US010784448B2

(12) United States Patent
Murer et al.

(10) Patent No.: US 10,784,448 B2
(45) Date of Patent: Sep. 22, 2020

(54) ELECTROLUMINESCENT IMIDAZO-QUINOXALINE CARBENE METAL COMPLEXES

(71) Applicant: UDC IRELAND LIMITED, Dublin (IE)

(72) Inventors: Peter Murer, Dublin (IE); Thomas Geßner, Dublin (IE); Christian Eickhoff, Dublin (IE); Jan Birnstock, Dublin (IE); Falk May, Dublin (IE); Klaus Kahle, Dublin (IE)

(73) Assignee: UDC IRELAND LIMITED, Dublin (IE)

( * ) Notice: Subject to any disclaimer, the term of this patent is extended or adjusted under 35 U.S.C. 154(b) by 487 days.

(21) Appl. No.: 15/502,394

(22) PCT Filed: Aug. 7, 2015

(86) PCT No.: PCT/EP2015/068240
§ 371 (c)(1),
(2) Date: Feb. 7, 2017

(87) PCT Pub. No.: WO2016/020516
PCT Pub. Date: Feb. 11, 2016

(65) Prior Publication Data

US 2017/0237020 A1 Aug. 17, 2017

(30) Foreign Application Priority Data

Aug. 8, 2014 (EP) .................................... 14180422

(51) Int. Cl.

| | |
|---|---|
| ***H01L 51/00*** | (2006.01) |
| ***C07F 15/00*** | (2006.01) |
| ***C09K 11/06*** | (2006.01) |
| ***C09K 11/02*** | (2006.01) |
| *H01L 51/50* | (2006.01) |

(52) U.S. Cl.
CPC ...... *H01L 51/0085* (2013.01); *C07F 15/0033* (2013.01); *C09K 11/025* (2013.01); *C09K 11/06* (2013.01); *H01L 51/0087* (2013.01); *C09K 2211/1007* (2013.01); *C09K 2211/1044* (2013.01); *C09K 2211/1074* (2013.01); *C09K 2211/185* (2013.01); *H01L 51/0054* (2013.01); *H01L 51/0072* (2013.01); *H01L 51/0073* (2013.01); *H01L 51/0077* (2013.01); *H01L 51/5016* (2013.01); *H01L 51/5056* (2013.01); *H01L 51/5088* (2013.01); *H01L 2251/558* (2013.01); *Y02E 10/549* (2013.01)

(58) Field of Classification Search
CPC ............. H01L 51/0085; H01L 51/0087; H01L 2251/558; H01L 51/0054; H01L 51/5088; H01L 51/5056; H01L 51/5016; H01L 51/0077; H01L 51/0073; H01L 51/0072; C09K 11/025; C09K 11/06; C09K 2211/1074; C09K 2211/185; C09K 2211/1044; C09K 2211/1007; C07F 15/0033; Y02E 10/549
USPC .......................................................... 428/690
See application file for complete search history.

(56) References Cited

U.S. PATENT DOCUMENTS 8,216,696 B2 * 7/2012 Kawakami ........... C07D 413/12 257/40
9,487,548 B2 * 11/2016 Molt .................. C07F 15/0086
2006/0258043 A1 11/2006 Bold
2009/0066226 A1 3/2009 Sugita
2011/0006670 A1 1/2011 Katakura
2011/0227049 A1 9/2011 Xia
2012/0261654 A1 10/2012 Yasukawa
2013/0032766 A1 2/2013 Molt
2014/0203268 A1 7/2014 Xia
2015/0129861 A1 * 5/2015 Hamano ............ H01L 51/0025 257/40

FOREIGN PATENT DOCUMENTS

CN 1871322 A 11/2006
CN 102762582 A 10/2012
EP 13174779 7/2013
JP 2233684 * 9/1990
JP 4110390 * 4/1992 ....... H01L 21/76898

(Continued)

OTHER PUBLICATIONS

Japanese Office Action (including English translation) issued in JP Patent Applictaion No. 2017-506869, dated Sep. 21, 2018 , 9 pages.
Chinese Office Action issued in CN Patent Application No. 201580056604.0, dated Jan. 8, 2019, 8 pages.
Taiwanese Office Action (with English translation) issued in TW Patent App. No. 104125837, dated Oct. 17, 2018, 6 pages.
Taiwanese Search Report (English Translation only) for TW Application No. 104125837, dated Oct. 15, 2018, 1 page.
Baldo et al., "Very high-efficiency green organic light-emitting devices based on electrophosphorescence". 1999, Applied Physics Letters, 75:4-6.

(Continued)

*Primary Examiner* — Douglas J McGinty
(74) *Attorney, Agent, or Firm* — Riverside Law LLP

(57) ABSTRACT

Metal carbene complexes comprising at least one imidazo-quinoxaline ligand, organic electronic devices, especially OLEDs (Organic Light-Emitting Diodes) which comprise such complexes, a light-emitting layer comprising at least one inventive metal carbene complex, an apparatus selected from the group consisting of illuminating elements, stationary visual display units and mobile visual display units comprising such an OLED, the use of such a metal carbene complex for electrophotographic photoreceptors, photoelectric converters, organic solar cells (organic photovoltaics), switching elements, organic light emitting field effect transistors (OLEFETs), image sensors, dye lasers and electroluminescent devices and a process for preparing such metal carbene complexes.

24 Claims, 1 Drawing Sheet

(56) References Cited

FOREIGN PATENT DOCUMENTS

| | | | |
|---|---|---|---|
| JP | 2007533774 | A | 11/2007 |
| JP | 2008127326 | | 6/2008 |
| JP | 2013513641 | A | 4/2013 |
| WO | 2005019373 | | 3/2005 |
| WO | 2005019373 | A2 | 3/2005 |
| WO | 2006056418 | | 6/2006 |
| WO | 2006128800 | | 12/2006 |
| WO | 2007101820 | | 9/2007 |
| WO | 2011073149 | | 6/2011 |
| WO | 2011073149 | A1 | 6/2011 |
| WO | 2011157779 | | 12/2011 |
| WO | 2011157790 | | 12/2011 |
| WO | 2012014621 | | 2/2012 |
| WO | 2012053627 | | 4/2012 |
| WO | 2012111462 | | 8/2012 |
| WO | 2012115034 | | 8/2012 |
| WO | 2012121936 | | 9/2012 |
| WO | 2012147397 | | 11/2012 |
| WO | 2012170461 | | 12/2012 |
| WO | 2012170463 | | 12/2012 |
| WO | 2013112557 | | 8/2013 |
| WO | 2014147134 | | 9/2014 |
| WO | 2015000955 | | 1/2015 |
| WO | 2015019373 | A2 | 2/2015 |

OTHER PUBLICATIONS

Phapale et al., "Nickel-catalysed Negishi cross-coupling reactions-:scope and mechanisms". 2009, Chem. Soc. Rev., 38: 1598-1607.

Espinet et al., "The Mechanisms of the Stille Reaction". 2004, Angew. Chem. Int. Ed. Eng., 43:4704-4734.

Leadbeater et al., "Transition-Metal-Free Suzuki-Type Coupling Reactions". 2003, Angew. Chem. Int. Ed. Eng., 42:1407-1409.

Saravanakumar et al., "Influence of anellation in N-heterocyclic carbenes: Novel quinoxaline-anellated NHCs trapped as transition metal complexes". 2006, Chem. Comm., 6:640-642.

Chambers et al., "Elemental Fluorine. Part 10. Selective fluorination of pyridine, quinoline, and quinoxaline derivatives with fluorine-iodine mixtures". 1999, J. Chem. Soc., Perkin Trans. 1, 7:803-810.

* cited by examiner

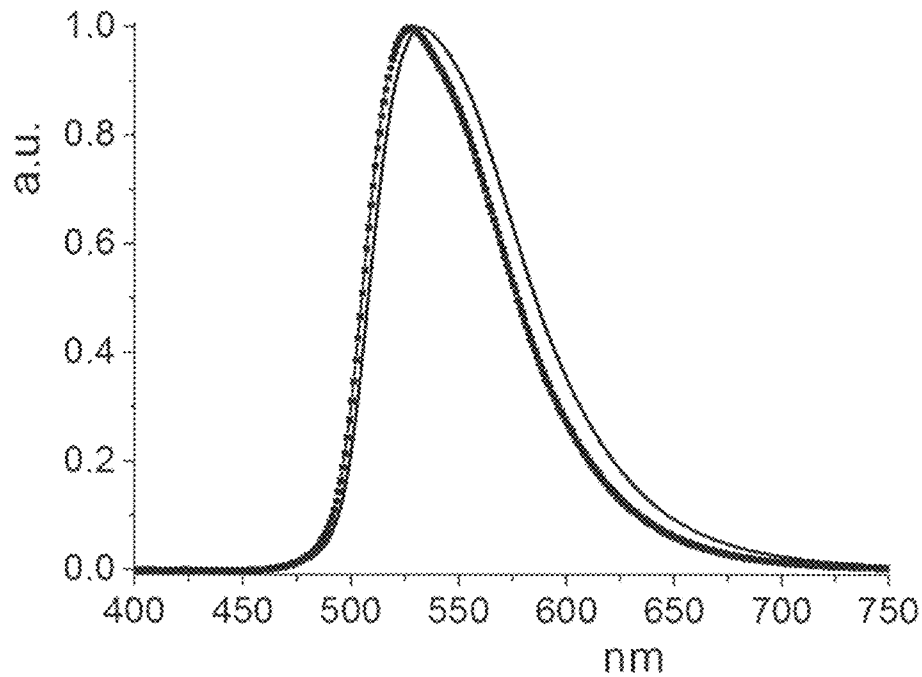
1.0
0.8
0.6
0.4
0.2
0.0
a.u.
400
450
500
550
600
650
700
750
nm

ELECTROLUMINESCENT IMIDAZO-QUINOXALINE CARBENE METAL COMPLEXES

CROSS-REFERENCE TO RELATED APPLICATIONS

This application is the U.S. National Stage Application filed under 35 U.S.C. § 371 of International Patent Application No. PCT/EP2015/068240, filed Aug. 7, 2015, which is entitled to priority under 35 U.S.C. § 119(e) to European Application No. 14180422.9, filed Aug. 8, 2014, all of which applications are hereby incorporated by reference in their entireties.

The present invention relates to metal-carbene complexes comprising at least one imidazo-quinoxaline ligand of the general formula (I), to organic electronic devices, especially OLEDs (Organic Light-Emitting Diodes) which comprise such complexes, to a light-emitting layer comprising at least one inventive metal carbene complex, to an apparatus selected from the group consisting of illuminating elements, stationary visual display units and mobile visual display units comprising such an OLED, to the use of such a metal-carbene complex for electrophotographic photoreceptors, photoelectric converters, organic solar cells (organic photovoltaics), switching elements, organic light emitting field effect transistors (OLEFETs), image sensors, dye lasers and electroluminescent devices and to a process for preparing such metal-carbene complexes.

Organic light-emitting diodes (OLEDs) exploit the propensity of materials to emit light when they are excited by electrical current. OLEDs are of particular interest as an alternative to cathode ray tubes and liquid-crystal displays for production of flat visual display units. Owing to the very compact design and the intrinsically low power consumption, devices comprising OLEDs are suitable especially for mobile applications, for example for applications in cellphones, smartphones, digital cameras, mp3 players, laptops, etc. In addition, white OLEDs give great advantages over the illumination technologies known to date, especially a particularly high efficiency.

The prior art proposes numerous materials which emit light on excitation by electrical current.

WO2006/056418A2 discloses the use of "unsymmetrical" transition metal-carbene complexes comprising one aromatic ligand and one aliphatic ligand connected with an imidazole ring in organic light-emitting diodes. The imidazole ring may comprise further aromatic or non-aromatic rings fused to the imidazole ring. All complexes shown in the examples in WO2006/056418A2 emit light in the purple to blue region of the electromagnetic spectrum.

WO2011/073149A1 discloses metal complexes comprising diazabenzimidazol carbene ligands and their use in OLEDs. According to the specification, metal complexes are provided emitting light especially in the blue region of the electromagnetic spectrum. Diazabenzimidazole carbene ligands, wherein the benzimidazole residue comprises further fused aromatic rings are excluded in WO2011/073149A1.

WO2012/170463 relates to metal-carbene complexes comprising a central atom selected from iridium and platinum, and specific azabenzimidazolocarbene ligands and to OLEDs, which comprise such complexes. WO2012/170461 and WO2012/121936 relate to metal-carbene complexes comprising a central atom selected from iridium and platinum, and diazabenzimidazolocarbene ligands, to organic light diodes which comprise such complexes and to light-emitting layers comprising at least one such metal-carbene complex. However, no complexes which have imidazo-quinoxaline carbene ligands are disclosed by said documents.

The carbene complexes mentioned in the prior art mentioned above are—according to said prior art—especially suitable as emitter materials emitting light in the blue region of the visible electromagnetic spectrum.

In the prior art mentioned below, complexes suitable as emitter materials emitting light in the green region of the visible electromagnetic spectrum are mentioned.

Baldo et al., Applied Physics Letters, vol. 75, No. 1, 5 Jul. 1999, 4-6, concerns an organic light-emitting device based on electrophosphorescent emitting light in the green region of the electromagnetic spectrum comprising—as emitter material—fac tris(2-phenylpyridine)iridium ($[Ir(ppy)_3]$).

US2011/0227049A1 concerns organic iridium complexes containing a 2-phenylpyridine ligand having a twisted aryl group on the pyridine portion of the ligand. The compounds may be used in organic light-emitting devices, particularly as emitting dopants. The iridium compounds shown in US2011/0227049A1 are, according to all examples, employed as emitter material in organic light-emitting diodes emitting light in the green region of the electromagnetic spectrum.

US2014/0203268A1 discloses heteroleptic iridium complexes having a combination of ligands which includes a single pyridyl dibenzo-substituted ligand. The compounds may be used in organic light-emitting devices. All organic light-emitting devices mentioned in the examples of US2014/0203268A1 comprise the specific iridium complexes mentioned before as emitter materials emitting light in the green region of the electromagnetic spectrum.

WO2012/053627A1 discloses organometallic complexes in which a 4-arylpyrimidine derivative is a ligand and iridium is a central metal, which organometallic complex emits phosphorescence and may be used in a light-emitting device. According to the specification, the organometallic complex has a broad range of emission spectra in the wavelength range of red to green.

One important application for phosphorescent emissive molecules is a full color display. Industry standards for such a display call for pixels adapted to emit the particular colors: saturated red, green and blue pixels. The color may be measured using CIE coordinates, which are well-known to a person skilled in the art.

There is therefore a need to provide phosphorescent emissive molecules emitting with high quantum efficiency and good color purity in the red, green and blue area of the electromagnetic spectrum.

Since highly emissive phosphorescent molecules emitting light in the blue region of the electromagnetic spectrum, based on carbene ligands, are known in the art (see for example the prior art mentioned above), it is an object of the present invention to provide phosphorescent emissive molecules based on transition metal carbene complexes, emitting in the green to yellow region of the visible electromagnetic spectrum, i.e. having a $\lambda_{max}$ of 510 to 590 nm. The preferred CIE-y coordinate is higher than 0.47, preferably higher than 0.50.

It is a further object of the present invention to provide organic electronic devices, preferably OLEDs, having—compared with the organic electronic devices known in the art—a high color purity in the green to yellow region of the visible electromagnetic spectrum, a high efficiency, low voltage and/or improved lifetime/stability.

The object is achieved by a metal carbene complex, wherein the metal is selected from Ir and Pt, comprising at least one ligand of formula (A), preferably at least one ligand of formula (I)

(A)

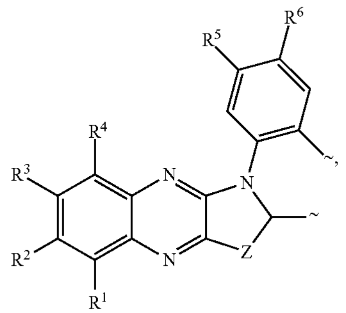

preferably (I)

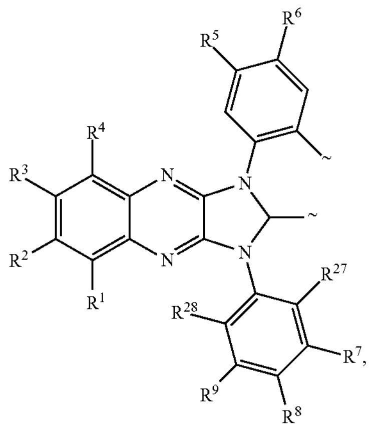

wherein is $NR^x$, O or S, preferably $NR^x$ or O, more preferably $NR^x$, $R^x$ is

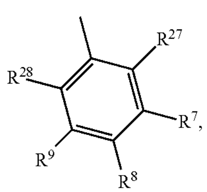

$R^1$, $R^2$, $R^3$ and $R^4$ are independently of each other hydrogen; a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one of O, S and $NR^{65}$ and/or substituted by at least one substituent E; a $C_6$-$C_{14}$aryl group, which can optionally be substituted by at least one substituent G; a —$NR^{65}$—$C_6$-$C_{14}$aryl group, preferably a —$N(C_6$-$C_{14}aryl)_2$ group, which can optionally be substituted by at least one substituent G; a heteroaryl group comprising 3 to 11 ring atoms, which can optionally be substituted by at least one substituent G, interrupted by at least one of O, S, N and $NR^{65}$; or a —$NR^{65}$-heteroaryl group, preferably a —N(heteroaryl)$_2$ group, comprising 3 to 11 ring atoms, which can optionally be substituted by at least one substituent G, interrupted by at least one of O, S, N and $NR^{65}$; a halogen atom, especially F or Cl; a $C_1$-$C_{18}$haloalkyl group such as $CF_3$; CN; or $SiR^{80}R^{81}R^{82}$;

or $R^1$ and $R^2$, $R^2$ and $R^3$ or $R^3$ and $R^4$ form together a ring

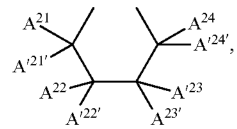

or

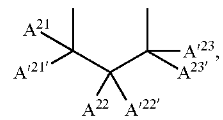

wherein $A^{21}$, $A^{21'}$, $A^{22}$, $A^{22'}$, $A^{23}$, $A^{23'}$, $A^{24'}$ and $A^{24}$ are independently of each other H, a $C_1$-$C_4$alkyl group, a $C_3$-$C_6$cycloalkyl group, or a fluoro$C_1$-$C_4$alkyl group;

$R^5$ and $R^6$ are independently of each other hydrogen; a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one of O, S and $NR^{65}$ and/or substituted by at least one substituent E; a $C_6$-$C_{14}$aryl group, which can optionally be substituted by at least one substituent G; a —$NR^{65}$—$C_6$-$C_{14}$aryl group, preferably a —$N(C_6$-$C_{14}aryl)_2$ group, which can optionally be substituted by at least one substituent G; a heteroaryl group comprising 3 to 11 ring atoms, which can optionally be substituted by at least one substituent G, interrupted by at least one of O, S, N and $NR^{65}$; a halogen atom, especially F or Cl; a $C_1$-$C_{18}$haloalkyl group such as $CF_3$; CN; or $SiR^{80}R^{81}R^{82}$;

$R^7$, $R^8$, $R^9$, $R^{27}$ and $R^{28}$ are independently of each other hydrogen; a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one of O, S and $NR^{65}$ and/or substituted by at least one substituent E; a $C_6$-$C_{14}$aryl group, which can optionally be substituted by at least one substituent G; a heteroaryl group comprising 3 to 11 ring atoms, which can optionally be substituted by at least one substituent G, interrupted by at least one of O, S, N and $NR^{65}$ a halogen atom, especially F or Cl; a $C_1$-$C_{18}$haloalkyl group such as $CF_3$; CN; or $SiR^{80}R^{81}R^{82}$; in addition to the groups mentioned above, $R^8$ may be a —$NR^{65}$—$C_6$-$C_{14}$aryl group, preferably a —$N(C_6$-$C_{14}aryl)_2$ group, which can optionally be substituted by at least one substituent G; or a —$NR^{65}$-heteroaryl group, preferably a —N(heteroaryl)$_2$ group, comprising 3 to 11 ring atoms, which can optionally be substituted by at least one substituent G, interrupted by at least one of O, S, N and $NR^{65}$;

or $R^5$ and $R^6$ and/or $R^8$ and $R^9$ together form a group of formula

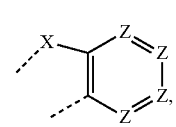

wherein Z is N or CR''', wherein 0 or 1 Z is N, preferably

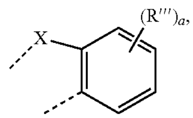

wherein X is O, S, $NR^{75}$ or $CR^{73}R^{74}$, preferably O; R''' is $C_1$-$C_8$alkyl and a is 0, 1 or 2, preferably 0 or 1, more preferably 0;

D is —CO—, —COO—, —S—, —SO—, —$SO_2$—, —O—, —$NR^{65}$—, —$SiR^{70}R^{71}$—, —$POR^{72}$—, —$CR^{63}$═$CR^{64}$—, or —C≡C, preferably —O—, —S— or —$NR^{65}$—;

E is —$OR^{69}$, —$SR^{69}$, —$NR^{65}R^{66}$, —$COR^{68}$, —$COOR^{67}$, —$CONR^{65}R^{66}$, —CN, halogen, a $C_1$-$C_{18}$alkyl group, which can optionally be substituted by at least one substituent E and/or interrupted by D; preferably F; a $C_1$-$C_8$haloalkyl group such as $CF_3$, or a $C_1$-$C_8$alkyl group;

preferably, E is $C_1$-$C_8$alkyl, $C_1$-$C_8$alkoxy, CN, halogen, preferably F, or $C_1$-$C_8$haloalkyl, such as $CF_3$; more preferably E is $C_1$-$C_8$alkyl, $C_1$-$C_8$alkoxy, or $C_1$-$C_8$haloalkyl, such as $CF_3$;

G is E; or an unsubstituted $C_6$-$C_{14}$aryl group; a $C_6$-$C_{14}$aryl group, which is substituted by F, $C_1$-$C_{18}$alkyl, or $C_1$-$C_{18}$alkyl, which is substituted by F and/or interrupted by O; an unsubstituted heteroaryl group comprising 3 to 11 ring atoms, interrupted by at least one of O, S, N and $NR^{65}$; or a heteroaryl group comprising 3 to 11 ring atoms, interrupted by at least one of O, S, N and $NR^{65}$, which is substituted by F, unsubstituted $C_1$-$C_{18}$alkyl, $SiR^{80}R^{81}R^{82}$, or $C_1$-$C_{18}$alkyl which is substituted by F and/or interrupted by O;

preferably, G is a $C_1$-$C_8$alkyl group, or a group of formula

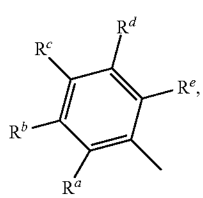

$R^a$ is H, a $C_1$-$C_5$alkyl group, a fluoro$C_1$-$C_4$alkyl group, or a $C_3$-$C_6$cycloalkyl group, $R^e$ is H, a $C_1$-$C_5$alkyl group, a fluoro$C_1$-$C_4$alkyl group, or a $C_3$-$C_6$cycloalkyl group, $R^c$, $R^b$ and $R^d$ are independently of each other hydrogen; a $C_1$-$C_{18}$alkyl group, which can optionally be substituted by E and/or interrupted by D; a $C_3$-$C_{12}$cycloalkyl group, which can optionally be substituted by G; a $C_3$-$C_{10}$heterocycloalkyl radical which is interrupted by at least one of O, S and $NR^{65}$ and/or substituted by E; a $C_6$-$C_{24}$aryl group, which can optionally be substituted by G; or a $C_2$-$C_{30}$heteroaryl group, which can optionally be substituted by G; a halogen atom, especially F or Cl; $C_1$-$C_8$haloalkyl such as $CF_3$; CN; or $SiR^{80}R^{81}R^{82}$;

or $R^c$ and $R^b$, or $R^a$ and $R^b$ together form a group of formula

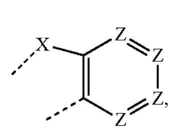

wherein Z is N or CR''', wherein 0 or 1 Z is N, preferably

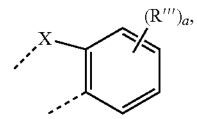

wherein X is O, S, $NR^{75}$ or $CR^{73}R^{74}$, preferably O; R''' is $C_1$-$C_8$alkyl and a is 0, 1 or 2, preferably 0 or 1, more preferably 0;

$R^{63}$ and $R^{64}$ are independently of each other H; unsubstituted $C_6$-$C_{18}$aryl; $C_6$-$C_{18}$aryl which is substituted by $C_1$-$C_{18}$alkyl, or $C_1$-$C_{18}$alkoxy; unsubstituted $C_1$-$C_{18}$alkyl; or $C_1$-$C_{18}$alkyl which is interrupted by —O—; preferably unsubstituted $C_6$-$C_{18}$aryl; $C_6$-$C_{18}$aryl which is substituted by $C_1$-$C_{18}$alkyl, or $C_1$-$C_{18}$alkoxy; unsubstituted $C_1$-$C_{18}$alkyl; or $C_1$-$C_{18}$alkyl which is interrupted by —O—; $R^{65}$ and $R^{66}$ are independently of each other H, an unsubstituted $C_6$-$C_{18}$aryl group; a $C_6$-$C_{18}$aryl group which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—;

$R^{65}$ and $R^{66}$ together form a five or six membered ring, $R^{67}$ is H, an unsubstituted $C_6$-$C_{18}$aryl group; a $C_6$-$C_{18}$aryl group, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; preferably an unsubstituted $C_6$-$C_{18}$aryl group; a $C_6$-$C_{18}$aryl group, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—;

$R^{68}$ is H; an unsubstituted $C_6$-$C_{18}$aryl group; a $C_6$-$C_{18}$aryl group, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—;

$R^{69}$ is H, an unsubstituted $C_6$-$C_{18}$aryl; a $C_6$-$C_{18}$aryl, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; preferably an unsubstituted $C_6$-$C_{18}$aryl; a $C_6$-$C_{18}$aryl, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—;

$R^{70}$ and $R^{71}$ are independently of each other an unsubstituted $C_1$-$C_{18}$alkyl group; an unsubstituted $C_6$-$C_{18}$aryl group; or a $C_6$-$C_{18}$aryl group, which is substituted by $C_1$-$C_{18}$alkyl; $R^{72}$ is an unsubstituted $C_1$-$C_{18}$alkyl group; an unsubstituted $C_6$-$C_{18}$aryl group, or a $C_6$-$C_{18}$aryl group, which is substituted by $C_1$-$C_{18}$alkyl;

$R^{73}$ and $R^{74}$ are independently of each other H, $C_1$-$C_{25}$alkyl, $C_1$-$C_{25}$alkyl which is interrupted by O, $C_7$-$C_{25}$arylalkyl, $C_6$-$C_{24}$aryl, $C_6$-$C_{24}$aryl which is substituted by $C_1$-$C_{18}$alkyl, $C_2$-$C_{20}$heteroaryl, or $C_2$-$C_{20}$heteroaryl which is substituted by $C_1$-$C_{18}$alkyl;

$R^{75}$ is a $C_6$-$C_{18}$aryl group; a $C_6$-$C_{18}$aryl which is substituted by $C_1$-$C_{18}$alkyl, or $C_1$-$C_{18}$alkoxy; a $C_1$-$C_{18}$alkyl group; or a $C_1$-$C_{18}$alkyl group, which is interrupted by —O—;

$R^{80}$, $R^{81}$ and $R^{82}$ are independently of each other a $C_1$-$C_{25}$alkyl group, which can optionally be interrupted by O; a $C_6$-$C_{14}$aryl group, which can optionally be substituted by $C_1$-$C_{18}$alkyl; or a heteroaryl group comprising 3 to 11 ring atoms, which can optionally be substituted by $C_1$-$C_{18}$alkyl;

~ is a bonding site to the metal.

It has been found by the inventors of the present invention that the inventive metal carbene complexes mentioned above emit light in the yellow to green area, especially in the yellow-green to green region, respectively in the green to yellow area, especially in the green to yellow-green region, of the visible electromagnetic spectrum ($\lambda_{max}$ of 510 to 590 nm). It has been further found by the inventors of the present application—in contrast to the expectation of a person skilled in the art—that the imidazo-quinoxaline carbene metal complexes according to the present invention show a short lifetime of the luminescence ($\tau_v$) of the respective Pt or Ir carbene complexes, especially Ir carbene complexes, of the present invention.

These metal-carbene complexes may spend less time in the excited state, thereby decreasing the possibility for photochemical reactions, or quenching to occur. Therefore, these compounds may provide devices with improved stability and/or also improved device efficiency. In addition, the inventive metal-carbene complexes may provide reduced color-shift of the emission with increasing doping concentration of the compounds in a host material.

Organic electronic devices comprising the metal carbene complexes according to the present invention further show a high color purity in the green to yellow region, especially in the yellow-green to green region, respectively in the green to yellow-green region, of the visible electromagnetic spectrum, a high efficiency, low voltage and/or improved lifetime/stability.

Organic electronic devices, preferably OLEDs, comprising the metal-carbene complex according to the present invention further show improved device performance such as high quantum efficiency, high luminous efficacy, low voltage, good stabilities and/or long lifetimes. The inventive metal-carbene complexes comprising at least one ligand of formula (I) are particularly suitable as emitter materials with an emission in the green to yellow region of the visible electromagnetic spectrum with a $\lambda_{max}$ of 510 to 590 nm. The preferred CIE-y coordinate is higher than 0.47, preferably higher than 0.50. This enables for example the production of white OLEDs, or full-color displays.

Any colour can be expressed by the chromaticity coordinates x and y on the CIE chromaticity diagram. The boundaries of this horseshoe-shaped diagram are the plots of monochromatic light, called spectrum loci, and all the colours in the visible spectrum fall within or on the boundary of this diagram. The arc near the centre of the diagram is called the Planckian locus, which is the plot of the coordinates of black body radiation at the temperatures from 1000 K to 20000 K, described as CCT.

The correlated colour temperature (CCT) is the temperature of a blackbody radiator that has a colour that most closely matches the emission from a nonblackbody radiator.

The metal carbene complexes of the present invention preferably emit yellow to green light ($\lambda_{max}$ of 510 to 590 nm) with a FWHM (full width at half maximum) of 20 nm to 140 nm, more preferably of 40 nm to 100 nm, most preferably 60 nm to 90 nm.

In case of OLED display applications, the color purity plays a crucial role. In order to achieve highly efficient displays with high color gamut, it is reasonable that the spectra of the OLED emitters are narrow. Therefore, it is preferred that the emission shows a single peak spectrum with a full width half-maximum (FWHM) of 20 nm to 140 nm, more preferably of 40 nm to 100 nm, most preferably 60 nm to 90 nm. For OLED lighting application, a broad spectrum is beneficial.

The triplet decay time (=lifetime of the luminescence $\tau_v$) of metal carbene complexes of the present invention (as emitter) is 0.5 to 100 micro seconds, more preferably 0.5 to 10 micro seconds, most preferably 0.5 to 5 micro seconds, even more preferably 0.5 to 3 micro seconds.

The metal carbene complex according to the present invention is—at room temperature (i.e. at 25° C.)—a phosphorescent emitter.

The phosphosphorescent emitters according to the present invention emit preferably from triplet excited states. Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

The absolute photoluminescence quantum yield of the metal carbene complexes of the present invention (measured at room temperature (in the context of the present invention "room temperature" is 25° C.)) is in general at least 50%, preferably at least 70%, e.g. 50 to 95%, more preferably 70 to 95%.

In a preferred embodiment, the absolute photoluminescence quantum yield of the metal carbene complexes of the present invention (measured at room temperature (in the context of the present invention "room temperature" is 25° C.)) is in general 50 to 99%, more preferably 70 to 99%.

The determination of the photoluminescence spectra of the inventive metal carbene complexes as well as the determination of the lifetime of luminescence $\tau_v$ are described below. The further data mentioned below can be determined based on said information by methods known to a person skilled in the art.

Another advantage of the complexes according to the present invention is their generally very high thermal stability. The complexes according to the present invention generally remain undegraded at a temperature above 250° C., preferably above 300° C., more preferably above 350° C., in general for a duration of more than 2 days, preferably more than 5 days, more preferably more than 9 days. This can for example been proved by a so-called "ampulla test". For that test, 50 mg of material have been sealed in glass ampullas under nitrogen atmosphere and afterwards they were stored in an oven at different temperatures at temperatures between 310° up to 385° C. for a duration of 10 days. After that period the materials have been investigated by means of HPLC to check their quality. The results show that the inventive complexes remain undegraded.

A variety of representations are used to depict the bonding in metal-carbenes, including those in which a curved line is used to indicate partial multiple bonding between the carbene carbon and the adjacent heteroatom(s):

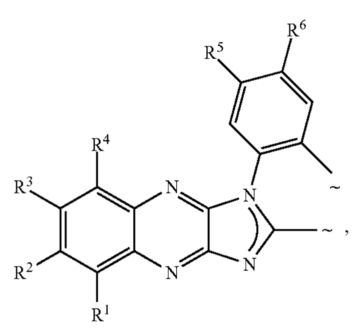

preferably

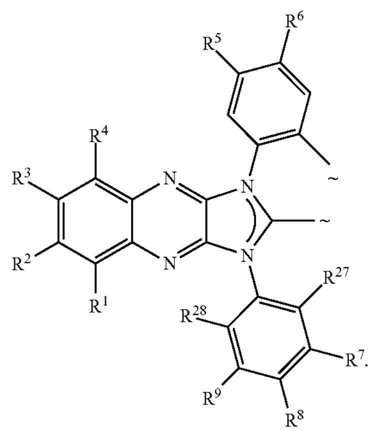

In the figures and structures herein, a metal-carbene bond is depicted as C-M, as, for example,

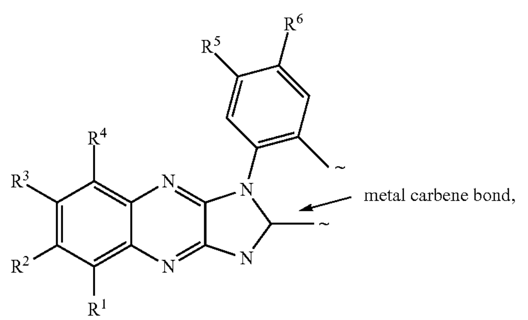

preferably

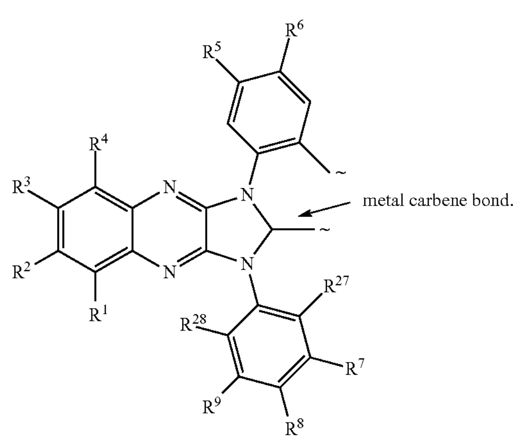

The residues mentioned in the specification of the present application generally have the following preferred meanings, if not defined differently in a specific residue:

A $C_1$-$C_{18}$alkyl group, which can optionally be substituted by at least one substituent E and/or interrupted by D: preferably a $C_1$-$C_{12}$alkyl group, which can optionally be substituted by at least one substituent E and/or interrupted by D; more preferably a $C_1$-$C_8$alkyl group, which can optionally be substituted by at least one substituent E and/or interrupted by D; most preferably a $C_1$-$C_8$alkyl group, which can optionally be substituted by at least one substituent E; even more preferably an unsubstituted $C_1$-$C_8$alkyl group; further even more preferably an unsubstituted $C_1$-$C_5$alkyl group, e.g. methyl, ethyl, propyl, like n-propyl, iso-propyl, n-butyl, sec-butyl, iso-butyl, tert-butyl, or neopentyl. The alkyl groups may be linear or branched.

A $C_3$-$C_{12}$cycloalkyl group, which can optionally be substituted by at least one substituent E: preferably a $C_3$-$C_{12}$cycloalkyl group, which can optionally be substituted by at least one substituent E; more preferably a $C_3$-$C_6$cycloalkyl group, which can optionally be substituted by at least one substituent E; most preferably an unsubstituted $C_3$-$C_6$cycloalkyl group, e.g. cyclohexyl or cyclopentyl.

A heterocycloalkyl group comprising 3 to 6 ring atoms, interrupted by at least one of O, S and $NR^{65}$ and/or substituted by at least one substituent E: preferably an unsubstituted heterocycloalkyl group comprising 3 to 6 ring atoms, interrupted by at least one of O, S and $NR^{65}$, e.g. heterocycloalkyl groups based on pyrrolidine, tetrahydrothiophene, tetrahydrofurane, tetrahydropyrane, tetrahydrothiopyrane, piperidine, dioxane, e.g. 1,4-dioxane or morpholine and derivatives thereof substituted by at least one substituent E.

A $C_6$-$C_{14}$aryl group, which can optionally be substituted by at least one substituent G: preferably a $C_6$-$C_{14}$aryl group, which can optionally be substituted by one or two groups G; more preferably a phenyl group, which can optionally be substituted by one or two groups G.

A —$NR^{65}$—$C_6$-$C_{14}$aryl group, which can optionally be substituted by at least one substituent G: preferably a —N($C_6$-$C_{14}$aryl)$_2$ group, which can optionally be substituted by at least one substituent G; more preferably a —N(phenyl)$_2$ group, which can optionally be substituted by one or two groups G; most preferably an unsubstituted—N(phenyl)$_2$ group.

A heteroaryl group comprising 3 to 11 ring atoms, which can optionally be substituted by at least one substituent G, interrupted by at least one of O, S, N and $NR^{65}$: preferably a heteroaryl group comprising 3 to 11 ring atoms, which can optionally be substituted by one or two groups G, interrupted by at least one of O, S, N and $NR^{65}$; more preferably pyridyl, methylpyridyl, pyrimidyl, pyrazinyl, carbazolyl, dibenzofuranyl, dibenzothiophenyl, indolyl, methylindolyl, benzofuranyl and benzothiophenyl, which can optionally be substituted by one, or more groups selected from a $C_1$-$C_5$alkyl group, a $C_3$-$C_6$cycloalkyl group and a $C_1$-$C_4$fluoroalkyl group; especially carbazolyl, dibenzofuranyl, dibenzothiophenyl, which can optionally be substituted by one, or more groups selected from a $C_1$-$C_5$alkyl group, a $C_3$-$C_6$cycloalkyl group and a $C_1$-$C_4$fluoroalkyl group; more especially dibenzofuranyl, dibenzothiophenyl, which can optionally be substituted by one, or more groups selected from a $C_1$-$C_4$alkyl group, and a $C_3$-$C_6$cycloalkyl group.

A a —$NR^{65}$-heteroaryl group, comprising 3 to 11 ring atoms, which can optionally be substituted by at least one substituent G, interrupted by at least one of O, S, N and $NR^{65}$: preferably a —N(heteroaryl)$_2$ group, comprising 3 to 11 ring atoms, which can optionally be substituted by at least one substituent G, interrupted by at least one of O, S, N and $NR^{65}$, preferred heteroaryl residues are mentioned before.

A halogen atom: preferably F or Cl, more preferably F.

A $C_1$-$C_{18}$haloalkyl group; preferably a fluoro$C_1$-$C_4$alkyl group, more preferably $CF_3$. The alkyl groups may be linear or branched.

In the alkyl groups and aryl groups mentioned in the present application one or more hydrogen atoms may be substituted by deuterium atoms.

Metal Carbene Complexes According to the Present Invention

The residues $R^1$, $R^2$, $R^3$ and $R^4$ in the metal carbene complexes according to the present invention are independently of each other hydrogen; a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one of O, S and $NR^{65}$ and/or substituted by at least one substituent E; a $C_6$-$C_{14}$aryl group, which can optionally be substituted by at least one substituent G; a —$NR^{65}$—$C_6$-$C_{14}$aryl group, preferably a —$N(C_6$-$C_{14}aryl)_2$ group, which can optionally be substituted by at least one substituent G; a heteroaryl group comprising 3 to 11 ring atoms, which can optionally be substituted by at least one substituent G, interrupted by at least one of O, S, N and $NR^{65}$; or a —$NR^{65}$-heteroaryl group, preferably a —N(heteroaryl)$_2$ group, comprising 3 to 11 ring atoms, which can optionally be substituted by at least one substituent G, interrupted by at least one of O, S, N and $NR^{65}$; a halogen atom, especially F or Cl; a $C_1$-$C_{18}$haloalkyl group such as $CF_3$; CN; or $SiR^{80}R^{81}R^{82}$;

or $R^1$ and $R^2$, $R^2$ and $R^3$ or $R^3$ and $R^4$ form together a ring

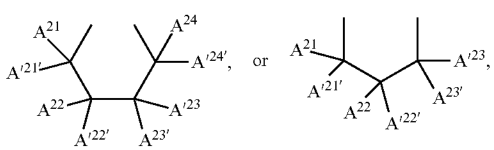

wherein $A^{21}$, $A^{21'}$, $A^{22}$, $A^{22'}$, $A^{23}$, $A^{23'}$, $A^{24'}$ and $A^{24}$ are independently of each other H, a $C_1$-$C_4$alkyl group, a $C_3$-$C_6$cycloalkyl group, or a fluoro$C_1$-$C_4$alkyl group.

Preferably, $R^1$, $R^2$, $R^3$ and $R^4$ are independently of each other hydrogen; a $C_1$-$C_{12}$alkyl group, which can optionally be substituted by at least one substituent E and/or interrupted by D; a $C_3$-$C_{12}$cycloalkyl group, which can optionally be substituted by at least one substituent E; a $C_6$-$C_{14}$aryl group, which can optionally be substituted by one or two groups G; a heteroaryl group comprising 3 to 11 ring atoms, which can optionally be substituted by one or two groups G; or a —N(phenyl)$_2$ group, which can optionally be substituted by one or two groups G.

More preferably, $R^1$, $R^2$, $R^3$ and $R^4$ are independently of each other hydrogen; a $C_1$-$C_8$alkyl group, which can optionally be substituted by at least one substituent E and/or interrupted by D; a $C_3$-$C_6$cycloalkyl group, which can optionally be substituted by at least one substituent E; or a phenyl group, which can optionally be substituted by one or two groups G.

Most preferably, $R^1$, $R^2$, $R^3$ and $R^4$ are independently of each other hydrogen; a $C_1$-$C_8$alkyl group, which can optionally be substituted by at least one substituent E; a $C_3$-$C_6$cycloalkyl group, which can optionally be substituted by at least one substituent E; or a phenyl group, which can optionally be substituted by one or two groups G.

Even more preferably, $R^1$, $R^2$, $R^3$ and $R^4$ are independently of each other hydrogen; a $C_1$-$C_8$alkyl group, which can optionally be substituted by at least one substituent E; a $C_3$-$C_6$cycloalkyl group; or either $R^2$ and $R^3$ or $R^1$ and $R^4$ are a phenyl group, which can optionally be substituted by one or two groups G.

Further more preferably, $R^1$, $R^2$, $R^3$ and $R^4$ are independently of each other hydrogen; a $C_1$-$C_8$alkyl group; or a $C_3$-$C_6$cycloalkyl group.

In one especially preferred embodiment, either $R^2$ and $R^3$ or $R^1$ and $R^4$ are H.

Further more preferably, $R^1$ and $R^4$ are hydrogen and $R^2$ and $R^3$ are independently of each other hydrogen; a $C_1$-$C_8$alkyl group; or a $C_3$-$C_6$cycloalkyl group, or a phenyl group, which can optionally be substituted by one or two groups G.

Most preferably, $R^1$, $R^2$, $R^3$ and $R^4$ are hydrogen.

The residues $R^5$ and $R^6$ are independently of each other hydrogen; a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one of O, S and $NR^{65}$ and/or substituted by at least one substituent E; a $C_6$-$C_{14}$aryl group, which can optionally be substituted by at least one substituent G; a —$NR^{65}$—$C_6$-$C_{14}$aryl group, preferably a —$N(C_6$-$C_{14}aryl)_2$ group, which can optionally be substituted by at least one substituent G; a heteroaryl group comprising 3 to 11 ring atoms, which can optionally be substituted by at least one substituent G, interrupted by at least one of O, S, N and $NR^{65}$; a halogen atom, especially F or Cl; a $C_1$-$C_{18}$haloalkyl group such as $CF_3$; CN; or $SiR^{80}R^{81}R^{82}$;

or $R^5$ and $R^6$ together form a group of formula

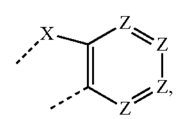

wherein Z is N or CR''', wherein 0 or 1 Z is N, preferably

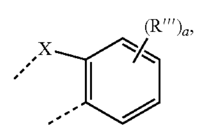

wherein X is O, S, $NR^{75}$ or $CR^{73}R^{74}$, preferably O; R''' is $C_1$-$C_8$alkyl and a is 0, 1 or 2, preferably 0 or 1, more preferably 0;

D is —CO—, —COO—, —S—, —SO—, —$SO_2$—, —O—, —$NR^{65}$—, —$SiR^{70}R^{71}$—, —$POR^{72}$—, —$CR^{63}$=$CR^{64}$—, or —C≡C, preferably —O—, —S— or —$NR^{65}$—.

Preferably, $R^5$ and $R^6$ are independently of each other hydrogen; a $C_1$-$C_{12}$alkyl group, which can optionally be substituted by E and/or interrupted by D; a $C_3$-$C_{12}$cycloalkyl group, which can optionally be substituted by E;

or one of $R^5$ and $R^6$, preferably $R^5$, is a group of formula

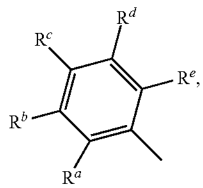

in a further preferred embodiment, $R^6$ is a group of formula

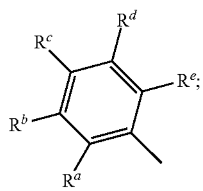

$R^a$ is H, a $C_1$-$C_5$alkyl group, a fluoro$C_1$-$C_4$alkyl group, or a $C_3$-$C_6$cycloalkyl group; preferably H, a $C_1$-$C_5$alkyl group, $C_3$-$C_6$cycloalkyl group; more preferably H, or a $C_1$-$C_5$alkyl group;

$R^e$ is H, a $C_1$-$C_5$alkyl group, a fluoro$C_1$-$C_4$alkyl group, or a $C_3$-$C_6$cycloalkyl group; preferably H, a $C_1$-$C_5$alkyl group, $C_3$-$C_6$cycloalkyl group; more preferably H, or a $C_1$-$C_5$alkyl group;

$R^c$, $R^b$ and $R^d$ are independently of each other hydrogen; a $C_1$-$C_{18}$alkyl group, which can optionally be substituted by E and/or interrupted by D; a $C_3$-$C_{12}$cycloalkyl group, which can optionally be substituted by G; a $C_6$-$C_{14}$aryl group, which can optionally be substituted by G; or a $C_2$-$C_{30}$heteroaryl group, which can optionally be substituted by G; $C_1$-$C_8$haloalkyl such as $CF_3$; or $SiR^{80}R^{81}R^{82}$; preferably $R^c$, $R^b$ and $R^d$ are independently of each other H, a $C_1$-$C_5$alkyl group, $C_3$-$C_6$cycloalkyl group; more preferably H, or a $C_1$-$C_5$alkyl group; further preferably, $R^b$, $R^c$ and $R^d$ are hydrogen or a phenyl group, which can optionally be substituted by one or two groups G;

or $R^c$ and $R^b$, or $R^a$ and $R^b$ together form a group of formula

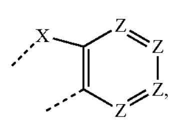

wherein Z is N or CR''', wherein 0 or 1 Z is N, preferably

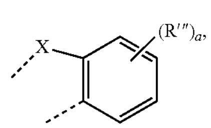

wherein X is O, S, $NR^{75}$ or $CR^{73}R^{74}$, preferably O; R''' is $C_1$-$C_8$alkyl and a is 0, 1 or 2, preferably 0 or 1, more preferably 0.

More preferably, $R^5$ and $R^6$ are independently of each other hydrogen; a $C_1$-$C_8$alkyl group, which can optionally be substituted by at least one substituent E and/or interrupted by D; or one of $R^5$ and $R^6$ is a $C_3$-$C_6$cycloalkyl group, which can optionally be substituted by at least one substituent E; or one of $R^5$ and $R^6$ is a phenyl group, which can optionally be substituted by one or two groups G.

Most preferably, $R^5$ and $R^6$ are independently of each other hydrogen; a $C_1$-$C_8$alkyl group, which can optionally be substituted by at least one substituent E; or a $C_3$-$C_6$cycloalkyl group, which can optionally be substituted by at least one substituent E; or a phenyl group, which can optionally be substituted by one or two groups G.

Even more preferably, $R^5$ and $R^6$ are independently of each other hydrogen; a $C_1$-$C_8$alkyl group, which can optionally be substituted by at least one substituent E; a $C_3$-$C_6$cycloalkyl group, which can optionally be substituted by at least one substituent E; or either $R^5$ or $R^6$, preferably $R^5$, is a phenyl group, which can optionally be substituted by one or two groups G; in a further preferred embodiment $R^6$ is a phenyl group, which can optionally be substituted by one or two groups G.

Further more preferably, $R^5$ and $R^6$ are independently of each other hydrogen; a $C_1$-$C_8$alkyl group; or a $C_3$-$C_6$cycloalkyl group. Preferably, at least one of $R^5$ and $R^6$ is hydrogen, and the other one is a $C_1$-$C_8$alkyl group. More preferably, at least $R^5$ is hydrogen, and $R^6$ is a $C_1$-$C_8$alkyl group. Most preferably both $R^5$ and $R^6$ are hydrogen.

In one further preferred embodiment, $R^5$ and $R^6$ are independently of each other hydrogen; a $C_1$-$C_8$alkyl group; or one of $R^5$ and $R^6$, preferably $R^5$, is a phenyl group, which can optionally be substituted by one group or two groups selected from $CF_3$ or $C_1$-$C_8$alkyl, preferably optionally be substituted by one or two $C_1$-$C_8$alkyl group; in a further preferred embodiment $R^6$ is a phenyl group, which can optionally be substituted by one group or two groups selected from $CF_3$ or $C_1$-$C_8$alkyl, preferably optionally be substituted by one or two $C_1$-$C_8$alkyl group; preferably, at least one of $R^5$ and $R^6$ is hydrogen; more preferably, at least one of $R^5$ and $R^6$ is hydrogen and the other one of $R^5$ and $R^6$ is hydrogen or a phenyl group, which can optionally be substituted by one or two $C_1$-$C_8$alkyl groups.

Most preferably, $R^5$ and $R^6$ are hydrogen.

In a further embodiment, $R^5$ is H and $R^6$ is a phenyl group, which can optionally be substituted by one group or two $C_1$-$C_8$alkyl groups.

$R^7$, $R^8$, $R^9$, $R^{27}$ and $R^{28}$ are independently of each other hydrogen; a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one of O, S and $NR^{65}$ and/or substituted by at least one substituent E; a $C_6$-$C_{14}$aryl group, which can optionally be substituted by at least one substituent G; a heteroaryl group comprising 3 to 11 ring atoms, which can optionally be substituted by at least one substituent G, interrupted by at least one of O, S, N and $NR^{65}$ a halogen atom, especially F or Cl; a $C_1$-$C_{18}$haloalkyl group such as $CF_3$; CN; or $SiR^{80}R^{81}R^{82}$; in addition to the groups mentioned above, $R^8$ may be a —$NR^{65}$—$C_6$-$C_{14}$aryl group, preferably a —N($C_6$-$C_{14}$aryl)$_2$ group, which can optionally be substituted by at least one substituent G; or a —$NR^{65}$-heteroaryl group, preferably a —N(heteroaryl)$_2$ group, comprising 3 to 11 ring atoms, which can optionally be substituted by at least one substituent G, interrupted by at least one of O, S, N and $NR^{65}$;

or $R^8$ and $R^9$ together form a group of formula

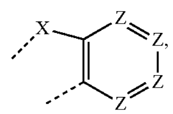

wherein Z is N or CR''', wherein 0 or 1 Z is N, preferably

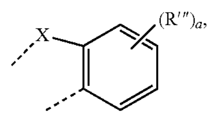

wherein X is O, S, $NR^{75}$ or $CR^{73}R^{74}$, preferably O; R''' is $C_1$-$C_8$alkyl and a is 0, 1 or 2, preferably 0 or 1, more preferably 0;

D is —CO—, —COO—, —S—, —SO—, —$SO_2$—, —O—, —$NR^{65}$—, —$SiR^{70}R^{71}$—, —$POR^{72}$—, —$CR^{63}$═$CR^{64}$—, or —C≡C, preferably —O—, —S— or —$NR^{65}$—.

Preferably, $R^7$, $R^8$ and $R^9$ are independently of each other hydrogen; a $C_1$-$C_{12}$alkyl group, which can optionally be substituted by E and/or interrupted by D; a $C_3$-$C_{12}$cycloalkyl group, which can optionally be substituted by E, a $C_6$-$C_{14}$aryl group, which can optionally be substituted by one or two groups G; a heteroaryl group comprising 3 to 11 ring atoms, which can optionally be substituted by one or two groups G.

Preferably, $R^{27}$, $R^{28}$ are independently of each other hydrogen; or a $C_1$-$C_{12}$alkyl group, which can optionally be substituted by E and/or interrupted by D, preferably a $CH_2$—$C_1$-$C_7$alkyl group, which can optionally be substituted by E and/or interrupted by D.

More preferably, $R^7$, $R^8$ and $R^9$ are independently of each other hydrogen; a $C_1$-$C_8$alkyl group, which can optionally be substituted by at least one substituent E and/or interrupted by D; a $C_3$-$C_6$cycloalkyl group, which can optionally be substituted by at least one substituent E or a phenyl group, which can optionally be substituted by one or two groups G.

More preferably, at least one of $R^{27}$ and $R^{28}$ is hydrogen.

Most preferably, $R^7$, $R^8$ and $R^9$ are independently of each other hydrogen; a $C_1$-$C_8$alkyl group, which can optionally be substituted by at least one substituent E; or a $C_3$-$C_6$cycloalkyl group, which can optionally be substituted by at least one substituent E; or a phenyl group, which can optionally be substituted by one or two groups G.

Most preferably, $R^{27}$ and $R^{28}$ are hydrogen.

Even more preferably, $R^7$, $R^8$ and $R^9$ are independently of each other hydrogen; a $C_1$-$C_8$alkyl group, which can optionally be substituted by at least one substituent E; a $C_3$-$C_6$cycloalkyl group; or $R^8$ is a phenyl group, which can optionally be substituted by one or two groups G.

Further more preferably, $R^7$, $R^8$ and $R^9$ are independently of each other hydrogen; a $C_1$-$C_8$alkyl group; or a $C_3$-$C_6$cycloalkyl group; most preferably, $R^7$, $R^8$ and $R^9$ are a $C_1$-$C_8$alkyl group.

Further more preferably, $R^7$ is hydrogen and $R^8$ and $R^9$ are identical with $R^5$ and $R^6$.

Most preferably, $R^7$ and $R^9$ are hydrogen and $R^8$ is hydrogen or a phenyl group, which can optionally be substituted by one or two groups G.

Even most preferably, $R^7$, $R^8$ and $R^9$ are hydrogen.

In a most preferred embodiment, $R^1$, $R^2$, $R^3$, $R^4$, $R^5$, $R^6$, $R^7$, $R^8$, $R^9$ and $R^{27}$ and $R^{28}$ are hydrogen.

D is —CO—, —COO—, —S—, —SO—, —$SO_2$—, —O—, —$NR^{65}$—, —$SiR^{70}R^{71}$—, —$POR^{72}$—, —$CR^{63}$═$CR^{64}$—, or —C≡C, preferably —O—, —S— or —$NR^{65}$—; more preferably —S—, or —O—;

E is —$OR^{69}$, —$SR^{69}$, —$NR^{65}R^{66}$, —$COR^{68}$, —$COOR^{67}$, —$CONR^{65}R^{66}$, —CN, halogen, or a $C_1$-$C_{18}$alkyl group, which can optionally be substituted by at least one substituent E and/or interrupted by D;

preferably F; a $C_1$-$C_8$haloalkyl group such as $CF_3$, or a $C_1$-$C_8$alkyl group; preferably, E is $C_1$-$C_8$alkyl, $C_1$-$C_8$alkoxy, CN, halogen, preferably F, or $C_1$-$C_8$haloalkyl, such as $CF_3$; more preferably E is $C_1$-$C_8$alkyl, $C_1$-$C_8$alkoxy, or $C_1$-$C_8$haloalkyl, such as $CF_3$; more preferably, E is —$OR^{69}$, $CF_3$, $C_1$-$C_8$alkyl or F; most preferably $CF_3$, $C_1$-$C_8$alkyl or F; even most preferably, E is —$C_1$-$C_8$alkyl.

G is E; or an unsubstituted $C_6$-$C_{14}$aryl group; a $C_6$-$C_{14}$aryl group, which is substituted by F, $C_1$-$C_{18}$alkyl, a $C_3$-$C_6$cycloalkyl group, or $C_1$-$C_{18}$alkyl, which is substituted by F and/or interrupted by O; an unsubstituted heteroaryl group comprising 3 to 11 ring atoms, interrupted by at least one of O, S, N and $NR^{65}$; or a heteroaryl group comprising 3 to 11 ring atoms, interrupted by at least one of O, S, N and $NR^{65}$, which is substituted by F, unsubstituted $C_1$-$C_{18}$alkyl, $SiR^{80}R^{81}R^{82}$, or $C_1$-$C_{18}$alkyl which is substituted by F and/or interrupted by O;

preferably, G is a $C_1$-$C_8$alkyl group, or a group of formula

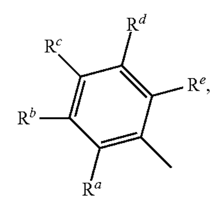

$R^a$ is H, a $C_1$-$C_5$alkyl group, a fluoro$C_1$-$C_4$alkyl group, or a $C_3$-$C_6$cycloalkyl group, preferably $R^a$ H, a $C_1$-$C_5$alkyl group, $C_3$-$C_6$cycloalkyl group; more preferably, $R^a$ is H, or a $C_1$-$C_5$alkyl group;

$R^e$ is H, a $C_1$-$C_5$alkyl group, a fluoro$C_1$-$C_4$alkyl group, or a $C_3$-$C_6$cycloalkyl group; preferably $R^e$ H, a $C_1$-$C_5$alkyl group, $C_3$-$C_6$cycloalkyl group; more preferably, $R^e$ is H, or a $C_1$-$C_5$alkyl group;

$R^e$ is H, a $C_1$-$C_5$alkyl group, a fluoro$C_1$-$C_4$alkyl group, or a $C_3$-$C_6$cycloalkyl group;

$R^c$, $R^b$ and $R^d$ are independently of each other hydrogen; a $C_1$-$C_{18}$alkyl group, which can optionally be substituted by E and/or interrupted by D; a $C_3$-$C_{12}$cycloalkyl group, which can optionally be substituted by G; a $C_3$-$C_{10}$heterocycloalkyl radical which is interrupted by at least one of O, S and $NR^{65}$ and/or substituted by E; a $C_6$-$C_{24}$aryl group, which can optionally be substituted by G;

or a $C_2$-$C_{30}$heteroaryl group, which can optionally be substituted by G; a halogen atom, especially F or Cl; $C_1$-$C_8$haloalkyl such as $CF_3$; CN; or $SiR^{80}R^{81}R^{82}$; preferably $R^c$, $R^b$ and $R^d$ are independently of each other H, a $C_1$-$C_5$alkyl group, $C_3$-$C_6$cycloalkyl group; more preferably, $R^c$, $R^b$ and $R^d$ are independently of each other H, or a $C_1$-$C_5$alkyl group;

or $R^c$ and $R^b$, or $R^a$ and $R^b$ together form a group of formula

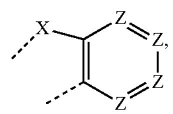

wherein Z is N or CR''', wherein 0 or 1 Z is N, preferably

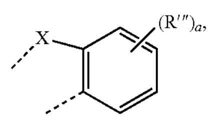

wherein X is O, S, $NR^{75}$ or $CR^{73}R^{74}$, preferably O; R''' is $C_1$-$C_8$alkyl and a is 0, 1 or 2, preferably 0 or 1, more preferably 0; more preferably, G is —$OR^{69}$, $CF_3$ or $C_1$-$C_8$alkyl; most preferably, G is $CF_3$ or $C_1$-$C_8$alkyl; even more preferably, G is $C_1$-$C_8$alkyl.

$R^{63}$ and $R^{64}$ are independently of each other H; unsubstituted $C_6$-$C_{18}$aryl; $C_6$-$C_{18}$aryl which is substituted by $C_1$-$C_{18}$alkyl, or $C_1$-$C_{18}$alkoxy; unsubstituted $C_1$-$C_{18}$alkyl; or $C_1$-$C_{18}$alkyl which is interrupted by —O—; preferably unsubstituted $C_6$-$C_{18}$aryl; $C_6$-$C_{18}$aryl which is substituted by $C_1$-$C_{18}$alkyl, or $C_1$-$C_{18}$alkoxy; unsubstituted $C_1$-$C_{18}$alkyl; or $C_1$-$C_{18}$alkyl which is interrupted by —O—; preferably, $R^{63}$ and $R^{64}$ are independently of each other a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

$R^{65}$ and $R^{66}$ are independently of each other H, an unsubstituted $C_6$-$C_{18}$aryl group; a $C_6$-$C_{18}$aryl group which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; or $R^{65}$ and $R^{66}$ together form a five or six membered ring; preferably, $R^{65}$ and $R^{66}$ are independently of each other a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

$R^{67}$ is H, an unsubstituted $C_6$-$C_{18}$aryl group; a $C_6$-$C_{18}$aryl group, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; preferably an unsubstituted $C_6$-$C_{18}$aryl group; a $C_6$-$C_{18}$aryl group, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; preferably, $R^{67}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

$R^{68}$ is H; an unsubstituted $C_6$-$C_{18}$aryl group; a $C_6$-$C_{18}$aryl group, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; preferably, $R^{68}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

$R^{69}$ is H, an unsubstituted $C_6$-$C_{18}$aryl; a $C_6$-$C_{18}$aryl, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; preferably an unsubstituted $C_6$-$C_{18}$aryl; a $C_6$-$C_{18}$aryl, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; preferably, $R^{69}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

$R^{70}$ and $R^{71}$ are independently of each other an unsubstituted $C_1$-$C_{18}$alkyl group; an unsubstituted $C_6$-$C_{18}$aryl group; or a $C_6$-$C_{18}$aryl group, which is substituted by $C_1$-$C_{18}$alkyl; preferably, $R^{70}$ and $R^{71}$ are independently of each other a phenyl group, which can optionally be substituted by one or two $C_1$-$C_8$alkyl groups; or an unsubstituted $C_1$-$C_{18}$alkyl group.

$R^{72}$ is an unsubstituted $C_1$-$C_{18}$alkyl group; an unsubstituted $C_6$-$C_{18}$aryl group, or a $C_6$-$C_{18}$aryl group, which is substituted by $C_1$-$C_{18}$alkyl; preferably, $R^{72}$ is a phenyl group, which can optionally be substituted by one or two $C_1$-$C_8$alkyl groups; or an unsubstituted $C_1$-$C_{18}$alkyl group.

$R^{73}$ and $R^{74}$ are independently of each other H, $C_1$-$C_{25}$alkyl, $C_1$-$C_{25}$alkyl which is interrupted by O, $C_7$-$C_{25}$arylalkyl, $C_6$-$C_{24}$aryl, $C_6$-$C_{24}$aryl which is substituted by $C_1$-$C_{18}$alkyl, $C_2$-$C_{20}$heteroaryl, or $C_2$-$C_{20}$heteroaryl which is substituted by $C_1$-$C_{18}$alkyl; preferably, $R^{73}$ and $R^{74}$ are independently of each other a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

$R^{75}$ is a $C_6$-$C_{18}$aryl group; a $C_6$-$C_{18}$aryl which is substituted by $C_1$-$C_{18}$alkyl, or $C_1$-$C_{18}$alkoxy; a $C^1$-$C_{18}$alkyl group; or a $C_1$-$C_{18}$alkyl group, which is interrupted by —O—; preferably, $R^{75}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

$R^{80}$, $R^{81}$ and $R^{82}$ are independently of each other a $C_1$-$C_{25}$alkyl group, which can optionally be interrupted by O; a $C_6$-$C_{14}$aryl group, which can optionally be substituted by $C_1$-$C_{18}$alkyl; or a heteroaryl group comprising 3 to 11 ring atoms, which can optionally be substituted by $C_1$-$C_{18}$alkyl; preferably, $R^{80}$, $R^{81}$ and $R^{82}$ are independently of each other a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

In a preferred embodiment the present invention concerns the inventive metal carbene complex, wherein at least one of the radicals $R^1$, $R^2$, $R^3$, $R^4$, $R^5$, $R^6$, $R^7$, $R^8$, and $R^9$ is not hydrogen; preferably, either $R^5$ is not hydrogen or at least two of the radicals $R^1$, $R^2$, $R^3$, $R^4$, $R^5$, $R^6$, $R^7$, $R^8$ and $R^9$ are not hydrogen.

In a further preferred embodiment two adjacent radicals of the group $R^1$, $R^2$, $R^3$, $R^4$, $R^5$, $R^6$, $R^7$, $R^8$, $R^9$, $R^{27}$ and $R^{28}$ are not at the same time an aromatic group, e.g. a $C_6$-$C_{14}$aryl group, which can optionally be substituted by at least one substituent G; a —$NR^{65}$—$C_6$-$C_{14}$aryl group, preferably a —$N(C_6$-$C_{14}aryl)_2$ group, which can optionally be substituted by at least one substituent G; a heteroaryl group comprising 3 to 11 ring atoms, which can optionally be substituted by at least one substituent G, interrupted by at least one of O, S, N and $NR^{65}$; or a —$NR^{65}$-heteroaryl group, preferably a —$N(heteroaryl)_2$ group, comprising 3 to 11 ring atoms, which can optionally be substituted by at least one substituent G, interrupted by at least one of O, S, N and $NR^{65}$.

The present invention also concerns a combination of both preferred embodiments mentioned before.

In a most preferred embodiment, the present invention concerns the inventive metal carbene complex, wherein $R^1$, $R^2$, $R^3$, $R^4$, $R^5$, $R^6$, $R^7$, $R^8$, $R^9$ and $R^{27}$ and $R^{28}$ are hydrogen.

In the case that $R^6$ and $R^8$ are both present in the inventive metal carbene complexes, $R^6$ and $R^8$ are preferably identical.

In the case that $R^5$ and $R^9$ are both present in the inventive metal carbene complexes, $R^5$ and $R^9$ are identical. "Present" means in the sense of the present application that the respective residues are not hydrogen.

The metal carbene complex according to the present invention is preferably an inventive metal carbene complex, wherein $R^1$, $R^2$, $R^3$ and $R^4$ are independently of each other hydrogen; a $C_1$-$C_{12}$alkyl group, which can optionally be substituted by at least one substituent E and/or interrupted by D; a $C_3$-$C_{12}$cycloalkyl group, which can optionally be substituted by at least one substituent E; a $C_6$-$C_{14}$aryl group, which can optionally be substituted by one or two groups G; a heteroaryl group comprising 3 to 11 ring atoms, which can optionally be substituted by one or two groups G; or a —N(phenyl)$_2$ group, which can optionally be substituted by one or two groups G;

preferably, $R^1$, $R^2$, $R^3$ and $R^4$ are independently of each other hydrogen; a $C_1$-$C_8$alkyl group, which can optionally be substituted by at least one substituent E and/or interrupted by D; a $C_3$-$C_6$cycloalkyl group, which can optionally be substituted by at least one substituent E; or a phenyl group, which can optionally be substituted by one or two groups G; more preferably, $R^1$, $R^2$, $R^3$ and $R^4$ are hydrogen;

$R^5$ and $R^6$ are independently of each other hydrogen; a $C_1$-$C_{12}$alkyl group, which can optionally be substituted by E and/or interrupted by D; a $C_3$-$C_{12}$cycloalkyl group, which can optionally be substituted by E;

or one of $R^5$ and $R^6$, preferably $R^5$, is a group of formula

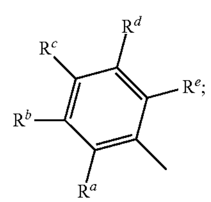

in a further preferred embodiment $R^6$ is a group of formula;

$R^a$ is H, a $C_1$-$C_5$alkyl group, a fluoro$C_1$-$C_4$alkyl group, or a $C_3$-$C_6$cycloalkyl group; preferably H, a $C_1$-$C_5$alkyl group, $C_3$-$C_6$cycloalkyl group; more preferably H, or a $C_1$-$C_5$alkyl group;

$R^e$ is H, a $C_1$-$C_5$alkyl group, a fluoro$C_1$-$C_4$alkyl group, or a $C_3$-$C_6$cycloalkyl group; preferably H, a $C_1$-$C_5$alkyl group, $C_3$-$C_6$cycloalkyl group; more preferably H, or a $C_1$-$C_5$alkyl group;

$R^c$, $R^b$ and $R^d$ are independently of each other hydrogen; a $C_1$-$C_{18}$alkyl group, which can optionally be substituted by E and/or interrupted by D; a $C_3$-$C_{12}$cycloalkyl group, which can optionally be substituted by G; a $C_6$-$C_{14}$aryl group, which can optionally be substituted by G; or a $C_2$-$C_{30}$heteroaryl group, which can optionally be substituted by G; $C_1$-$C_8$haloalkyl such as $CF_3$; or $SiR^{80}R^{81}R^{82}$; preferably $R^c$, $R^b$ and $R^d$ are independently of each other H, a $C_1$-$C_5$alkyl group, $C_3$-$C_6$cycloalkyl group; more preferably H, or a $C_1$-$C_5$alkyl group; further preferably $R^c$, $R^b$ and $R^d$ are hydrogen or a phenyl group which can optionally substituted by one or two groups G;

or $R^c$ and $R^b$, or $R^a$ and $R^b$ together form a group of formula

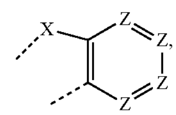

wherein Z is N or CR''', wherein 0 or 1 Z is N, preferably

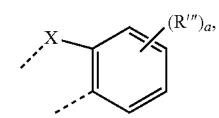

wherein X is O, S, $NR^{75}$ or $CR^{73}R^{74}$, preferably O; R''' is C1-C8alkyl and a is 0, 1 or 2, preferably 0 or 1, more preferably 0;

preferably, $R^5$ and $R^6$ are independently of each other hydrogen; a $C_1$-$C_8$alkyl group, which can optionally be substituted by at least one substituent E and/or interrupted by D; or one of $R^5$ and $R^6$ is a $C_3$-$C_6$cycloalkyl group, which can optionally be substituted by at least one substituent E; or one of $R^5$ and $R^6$ is a phenyl group, which can optionally be substituted by one or two groups G; more preferably, $R^5$ and $R^6$ are hydrogen;

$R^7$, $R^8$ and $R^9$ are independently of each other hydrogen; a $C_1$-$C_{12}$alkyl group, which can optionally be substituted by E and/or interrupted by D; a $C_3$-$C_{12}$cycloalkyl group, which can optionally be substituted by E a $C_6$-$C_{14}$aryl group, which can optionally be substituted by one or two groups G; a heteroaryl group comprising 3 to 11 ring atoms, which can optionally be substituted by one or two groups G;

preferably, $R^7$, $R^8$ and $R^9$ are independently of each other hydrogen; a $C_1$-$C_8$alkyl group, which can optionally be substituted by at least one substituent E and/or interrupted by D; a $C_3$-$C_6$cycloalkyl group, which can optionally be substituted by at least one substituent E; more preferably, $R^7$ and $R^9$ are hydrogen and $R^8$ is hydrogen or a phenyl group which can be optionally substituted by one or two groups G; most preferably, $R^7$, $R^8$ and $R^9$ are hydrogen;

$R^{27}$, $R^{28}$ are independently of each other hydrogen; a $C_1$-$C_{12}$alkyl group, which can optionally be substituted by E and/or interrupted by D, preferably a $CH_2$—$C_1$-$C_7$alkyl group, which can optionally be substituted by E and/or interrupted by D;

preferably, at least one of $R^{27}$ and $R^{28}$ is hydrogen, more preferably, $R^{27}$ and $R^{28}$ are hydrogen;

D is —S—, or —O—

E is —$OR^{69}$, $CF_3$, $C_1$-$C_8$alkyl or F; preferably $CF_3$, $C_1$-$C_8$alkyl or F; most preferably $C_1$-$C_8$alkyl;

G is —$OR^{69}$, $CF_3$ or $C_1$-$C_8$alkyl; preferably $CF_3$ or $C_1$-$C_8$alkyl; more preferably $C_1$-$C_8$alkyl;

$R^{65}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—; and $R^{69}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

More preferably, the metal carbene complex according to the present invention is an inventive metal carbene complex, wherein $R^1$, $R^2$, $R^3$ and $R^4$ are independently of each other hydrogen; a $C_1$-$C_8$alkyl group, which can optionally be substituted by at least one substituent E; a $C_3$-$C_6$cycloalkyl group, which can optionally be substituted by at least one substituent E; or a phenyl group, which can optionally be substituted by one or two groups G;

preferably, $R^1$, $R^2$, $R^3$ and $R^4$ are independently of each other hydrogen; a $C_1$-$C_8$alkyl group, which can optionally be substituted by at least one substituent E; a $C_3$-$C_6$cycloalkyl group; or either $R^2$ and $R^3$ or $R^1$ and $R^4$ are a phenyl group, which can optionally be substituted by one or two groups G; more preferably, $R^1$, $R^2$, $R^3$ and $R^4$ are hydrogen;

$R^5$ and $R^6$ are independently of each other hydrogen; a $C_1$-$C_8$alkyl group, which can optionally be substituted by at least one substituent E; or a $C_3$-$C_6$cycloalkyl group, which can optionally be substituted by at least one substituent E; or a phenyl group, which can optionally be substituted by one or two groups G;

preferably, $R^5$ and $R^6$ are independently of each other hydrogen; a $C_1$-$C_8$alkyl group, which can optionally be substituted by at least one substituent E; a $C_3$-$C_6$cycloalkyl group; or either $R^5$ or $R^6$, preferably $R^5$, is a phenyl group, which can optionally be substituted by one or two groups G; in a further preferred embodiment, $R^6$ is a phenyl group, which can optionally be substituted by one or two groups G; more preferably, $R^5$ and $R^6$ are hydrogen;

$R^7$, $R^8$ and $R^9$ are independently of each other hydrogen; a $C_1$-$C_8$alkyl group, which can optionally be substituted by at least one substituent E; or a $C_3$-$C_6$cycloalkyl group, which can optionally be substituted by at least one substituent E; or a phenyl group, which can optionally be substituted by one or two groups G;

preferably, $R^7$, $R^8$ and $R^9$ are independently of each other hydrogen; a $C_1$-$C_8$alkyl group, which can optionally be substituted by at least one substituent E; a $C_3$-$C_6$cycloalkyl group; or $R^8$ is a phenyl group, which can optionally be substituted by one or two groups G; more preferably, $R^7$ and $R^9$ are hydrogen and $R^8$ is hydrogen or a phenyl group which can be optionally substituted by one or two groups G; most preferably, $R^7$, $R^8$ and $R^9$ are hydrogen;

$R^{27}$ and $R^{28}$ are hydrogen;

E is $CF_3$, $C_1$-$C_8$alkyl or F; preferably, E is $C_1$-$C_8$alkyl;

G is $CF_3$ or $C_1$-$C_8$alkyl; preferably $C_1$-$C_8$alkyl;

$R^{65}$ is a phenyl group, which can optionally be substituted by one or two $C_1$-$C_8$alkyl groups; an unsubstituted $C_1$-$C_8$alkyl group; or a $C_1$-$C_8$alkyl group, which is interrupted by —O—; and $R^{69}$ is a phenyl group, which can optionally be substituted by one or two $C_1$-$C_8$alkyl groups; an unsubstituted $C_1$-$C_8$alkyl group; or a $C_1$-$C_8$alkyl group, which is interrupted by —O—.

Most preferably, the metal carbene complex according to the present invention is an inventive metal carbene complex, wherein $R^1$, $R^2$, $R^3$ and $R^4$ are independently of each other hydrogen; a $C_1$-$C_8$alkyl group; or a $C_3$-$C_6$cycloalkyl group; or either $R^1$ and $R^4$ or $R^2$ and $R^3$ are a phenyl group, which can optionally be substituted by one or two groups G; preferably, $R^1$ and $R^4$ are hydrogen and $R^2$ and $R^3$ are are independently of each other hydrogen; a $C_1$-$C_8$alkyl group; or a $C_3$-$C_6$cycloalkyl group, or a phenyl group, which can optionally be substituted by one or two groups G.

Further most preferably, $R^1$, $R^2$, $R^3$ and $R^4$ are hydrogen.

$R^5$, $R^6$, $R^7$, $R^8$ and $R^9$ are independently of each other hydrogen; a $C_1$-$C_8$alkyl group; or a $C_3$-$C_6$cycloalkyl group; or $R^7$ and $R^9$ are hydrogen and $R^8$ is hydrogen or a phenyl group which can be optionally substituted by one or two groups G and either one of $R^5$ and $R^6$ is phenyl group which can be optionally substituted by one or two groups G and the other one of $R^5$ and $R^6$ is hydrogen; more preferably, $R^5$, $R^6$, $R^7$, $R^8$ and $R^9$ are hydrogen;

and $R^{27}$ and $R^{28}$ are hydrogen.

Even more preferably, the metal carbene complex according to the present invention is an inventive metal carbene complex, wherein either $R^2$ and $R^3$ or $R^1$ and $R^4$ are H; preferably, $R^1$ and $R^4$ are H, more preferably, $R^1$, $R^2$, $R^3$ and $R^4$ are H.

Further more preferably, the metal carbene complex according to the present invention is an inventive metal carbene complex, wherein $R^5$ and $R^6$ are independently of each other hydrogen; a $C_1$-$C_8$alkyl group; or one of $R^5$ and $R^6$, preferably $R^5$, is a phenyl group, which can optionally be substituted by one or two groups selected from $CF_3$ or $C_1$-$C_8$alkyl, preferably optionally be substituted by one or two $C_1$-$C_8$alkyl groups;

preferably, at least one of $R^5$ and $R^6$ is hydrogen; more preferably, $R^5$ and $R^6$ are hydrogen;

$R^7$ and $R^9$ are $C_1$-$C_8$alkyl or $R^7$ and $R^9$ are hydrogen; preferably, $R^7$ and $R^9$ are hydrogen; $R^8$ is hydrogen; a $C_1$-$C_8$alkyl group; or a phenyl group, which can optionally be para-substituted by one group selected from $CF_3$ or $C_1$-$C_8$alkyl, preferably optionally be substituted by one $C_1$-$C_8$alkyl group; preferably, $R^8$ is hydrogen;

$R^{27}$ and $R^{28}$ are hydrogen.

In a further embodiment of the present invention, the metal carbene complex according to the present invention is further more preferably an inventive metal carbene complex, wherein $R^5$ is hydrogen; a $C_1$-$C_8$alkyl group, which can optionally be substituted by at least one substituent selected from $CF_3$, $C_1$-$C_8$alkyl and F, preferably a $C_1$-$C_8$alkyl substituent; a $C_3$-$C_6$cycloalkyl group, which can optionally be substituted by at least one substituent selected from $CF_3$, $C_1$-$C_8$alkyl and F, preferably a $C_1$-$C_8$alkyl substituent; or a phenyl group, which can optionally be substituted by one or two groups selected from $CF_3$ and $C_1$-$C_8$alkyl, preferably optionally be substituted by one or two $C_1$-$C_8$alkyl groups; preferably hydrogen;

$R^6$ and $R^8$ are identical and selected from the group consisting of a $C_1$-$C_8$alkyl group, which can optionally be substituted by at least one substituent selected from $CF_3$, $C_1$-$C_8$alkyl and F, preferably a $C_1$-$C_8$alkyl substituent; a $C_3$-$C_6$cycloalkyl group, which can optionally be substituted by at least one substituent selected from $CF_3$, $C_1$-$C_8$alkyl and F, preferably a $C_1$-$C_8$alkyl substituent; and a phenyl group, which can optionally be substituted by one or two groups selected from $CF_3$ and $C_1$-$C_8$alkyl, preferably optionally be substituted by one or two $C_1$-$C_8$alkyl groups; preferably hydrogen;

and $R^7$ and $R^9$ are hydrogen, wherein $R^5$ and $R^6$ are not at the same time a phenyl group, which can optionally be substituted by one or two groups selected from $CF_3$ and $C_1$-$C_8$alkyl, preferably optionally be substituted by one or two $C_1$-$C_8$alkyl groups;

$R^{27}$ and $R^{28}$ are hydrogen.

In a further embodiment of the present invention, the metal carbene complex according to the present invention is further more preferably an inventive metal carbene complex, wherein $R^7$, $R^8$ and $R^9$ are H; and $R^6$ is H; and $R^{27}$ and $R^{28}$ are hydrogen.

Preferably, the metal carbene complex according to the present invention has the following formula (B), preferably the following formula (II)

(B)

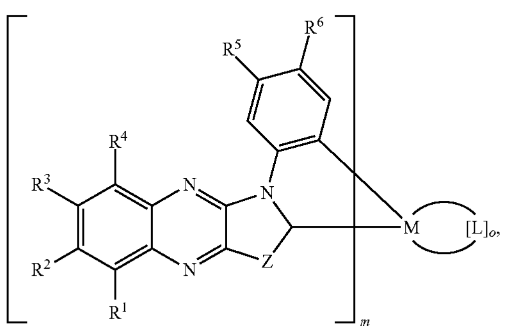

preferably (II)

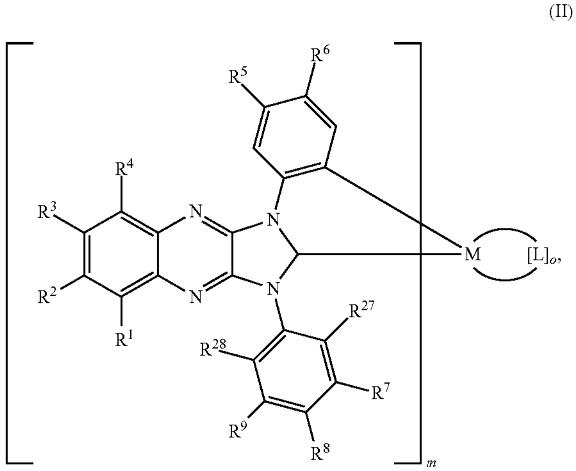

wherein is $NR^x$, O or S, preferably $NR^x$ or O, more preferably $R^x$;

$R^x$ is

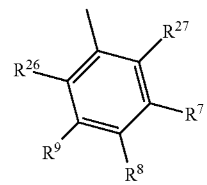

M is Pt, or Ir, preferably Ir;

if M is Ir, m is 1, 2, or 3, preferably 2 or 3; o is 0, 1, or 2, preferably 0 or 1; and the sum of m+o is 3;

in the case that o=2, the ligands L may be the same or different, preferably the same; and in the case that m is 2 or 3, the m carbene ligands may be the same or different, preferably the same;

if M is Pt, m is 1, or 2; o is 0, or 1; and the sum of m+o is 2;

in the case that m is 2, the m carbene ligands may be the same or different, preferably the same; and L is a monoanionic bidentate ligand;

and $R^1$, $R^2$, $R^3$, $R^4$, $R^5$, $R^6$, $R^7$, $R^8$, $R^9$, $R^{27}$ and $R^{28}$ having the meanings mentioned before.

Preferably, the metal carbene complex according to the present invention has the formula (II).

More preferably, the residues, symbols and indices in the metal carbene complex of formula (II) according to the present invention have the following meanings:

M is Ir;

m is 2 or 3; o is 0 or 1; and the sum of m+o is 3;

in the case that o=2, the ligands L may be the same or different, preferably the same; and in the case that m is 2 or 3, the m carbene ligands may be the same or different, preferably the same; and L is a monoanionic bidentate ligand;

and $R^1$, $R^2$, $R^3$, $R^4$, $R^5$, $R^6$, $R^7$, $R^8$, $R^9$, $R^{27}$ and $R^{28}$ having the meanings mentioned before.

In one most preferred embodiment, the metal carbene complex according to the present invention has the formula (B), preferably the formula (II) mentioned above wherein is $NR^x$, O or S, preferably $NR^x$ or O, more preferably $NR^x$;

$R^x$ is

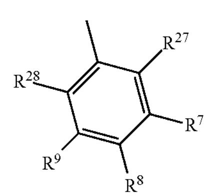

M is Ir;

m is 1; o is 2, wherein the ligands L may be the same or different, preferably the same; and L is a monoanionic bidentate ligand;

and $R^1$, $R^2$, $R^3$, $R^4$, $R^5$, $R^6$, $R^7$, $R^8$, $R^9$, $R^{27}$ and $R^{28}$ having the meanings mentioned before.

In another most preferred embodiment, the metal carbene complex according to the present invention has the formula (B), preferably the formula (II) mentioned above wherein is $NR^x$, O or S, preferably $NR^x$ or O, more preferably $NR^x$;

$R^x$ is

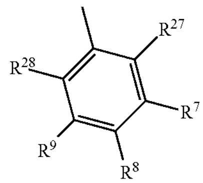

M is Ir;

m is 2; o is 1, wherein the m carbene ligands may be the same or different, preferably the same; and L is a monoanionic bidentate ligand;

and $R^1$, $R^2$, $R^3$, $R^4$, $R^5$, $R^6$, $R^7$, $R^8$, $R^9$, $R^{27}$ and $R^{28}$ having the meanings mentioned before.

In another most preferred embodiment, the metal carbene complex according to the present invention has the formula (B), preferably the formula (II) mentioned above wherein is $NR^x$, O or S, preferably $NR^x$ or O, more preferably $NR^x$;

$R^x$ is

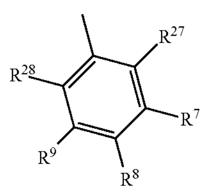

M is Ir;

m is 3; o is 0, wherein the m carbene ligands may be the same or different, preferably the same; and L is a monoanionic bidentate ligand;

and $R^1$, $R^2$, $R^3$, $R^4$, $R^5$, $R^6$, $R^7$, $R^8$, $R^9$, $R^{27}$ and $R^{28}$ having the meanings mentioned before.

Preferably, L in the metal carbene complex according to the present invention is a group of formula (X-1)

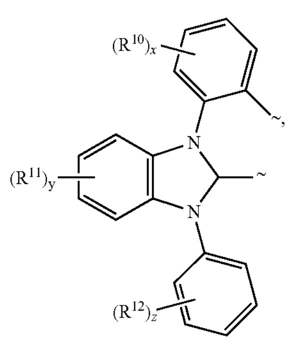

-continued (X-2)

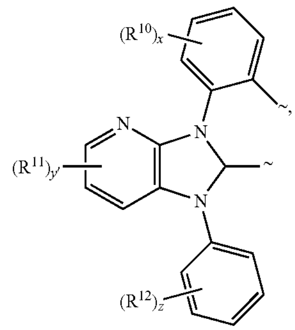

(X-3)

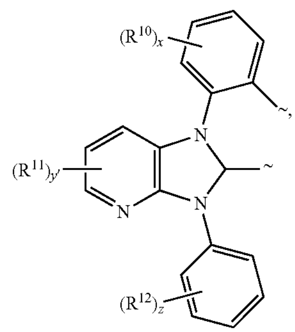

(X-4)

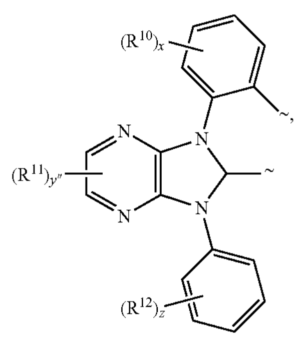

(X-5)

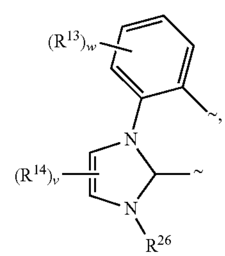

preferably (X-5a)

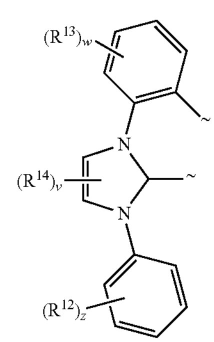

or

-continued
(X-5b)
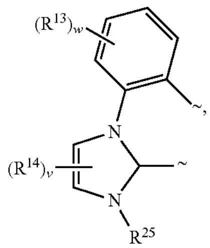
(X-6)
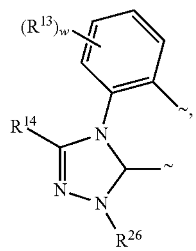
(X-7)
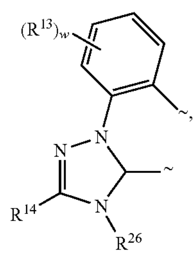
(X-8)
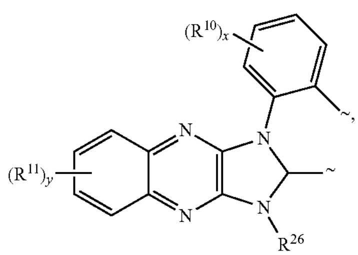
(X-9)
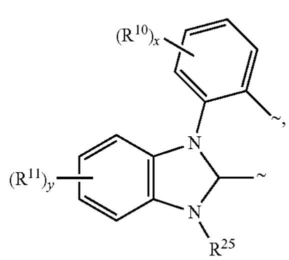
(X-10)
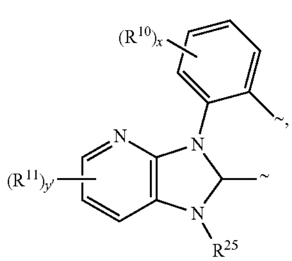
-continued
(X-11)
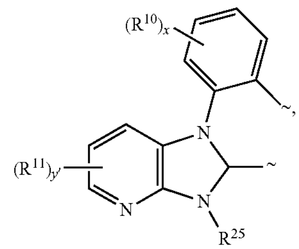
(X-12)
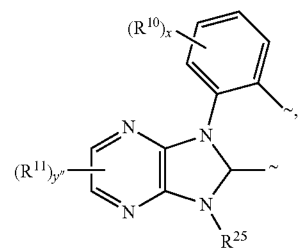
(X-13)
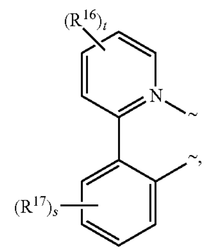
(X-14)
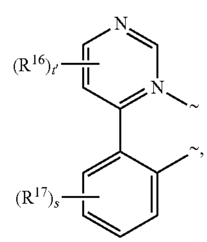
(X-15)
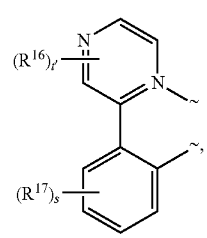
(X-16)
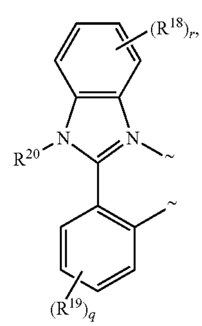

-continued
(X-17)
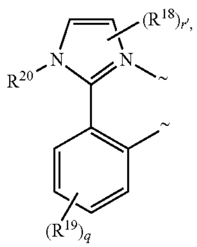
(X-18)
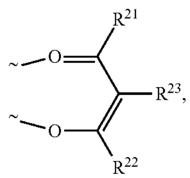
or
(X-19)
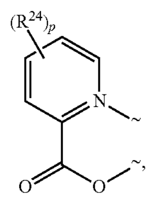
(X-20)
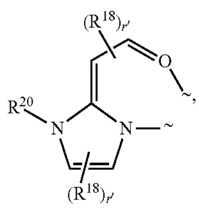
(X-21)
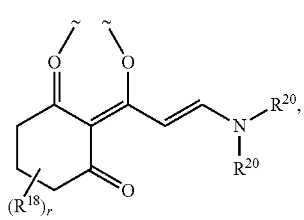
(X-22)
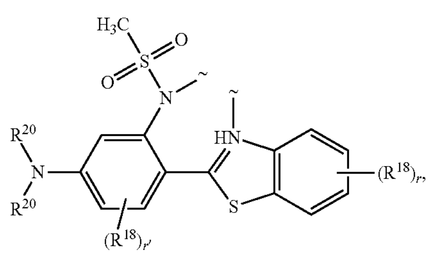
(X-23)
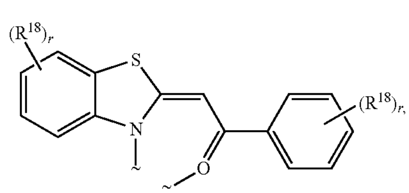
-continued
(X-24)
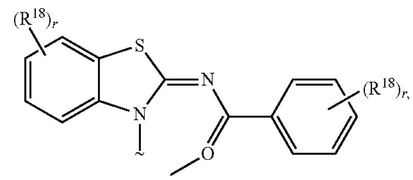
(X-25)
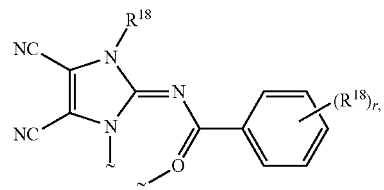
(X-26)
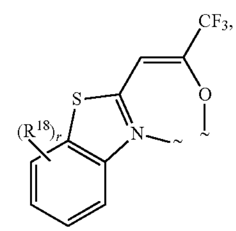
(X-27)
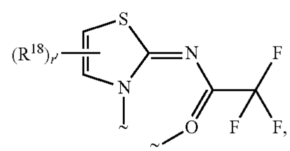
(X-28)
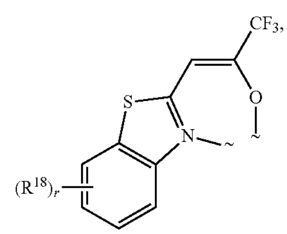
(X-29)
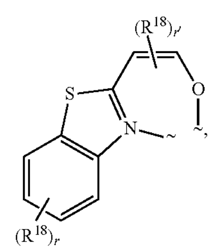
or
(X-30)
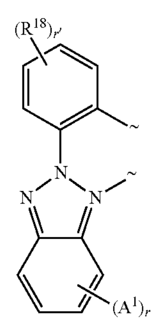

-continued
(X-31)
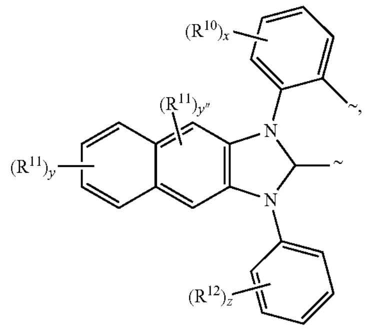
(X-32)
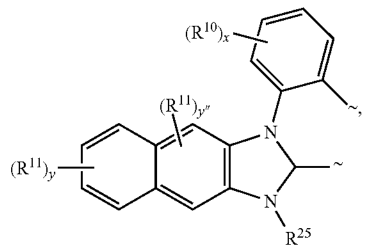
(X-33)\
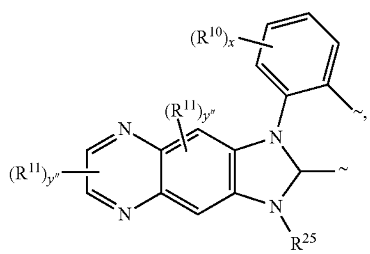
(X-34)
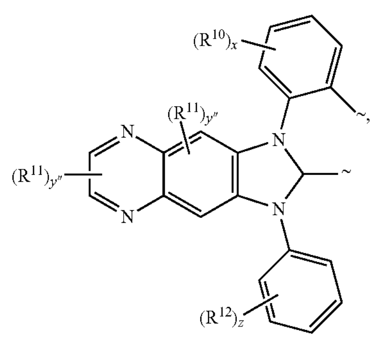
(X-35)
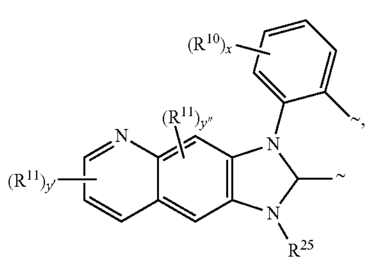
-continued
(X-36)
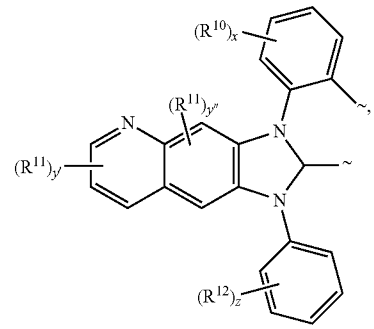
(X-37)
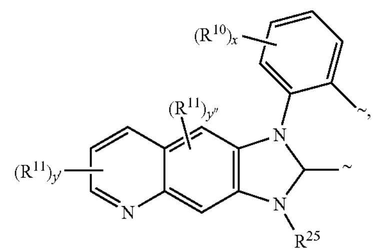
(X-38)
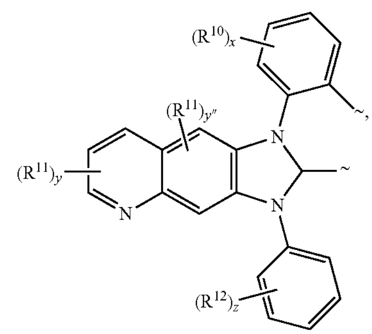
(X-39)
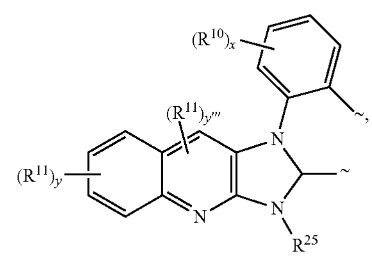
(X-40)
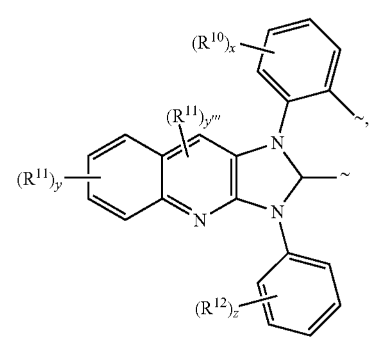

-continued (X-41)

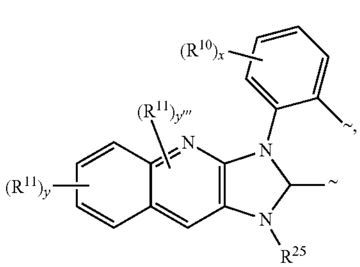

(X-42)

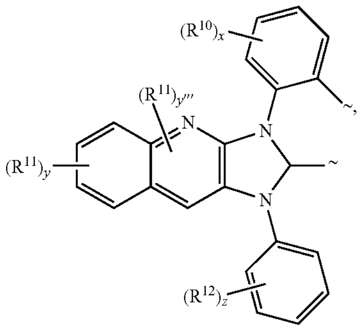

(X-43)

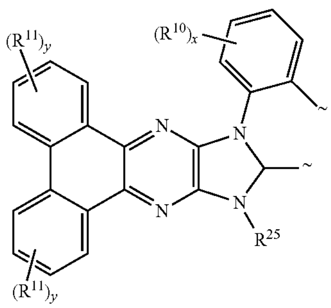

or (X-44)

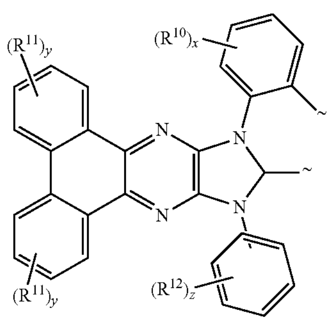

wherein $R^{10}$, $R^{12}$, $R^{13}$, $R^{16}$, $R^{17}$, $R^{18}$ and $R^{19}$ the radicals $R^{10}$, $R^{12}$, $R^{13}$, $R^{16}$, $R^{17}$, $R^{18}$ and $R^{19}$ are—in each case—independently of each other a $C_1$-$C_{18}$alkyl group, which can optionally be substituted by E and/or interrupted by D; a $C_3$-$C_{12}$cycloalkyl group, which can optionally be substituted by E; a heterocycloalkyl group comprising 3 to 6 ring atoms, interrupted by at least one heteroatom selected from —O—, —S— and —$NR^{65}$—, optionally bearing at least one substituent E; a halogen atom, especially F or Cl; $C_1$-$C_8$haloalkyl such as $CF_3$; CN; or $SiR^{80}R^{81}R^{82}$; or one radical $R^{10}$ and/or one radical $R^{12}$; one radical $R^{13}$ and/or one radical $R^{12}$; one radical $R^{16}$ and/or one radical $R^{17}$; one radical $R^{18}$ and/or one radical $R^{19}$ is a group of formula

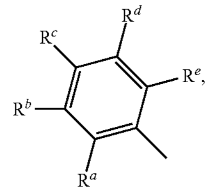

$R^a$ is H, a $C_1$-$C_5$alkyl group, a fluoro$C_1$-$C_4$alkyl group, or a $C_3$-$C_6$cycloalkyl group, preferably $C_1$-$C_5$-alkyl, or H, more preferably H, $R^e$ is H, a $C_1$-$C_5$alkyl group, a fluoro$C_1$-$C_4$alkyl group, or a $C_3$-$C_6$cycloalkyl group, preferably $C_1$-$C_5$-alkyl, or H, more preferably H, $R^c$, $R^b$ and $R^d$ are independently of each other hydrogen; a $C_1$-$C_{18}$alkyl group, which can optionally be substituted by E and/or interrupted by D; a $C_3$-$C_{12}$cycloalkyl group, which can optionally be substituted by G; a $C_3$-$C_{10}$heterocycloalkyl radical which is interrupted by at least one of O, S and $NR^{65}$ and/or substituted by E; a $C_6$-$C_{24}$aryl group, which can optionally be substituted by G; or a $C_2$-$C_{30}$heteroaryl group, which can optionally be substituted by G; a halogen atom, especially F or Cl; $C_1$-$C_8$haloalkyl such as $CF_3$; CN; or $SiR^{80}R^{81}R^{82}$; preferably H or a $C_1$-$C_8$alkyl group, more preferably, $R^d$ is H and one of $R^b$ or $R^c$ is a $C_1$-$C_8$alkyl group and the other one of $R^b$ and $R^d$ is H; even more preferably $R^c$, $R^b$ and $R^d$ are H; or two adjacent radicals $R^{10}$ and/or two adjacent radicals $R^{12}$; two adjacent radicals $R^{13}$ and/or two adjacent radicals $R^{12}$; two adjacent radicals $R^{16}$ and/or two adjacent radicals $R^{17}$; or two adjacent radicals $R^{19}$; or $R^c$ and $R^b$, or $R^a$ and $R^b$ together form a group of formula

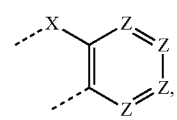

wherein Z is N or CR''', wherein 0 or 1 Z is N, preferably

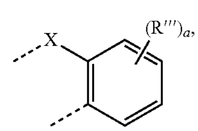

wherein X is O, S, $NR^{75}$ or $CR^{73}R^{74}$, preferably O; R''' is $C_1$-$C_8$alkyl and a' is 0 or 1, preferably 0;

preferably, the radicals $R^{10}$, $R^{12}$, $R^{13}$, $R^{16}$, $R^{17}$, $R^{18}$ and $R^{19}$ are—in each case—independently of each other a $C_1$-$C_8$alkyl group, which can optionally be substituted by at least one substituent E and/or interrupted by D, especially methyl, ethyl, i-propyl, n-butyl, sec-butyl, tert-butyl or isoamyl; a $C_3$-$C_6$cycloalkyl group, which can optionally be substituted by at least one substituent E; F;

Cl; $C_1$-$C_8$haloalkyl such as $CF_3$; CN;

in a further preferred embodiment, $R^{10}$, $R^{12}$, $R^{13}$, $R^{16}$, $R^{17}$, $R^{18}$ and R19 are—in each case—independently of each other hydrogen, a $C_1$-$C_8$alkyl group especially methyl, ethyl, i-propyl, n-butyl, sec-butyl, tert-butyl or isoamyl; or a phenyl group, which can optionally be substituted by one or two groups G; or a $C_2$-$C_{30}$heteroaryl group, which can optionally be substituted by G; more preferably hydrogen, a $C_1$-$C_8$alkyl group especially methyl, ethyl, i-propyl, n-butyl, sec-butyl, tert-butyl or isoamyl; or a phenyl group, which can optionally be substituted by one or two $C_1$-$C_8$alkyl groups, for example 2-tolyl, 3-tolyl, 4-tolyl, 2-ethylphenyl, 3-ethylphenyl, 4-ethylphenyl, 2-isopropylphenyl, 3-isopropylphenyl or 4-isopropylphenyl; most preferably hydrogen or a $C_1$-$C_8$alkyl group especially methyl, ethyl, i-propyl, n-butyl, sec-butyl, tert-butyl or isoamyl.

or two adjacent radicals $R^{10}$ and/or two adjacent radicals $R^{12}$; two adjacent radicals $R^{13}$ and/or two adjacent radicals $R^{12}$; two adjacent radicals $R^{16}$ and/or two adjacent radicals $R^{17}$; or two adjacent radicals $R^{19}$ together form a group of formula

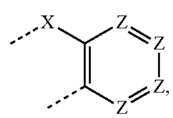

wherein Z is N or CR''', wherein 0 or 1 Z is N, preferably

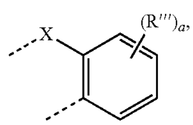

wherein X is O, S, $NR^{75}$ or $CR^{73}R^{74}$, preferably O or S; more preferably O; R''' is $C_1$-$C_8$alkyl and a' is 0 or 1, preferably 0;

$R^{11}$, $R^{14}$, $R^{20}$, $R^{21}$, $R^{22}$, $R^{23}$ and $R^{24}$:

the radicals $R^{11}$, $R^{14}$, $R^{20}$, $R^{21}$, $R^{22}$, $R^{23}$ and $R^{24}$ are—in each case—independently of each other a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one heteroatom selected from —O—, —S— and —$NR^{65}$—, optionally bearing at least one substituent E; a $C_6$-$C_{14}$aryl group, which can optionally be substituted by one or two groups G; a heteroaryl group comprising 3 to 11 ring atoms, which can optionally be substituted by one or two groups G; or a —$NR^{65}$-phenyl group, which can optionally be substituted by one or two groups G;

preferably, $R^{11}$, $R^{14}$, $R^{20}$, $R^{21}$, $R^{22}$, $R^{23}$ and $R^{24}$ are—in each case—independently of each other hydrogen; a $C_1$-$C_8$alkyl group, which can optionally be substituted by at least one substituent E and/or interrupted by D; a $C_3$-$C_6$cycloalkyl group, which can optionally be substituted by at least one substituent E; or a phenyl group, which can optionally be substituted by one or two groups G; $C_1$-$C_8$ haloalkyl such as $CF_3$; or $SiR^{80}R^{81}R^{82}$; or in the case of X-1, X-2, X-3, X-31, X-34, X-35, X-36, X-37 and X-38 CN;

or two adjacent radicals $R^{11}$ or two adjacent radicals $R^{14}$ form together a group

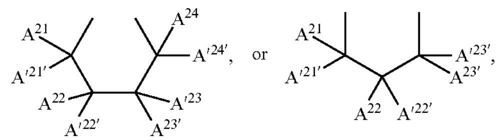

wherein $A^{21}$, $A^{21'}$, $A^{22}$, $A^{22'}$, $A^{23}$, $A^{23'}$, $A^{24'}$ and $A^{24}$ are independently of each other H, a $C_1$-$C_4$alkyl group, a $C_3$-$C_6$cycloalkyl group, or a fluoro$C_1$-$C_4$alkyl group;

preferably, $R^{11}$, $R^{14}$, $R^{20}$, $R^{21}$, $R^{22}$, $R^{23}$ and $R^{24}$ are—in each case—independently of each other a $C_1$-$C_8$alkyl group, which can optionally be substituted by at least one substituent E and/or interrupted by D, especially methyl, ethyl, i-propyl, n-butyl, sec-butyl, tert-butyl or isoamyl; a $C_3$-$C_6$cycloalkyl group, which can optionally be substituted by at least one substituent E; $C_1$-$C_8$haloalkyl such as $CF_3$; or in the case of X-1, X-2, X-3, X-31, X-34, X-35, X-36, X-37 and X-38 CN;

in a further preferred embodiment $R^{11}$, $R^{14}$, $R^{20}$, $R^{21}$, $R^{22}$, $R^{23}$ and $R^{24}$ are—in each case—independently of each other hydrogen, a $C_1$-$C_8$alkyl group especially methyl, ethyl, i-propyl, n-butyl, sec-butyl, tert-butyl or isoamyl; or a phenyl group, which can optionally be substituted by one or two groups G; or a $C_2$-$C_{30}$heteroaryl group, which can optionally be substituted by G; more preferably hydrogen, a $C_1$-$C_8$alkyl group especially methyl, ethyl, i-propyl, n-butyl, sec-butyl, tert-butyl or isoamyl; or a phenyl group, which can optionally be substituted by one or two $C_1$-$C_8$alkyl groups, for example 2-tolyl, 3-tolyl, 4-tolyl, 2-ethylphenyl, 3-ethylphenyl, 4-ethylphenyl, 2-isopropylphenyl, 3-isopropylphenyl or 4-isopropylphenyl; most preferably hydrogen or a $C_1$-$C_8$alkyl group especially methyl, ethyl, i-propyl, n-butyl, sec-butyl, tert-butyl or isoamyl;

or two adjacent radicals $R^{11}$ or two adjacent radicals $R^{14}$ form together a group

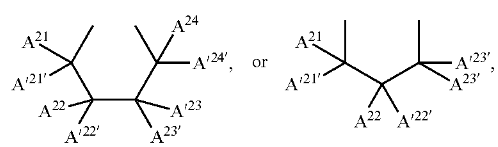

wherein $A^{21}$, $A^{21'}$, $A^{22}$, $A^{22'}$, $A^{23}$, $A^{23'}$, $A^{24'}$ and $A^{24}$ are independently of each other H, a $C_1$-$C_4$alkyl group, a $C_3$-$C_6$cycloalkyl group, or a fluoro$C_1$-$C_4$alkyl group;

$R^{25}$ is $CH_3$ or ethyl or iso-propyl;

$R^{26}$ is a phenyl group, which can optionally be substituted by one or two groups selected from $CF_3$ and $C_1$-$C_8$alkyl; preferably optionally substituted by one or two $C_1$-$C_8$alkyl groups; or $R^{26}$ is $CH_3$; or iso-propyl; preferably, $R^{26}$ is a phenyl group, which can optionally be substituted by one or two groups selected from $CF_3$ and $C_1$-$C_8$alkyl preferably optionally substituted by one or two $C_1$-$C_8$alkyl groups; in a further preferred embodiment $R^{26}$ is a phenyl group, which is substituted by one or two phenyl groups;

D is —S—, —O—, or —$NR^{65}$—;

E is —$OR^{69}$, —CN, $CF_3$, $C_1$-$C_8$alkyl or F; preferably $CF_3$ or $C_1$-$C_8$alkyl; more preferably $C_1$-$C_8$alkyl;

G is —$OR^{69}$, —CN, $CF_3$ or $C_1$-$C_8$alkyl; preferably $C_1$-$C_8$alkyl;

$R^{65}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—; and $R^{69}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—; $A^1$ is $C_6$-$C_{10}$aryl;

or two adjoint groups $A^1$ together form a group

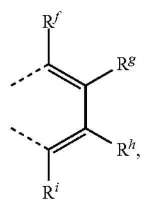

wherein $R^f$, $R^g$, $R^h$ and $R^i$ are independently of each other H, or $C_1$-$C_8$alkyl;

$Q^1$ and $Q^2$ are independently of each other hydrogen, $C_1$-$C_{18}$alkyl, or $C_6$-$C_{18}$aryl;

w, x are are independently of each other 0, 1 or 2, preferably 0 or 1; more preferably 0;

z is 0, 1, 2 or 3, preferably 0, 1, more preferably 0;

y, y', y'', u, v are independently of each other 0, 1 or 2, preferably 0 or 2; more preferably 0;

y''' is 0 or 1, preferably 0;

p, q, r, s, t, t', t'' are are independently of each other 0, 1, 2, 3 or 4, preferably 0, 1, 2 or 3;

r' is 0, 1 or 2, preferably 0 or 1, more preferably 0.

Preferably, L in the metal carbene complex according to the present invention is a group of formula (X-1), (X-2), (X-3), (X-4), (X-5), preferably (X-5a) and (X-5b), (X-8), (X-9), (X-10), (X-11), (X-12), (X-13), (X-14), (X-15), (X-16), (X-17), (X-18), (X-20), (X-21), (X-22), (X-23), (X-24), (X-25), (X-26), (X-27), (X-28), and (X-29); or a group of formula (X-30), (X-31), (X-32), (X-33), (X-34), (X-35), (X-36), (X-37), (X-38), (X-39), (X-40), (X-41), (X-42), (X-43) or (X-44).

More preferably, L in the metal carbene complex according to the present invention is a group of formula (X-1), (X-2), (X-3), (X-4), (X-5), preferably (X-5a) and (X-5b), (X-8), (X-9), (X-10), (X-11), (X-12), (X-13), (X-14), (X-15), (X-16), (X-17), and (X-18); or a group of formula (X-31), (X-32), (X-33), (X-34), (X-35), (X-36), (X-37), (X-38), (X-39), (X-40), (X-41), (X-42), (X-43) or (X-44).

Most preferably, L in the metal carbene complex according to the present invention is a group of formula (X-1), (X-2), (X-3), (X-4), (X-5), preferably (X-5a) and (X-5b), (X-8), (X-9), (X-10), (X-11), and (X-12); or a group of formula (X-31), (X-32), (X-33), (X-34), (X-35), (X-36), (X-37), (X-38), (X-39), (X-40), (X-41), (X-42), (X-43) or (X-44).

Even more preferably, L in the metal carbene complex according to the present invention is a group of formula (X-1), (X-4), (X-5), preferably (X-5a) and (X-5b), (X-8), (X-9), (X-10), (X-11), and (X-12); more preferably (X-1), (X-4), (X-5), (X-8), (X-9), and (X-12).

Most preferably, L in the metal carbene complex according to the present invention is a group of formula (X-1) or (X-4).

In a further preferred embodiment, L in the metal carbene complex according to the present invention is a group of formula (X-1), (X-2), (X-3), (X-4), (X-5a), (X-8, wherein $R^{26}$ is a phenyl group, which can optionally be substituted by one or two groups selected from $CF_3$ and $C_1$-$C_8$alkyl), (X-31), (X-34), (X-36), (X-38), (X-40), (X-42) or (X-44).

In a further more preferred embodiment, L in the metal carbene complex according to the present invention is a group of formula (X-1), (X-2), (X-3), (X-4), (X-5a), (X-8, wherein $R^{26}$ is a phenyl group, which can optionally be substituted by one or two selected from $CF_3$ and $C_1$-$C_8$alkyl), (X-31), (X-34) or (X-44).

In a further even more preferred embodiment, L in the metal carbene complex according to the present invention is a group of formula (X-1), (X-4), (X-5a), (X-8, wherein $R^{26}$ is a phenyl group, which can optionally be substituted by one or two selected from $CF_3$ and $C_1$-$C_8$alkyl) or (X-31); further even more preferably L is (X-1), (X-4), (X-5a) or (X-31) and most preferably, L is (X-1) or (X-4).

In a further even more preferred embodiment, L in the metal carbene complex according to the present invention is a group of formula (X-1), (X-5a) or (X-31), more preferably (X-1) or (X-5a).

Most preferably, L is (X-1).

The metal M in the inventive metal carbene complexes is Ir or Pt, preferably Ir, more preferably Ir (III). In the case that the metal is Pt, Pt(II) is preferred.

In the most preferred metal carbene complexes of formula (II) according to the present invention the residues, symbols and indices have the following meanings:

M is Ir;

m is 2 or 3;

o is 0 or 1; and

L is (X-1) or (X-4), whereby the m carbene ligands are preferably the same (identical), wherein the further residues, symbols and indices in the metal carbene complexes of formula (II) are the same as mentioned above.

In a further more preferred embodiment, L in the metal carbene complex mentioned above is a group of formula (X-5a), (X-31), more preferably (X-1), (X-8, wherein $R^{26}$ is a phenyl group, which can optionally be substituted by one or two selected from $CF_3$ and $C_1$-$C_8$alkyl) or (X-31).

Even further preferred are metal carbene complexes of formula (II) according to the present invention the residues, symbols and indices have the following meanings:

M is Ir;

m is 2 or 3;

o is 0 or 1; and

L is (X-1) or (X-4), whereby the m carbene ligands are preferably the same (identical);

wherein the residues $R^1$, $R^2$, $R^3$, $R^4$, $R^5$, $R^6$, $R^7$, $R^8$, $R^9$, $R^{27}$, $R^{28}$ are H and the indices x, y, z and y'' are 0.

In a further more preferred embodiment, L in the metal carbene complex mentioned above is a group of formula (X-5a), (X-8, wherein $R^{26}$ is a phenyl group, which can optionally be substituted by one or two selected from $CF_3$ and $C_1$-$C_8$alkyl) or (X-31).

In further most preferred embodiment, the residues, symbols and indices in the metal carbene complexes of formula (II) according to the present invention have the following meanings:

M is Ir;

m is 1;

o is 2; and

L is (X-1), (X-4) (X-5a), (X-8, wherein $R^{26}$ is a phenyl group, which can optionally be substituted by one or two selected from $CF_3$ and $C_1$-$C_8$alkyl) or (X-31), preferably (X-1), (X-4), (X-5a) or (X-31), even more preferably (X-1) or (X-4);

whereby the o carbene ligands are preferably the same (identical)

wherein the further residues, symbols and indices in the metal carbene complexes of formula (II) are the same as mentioned above.

In an even further preferred embodiment, the residues, symbols and indices in the metal carbene complexes of formula (II) according to the present invention have the following meanings:

M is Ir;

m is 1, o is 2; and

L is (X-1), (X-4) (X-5a), (X-8, wherein $R^{26}$ is a phenyl group, which can optionally be substituted by one or two selected from $CF_3$ and $C_1$-$C_8$alkyl) or (X-31), preferably (X-1), (X-4), (X-5a) or (X-31), even more preferably (X-1) or (X-4);

whereby the o carbene ligands are preferably the same (identical), wherein the residues $R^1$, $R^2$, $R^3$, $R^4$, $R^5$, $R^6$, $R^7$, $R^8$, $R^9$, $R^{27}$, $R^{28}$ are H and the indices x, y, z and y" are 0.

Preferably, the metal carbene complex according to the present invention is selected from (IIa)

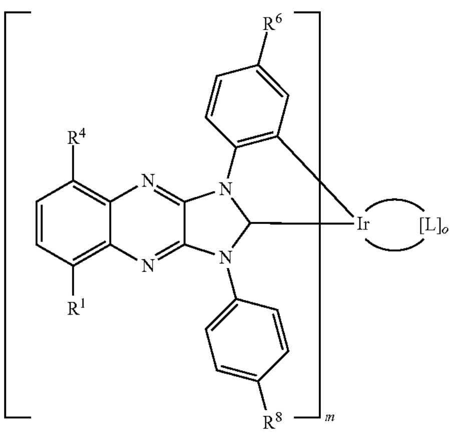

(IIb)

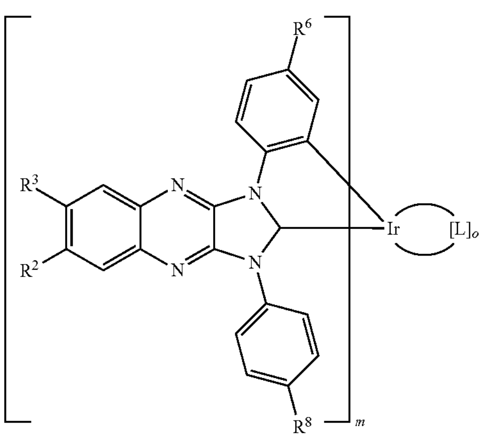

-continued (IIc)

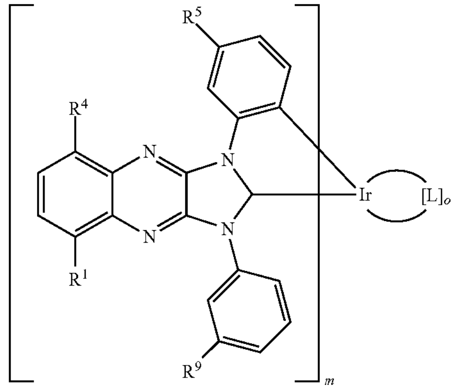

(IId)

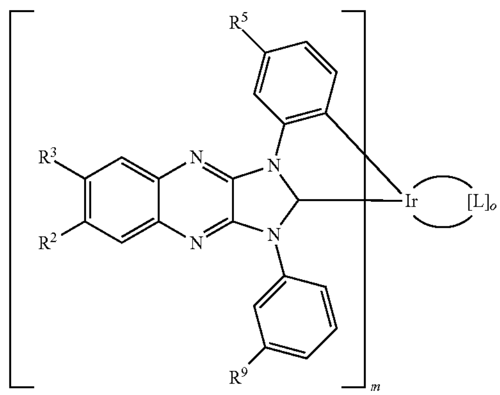

(IIe)

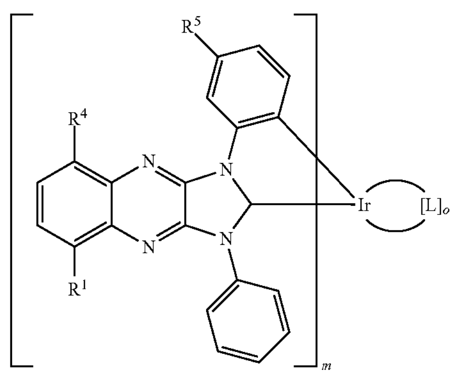

(IIf)

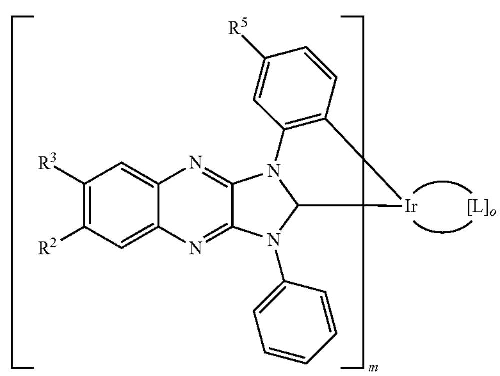

-continued (IIg)

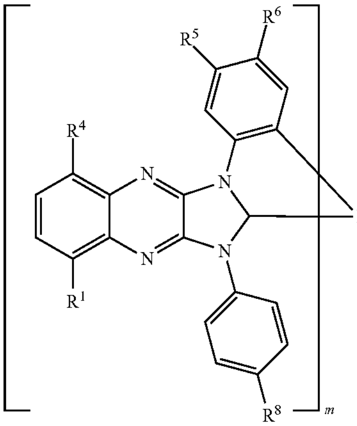

(IIh)

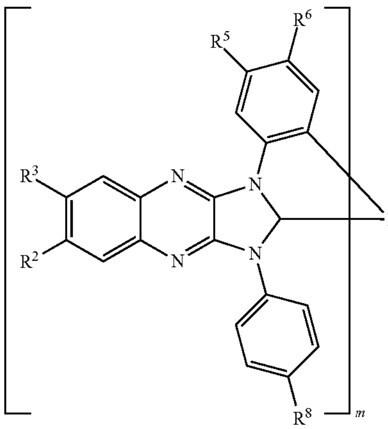

wherein $R^1$, $R^2$, $R^3$ and $R^4$ are independently of each other—in each case—hydrogen; a $C_1$-$C_8$alkyl group, which can optionally be substituted by at least one substituent E and/or interrupted by D; a $C_3$-$C_6$cycloalkyl group, which can optionally be substituted by at least one substituent E; or a phenyl group, which can optionally be substituted by one or two groups G;

preferably, in the case that $R^1$, $R^2$, $R^3$ and/or $R^4$ are a phenyl group, which can optionally be substituted by one or two groups G; $R^5$, $R^6$, $R^8$ and $R^9$ are not a phenyl group, which can optionally be substituted by one or two groups G;

more preferably, $R^1$, $R^2$, $R^3$ and $R^4$ are independently of each other—in each case—hydrogen; a $C_1$-$C_8$alkyl group, which can optionally be substituted by at least one substituent E and/or interrupted by D; or a $C_3$-$C_6$cycloalkyl group, which can optionally be substituted by at least one substituent E; most preferably, $R^1$ and $R^4$ as well as $R^2$ and $R^3$ are identical; even further more preferably, $R^1$, $R^2$, $R^3$ and $R^4$ are hydrogen;

$R^5$ and $R^6$ are independently of each other—in each case—hydrogen; a $C_1$-$C_8$alkyl group, which can optionally be substituted by at least one substituent E and/or interrupted by D; or a $C_3$-$C_6$cycloalkyl group, which can optionally be substituted by at least one substituent E; or a phenyl group, which can optionally be substituted by one or two groups G;

preferably, $R^5$ and $R^6$ are independently of each other—in each case—hydrogen; a $C_1$-$C_8$alkyl group, which can optionally be substituted by at least one substituent E and/or interrupted by D; or a $C_3$-$C_6$cycloalkyl group, which can optionally be substituted by at least one substituent E; or either $R^5$ or $R^6$, preferably $R^5$, are a phenyl group, which can optionally be substituted by one or two groups G;

more preferably, $R^5$ and $R^6$ are independently of each other—in each case—hydrogen; a $C_1$-$C_8$alkyl group, which can optionally be substituted by at least one substituent E and/or interrupted by D; or a $C_3$-$C_6$cycloalkyl group, which can optionally be substituted by at least one substituent E; or either $R^5$ or $R^6$, preferably $R^5$, is a phenyl group, which can optionally be substituted by one or two groups G; in a further preferred embodiment, $R^6$ is a phenyl group, which can optionally be substituted by one or two groups G; more preferably, $R^5$ and $R^6$ are hydrogen; $R^8$ and $R^9$ are independently of each other hydrogen; a $C_1$-$C_8$alkyl group, which can optionally be substituted by at least one substituent E and/or interrupted by D; or a $C_3$-$C_6$cycloalkyl group, which can optionally be substituted by at least one substituent E; or a phenyl group, which can optionally be substituted by one or two groups G;

preferably, $R^8$ and $R^9$ are independently of each other—in each case—hydrogen; a $C_1$-$C_8$alkyl group, which can optionally be substituted by at least one substituent E and/or interrupted by D; or a $C_3$-$C_6$cycloalkyl group, which can optionally be substituted by at least one substituent E; or either $R^8$ or $R^9$ are a phenyl group, which can optionally be substituted by one or two groups G; more preferably, $R^8$ and $R^9$ are independently of each other—in each case—hydrogen; a $C_1$-$C_8$alkyl group, which can optionally be substituted by at least one substituent E and/or interrupted by D; or a $C_3$-$C_6$cycloalkyl group, which can optionally be substituted by at least one substituent E; more preferably, $R^9$ is hydrogen and $R^8$ is hydrogen or a phenyl group which can be optionally substituted by one or two groups G; most preferably, $R^8$ and $R^9$ are hydrogen;

D is —S— or —O—;

E is $—OR^{69}$, —CN, $CF_3$, $C_1$-$C_8$alkyl or F; preferably $CF_3$ or $C_1$-$C_8$alkyl; preferably $C_1$-$C_8$alkyl;

G is $—OR^{69}$, —CN, $CF_3$ or $C_1$-$C_8$alkyl; preferably $C_1$-$C_8$alkyl;

$R^{69}$ is a phenyl group, which can optionally be substituted by one or two $C_1$-$C_8$alkyl groups; an unsubstituted $C_1$-$C_8$alkyl group; or a $C_1$-$C_8$alkyl group, which is interrupted by —O—;

L is a monoanionic bidentate ligand, for example (X-1′)

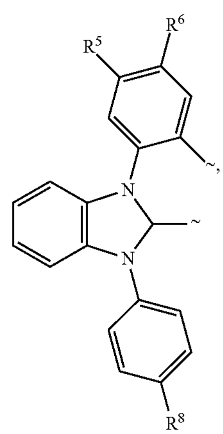

-continued (X-2')

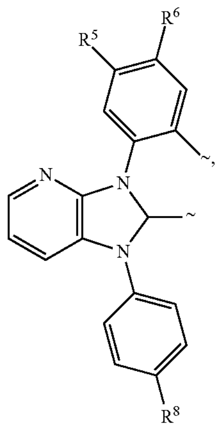

(X-3')

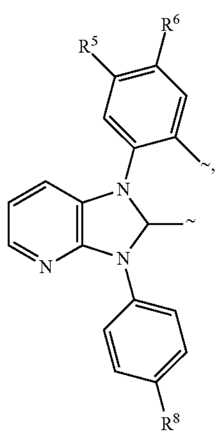

(X-4')

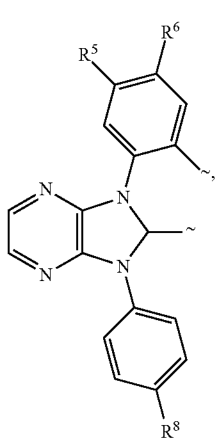

as well as (X-5a')

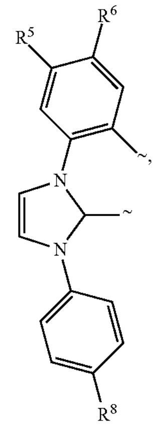

(X-8')

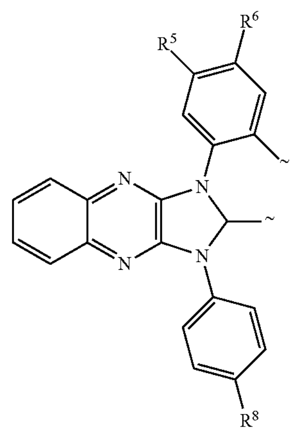

and (X-31')

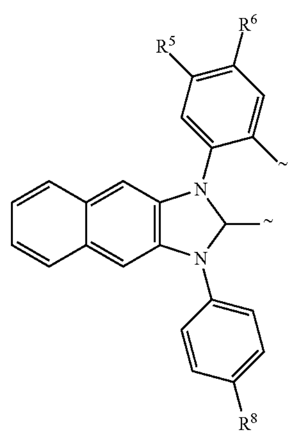

preferably (X-1'), (X-4'), (X-5a'), (X-8') or (X-31'); more preferably, (X-1'), (X-4'), (X-5a') or (X-31'); most preferably, (X-1'), (X-4') or (X-5a'), further most preferably, (X-1') or (X-4'); even further most preferably (X-1').

m is 1, 2, or 3; preferably 2 or 3; or—in a further preferred embodiment—1;

o is 0, 1, or 2; preferably 0 or 1; or—in a further preferred embodiment—2;

and the sum of m+o is 3;

in the case that o=2, the ligands L may be the same or different, preferably the same; and in the case that m is 2 or 3, the m carbene ligands may be the same or different, preferably the same.

More preferably, at least one of the residues $R^1$, $R^2$, $R^3$, $R^4$, $R^5$, $R^6$, $R^8$ and $R^9$ in the complexes of formulae (IIa), (IIb), (IIc), (IId), (IIe), (IIf), (IIg) and (IIh) is not hydrogen; most preferably, in formula (IIa), two or all of $R^1$, $R^4$, $R^6$ and $R^8$ are not hydrogen; in formula (IIb), two or all of $R^2$, $R^3$, $R^6$ and $R^8$ are not hydrogen; in formula (IIc), two or all of $R^1$, $R^4$, $R^5$ and $R^9$ are not hydrogen; in formula (IId), two or all of $R^2$, $R^3$, $R^5$ and $R^9$ are not hydrogen; in formula (IIe), one or all of $R^1$, $R^4$ and $R^5$ are not hydrogen; in formula (IIf), one or all of $R^2$, $R^3$ and $R^5$ are not hydrogen; in formula (IIg), three or all of $R^1$, $R^4$, $R^5$, $R^6$ and $R^8$are not hydrogen; in formula (IIh), three or all of $R^2$, $R^3$, $R^5$, $R^6$ and $R^8$are not hydrogen.

In a further preferred embodiment, $R^1$, $R^2$, $R^3$ and $R^4$ are hydrogen and the residues $R^5$, $R^6$ and $R^8$ are as mentioned above.

In a further preferred embodiment of the present invention, $R^5$, $R^6$ and $R^8$ in formulae (X-1'), (X-2'), (X-3'), and (X-4') are hydrogen. In a further preferred embodiment of the present invention, $R^5$, $R^6$ and $R^8$ in formulae (X-5a'), (X-8') and (X-31') are hydrogen.

More preferably, the metal carbene complex according to the present invention is selected from the metal carbene complexes (IIa), (IIb), (IIe), (IIf), (IIg) and (IIh). In a further more preferred embodiment, the metal carbene complex according to the present invention is selected from the metal carbene complex (IId). Most preferably, the metal carbene complex according to the present invention is selected from the metal carbene complexes (IIb), (IId), (IIf) and (IIh).

In a most preferred embodiment, $R^1$, $R^2$, $R^3$, $R^4$, $R^5$, $R^6$, $R^8$, and $R^9$ are hydrogen, i.e. the metal carbene complex of the present invention has the following formula:

(IIi)

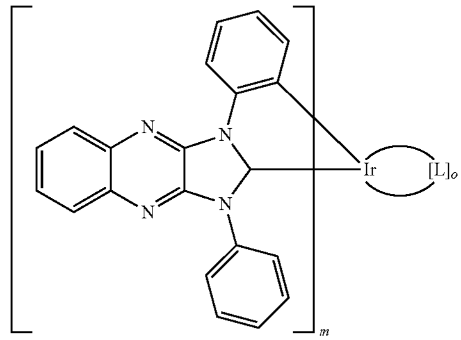

Most preferably, the metal carbene complex according to the present invention is selected from (II-1)

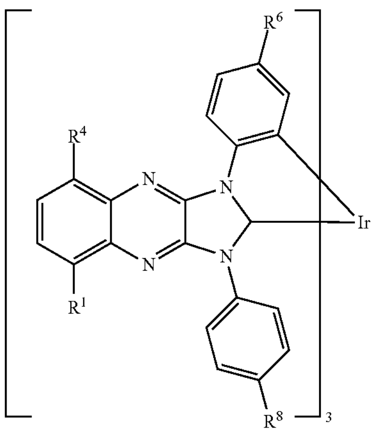

(II-2)

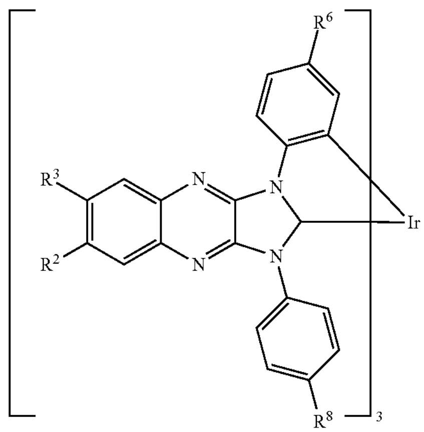

(II-3)

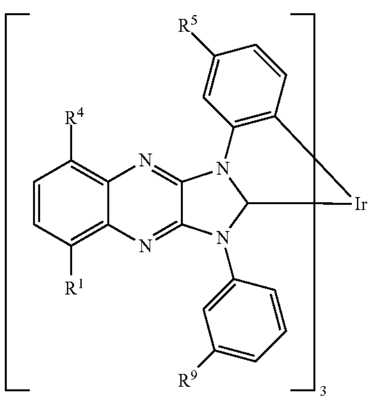

(II-4)

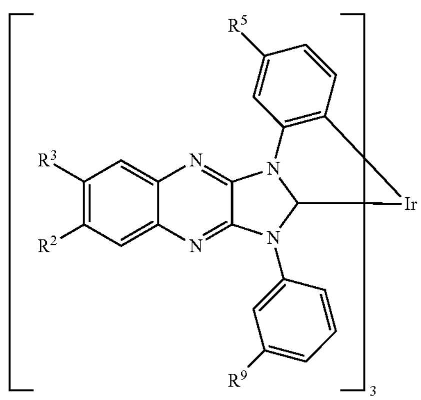

-continued
(II-5)
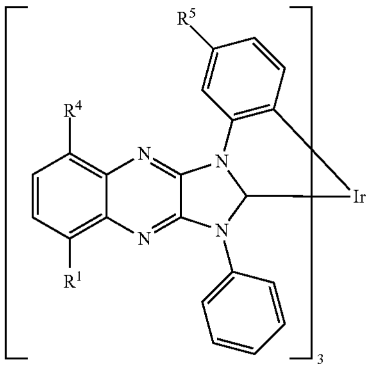
(II-6)
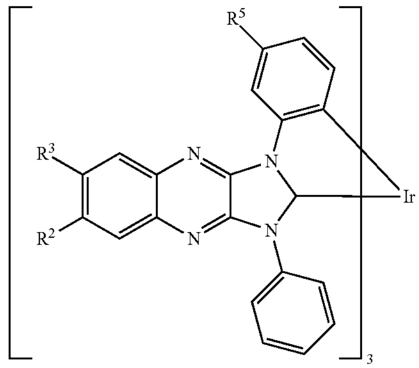
(II-7)
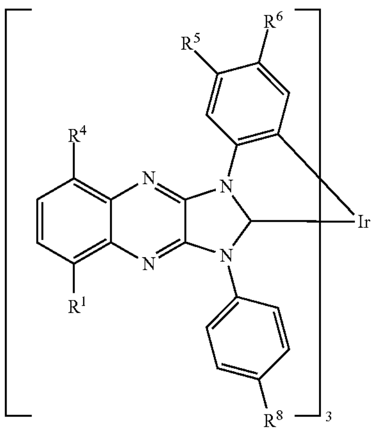
(II-8)
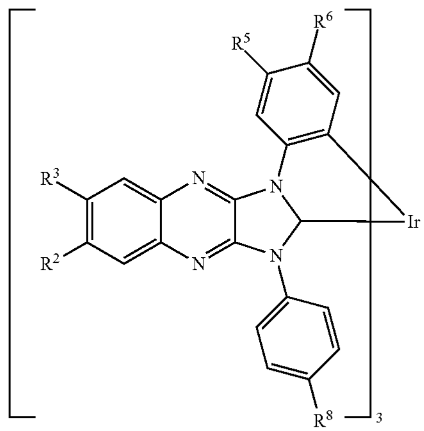
(II-9)
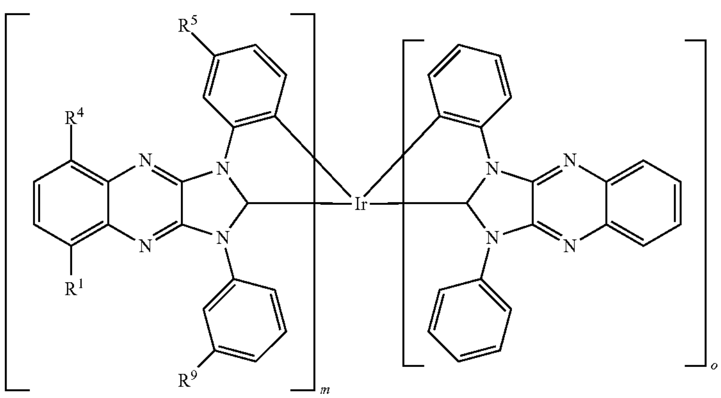
(II-10)
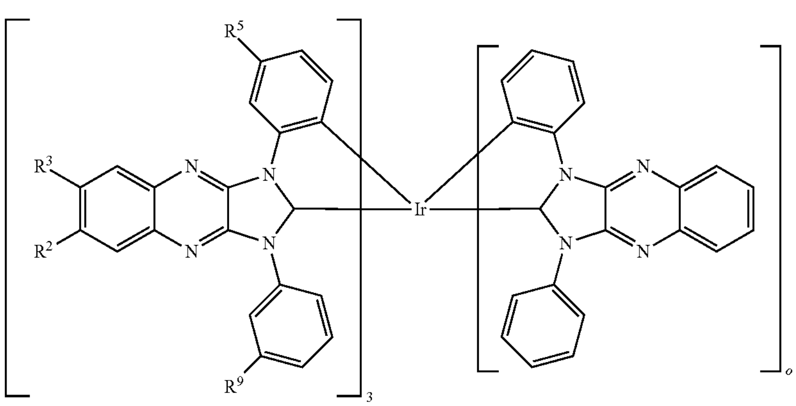

-continued
(II-11)
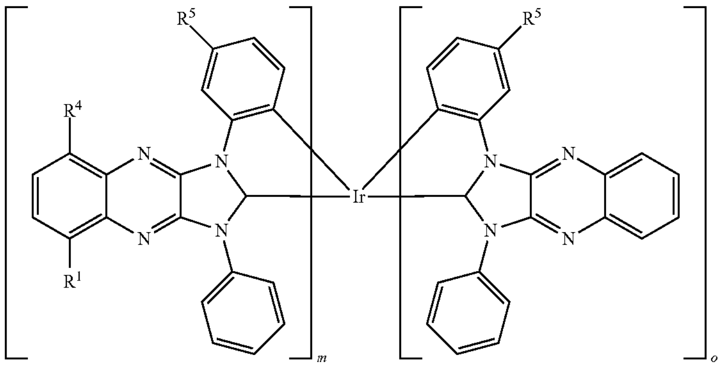
(II-12)
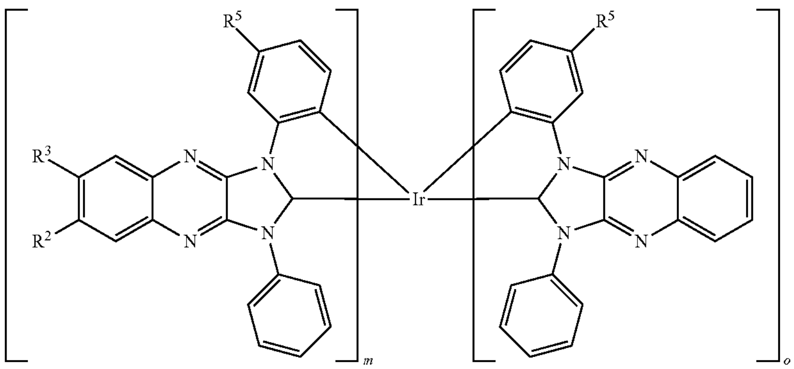
(II-13)
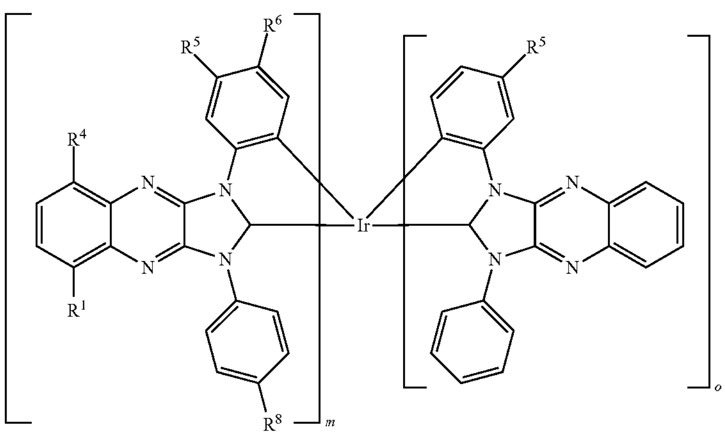
(II-14)
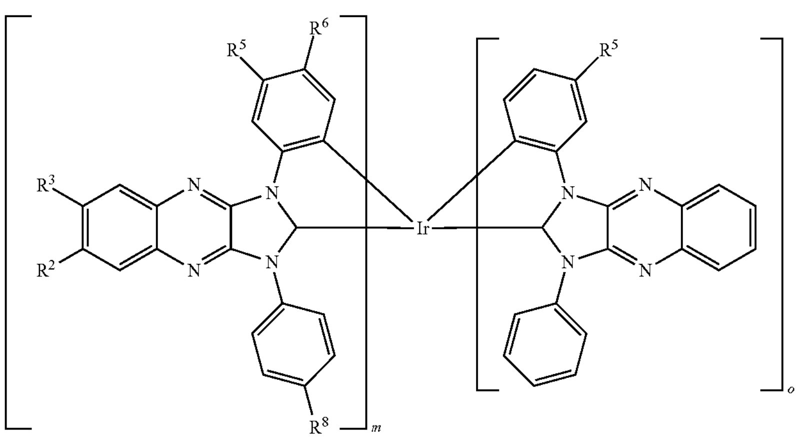

-continued
(II-15)
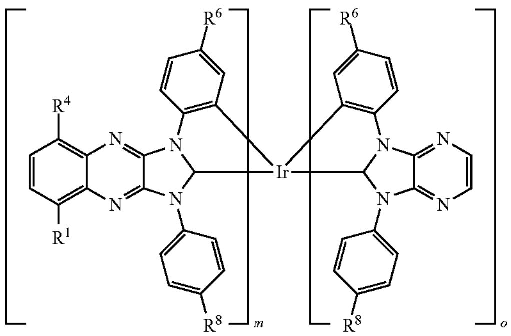
(II-16)
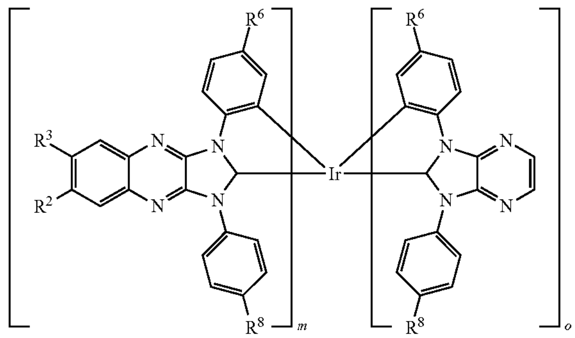
(II-17)
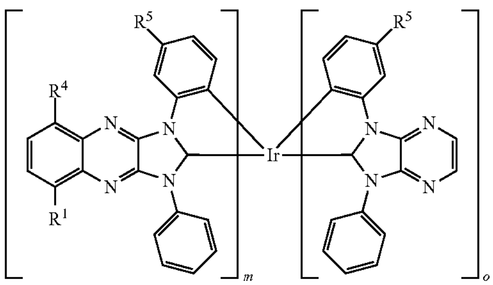
(II-18)
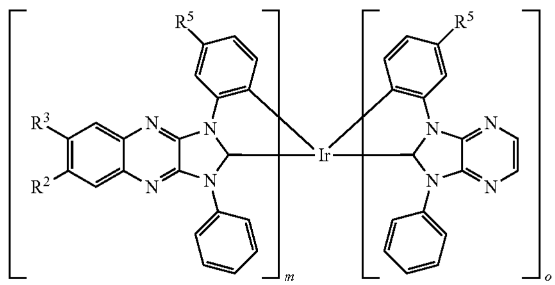
(II-19)
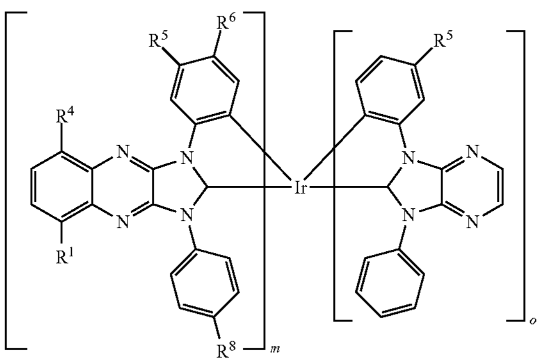
(II-20)
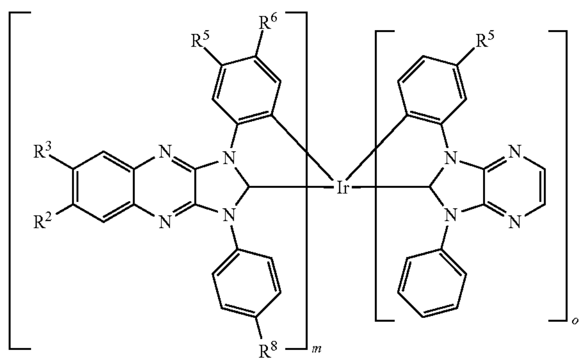
(II-21)
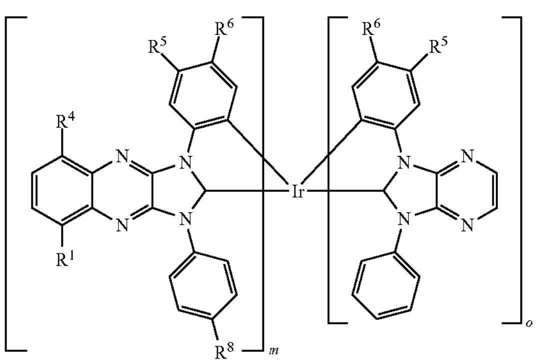
(II-22)
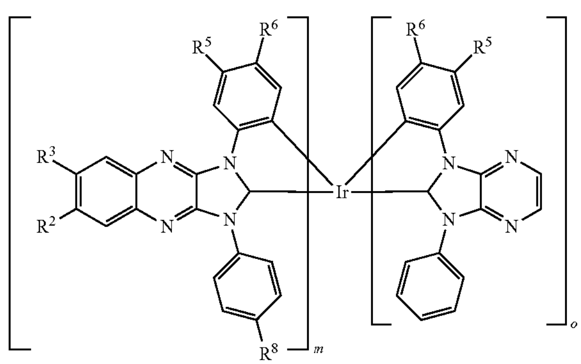

-continued
(II-23)
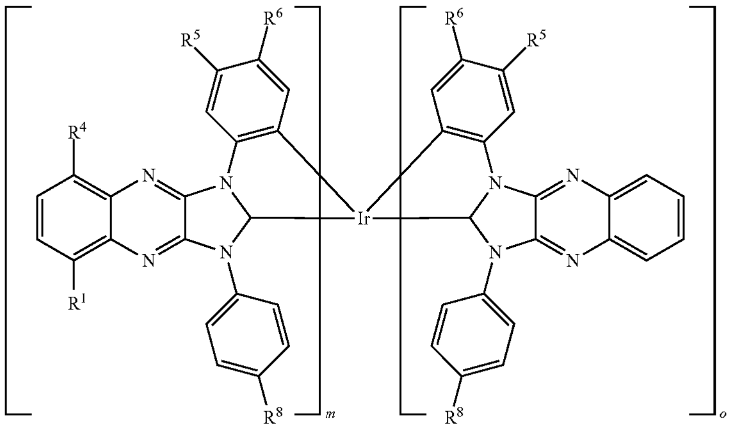
(II-24)
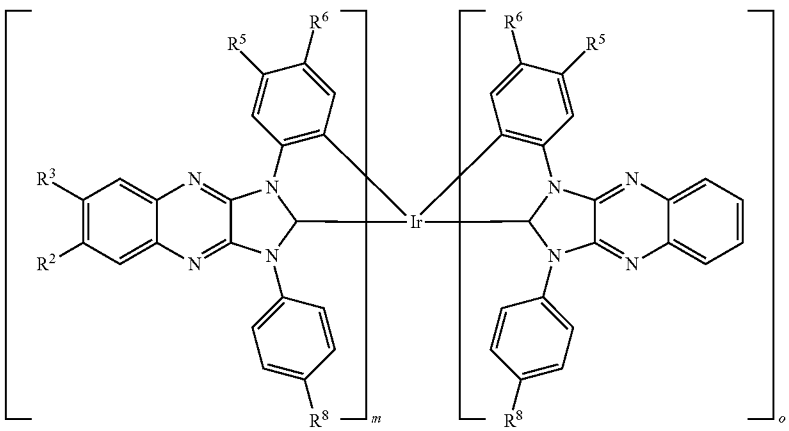
(II-25)
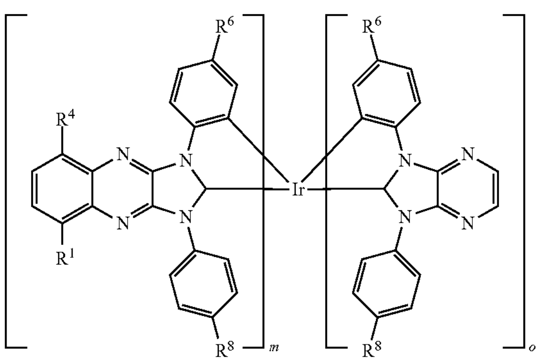
(II-26)
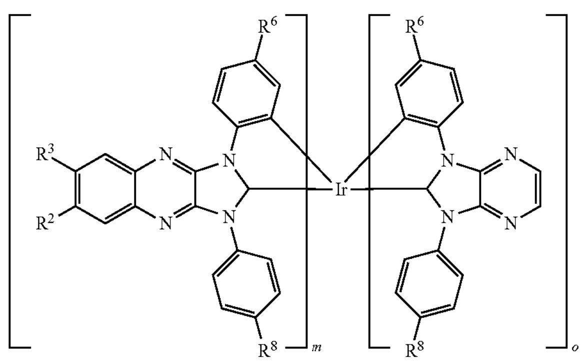
(II-27)
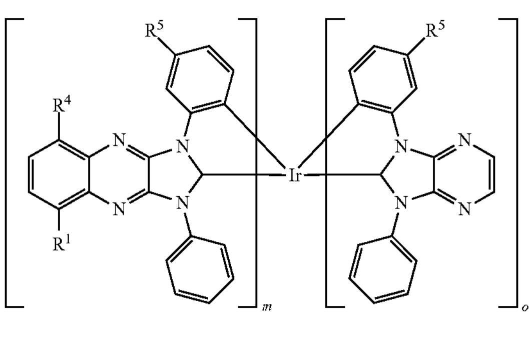
(II-28)
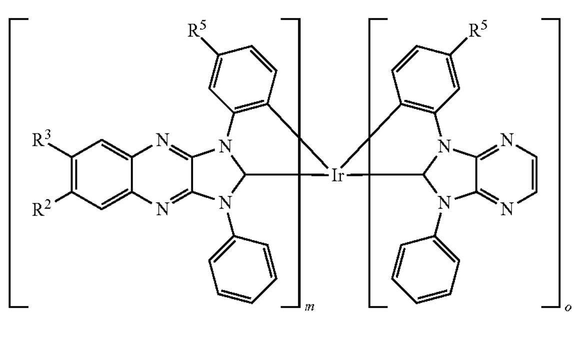

-continued
(II-29)
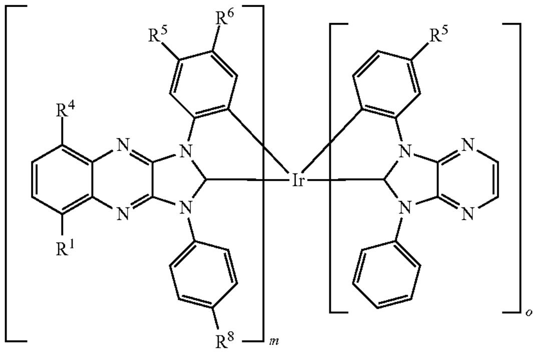
(II-30)
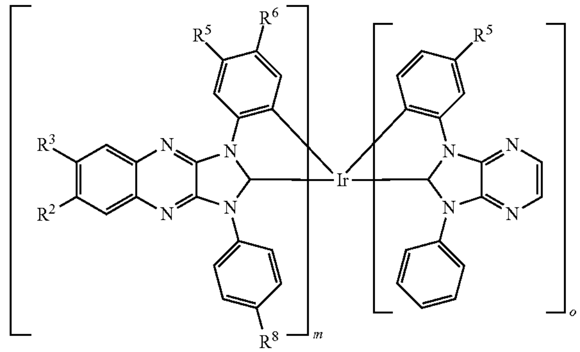
(II-31)
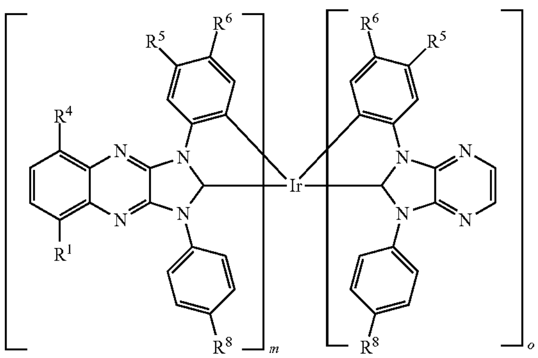
(II-32)
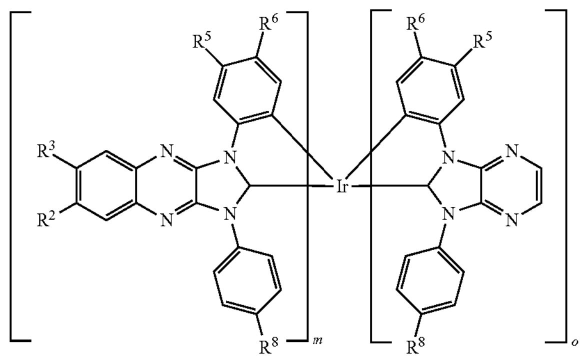
(II-33)
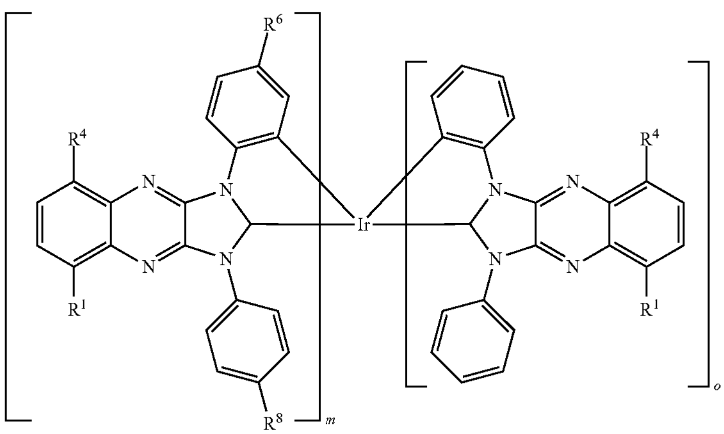
(II-34)
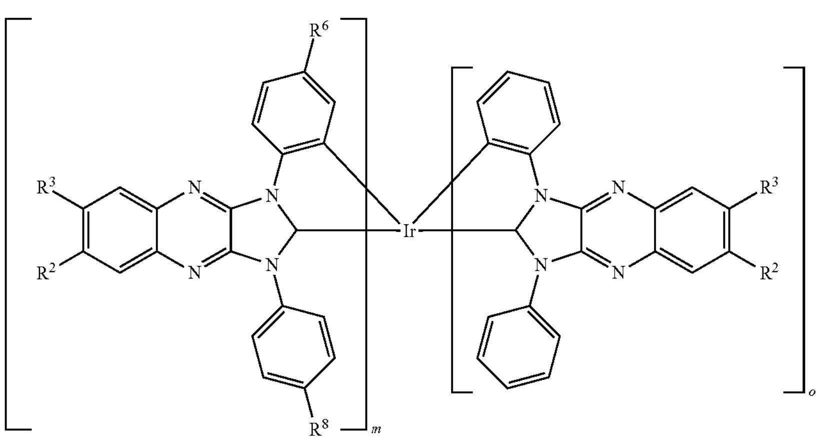

-continued
(II-35)
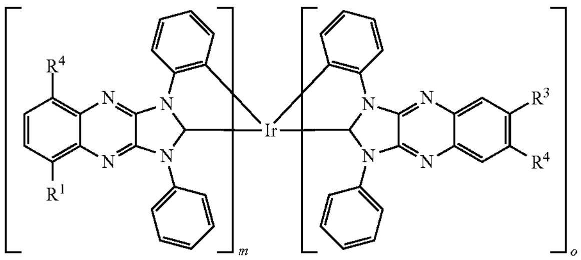
(II-36)
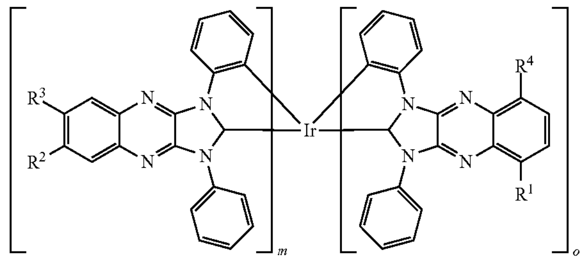
(II-37)
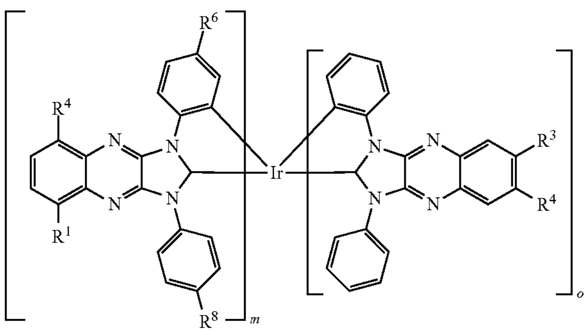
(II-38)
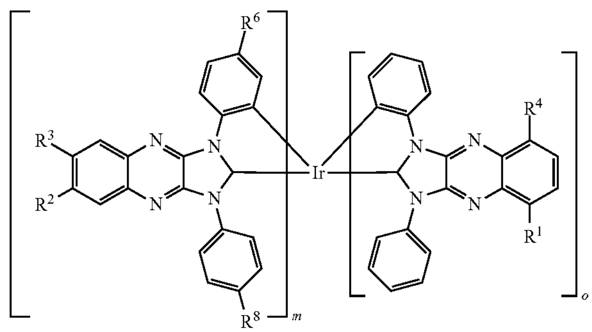
(II-39)
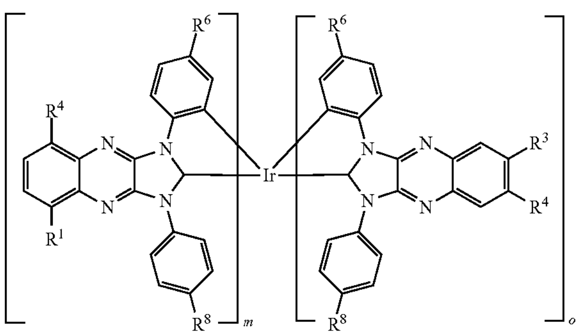
(II-40)
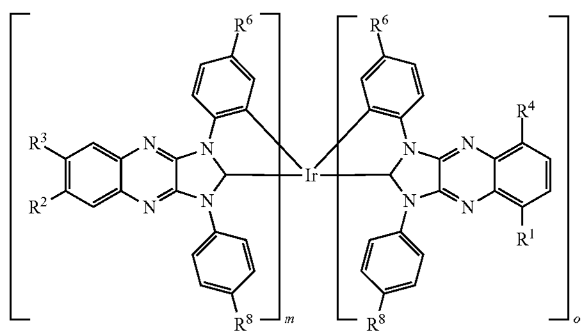
(II-41)
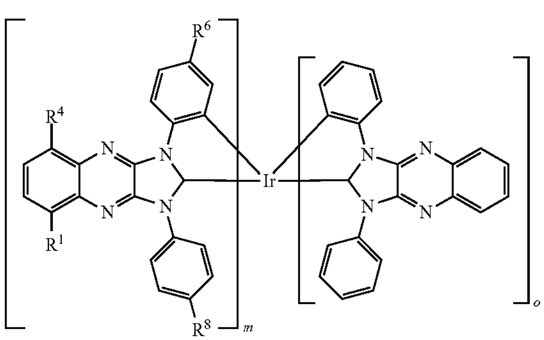
(II-42)
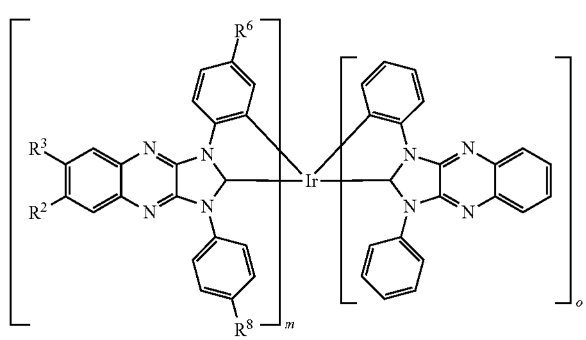

-continued
(II-43)
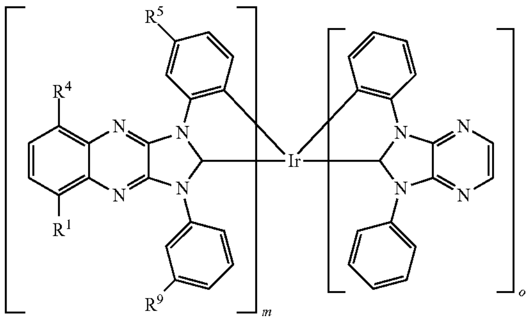
(II-44)
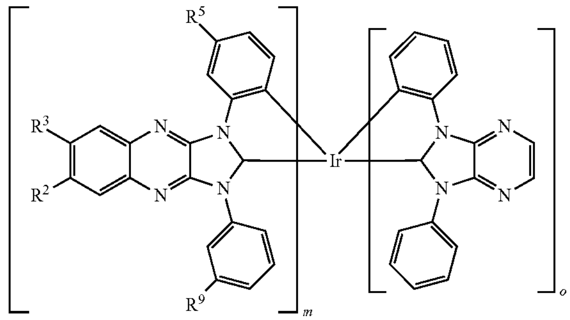
(II-45)
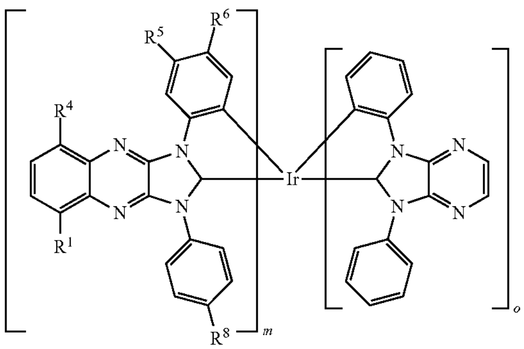
(II-46)
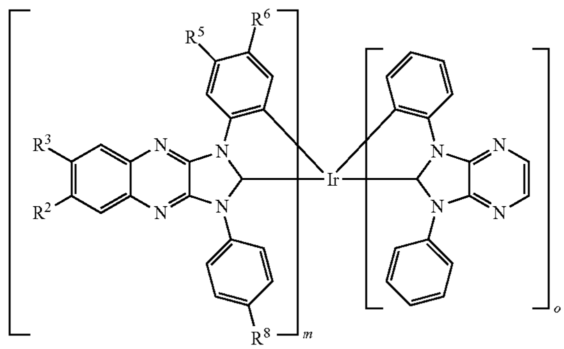
(II-47)
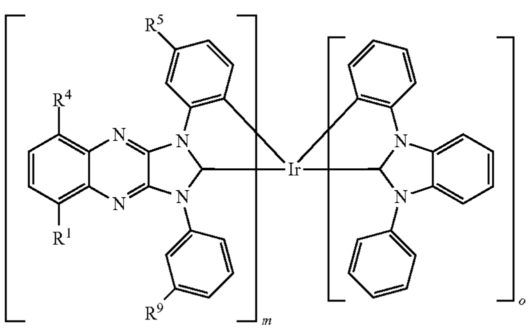
(II-48)
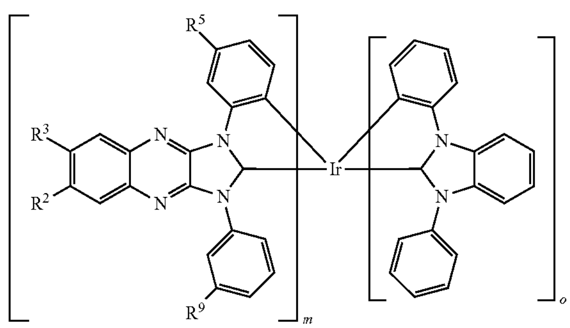
(II-49)
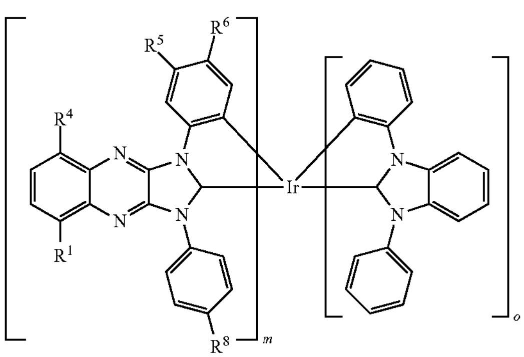
(II-50)
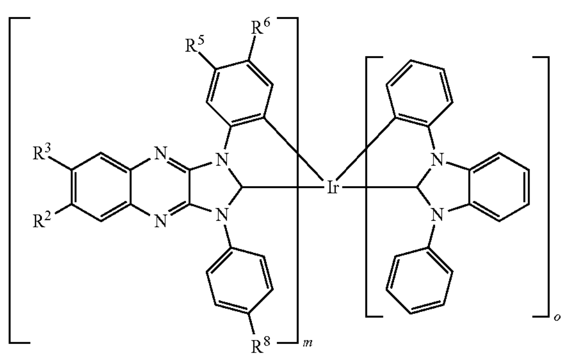

-continued
(II-51)
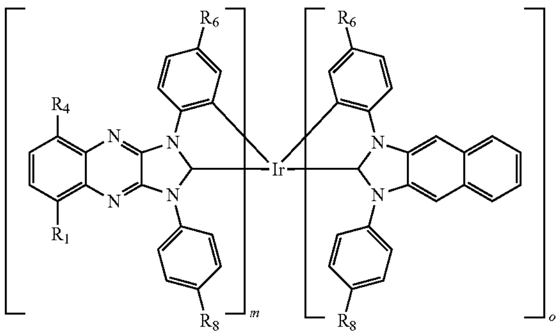
(II- 52)
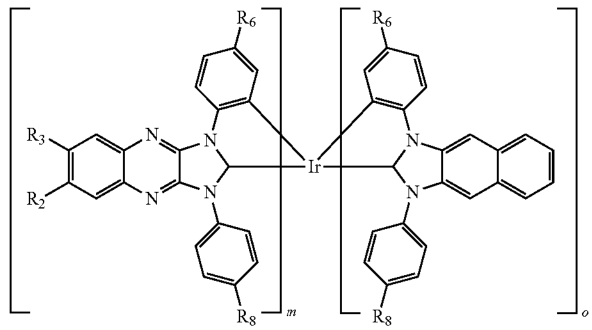
(II-53)
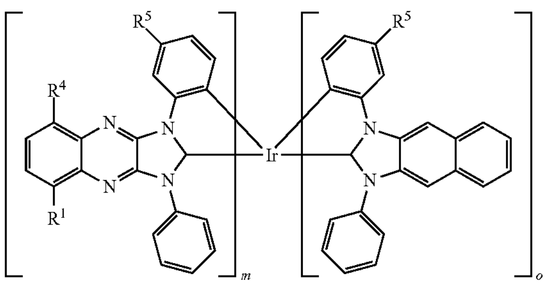
(II-54)
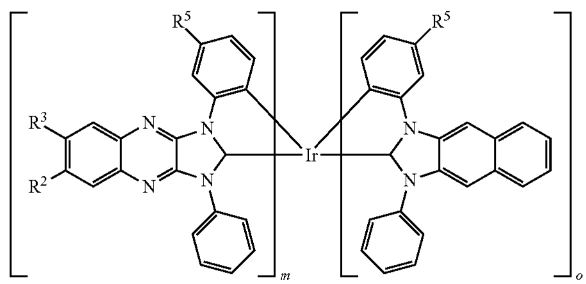
(II-55)
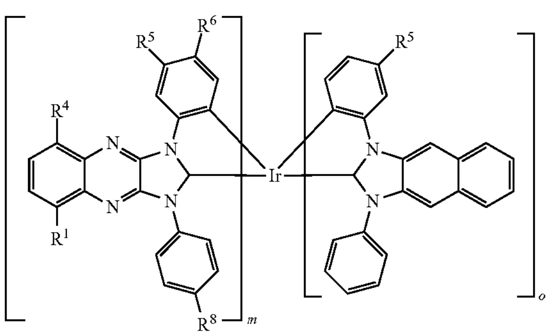
(II-56)
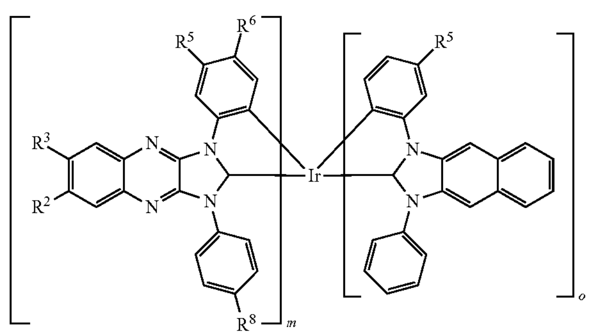
(II-57)
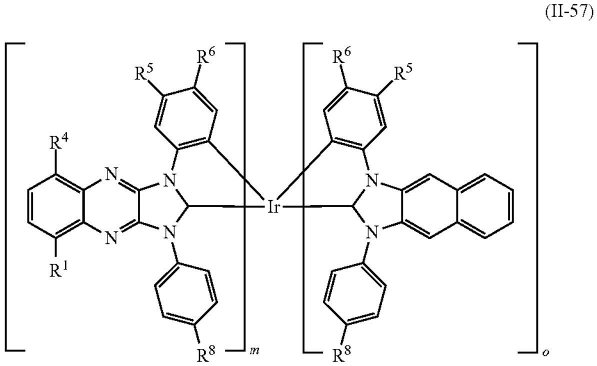
(II-58)
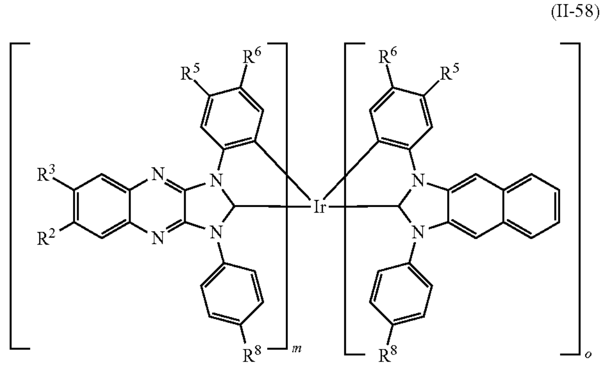

-continued
(II-59)
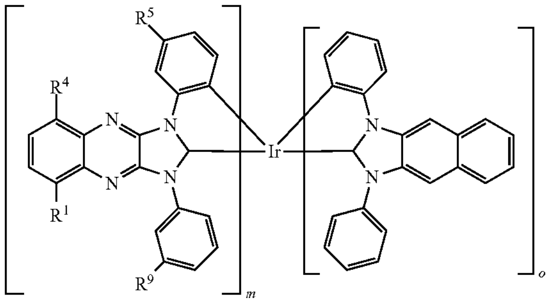
(II-60)
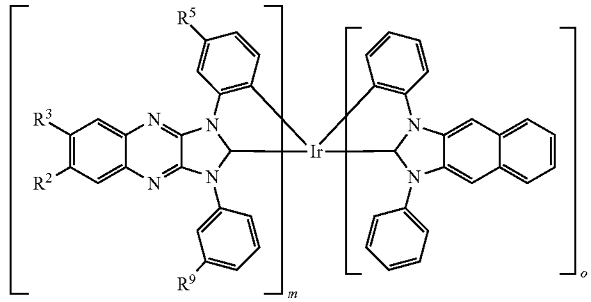
(II-61)
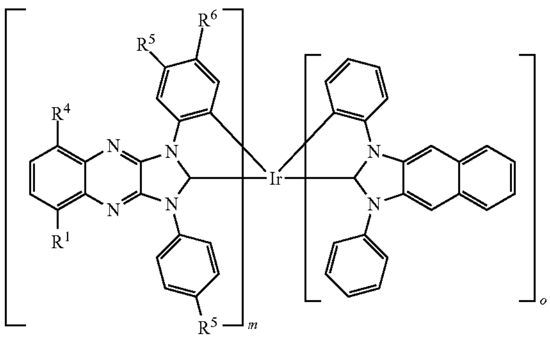
(II-62)
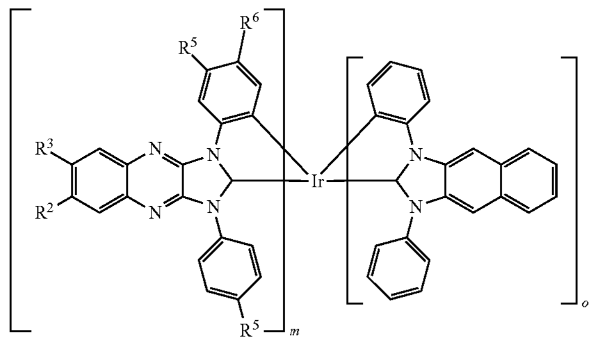
(II-63)
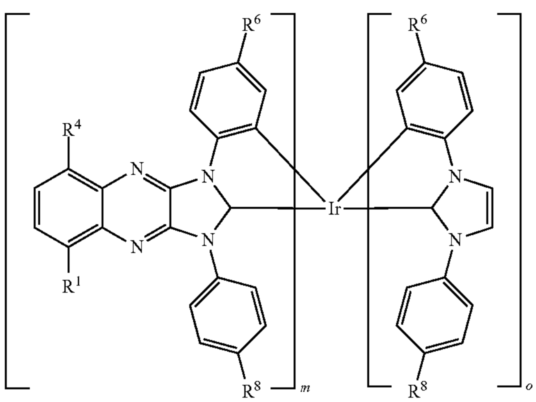
(II-64)
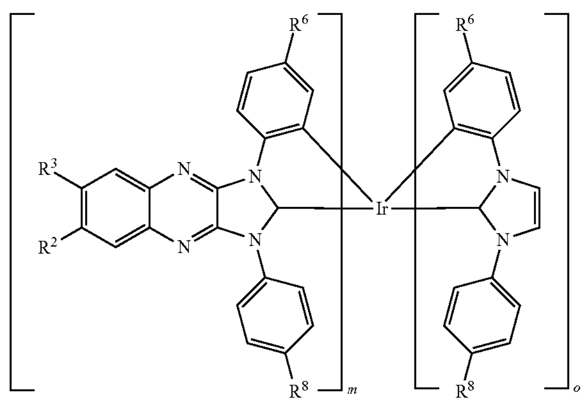
(II-65)
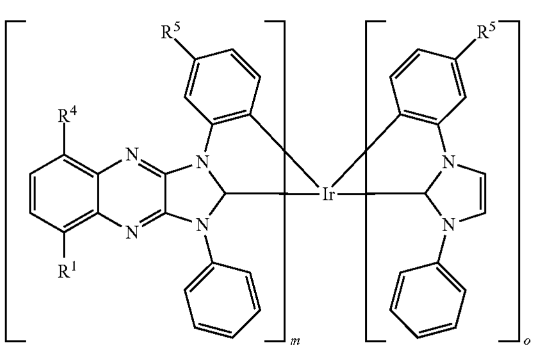
(II-66)
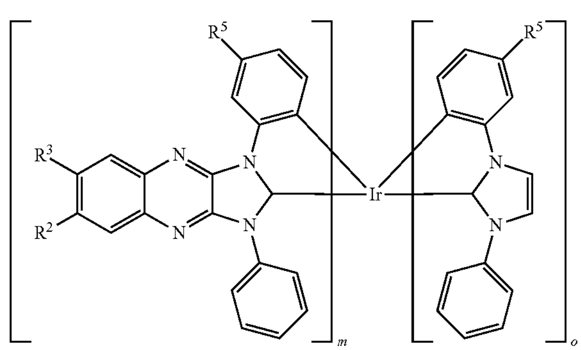

-continued
(II-67)
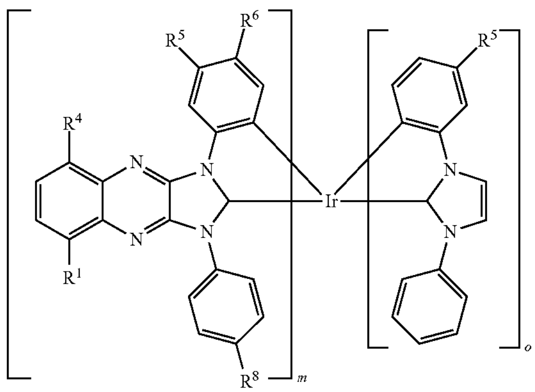
(II-68)
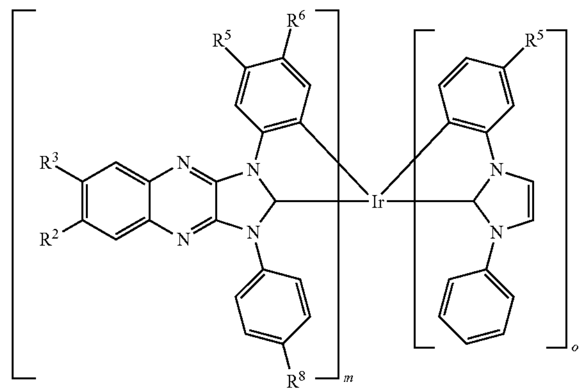
(II-69)
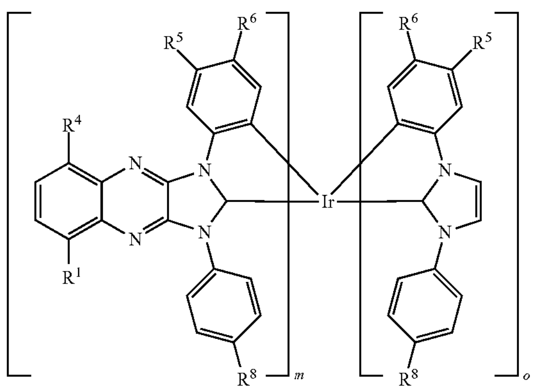
(II-70)
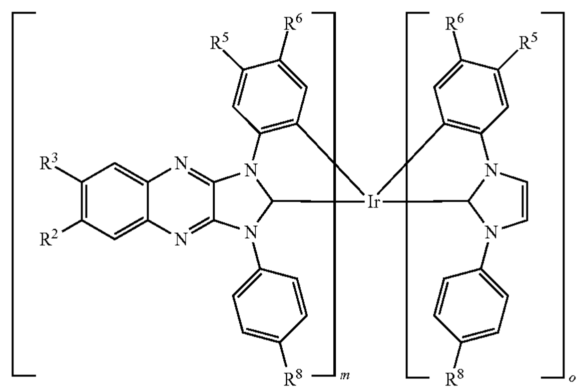
(II-71)
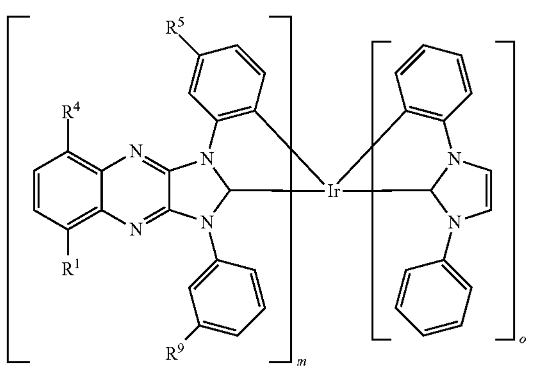
(II-72)
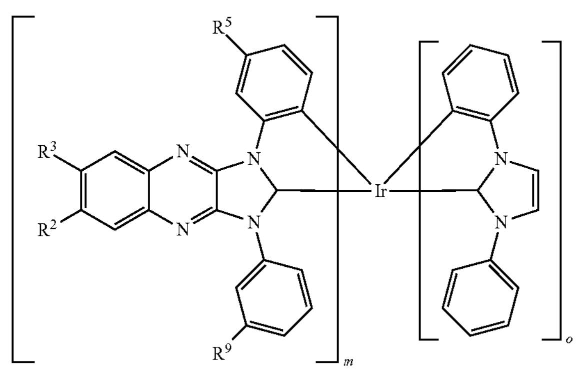
(II-73)
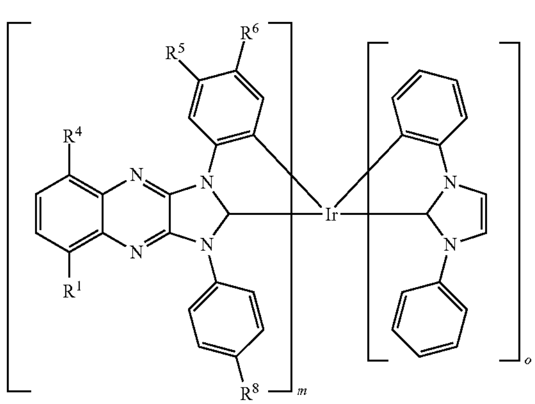
(II-74)
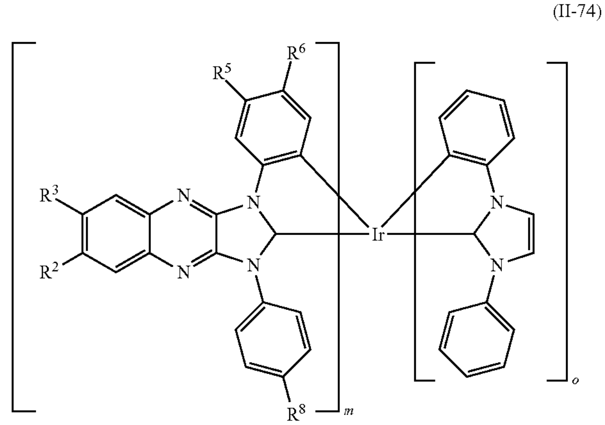

wherein $R^1$, $R^2$, $R^3$ and $R^4$ are independently of each other—in each case—hydrogen, a $C_1$-$C_8$alkyl group, which can optionally be substituted by at least one substituent E and/or interrupted by D; a $C_3$-$C_6$cycloalkyl group, which can optionally be substituted by at least one substituent E; or a phenyl group, which can optionally be substituted by one or two groups G;

preferably, in the case that $R^1$, $R^2$, $R^3$ and/or $R^4$ are a phenyl group, which can optionally be substituted by one or two groups G; $R^5$, $R^6$, $R^8$ and $R^9$ are not a phenyl group, which can optionally be substituted by one or two groups G;

more preferably, $R^1$, $R^2$, $R^3$ and $R^4$ are independently of each other—in each case—hydrogen, a $C_1$-$C_8$alkyl group, which can optionally be substituted by at least one substituent E and/or interrupted by D; or a $C_3$-$C_6$cycloalkyl group, which can optionally be substituted by at least one substituent E; most preferably, $R^1$ and $R^4$ as well as $R^2$ and $R^3$ are identical; even further more preferably, $R^1$, $R^2$, $R^3$ and $R^4$ are hydrogen;

$R^5$ and $R^6$ are independently of each other—in each case—hydrogen, a $C_1$-$C_8$alkyl group, which can optionally be substituted by at least one substituent E and/or interrupted by D; or a $C_3$-$C_6$cycloalkyl group, which can optionally be substituted by at least one substituent E; or a phenyl group, which can optionally be substituted by one or two groups G;

preferably, $R^5$ and $R^6$ are independently of each other—in each case—hydrogen, a $C_1$-$C_8$alkyl group, which can optionally be substituted by at least one substituent E and/or interrupted by D; or a $C_3$-$C_6$cycloalkyl group, which can optionally be substituted by at least one substituent E; or either $R^5$ or $R^6$, preferably $R^5$, are a phenyl group, which can optionally be substituted by one or two groups G;

more preferably, $R^5$ and $R^6$ are independently of each other—in each case—hydrogen, a $C_1$-$C_8$alkyl group, which can optionally be substituted by at least one substituent E and/or interrupted by D; or a $C_3$-$C_6$cycloalkyl group, which can optionally be substituted by at least one substituent E; or either $R^5$ or $R^6$, preferably $R^5$, is a phenyl group, which can optionally be substituted by one or two groups G; in a further preferred embodiment, $R^6$ is a phenyl group, which can optionally be substituted by one or two groups G; more preferably, $R^5$ and $R^6$ are hydrogen;

$R^8$ and $R^9$ are independently of each other—in each case—hydrogen, a $C_1$-$C_8$alkyl group, which can optionally be substituted by at least one substituent E and/or interrupted by D; or a $C_3$-$C_6$cycloalkyl group, which can optionally be substituted by at least one substituent E; or a phenyl group, which can optionally be substituted by one or two groups G;

preferably, $R^8$ and $R^9$ are independently of each other—in each case—hydrogen, a $C_1$-$C_8$alkyl group, which can optionally be substituted by at least one substituent E and/or interrupted by D; or a $C_3$-$C_6$cycloalkyl group, which can optionally be substituted by at least one substituent E; or either $R^8$ or $R^9$ are a phenyl group, which can optionally be substituted by one or two groups G; more preferably, $R^8$ and $R^9$ are independently of each other—in each case—a $C_1$-$C_8$alkyl group, which can optionally be substituted by at least one substituent E and/or interrupted by D; or a $C_3$-$C_6$cycloalkyl group, which can optionally be substituted by at least one substituent E; more preferably, $R^9$ is hydrogen and $R^8$ is hydrogen or a phenyl group which can be optionally substituted by one or two groups G; most preferably, $R^8$ and $R^9$ are hydrogen;

most preferably, in the case that $R^6$ and $R^8$ are both present, $R^6$ and $R^8$ are identical; in the case that $R^5$ and $R^9$ are both present, $R^5$ and $R^9$ are identical;

D is —S— or —O—;

E is —$OR^{69}$, —CN, $CF_3$, $C_1$-$C_8$alkyl or F; preferably $CF_3$ or $C_1$-$C_8$alkyl; preferably $C_1$-$C_8$alkyl;

G is —$OR^{69}$, —CN, $CF_3$ or $C_1$-$C_8$alkyl; preferably $C_1$-$C_8$alkyl;

$R^{69}$ is a phenyl group, which can optionally be substituted by one or two $C_1$-$C_8$alkyl groups; an unsubstituted $C_1$-$C_8$alkyl group; or a $C_1$-$C_8$alkyl group, which is interrupted by —O—; m is 2 or 1, preferably 2; in the case that m is 2, the two ligands are identical or different, preferably, the two ligands are identical;

o is 1 or 2, preferably 1; in the case that m is 2, the two ligands are identical or different, preferably, the two ligands are identical;

and the sum of m+o is 3.

Preferred residues $R^1$, $R^2$, $R^3$, $R^4$, $R^5$, $R^6$, $R^8$ and $R^9$ and combinations of said residues are mentioned above. Preferred groups D, E, G and $R^{69}$ are also mentioned above.

In one preferred embodiment of the present invention, at least one of the residues $R^1$, $R^2$, $R^3$, $R^4$, $R^5$, $R^6$, $R^8$ and $R^9$ in each formula of formulae (II-1) to (II-74) is not hydrogen.

In a most preferred embodiment, $R^1$, $R^2$, $R^3$, $R^4$, $R^5$, $R^6$, $R^8$, and $R^9$ in each formula of formulae (II-1) to (II-74) are hydrogen.

Even more preferably, the metal carbene complex according to the present invention is selected from the metal carbene complexes (II-1), (II-2), (II-5), (II-6), (II-7), (II-8), (II-11), (II-12), (II-13), (II-14), (II-15), (II-16), (II-17), (II-18), (II-19), (II-20), (II-21), (II-22), (II-23), (II-24), (II-25), (II-26), (II-27), (II-28), (II-29), (II-30), (II-31), (II-32), (II-33), (II-34), (II-35), (II-36), (II-37), (II-38), (II-39), (II-40), (II-41), (II-42), (II-45), and (II-46).

Additionally, even more preferably, the metal carbene complex according to the present invention is selected from the metal carbene complexes (II-51), (II-52), (II-53), (II-54), (II-55), (II-56), (II-57), (II-58), (II-59), (II-60), (II-61), (II-62), (II-63), (II-64), (II-65), (II-66), (II-67), (II-68), (II-69), (II-70), (II-71), (II-72), (II-73) and (II-74).

Further even more preferably, the metal carbene complex according to the present invention is selected from the metal carbene complexes (II-1), (II-2), (II-5), (II-6), (II-11), (II-12), (II-15), (II-16), (II-17), (II-18), (II-25), (II-26), (II-27), (II-28), (II-33), (II-34), (II-35), (II-36), (II-37), (II-38), (II-39), (II-40), (II-41), and (II-42).

Additionally, further even more preferably, the metal carbene complex according to the present invention is selected from the metal carbene complexes (II-51), (II-52), (II-53), (II-54), (II-59), (II-60), (II-63), (II-64), (II-65), (II-66), (II-71) and (II-72).

In a most preferred embodiment, $R^1$, $R^2$, $R^3$, $R^4$, $R^5$, $R^6$, $R^8$, and $R^9$ are hydrogen, i.e. the metal carbene complex of the present invention has one of the following formulae:

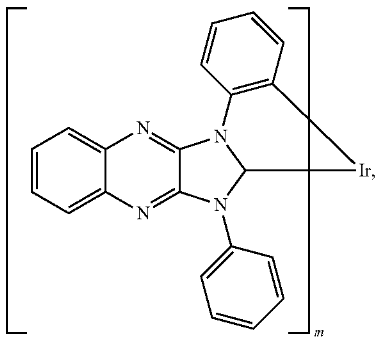

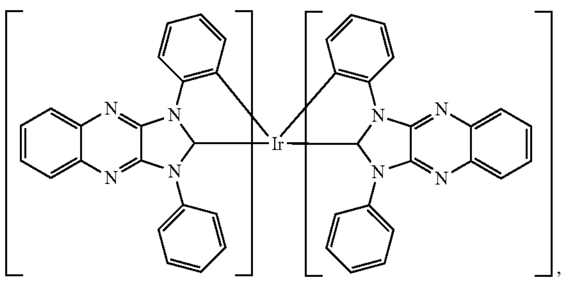

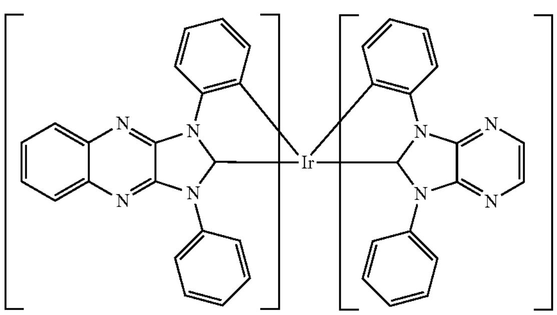

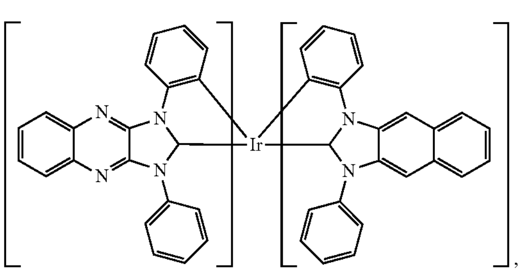

or

-continued

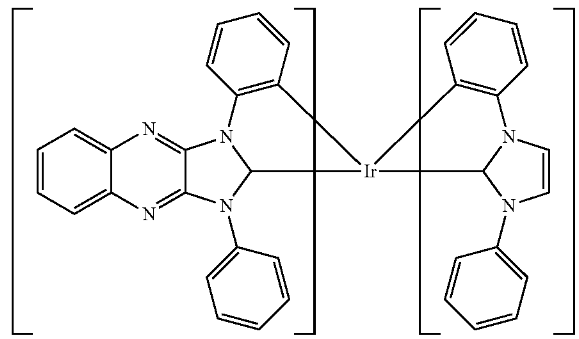

wherein m is 1, 2 or 3, preferably 2 or 3; and o is 0, 1 or 2, preferably 0 or 1.

In a further most preferred embodiment, $R^1$, $R^2$, $R^3$, $R^4$, $R^5$, $R^6$, $R^8$, and $R^9$ are hydrogen, i.e. the metal carbene complex of the present invention has one of the formulae (II-A), (II-B), (II-C), (II-D) or (II-E) as mentioned above, wherein m is 1; and o is 2.

Examples for particularly preferred metal carbene complexes according to the present invention are mentioned in the following tables:

(IIa-A)

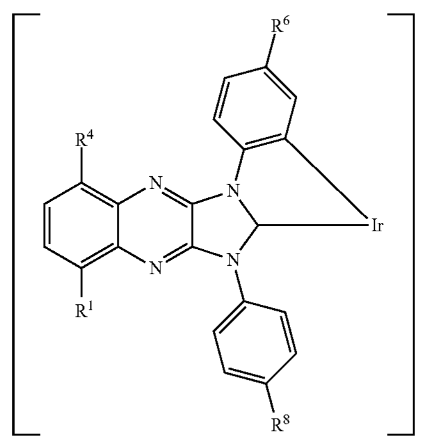

(IIa-A′)

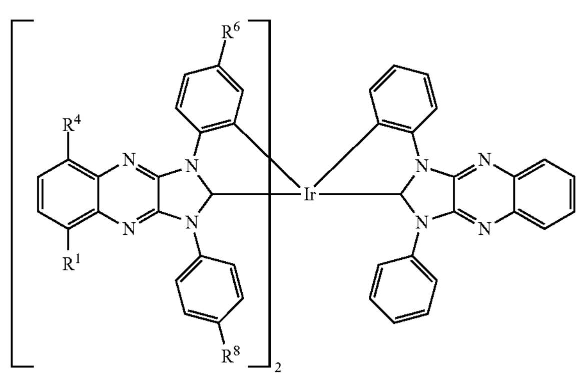

-continued (IIa-A'')

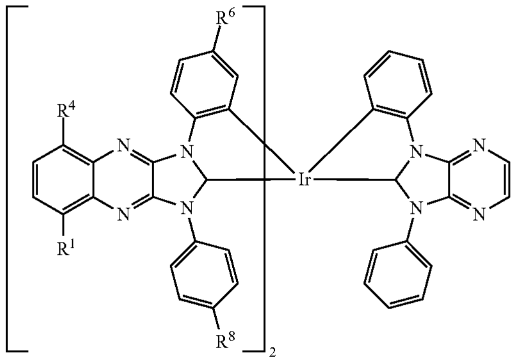

or (IIIa-A''')

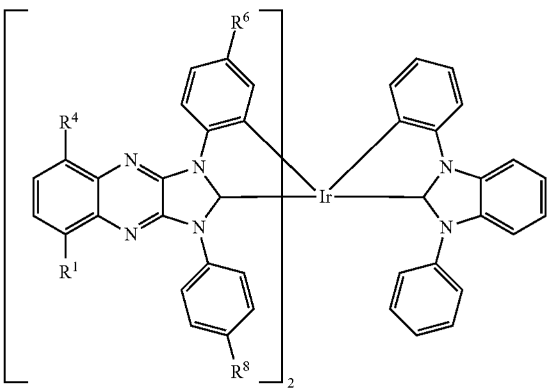

-continued (IIa-A'''')

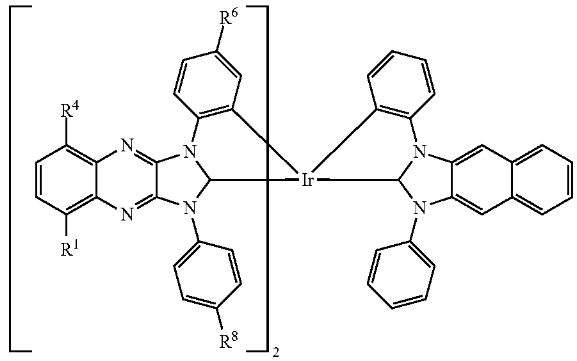

(IIa-A''''')

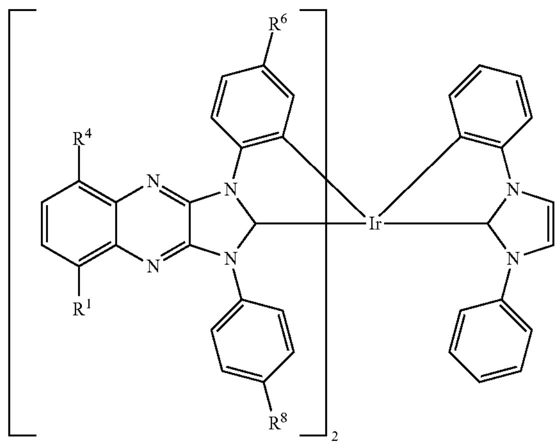

| Cpd. | $R^4$ | $R^1$ | $R^6 = R^8$ |
|---|---|---|---|
| A-1, A'-1, A''-1, A'''-1, A''''-1, A'''''-1 | $—CH_3$ | $—CH_3$ | H |
| A-2, A'-2, A''-2, A'''-2, A''''-2, A'''''-2 | $—CH_2CH_3$ | $—CH_2CH_3$ | H |
| A-3, A'-3, A''-3, A'''-3, A-''''-3, A'''''-3 | n-propyl | n-propyl | H |
| A-4, A'-4, A''-4, A'''-4, A''''-4, A'''''-4 | iso-propyl | iso-propyl | H |
| A-5, A'-5, A''-5, A'''-5, A''''-5, A'''''-5 | sec-butyl | sec-butyl | H |
| A-6, A'-6, A''-6, A'''-6, A''''-6, A'''''-6 | iso-butyl | iso-butyl | H |
| A-7, A'-7, A''-7, A'''-7, A''''-7, A'''''-7 | neopentyl | neopentyl | H |
| A-8, A'-8, A''-8, A'''-8, A''''-8, A'''''-8 | 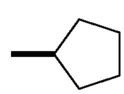 | 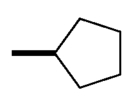 | H |
| A-9, A'-9, A''-9, A'''-9, A''''-9, A'''''-9 | 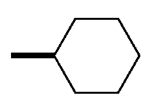 | 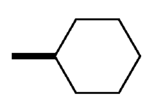 | H |
| A-10, A'-10, A''-10, A'''-10, A''''-10, A'''''-10 | $—CH_3$ | $—CH_3$ | $—CH_3$ |
| A-11, A'-11, A''-11, A'''-11, A''''-11, A'''''-11 | $—CH_2CH_3$ | $—CH_2CH_3$ | $—CH_3$ |
| A-12, A'-12, A''-12, A'''-12, A''''-12, A'''''-12 | n-propyl | n-propyl | $—CH_3$ |
| A-13, A'-13, A''-13, A'''-13, A''''-13, A'''''-13 | iso-propyl | iso-propyl | $—CH_3$ |
| A-14, A'-14, A''-14, A'''-14, A''''-14, A'''''-14 | sec-butyl | sec-butyl | $—CH_3$ |
| A-15, A'-15, A''-15, A'''-15, A''''-15, A'''''-15 | iso-butyl | iso-butyl | $—CH_3$ |
| A-16, A'-16, A''-16, A'''-16, A''''-16, A'''''-16 | neopentyl | neopentyl | $—CH_3$ |
| A-17, A'-17, A''-17, A'''-17, A''''-17, A'''''-17 | 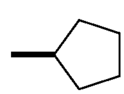 | 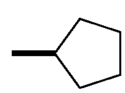 | $—CH_3$ |

-continued

| Cpd. | $R^4$ | $R^1$ | $R^6 = R^8$ |
|---|---|---|---|
| A-18, A'-18, A''-18, A'''-18, A''''-18, A'''''-18 | 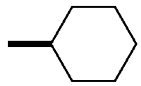 | 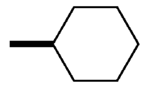 | —$CH_3$ |
| A-19, A'-19, A''-19, A'''-19, A''''-19, A'''''-19 | —$CH_3$ | —$CH_3$ | —$CH_2CH_3$ |
| A-20, A'-20, A''-20, A'''-20, A''''-20, A'''''-20 | —$CH_2CH_3$ | —$CH_2CH_3$ | —$CH_2CH_3$ |
| A-21, A'-21, A''-21, A'''-21, A''''-21, A'''''-21 | n-propyl | n-propyl | —$CH_2CH_3$ |
| A-22, A'-22, A''-22, A'''-22, A''''-22, A'''''-22 | iso-propyl | iso-propyl | —$CH_2CH_3$ |
| A-23, A'-23, A''-23, A'''-23, A''''-23, A'''''-23 | sec-butyl | sec-butyl | —$CH_2CH_3$ |
| A-24, A'-24, A''-24, A'''-24, A''''-24, A'''''-24 | iso-butyl | iso-butyl | —$CH_2CH_3$ |
| A-25, A'-25, A''-25, A'''-25, A''''-25, A'''''-25 | neopentyl | neopentyl | —$CH_2CH_3$ |
| A-26, A'-26, A''-26, A'''-26, A''''-26, A'''''-26 | 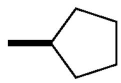 | 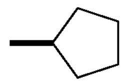 | —$CH_2CH_3$ |
| A-27, A'-27, A''-27, A'''-27, A''''-27, A'''''-27 | 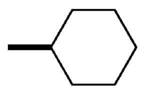 | 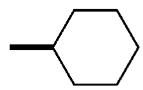 | —$CH_2CH_3$ |
| A-28, A'-28, A''-28, A'''-28, A''''-28, A'''''-28 | —$CH_3$ | —$CH_3$ | n-propyl |
| A-29, A'-29, A''-29, A'''-29, A''''-29, A'''''-29 | —$CH_2CH_3$ | —$CH_2CH_3$ | n-propyl |
| A-30, A'-30, A''-30, A'''-30, A''''-30, A'''''-30 | n-propyl | n-propyl | n-propyl |
| A-31, A'-31, A''-31, A'''-31, A''''-31, A'''''-31 | iso-propyl | iso-propyl | n-propyl |
| A-32, A'-32, A''-32, A'''-32, A''''-32, A'''''-32 | sec-butyl | sec-butyl | n-propyl |
| A-33, A'-33, A''-33, A'''-33, A''''-33, A'''''-33 | iso-butyl | iso-butyl | n-propyl |
| A-34, A'-34, A''-34, A'''-34, A''''-34, A'''''-34 | neopentyl | neopentyl | n-propyl |
| A-35, A'-35, A''-35, A'''-35, A''''-35, A'''''-35 | 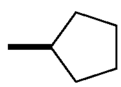 | 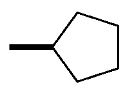 | n-propyl |
| A-36, A'-36, A''-36, A'''-36, A''''-36, A'''''-36 | 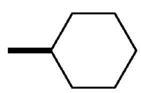 | 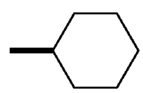 | n-propyl |
| A-37, A'-37, A''-37, A'''-37, A''''-37, A'''''-37 | —$CH_3$ | —$CH_3$ | iso-propyl |
| A-38, A'-38, A''-38, A'''-38, A''''-38, A'''''-38 | —$CH_2CH_3$ | —$CH_2CH_3$ | iso-propyl |
| A-39, A'-39, A''-39, A'''-39, A''''-39, A'''''-39 | n-propyl | n-propyl | iso-propyl |
| A-40, A'-40, A''-40, A'''-40, A''''-40, A'''''-40 | iso-propyl | iso-propyl | iso-propyl |
| A-41, A'-41, A''-41, A'''-41, A''''-41, A'''''-41 | sec-butyl | sec-butyl | iso-propyl |
| A-42, A'-42, A''-42, A'''-42, A''''-42, A'''''-42 | iso-butyl | iso-butyl | iso-propyl |
| A-43, A'-43, A''-43, A'''-43, A''''-43, A'''''-43 | neopentyl | neopentyl | iso-propyl |
| A-44, A'-44, A''-44, A'''-44, A''''-44, A'''''-44 | 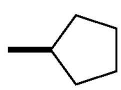 | 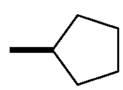 | iso-propyl |
| A-45, A'-45, A''-45, A'''-45, A''''-45, A'''''-45 | 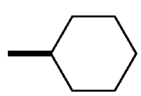 | 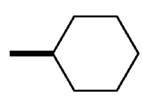 | iso-propyl |
| A-46, A'-46, A''-46, A'''-46, A''''-46, A'''''-46 | —$CH_3$ | —$CH_3$ | sec-butyl |
| A-47, A'-47, A''-47, A'''-47, A''''-47, A'''''-47 | —$CH_2CH_3$ | —$CH_2CH_3$ | sec-butyl |
| A-48, A'-48, A''-48, A'''-48, A''''-48, A'''''-48 | n-propyl | n-propyl | sec-butyl |
| A-49, A'-49, A''-49, A'''-49, A''''-49, A'''''-49 | iso-propyl | iso-propyl | sec-butyl |
| A-50, A'-50, A''-50, A'''-50, A''''-50, A'''''-50 | sec-butyl | sec-butyl | sec-butyl |
| A-51, A'-51, A''-51, A'''-51, A''''-51, A'''''-51 | iso-butyl | iso-butyl | sec-butyl |
| A-52, A'-52, A''-52, A'''-52, A''''-52, A'''''-52 | neopentyl | neopentyl | sec-butyl |
| A-53, A'-53, A''-53, A'''-53, A''''-53, A'''''-53 | 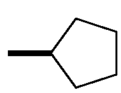 | 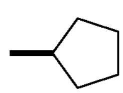 | sec-butyl |
| A-54, A'-54, A''-54, A'''-54, A''''-54, A'''''-54 | 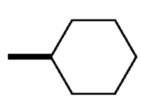 | 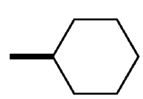 | sec-butyl |
| A-55, A'-55, A''-55, A'''-55, A''''-55, A'''''-55 | —$CH_3$ | —$CH_3$ | iso-butyl |
| A-56, A'-56, A''-56, A'''-56, A''''-56, A'''''-56 | —$CH_2CH_3$ | —$CH_2CH_3$ | iso-butyl |

-continued

| Cpd. | $R^4$ | $R^1$ | $R^6 = R^8$ |
|---|---|---|---|
| A-57, A'-57, A''-57, A'''-57, A''''-57, A'''''-57 | n-propyl | n-propyl | iso-butyl |
| A-58, A'-58, A''-58, A'''-58, A''''-58, A'''''-58 | iso-propyl | iso-propyl | iso-butyl |
| A-59, A'-59, A''-59, A'''-59, A''''-59, A'''''-59 | sec-butyl | sec-butyl | iso-butyl |
| A-60, A'-60, A''-60, A'''-60, A''''-60, A'''''-60 | iso-butyl | iso-butyl | iso-butyl |
| A-61, A'-61, A''-61, A'''-61, A''''-61, A'''''-61 | neopentyl | neopentyl | iso-butyl |
| A-62, A'-62, A''-62, A'''-62, A''''-62, A'''''-62 | 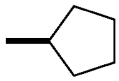 | 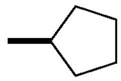 | iso-butyl |
| A-63, A'-63, A''-63, A'''-63, A''''-63, A'''''-63 | 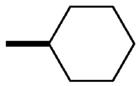 | 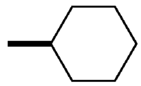 | iso-butyl |
| A-64, A'-64, A''-64, A'''-64, A''''-64, A'''''-64 | $—CH_3$ | $—CH_3$ | neopentyl |
| A-65, A'-65, A''-65, A'''-65, A''''-65, A'''''-65 | $—CH_2CH_3$ | $—CH_2CH_3$ | neopentyl |
| A-66, A'-66, A''-66, A'''-66, A''''-66, A'''''-66 | n-propyl | n-propyl | neopentyl |
| A-67, A'-67, A''-67, A'''-67, A''''-67, A'''''-67 | iso-propyl | iso-propyl | neopentyl |
| A-68, A'-68, A''-68, A'''-68, A''''-68, A'''''-68 | sec-butyl | sec-butyl | neopentyl |
| A-69, A'-69, A''-69, A'''-69, A''''-69, A'''''-69 | iso-butyl | iso-butyl | neopentyl |
| A-70, A'-70, A''-70, A'''-70, A''''-70, A'''''-70 | neopentyl | neopentyl | neopentyl |
| A-71, A'-71, A''-71, A'''-71, A''''-71, A'''''-71 | 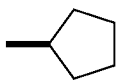 | 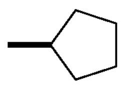 | neopentyl |
| A-72, A'-72, A''-72, A'''-72, A''''-72, A'''''-72 | 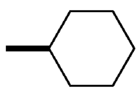 | 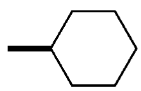 | neopentyl |
| A-73, A'-73, A''-73, A'''-73, A''''-73, A'''''-73 | $—CH_3$ | $—CH_3$ | 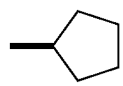 |
| A-74, A'-74, A''-74, A'''-74, A''''-74, A'''''-74 | $—CH_2CH_3$ | $—CH_2CH_3$ | 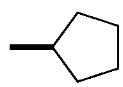 |
| A-75, A'-75, A''-75, A'''-75, A''''-75, A'''''-75 | n-propyl | n-propyl | 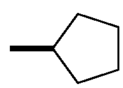 |
| A-76, A'-76, A''-76, A'''-76, A''''-76, A'''''-76 | iso-propyl | iso-propyl | 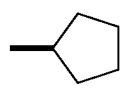 |
| A-77, A'-77, A''-77, A'''-77, A''''-77, A'''''-77 | sec-butyl | sec-butyl | 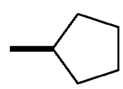 |
| A-78, A'-78, A''-78, A'''-78, A''''-78, A'''''-78 | iso-butyl | iso-butyl | 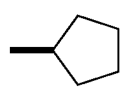 |
| A-79, A'-79, A''-79, A'''-79, A''''-79, A'''''-79 | neopentyl | neopentyl | 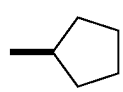 |
| A-80, A'-80, A''-80, A'''-80, A''''-80, A'''''-80 | 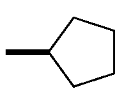 | 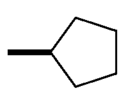 | 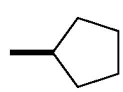 |
| A-81, A'-81, A''-81, A'''-81, A''''-81, A'''''-81 | 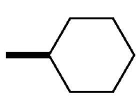 | 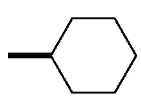 | 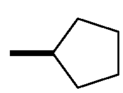 |

-continued

| Cpd. | $R^4$ | $R^1$ | $R^6 = R^8$ |
|---|---|---|---|
| A-82, A'-82, A''-82, A'''-82, A''''-82, A'''''-82 | —$CH_3$ | —$CH_3$ | 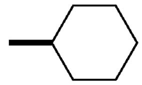 |
| A-83, A'-83, A''-83, A'''-83, A''''-83, A'''''-83 | —$CH_2CH_3$ | —$CH_2CH_3$ | 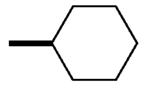 |
| A-84, A'-84, A''-84, A'''-84, A''''-84, A'''''-84 | n-propyl | n-propyl | 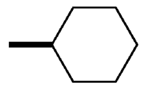 |
| A-85, A'-85, A''-85, A'''-85, A''''-85, A'''''-85 | iso-propyl | iso-propyl | 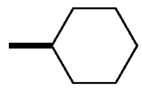 |
| A-86, A'-86, A''-86, A'''-86, A''''-86, A'''''-86 | sec-butyl | sec-butyl | 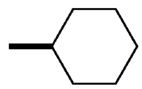 |
| A-87, A'-87, A''-87, A'''-87, A''''-87, A'''''-87 | iso-butyl | iso-butyl | 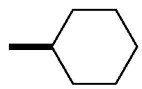 |
| A-88, A'-88, A''-88, A'''-88, A''''-88, A'''''-88 | neopentyl | neopentyl | 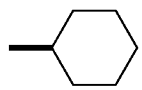 |
| A-89, A'-89, A''-89, A'''-89, A''''-89, A'''''-89 | 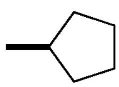 | 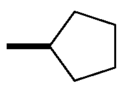 | 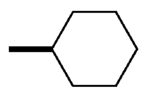 |
| A-90, A'-90, A''-90, A'''-90, A''''-90, A'''''-90 | 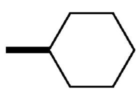 | 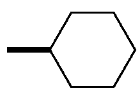 | 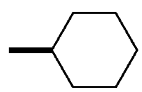 |
| A-91, A'-91, A''-91, A'''-91, A''''-91, A'''''-91 | —$CH_3$ | —$CH_3$ | tert-butyl |
| A-92, A'-92, A''-92, A'''-92, A''''-92, A'''''-92 | —$CH_2CH_3$ | —$CH_2CH_3$ | tert-butyl |
| A-93, A'-93, A''-93, A'''-93, A''''-93, A'''''-93 | n-propyl | n-propyl | tert-butyl |
| A-94, A'-94, A''-94, A'''-94, A''''-94, A'''''-94 | iso-propyl | iso-propyl | tert-butyl |
| A-95, A'-95, A''-95, A'''-95, A''''-95, A'''''-95 | sec-butyl | sec-butyl | tert-butyl |
| A-96, A'-96, A''-96, A'''-96, A''''-96, A'''''-96 | iso-butyl | iso-butyl | tert-butyl |
| A-97, A'-97, A''-97, A'''-97, A''''-97, A'''''-97 | neopentyl | neopentyl | tert-butyl |
| A-98, A'-98, A''-98, A'''-98, A''''-98, A'''''-98 | 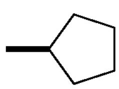 | 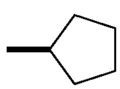 | tert-butyl |
| A-99, A'-99, A''-99, A'''-99, A''''-99, A'''''-99 | 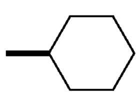 | 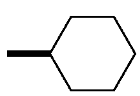 | tert-butyl |
| A-100, A'-100, A''-100, A'''-100, A''''-100, A'''''-100 | —$CH_3$ | —$CH_3$ | tert-amyl |
| A-101, A'-101, A''-101, A'''-101, A''''-101, A'''''-101 | —$CH_2CH_3$ | —$CH_2CH_3$ | tert-amyl |
| A-102, A'-102, A''-102, A'''-102, A''''-102, A'''''-102 | n-propyl | n-propyl | tert-amyl |
| A-103, A'-103, A''-103, A'''-103, A''''-103, A'''''-103 | iso-propyl | iso-propyl | tert-amyl |
| A-104, A'-104, A''-104, A'''-104, A''''-104, A'''''-104 | sec-butyl | sec-butyl | tert-amyl |
| A-105, A'-105, A''-105, A'''-105, A''''-105, A'''''-105 | iso-butyl | iso-butyl | tert-amyl |
| A-106, A'-106, A''-106, A'''-106, A''''-106, A'''''-106 | neopentyl | neopentyl | tert-amyl |

-continued

| Cpd. | $R^4$ | $R^1$ | $R^6 = R^8$ |
|---|---|---|---|
| A-107, A'-107, A''-107, A'''-107, A''''-107, A'''''-107 | 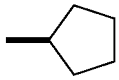 | 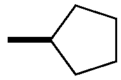 | tert-amyl |
| A-108, A'-108, A''-108, A'''-108, A''''-108, A'''''-108 | 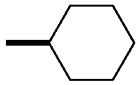 | 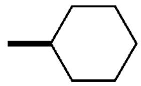 | tert-amyl |
| A-109, A'-109, A''-109, A'''-109, A''''-109, A'''''-109 | tert-butyl | tert-butyl | —$CH_3$ |
| A-110, A''-110, A''-110, A'''-110, A''''-110, A'''''-110 | tert-butyl | tert-butyl | —$CH_2CH_3$ |
| A-111, A'-111, A''-111, A'''-111, A''''-111, A'''''-111 | ten-butyl | tert-butyl | n-propyl |
| A-112, A'-112, A''-112, A'''-112, A''''-112, A'''''-112 | tert-butyl | tert-butyl | iso-propyl |
| A-113, A'-113, A''-113, A'''-113, A''''-113, A'''''-113 | tert-butyl | tert-butyl | sec-butyl |
| A-114, A'-114, A''-114, A'''-114, A''''-114, A'''''-114 | tert-butyl | tert-butyl | iso-butyl |
| A-115, A'-115, A''-115, A'''-115, A''''-115, A'''''-115 | tert-butyl | tert-butyl | neopentyl |
| A-116, A'-116, A''-116, A'''-116, A''''-116, A'''''-116 | tert-butyl | tert-butyl | 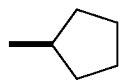 |
| A-117, A'-117, A''-117, A'''-117, A''''-117, A'''''-117 | tert-butyl | tert-butyl | 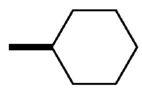 |
| A-118, A'-118, A''-118, A'''-118, A''''-118, A'''''-118 | tert-butyl | tert-butyl | tert-butyl |
| A-119, A'-119, A''-119, A'''-119, A''''-119, A'''''-119 | tert-butyl | tert-butyl | tert-amyl |
| A-120, A'-120, A''-120, A'''-120, A''''-120, A'''''-120 | tert-amyl | tert-amyl | —$CH_3$ |
| A-121, A'-121, A''-121, A'''-121, A''''-121, A'''''-121 | tert-amyl | tert-amyl | —$CH_2CH_3$ |
| A-122, A'-122, A''-122, A'''-122, A''''-122, A'''''-122 | tert-amyl | tert-amyl | n-propyl |
| A-123, A'-123, A''-123, A'''-123, A''''-123, A'''''-123 | tert-amyl | tert-amyl | iso-propyl |
| A-124, A'-124, A''-124, A'''-124, A''''-124, A'''''-124 | tert-amyl | tert-amyl | sec-butyl |
| A-125, A'-125, A''-125, A'''-125, A''''-125, A'''''-125 | tert-amyl | tert-amyl | iso-butyl |
| A-126, A'-126, A''-126, A'''-126, A''''-126, A'''''-126 | tert-amyl | tert-amyl | neopentyl |
| A-127, A'-127, A''-127, A'''-127, A''''-127, A'''''-127 | tert-amyl | tert-amyl | 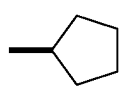 |
| A-128, A'-128, A''-128, A'''-128, A''''-128, A'''''-128 | tert-amyl | tert-amyl | 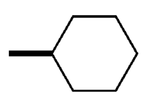 |
| A-129, A'-129, A''-129, A'''-129, A''''-129, A'''''-129 | tert-amyl | tert-amyl | tert-butyl |
| A-130, A'-130, A''-130, A'''-130, A''''-130, A'''''-130 | tert-amyl | tert-amyl | tert-amyl |
| A-131, A'-131, A''-131, A'''-131, A''''-131, A'''''-131 | tert-butyl | tert-butyl | H |
| A-132, A'-132, A''-132, A'''-132, A''''-132, A'''''-132 | tert-amyl | tert-amyl | H |
| A-133, A'-133, A''-133, A'''-133, A''''-133, A'''''-133 | H | H | H |

Preferred compounds A, A', A", A"', A"" and A""' are compounds A-1, A'-1, A"-1, A"'-1, A"" and A""'-1 to A-90, A'-90, A"-90, A"'-90, A""-90 and A""'-90. Further most preferred compounds are A-133, A'-133, A"-133, A"'-133, A""-133 and A""'-133.

(IIb-B)

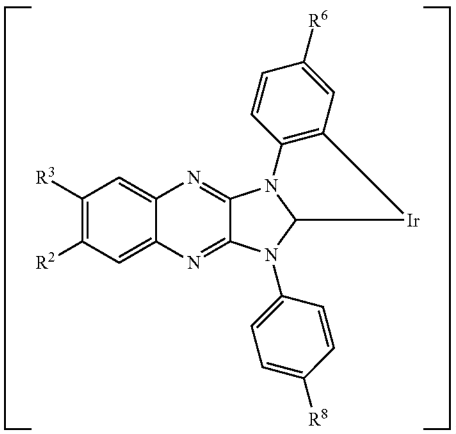

(IIb-B')

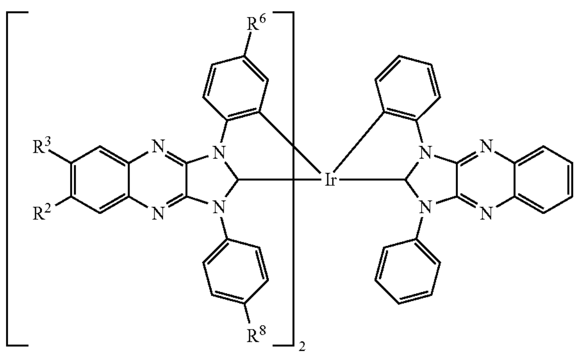

(IIb-B'')

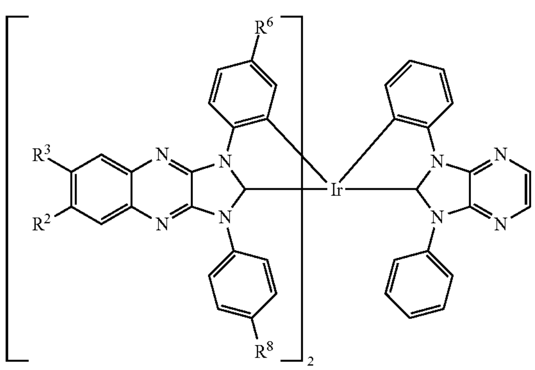

or

-continued (IIb-B''')

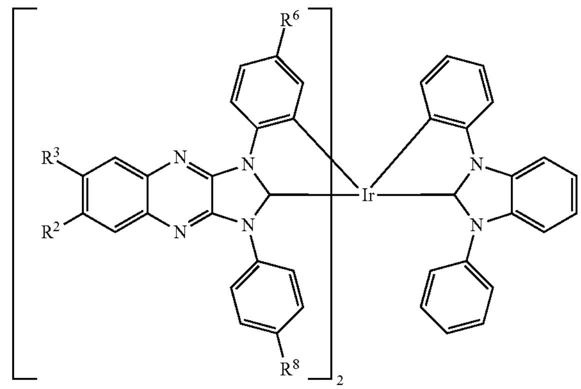

(IIb-B'''')

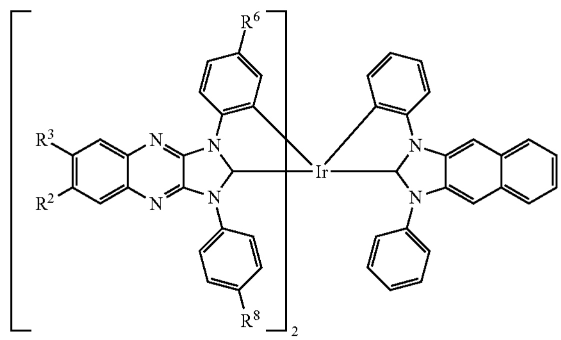

or (IIb-B''''')

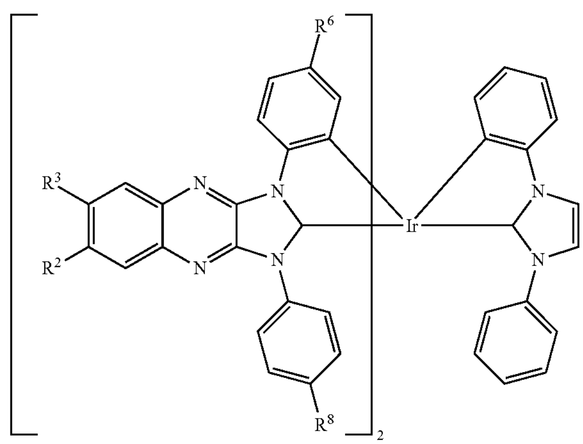

| Cpd. | $R^3$ | $R^2$ | $R^6 = R^8$ |
|---|---|---|---|
| B-1, B'-1, B"-1, B"'-1, B""-1, B""'-1 | —$CH_3$ | —$CH_3$ | H |
| B-2, B'-2, B"-2, B"'-2, B""-2, B""'-2 | —$CH_2CH_3$ | —$CH_2CH_3$ | H |
| B-3, B'-3, B"-3, B"'-3, B""-3, B""'-3 | n-propyl | n-propyl | H |
| B-4, B'-4, B"-4, B"'-4, B""-4, B""'-4 | iso-propyl | iso-propyl | H |
| B-5, B'-5, B"-5, B"'-5, B""-5, B""'-5 | sec-butyl | sec-butyl | H |
| B-6, B'-6, B"-6, B"'-6, B""-6, B""'-6 | iso-butyl | iso-butyl | H |
| B-7, B'-7, B"-7, B"'-7, B""-7, B""'-7 | neopentyl | neopentyl | H |
| B-8, B'-8, B"-8, B"'-8, B""-8, B""'-8 | 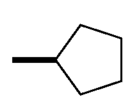 | 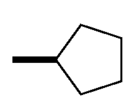 | H |

-continued

| Cpd. | $R^3$ | $R^2$ | $R^6 = R^8$ |
|---|---|---|---|
| B-9, B'-9, B''-9, B'''-9, B''''-9, B'''''-9 | 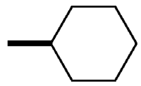 | 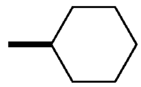 | H |
| B-10, B'-10, B''-10, B'''-10, B''''-10, B'''''-10 | —$CH_3$ | —$CH_3$ | —$CH_3$ |
| B-11, B'-11, B''-11, B'''-11, B''''-11, B'''''-11 | —$CH_2CH_3$ | —$CH_2CH_3$ | —$CH_3$ |
| B-12, B'-12, B''-12, B'''-12, B''''-12, B'''''-12 | n-propyl | n-propyl | —$CH_3$ |
| B-13, B'-13, B''-13, B'''-13, B''''-13, B'''''-13 | iso-propyl | iso-propyl | —$CH_3$ |
| B-14, B'-14, B''-14, B'''-14, B''''-14, B'''''-14 | sec-butyl | sec-butyl | —$CH_3$ |
| B-15, B'-15, B''-15, B'''-15, B''''-15, B'''''-15 | iso-butyl | iso-butyl | —$CH_3$ |
| B-16, B'-16, B''-16, B'''-16, B''''-16, B'''''-16 | neopentyl | neopentyl | —$CH_3$ |
| B-17, B'-17, B''-17, B'''-17, B''''-17, B'''''-17 | 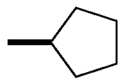 | 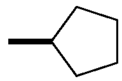 | —$CH_3$ |
| B-18, B'-18, B''-18, B'''-18, B''''-18, B'''''-18 | 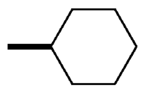 | 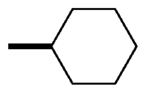 | —$CH_3$ |
| B-19, B'-19, B''-19, B'''-19, B''''-19, B'''''-19 | —$CH_3$ | —$CH_3$ | —$CH_2CH_3$ |
| B-20, B'-20, B''-20, B'''-20, B''''-20, B'''''-20 | —$CH_2CH_3$ | —$CH_2CH_3$ | —$CH_2CH_3$ |
| B-21, B'-21, B''-21, B'''-21, B''''-21, B'''''-21 | n-propyl | n-propyl | —$CH_2CH_3$ |
| B-22, B'-22, B''-22, B'''-22, B''''-22, B'''''-22 | iso-propyl | iso-propyl | —$CH_2CH_3$ |
| B-23, B'-23, B''-23, B'''-23, B''''-23, B'''''-23 | sec-butyl | sec-butyl | —$CH_2CH_3$ |
| B-24, B'-24, B''-24, B'''-24, B''''-24, B'''''-24 | iso-butyl | iso-butyl | —$CH_2CH_3$ |
| B-25, B'-25, B''-25, B'''-25, B''''-25, B'''''-25 | neopentyl | neopentyl | —$CH_2CH_3$ |
| B-26, B'-26, B''-26, B'''-26, B''''-26, B'''''-26 | 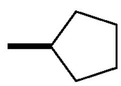 | 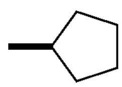 | —$CH_2CH_3$ |
| B-27, B'-27, B''-27, B'''-27, B''''-27, B'''''-27 | 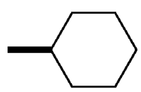 | 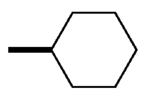 | —$CH_2CH_3$ |
| B-28, B'-28, B''-28, B'''-28, B''''-28, B'''''-28 | —$CH_3$ | —$CH_3$ | n-propyl |
| B-29, B'-29, B''-29, B'''-29, B''''-29, B'''''-29 | —$CH_2CH_3$ | —$CH_2CH_3$ | n-propyl |
| B-30, B'-30, B''-30, B'''-30, B''''-30, B'''''-30 | n-propyl | n-propyl | n-propyl |
| B-31, B'-31, B''-31, B'''-31, B''''-31, B'''''-31 | iso-propyl | iso-propyl | n-propyl |
| B-32, B'-32, B''-32, B'''-32, B''''-32, B'''''-32 | sec-butyl | sec-butyl | n-propyl |
| B-33, B'-33, B''-33, B'''-33, B''''-33, B'''''-33 | iso-butyl | iso-butyl | n-propyl |
| B-34, B'-34, B''-34, B'''-34, B''''-34, B'''''-34 | neopentyl | neopentyl | n-propyl |
| B-35, B'-35, B''-35, B'''-35, B''''-35, B'''''-35 | 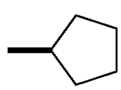 | 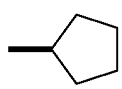 | n-propyl |
| B-36, B'-36, B''-36, B'''-36, B''''-36, B'''''-36 | 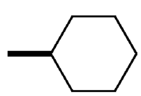 | 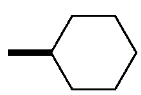 | n-propyl |
| B-37, B'-37, B''-37, B'''-37, B''''-37, B'''''-37 | —$CH_3$ | —$CH_3$ | iso-propyl |
| B-38, B'-38, B''-38, B'''-38, B''''-38, B'''''-38 | —$CH_2CH_3$ | —$CH_2CH_3$ | iso-propyl |
| B-39, B'-39, B''-39, B'''-39, B''''-39, B'''''-39 | n-propyl | n-propyl | iso-propyl |
| B-40, B'-40, B''-40, B'''-40, B''''-40, B'''''-40 | iso-propyl | iso-propyl | iso-propyl |
| B-41, B'-41, B''-41, B'''-41, B''''-41, B'''''-41 | sec-butyl | sec-butyl | iso-propyl |
| B-42, B'-42, B''-42, B'''-42, B''''-42, B'''''-42 | iso-butyl | iso-butyl | iso-propyl |
| B-43, B'-43, B''-43, B'''-43, B''''-43, B'''''-43 | neopentyl | neopentyl | iso-propyl |
| B-44, B'-44, B''-44, B'''-44, B''''-44, B'''''-44 | 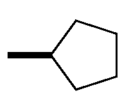 | 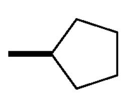 | iso-propyl |
| B-45, B'-45, B''-45, B'''-45, B''''-45, B'''''-45 | 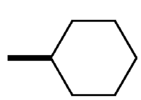 | 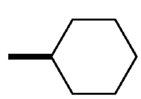 | iso-propyl |
| B-46, B'-46, B''-46, B'''-46, B''''-46, B'''''-46 | —$CH_3$ | —$CH_3$ | sec-butyl |

-continued

| Cpd. | $R^3$ | $R^2$ | $R^6 = R^8$ |
|---|---|---|---|
| B-47, B'-47, B''-47, B'''-47, B''''-47, B'''''-47 | —$CH_2CH_3$ | —$CH_2CH_3$ | sec-butyl |
| B-48, B'-48, B''-48, B'''-48, B''''-48, B'''''-48 | n-propyl | n-propyl | sec-butyl |
| B-49, B'-49, B''-49, B'''-49, B''''-49, B'''''-49 | iso-propyl | iso-propyl | sec-butyl |
| B-50, B'-50, B''-50, B'''-50, B''''-50, B'''''-50 | sec-butyl | sec-butyl | sec-butyl |
| B-51, B'-51, B''-51, B'''-51, B''''-51, B'''''-51 | iso-butyl | iso-butyl | sec-butyl |
| B-52, B'-52, B''-52, B'''-52, B''''-52, B'''''-52 | neopentyl | neopentyl | sec-butyl |
| B-53, B'-53, B''-53, B'''-53, B''''-53, B'''''-53 | 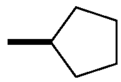 | 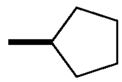 | sec-butyl |
| B-54, B'-54, B''-54, B'''-54, B''''-54, B'''''-54 | 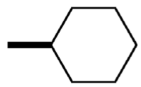 | 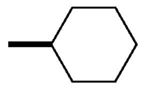 | sec-butyl |
| B-55, B'-55, B''-55, B'''-55, B''''-55, B'''''-55 | —$CH_3$ | —$CH_3$ | iso-butyl |
| B-56, B'-56, B''-56, B'''-56, B''''-56, B'''''-56 | —$CH_2CH_3$ | —$CH_2CH_3$ | iso-butyl |
| B-57, B'-57, B''-57, B'''-57, B''''-57, B'''''-57 | n-propyl | n-propyl | iso-butyl |
| B-58, B'-58, B''-58, B'''-58, B''''-58, B'''''-58 | iso-propyl | iso-propyl | iso-butyl |
| B-59, B'-59, B''-59, B'''-59, B''''-59, B'''''-59 | sec-butyl | sec-butyl | iso-butyl |
| B-60, B'-60, B''-60, B'''-60, B''''-60, B'''''-60 | iso-butyl | iso-butyl | iso-butyl |
| B-61, B'-61, B''-61, B'''-61, B''''-61, B'''''-61 | neopentyl | neopentyl | iso-butyl |
| B-62, B'-62, B''-62, B'''-62, B''''-62, B'''''-62 | 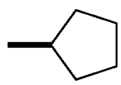 | 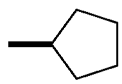 | iso-butyl |
| B-63, B'-63, B''-63, B'''-63, B''''-63, B'''''-63 | 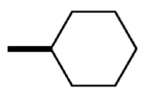 | 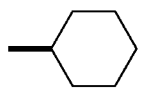 | iso-butyl |
| B-64, B'-64, B''-64, B'''-64, B''''-64, B'''''-64 | —$CH_3$ | —$CH_3$ | neopentyl |
| B-65, B'-65, B''-65, B'''-65, B''''-65, B'''''-65 | —$CH_2CH_3$ | —$CH_2CH_3$ | neopentyl |
| B-66, B'-66, B''-66, B'''-66, B''''-66, B'''''-66 | n-propyl | n-propyl | neopentyl |
| B-67, B'-67, B''-67, B'''-67, B''''-67, B'''''-67 | iso-propyl | iso-propyl | neopentyl |
| B-68, B'-68, B''-68, B'''-68, B''''-68, B'''''-68 | sec-butyl | sec-butyl | neopentyl |
| B-69, B'-69, B''-69, B'''-69, B''''-69, B'''''-69 | iso-butyl | iso-butyl | neopentyl |
| B-70, B'-70, B''-70, B'''-70, B''''-70, B'''''-70 | neopentyl | neopentyl | neopentyl |
| B-71, B'-71, B''-71, B'''-71, B''''-71, B'''''-71 | 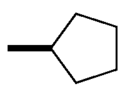 | 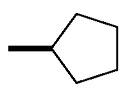 | neopentyl |
| B-72, B'-72, B''-72, B'''-72, B''''-72, B'''''-72 | 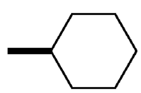 | 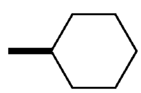 | neopentyl |
| B-73, B'-73, B''-73, B'''-73, B''''-73, B'''''-73 | —$CH_3$ | —$CH_3$ | 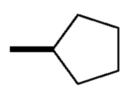 |
| B-74, B'-74, B''-74, B'''-74, B''''-74, B'''''-74 | —$CH_2CH_3$ | —$CH_2CH_3$ | 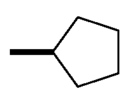 |
| B-75, B'-75, B''-75, B'''-75, B''''-75, B'''''-75 | n-propyl | n-propyl | 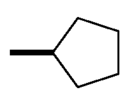 |
| B-76, B'-76, B''-76, B'''-76, B''''-76, B'''''-76 | iso-propyl | iso-propyl | 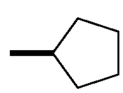 |
| B-77, B'-77, B''-77, B'''-77, B''''-77, B'''''-77 | sec-butyl | sec-butyl | 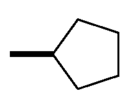 |

-continued

| Cpd. | $R^3$ | $R^2$ | $R^6 = R^8$ |
|---|---|---|---|
| B-78, B'-78, B''-78, B'''-78, B''''-78, B'''''-78 | iso-butyl | iso-butyl | 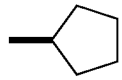 |
| B-79, B'-79, B''-79, B'''-79, B''''-79, B'''''-79 | neopentyl | neopentyl | 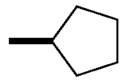 |
| B-80, B'-80, B''-80, B'''-80, B''''-80, B'''''-80 | 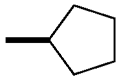 | 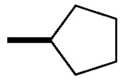 | 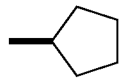 |
| B-81, B'-81, B''-81, B'''-81, B''''-81, B'''''-81 | 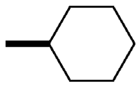 | 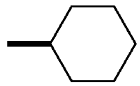 | 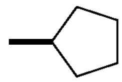 |
| B-82, B'-82, B''-82, B'''-82, B''''-82, B'''''-82 | $—CH_3$ | $—CH_3$ | 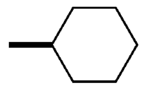 |
| B-83, B'-83, B''-83, B'''-83, B''''-83, B'''''-83 | $—CH_2CH_3$ | $—CH_2CH_3$ | 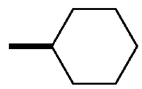 |
| B-84, B'-84, B''-84, B'''-84, B''''-84, B'''''-84 | n-propyl | n-propyl | 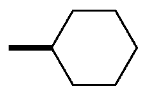 |
| B-85, B'-85, B''-85, B'''-85, B''''-85, B'''''-85 | iso-propyl | iso-propyl | 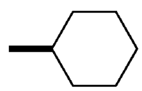 |
| B-86, B'-86, B''-86, B'''-86, B''''-86, B'''''-86 | sec-butyl | sec-butyl | 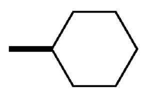 |
| B-87, B'-87, B''-87, B'''-87, B''''-87, B'''''-87 | iso-butyl | iso-butyl | 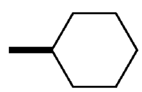 |
| B-88, B'-88, B''-88, B'''-88, B''''-88, B'''''-88 | neopentyl | neopentyl | 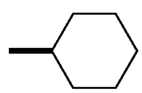 |
| B-89, B'-89, B''-89, B'''-89, B''''-89, B'''''-89 | 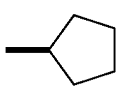 | 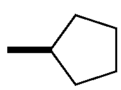 | 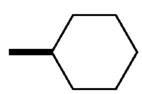 |
| B-90, B'-90, B''-90, B'''-90, B''''-90, B'''''-90 | 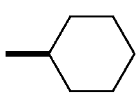 | 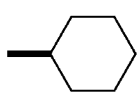 | 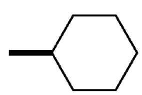 |
| B-91, B'-91, B''-91, B'''-91, B''''-91, B'''''-91 | $—CH_3$ | $—CH_3$ | tert-butyl |
| B-92, B'-92, B''-92, B'''-92, B''''-92, B'''''-92 | $—CH_2CH_3$ | $—CH_2CH_3$ | tert-butyl |
| B-93, B'-93, B''-93, B'''-93, B''''-93, B'''''-93 | n-propyl | n-propyl | tert-butyl |
| B-94, B'-94, B''-94, B'''-94, B''''-94, B'''''-94 | iso-propyl | iso-propyl | tert-butyl |
| B-95, B'-95, B''-95, B'''-95, B''''-95, B'''''-95 | sec-butyl | sec-butyl | tert-butyl |
| B-96, B'-96, B''-96, B'''-96, B''''-96, B'''''-96 | iso-butyl | iso-butyl | tert-butyl |
| B-97, B'-97, B''-97, B'''-97, B''''-97, B'''''-97 | neopentyl | neopentyl | tert-butyl |
| B-98, B'-98, B''-98, B'''-98, B''''-98, B'''''-98 | 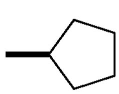 | 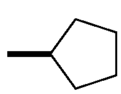 | tert-butyl |

-continued

| Cpd. | $R^3$ | $R^2$ | $R^6 = R^8$ |
|---|---|---|---|
| B-99, B'-99, B"-99, B"'-99, B""-99, B"""-99 | 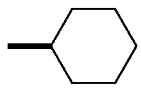 | 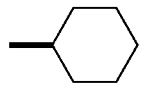 | tert-butyl |
| B-100, B'-100, B"-100, B"'-100, B""-100, B"""-100 | —$CH_3$ | —$CH_3$ | tert-amyl |
| B-101, B'-100, B"-101, B"'-101, B""-101, B"""-101 | —$CH_2CH_3$ | —$CH_2CH_3$ | tert-amyl |
| B-102, B'-100, B"-102, B"'-102, B""-102, B"""-102 | n-propyl | n-propyl | tert-amyl |
| B-103, B'-100, B"-103, B"'-103, B""-103, B"""-103 | iso-propyl | iso-propyl | tert-amyl |
| B-104, B'-100, B"-104, B"'-104, B""-104, B"""-104 | sec-butyl | sec-butyl | tert-amyl |
| B-105, B'-100, B"-105, B"'-105, B""-105, B"""-105 | iso-butyl | iso-butyl | tert-amyl |
| B-106, B'-100, B"-106, B"'-106, B""-106, B"""-106 | neopentyl | neopentyl | tert-amyl |
| B-107, B'-100, B"-107, B"'-107, B""-107, B"""-107 | 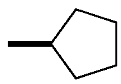 | 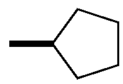 | tert-amyl |
| B-108, B'-100, B"-108, B"'-108, B""-108, B"""-108 | 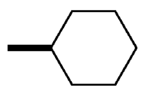 | 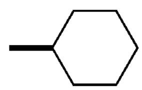 | tert-amyl |

Preferred compounds B, B', B", B"', B"" and B""" are compounds B-1, B'-1, B"-1, B"'-1, B""-1 and B"""-1 to B-90, B'-90, B"-90, B"'-90, B""-90 and B"""-90.

(IIg-C)

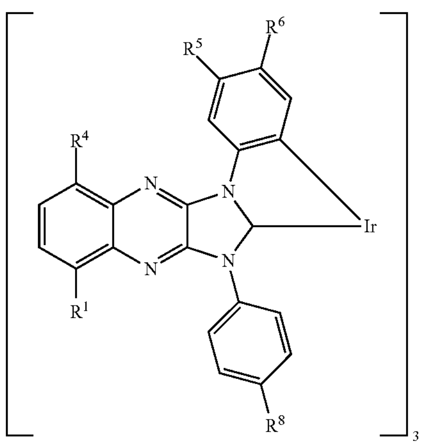

| Cpd. | $R^4$ | $R^1$ | $R^5 = R^6 = R^8$ |
|---|---|---|---|
| C-1 | —$CH_3$ | —$CH_3$ | H |
| C-2 | —$CH_2CH_3$ | —$CH_2CH_3$ | H |
| C-3 | n-propyl | n-propyl | H |
| C-4 | iso-propyl | iso-propyl | H |
| C-5 | sec-butyl | sec-butyl | H |
| C-6 | iso-butyl | iso-butyl | H |
| C-7 | neopentyl | Neopentyl | H |
| C-8 | 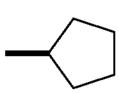 | 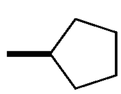 | H |
| C-9 | 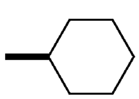 | 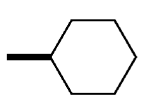 | H |
| C-10 | —$CH_3$ | —$CH_3$ | —$CH_3$ |

-continued

| Cpd. | $R^4$ | $R^1$ | $R^5 = R^6 = R^8$ |
|---|---|---|---|
| C-11 | —$CH_2CH_3$ | —$CH_2CH_3$ | —$CH_3$ |
| C-12 | n-propyl | n-propyl | —$CH_3$ |
| C-13 | iso-propyl | iso-propyl | —$CH_3$ |
| C-14 | sec-butyl | sec-butyl | —$CH_3$ |
| C-15 | iso-butyl | iso-butyl | —$CH_3$ |
| C-16 | neopentyl | Neopentyl | —$CH_3$ |
| C-17 | 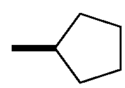 | 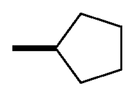 | —$CH_3$ |
| C-18 | 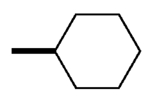 | 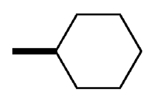 | —$CH_3$ |
| C-19 | —$CH_3$ | —$CH_3$ | —$CH_2CH_3$ |
| C-20 | —$CH_2CH_3$ | —$CH_2CH_3$ | —$CH_2CH_3$ |
| C-21 | n-propyl | n-propyl | —$CH_2CH_3$ |
| C-22 | iso-propyl | iso-propyl | —$CH_2CH_3$ |
| C-23 | sec-butyl | sec-butyl | —$CH_2CH_3$ |
| C-24 | iso-butyl | iso-butyl | —$CH_2CH_3$ |
| C-25 | neopentyl | Neopentyl | —$CH_2CH_3$ |
| C-26 | 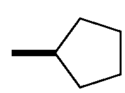 | 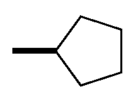 | —$CH_2CH_3$ |
| C-27 | 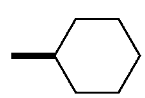 | 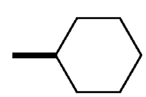 | —$CH_2CH_3$ |
| C-28 | —$CH_3$ | —$CH_3$ | n-propyl |
| C-29 | —$CH_2CH_3$ | —$CH_2CH_3$ | n-propyl |
| C-30 | n-propyl | n-propyl | n-propyl |
| C-31 | iso-propyl | iso-propyl | n-propyl |
| C-32 | sec-butyl | sec-butyl | n-propyl |
| C-33 | iso-butyl | iso-butyl | n-propyl |
| C-34 | neopentyl | Neopentyl | n-propyl |
| C-35 | 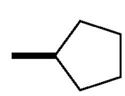 | 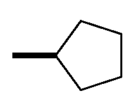 | n-propyl |

-continued

| Cpd. | $R^4$ | $R^1$ | $R^5 = R^6 = R^8$ |
|---|---|---|---|
| C-36 | 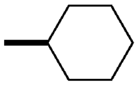 | 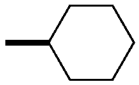 | n-propyl |
| C-37 | —$CH_3$ | —$CH_3$ | iso-propyl |
| C-38 | —$CH_2CH_3$ | —$CH_2CH_3$ | iso-propyl |
| C-39 | n-propyl | n-propyl | iso-propyl |
| C-40 | iso-propyl | iso-propyl | iso-propyl |
| C-41 | sec-butyl | sec-butyl | iso-propyl |
| C-42 | iso-butyl | iso-butyl | iso-propyl |
| C-43 | neopentyl | Neopentyl | iso-propyl |
| C-44 | 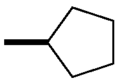 | 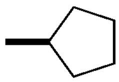 | iso-propyl |
| C-45 | 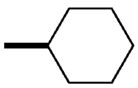 | 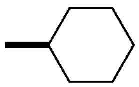 | iso-propyl |
| C-46 | —$CH_3$ | —$CH_3$ | sec-butyl |
| C-47 | —$CH_2CH_3$ | —$CH_2CH_3$ | sec-butyl |
| C-48 | n-propyl | n-propyl | sec-butyl |
| C-49 | iso-propyl | iso-propyl | sec-butyl |
| C-50 | sec-butyl | sec-butyl | sec-butyl |
| C-51 | iso-butyl | iso-butyl | sec-butyl |
| C-52 | neopentyl | Neopentyl | sec-butyl |
| C-53 | 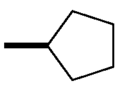 | 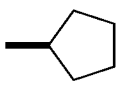 | sec-butyl |
| C-54 | 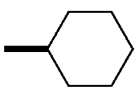 | 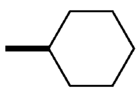 | sec-butyl |
| C-55 | —$CH_3$ | —$CH_3$ | iso-butyl |
| C-56 | —$CH_2CH_3$ | —$CH_2CH_3$ | iso-butyl |
| C-57 | n-propyl | n-propyl | iso-butyl |
| C-58 | iso-propyl | iso-propyl | iso-butyl |
| C-59 | sec-butyl | sec-butyl | iso-butyl |
| C-60 | iso-butyl | iso-butyl | iso-butyl |
| C-61 | neopentyl | Neopentyl | iso-butyl |
| C-62 | 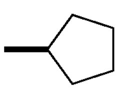 | 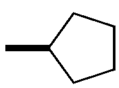 | iso-butyl |
| C-63 | 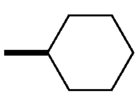 | 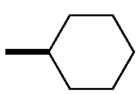 | iso-butyl |
| C-64 | —$CH_3$ | —$CH_3$ | neopentyl |
| C-65 | —$CH_2CH_3$ | —$CH_2CH_3$ | neopentyl |
| C-66 | n-propyl | n-propyl | neopentyl |
| C-67 | iso-propyl | iso-propyl | neopentyl |
| C-68 | sec-butyl | sec-butyl | neopentyl |
| C-69 | iso-butyl | iso-butyl | neopentyl |
| C-70 | neopentyl | Neopentyl | neopentyl |
| C-71 | 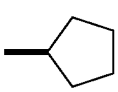 | 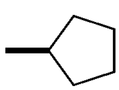 | neopentyl |
| C-72 | 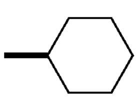 | 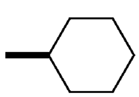 | neopentyl |

-continued

| Cpd. | $R^4$ | $R^1$ | $R^5 = R^6 = R^8$ |
|---|---|---|---|
| C-73 | —$CH_3$ | —$CH_3$ | 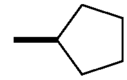 |
| C-74 | —$CH_2CH_3$ | —$CH_2CH_3$ | 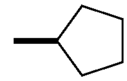 |
| C-75 | n-propyl | n-propyl | 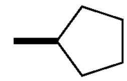 |
| C-76 | iso-propyl | iso-propyl | 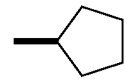 |
| C-77 | sec-butyl | sec-butyl | 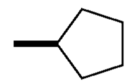 |
| C-78 | iso-butyl | iso-butyl | 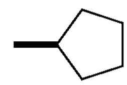 |
| C-79 | neopentyl | Neopentyl | 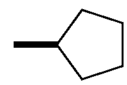 |
| C-80 | 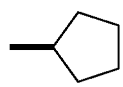 | 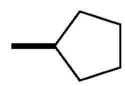 | 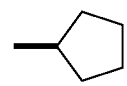 |
| C-81 | 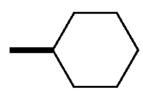 | 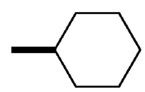 | 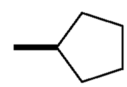 |
| C-82 | —$CH_3$ | —$CH_3$ | 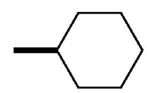 |
| C-83 | —$CH_2CH_3$ | —$CH_2CH_3$ | 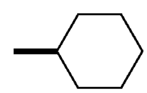 |
| C-84 | n-propyl | n-propyl | 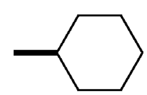 |
| C-85 | iso-propyl | iso-propyl | 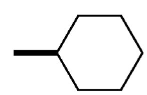 |
| C-86 | sec-butyl | sec-butyl | 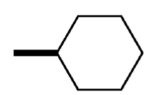 |
| C-87 | iso-butyl | iso-butyl | 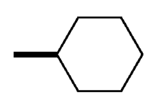 |
| C-88 | neopentyl | Neopentyl | 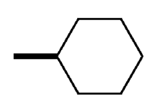 |

-continued

| Cpd. | $R^4$ | $R^1$ | $R^5 = R^6 = R^8$ |
|---|---|---|---|
| C-89 | 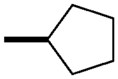 | 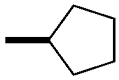 | 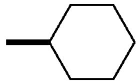 |
| C-90 | 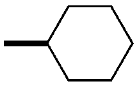 | 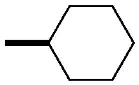 | 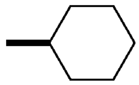 |
| C-91 | tert-butyl | tert-butyl | $—CH_3$ |
| C-92 | tert-butyl | tert-butyl | $—CH_2CH_3$ |
| C-93 | tert-butyl | tert-butyl | n-propyl |
| C-94 | tert-butyl | tert-butyl | iso-propyl |
| C-95 | tert-butyl | tert-butyl | sec-butyl |
| C-96 | tert-butyl | tert-butyl | iso-butyl |
| C-97 | tert-butyl | tert-butyl | neopentyl |
| C-98 | tert-butyl | tert-butyl | 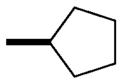 |
| C-99 | tert-butyl | tert-butyl | 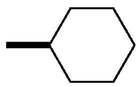 |
| C-100 | tert-amyl | tert-amyl | $—CH_3$ |
| C-101 | tert-amyl | tert-amyl | $—CH_2CH_3$ |
| C-102 | tert-amyl | tert-amyl | n-propyl |
| C-103 | tert-amyl | tert-amyl | iso-propyl |
| C-104 | tert-amyl | tert-amyl | sec-butyl |
| C-105 | tert-amyl | tert-amyl | iso-butyl |
| C-106 | tert-amyl | tert-amyl | neopentyl |
| C-107 | tert-amyl | tert-amyl | 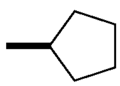 |
| C-108 | tert-amyl | tert-amyl | 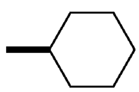 |
| C-109 | H | H | H |

Preferred compounds C are C-1 to C-90. Further, most preferred is compound C-109.

(IIh-D)

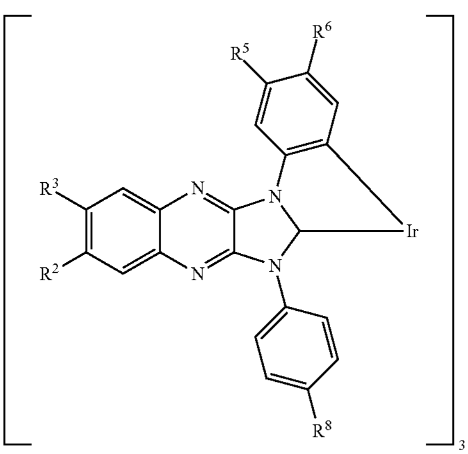

| Cpd. | $R^3$ | $R^2$ | $R^5 = R^6 = R^8$ |
|---|---|---|---|
| D-1 | $—CH_3$ | $—CH_3$ | H |
| D-2 | $—CH_2CH_3$ | $—CH_2CH_3$ | H |
| D-3 | n-propyl | n-propyl | H |
| D-4 | iso-propyl | iso-propyl | H |
| D-5 | sec-butyl | sec-butyl | H |
| D-6 | iso-butyl | iso-butyl | H |
| D-7 | neopentyl | Neopentyl | H |
| D-8 | 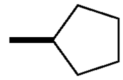 | 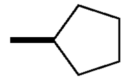 | H |
| D-9 | 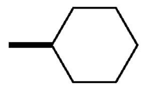 | 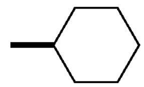 | H |
| D-10 | $—CH_3$ | $—CH_3$ | $—CH_3$ |
| D-11 | $—CH_2CH_3$ | $—CH_2CH_3$ | $—CH_3$ |
| D-12 | n-propyl | n-propyl | $—CH_3$ |
| D-13 | iso-propyl | iso-propyl | $—CH_3$ |
| D-14 | sec-butyl | sec-butyl | $—CH_3$ |
| D-15 | iso-butyl | iso-butyl | $—CH_3$ |
| D-16 | neopentyl | Neopentyl | $—CH_3$ |
| D-17 | 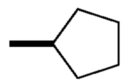 | 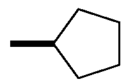 | $—CH_3$ |
| D-18 | 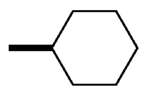 | 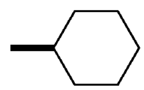 | $—CH_3$ |
| D-19 | $—CH_3$ | $—CH_3$ | $—CH_2CH_3$ |
| D-20 | $—CH_2CH_3$ | $—CH_2CH_3$ | $—CH_2CH_3$ |
| D-21 | n-propyl | n-propyl | $—CH_2CH_3$ |
| D-22 | iso-propyl | iso-propyl | $—CH_2CH_3$ |
| D-23 | sec-butyl | sec-butyl | $—CH_2CH_3$ |
| D-24 | iso-butyl | iso-butyl | $—CH_2CH_3$ |
| D-25 | neopentyl | Neopentyl | $—CH_2CH_3$ |
| D-26 | 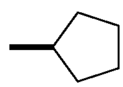 | 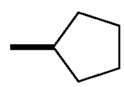 | $—CH_2CH_3$ |
| D-27 | 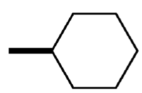 | 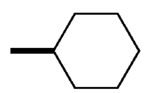 | $—CH_2CH_3$ |
| D-28 | $—CH_3$ | $—CH_3$ | n-propyl |
| D-29 | $—CH_2CH_3$ | $—CH_2CH_3$ | n-propyl |
| D-30 | n-propyl | n-propyl | n-propyl |
| D-31 | iso-propyl | iso-propyl | n-propyl |
| D-32 | sec-butyl | sec-butyl | n-propyl |
| D-33 | iso-butyl | iso-butyl | n-propyl |
| D-34 | neopentyl | Neopentyl | n-propyl |
| D-35 | 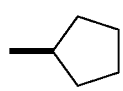 | 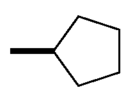 | n-propyl |
| D-36 | 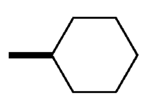 | 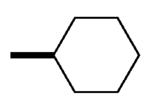 | n-propyl |
| D-37 | $—CH_3$ | $—CH_3$ | iso-propyl |
| D-38 | $—CH_2CH_3$ | $—CH_2CH_3$ | iso-propyl |
| D-39 | n-propyl | n-propyl | iso-propyl |
| D-40 | iso-propyl | iso-propyl | iso-propyl |
| D-41 | sec-butyl | sec-butyl | iso-propyl |
| D-42 | iso-butyl | iso-butyl | iso-propyl |
| D-43 | neopentyl | Neopentyl | iso-propyl |

-continued

| Cpd. | $R^3$ | $R^2$ | $R^5 = R^6 = R^8$ |
|---|---|---|---|
| D-44 | 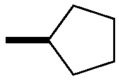 | 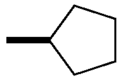 | iso-propyl |
| D-45 | 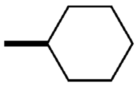 | 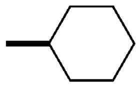 | iso-propyl |
| D-46 | —$CH_3$ | —$CH_3$ | sec-butyl |
| D-47 | —$CH_2CH_3$ | —$CH_2CH_3$ | sec-butyl |
| D-48 | n-propyl | n-propyl | sec-butyl |
| D-49 | iso-propyl | iso-propyl | sec-butyl |
| D-50 | sec-butyl | sec-butyl | sec-butyl |
| D-51 | iso-butyl | iso-butyl | sec-butyl |
| D-52 | neopentyl | Neopentyl | sec-butyl |
| D-53 | 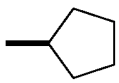 | 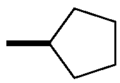 | sec-butyl |
| D-54 | 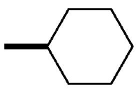 | 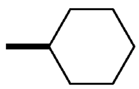 | sec-butyl |
| D-55 | —$CH_3$ | —$CH_3$ | iso-butyl |
| D-56 | —$CH_2CH_3$ | —$CH_2CH_3$ | iso-butyl |
| D-57 | n-propyl | n-propyl | iso-butyl |
| D-58 | iso-propyl | iso-propyl | iso-butyl |
| D-59 | sec-butyl | sec-butyl | iso-butyl |
| D-60 | iso-propyl | iso-propyl | iso-butyl |
| D-61 | neopentyl | Neopentyl | iso-butyl |
| D-62 | 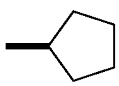 | 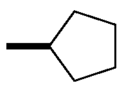 | iso-butyl |
| D-63 | 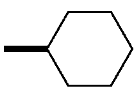 | 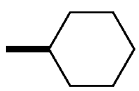 | iso-butyl |
| D-64 | —$CH_3$ | —$CH_3$ | neopentyl |
| D-65 | —$CH_2CH_3$ | —$CH_2CH_3$ | neopentyl |
| D-66 | n-propyl | n-propyl | neopentyl |
| D-67 | iso-propyl | iso-propyl | neopentyl |
| D-68 | sec-butyl | sec-butyl | neopentyl |
| D-69 | iso-butyl | iso-butyl | neopentyl |
| D-70 | neopentyl | Neopentyl | neopentyl |
| D-71 | 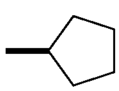 | 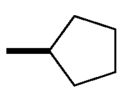 | neopentyl |
| D-72 | 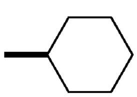 | 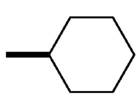 | neopentyl |
| D-73 | —$CH_3$ | —$CH_3$ | 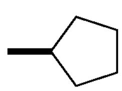 |
| D-74 | —$CH_2CH_3$ | —$CH_2CH_3$ | 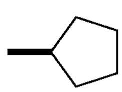 |
| D-75 | n-propyl | n-propyl | 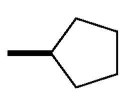 |

-continued

| Cpd. | $R^3$ | $R^2$ | $R^5 = R^6 = R^8$ |
|---|---|---|---|
| D-76 | iso-propyl | iso-propyl | 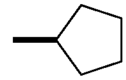 |
| D-77 | sec-butyl | sec-butyl | 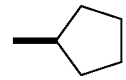 |
| D-78 | iso-butyl | iso-butyl | 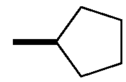 |
| D-79 | neopentyl | Neopentyl | 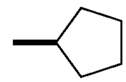 |
| D-80 | 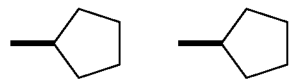 | | 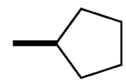 |
| D-81 | 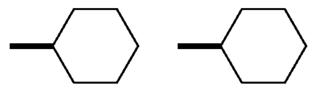 | | 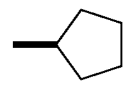 |
| D-82 | —$CH_3$ | —$CH_3$ | 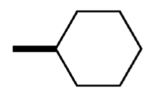 |
| D-83 | —$CH_2CH_3$ | —$CH_2CH_3$ | 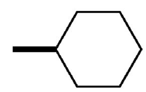 |
| D-84 | n-propyl | n-propyl | 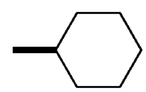 |
| D-85 | iso-propyl | iso-propyl | 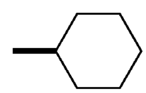 |
| D-86 | sec-butyl | sec-butyl | 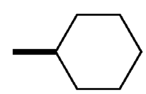 |
| D-87 | iso-butyl | iso-butyl | 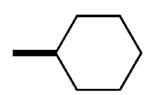 |
| D-88 | neopentyl | Neopentyl | 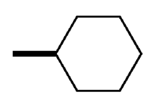 |
| D-89 | 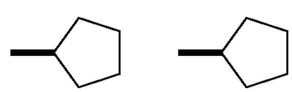 | | 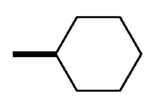 |
| D-90 | 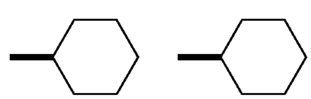 | | 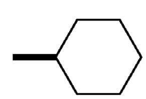 |

-continued (IIe-E)

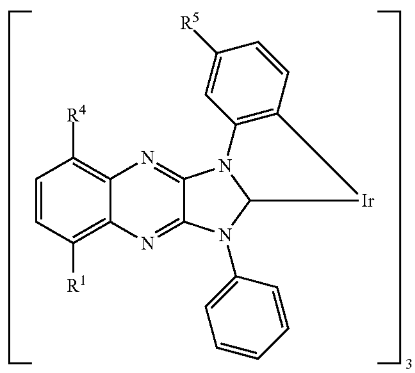

(IIe-E')

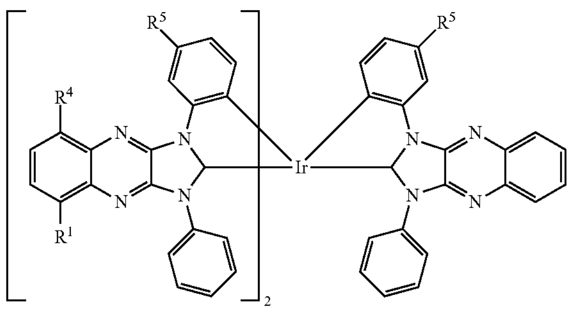

(IIe-E'')

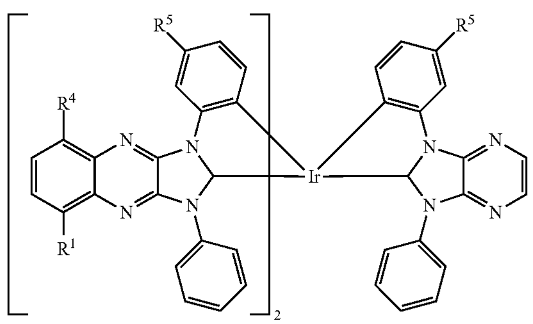

or (IIe-E''')

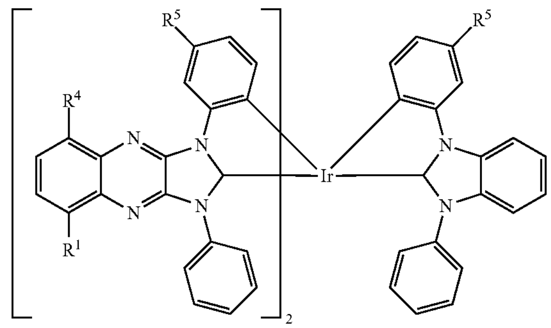

(IIe-E'''')

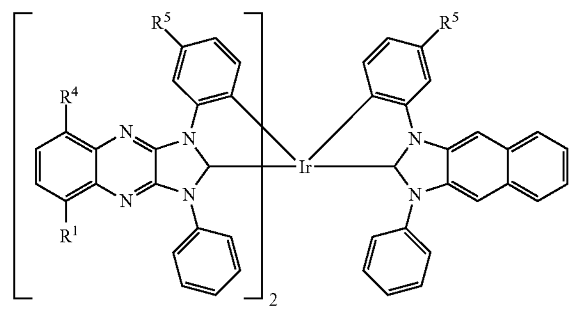

(IIe-E''''')

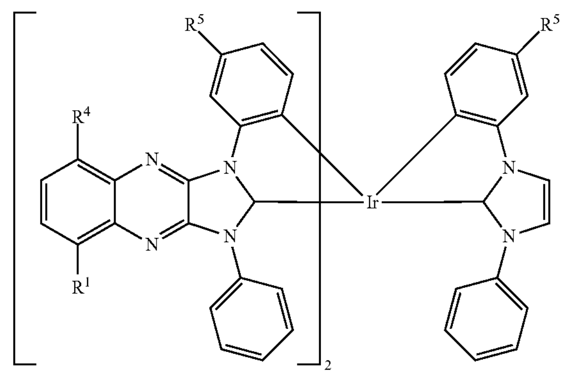

| Cpd. | $R^4$ | $R^1$ | $R^5$ |
|---|---|---|---|
| E-1, E'-1, E''-1, E'''-1, E''''-1, E'''''-1 | $—CH_3$ | $—CH_3$ | H |
| E-2, E'-2, E''-2, E'''-2, E''''-2, E'''''-2 | $—CH_2CH_3$ | $—CH_2CH_3$ | H |
| E-3, E'-3, E''-3, E'''-3, E-''''-3, E'''''-3 | n-propyl | n-propyl | H |
| E-4, E'-4, E''-4, E'''-4, E''''-4, E'''''-4 | iso-propyl | iso-propyl | H |
| E-5, E'-5, E''-5, E'''-5, E''''-5, E'''''-5 | sec-butyl | sec-butyl | H |
| E-6, E'-6, E''-6, E'''-6, E''''-6, E'''''-6 | iso-butyl | iso-butyl | H |
| E-7, E'-7, E''-7, E'''-7, E''''-7, E'''''-7 | neopentyl | neopentyl | H |
| E-8, E'-8, E''-8, E'''-8, E''''-8, E'''''-8 | 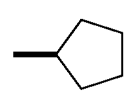 | 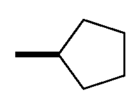 | H |
| E-9, E'-9, E''-9, E'''-9, E''''-9, E'''''-9 | 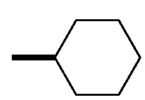 | 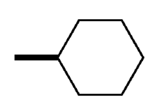 | H |
| E-10, E'-10, E''-10, E'''-10, E''''-10, E'''''-10 | $—CH_3$ | $—CH_3$ | $—CH_3$ |
| E-11, E'-11, E''-11, E'''-11, E''''-11, E'''''-11 | $—CH_2CH_3$ | $—CH_2CH_3$ | $—CH_3$ |
| E-12, E'-12, E''-12, E'''-12, E''''-12, E'''''-12 | n-propyl | n-propyl | $—CH_3$ |
| E-13, E'-13, E''-13, E'''-13, E''''-13, E'''''-13 | iso-propyl | iso-propyl | $—CH_3$ |

-continued

| Cpd. | $R^4$ | $R^1$ | $R^5$ |
|---|---|---|---|
| E-14, E'-14, E''-14, E'''-14, E''''-14, E'''''-14 | sec-butyl | sec-butyl | $—CH_3$ |
| E-15, E'-15, E''-15, E'''-15, E''''-15, E'''''-15 | iso-butyl | iso-butyl | $—CH_3$ |
| E-16, E'-16, E''-16, E'''-16, E''''-16, E'''''-16 | neopentyl | neopentyl | $—CH_3$ |
| E-17, E'-17, E''-17, E'''-17, E''''-17, E'''''-17 | 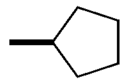 | 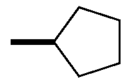 | $—CH_3$ |
| E-18, E'-18, E''-18, E'''-18, E''''-18, E'''''-18 | 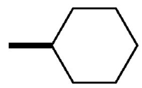 | 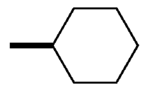 | $—CH_3$ |
| E-19, E'-19, E''-19, E'''-19, E''''-19, E'''''-19 | $—CH_3$ | $—CH_3$ | $—CH_2CH_3$ |
| E-20, E'-20, E''-20, E'''-20, E''''-20, E'''''-20 | $—CH_2CH_3$ | $—CH_2CH_3$ | $—CH_2CH_3$ |
| E-21, E'-21, E''-21, E'''-21, E''''-21, E'''''-21 | n-propyl | n-propyl | $—CH_2CH_3$ |
| E-22, E'-22, E''-22, E'''-22, E''''-22, E'''''-22 | iso-propyl | iso-propyl | $—CH_2CH_3$ |
| E-23, E'-23, E''-23, E'''-23, E''''-23, E'''''-23 | sec-butyl | sec-butyl | $—CH_2CH_3$ |
| E-24, E'-24, E''-24, E'''-24, E''''-24, E'''''-24 | iso-butyl | iso-butyl | $—CH_2CH_3$ |
| E-25, E'-25, E''-25, E'''-25, E''''-25, E'''''-25 | neopentyl | neopentyl | $—CH_2CH_3$ |
| E-26, E'-26, E''-26, E'''-26, E''''-26, E'''''-26 | 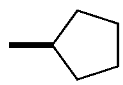 | 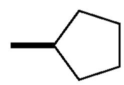 | $—CH_2CH_3$ |
| E-27, E'-27, E''-27, E'''-27, E''''-27, E'''''-27 | 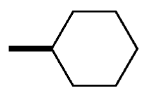 | 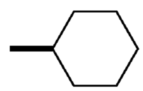 | $—CH_2CH_3$ |
| E-28, E'-28, E''-28, E'''-28, E''''-28, E'''''-28 | $—CH_3$ | $—CH_3$ | n-propyl |
| E-29, E'-29, E''-29, E'''-29, E''''-29, E'''''-29 | $—CH_2CH_3$ | $—CH_2CH_3$ | n-propyl |
| E-30, E'-30, E''-30, E'''-30, E''''-30, E'''''-30 | n-propyl | n-propyl | n-propyl |
| E-31, E'-31, E''-31, E'''-31, E''''-31, E'''''-31 | iso-propyl | iso-propyl | n-propyl |
| E-32, E'-32, E''-32, E'''-32, E''''-32, E'''''-32 | sec-butyl | sec-butyl | n-propyl |
| E-33, E'-33, E''-33, E'''-33, E''''-33, E'''''-33 | iso-butyl | iso-butyl | n-propyl |
| E-34, E'-34, E''-34, E'''-34, E''''-34, E'''''-34 | neopentyl | neopentyl | n-propyl |
| E-35, E'-35, E''-35, E'''-35, E''''-35, E'''''-35 | 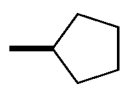 | 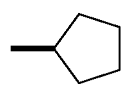 | n-propyl |
| E-36, E'-36, E''-36, E'''-36, E''''-36, E'''''-36 | 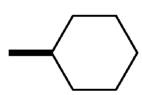 | 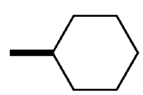 | n-propyl |
| E-37, E'-37, E''-37, E'''-37, E''''-37, E'''''-37 | $—CH_3$ | $—CH_3$ | iso-propyl |
| E-38, E'-38, E''-38, E'''-38, E''''-38, E'''''-38 | $—CH_2CH_3$ | $—CH_2CH_3$ | iso-propyl |
| E-39, E'-39, E''-39, E'''-39, E''''-39, E'''''-39 | n-propyl | n-propyl | iso-propyl |
| E-40, E'-40, E''-40, E'''-40, E''''-40, E'''''-40 | iso-propyl | iso-propyl | iso-propyl |
| E-41, E'-41, E''-41, E'''-41, E''''-41, E'''''-41 | sec-butyl | sec-butyl | iso-propyl |
| E-42, E'-42, E''-42, E'''-42, E''''-42, E'''''-42 | iso-butyl | iso-butyl | iso-propyl |
| E-43, E'-43, E''-43, E'''-43, E''''-43, E'''''-43 | neopentyl | neopentyl | iso-propyl |
| E-44, E'-44, E''-44, E'''-44, E''''-44, E'''''-44 | 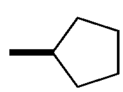 | 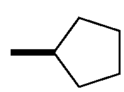 | iso-propyl |
| E-45, E'-45, E''-45, E'''-45, E''''-45, E'''''-45 | 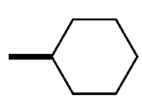 | 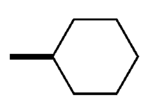 | iso-propyl |
| E-46, E'-46, E''-46 E'''-46, E''''-46, E'''''-46 | $—CH_3$ | $—CH_3$ | sec-butyl |
| E-47, E'-47, E''-47, E'''-47, E''''-47, E'''''-47 | $—CH_2CH_3$ | $—CH_2CH_3$ | sec-butyl |
| E-48, E'-48, E''-48, E'''-48, E''''-48, E'''''-48 | n-propyl | n-propyl | sec-butyl |
| E-49, E'-49, E''-49, E'''-49, E''''-49, E'''''-49 | iso-propyl | iso-propyl | sec-butyl |
| E-50, E'-50, E''-50, E'''-50, E''''-50, E'''''-50 | sec-butyl | sec-butyl | sec-butyl |
| E-51, E'-51, E''-51, E'''-51, E''''-51, E'''''-51 | iso-butyl | iso-butyl | sec-butyl |
| E-52, E'-52, E''-52, E'''-52, E''''-52, E'''''-52 | neopentyl | neopentyl | sec-butyl |

-continued

| Cpd. | $R^4$ | $R^1$ | $R^5$ |
|---|---|---|---|
| E-53, E'-53, E''-53, E'''-53, E''''-53, E'''''-53 | 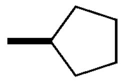 | 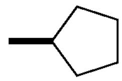 | sec-butyl |
| E-54, E'-54, E''-54, E'''-54, E''''-54, E'''''-54 | 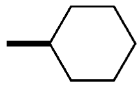 | 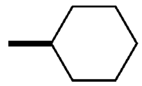 | sec-butyl |
| E-55, E'-55, E''-55, E'''-55, E''''-55, E'''''-55 | $-CH_3$ | $-CH_3$ | iso-butyl |
| E-56, E'-56, E''-56, E'''-56, E''''-56, E'''''-56 | $-CH_2CH_3$ | $-CH_2CH_3$ | iso-butyl |
| E-57, E'-57, E''-57, E'''-57, E''''-57, E'''''-57 | n-propyl | n-propyl | iso-butyl |
| E-58, E'-58, E''-58, E'''-58, E''''-58, E'''''-58 | iso-propyl | iso-propyl | iso-butyl |
| E-59, E'-59, E''-59, E'''-59, E''''-59, E'''''-59 | sec-butyl | sec-butyl | iso-butyl |
| E-60, E'-60, E''-60, E'''-60, E''''-60, E'''''-60 | iso-butyl | iso-butyl | iso-butyl |
| E-61, E'-61, E''-61, E'''-61, E''''-61, E'''''-61 | neopentyl | neopentyl | iso-butyl |
| E-62, E'-62, E''-62, E'''-62, E''''-62, E'''''-62 | 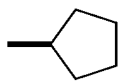 | 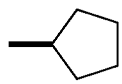 | iso-butyl |
| E-63, E'-63, E''-63, E'''-63, E''''-63, E'''''-63 | 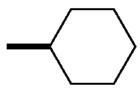 | 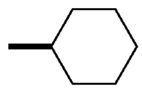 | iso-butyl |
| E-64, E'-64, E''-64, E'''-64, E''''-64, E'''''-64 | $-CH_3$ | $-CH_3$ | neopentyl |
| E-65, E'-65, E''-65, E'''-65, E''''-65, E'''''-65 | $-CH_2CH_3$ | $-CH_2CH_3$ | neopentyl |
| E-66, E'-66, E''-66, E'''-66, E''''-66, E'''''-66 | n-propyl | n-propyl | neopentyl |
| E-67, E'-67, E''-67, E'''-67, E''''-67, E'''''-67 | iso-propyl | iso-propyl | neopentyl |
| E-68, E'-68, E''-68, E'''-68, E''''-68, E'''''-68 | sec-butyl | sec-butyl | neopentyl |
| E-69, E'-69, E''-69, E'''-69, E''''-69, E'''''-69 | iso-butyl | iso-butyl | neopentyl |
| E-70, E'-70, E''-70, E'''-70, E''''-70, E'''''-70 | neopentyl | neopentyl | neopentyl |
| E-71, E'-71, E''-71, E'''-71, E''''-71, E'''''-71 | 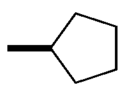 | 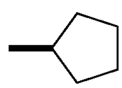 | neopentyl |
| E-72, E'-72, E''-72, E'''-72, E''''-72, E'''''-72 | 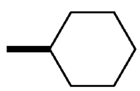 | 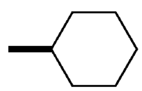 | neopentyl |
| E-73, E'-73, E''-73, E'''-73, E''''-73, E'''''-73 | $-CH_3$ | $-CH_3$ | 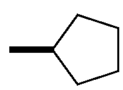 |
| E-74, E'-74, E''-74, E'''-74, E''''-74, E'''''-74 | $-CH_2CH_3$ | $-CH_2CH_3$ | 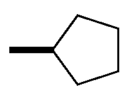 |
| E-75, E'-75, E''-75, E'''-75, E''''-75, E'''''-75 | n-propyl | n-propyl | 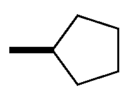 |
| E-76, E'-76, E''-76, E'''-76, E''''-76, E'''''-76 | iso-propyl | iso-propyl | 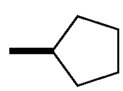 |
| E-77, E'-77, E''-77, E'''-77, E''''-77, E'''''-77 | sec-butyl | sec-butyl | 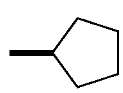 |
| E-78, E'-78, E''-78, E'''-78, E''''-78, E'''''-78 | iso-butyl | iso-butyl | 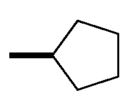 |
| E-79, E'-79, E''-79, E'''-79, E''''-79, E'''''-79 | neopentyl | neopentyl | 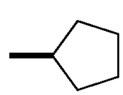 |

-continued

| Cpd. | R⁴ | R¹ | R⁵ |
|---|---|---|---|
| E-80, E'-80, E''-80, E'''-80, E''''-80, E'''''-80 | 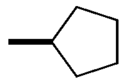 | 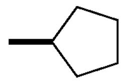 | 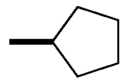 |
| E-81, E'-81, E''-81, E'''-81, E''''-81, E'''''-81 | 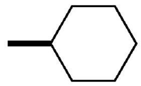 | 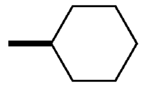 | 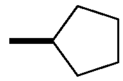 |
| E-82, E'-82, E''-82, E'''-82, E''''-82, E'''''-82 | $—CH_3$ | $—CH_3$ | 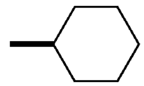 |
| E-83, E'-83, E''-83, E'''-83, E''''-83, E'''''-83 | $—CH_2CH_3$ | $—CH_2CH_3$ | 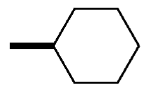 |
| E-84, E'-84, E''-84, E'''-84, E''''-84, E'''''-84 | n-propyl | n-propyl | 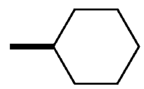 |
| E-85, E'-85, E''-85, E'''-85, E''''-85, E'''''-85 | iso-propyl | iso-propyl | 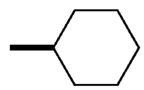 |
| E-86, E'-86, E''-86, E'''-86, E''''-86, E'''''-86 | sec-butyl | sec-butyl | 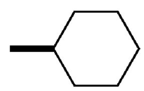 |
| E-87, E'-87, E''-87, E'''-87, E''''-87, E'''''-87 | iso-butyl | iso-butyl | 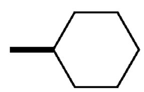 |
| E-88, E'-88, E''-88, E'''-88, E''''-88, E'''''-88 | neopentyl | neopentyl | 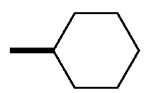 |
| E-89, E'-89, E''-89, E'''-89, E''''-89, E'''''-89 | 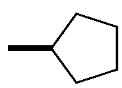 | 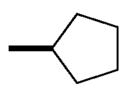 | 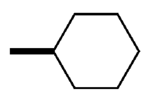 |
| E-90, E'-90, E''-90, E'''-90, E''''-90, E'''''-90 | 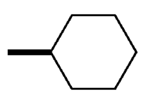 | 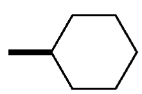 | 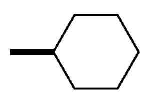 |
| E-91, E'-91, E''-91, E'''-91, E''''-91, E'''''-91 | $—CH_3$ | $—CH_3$ | tert-butyl |
| E-92, E'-92, E''-92, E'''-92, E''''-92, E'''''-92 | $—CH_2CH_3$ | $—CH_2CH_3$ | tert-butyl |
| E-93, E'-93, E''-93, E'''-93, E''''-93, E'''''-93 | n-propyl | n-propyl | tert-butyl |
| E-94, E'-94, E''-94, E'''-94, E''''-94, E'''''-94 | iso-propyl | iso-propyl | tert-butyl |
| E-95, E'-95, E''-95, E'''-95, E''''-95, E'''''-95 | sec-butyl | sec-butyl | tert-butyl |
| E-96, E'-96, E''-96, E'''-96, E''''-96, E'''''-96 | iso-butyl | iso-butyl | tert-butyl |
| E-97, E'-97, E''-97, E'''-97, E''''-97, E'''''-97 | neopentyl | neopentyl | tert-butyl |
| E-98, E'-98, E''-98, E'''-98, E''''-98, E'''''-98 | 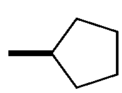 | 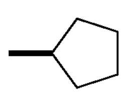 | tert-butyl |
| E-99, E'-99, E''-99, E'''-99, E''''-99, E'''''-99 | 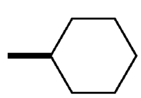 | 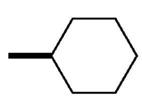 | tert-butyl |
| E-100, E'-100, E''-100, E'''-100, E''''-100, E'''''-100 | $—CH_3$ | $—CH_3$ | tert-amyl |
| E-101, E'-101, E''-101, E'''-101, E''''-101, E'''''-101 | $—CH_2CH_3$ | $—CH_2CH_3$ | tert-amyl |
| E-102, E'-102, E''-102, E'''-102, E''''-102, E'''''-102 | n-propyl | n-propyl | tert-amyl |
| E-103, E'-103, E''-103, E'''-103, E''''-103, E'''''-103 | iso-propyl | iso-propyl | tert-amyl |

-continued

| Cpd. | $R^4$ | $R^1$ | $R^5$ |
|---|---|---|---|
| E-104, E'-104, E"-104, E'"-104, E""-104, E"""-104 | sec-butyl | sec-butyl | tert-amyl |
| E-105, E'-105, E"-105, E'"-105, E""-105, E"""-105 | iso-butyl | iso-butyl | tert-amyl |
| E-106, E'-106, E"-106, E'"-106, E""-106, E"""-106 | neopentyl | neopentyl | tert-amyl |
| E-107, E'-107, E"-107, E'"-107, E""-107, E"""-107 | 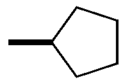 | 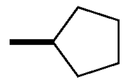 | tert-amyl |
| E-108, E'-108, E"-108, E'"-108, E""-108, E"""-108 | 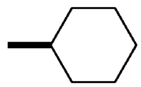 | 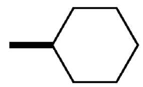 | tert-amyl |
| E-109, E'-109, E"-109, E'"-109, E""-109, E"""-109 | tert-butyl | tert-butyl | $—CH_3$ |
| E-110, E'-110, E"-110, E'"-110, E""-110, E"""-110 | tert-butyl | tert-butyl | $—CH_2CH_3$ |
| E-111, E'-111, E"-111, E'"-111, E""-111, E"""-111 | tert-butyl | tert-butyl | n-propyl |
| E-112, E'-112, E"-112, E'"-112, E""-112, E"""-112 | tert-butyl | tert-butyl | iso-propyl |
| E-113, E'-113, E"-113, E'"-113, E""-113, E"""-113 | tert-butyl | tert-butyl | sec-butyl |
| E-114, E'-114, E"-114, E'"-114, E""-114, E"""-114 | tert-butyl | tert-butyl | iso-butyl |
| E-115, E'-115, E"-115, E'"-115, E""-115, E"""-115 | tert-butyl | tert-butyl | neopentyl |
| E-116, E'-116, E"-116, E'"-116, E""-116, E"""-116 | tert-butyl | tert-butyl | 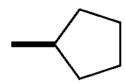 |
| E-117, E'-117, E"-117, E'"-117, E""-117, E"""-117 | tert-butyl | tert-butyl | 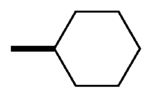 |
| E-118, E'-118, E"-118, E'"-118, E""-118, E"""-118 | tert-butyl | tert-butyl | tert-butyl |
| E-119, E'-119, E"-119, E'"-119, E""-119, E"""-119 | tert-butyl | tert-butyl | tert-amyl |
| E-120, E'-120, E"-120, E'"-120, E""-120, E"""-120 | tert-amyl | tert-amyl | $—CH_3$ |
| E-121, E'-121, E"-121, E'"-121, E""-121, E"""-121 | tert-amyl | tert-amyl | $—CH_2CH_3$ |
| E-122, E'-122, E"-122, E'"-122, E""-122, E"""-122 | tert-amyl | tert-amyl | n-propyl |
| E-123, E'-123, E"-123, E'"-123, E""-123, E"""-123 | tert-amyl | tert-amyl | iso-propyl |
| E-124, E'-124, E"-124, E'"-124, E""-124, E"""-124 | tert-amyl | tert-amyl | sec-butyl |
| E-125, E'-125, E"-125, E'"-125, E""-125, E"""-125 | tert-amyl | tert-amyl | iso-butyl |
| E-126, E'-126, E"-126, E'"-126, E""-126, E"""-126 | tert-amyl | tert-amyl | neopentyl |
| E-127, E'-127, E"-127, E'"-127, E""-127, E"""-127 | tert-amyl | tert-amyl | 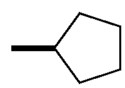 |
| E-128, E'-128, E"-128, E'"-128, E""-128, E"""-128 | tert-amyl | tert-amyl | 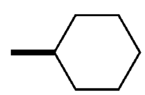 |
| E-129, E'-129, E"-129, E'"-129, E""-129, E"""-129 | tert-amyl | tert-amyl | tert-butyl |
| E-130, E'-130, E"-130, E'"-130, E""-130, E"""-130 | tert-amyl | tert-amyl | tert-amyl |

Preferred compounds E, E', E", E'", E"" and E""" are compounds E-1, E'-1, E"-1, E'"-1, E-1"" and E"""-1 to E-90, E'-90, E"-90, E'"-90, E""-90 and E"""-90.

(IIf-F)

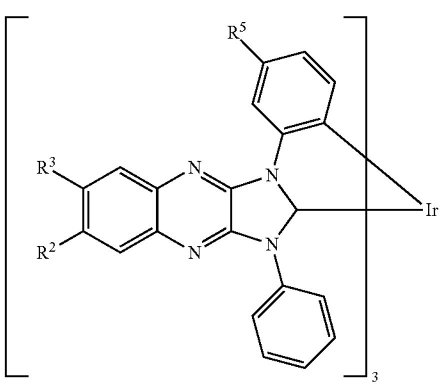

-continued
(IIf-F′)
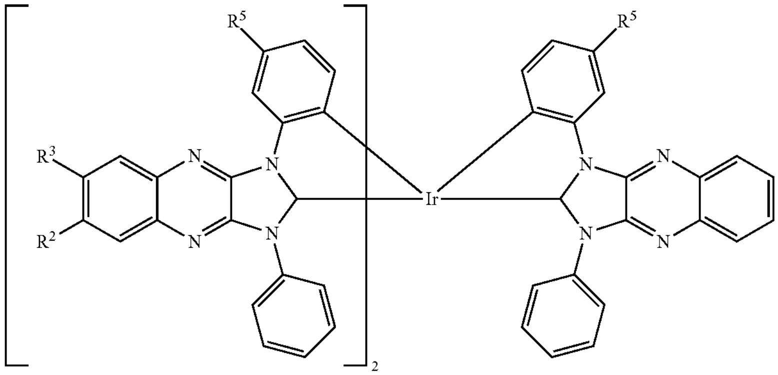
(IIf-F″)
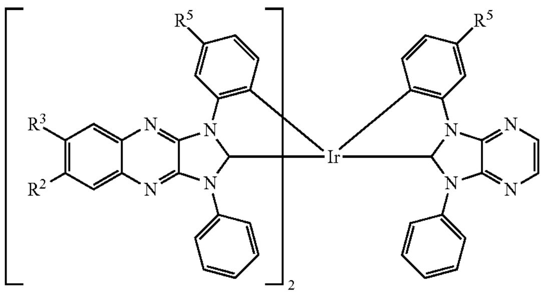
or
(IIf-F‴)
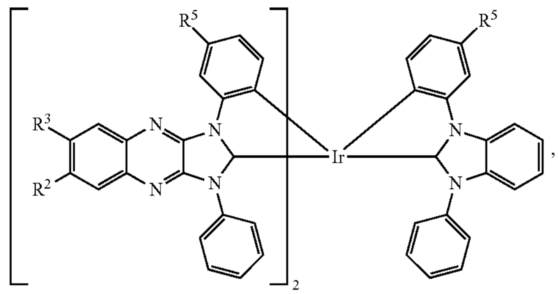
,
(IIf-F'''')
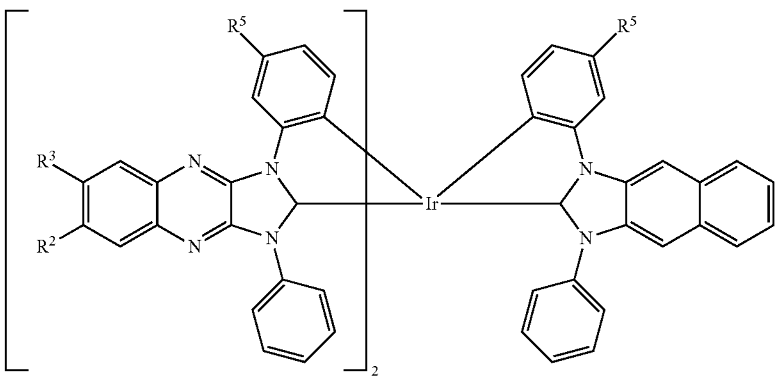
or
(IIf-F''''')
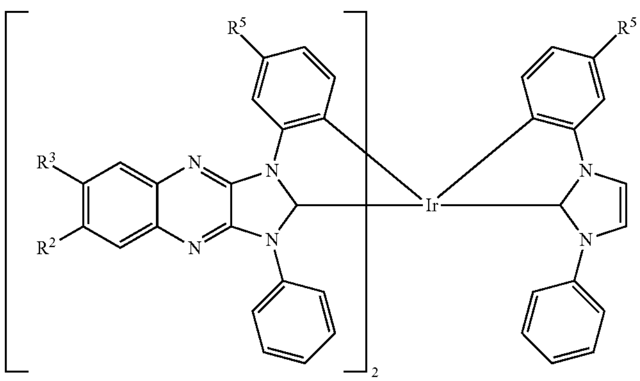
| Cpd. | $R^3$ | $R^2$ | $R^5$ |
|---|---|---|---|
| F-1, F'-1, F''-1, F'''-1, F''''-1, F'''''-1 | —$CH_3$ | —$CH_3$ | H |
| F-2, F'-2, F''-2, F'''-2, F''''-2, F'''''-2 | —$CH_2CH_3$ | —$CH_2CH_3$ | H |
| F-3, F'-3, F''-3, F'''-3, F-''''-3, F'''''-3 | n-propyl | n-propyl | H |

-continued

| Cpd. | R3 | R2 | R5 |
|---|---|---|---|
| F-4, F'-4, F''-4, F'''-4, F''''-4, F'''''-4 | iso-propyl | iso-propyl | H |
| F-5, F'-5, F''-5, F'''-5, F''''-5, F'''''-5 | sec-butyl | sec-butyl | H |
| F-6, F'-6, F''-6, F'''-6, F''''-6, F'''''-6 | iso-butyl | iso-butyl | H |
| F-7, F'-7, F''-7, F'''-7, F''''-7, F'''''-7 | neopentyl | neopentyl | H |
| F-8, F'-8, F''-8, F'''-8, F''''-8, F'''''-8 | 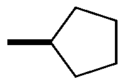 | 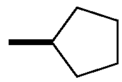 | H |
| F-9, F'-9, F''-9, F'''-9, F''''-9, F'''''-9 | 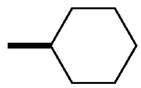 | 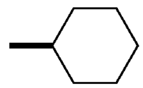 | H |
| F-10, F'-10, F''-10, F'''-10, F''''-10, F'''''-10 | $—CH_3$ | $—CH_3$ | $—CH_3$ |
| F-11, F'-11, F''-11, F'''-11, F''''-11, F'''''-11 | $—CH_2CH_3$ | $—CH_2CH_3$ | $—CH_3$ |
| F-12, F'-12, F''-12, F'''-12, F''''-12, F'''''-12 | n-propyl | n-propyl | $—CH_3$ |
| F-13, F'-13, F''-13, F'''-13, F''''-13, F'''''-13 | iso-propyl | iso-propyl | $—CH_3$ |
| F-14, F'-14, F''-14, F'''-14, F''''-14, F'''''-14 | sec-butyl | sec-butyl | $—CH_3$ |
| F-15, F'-15, F''-15, F'''-15, F''''-15, F'''''-15 | iso-butyl | iso-butyl | $—CH_3$ |
| F-16, F'-16, F''-16, F'''-16, F''''-16, F'''''-16 | neopentyl | neopentyl | $—CH_3$ |
| F-17, F'-17, F''-17, F'''-17, F''''-17, F'''''-17 | 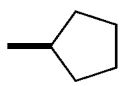 | 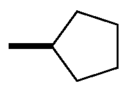 | $—CH_3$ |
| F-18, F'-18, F''-18, F'''-18, F''''-18, F'''''-18 | 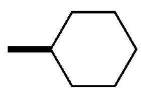 | 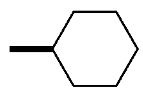 | $—CH_3$ |
| F-19, F'-19, F''-19, F'''-19, F''''-19, F'''''-19 | $—CH_3$ | $—CH_3$ | $—CH_2CH_3$ |
| F-20, F'-20, F''-20, F'''-20, F''''-20, F'''''-20 | $—CH_2CH_3$ | $—CH_2CH_3$ | $—CH_2CH_3$ |
| F-21, F'-21, F''-21, F'''-21, F''''-21, F'''''-21 | n-propyl | n-propyl | $—CH_2CH_3$ |
| F-22, F'-22, F''-22, F'''-22, F''''-22, F'''''-22 | iso-propyl | iso-propyl | $—CH_2CH_3$ |
| F-23, F'-23, F''-23, F'''-23, F''''-23, F'''''-23 | sec-butyl | sec-butyl | $—CH_2CH_3$ |
| F-24, F'-24, F''-24, F'''-24, F''''-24, F'''''-24 | iso-butyl | iso-butyl | $—CH_2CH_3$ |
| F-25, F'-25, F''-25, F'''-25, F''''-25, F'''''-25 | neopentyl | neopentyl | $—CH_2CH_3$ |
| F-26, F'-26, F''-26, F'''-26, F''''-26, F'''''-26 | 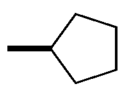 | 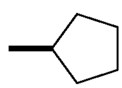 | $—CH_2CH_3$ |
| F-27, F'-27, F''-27, F'''-27, F''''-27, F'''''-27 | 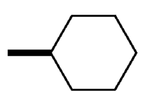 | 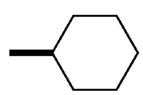 | $—CH_2CH_3$ |
| F-28, F'-28, F''-28, F'''-28, F''''-28, F'''''-28 | $—CH_3$ | $—CH_3$ | n-propyl |
| F-29, F'-29, F''-29, F'''-29, F''''-29, F'''''-29 | $—CH_2CH_3$ | $—CH_2CH_3$ | n-propyl |
| F-30, F'-30, F''-30, F'''-30, F''''-30, F'''''-30 | n-propyl | n-propyl | n-propyl |
| F-31, F'-31, F''-31, F'''-31, F''''-31, F'''''-31 | iso-propyl | iso-propyl | n-propyl |
| F-32, F'-32, F''-32, F'''-32, F''''-32, F'''''-32 | sec-butyl | sec-butyl | n-propyl |
| F-33, F'-33, F''-33, F'''-33, F''''-33, F'''''-33 | iso-butyl | iso-butyl | n-propyl |
| F-34, F'-34, F''-34, F'''-34, F''''-34, F'''''-34 | neopentyl | neopentyl | n-propyl |
| F-35, F'-35, F''-35, F'''-35, F''''-35, F'''''-35 | 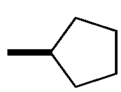 | 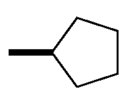 | n-propyl |
| F-36, F'-36, F''-36, F'''-36, F''''-36, F'''''-36 | 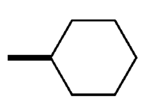 | 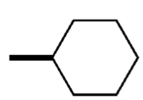 | n-propyl |
| F-37, F'-37, F''-37, F'''-37, F''''-37, F'''''-37 | $—CH_3$ | $—CH_3$ | iso-propyl |
| F-38, F'-38, F''-38, F'''-38, F''''-38, F'''''-38 | $—CH_2CH_3$ | $—CH_2CH_3$ | iso-propyl |
| F-39, F'-39, F''-39, F'''-39, F''''-39, F'''''-39 | n-propyl | n-propyl | iso-propyl |
| F-40, F'-40, F''-40, F'''-40, F''''-40, F'''''-40 | iso-propyl | iso-propyl | iso-propyl |
| F-41, F'-41, F''-41, F'''-41, F''''-41, F'''''-41 | sec-butyl | sec-butyl | iso-propyl |
| F-42, F'-42, F''-42, F'''-42, F''''-42, F'''''-42 | iso-butyl | iso-butyl | iso-propyl |
| F-43, F'-43, F''-43, F'''-43, F''''-43, F'''''-43 | neopentyl | neopentyl | iso-propyl |

-continued

| Cpd. | $R^3$ | $R^2$ | $R^5$ |
|---|---|---|---|
| F-44, F'-44, F''-44, F'''-44, F''''-44, F'''''-44 | 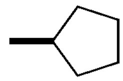 | 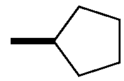 | iso-propyl |
| F-45, F'-45, F''-45, F'''-45, F''''-45, F'''''-45 | 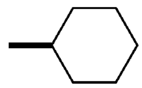 | 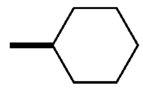 | iso-propyl |
| F-46, F'-46, F''-46 F'''-46, F''''-46, F'''''-46 | —$CH_3$ | —$CH_3$ | sec-butyl |
| F-47, F'-47, F''-47, F'''-47, F''''-47, F'''''-47 | —$CH_2CH_3$ | —$CH_2CH_3$ | sec-butyl |
| F-48, F'-48, F''-48, F'''-48, F''''-48, F'''''-48 | n-propyl | n-propyl | sec-butyl |
| F-49, F'-49, F''-49, F'''-49, F''''-49, F'''''-49 | iso-propyl | iso-propyl | sec-butyl |
| F-50, F'-50, F''-50, F'''-50, F''''-50, F'''''-50 | sec-butyl | sec-butyl | sec-butyl |
| F-51, F'-51, F''-51, F'''-51, F''''-51, F'''''-51 | iso-butyl | iso-butyl | sec-butyl |
| F-52, F'-52, F''-52, F'''-52, F''''-52, F'''''-52 | neopentyl | neopentyl | sec-butyl |
| F-53, F'-53, F''-53, F'''-53, F''''-53, F'''''-53 | 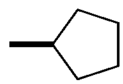 | 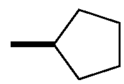 | sec-butyl |
| F-54, F'-54, F''-54, F'''-54, F''''-54, F'''''-54 | 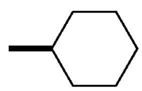 | 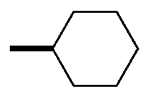 | sec-butyl |
| F-55, F'-55, F''-55, F'''-55, F''''-55, F'''''-55 | —$CH_3$ | —$CH_3$ | iso-butyl |
| F-56, F'-56, F''-56, F'''-56, F''''-56, F'''''-56 | —$CH_2CH_3$ | —$CH_2CH_3$ | iso-butyl |
| F-57, F'-57, F''-57, F'''-57, F''''-57, F'''''-57 | n-propyl | n-propyl | iso-butyl |
| F-58, F'-58, F''-58, F'''-58, F''''-58, F'''''-58 | iso-propyl | iso-propyl | iso-butyl |
| F-59, F'-59, F''-59, F'''-59, F''''-59, F'''''-59 | sec-butyl | sec-butyl | iso-butyl |
| F-60, F'-60, F''-60, F'''-60, F''''-60, F'''''-60 | iso-butyl | iso-butyl | iso-butyl |
| F-61, F'-61, F''-61, F'''-61, F''''-61, F'''''-61 | neopentyl | neopentyl | iso-butyl |
| F-62, F'-62, F''-62, F'''-62, F''''-62, F'''''-62 | 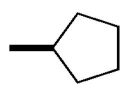 | 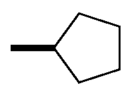 | iso-butyl |
| F-63, F'-63, F''-63, F'''-63, F''''-63, F'''''-63 | 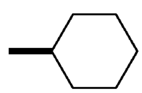 | 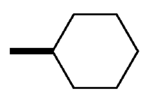 | iso-butyl |
| F-64, F'-64, F''-64, F'''-64, F''''-64, F'''''-64 | —$CH_3$ | —$CH_3$ | Neopentyl |
| F-65, F'-65, F''-65, F'''-65, F''''-65, F'''''-65 | —$CH_2CH_3$ | —$CH_2CH_3$ | Neopentyl |
| F-66, F'-66, F''-66, F'''-66, F''''-66, F'''''-66 | n-propyl | n-propyl | Neopentyl |
| F-67, F'-67, F''-67, F'''-67, F''''-67, F'''''-67 | iso-propyl | iso-propyl | Neopentyl |
| F-68, F'-68, F''-68, F'''-68, F''''-68, F'''''-68 | sec-butyl | sec-butyl | Neopentyl |
| F-69, F'-69, F''-69, F'''-69, F''''-69, F'''''-69 | iso-butyl | iso-butyl | neopentyl |
| F-70, F'-70, F''-70, F'''-70, F''''-70, F'''''-70 | neopentyl | neopentyl | Neopentyl |
| F-71, F'-71, F''-71, F'''-71, F''''-71, F'''''-71 | 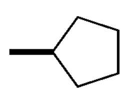 | 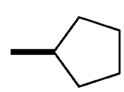 | Neopentyl |
| F-72, F'-72, F''-72, F'''-72, F''''-72, F'''''-72 | 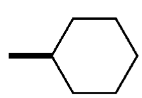 | 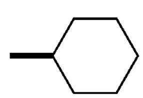 | Neopentyl |
| F-73, F'-73, F''-73, F'''-73, F''''-73, F'''''-73 | —$CH_3$ | —$CH_3$ | 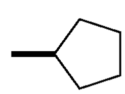 |
| F-74, F'-74, F''-74, F'''-74, F''''-74, F'''''-74 | —$CH_2CH_3$ | —$CH_2CH_3$ | 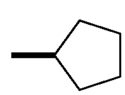 |
| F-75, F'-75, F''-75, F'''-75, F''''-75, F'''''-75 | n-propyl | n-propyl | 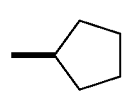 |

-continued

| Cpd. | $R^3$ | $R^2$ | $R^5$ |
|---|---|---|---|
| F-76, F'-76, F''-76, F'''-76, F''''-76, F'''''-76 | iso-propyl | iso-propyl | 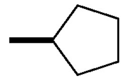 |
| F-77, F'-77, F''-77, F'''-77, F''''-77, F'''''-77 | sec-butyl | sec-butyl | 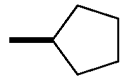 |
| F-78, F'-78, F''-78, F'''-78, F''''-78, F'''''-78 | iso-butyl | iso-butyl | 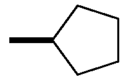 |
| F-79, F'-79, F''-79, F'''-79, F''''-79, F'''''-79 | neopentyl | neopentyl | 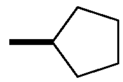 |
| F-80, F'-80, F''-80, F'''-80, F''''-80, F'''''-80 | 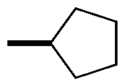 | 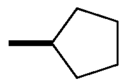 | 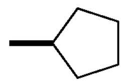 |
| F-81, F'-81, F''-81, F'''-81, F''''-81, F'''''-81 | 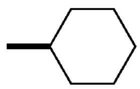 | 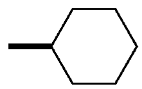 | 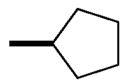 |
| F-82, F'-82, F''-82, F'''-82, F''''-82, F'''''-82 | $—CH_3$ | $—CH_3$ | 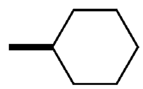 |
| F-83, F'-83, F''-83, F'''-83, F''''-83, F'''''-83 | $—CH_2CH_3$ | $—CH_2CH_3$ | 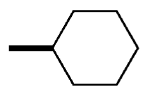 |
| F-84, F'-84, F''-84, F'''-84, F''''-84, F'''''-84 | n-propyl | n-propyl | 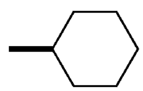 |
| F-85, F'-85, F''-85, F'''-85, F''''-85, F'''''-85 | iso-propyl | iso-propyl | 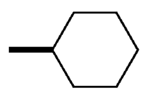 |
| F-86, F'-86, F''-86, F'''-86, F''''-86, F'''''-86 | sec-butyl | sec-butyl | 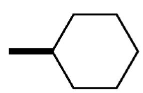 |
| F-87, F'-87, F''-87, F'''-87, F''''-87, F'''''-87 | iso-butyl | iso-butyl | 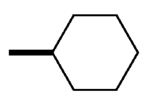 |
| F-88, F'-88, F''-88, F'''-88, F''''-88, F'''''-88 | neopentyl | neopentyl | 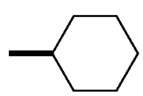 |
| F-89, F'-89, F''-89, F'''-89, F''''-89, F'''''-89 | 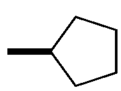 | 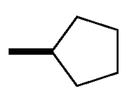 | 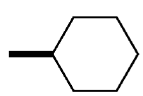 |
| F-90, F'-90, F''-90, F'''-90, F''''-90, F'''''-90 | 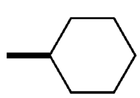 | 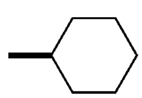 | 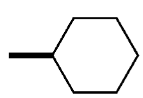 |
| F-91, F'-91, F''-91, F'''-91, F''''-91, F'''''-91 | $—CH_3$ | $—CH_3$ | tert-butyl |
| F-92, F'-92, F''-92, F'''-92, F''''-92, F'''''-92 | $—CH_2CH_3$ | $—CH_2CH_3$ | tert-butyl |
| F-93, F'-93, F''-93, F'''-93, F''''-93, F'''''-93 | n-propyl | n-propyl | tert-butyl |

-continued

| Cpd. | R³ | R² | R⁵ |
|---|---|---|---|
| F-94, F'-94, F''-94, F'''-94, F''''-94, F'''''-94 | iso-propyl | iso-propyl | tert-butyl |
| F-95, F'-95, F''-95, F'''-95, F''''-95, F'''''-95 | sec-butyl | sec-butyl | tert-butyl |
| F-96, F'-96, F''-96, F'''-96, F''''-96, F'''''-96 | iso-butyl | iso-butyl | tert-butyl |
| F-97, F'-97, F''-97, F'''-97, F''''-97, F'''''-97 | neopentyl | neopentyl | tert-butyl |
| F-98, F'-98, F''-98, F'''-98, F''''-98, F'''''-98 | 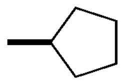 | 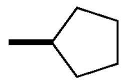 | tert-butyl |
| F-99, F'-99, F''-99, F'''-99, F''''-99, F'''''-99 | 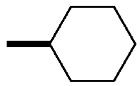 | 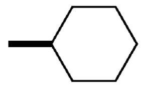 | tert-butyl |
| F-100, F'-100, F''-100, F'''-100, F''''-100, F'''''-100 | —$CH_3$ | —$CH_3$ | tert-amyl |
| F-101, F'-101, F''-101, F'''-101, F''''-101, F'''''-101 | —$CH_2CH_3$ | —$CH_2CH_3$ | tert-amyl |
| F-102, F'-102, F''-102, F'''-102, F''''-102, F'''''-102 | n-propyl | n-propyl | tert-amyl |
| F-103, F'-103, F''-103, F'''-103, F''''-103, F'''''-103 | iso-propyl | iso-propyl | tert-amyl |
| F-104, F'-104, F''-104, F'''-104, F''''-104, F'''''-104 | sec-butyl | sec-butyl | tert-amyl |
| F-105, F'-105, F''-105, F'''-105, F''''-105, F'''''-105 | iso-butyl | iso-butyl | tert-amyl |
| F-106, F'-106, F''-106, F'''-106, F''''-106, F'''''-106 | neopentyl | neopentyl | tert-amyl |
| F-107, F'-107, F''-107, F'''-107, F''''-107, F'''''-107 | 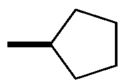 | 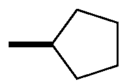 | tert-amyl |
| F-108, F'-108, F''-108, F'''-108, F''''-108, F'''''-108 | 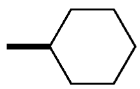 | 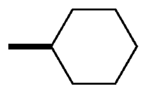 | tert-amyl |

Preferred compounds F, F', F'', F''', F'''' and F''''' are compounds F-1, F'-1, F''-1, F'''-1, F''''-1 and F'''''-1 to F-90, F'-90, F''-90, F'''-90, F''''-90 and F'''''-90.

(IIi-I)

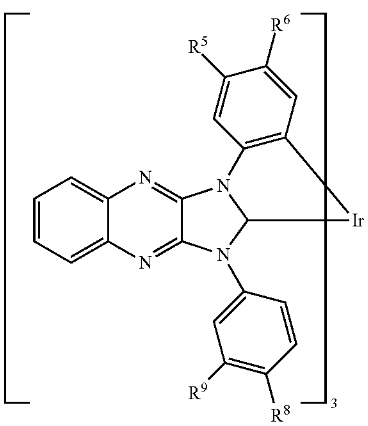

(IIi-I')

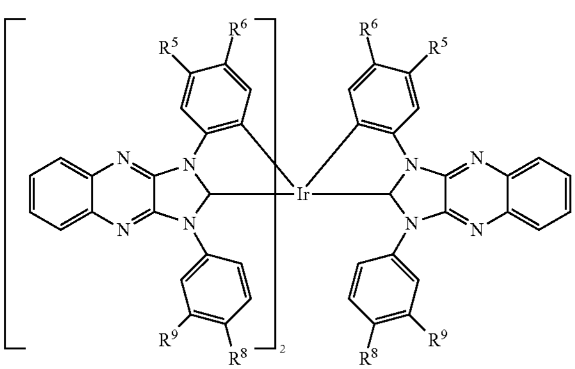

-continued (IIi-I'')

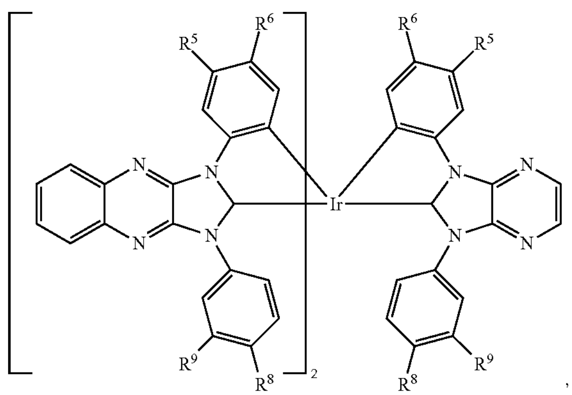

(IIi-I')

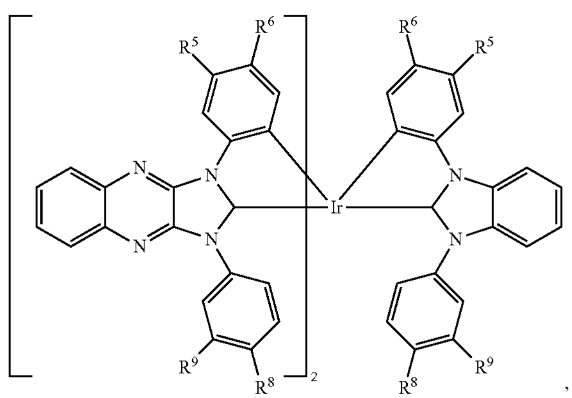

-continued
(IIi-I')
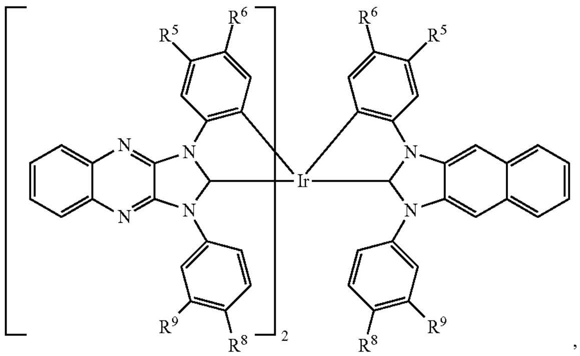
(IIi-I')
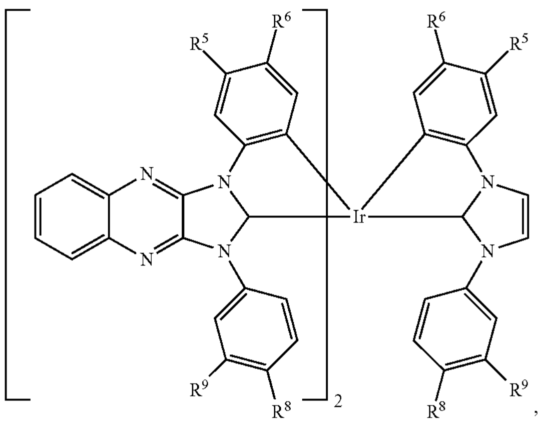
(IIi-HI)
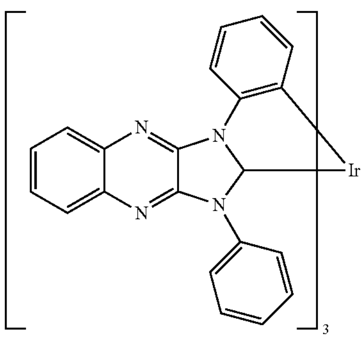
(IIi'-HI)
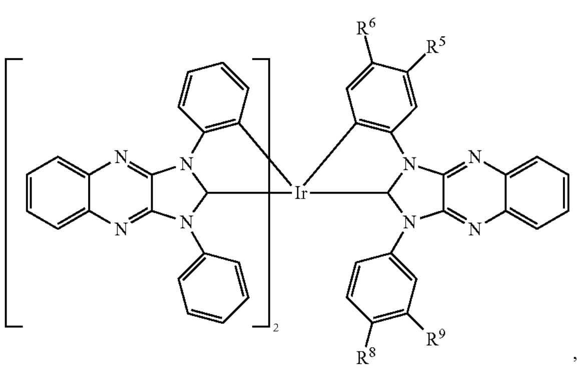
-continued
(IIi''-HI)
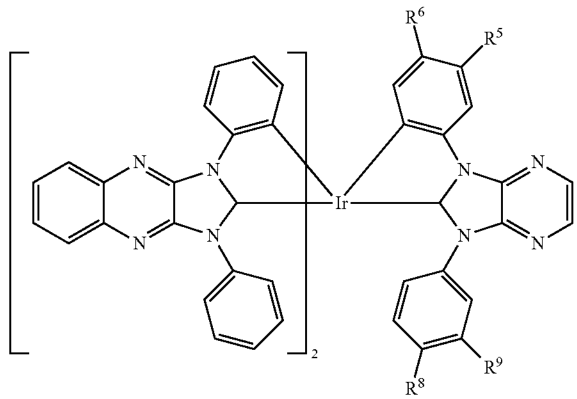
(IIi'-HI)
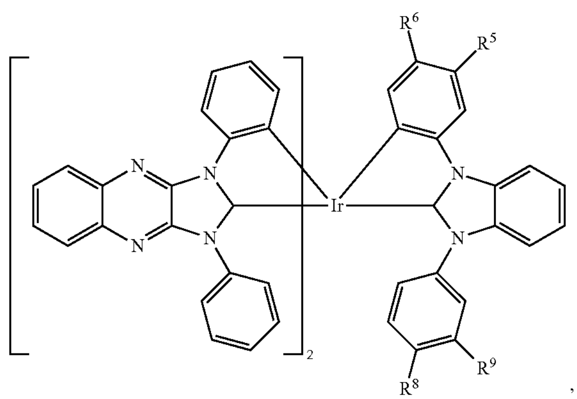
(IIi'-HI)
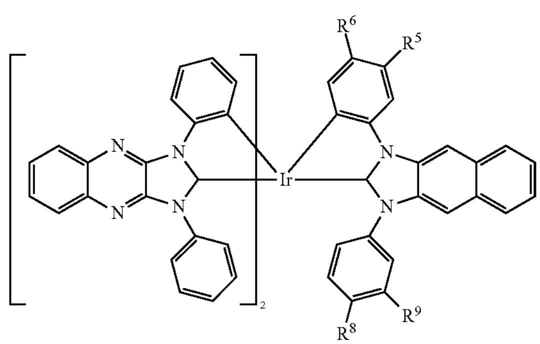
or
(IIi'-HI)
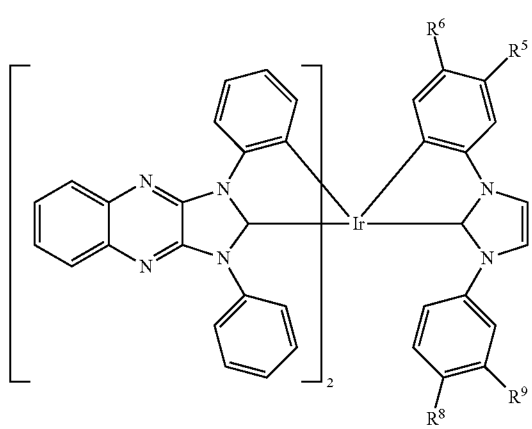

| Cpd. | $R^5 = R^8$ | $R^6 = R^9$ |
|---|---|---|
| I-1, I'-1, I''-1, I'''-1, I''''-1, I'''''-1, HI-1, HI'-1, HI''-1, HI'''-1, HI''''-1, HI'''''-1 | —$CH_3$ | H |
| I-2, I'-2, I''-2, I'''-2, I''''-2, I'''''-2, HI-2, HI'-2, HI''-2, HI'''-2, HI''''-2, HI'''''-2 | —$CH_2CH_3$ | H |
| I-3, I'-3, I''-3, I'''-3, I''''-3, I'''''-3, HI-3, HI'-3, HI''-3, HI'''-3, HI''''-3, HI'''''-3 | n-propyl | H |
| I-4, I'-4, I''-4, I'''-4, I''''-4, I'''''-4, HI-4, HI'-4, HI''-4, HI'''-4, HI''''-4, HI'''''-4 | iso-propyl | H |
| I-5, I'-5, I''-5, I'''-5, I''''-5, I'''''-5, HI-5, HI'-5, HI''-5, HI'''-5, HI''''-5, HI'''''-5 | sec-butyl | H |
| I-6, I'-6, I''-6, I'''-6, I''''-6, I'''''-6, HI-6, HI'-6, HI''-6, HI'''-6, HI''''-6, HI'''''-6 | iso-butyl | H |
| I-7, I'-7, I''-7, I'''-7, I''''-7, I'''''-7, HI-7, HI'-7, HI''-7, HI'''-7, HI''''-7, HI'''''-7 | neopentyl | H |
| I-8, I'-8, I''-8, I'''-8, I''''-8, I'''''-8, HI-8, HI'-8, HI''-8, HI'''-8, HI''''-8, HI'''''-8 | 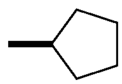 | H |
| I-9, I'-9, I''-9, I'''-9, I''''-9, I'''''-9, HI-9, HI'-9, HI''-9, HI'''-9, HI''''-9, HI'''''-9 | 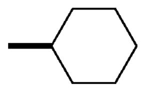 | H |
| I-10, I'-10, I''-10, I'''-10, I''''-10, I'''''-10, HI-10, HI'-10, HI''-10, HI'''-10, HI''''-10, HI'''''-10 | H | —$CH_3$ |
| I-11, I'-11, I''-11, I'''-11, I''''-11, I'''''-11, HI-11, HI'-11, HI''-11, HI'''-11, HI''''-11, HI'''''-11 | H | —$CH_2CH_3$ |
| I-12, I'-12, I''-12, I'''-12, I''''-12, I'''''-12, HI-12, HI'-12, HI''-12, HI'''-12, HI''''-12, HI'''''-12 | H | n-propyl |
| I-13, I'-13, I''-13, I'''-13, I''''-13, I'''''-13, HI-13, HI'-13, HI''-13, HI'''-13, HI''''-13, HI'''''-13 | H | iso-propyl |
| I-14, I'-14, I''-14, I'''-14, I''''-14, I'''''-14, HI-14, HI'-14, HI''-14, HI'''-14, HI''''-14, HI'''''-14 | H | sec-butyl |
| I-15, I'-15, I''-15, I'''-15, I''''-15, I'''''-15, HI-15, HI'-15, HI''-15, HI'''-15, HI''''-15, HI'''''-15 | H | iso-butyl |
| I-16, I'-16, I''-16, I'''-16, I''''-16, I'''''-16, HI-16, HI'-16, HI''-16, HI'''-16, HI''''-16, HI'''''-16 | H | neopentyl |
| I-17, I'-17, I''-17, I'''-17, I''''-17, I'''''-17, HI-17, HI'-17, HI''-17, HI'''-17, HI''''-17, HI'''''-17 | H | 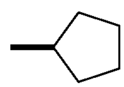 |
| I-18, I'-18, I''-18, I'''-18, I''''-18, I'''''-18, HI-18, HI'-18, HI''-18, HI'''-18, HI''''-18, HI'''''-18 | H | 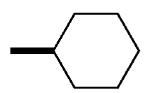 |
| I-19, I'-19, I''-19, I'''-19, I''''-19, I'''''-19, HI-19, HI'-19, HI''-19, HI'''-19, HI''''-19, HI'''''-19 | 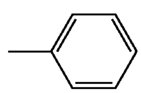 | H |
| I-20, I'-20, I''-20, I'''-20, I''''-20, I'''''-20, HI-20, HI'-20, HI''-20, HI'''-20, HI''''-20, HI'''''-20 | 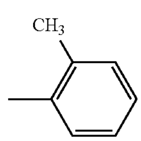 | H |
| I-21, I'-21, I''-21, I'''-21, I''''-21, I'''''-21, HI-21, HI'-21, HI''-21, HI'''-21, HI''''-21, HI'''''-21 | 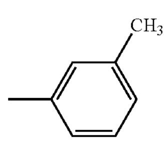 | H |
| I-22, I'-22, I''-22, I'''-22, I''''-22, I'''''-22, HI-22, HI'-22, HI''-22, HI'''-22, HI''''-22, HI'''''-22 | 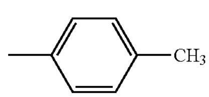 | H |
| I-23, I'-23, I''-23, I'''-23, I''''-23, I'''''-23, HI-23, HI'-23, HI''-23, HI'''-23, HI''''-23, HI'''''-23 | 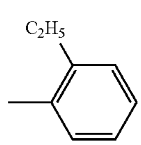 | H |

-continued

| Cpd. | $R^5 = R^8$ | $R^6 = R^9$ |
|---|---|---|
| I-24, I'-24, I''-24, I'''-24, I''''-24, I'''''-24, HI-24, HI'-24, HI''-24, HI'''-24, HI''''-24, HI'''''-24 | 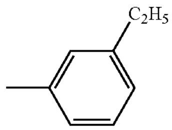 | H |
| I-25, I'-25, I''-25, I'''-25, I''''-25, I'''''-25, HI-25, HI'-25, HI''-25, HI'''-25, HI''''-25, HI'''''-25 | 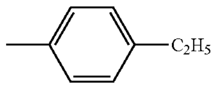 | H |
| I-26, I'-26, I''-26, I'''-26, I''''-26, I'''''-26, HI-26, HI'-26, HI''-26, HI'''-26, HI''''-26, HI'''''-26 | 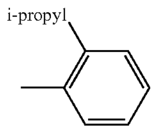 | H |
| I-27, I'-27, I''-27, I'''-27, I''''-27, I'''''-27, HI-27, HI'-27, HI''-27, HI'''-27, HI''''-27, HI'''''-27 | 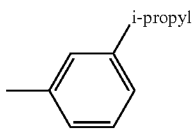 | H |
| I-28, I'-28, I''-28, I'''-28, I''''-28, I'''''-28, HI-28, HI'-28, HI''-28, HI'''-28, HI''''-28, HI'''''-28 | 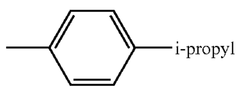 | H |
| I-29, I'-29, I''-29, I'''-29, I''''-29, I'''''-29, HI-29, HI'-29, HI''-29, HI'''-29, HI''''-29, HI'''''-29 | H | 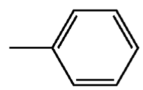 |
| I-30, I'-30, I''-30, I'''-30, I''''-30, I'''''-30, HI-30, HI'-30, HI''-30, HI'''-30, HI''''-30, HI'''''-30 | H | 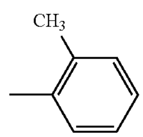 |
| I-31, I'-31, I''-31, I'''-31, I''''-31, I'''''-31, HI-31, HI'-31, HI''-31, HI'''-31, HI''''-31, HI'''''-31 | H | 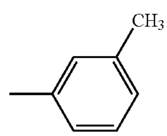 |
| I-32, I'-32, I''-32, I'''-32, I''''-32, I'''''-32, HI-32, HI'-32, HI''-32, HI'''-32, HI''''-32, HI'''''-32 | H | 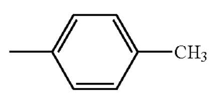 |
| I-33, I'-33, I''-33, I'''-33, I''''-33, I'''''-33, HI-33, HI'-33, HI''-33, HI'''-33, HI''''-33, HI'''''-33 | H | 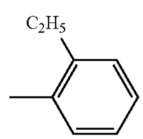 |
| I-34, I'-34, I''-34, I'''-34, I''''-34, I'''''-34, HI-34, HI'-34, HI''-34, HI'''-34, HI''''-34, HI'''''-34 | H | 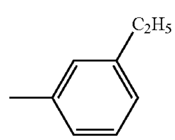 |
| I-35, I'-35, I''-35, I'''-35, I''''-35, I'''''-35, HI-35, HI'-35, HI''-35, HI'''-35, HI''''-35, HI'''''-35 | H | 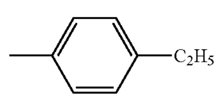 |

-continued
| Cpd. | $R^5 = R^8$ | $R^6 = R^9$ |
|---|---|---|
| I-36, I'-36, I''-36, I'''-36, I''''-36, I'''''-36, HI-36, HI'-36, HI''-36, HI'''-36, HI''''-36, HI'''''-36 | H | 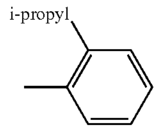  |
| I-37, I'-37, I''-37, I'''-37, I''''-37, I'''''-37, HI-37, HI'-37, HI''-37, HI'''-37, HI''''-37, HI'''''-37 | H | 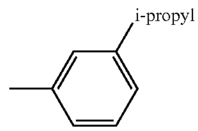  |
| I-38, I'-38, I''-38, I'''-38, I''''-38, I'''''-38, HI-38, HI'-38, HI''-38, HI'''-38, HI''''-38, HI'''''-38 | H | 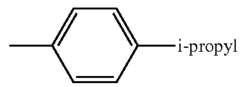  |
| I-39, I'-39, I''-39, I'''-39, I''''-39, I'''''-39, HI-39, HI'-39, HI''-39, HI'''-39, HI''''-39, HI'''''-39 | H | H |
(IIj-J)
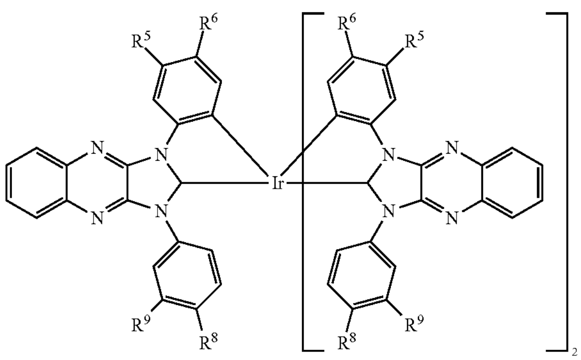
(IIj-J)
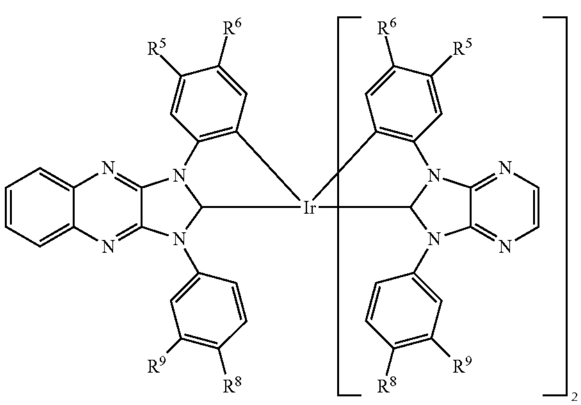

-continued
(IIj-J)
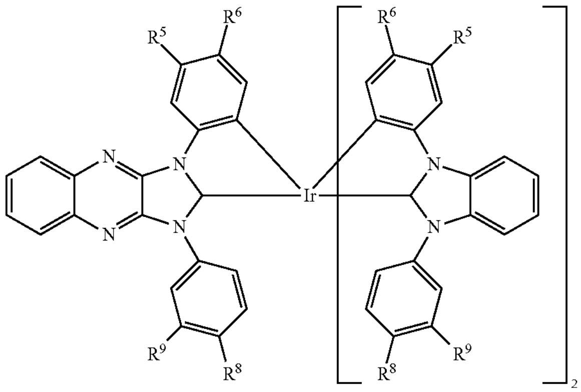
(IIj-J)
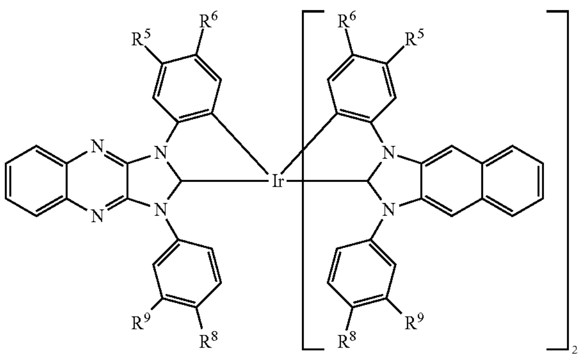
(IIj-J)
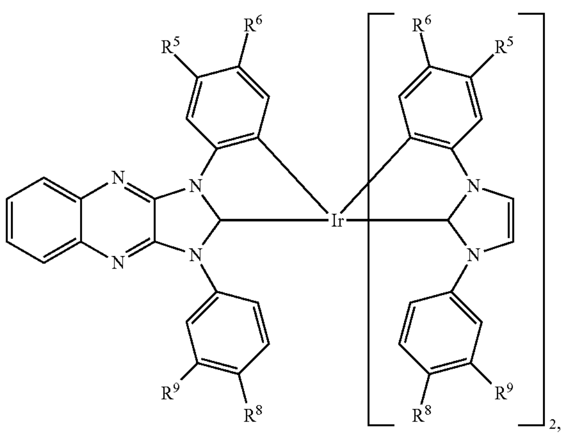
(IIj'-HJ)
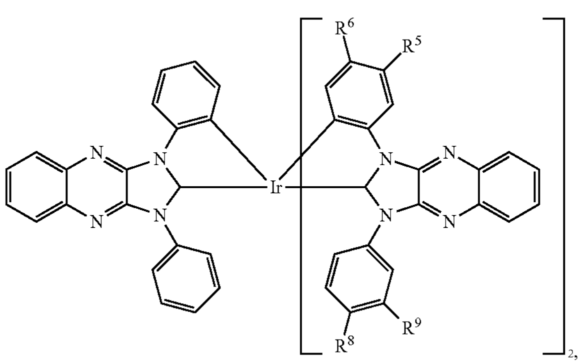

-continued
(IIj''-HJ)
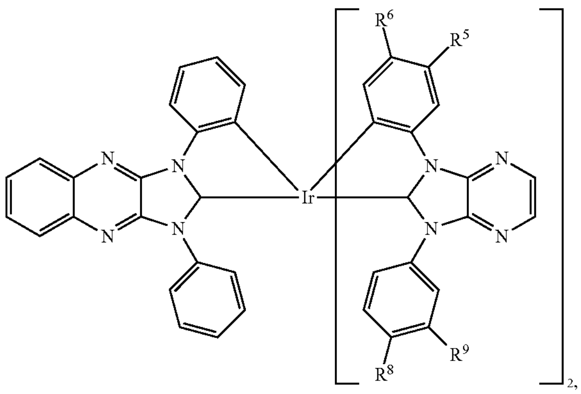
(IIj'''-HJ)
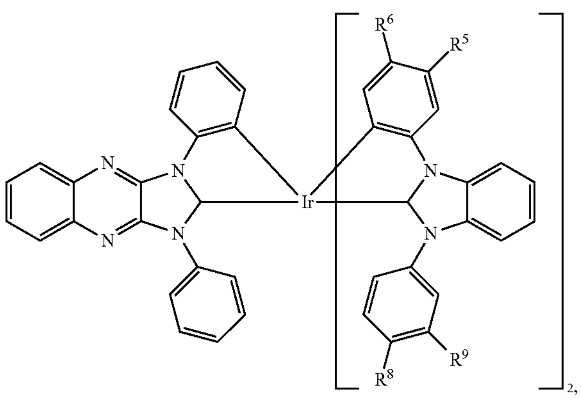
(IIj-HJ)
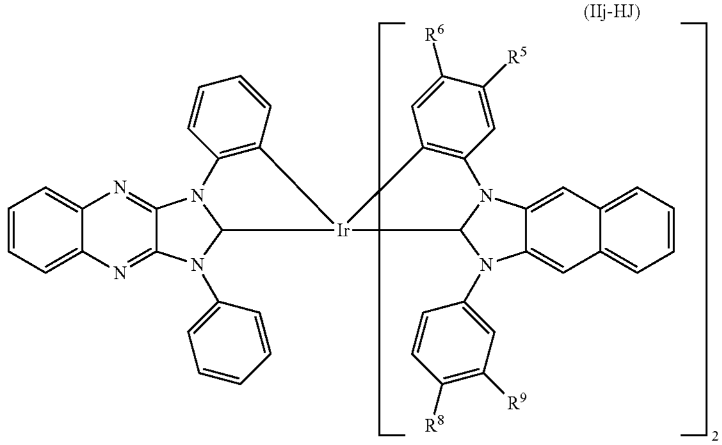
or -continued (IIj-HJ)

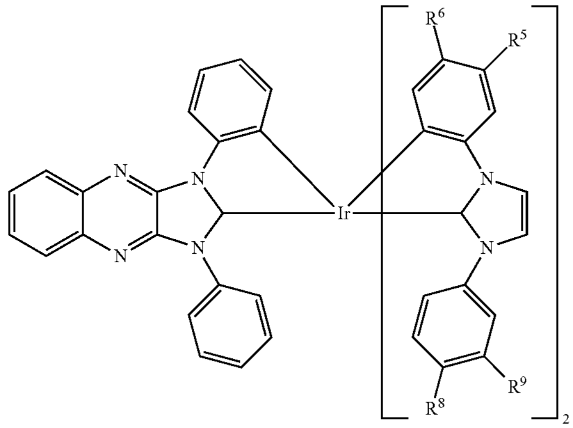

| Cpd. | $R^5 = R^8$ | $R^6 = R^9$ |
|---|---|---|
| J'-1, J''-1, J'''-1, J''''-1, J'''''-1, HJ'-1, HJ''-1, HJ'''-1, HJ''''-1, HJ'''''-1 | $—CH_3$ | H |
| J'-2, J''-2, J'''-2, J''''-2, J'''''-2, HJ'-2, HJ''-2, HJ'''-2, HJ''''-2, HJ'''''-2 | $—CH_2CH_3$ | H |
| J'-3, J''-3, J'''-3, J''''-3, J'''''-3, HJ'-3, HJ''-3, HJ'''-3, HJ''''-3, HJ'''''-3 | n-propyl | H |
| J'-4, J''-4, J'''-4, J''''-4, J'''''-4, HJ'-4, HJ''-4, HJ'''-4, HJ''''-4, HJ'''''-4 | iso-propyl | H |
| J'-5, J''-5, J'''-5, J''''-5, J'''''-5, HJ'-5, HJ''-5, HJ'''-5, HJ''''-5, HJ'''''-5 | sec-butyl | H |
| J'-6, J''-6, J'''-6, J''''-6, J'''''-6, HJ'-6, HJ''-6, HJ'''-6, HJ''''-6, HJ'''''-6 | iso-butyl | H |
| J'-7, J''-7, J'''-7, J''''-7, J'''''-7, HJ'-7, HJ''-7, HJ'''-7, HJ''''-7, HJ'''''-7 | neopentyl | H |
| J'-8, J''-8, J'''-8, J''''-8, J'''''-8, HJ'-8, HJ''-8, HJ'''-8, HJ''''-8, HJ'''''-8 | 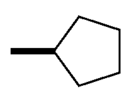 | H |
| J'-9, J''-9, J'''-9, J''''-9, J'''''-9, HJ'-9, HJ''-9, HJ'''-9, HJ''''-9, HJ'''''-9 | 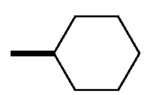 | H |
| J'-10, J''-10, J'''-10, J''''-10, J'''''-10, HJ'-10, HJ''-10, HJ'''-10, HJ''''-10, HJ'''''-10 | H | $—CH_3$ |
| J'-11, J''-11, J'''-11, J''''-11, J'''''-11, HJ'-11, HJ''-11, HJ'''-11, HJ''''-11, HJ'''''-11 | H | $—CH_2CH_3$ |
| J'-12, J''-12, J'''-12, J''''-12, J'''''-12, HJ'-12, HJ''-12, HJ'''-12, HJ''''-12, HJ'''''-12 | H | n-propyl |
| J'-13, J''-13, J'''-13, J''''-13, J'''''-13, HJ'-13, HJ''-13, HJ'''-13, HJ''''-13, HJ'''''-13 | H | iso-propyl |
| J'-14, J''-14, J'''-14, J''''-14, J'''''-14, HJ'-14, HJ''-14, HJ'''-14, HJ''''-14, HJ'''''-14 | H | sec-butyl |
| J'-15, J''-15, J'''-15, J''''-15, J'''''-15, HJ'-15, HJ''-15, HJ'''-15, HJ''''-15, HJ'''''-15 | H | iso-butyl |
| J'-16, J''-16, J'''-16, J''''-16, J'''''-16, HJ'-16, HJ''-16, HJ'''-16, HJ''''-16, HJ'''''-16 | H | neopentyl |
| J'-17, J''-17, J'''-17, J''''-17, J'''''-17, HJ'-17, HJ''-17, HJ'''-17, HJ''''-17, HJ'''''-17 | H | 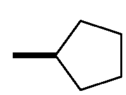 |
| J'-18, J''-18, J'''-18, J''''-18, J'''''-18, HJ'-18, HJ''-18, HJ'''-18, HJ''''-18, HJ'''''-18 | H | 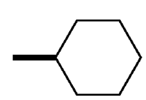 |
| J'-19, J''-19, J'''-19, J''''-19, J'''''-19, HJ'-19, HJ''-19, HJ'''-19, HJ''''-19, HJ'''''-19 | 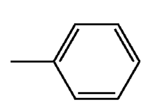 | H |

-continued

| Cpd. | $R^5 = R^8$ | $R^6 = R^9$ |
| --- | --- | --- |
| J'-20, J''-20, J'''-20, J''''-20, J'''''-20, HJ'-20, HJ''-20, HJ'''-20, HJ''''-20, HJ'''''-20 | 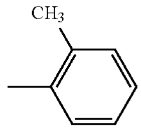 | H |
| J'-21, J''-21, J'''-21, J''''-21, J'''''-21, HJ'-21, HJ''-21, HJ'''-21, HJ''''-21, HJ'''''-21 | 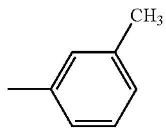 | H |
| J'-22, J''-22, J'''-22, J''''-22, J'''''-22, HJ'-22, HJ''-22, HJ'''-22, HJ''''-22, HJ'''''-22 | 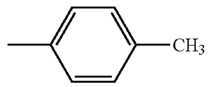 | H |
| J'-23, J''-23, J'''-23, J''''-23, J'''''-23, HJ'-23, HJ''-23, HJ'''-23, HJ''''-23, HJ'''''-23 | 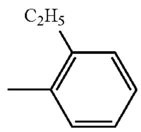 | H |
| J'-24, J''-24, J'''-24, J''''-24, J'''''-24, HJ'-24, HJ''-24, HJ'''-24, HJ''''-24, HJ'''''-24 | 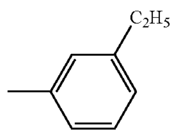 | H |
| J'-25, J''-25, J'''-25, J''''-25, J'''''-25, HJ'-25, HJ''-25, HJ'''-25, HJ''''-25, HJ'''''-25 | 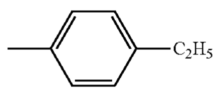 | H |
| J'-26, J''-26, J'''-26, J''''-26, J'''''-26, HJ'-26, HJ''-26, HJ'''-26, HJ''''-26, HJ'''''-26 | 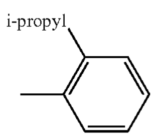 | H |
| J'-27, J''-27, J'''-27, J''''-27, J'''''-27, HJ'-27, HJ''-27, HJ'''-27, HJ''''-27, HJ'''''-27 | 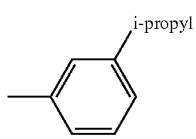 | H |
| J'-28, J''-28, J'''-28, J''''-28, J'''''-28, HJ'-28, HJ''-28, HJ'''-28, HJ''''-28, HJ'''''-28 | 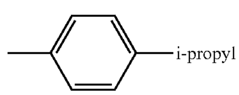 | H |
| J'-29, J''-29, J'''-29, J''''-29, J'''''-29, HJ'-29, HJ''-29, HJ'''-29, HJ''''-29, HJ'''''-29 | H | 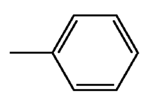 |
| J'-30, J''-30, J'''-30, J''''-30, J'''''-30, HJ'-30, HJ''-30, HJ'''-30, HJ''''-30, HJ'''''-30 | H | 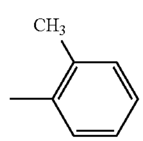 |
| J'-31, J''-31, J'''-31, J''''-31, J'''''-31, HJ'-31, HJ''-31, HJ'''-31, HJ''''-31, HJ'''''-31 | H | 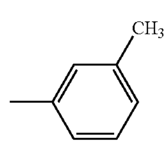 |

-continued

| Cpd. | $R^5 = R^8$ | $R^6 = R^9$ |
|---|---|---|
| J'-32, J''-32, J'''-32, J''''-32, J'''''-32, HJ'-32, HJ''-32, HJ'''-32, HJ''''-32, HJ'''''-32 | H | 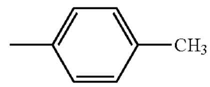 |
| J'-33, J''-33, J'''-33, J''''-33, J'''''-33, HJ'-33, HJ''-33, HJ'''-33, HJ''''-33, HJ'''''-33 | H | 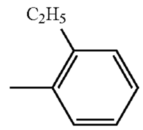 |
| J'-34, J''-34, J'''-34, J''''-34, J'''''-34, HJ'-34, HJ''-34, HJ'''-34, HJ''''-34, HJ'''''-34 | H | 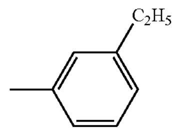 |
| J'-35, J''-35, J'''-35, J''''-35, J'''''-35, HJ'-35, HJ''-35, HJ'''-35, HJ''''-35, HJ'''''-35 | H | 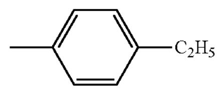 |
| J'-36, J''-36, J'''-36, J''''-36, J'''''-36, HJ'-36, HJ''-36, HJ'''-36, HJ''''-36, HJ'''''-36 | H | 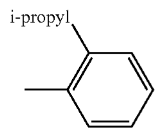 |
| J'-37, J''-37, J'''-37, J''''-37, J'''''-37, HJ'-37, HJ''-37, HJ'''-37, HJ''''-37, HJ'''''-37 | H | 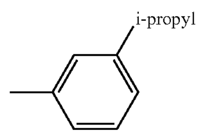 |
| J'-38, J''-38, J'''-38, J''''-38, J'''''-38, HJ'-38, HJ''-38, HJ'''-38, HJ''''-38, HJ'''''-38 | H | 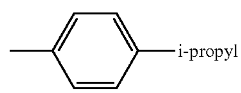 |
| J'-39, J''-39, J'''-39, J''''-39, J'''''-39, HJ'-39, HJ''-39, HJ'''-39, HJ''''-39, HJ'''''-39 | H | H |

Examples for most preferred metal carbene complexes of the present invention are the following complexes:

(I)

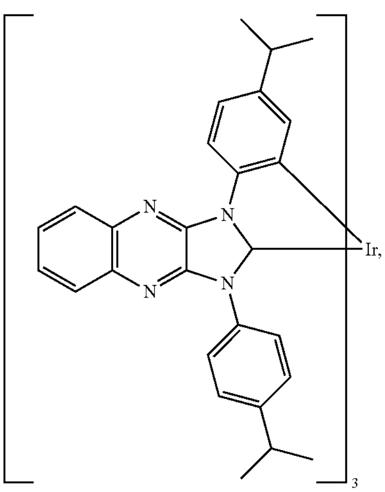

-continued (II)

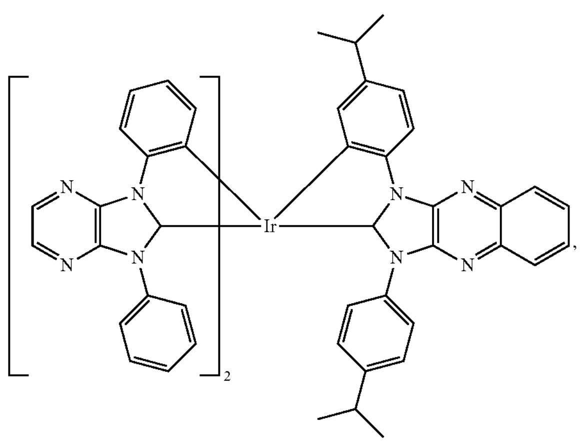

-continued
(III)
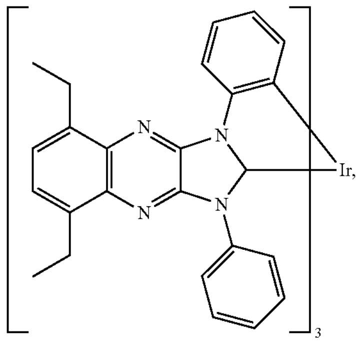
(IV)
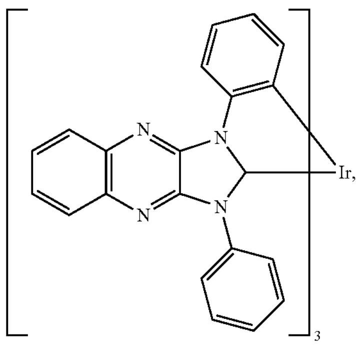
(V)
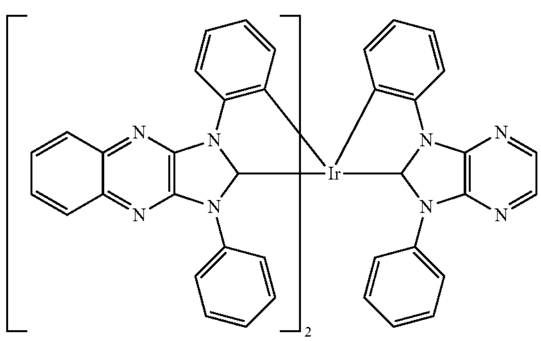
and
(VI)
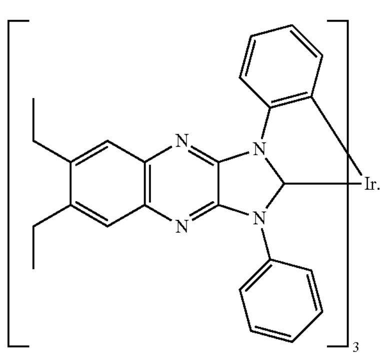
Further preferred compounds are
(VIa)
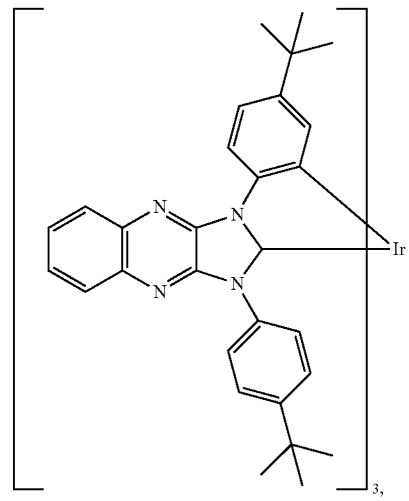
(VII)
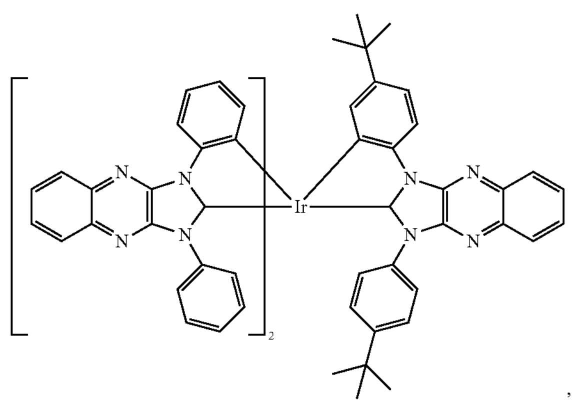
(IX)
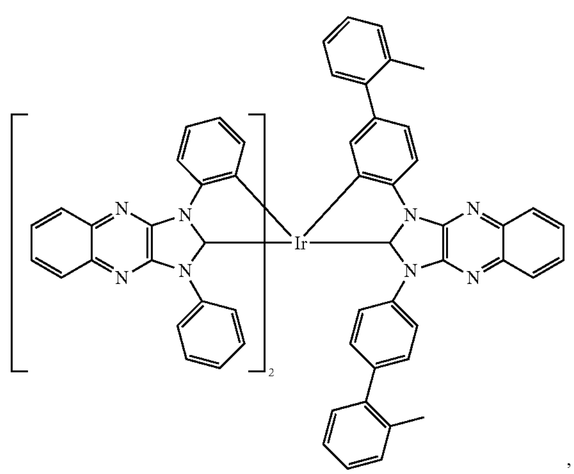

-continued
(XVII)
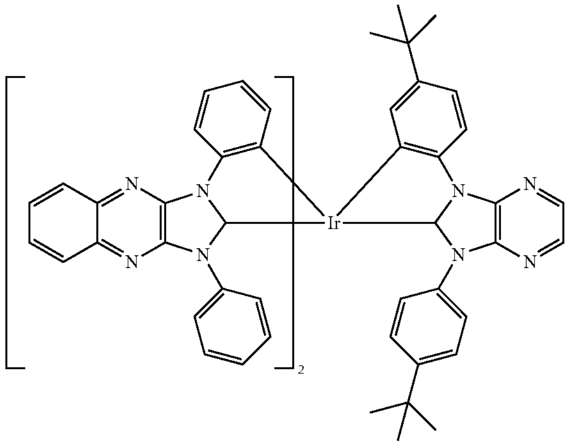
,
(XVII)
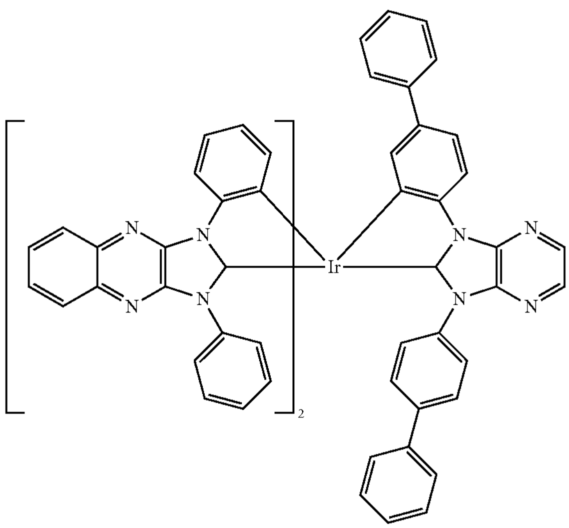
,
(XVIII)
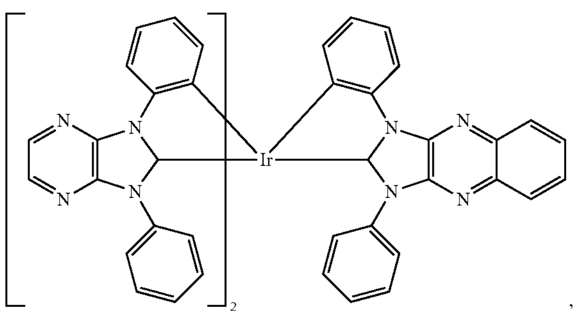
,
-continued
(XX)
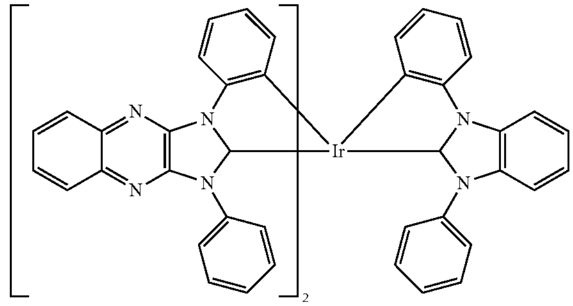
,
(XXI)
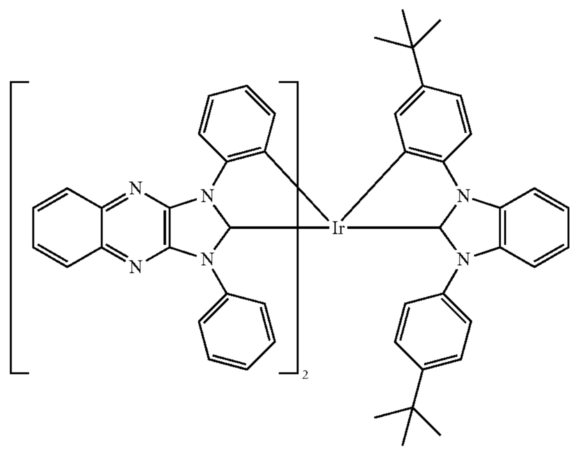
,
(XXIV)
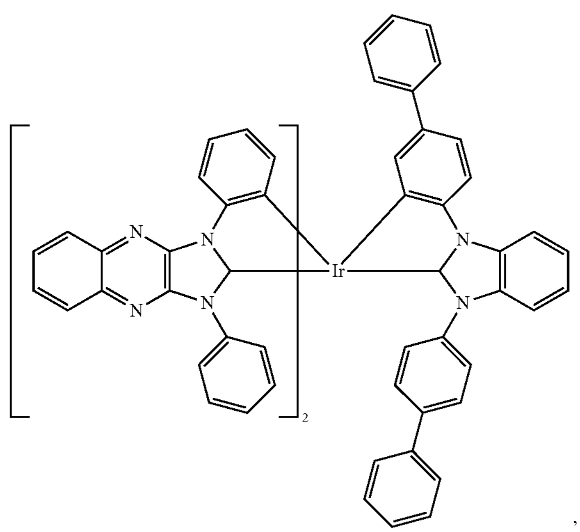
, -continued
(XXVI)
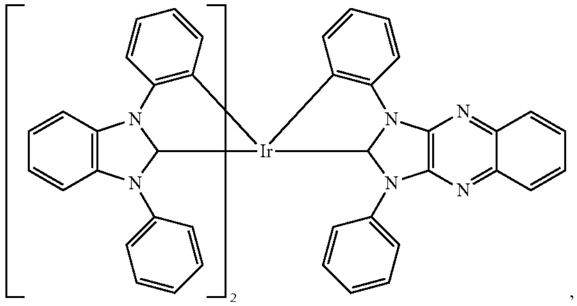
,
(XXVII)
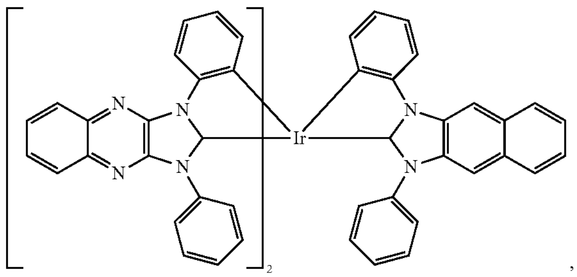
,
(XXVIII)
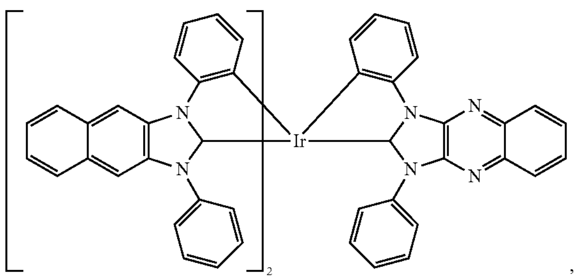
,
(XXIX)
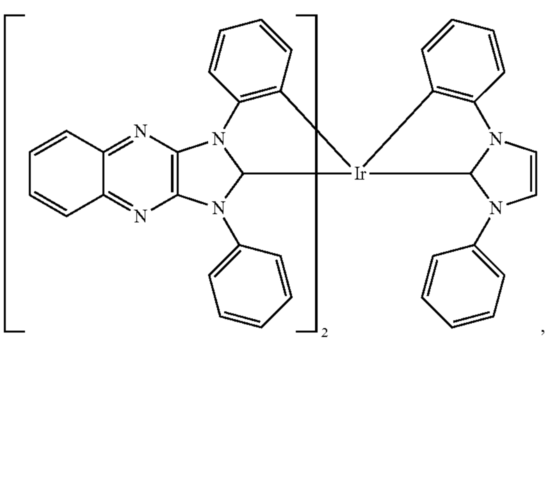
,
-continued
(XXXIII)
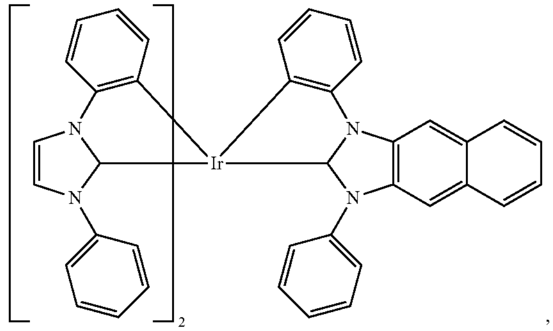
,
(XXXIV)
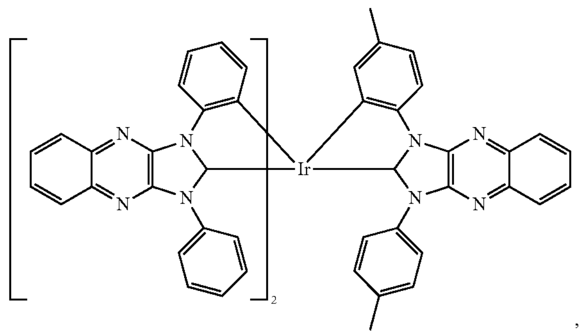
,
(XXXV)
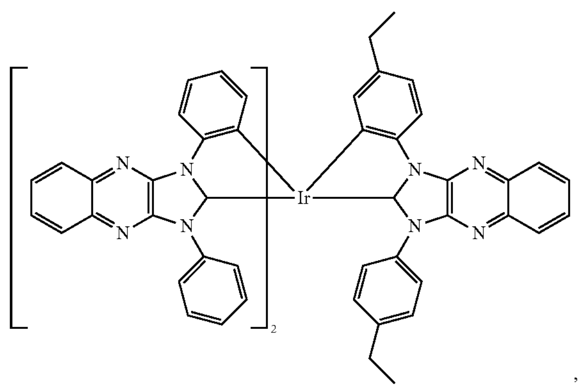
,
(XXXVI)
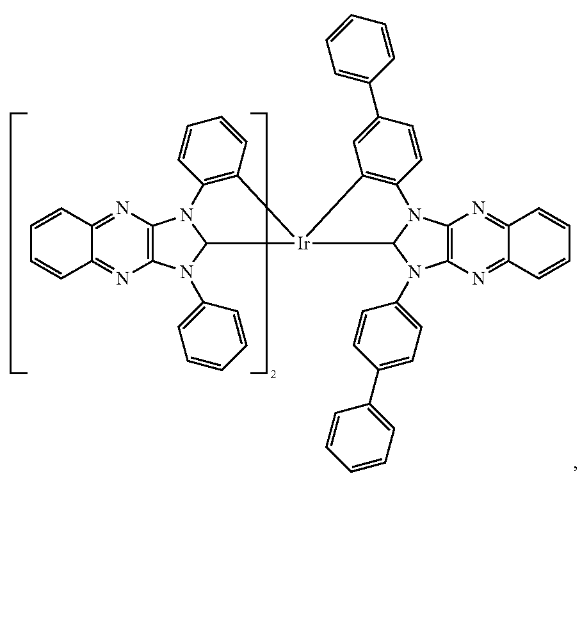
, -continued
(XXXVII)
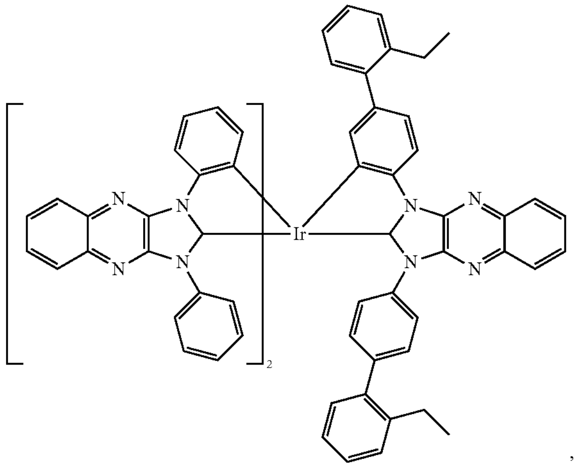
,
(XXXVIII)
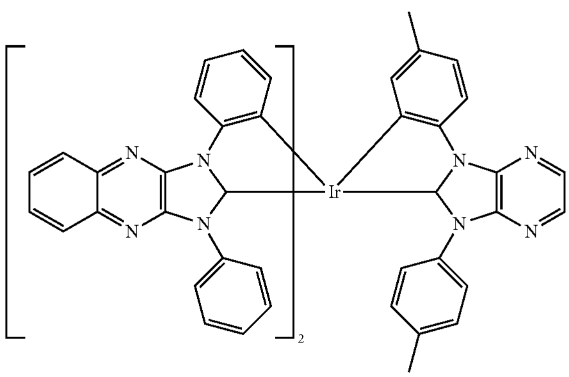
,
(XXXIX)
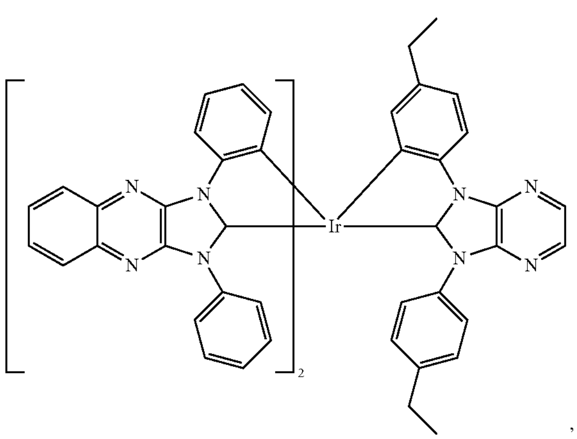
,
-continued
(XXXX)
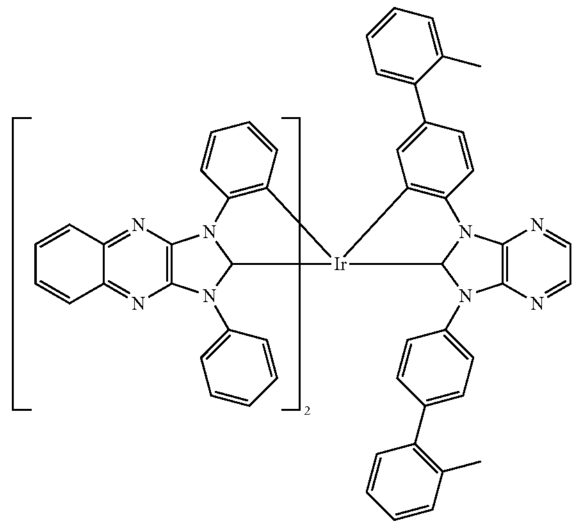
,
(XXXXI)
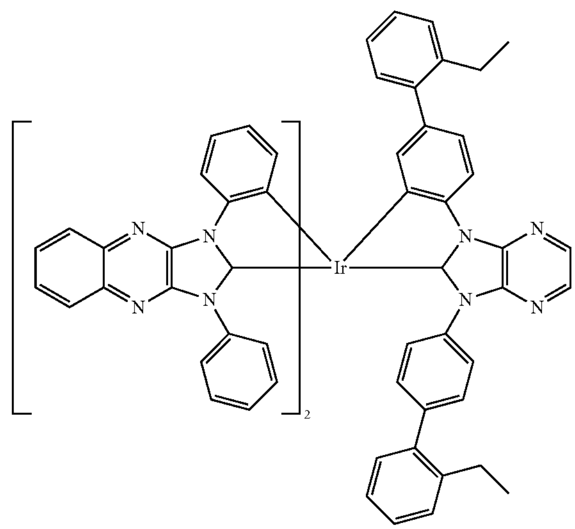
,
start with the first ring on page 7
Most preferred compounds are the following compounds
(IV)
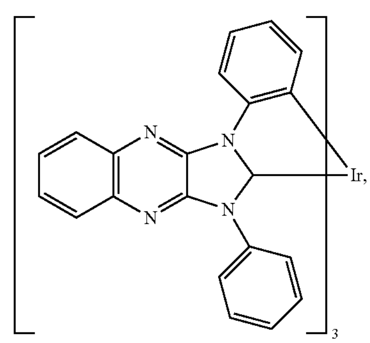

-continued
(V)
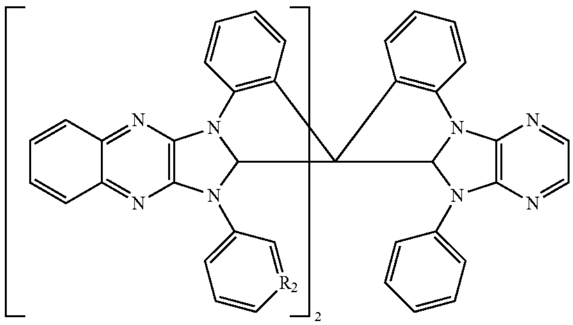
,
(VIa)
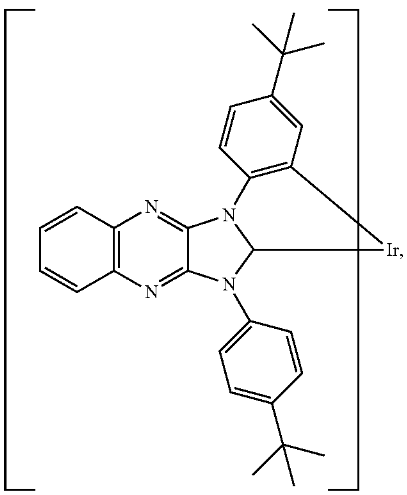
(VII)
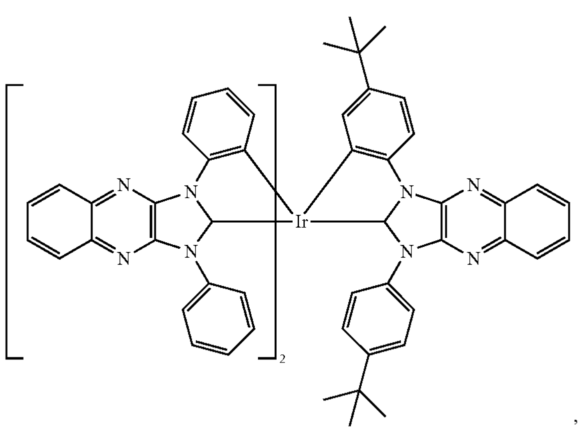
,
-continued
(IX)
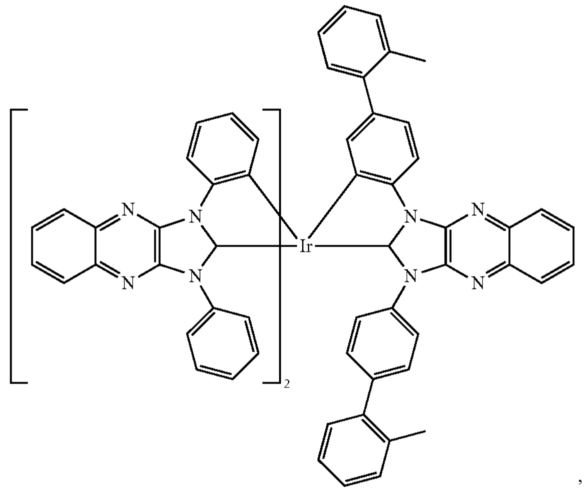
,
(XVII)
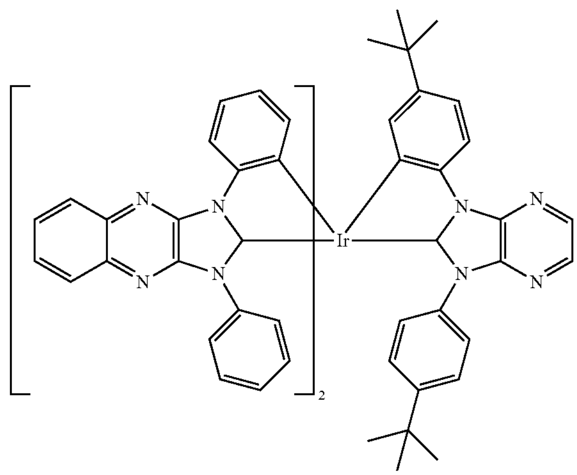
,
(XVII)
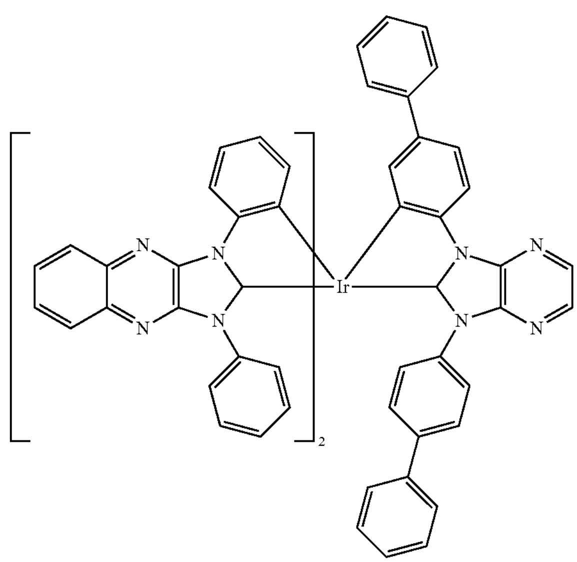
, -continued
(XVIII)
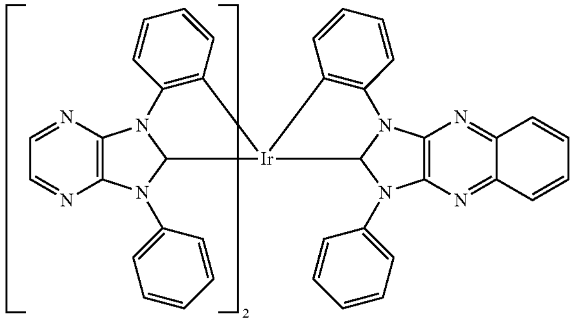
,
(XX)
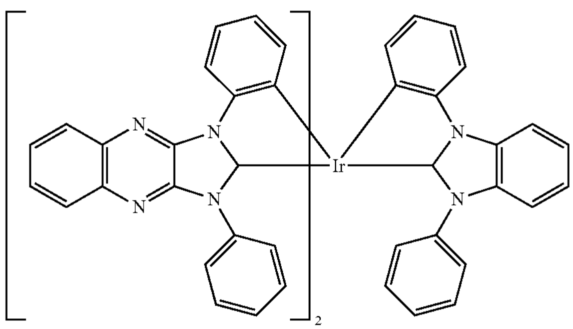
,
(XXI)
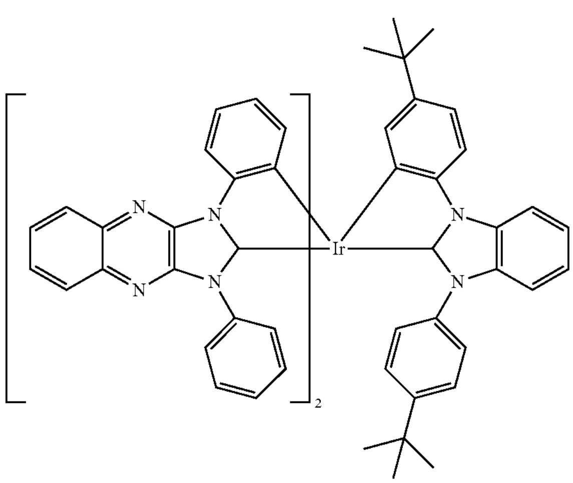
,
-continued
(XXIV)
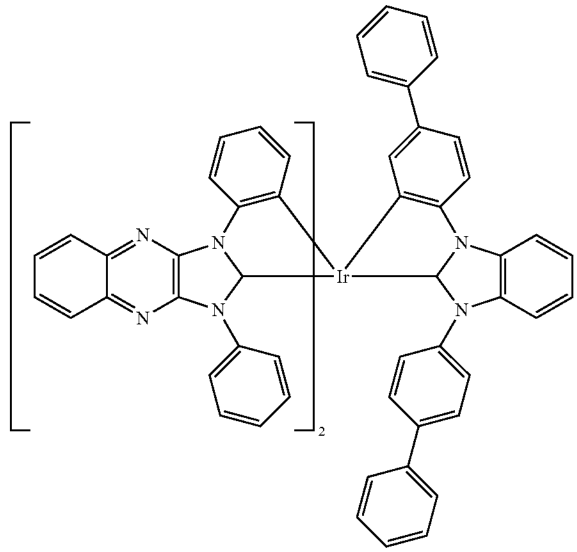
,
(XXVI)
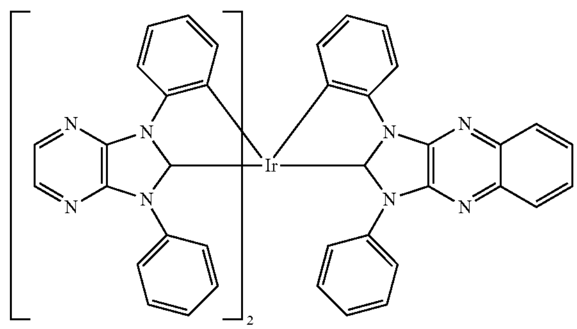
,
(XXVII)
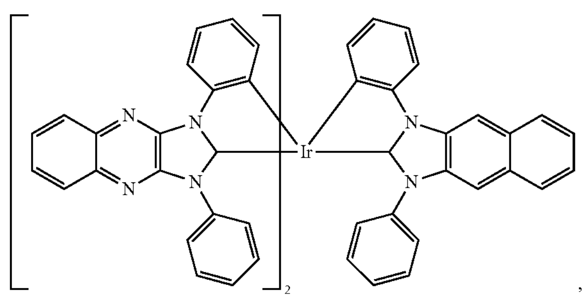
,
(XXVIII)
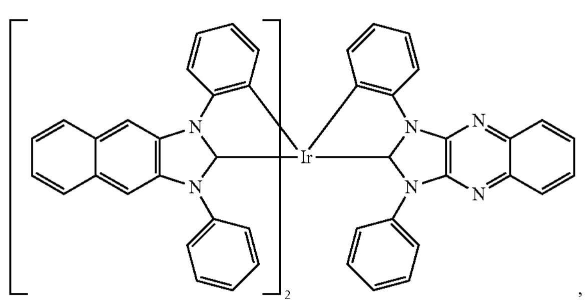
, -continued
(XXIX)
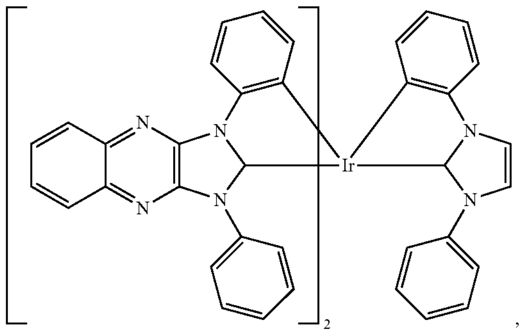
,
(XXXIII)
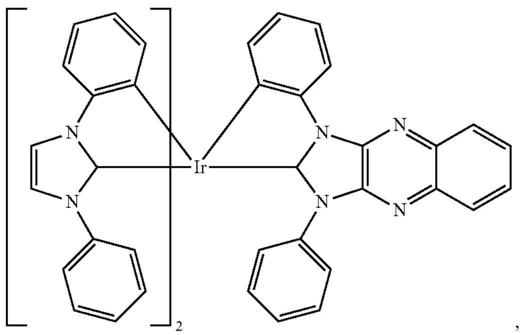
,
(XXXIV)
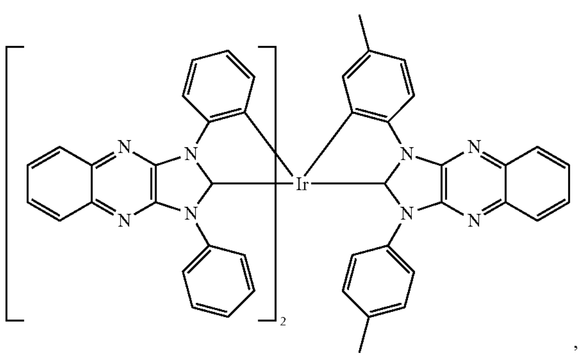
,
(XXXV)
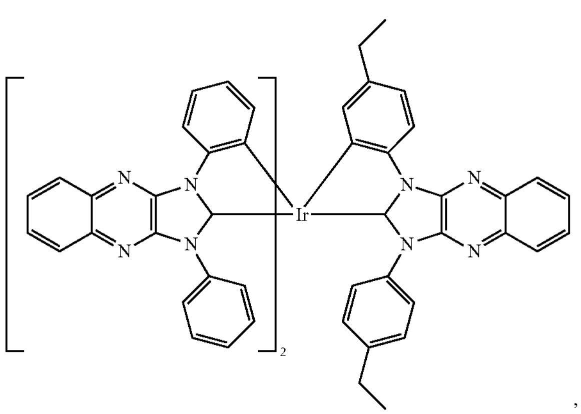
,
-continued
(XXXVI)
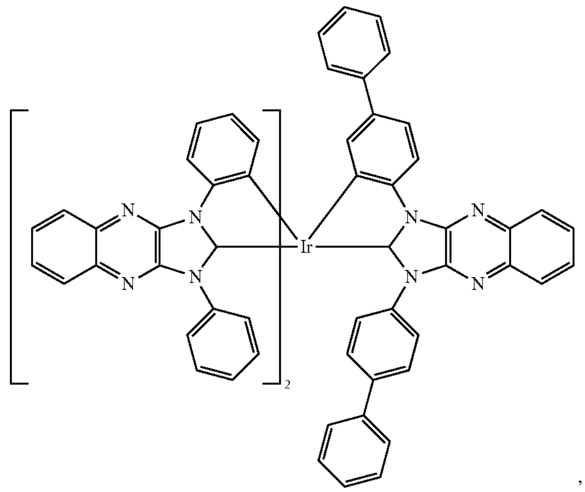
,
(XXXVII)
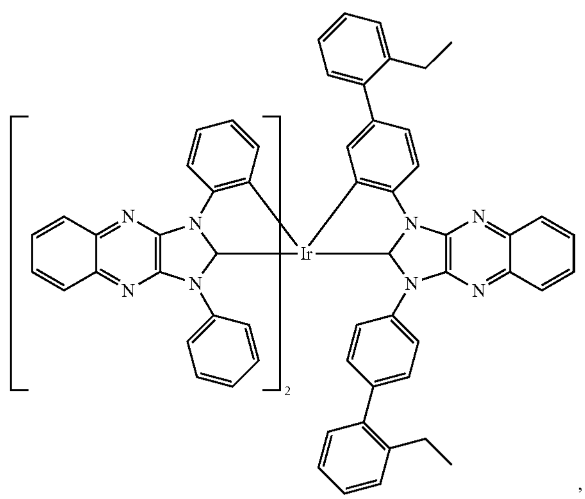
,
(XXXVII)
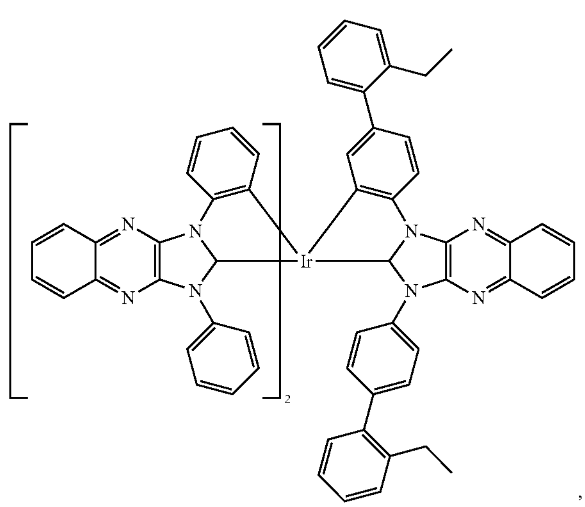
, -continued
(XXXVIII)
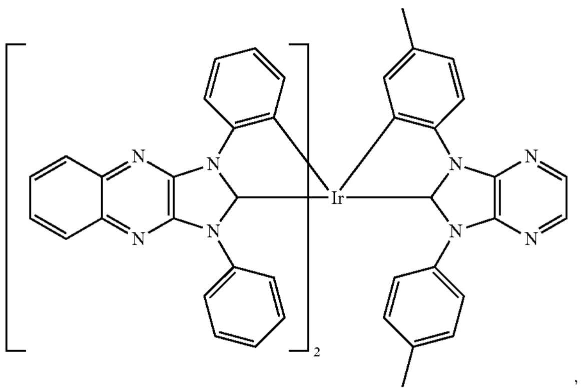
(XXXIX)
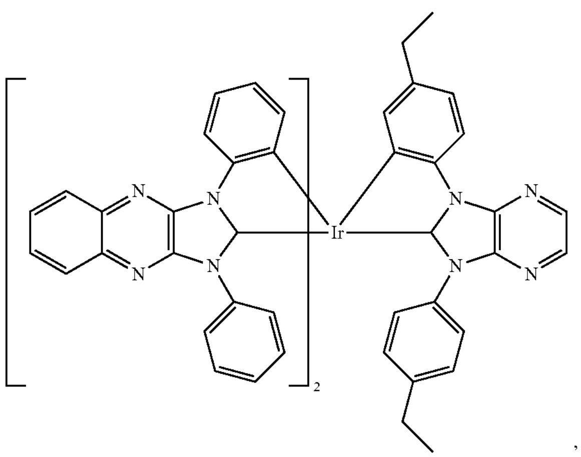
(XXXX)
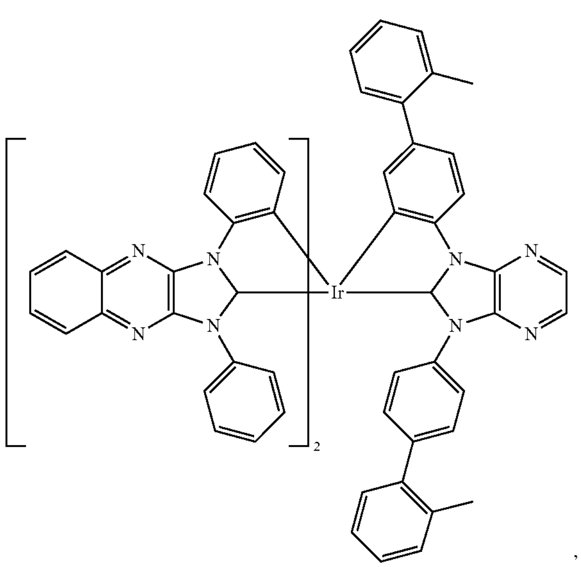
-continued
(XXXXI)
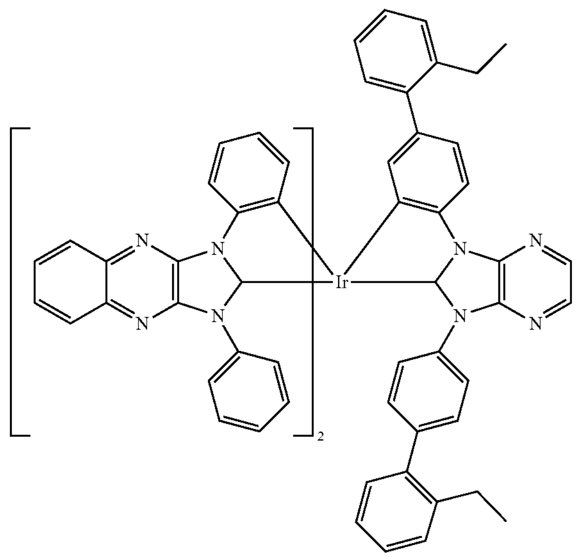
(XXXXII)
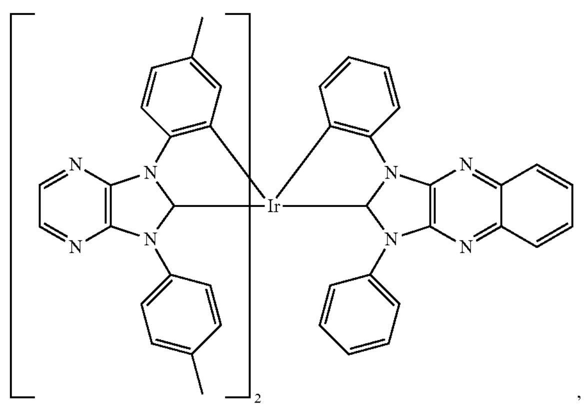
(XXXXIII)
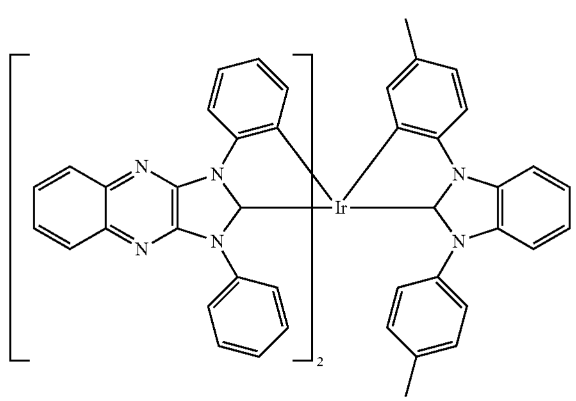

-continued
(XXXXIV)
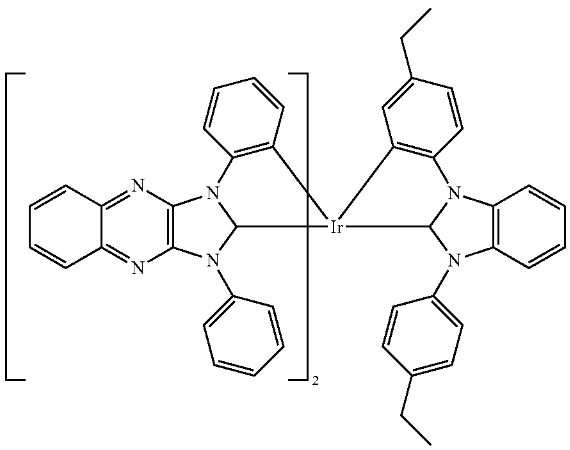
,
(XXXXV)
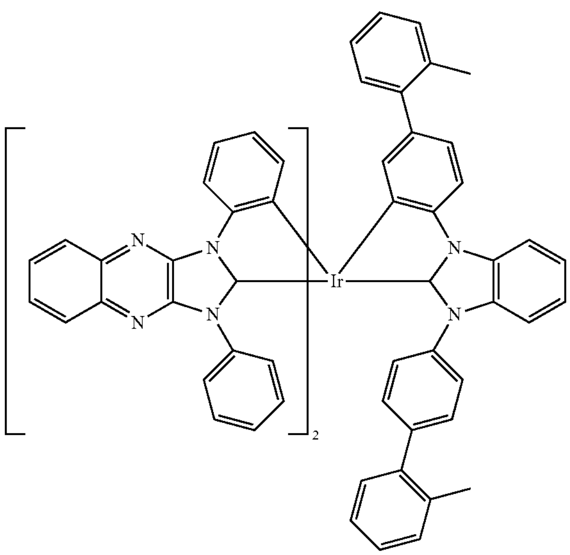
,
(XXXXVI)
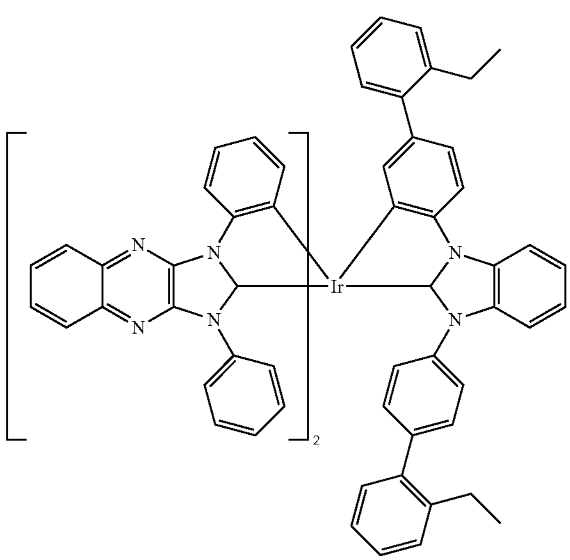
,
-continued
(XXXXVII)
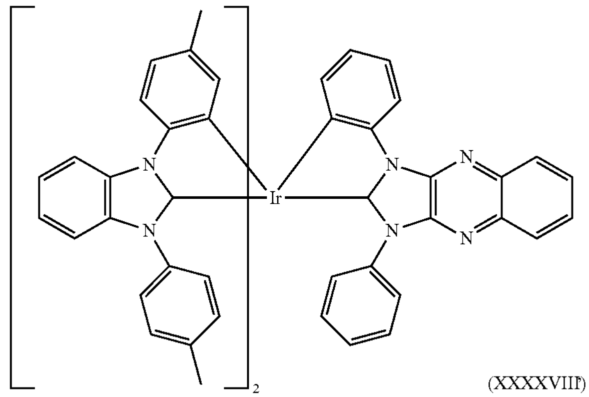
(XXXXVIII)
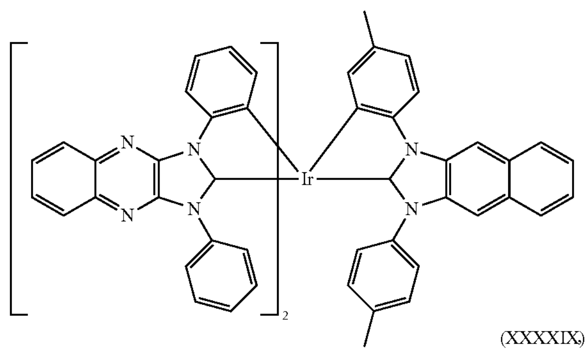
(XXXXIX)
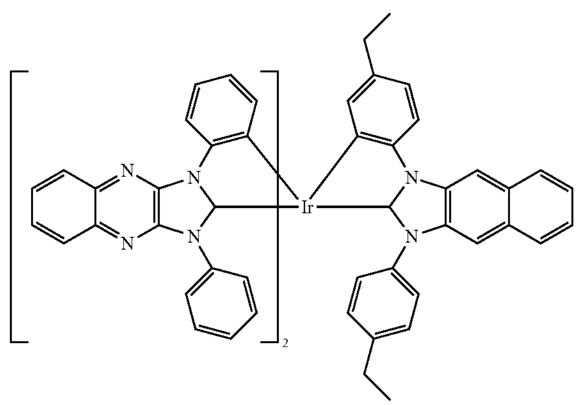
,
(XXXXX)
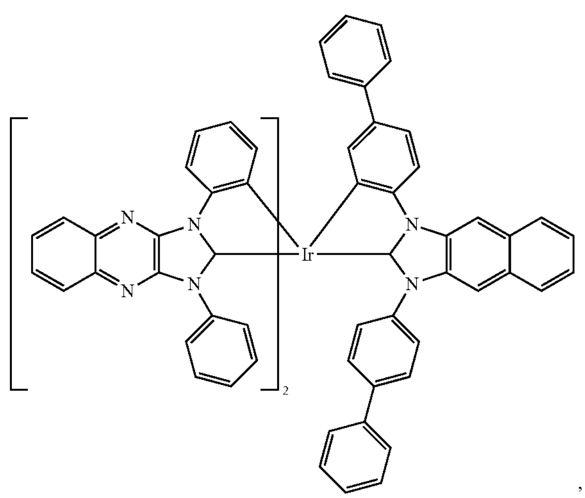
, (XXXXXI)
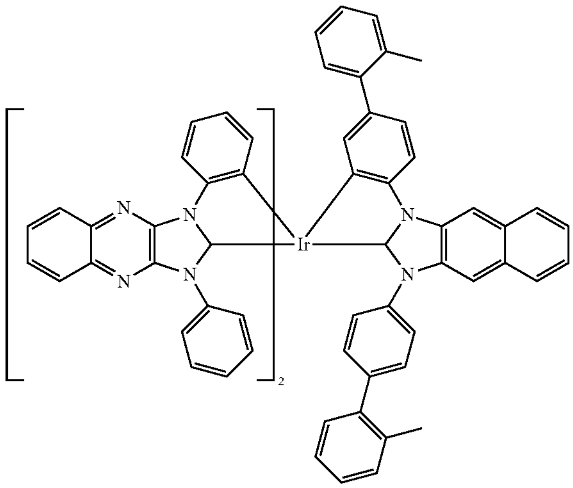
,
(XXXXXII)
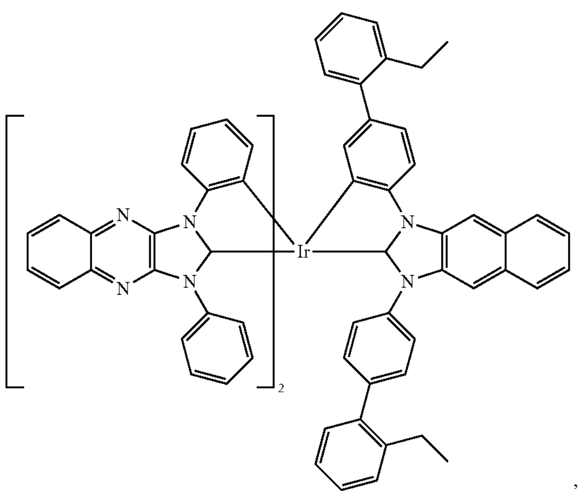
,
(XXXXXIII)
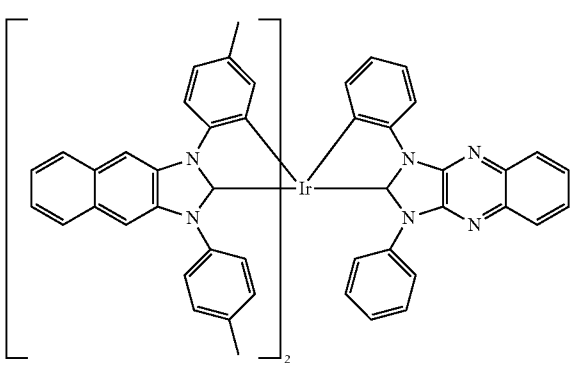
,
(XXXXXIV)
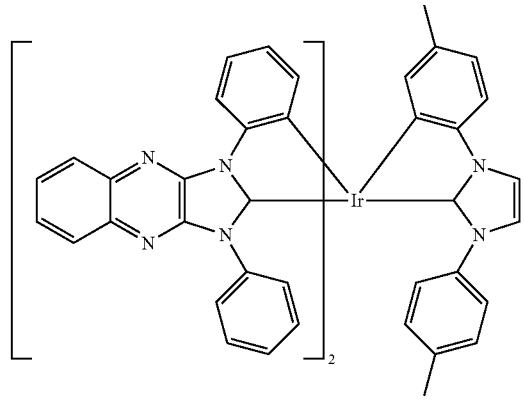
,
(XXXXXV
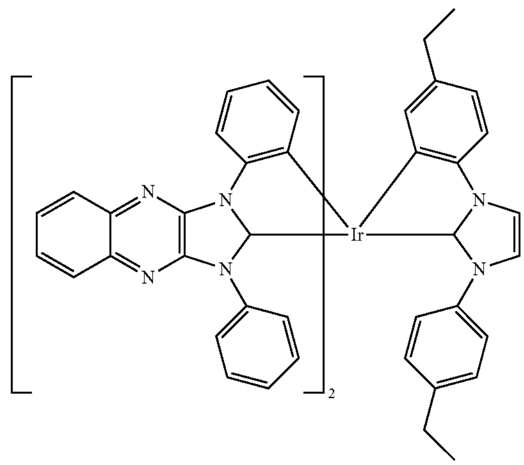
,
(XXXXXVI)
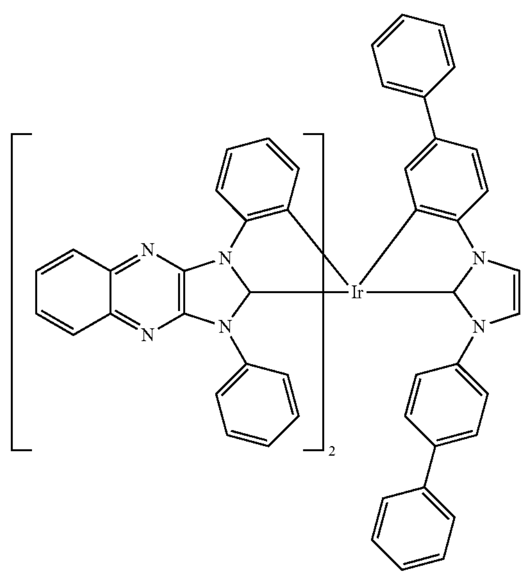
, -continued
(XXXXXVII)
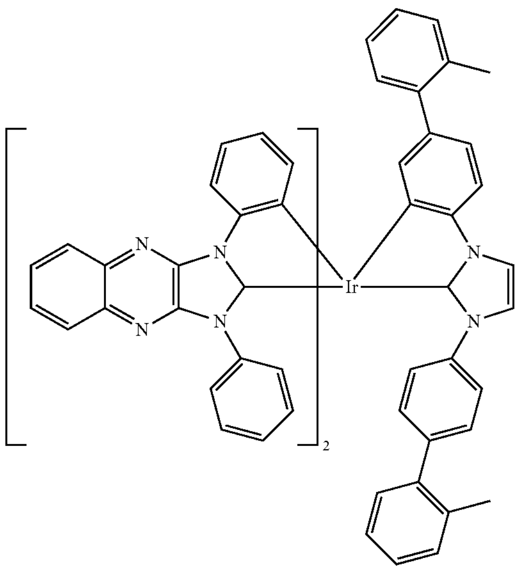
,
(XXXXXVIII)
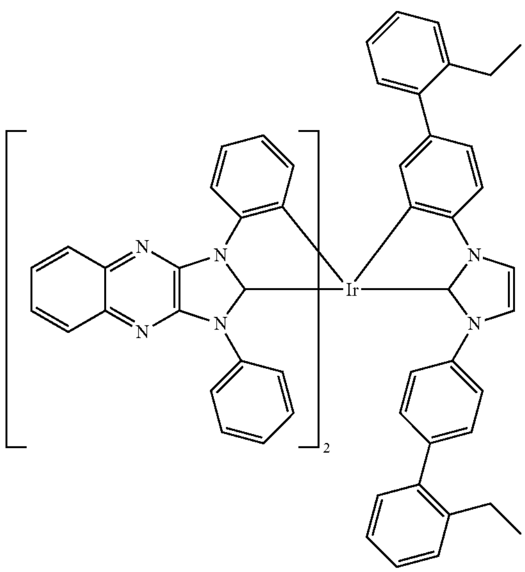
, and
(XXXXXIX)
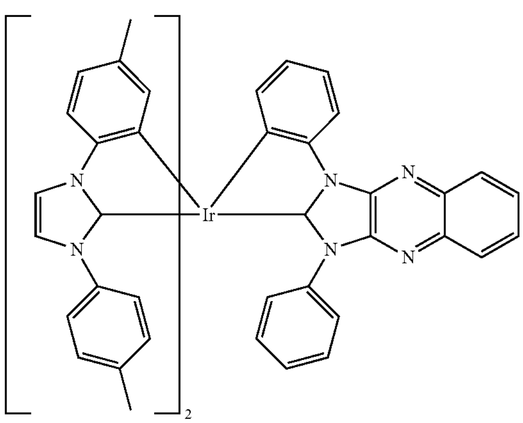
.
Even more preferred are the following compounds:
(IV)
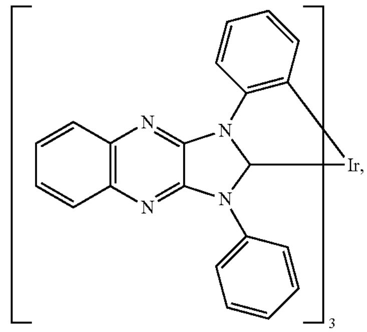
(V)
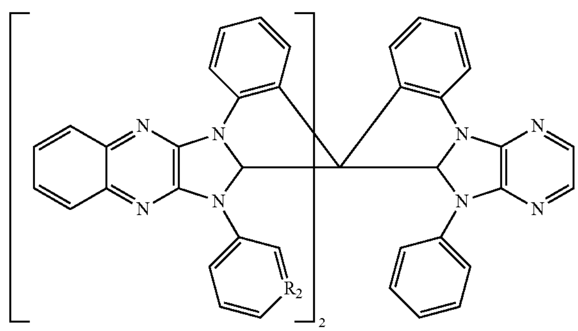
,
(IX)
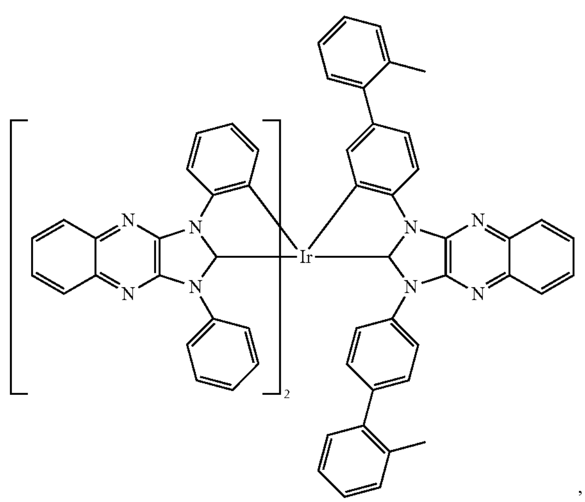
, -continued
(XVII)
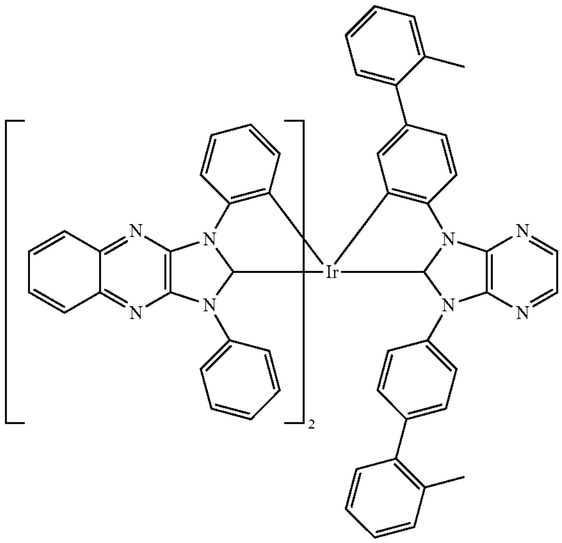
,
(XVIII)
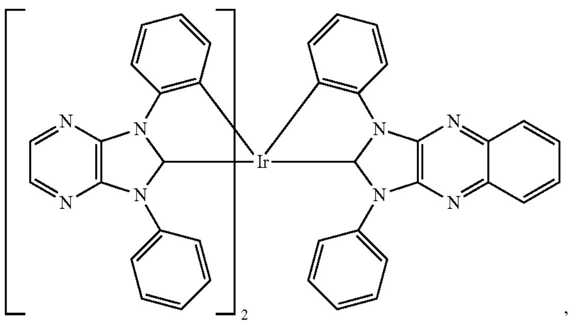
,
(XX)
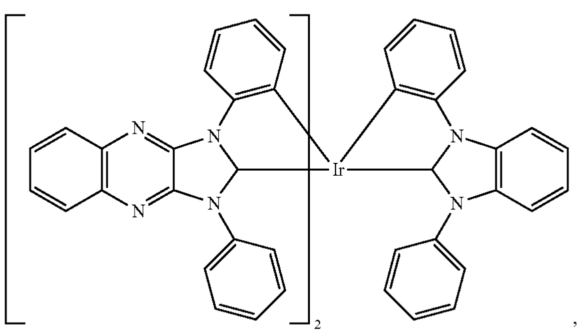
,
-continued
(XXIV)
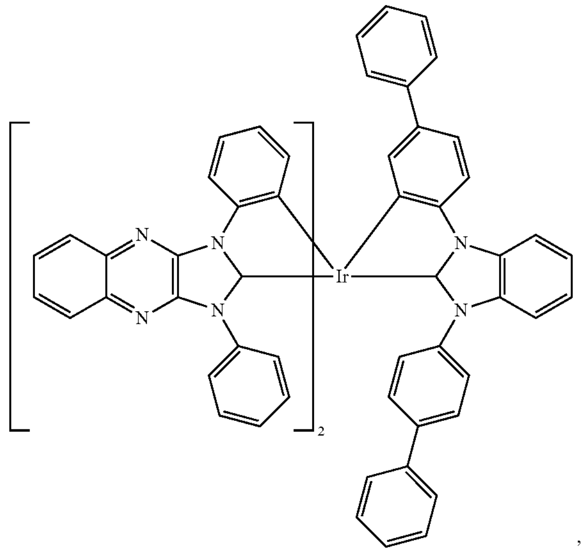
,
(XXVI)
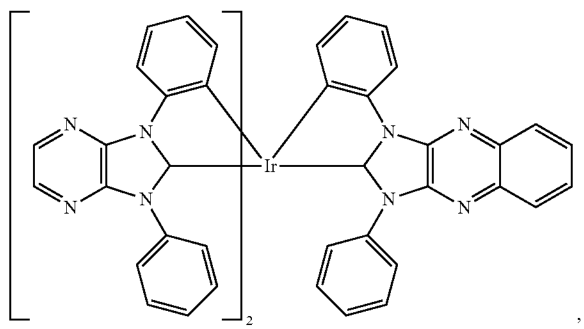
,
(XXVII)
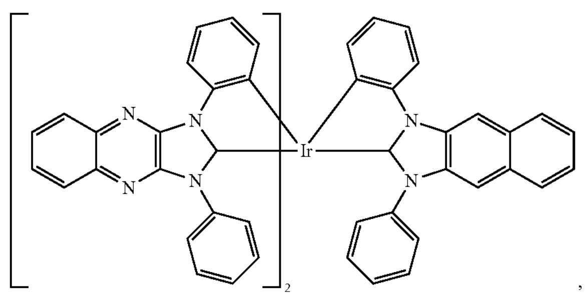
,
(XXVIII)
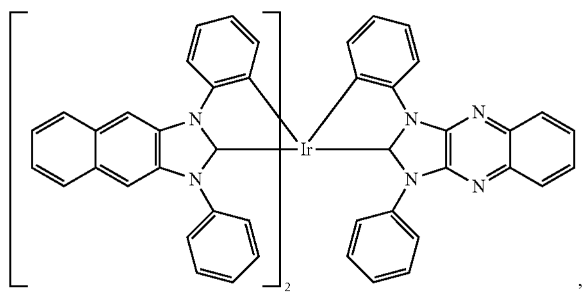
, -continued
(XXIX)
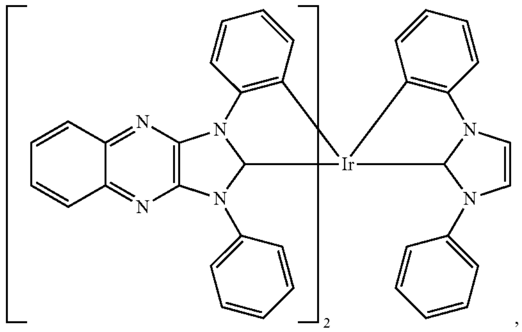
,
(XXXIII)
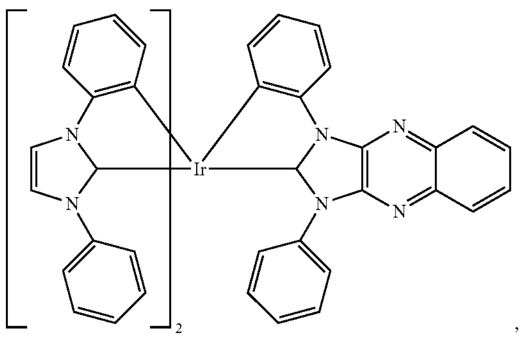
,
(XXXVI)
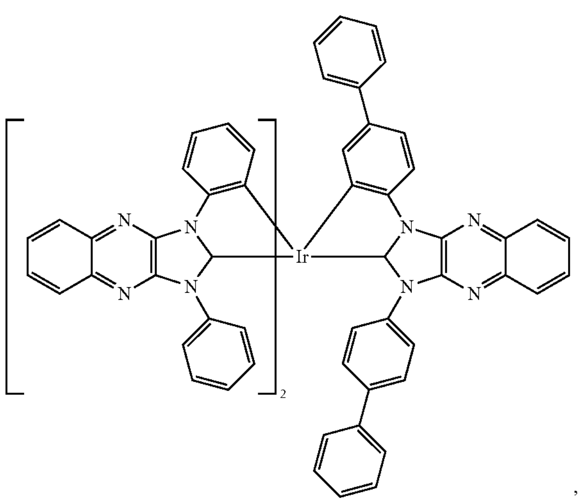
,
-continued
(XXXVII)
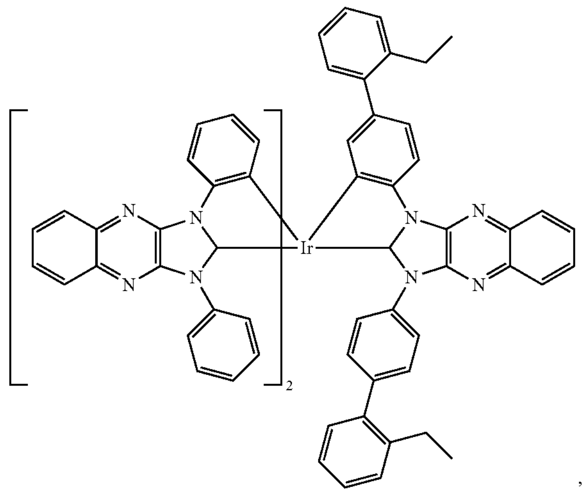
,
(XXXX)
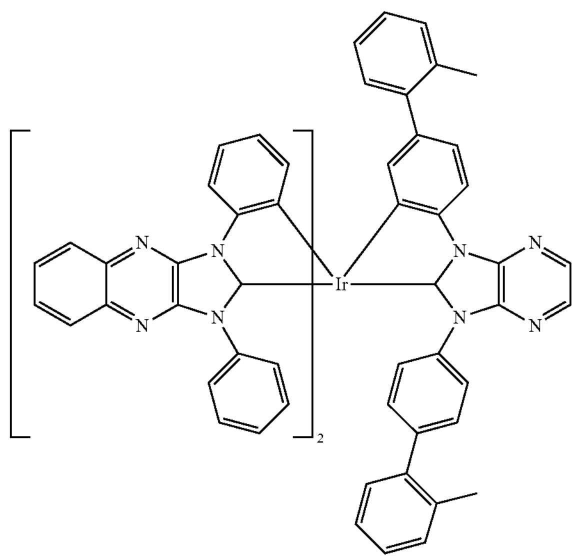
,
(XXXXI)
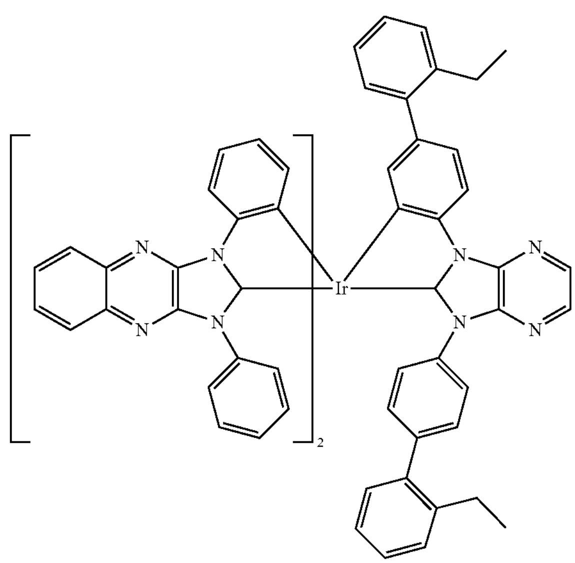
, -continued
(XXXXV)
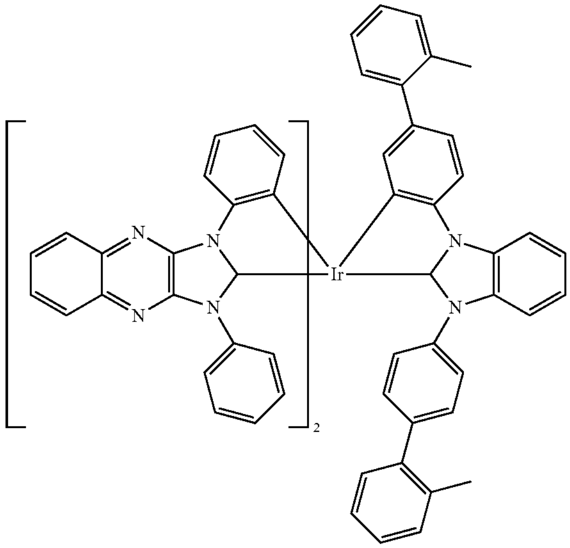
,
(XXXXVI)
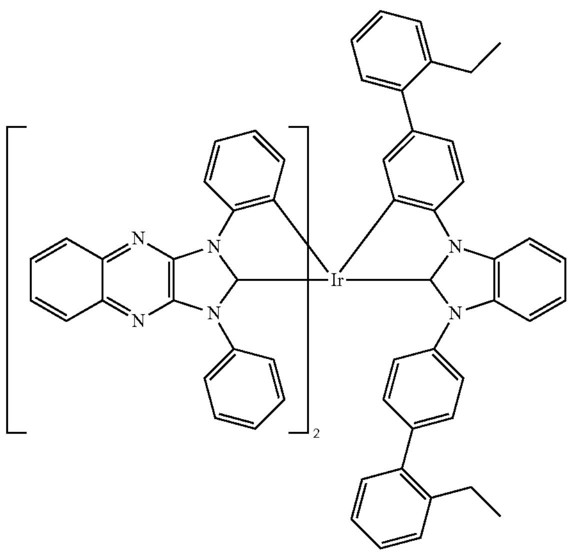
,
(XXXXX)
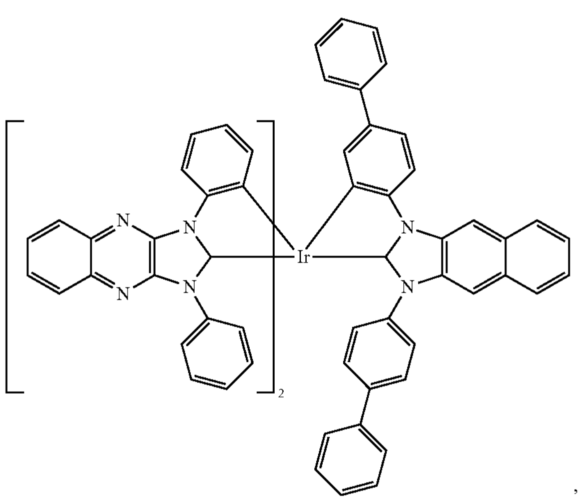
,
-continued
(XXXXXI)
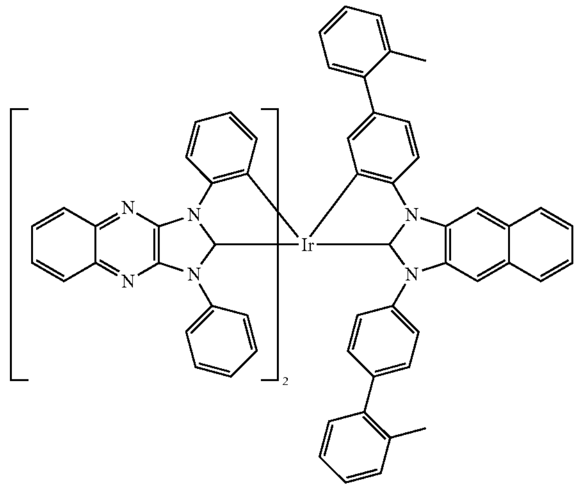
,
(XXXXXII)
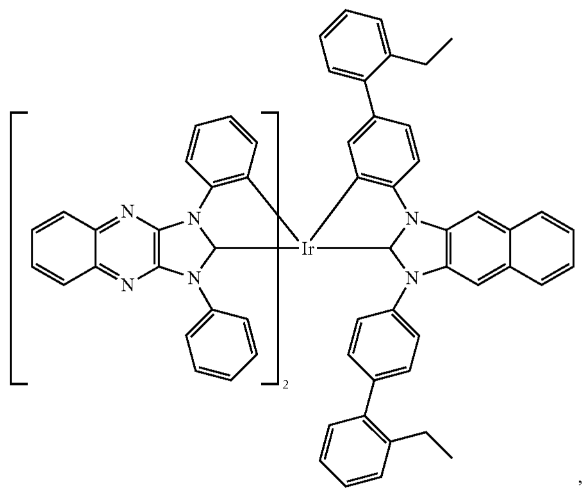
,
(XXXXXVI)
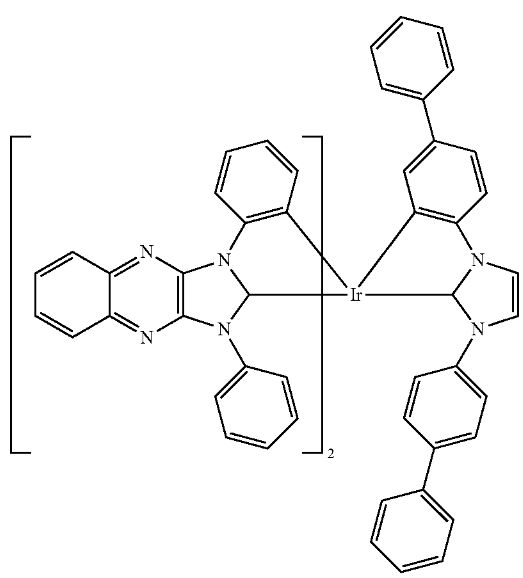
, -continued
(XXXXXVII)
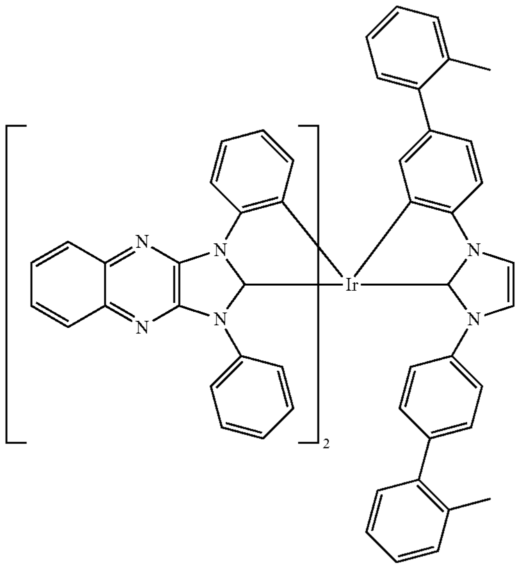
, and
(XXXXXVIII)
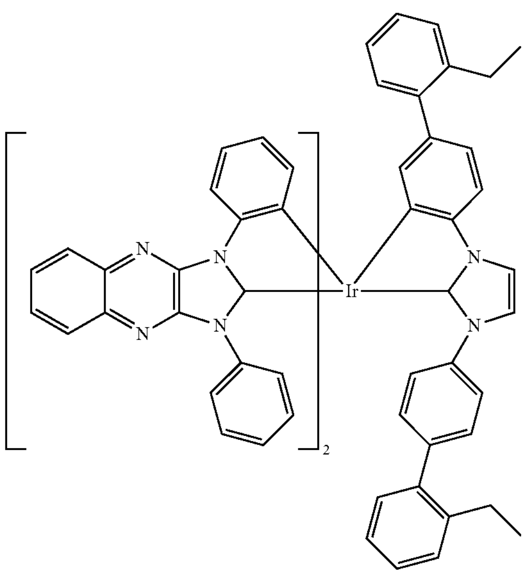
.
Even more preferred are the following compounds:
(IV)
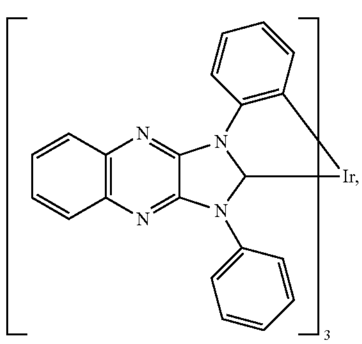
-continued
(V)
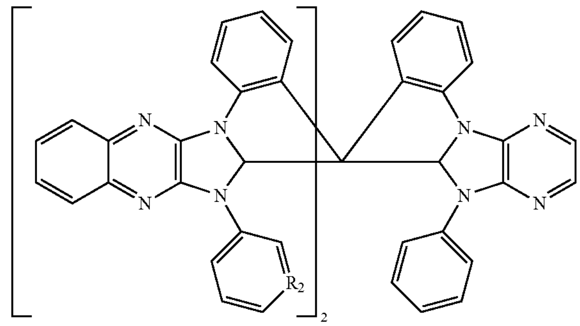
,
(XVII)
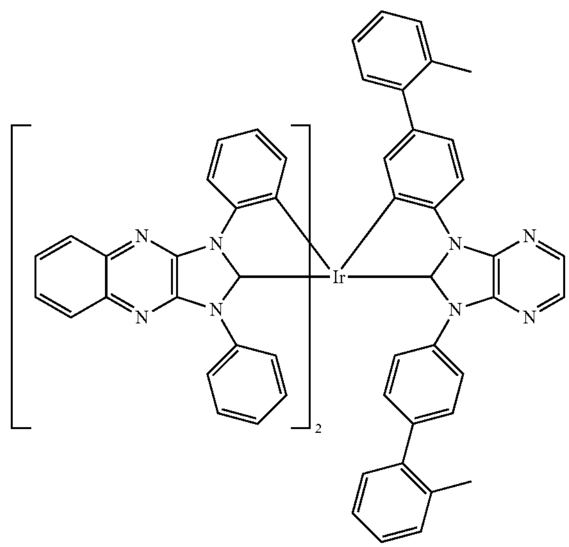
,
(XVIII)
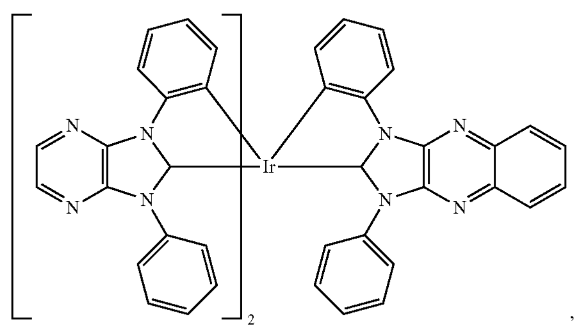
,
(XX)
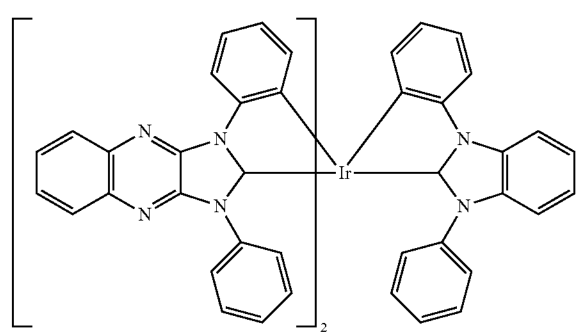
, -continued
(XXIV)
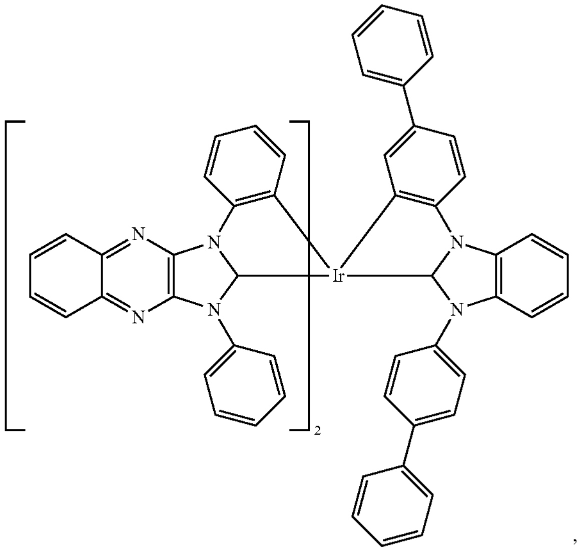
,
(XXVI)
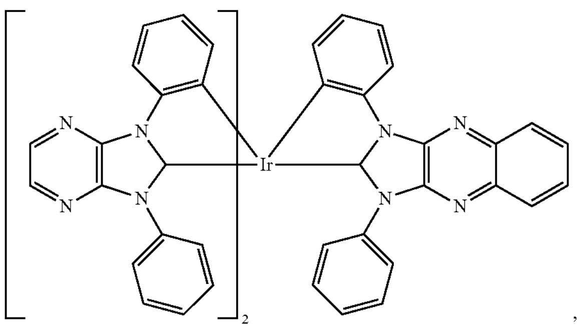
,
(XXVII)
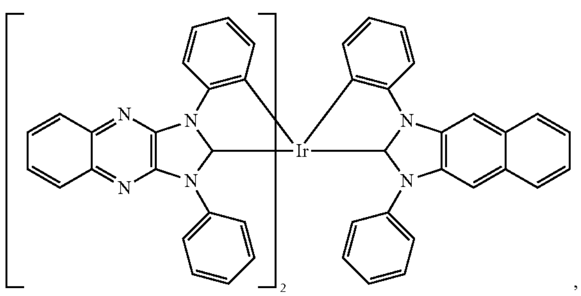
,
(XXVIII)
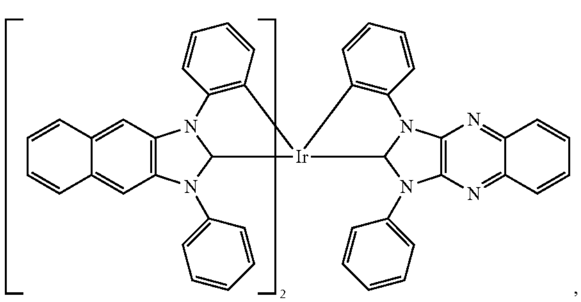
,
-continued
(XXIX)
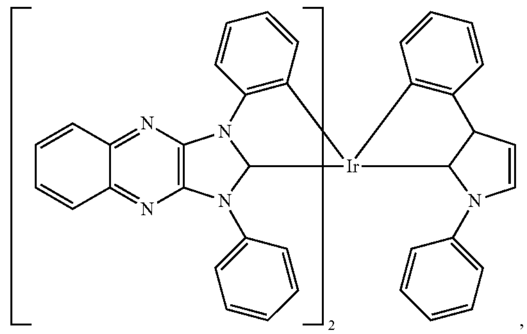
,
(XXXIII)
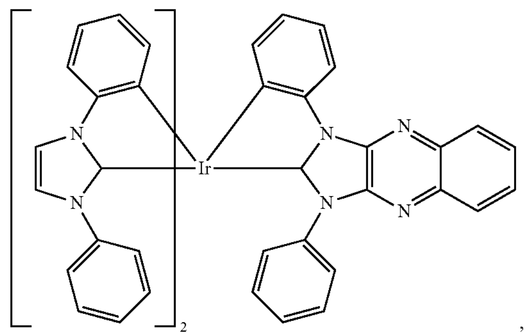
,
(XXXXXVI)
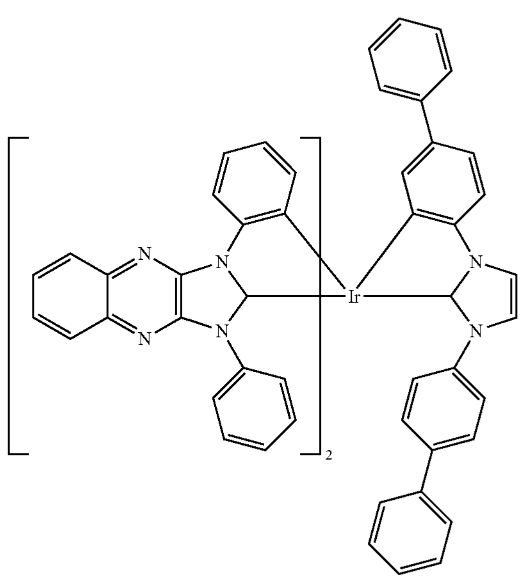
, Even more preferred are the following compounds:
(IV)
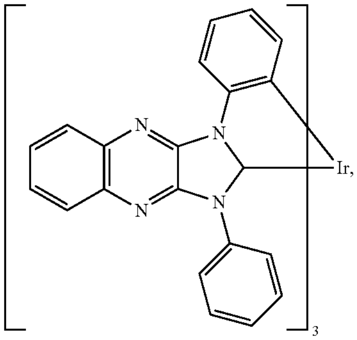
(V)
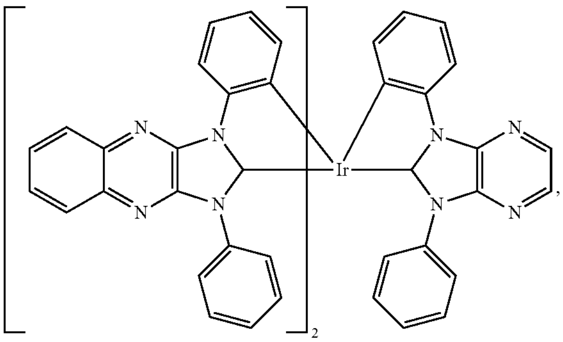
(XVIII)
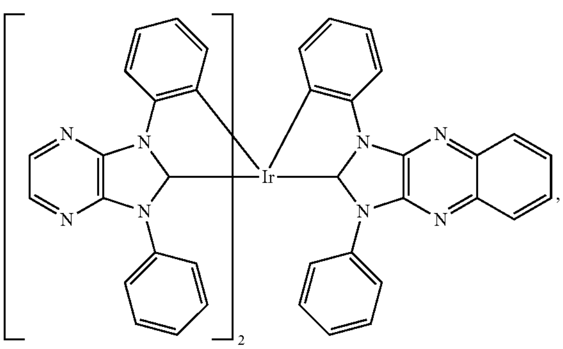
(XX)
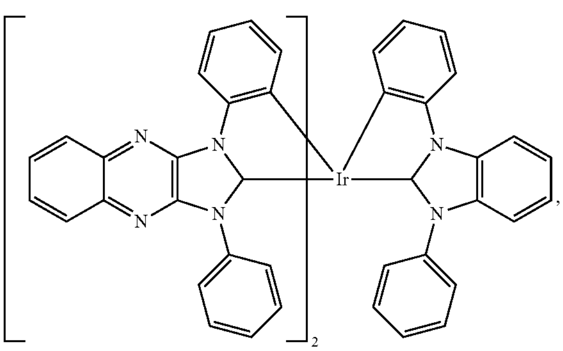
-continued
(XXVI)
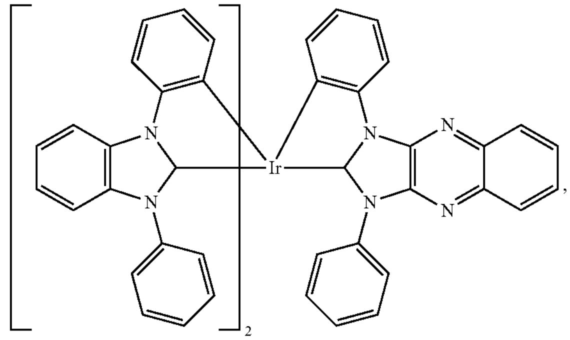
(XXVII)
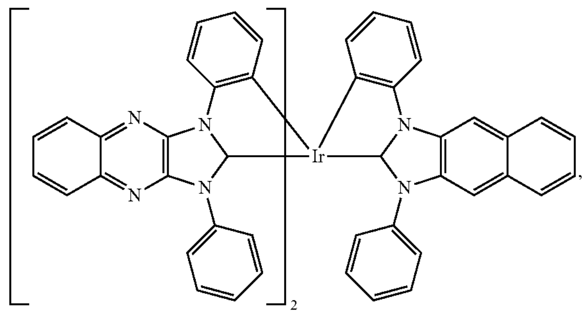
(XXVIII)
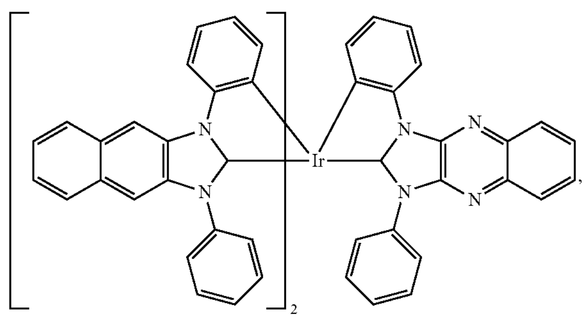
(XXIX)
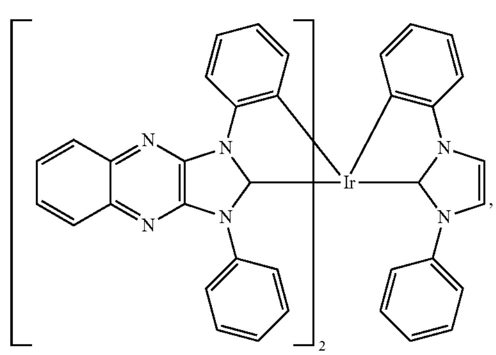
and -continued
(XXXIII)
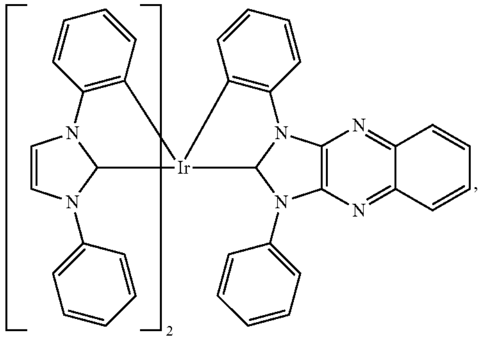
-continued
(XX)
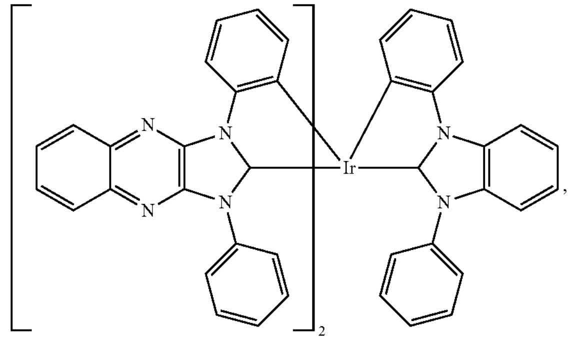
Even more preferred are the following compounds:
(IV)
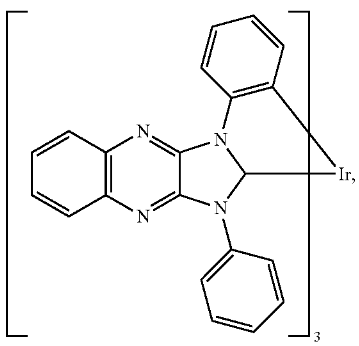
(XXVI)
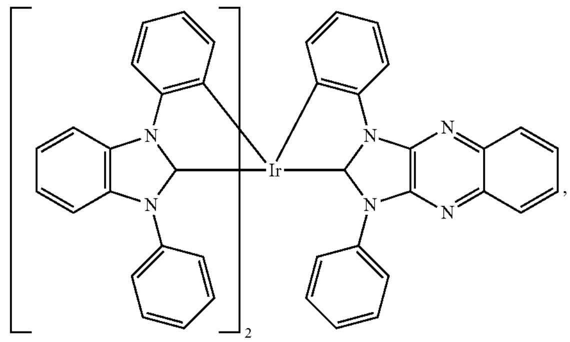
(V)
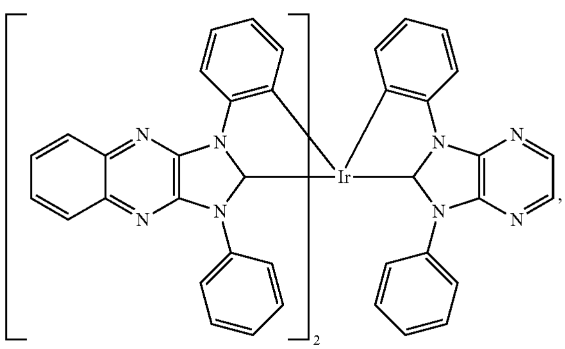
(XXVII)
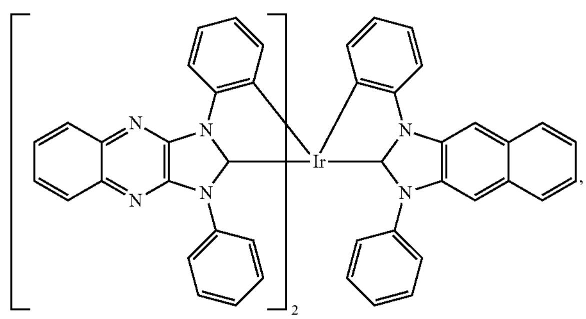
(XVIII)
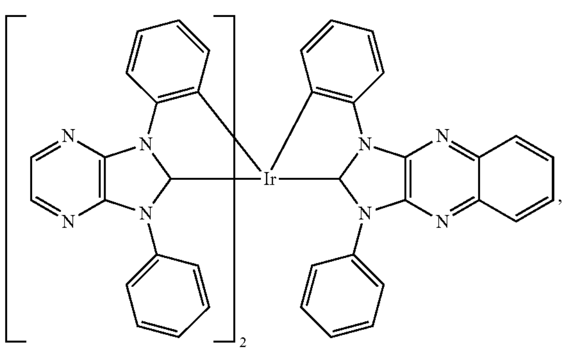
(XXVIII)
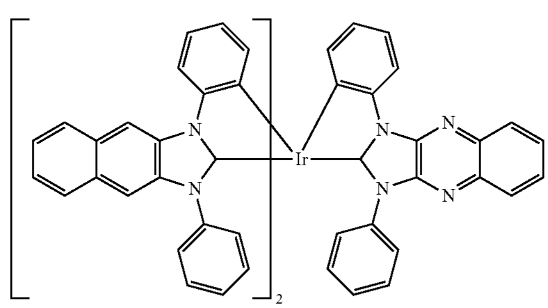

-continued
(XXIX)
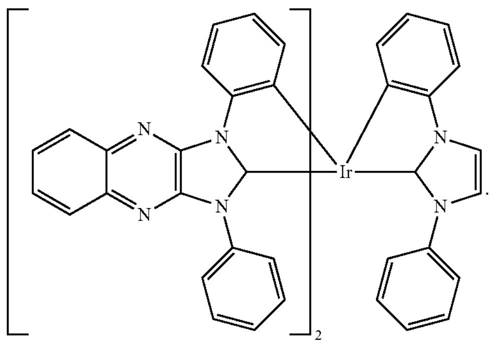
Even more preferred are the following compounds:
(IV)
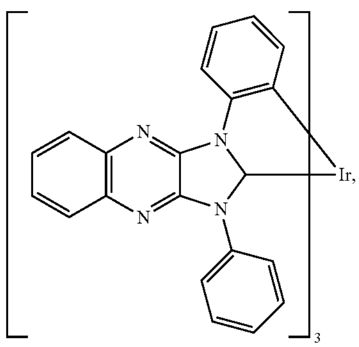
(V)
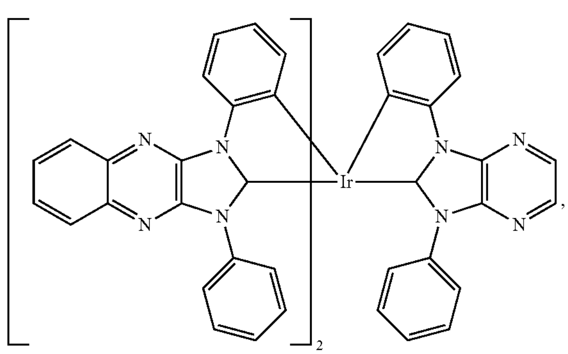
(XX)
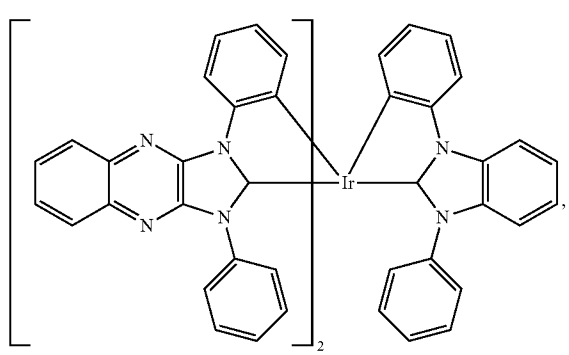
-continued
(XXVII)
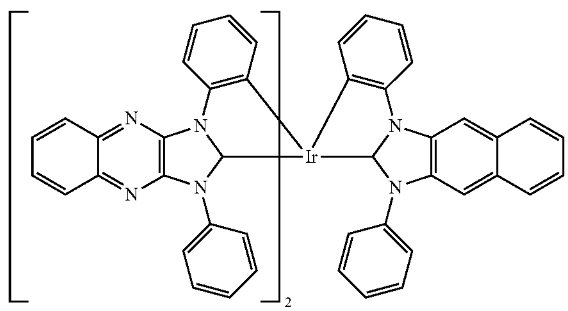
(XXIX)
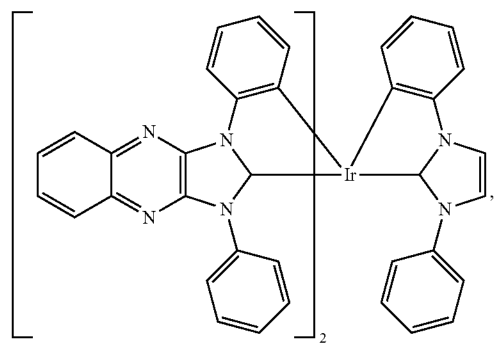
(XVIII)
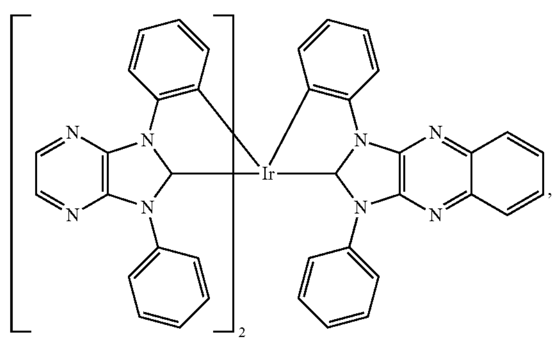
(XXVI)
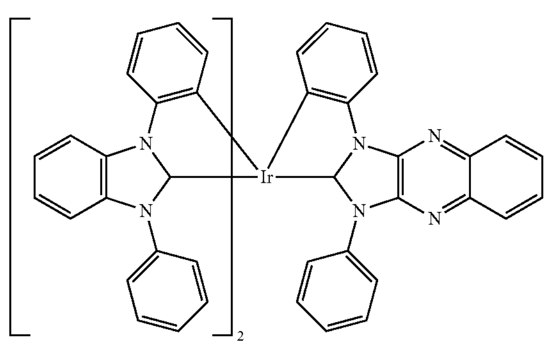
and -continued (XXVIII)

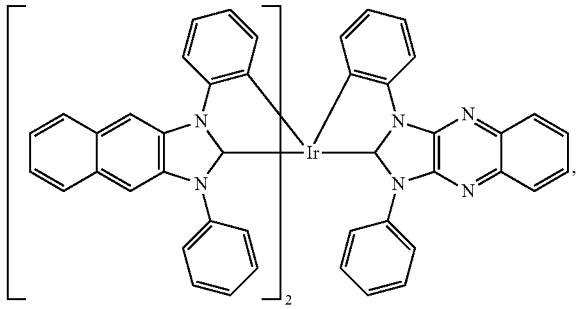

Preparation of the Inventive Metal Carbene Complexes (a) Preparation of the Inventive Metal Carbene Complexes The present invention also relates to a process for preparing the inventive metal carbene complexes, wherein the metal is selected from Ir and Pt, comprising at least one ligand of formula (A)

(A)

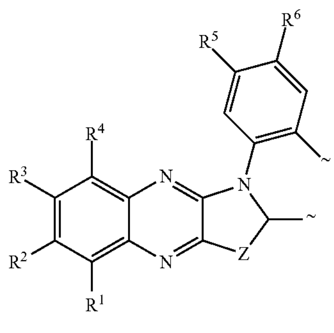

wherein

Z is $NR^x$, O or S, preferably $NR^x$ or O, more preferably $NR^x$, $R^x$ is

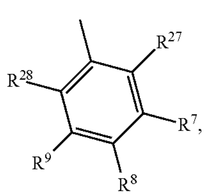

and the other residues, symbols and indices are mentioned above.

In a preferred embodiment, the present invention also relates to a process for preparing the inventive metal carbene complexes, wherein the metal is selected from Ir and Pt, comprising at least one ligand of formula (I')

(I)

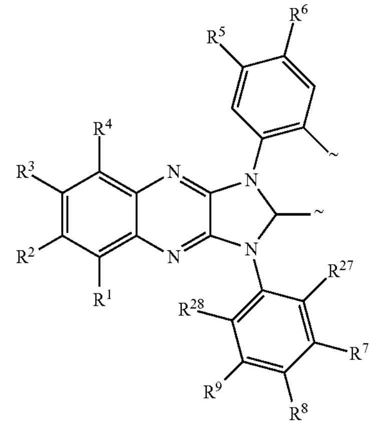

by contacting suitable compounds comprising Ir or Pt with the appropriate ligands or ligand precursors. The residues $R^1$, $R^2$, $R^3$, $R^4$, $R^5$, $R^6$, $R^7$, $R^8$, $R^9$, $R^{27}$ and $R^{28}$ have been defined before.

In one embodiment of the process according to the invention, a suitable compound comprising iridium or platinum, preferably iridium, and appropriate carbene ligands, preferably in deprotonated form as the free carbene or in the form of a protected carbene, for example as the silver-carbene complex, are contacted.

The present invention therefore relates—in one embodiment—to a process according to the invention wherein the ligand precursor used is a corresponding Ag-carbene complex.

In a further preferred embodiment of the process according to the invention, the ligand precursors used are organic compounds which are reacted with suitable Ir or Pt comprising compounds. The carbene can be released from precursors of the carbene ligands by removing volatile substances, for example lower alcohols such as methanol or ethanol, for example at elevated temperature and/or under reduced pressure and/or using molecular sieves which bind the alcohol molecules eliminated. Corresponding processes are known to those skilled in the art.

The present invention also relates to the process according to the invention wherein the ligand precursor used is a compound of the general formula (XXA)

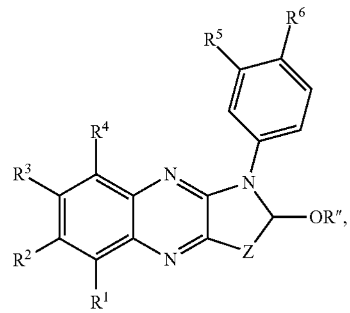

wherein $R^1$, $R^2$, $R^3$, $R^4$, $R^5$, $R^6$, $R^7$, $R^8$, $R^9$, $R^{27}$ and $R^{28}$ and Z are as defined above, and R" is $SiR^{13}R^{14}R^{15}$, heteroaryl, alkyl, cycloalkyl or heterocycloalkyl, wherein $R^{13}$, $R^{14}$ and $R^{15}$ are independently of each other aryl, heteroaryl, alkyl, cycloalkyl or heterocycloalkyl.

Preferably, the present invention also relates to the process according to the invention wherein the ligand precursor used is a compound of the general formula (XX)

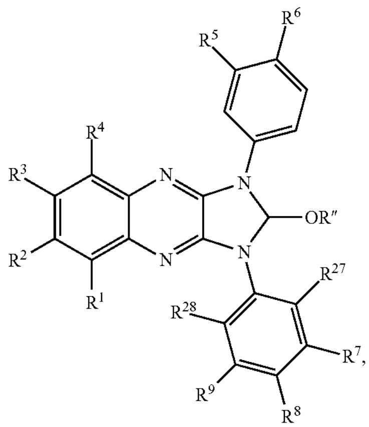

wherein $R^1$, $R^2$, $R^3$, $R^4$, $R^5$, $R^6$, $R^7$, $R^8$, $R^9$, $R^{27}$ and $R^{28}$ are as defined above, and R" is $SiR^{13}R^{14}R^{15}$, aryl, heteroaryl, alkyl, cycloalkyl or heterocycloalkyl, wherein $R^{13}$, $R^{14}$ and $R^{15}$ are independently of each other aryl, heteroaryl, alkyl, cycloalkyl or heterocycloalkyl.

In a particularly preferred embodiment, R" is alkyl, especially $C_1$-$C_{20}$alkyl, preferably $C_1$-$C_{10}$alkyl, more preferably $C_1$-$C_8$alkyl, for example methyl, ethyl, propyl such as n-propyl, isopropyl, butyl such as n-butyl, isobutyl, tert-butyl, pentyl, hexyl, heptyl or octyl.

R" in the compound of the general formula (XXA) and (XX) is most preferably methyl or ethyl.

Compounds of the general formula (XXA) and (XX) are generally obtainable by processes known to those skilled in the art. Compounds of the general formula (XXA) and (XX) can be obtained for example by reacting compounds of the general formula (XXIAa), preferably by reacting compounds of the general formula (XXIa)

(XXIAa)

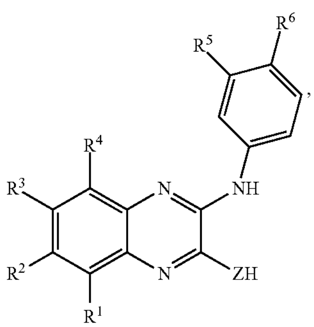

preferably (XXIa)

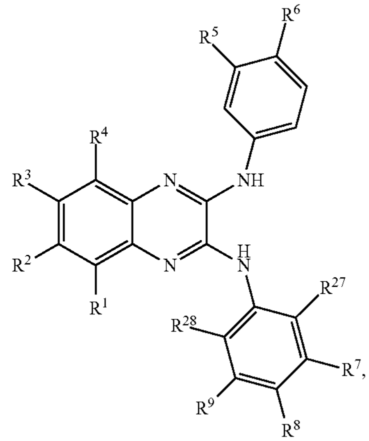

or the corresponding
Cl or $BF_4$ salt of formula (XXIAb)

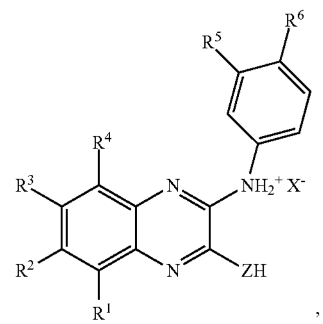

preferably (XXIb)

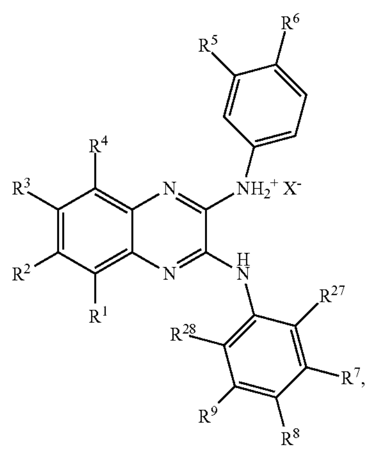

wherein X is Cl or $BF_4$,
with compounds of the general formula $HC(OR")_3$ (XXII), or
by reacting compounds of the general formula (XXIAa) or (XXIAb), preferably (XXIa) or (XXIb) in a first step with Vilsmeier reagent ((chloromethylene)dimethylammonium chloride) and a sodium salt selected from $NaBF_4$, NaCl, NaBr or NaI to obtain a compound of formula (XXIAc), preferably (XXIc)

(XXIAc)

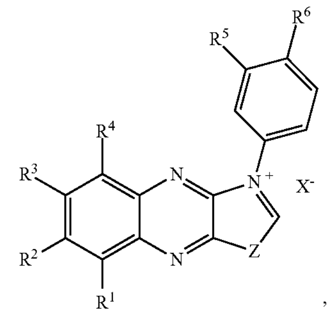

preferably (XXIc)

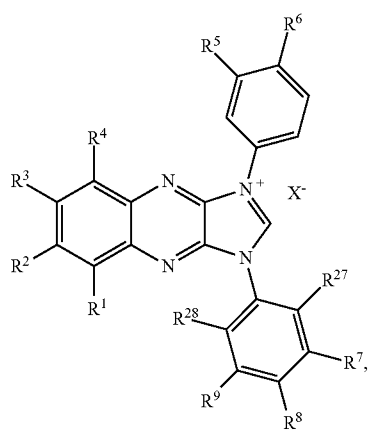

wherein X is $BF_4$, Cl, Br or I and in a second step with R"OH or M"OR", wherein M" is an alkali metal salt, preferably Na, wherein R, R', $R^4$, $R^{4'}$, $R^5$, $R^6$ and $R^7$ are as defined above and the metal is Ir or Pt, comprising one, two or three bidentate ligands of formula (D).

The reaction of compounds of formula (XXIAa), preferably (XXIa) with the compounds of the general formula $HC(OR")_3$ (XXII) is preferably carried out in the presence of an ammonium salt. Suitable ammonium salts are for example ammonium tetrafluoroborate or ammonium halides, e.g. ammonium chloride. The amount of the ammonium salt in relation to the compound of formula (XXIAa), preferably (XXIa) (100 mol %) is usually 1 mol % to 100 mol %.

This preparation of the compounds of the general formula (XXA), preferably (XX) can be effected in the presence or in the absence of a solvent. Suitable solvents are specified below. In one preferred embodiment, the compounds of the general formula (XXA), preferably (XX) are prepared in substance, or the compound of the general formula (XXIIA), preferably (XXII) is added in an excess, such that it functions as a solvent.

Compounds of the general formulae (XXIA) and (XXIIA), preferably (XXI) and (XXII) are commercially available and/or obtainable by processes known to those skilled in the art; for example, compounds of the general formula (XXIA), preferably (XXI) are obtainable by reacting the appropriate chlorides with the appropriate amines.

The compounds of the general formula (XXA), preferably (XX) are prepared generally at a temperature of 10 to 150° C., preferably 40 to 120° C., more preferably 60 to 110° C.

The reaction time is generally 2 to 48 hours, preferably 6 to 24 hours, more preferably 8 to 16 hours.

After the reaction has ended, the desired product can be isolated and purified by customary processes known to those skilled in the art, for example filtration, recrystallization, column chromatography, etc.

Appropriate compounds, especially complexes, comprising Ir or Pt, preferably iridium, are known to those skilled in the art. Particularly suitable compounds comprising platinum or iridium comprise, for example, ligands such as halides, preferably chloride, 1,5-cyclooctadiene (COD), cyclooctene (COE), phosphines, cyanides, alkoxides, pseudohalides and/or alkyl.

Particularly preferred complexes comprising the appropriate metal, especially iridium, are selected from the group consisting of $[Ir(COD)Cl]_2$, $[Ir(COE)_2Cl]_2$ $IrCl_3 \times H_2O$, Ir(acac)$_3$, $Ir(COD)_2BF_4$, $Ir(COD)_2$BARF (BARF=tetrakis[3,5-bis(trifluoromethyl)phenyl]borate)), $Pt(COD)Cl_2$, $Pt(acac)_2$, $[Pt(C_6H_{10})Cl_2]_2$, $K_2PtCl_6$, $Pt(pyridine)_2Cl_2$, $[PtMe_2(SMe_2)]_2$, $Pt(SMe_2)_2Cl_2$, $Pt(SEt_2)_2Cl_2$, Pt(phenanthroline)$Cl_2$, $Pt(NH_3)_2Cl_2$ and mixtures thereof.

The carbene ligand precursors are deprotonated, preferably before the reaction, for example, by basic compounds known to those skilled in the art, for example basic metalates, basic metal acetates, acetylacetonates or alkoxides, or bases such as KO$^t$Bu, NaO$^t$Bu, LiO$^t$Bu, NaH, silylamides, $Ag_2O$ and phosphazene bases. Particular preference is given to deprotonating with $Ag_2O$ to obtain the corresponding Ag-carbene, which is reacted with the compound comprising M to give the inventive complexes.

Particularly preferably, the carbene can be released from precursors of the carbene ligands by removing volatile substances, for example lower alcohols.

The process according to the invention for preparing the metal carbene complexes comprising at least one ligand of formula (I) according to the present invention using the compounds of the general formula (XX) has the advantage that the compounds of the general formula (XXA), preferably (XX) are stable intermediates which can be handled readily and can be isolated under standard laboratory conditions. In addition, the compounds of the general formula (XXA), preferably (XX) are soluble in customary organic solvents, such that the preparation of the inventive metal carbene complexes comprising at least one ligand of formula (A), preferably of formula (I) in homogeneous solution is possible, such that a workup of the desired product, i.e. of the metal carbene complexes comprising at least one ligand of formula (A), preferably of formula (I) is more readily possible, for example for isolation and/or purification.

The contacting is preferably effected in a solvent. Suitable solvents are known per se to those skilled in the art and are preferably selected from the group consisting of aromatic or aliphatic solvents, for example benzene, toluene, xylene or mesitylene, cyclic or acyclic ethers, for example dioxane or THF, alcohols, esters, amides, ketones, nitriles, halogenated compounds and mixtures thereof. Particularly preferred solvents are toluene, xylenes, mesitylene and dioxane.

The molar ratio of metal-noncarbene complex used to carbene ligand precursor used is generally 1:10 to 10:1, preferably 1:1 to 1:6, more preferably 1:2 to 1:5.

The contacting is generally effected at a temperature of 20 to 200° C., preferably 50 to 150° C., more preferably 60 to 150° C.

The reaction time depends on the desired carbene complex and is generally 0.02 to 50 hours, preferably 0.1 to 24 hours, more preferably 1 to 24 hours.

The metal carbene complexes comprising at least one ligand of formula (A), preferably of formula (I) obtained after the reaction can optionally be purified by processes known to those skilled in the art, for example washing, crystallization or chromatography, and optionally isomerized under conditions likewise known to those skilled in the art, for example with acid mediation, thermally or photochemically.

Suitable processes for preparing the metal carbene complex comprising at least one ligand of formula (A), preferably of formula (I) are for example mentioned in WO 2011/073149 and EP13174779.

The resulting complexes may yield different isomers that can be separated or converted into a form with a major isomer by isomerization of the mixture.

(b) Post Functionalization

It is also possible to insert the radical $R^5$—if present—by post-functionalization of the metal carbene complex (which does not comprise a residue $R^5$). In the case of inventive heteroleptic metal carbene complexes comprising a ligand L selected from the ligands (X-1), (X-2), (X-3) or (X-4), comprising a substitutable position $R^5$ (the position $R^5$ is shown in the ligands (X-1'), (X-2'), (X-3') or (X-4')), in general, also the position $R^5$ in said ligand L is post-functionalized at the same time.

The post-functionalization is exemplified in the following for ligands of formula (I), wherein Z—as mentioned in the ligands of formula (A)—is $NR^x$. However, a person skilled in the art knows that the post-functionalization steps can be easily transferred to prepare ligands of formula (A), wherein Z is O or S.

The present invention therefore further provides a process for preparing a metal carbene complex according to the present invention, comprising at least one ligand of formula (I')

(I')

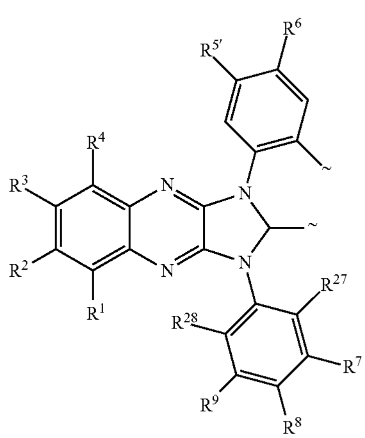

wherein the residues $R^1$, $R^2$, $R^3$, $R^4$, $R^6$, $R^7$, $R^8$, $R^9$, $R^{27}$ and $R^{28}$ have been defined before, and $R^{5'}$ is a $C_1$-$C_{18}$alkyl group, which can optionally be substituted by at least one substituent E and/or interrupted by D; a $C_3$-$C_{12}$cycloalkyl group, which can optionally be substituted by at least one substituent E; a $C_6$-$C_{14}$aryl group, which can optionally be substituted by at least one substituent G; a —N($C_6$-$C_{14}$aryl)$_2$ group, which can optionally be substituted by at least one substituent G; or a heteroaryl group comprising 3 to 11 ring atoms, which can optionally be substituted by at least one substituent G, interrupted by at least one of O, S and N;

comprising reacting metal carbene complex, wherein the metal is selected from Ir and Pt, comprising at least one ligand of formula of formula (III)

(III)

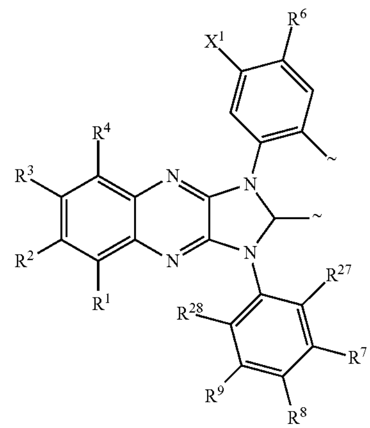

with a compound of formula (IV) corresponding to the respective Y-substituted residue $R^{5'}$:

$R^{5'}$—Y (IV)

wherein $X^1$ is Cl, Br, or I, especially Br;

Y is —B(OH)$_2$, —B(OY$^1$)$_2$,

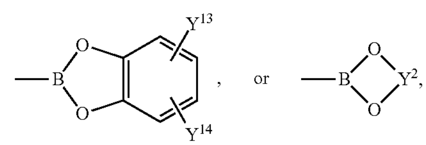

wherein $Y^1$ is a $C_1$-$C_{10}$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, —$CH_2C(CH_3)_2CH_2$—, or —$C(CH_3)_2CH_2C(CH_3)_2$—, and $Y^{13}$ and $Y^{14}$ are independently of each other hydrogen, or a $C_1$-$C_{10}$alkyl group;

—$SnR^{307}R^{308}R^{309}$, wherein $R^{307}$, $R^{308}$ and $R^{309}$ are identical or different and are H or $C_1$-$C_6$alkyl, wherein two radicals optionally form a common ring and these radicals are optionally branched or unbranched;

$ZnR^{310}R^{311}$, wherein $R^{310}$ is halogen and $R^{311}$ is a $C_1$-$C_{10}$alkyl group, a $C_6$-$C_{12}$aryl group, or $C_1$-$C_{10}$alkenyl group; or $SiR^{312}R^{313}R^{314}$, wherein $R^{312}$, $R^{313}$ and $R^{314}$ are identical or different and are halogen, or $C_1$-$C_6$alkyl.

Preferred residues $R^{5'}$ are:

a $C_1$-$C_{12}$alkyl group, which can optionally be substituted by E and/or interrupted by D; a $C_3$-$C_{12}$cycloalkyl group, which can optionally be substituted by E;

or $R^{5'}$, is a group of formula

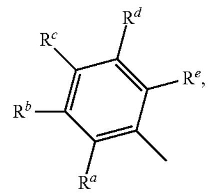

$R^a$ is H, a $C_1$-$C_5$alkyl group, a fluoro$C_1$-$C_4$alkyl group, or a $C_3$-$C_6$cycloalkyl group; preferably H, a $C_1$-$C_5$alkyl group, $C_3$-$C_6$cycloalkyl group; more preferably H, or a $C_1$-$C_5$alkyl group;

$R^e$ is H, a $C_1$-$C_5$alkyl group, a fluoro$C_1$-$C_4$alkyl group, or a $C_3$-$C_6$cycloalkyl group; preferably H, a $C_1$-$C_5$alkyl group, $C_3$-$C_6$cycloalkyl group; more preferably H, or a $C_1$-$C_5$alkyl group;

$R^c$, $R^b$ and $R^d$ are independently of each other hydrogen; a $C_1$-$C_{18}$alkyl group, which can optionally be substituted by E and/or interrupted by D; a $C_3$-$C_{12}$cycloalkyl group, which can optionally be substituted by G; a $C_6$-$C_{14}$aryl group, which can optionally be substituted by G; or a $C_2$-$C_{30}$heteroaryl group, which can optionally be substituted by G; $C_1$-$C_8$haloalkyl such as $CF_3$; or $SiR^{80}R^{81}R^{82}$; preferably $R^c$, $R^b$ and $R^d$ are independently of each other H, a $C_1$-$C_5$alkyl group, $C_3$-$C_6$cycloalkyl group; more preferably H, or a $C_1$-$C_5$alkyl group;

or $R^c$ and $R^b$, or $R^a$ and $R^b$ together form a group of formula

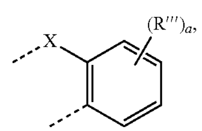

wherein X is O, S, $NR^{75}$ or $CR^{73}R^{74}$; R''' is $C_1$-$C_8$alkyl and a is 0, 1 or 2, preferably 0 or 1, more preferably 0.

More preferably, $R^{5'}$ is a $C_1$-$C_8$alkyl group, which can optionally be substituted by at least one substituent E and/or interrupted by D; or $R^{5'}$ is a $C_3$-$C_6$cycloalkyl group, which can optionally be substituted by at least one substituent E; or a phenyl group, which can optionally be substituted by one or two groups G.

Most preferably, $R^{5'}$ is a $C_1$-$C_8$alkyl group, which can optionally be substituted by at least one substituent E; or a $C_3$-$C_6$cycloalkyl group, which can optionally be substituted by at least one substituent E; or a phenyl group, which can optionally be substituted by one or two groups G.

Suitable and preferred groups E, D and G are mentioned before.

Preferred residues $R^1$, $R^2$, $R^3$, $R^4$, $R^6$, $R^7$, $R^8$, $R^9$, $R^{27}$ and $R^{28}$ have also been defined before.

Preferred reactions for the introduction of the substituent $R^{5'}$ on the compound of formula (III) are in general metal catalyzed reactions and more specifically Suzuki, Ullmann, Negishi, Heck, Stille and Kumada coupling reactions (J. Hassan et al., Chemical Reviews 102 (2002) 5; L. Ackermann: "Modern Arylation Methods" (Ed.: L. Ackermann), Wiley-VCH, Weinheim, 2009).

Preferably, the inventive metal carbene complex of formula (I') comprising a residue $R^{5'}$ as mentioned above can be synthesized by one of the following coupling reactions:

i) Negishi coupling reaction using a compound of formula: $R^{5'}$—Y, wherein Y is $ZnR^{310}R^{311}$, wherein $R^{310}$ is halogen and $R^{311}$ is a $C_1$-$C_{10}$alkyl group, a $C_6$-$C_{12}$aryl group, or $C_1$-$C_{10}$alkenyl group. Reference is, for example, made to B. Vilas et al., Chem. Soc. Rev., 38 (2009) 1598-1607.

ii) Stille coupling reaction using a compound of formula: $R^{5'}$—Y, wherein Y is —$SnR^{307}R^{308}$ $R^{309}$, wherein $R^{307}$, $R^{308}$ and $R^{309}$ are identical or different and are H or $C_1$-$C_6$alkyl, wherein two radicals optionally form a common ring and these radicals are optionally branched or unbranched. Reference is, for example, made to J. K. Stille, Angew. Chem. 98 (1986) 504-519; P. Espinet et al., Angew. Chem. Int. Ed., 43 (2004) 4704-4734.

iii) Hiyama coupling reaction using a a compound of formula: $R^{5'}$—Y, wherein Y is $SiR^{312}R^{313}R^{314}$, wherein $R^{312}$, $R^{313}$ and $R^{314}$ are identical or different and are halogen, or $C_1$-$C_6$alkyl. Reference is, for example, made to T. Hiyama et al., Pure Appl. Chem. 66 (1994) 1471-1478 and T. Hiyama et al., Synlett (1991) 845-853.

iv) Suzuki coupling reaction using a a compound of formula: $R^{5'}$—Y, wherein Y is —$B(OH)_2$, —$B(OY^1)_2$,

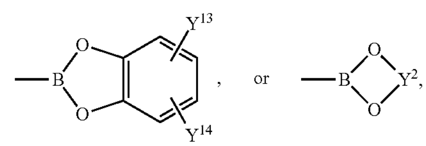

wherein $Y^1$ is a $C_1$-$C_{10}$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, —$CH_2C(CH_3)_2CH_2$—, or —$C(CH_3)_2CH_2C(CH_3)_2$—, and $Y^{13}$ and $Y^{14}$ are independently of each other hydrogen, or a $C_1$-$C_{10}$alkyl group. Reference is, for example, made to A. Suzuki et al., Chemical Reviews 95 (1995) 2457-2483, "Suzuki in Modern Arene Chemistry" (Ed.: D. Astruc), Wiley-VCH, Weinheim, 2002, pp. 53-106. More preferably Suzuki and Negishi coupling reactions are used. Suzuki type reactions are most preferred.

Preferably, the Suzuki reaction of compound (III) with compound (IV) is carried out in presence of a) a catalyst/ligand system comprising a palladium catalyst and an organic phosphine or phosphonium compound, b) a base, c) a solvent or a mixture of solvents.

The organic solvent is usually an aromatic hydrocarbon, a linear, branched, or cyclic ether, or a usual polar organic solvent, such as benzene, toluene, xylene, tetrahydrofurane, or dioxane, or mixtures thereof. If desired, water can be added to the organic reaction medium, in which case, depending on the organic solvent used, the reaction can be carried out in a single phase or in a two-phase mixture.

Usually, the amount of the solvent is chosen in the range of from 1 to 10 l per mol of boronic acid derivative.

Also preferred, the reaction is carried out under an inert atmosphere such as nitrogen, or argon.

Further, it is preferred to carry out the reaction in the presence of an aqueous base, such as an alkali metal hydroxide, metal phosphate, or carbonate such as NaOH, KOH, $K_3PO_4$, $Na_2CO_3$, $K_2CO_3$, or $Cs_2CO_3$.

Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein).

Usually, the molar ratio of the base to boronic acid or boronic ester derivative is chosen in the range of from 0.5:1 to 50:1, very especially in the range of 1:1 to 5:1.

Generally, the reaction temperature is chosen in the range of from 40 to 180° C., preferably under reflux conditions.

Generally, the reaction time is chosen in the range of from 0.5 to 80 hours, preferably from 2 hours to 60 hours.

In a preferred embodiment a usual catalyst for coupling reactions or for polycondensation reactions is used, preferably Pd-based, which is described in WO2007/101820. The palladium compound is added in a ratio of from 1:10000 to 1:50, preferably from 1:5000 to 1:200, based on the number of bonds to be closed. Preference is given, for example, to the use of palladium(II) salts such as $PdOAc_2$ or $Pd_2dba_3$ and to the addition of ligands selected from the group consisting of

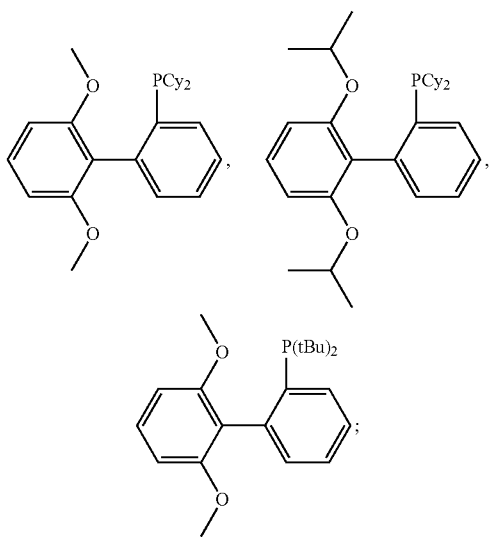

wherein

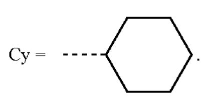

The ligand is added in a ratio of from 1:1 to 1:10, based on Pd. Also preferred, the catalyst is added as in solution or suspension. Preferably, an appropriate organic solvent such as the ones described above, preferably benzene, toluene, xylene, THF, dioxane, more preferably toluene, or mixtures thereof, is used. The amount of solvent usually is chosen in the range of from 1 to 10 l per mol of boronic acid derivative.

Other variations of reaction conditions are given by T. I. Wallow and B. M. Novak in J. Org. Chem. 59 (1994) 5034-5037; and M. Remmers, M. Schulze, G. Wegner in Macromol. Rapid Commun. 17 (1996) 239-252 and G. A. Molander und B. Canturk, Angew. Chem., 121 (2009) 9404-9425.

The following reaction systems are preferred:

i) aryl boronic acid, tris(dibenzylideneacetone) dipalladium (0), SPhos (Dicyclohexylphosphino-2',6'-dimethoxybiphenyl), tripotassium phosphate (solvent toluene/water mixture);

ii) aryl boronic acid, bis(tri-t-butylphosphin)palladium(0) ($Pd[P(tBu)_3]_2$), sodium hydroxide (solvent toluene/dioxane/water mixture); and iii) aryl boronic acid, palladium acetate ($Pd(OAc)_2$), SPhos (Dicyclohexylphosphino-2',6'-dimethoxybiphenyl), tripotassium phosphate (o-xylene mixture).

The metal carbene complex, wherein the metal is selected from Ir and Pt, comprising at least one ligand of formula of formula (III) can be obtained by reacting a metal carbene complex, wherein the metal is selected from Ir and Pt, comprising at least one ligand of formula of formula (III')

(III')

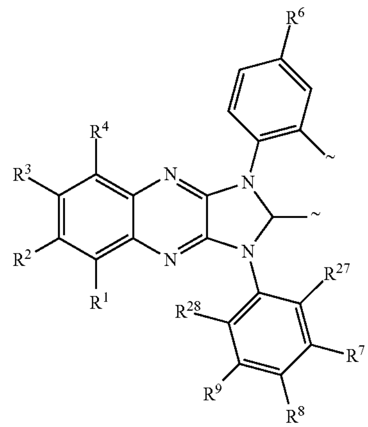

with a halogenating agent, wherein $R^1$, $R^2$, $R^3$, $R^4$, $R^6$, $R^7$, $R^8$, $R^9$, $R^{27}$ and $R^{28}$ have been defined before. The halogenation can be performed by methods known to those skilled in the art.

Halogenating agents according to the invention are the halogens $X_2$ or the interhalogens X—X and a base in a ratio of from 1:1 to 1:100 and optionally a Lewis acid in a ratio (halogen to Lewis acid) of from 1:0.1 to 1:0.0001, for example chlorine, bromine or iodine, or chlorine fluoride, bromine fluoride, iodine fluoride, bromine chloride, iodine chloride or iodine bromide, in combination with organic bases such as amines, for example triethylamine, tri-n-butylamine, diisopropylethylamine, morpholine, N-methylmorpholine and pyridine, or salts of carboxylic acids such as sodium acetate, sodium propionate, sodium benzoate, or inorganic bases such as sodium or potassium phosphate or hydrogenphosphate, potassium or sodium hydrogencarbonate, potassium or sodium carbonate, or else organic bromine complexes such as pyridinium perbromide, optionally each in combination with a Lewis acid, e.g. boron trifluoride, boron trifluoride etherate, boron trichloride, boron tribromide, boron triiodide, aluminum trichloride, aluminum tribromide, aluminum triiodide, iron(III) chloride, iron(III) bromide, zinc(II)chloride, zinc(II)bromide, tin(IV)chloride, tin(IV)bromide, phosphorus pentachloride, arsenic pentachloride and antimony pentachloride are used.

Further halogenating agents according to the invention are organic N—X compounds, such as 1-(chloromethyl)-4-fluoro-1,4-diazoniabicyclo[2.2.2]octane bis(tetrafluoroborate), or N-halocarboxamides such as N-chloro-, N-bromo- and N-iodoacetamide, N-chloro-, N-bromo- and N-iodopropionamide, N-chloro-, N-bromo- and N-iodobenzamide, or N-halocarboximides such as N-chloro-, N-bromo- and N-iodosuccinimide, N-chloro-, N-bromo- and N-iodophthalimide, or N,N-dihalohydantoins, such as 1,3-dibromo-5,5-dimethylhydantoin, 1,3-dichloro-5,5-dimethylhydantoin, 1,3-diiodo-5,5-dimethylhydantoin or N-dihalosulfonamides such as, benzenesulfo-N-dibromamide, or N-halosulfonamide salts such as chloramine B or T. In the case of these halogenating agents, the additive use of Lewis acids, as listed above, for example, may likewise be advantageous.

Preferred halogenating agents N-halocarboxamides such as N-chloro-, N-bromo- and N-iodosuccinimide, N-chloro-, N-bromo- and N-iodophthalimide, or N,N-dihalohydantoins, such as 1,3-dibromo-5,5-dimethylhydantoin, 1,3-dichloro-5,5-dimethylhydantoin and 1,3-diiodo-5,5-dimethylhydantoin.

In the process according to the invention, a stoichiometric ratio or an excess of the halogenating agent based on the content of active halogen, to the ligands (III') is used, and can lead selectively to the ligands (III). Preferably a stoichiometric ratio up to a ratio of 2:1 of the halogenating agent based on the content of active halogen to the ligands (III') is used. More preferably a stoichiometric ratio is used.

Reaction media according to the invention are protic or aprotic, halogen-free or halogenated solvents, for example alcohols such as methanol, ethanol, propanol, butanol, polyhydric alcohols such as ethylene glycol, propyleneglycol, nitriles such as acetonitrile, propionitrile or benzonitrile, ethers such as diethyl ether THF or dioxane, aromatic hydrocarbons such as benzonitrile, nitrobenzene or chlorobenzene, N,N-dialkylamides such as dimethylformamide, methylacetamide or N-methylpyrroldinone, sulfoxides, such as dimethyl sulfoxide, sulfones such as dimethylsulfone or sulfolane, halogenated hydrocarbons such as dichloromethane, trichloromethanen, 1,1-dichloroethane, 1,2-dichloroethane, 1,1,2,2-tetrachloroethane. Preference is given to aromatic or chlorinated solvents.

According to the invention, the concentration of the metal carbene complex comprising at least one ligand of formula (III') is in the range from 0.0005 mol/l to 2 mol/l, more preferably in the range from 0.002 mol/l to 0.1 mol/l.

According to the invention, the metal carbene complex comprising at least one ligand of formula (III') may be dissolved or suspended in the reaction medium.

According to the invention, the reaction is carried out in the temperature range from −78° C. to 150° C., preferably at from 0° C. to 80° C., more preferably at from 0° C. to 40° C.

According to the invention, the reaction is carried out within from 1 h to 100 hours, preferably within from 3 h to 60 h.

Brominating in the 3 position of the cyclometallating N-aryl group of the imidazo-quinoxaline carbene ligand can be, for example, accomplished by reaction of the metal carbene complex comprising at least one ligand of formula (III') with N-bromosuccinimide in dichloromethane.

Iodinating in the 3 position of the cyclometallating N-aryl group of the imidazo-quinoxaline carbene ligand can be, for example, accomplished by reaction of the metal carbene complex comprising at least one ligand of formula (III') with N-iodosuccinimide in dichloromethane.

(c) Preparation of Imidazo-Quinoxaline Carbene Ligands

The imidazo-quinoxalines which form the basis for the imidazo-quinoxaline carbene ligands in the metal carbene complexes of the present invention are commercially available or prepared by methods known in the art and for example described in Saravanakumar et al., Chem. Commun. 2006, 640-642; Al-Raqa et al., Heteroatom Chem. 17: 634-647, 2006; El-Sharief et al., Heteroatom Chem. 16: 218-225, 2005; Phukan et al., J. Org. Chem. 2013, 78, 11032-11039; JP-A 2000-121807; and Semenov et al., Russian Journal of Organic Chemistry, 2010, Vol. 46, No. 3, pp. 439-443.

Exemplary examples for the preparation of inidazo-quinoxaline ligands are shown in the experimental part of the present application.

Organic Electronic Devices

The inventive metal carbene complexes can be used in organic electronic devices. Suitable organic electronic devices are selected from organic light-emitting diodes (OLEDs), organic photovoltaic cells (OPVs), organic field-effect transistors (OFETs) and light-emitting electrochemical cells (LEECs), preference being given to OLEDs.

The inventive metal carbene complexes are generally notable for improved device performance such as high external quantum efficiency, high luminous efficacy and low voltage, green to yellow emission, decreased lifetime of the luminescence τ (higher radiation rate $k_{rad}$), reduced color-shift (e.g. CIE-y shift) with increasing doping concentration, or long device lifetime and/or excellent thermal stability. The inventive metal-carbene complexes are therefore suitable with particular preference as emitter material in OLEDs The present invention therefore concerns an organic electronic device, comprising at least one metal carbene complex according to the present invention.

In a preferred embodiment, the organic electronic device is an OLED. The present application therefore further provides an OLED comprising at least one inventive metal carbene complex. The inventive metal carbene complex is used in the OLED preferably as an emitter, matrix material, charge transport material, especially hole transport material, and/or charge blocker, more preferably as an emitter and/or hole transport material, most preferably as emitter.

In a further embodiment, the inventive metal carbene complex is used in the OLED as an electron transport material or as an electron transport material and a hole transport material.

The present application also provides for the use of the inventive metal carbene complexes in OLEDs, preferably as emitter, matrix material, charge transport material, especially hole transport material, and/or charge blocker, more preferably as emitter and/or hole transport material, most preferably as emitter.

The at least one inventive metal carbene complex is more preferably present in the light-emitting layer of an OLED, most preferably as emitter. The present application therefore also provides for a light-emitting layer comprising at least one inventive metal carbene complex, preferably as emitter. More preferably, the light-emitting layer additionally comprises at least one host material. Most preferably, the light-emitting layer additionally comprises two host materials.

In a further embodiment, the present invention relates to a light-emitting layer consisting of at least one inventive metal carbene complex.

Organic light-emitting diodes are in principle formed from a plurality of layers, e.g.:

(a) an anode,
(b) optionally a hole injection layer,
(c) optionally a hole transport layer,
(d) optionally an electron/exciton blocking layer
(e) a light-emitting layer,
(f) optionally a hole/exciton blocking layer,
(g) optionally an electron transport layer,
(h) optionally an electron injection layer, and
(i) a cathode.

It is, however, also possible that the OLED does not comprise all of the layers mentioned; for example, an OLED comprising layers (a) (anode), (e) (light-emitting layer) and (i) (cathode) is likewise suitable, in which case the functions of layers (c) (hole-transport layer) and (g) (electron-transport layer) are assumed by the adjoining layers. OLEDs comprising layers (a), (c), (e), (g) and (i) or (a), (c), (e) and (i) or layers (a), (e), (g) and (i) or (a), (b), (c), (d), (e), (g), (h) and (i) or (a), (b), (c), (e), (g), (h) and (i) or (a), (b), (c), (d), (e), (g) and (i) are likewise suitable.

The individual layers among the aforementioned layers of the OLED may in turn be formed from two or more layers. For example, the hole-transport layer may be formed from one layer, into which holes are injected from the electrode, and a layer which transports the holes away from the hole-injecting layer into the light-emitting layer. The electron-transport layer may likewise consist of a plurality of layers, for example of a layer in which electrons are injected through the electrode and a layer which receives electrons from the electron-injecting layer and transports them into the light-emitting layer. These layers mentioned are each selected according to factors such as energy level, thermal resistance and charge carrier mobility, and also energy difference of the layers mentioned with the organic layers or the metal electrodes. The person skilled in the art is capable of selecting the construction of the OLEDs such that it is matched optimally to the inventive metal-carbene complexes, preferably used as emitter substances in accordance with the invention.

In order to obtain particularly efficient OLEDs, the HOMO (highest occupied molecular orbital) of the hole-transport layer should be aligned to the work function of the anode, and the LUMO (lowest unoccupied molecular orbital) of the electron-transport layer should be aligned to the work function of the cathode.

Suitable materials for the aforementioned layers (anode, cathode, hole and electron injection materials, hole and electron transport materials and hole and electron blocker materials, matrix materials, fluorescence and phosphorescence emitters) are known to those skilled in the art and are specified, for example, in H. Meng, N. Herron, *Organic Small Molecule Materials for Organic Light-Emitting Devices* in *Organic Light-Emitting Materials and Devices*, eds: Z. Li, H. Meng, Taylor & Francis, 2007, Chapter 3, pages 295 to 411 as well as in US2012/0104422, D. J. Gaspar, E Polikarpov, OLED Fundamentals: Materials, Devices, and Processing of Organic Light-Emitting Diodes, CRC Press, Taylor & Francis, 2015, and Z. R. Li, Organic Light-Emitting Materials and Devices, CRC Press, Taylor & Francis, 2015.

In addition, it is possible that some or all of the layers (b) to (h) have been surface-treated in order to increase the efficiency of charge carrier transport. The selection of the materials for each of the layers mentioned is preferably determined by obtaining an OLED having a high efficiency.

The inventive metal carbene complexes are preferably used as emitter molecules and/or matrix materials in the light-emitting layer (e). The inventive metal-carbene complexes may—in addition to use as emitter molecules and/or matrix materials in the light-emitting layer (e) or instead of use in the light-emitting layer—also be used as a charge transport material in the hole-transport layer (c) or in the electron-transport layer (g) and/or as a charge blocker, preference being given to use as a charge transport material in the hole-transport layer (c) (hole transport material).

In a further embodiment, the inventive metal carbene complex is used as an electron transport material, or as an electron transport material and a hole transport material.

Light-Emitting Layer (e)

Emitter

Suitable emitter materials for OLEDs are known by a person skilled in the art. The light-emitting layer preferably comprises at least one phosphorescent emitter. Phosphorescent emitter are preferred because of the higher luminescent efficiencies associated with such materials. The light-emitting layer preferably also comprises at least one host material. Preferably, the host material is capable of transporting electrons and/or holes, doped with an emitting material that may trap electrons, holes, and/or excitons, such that excitons relax from the emissive material via a photoemissive mechanism. In a preferred embodiment, the light emitting layer comprises the emitter and two host materials. In this case the two host materials both contribute to the transport of electrons and/or holes. By adjusting the mixing ratio of the two host materials, the optimal charge carrier balance and thus the optimal device performance in terms of voltage, lifetime, efficiency and/or color can be achieved.

It is an object of the present invention to provide organic electronic devices, preferably OLEDs, having—compared with the organic electronic devices known in the art—a high color purity in the green to yellow region of the visible electromagnetic spectrum, a high efficiency, low voltage and/or improved lifetime/stability to provide organic electronic devices, preferably OLEDs, having—compared with the organic electronic devices known in the art—a high color purity in the green to yellow region of the visible electromagnetic spectrum, a high efficiency, low voltage and/or improved lifetime/stability.

The emitter in the OLED of the present invention is therefore preferably a phosphorescent emitter emitting light in the green to yellow region of the visible electromagnetic spectrum ("phosphorescent green emitter").

The term "phosphorescent green emitter" as used herein refers to a yellow or green phosphorescent emitter having an emission maximum ($\lambda_{max}$), which is located at 510 nm to 590 nm, preferably at 515 nm to 570 nm.

Suitable phosphorescent green emitters are known in the prior art, for example in Baldo et al., Applied Physics Letters, vol. 75, No. 1, 5 Jul. 1999, 4-6, US 2011/0227049 A1, US 2014/0203268 A1, US 2013/0341609, US 2013/0181190, US 2013/0119354, WO 2012/053627 A1, and WO 2013/112557, Preferably, the inventive metal carbene complexes are used as emitter. The light-emitting layer (e) may comprise one or more of the inventive metal-carbene complexes as emitter material. Suitable and preferred inventive metal carbene complexes are mentioned above. It is also possible that the light-emitting layer comprises in addition to at least one inventive metal carbene complex one or more further emitters.

The light-emitting layer preferably comprises beside at least one emitter material (suitable emitter materials are mentioned above), preferably at least one metal carbene complex according to the present invention, at least one host material.

Suitable host materials are known by a person skilled in the art. Preferred host materials are mentioned below.

Host

For efficient light emission the triplet energy of the host material has to be about 0.2 eV larger than the triplet energy of the phosphorescent emitter (preferably the metal carbene complex according to the present invention) used. Hence, all host materials fulfilling this requirement are, in principle, suitable as host compound.

Suitable host materials for phosphorescent green to yellow emitters are, for example, described in EP2363398A1, WO2008/031743, WO2008/065975, WO2010/145991, WO2010/047707, US2009/0283757, US2009/0322217, US2010/0001638, WO2010/002850, US2010/0060154, US2010/0060155, US2010/0076201, US2010/0096981, US2010/0156957, US2011/186825, US2011/198574, US2011/0210316, US2011/215714, US2011/284835, and WO2012/045710. Further suitable host materials for phosphorescent green to yellow emitters are, for example, described in WO2012/004765 and US2011/0006670 (e.g. SH-2 Host), US2014/0001446 and WO2015/014791. The host material may be a compound having hole-transporting property and/or an organic compound having electron-transporting property. Preferably, the host material is an organic compound or organometallic compound having hole-transporting property. Alternatively the host compound may be a mixture of an organic compound or organometallic compound having hole-transporting property and an organic compound or organometallic compound having electron-transporting property. In principle, any organic compound or organometallic compound having hole-transporting property or having electron-transporting property and sufficient triplet energy can be used as host in the light-emitting layer. In a preferred embodiment, it is also possible to combine an organic compound or organometallic compound having both hole- and electron-transporting property and an organic compound or organometallic compound having either hole- or electron-transporting properties as hosts. Both materials can be processed from separate sources or as one pre-mixed host-compound.

Examples of organic compounds which can be used for the host material include a carbazole derivative such as 4, 4'-di(carbazolyl)biphenyl (abbreviation: CBP), 1,3-bis(carbazolyl)benzene (abbreviation: mCP) or 1,3,5-tris(N-carbazolyl)benzene (abbreviation: TCzB), =DNTPD.

Examples of organometallic compounds which can be used for the host material include iridium carbene complexes. Suitable iridium carbene complexes are, for example, iridium carbene complexes as described in WO2005/019373A2, WO2006/056418 A2, WO2007/115970, WO2007/115981, WO2008/000727, WO2012/121936A2, US2012/0305894A1, and WO2012/172482A1. Examples of suitable iridium carbene complexes are Ir(DPBIC)$_3$ with the formula:

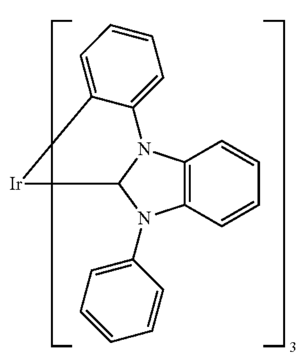

(HTM-1) and Ir(ABIC)$_3$ with the formula:

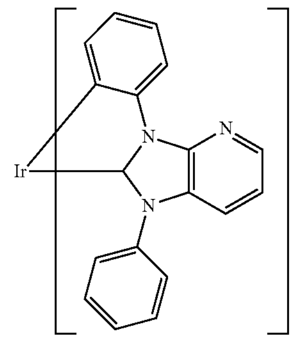

(HTM-2).

Further suitable host materials are the compounds described in WO2010/079051 (in particular pages on 19 to 26 and in the tables on pages 27 to 34, pages 35 to 37 and pages 42 to 43).

Also preferred as host compounds in the OLED and in the light-emitting layer of the present invention are the compounds mentioned in WO2012/130709; WO2013/050401; WO2014/009317; WO2014/044722; and the non-published European Patent Application EP13191100.0.

Further preferred host materials are binary host systems as described in WO2011/136755; the hosts described in WO2013/022419 and WO2013/112557; triphenylene derivatives for example as described in WO2010/028151, WO2010/002850, WO2010/0056669, US2010/0244004, US2011/0177641, US2011/022749, WO2011/109042, and WO2011/137157; azaborinine compounds for example as described in WO2011/143563; bicarbazole compounds for example as described in WO2012/023947; carbazolephenyl-pyridine, -pyrimidine and -triazine compounds for example as described in WO2012/108879; biscarbazolephenyl-pyridine, -pyrimidine and -triazine compounds for example as described in WO2012/108881; dibenzoquinoxaline compounds for example as described in US2011/0210316; triazole derivatives for example as described in US2011/0285276 and US2012/0025697; benzimidazole derivatives for example as described in US2011/0147792; heterocyclic compounds for example as described in US2012/0061651; phenanthrene derivatives for example as described in US2012/0104369; benzoxazole derivatives for example as described in US2012/0132896; oxazole derivatives for example as described in US2012/0130081; and carbazole-benzimidazole derivatives for example as described in US2012/0133274.

Further preferred host materials are described in US2011/0006670 (the SH-2 host is for example mentioned therein).

Especially suitable host materials are for example host materials described in WO2013/112557 having the following general formula:

(H1)

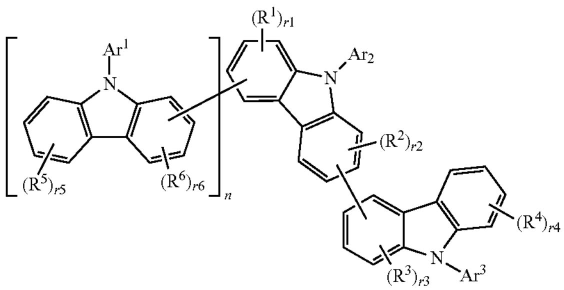

wherein $R^1$, $R^2$, R3, $R^4$, $R^5$, and $R^6$ may be the same or different fluorine atom, chlorine atom, a deuterium atom, a cyano group, a trifluoromethyl group, a nitro group, linear or branched $C_1$-$C_6$alkyl group, $C_5$-$C_{10}$cyclo-alkyl group, linear or branched $C_1$-$C_6$alkoxy group, $C_5$-$C_{10}$cyclo-alkoxy group, substituted or unsubstituted aromatic hydrocarbon group, substituted or unsubstituted aromatic heterocyclic group, substituted or unsubstituted condensed polycyclic aromatic group, r1, r4, r5 is 0, 1, 2, 3, or 4,
r2, r3, r6 is 0, 1, 2 or 3,
n is 0 or 1, and $Ar^1$, $Ar^2$, and $Ar^3$ may be the same or different, substituted or unsubstituted aromatic hydrocarbon group, substituted or unsubstituted aromatic heterocyclic group, substituted or unsubstituted condensed polycyclic aromatic group, deuterium substituted aromatic hydrocarbon group, deuterium substituted aromatic heterocyclic group, or deuterium substituted condensed polycyclic aromatic group.

When $Ar^1$, Ar2, or $Ar^3$ is a substituted aromatic hydrocarbon group, a substituted aromatic heterocyclic group, or a substituted polycyclic aromatic group, the substitution groups can be any non-carbon or carbon-containing functional group, such as, an aromatic hydrocarbon group, an aromatic heterocyclic group or a polycyclic aromatic group. For example, the substitution group on the aromatic ring structure of $Ar^1$, $A^2$, or $Ar^3$ can be

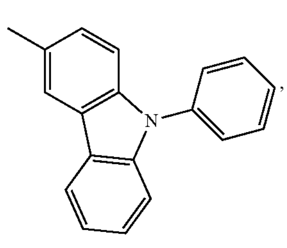

-continued

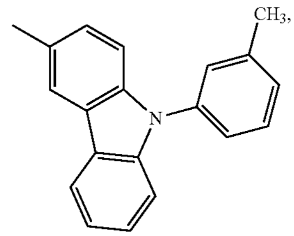

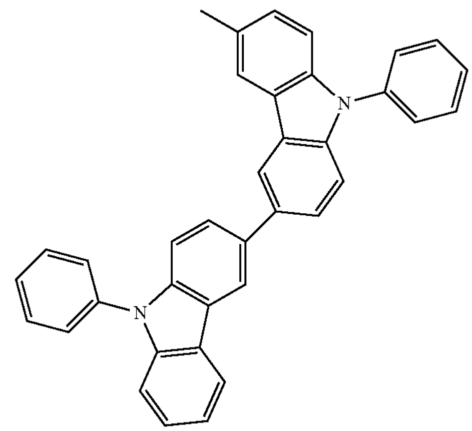

or the like.

Especially suitable are the compounds (H1-1), (H1-2), (H1-7) as mentioned below and the compounds (H1-3), (H1-4), (H1-5), (H1-6), (H1-8), (H1-9), (H1-10), (H1-11), (H1-12), (H1-13), (H1-14), (H1-14), (H-16) and (H1-17) as described in WO 2013/112557.

(H1-1)

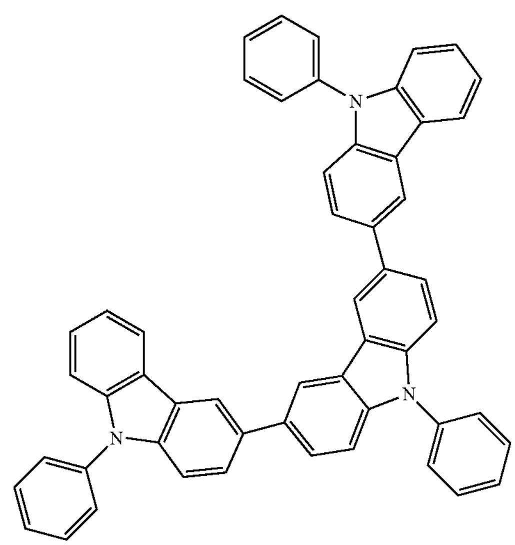

-continued (H1-2)

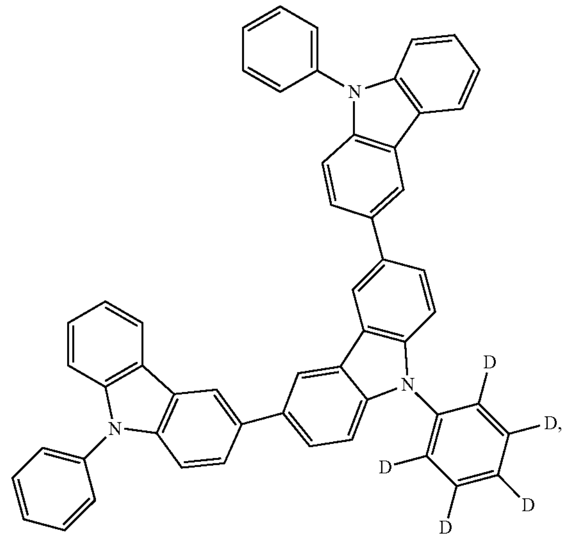

(H1-7)

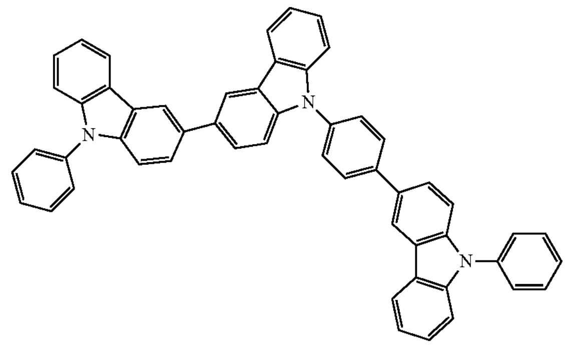

Further suitable host materials—which may be employed together with the host material mentioned before—are host materials containing at least one of the following groups in the molecule:

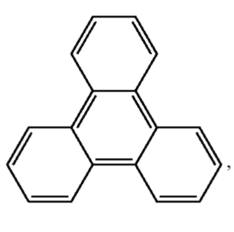

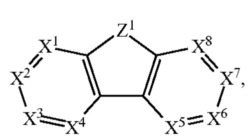

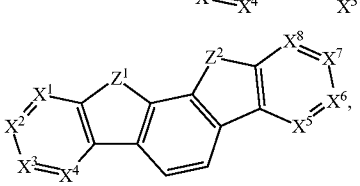

-continued

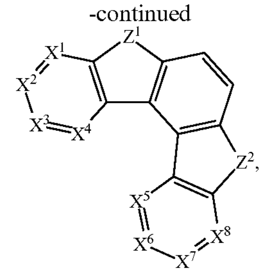

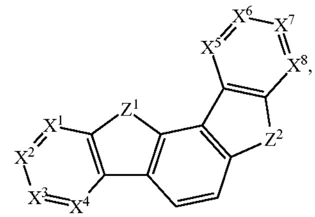

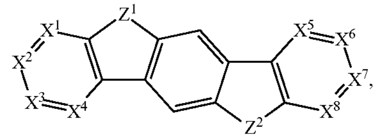

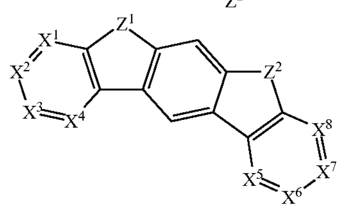

wherein $X^1$ to $X^8$ is selected from C or N; and wherein $Z^1$ and $Z^2$ is S or O.

The groups mentioned above may be unsubstituted or substituted by an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{=}CHC_nH_{2n+1}$, $A_1$, $Ar_1$-$Ar_2$, $C_nH_{2n-Ar1}$, wherein n is 1, 2, 3, 4, 5, 6, 7, 8, 9, or 10, and wherein $Ar_1$ and $Ar_2$ are independently selected from the group consisting of benzene, biphenyl, naphthalene, triphenylene, carbazole, and heteroaromatic analogs thereof.

Further suitable host compounds are compounds comprising a triphenylene containing benzo-fused thiophene. A combination of benzo-fused thiophenes and triphenylene as hosts in OLEDs may be beneficial. Therefore combining these two moieties in one molecule may offer improved charge balance which may improve device performance in terms of lifetime, efficiency and low voltage. Different chemical linkage of the two moieties can be used to tune the properties of the resulting compound to make it the most appropriate for a particular phosphorescent emitter, device architecture, and/or fabrication process. For example, m-phenylene linkage is expected to result in higher triplet energy and higher solubility whereas p-phenylene linkage is expected to result in lower triplet energy and lower solubility.

Similar to the characterization of benzo-fused thiophenes, benzo-fused furans are also suitable host materials. Examples of benzo-fused furans include benzofuran and dibenzofuran. Therefore, a material containing both triphenylene and benzofuran may be advantageously used as host material in OLEDs. A compound containing both of these two groups may offer improved electron stabilization which may improve device stability and efficiency with low voltage. The properties of the triphenylene containing benzofuran compounds may be tuned as necessary by using different chemical linkages to link the triphenylene and the benzofuran.

Benzo-fused furans are benzofurans and dibenzofurans. Benzo-fused thiophenes are benzothiophenes and dibenzothiophenes.

The benzo-fused thiophene and benzo-fused furans mentioned above may be unsubstituted or substituted for example by one or more unfused substituents independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{=}CHC_nH_{2n+1}$, $A_1$, $Ar_1$-$Ar_2$, $C_nH_{2n-Ar1}$, wherein n is 1, 2, 3, 4, 5, 6, 7, 8, 9, or 10, and wherein $Ar_1$ and $Ar_2$ are independently selected from the group consisting of benzene, biphenyl, naphthalene, triphenylene, carbazole, and heteroaromatic analogs thereof.

The substituents of the compounds described above are unfused such that the substituents are not fused to the triphenylene, benzo-fused furan or benzo-fused thiophene moieties of the compound. The substituents may optionally be inter-fused (i.e. fused to each other).

The benzo-fused thiophene and benzo-fused furans mentioned above are for example described in WO2013/112557 and in WO2009/021126.

Further suitable host materials for phosphorescent green emitters are mentioned in US2013/0181190, especially in table 3, and US2013/0119354, especially in table 4.

Specific examples of organic compounds which can be used for the host material include a compounds such as

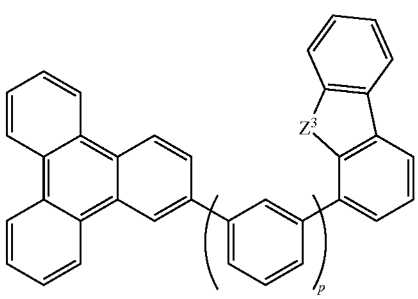

wherein $Z^3$ is O or S and p is 0 or 1, such as

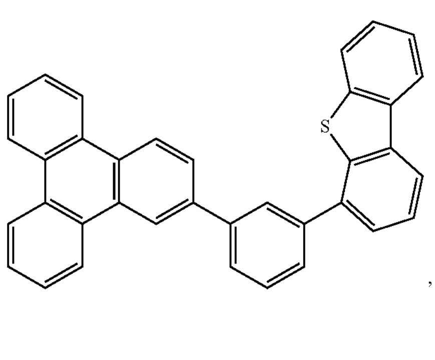

,

-continued

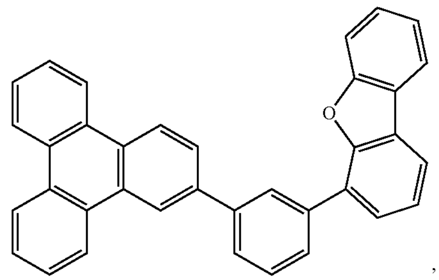

,

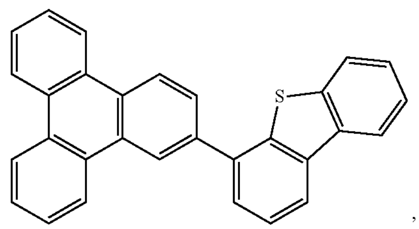

, or

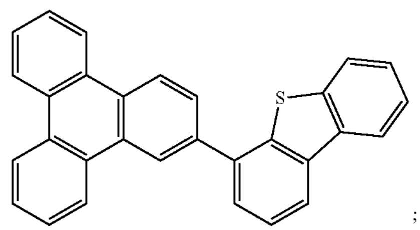

;

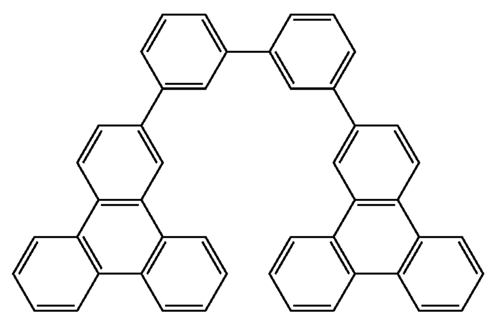

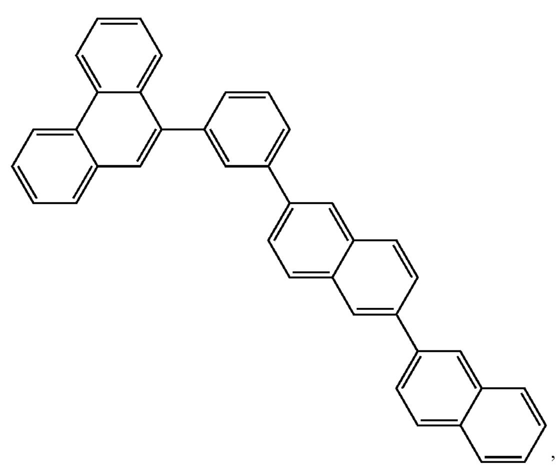

,

-continued
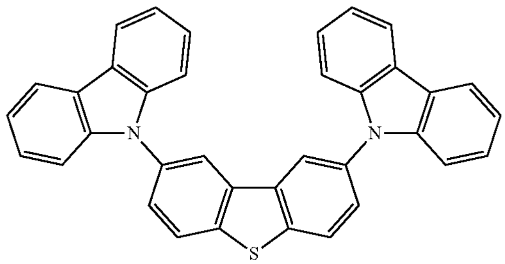
,
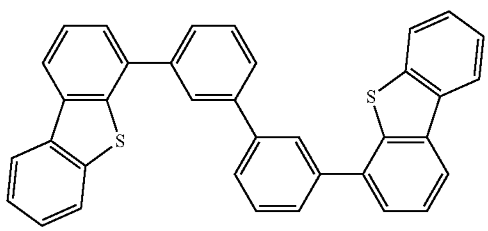
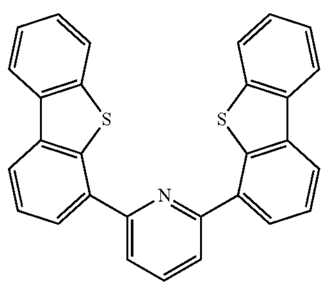
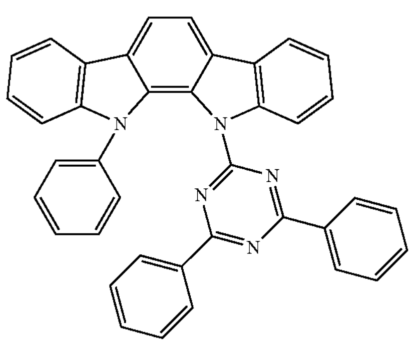
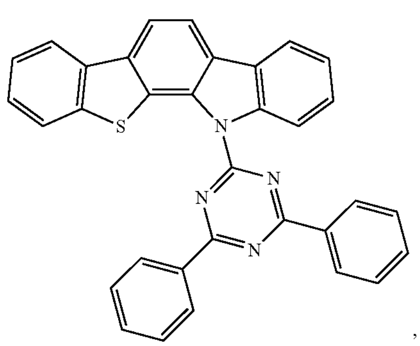
,
-continued
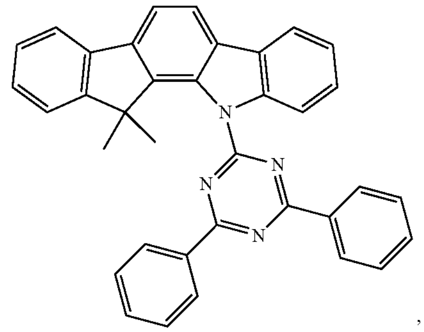
,
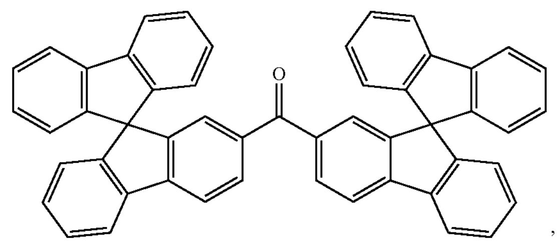
,
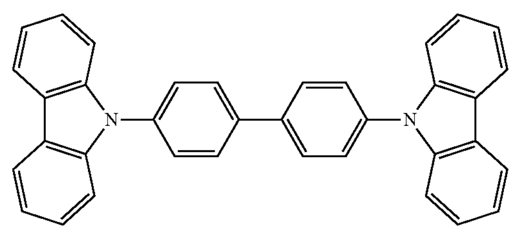
,
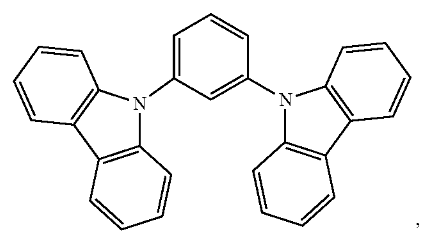
,
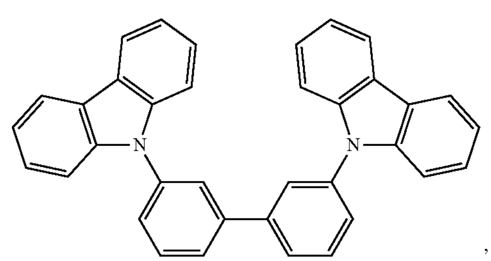
,
Further specific examples of organic compounds which can be used for the host material include the following compounds

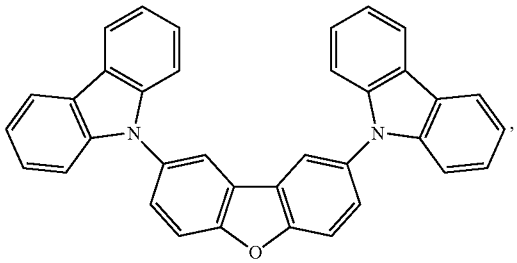

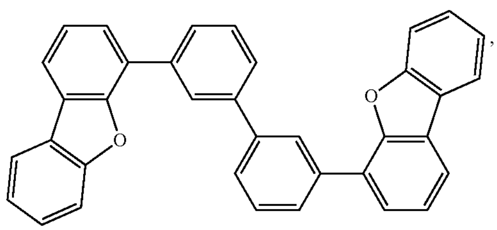

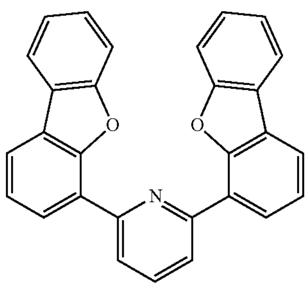

and

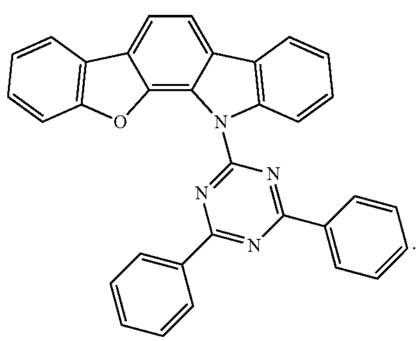

The host compound can be one compound or it can be a mixture of two or more compounds. Suitable mixtures are for example the binary hosts systems as described in WO2011/136755 and WO2013/112557.

A further suitable host material for the emitters of the present invention is mentioned in US2012/0235123 and US2011/0279020. A typical and preferred host material described in the documents mentioned before is

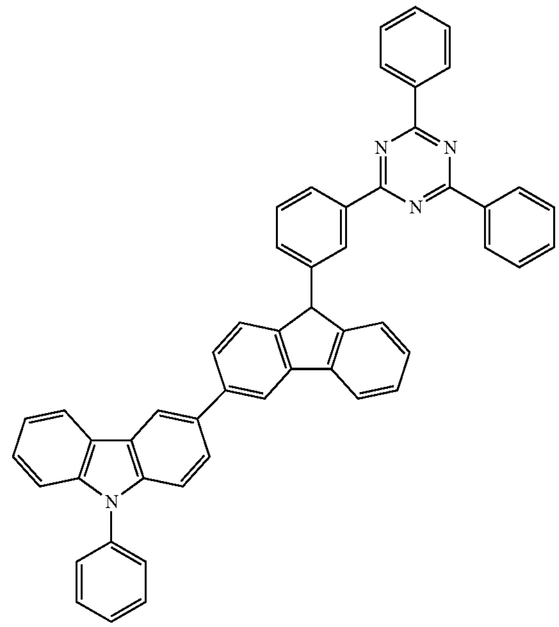 [SMILES: c1ccc(-c2nc(-c3ccccc3)nc(-c3cccc(C4c5ccccc5-c5cc(-c6ccc7c(c6)c6ccccc6n7-c6ccccc6)ccc54)c3)n2)cc1]

Additionally, as mentioned before, co-host systems are suitable as host material for the emitters of the present invention. A suitable co-host system is exemplified below. It is clear for a person skilled in the art that also similar co-host systems are suitable.

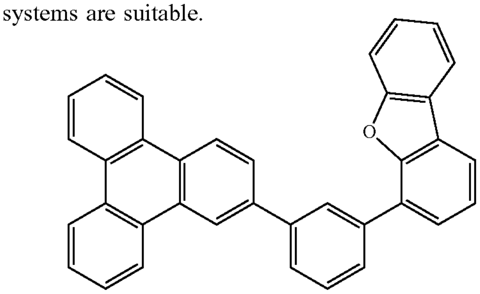

or

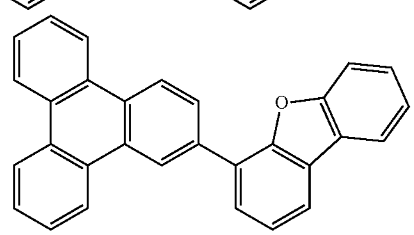

combined with

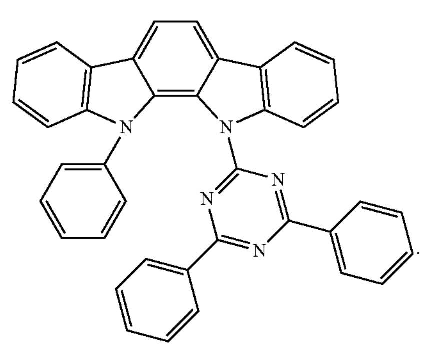 [SMILES: c1ccc(-c2nc(-c3ccccc3)nc(-n3c4ccccc4c4ccc5c6ccccc6n(-c6ccccc6)c5c43)n2)cc1]

In a preferred embodiment, the light-emitting layer (e) comprises the emitter in an amount of 2 to 40% by weight, preferably 5 to 35% by weight, more preferably 5 to 20% by weight and the host compound in an amount of 60 to 98% by weight, preferably 65 to 95% by weight, more preferably 80 to 95% by weight, where the amount of the phosphorescent emitter and the host compound adds up to a total of 100% by weight. The emitter may be one emitter or a combination of two ore more emitters. The host may be one host or a combination of two or more hosts. In a preferred embodiment, in case of the use of two host compounds they are mixed in a ratio of 1:1 to 1:30, more preferably 1:1 to 1:7, most preferably 1:1 to 1:3.

Anode (a)

The anode is an electrode which provides positive charge carriers. It may be composed, for example, of materials which comprise a metal, a mixture of different metals, a metal alloy, a metal oxide or a mixture of different metal oxides. Alternatively, the anode may be a conductive polymer. Suitable metals comprise the metals of groups 11, 4, 5 and 6 of the Periodic Table of the Elements, and also the transition metals of groups 8 to 10. When the anode is to be transparent, mixed metal oxides of groups 12, 13 and 14 of the Periodic Table of the Elements are generally used, for example indium tin oxide (ITO). It is likewise possible that the anode (a) comprises an organic material, for example polyaniline, as described, for example, in Nature, Vol. 357, pages 477 to 479 (Jun. 11, 1992). Preferred anode materials include conductive metal oxides, such as indium tin oxide (ITO) and indium zinc oxide (IZO), aluminum zinc oxide (AlZnO), and metals. Anode (and substrate) may be sufficiently transparent to create a bottom-emitting device. A preferred transparent substrate and anode combination is commercially available ITO (anode) deposited on glass or plastic (substrate). A reflective anode may be preferred for some top-emitting devices, to increase the amount of light emitted from the top of the device. At least either the anode or the cathode should be at least partly transparent in order to be able to emit the light formed. Other anode materials and structures may be used.

Hole Injection Layer (b)

Generally, injection layers are comprised of a material that may improve the injection of charge carriers from one layer, such as an electrode or a charge generating layer, into an adjacent organic layer. Injection layers may also perform a charge transport function. The hole injection layer may be any layer that improves the injection of holes from anode into an adjacent organic layer. A hole injection layer may comprise a solution deposited material, such as a spin-coated polymer, or it may be a vapor deposited small molecule material, such as, for example, CuPc or MTDATA. Polymeric hole-injection materials can be used such as poly(N-vinylcarbazole) (PVK), polythiophenes, polypyrrole, polyaniline, self-doping polymers, such as, for example, sulfonated poly(thiophene-3-[2[(2-methoxyethoxy)ethoxy]-2,5-diyl) (Plexcore® OC Conducting Inks commercially available from Plextronics), and copolymers such as poly(3,4-ethylenedioxythiophene)/poly(4-styrenesulfonate) also called PEDOT/PSS. Further suitable hole injection materials are mentioned in US2013/0181190, especially in table 3, and US2013/0119354, especially in table 4.

It is possible to use as hole injection materials p-doped layers. Suitable p-dopants are mentioned below concerning the hole transport layer. Examples for suitable p-dopants are $MoO_3$, F4-TCNQ or NDP-9. It is further possible to use layers of p-dopants itself. Suitable p-dopants are mentioned below concerning the hole transport layer. Examples for suitable p-dopants are $MoO_3$, F4-TCNQ or NDP-9.

Further suitable hole injection materials are described in US2006/0188745, US2006/0240280 and US2007/0092755, whereby the following material is an example for a preferred hole injection material:

(HAT-CN)

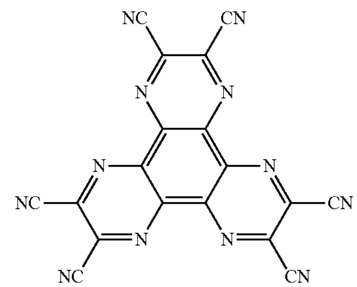

Further suitable hole injection materials are described in US2010/0219400, US2015/0073142 and US2015/0102331, whereby the following material is an example for a preferred hole injection material:

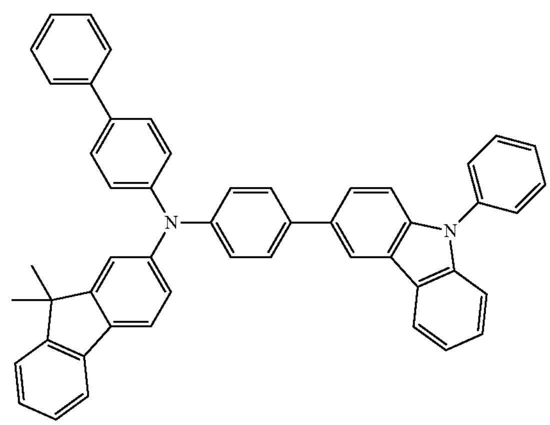

preferably doped with $MoO_3$, F4-TCNQ or NDP-9, more preferably doped with NDP-9.

The dopant NDP-9 is commercially available and for example described in EP 2 180 029. Further suitable hole injection materials are the following materials:

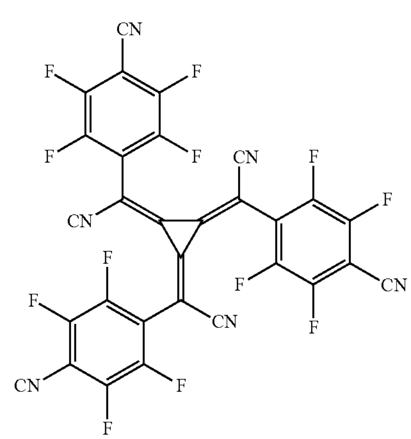

and

-continued

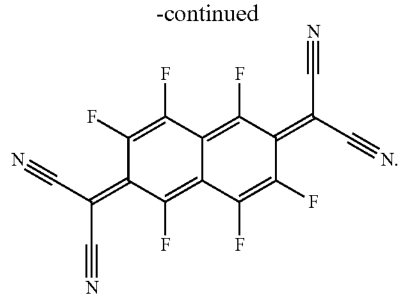

Further compounds suitable as hole injection material are for example mentioned in US2010/0044689 and US2014/0217392, e.g. the following compound

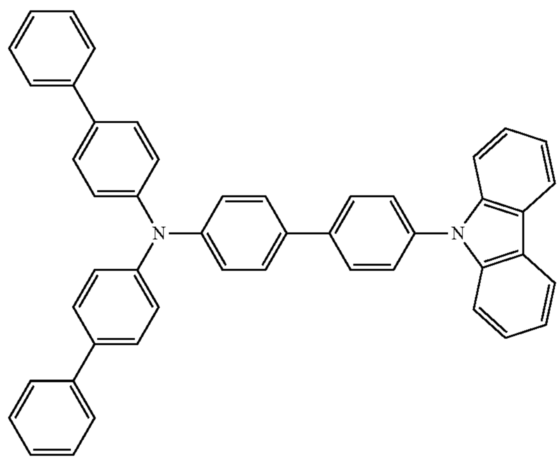 [SMILES: c1ccc(-c2ccc(N(c3ccc(-c4ccccc4)cc3)c3ccc(-c4ccc(-n5c6ccccc6c6ccccc65)cc4)cc3)cc2)cc1]

doped with a p-dopant. Suitable p-dopants are mentioned below concerning the hole transport layer. Examples for suitable p-dopants are $MoO_3$, F4-TCNQ or NDP-9.

Further compounds suitable as hole injection material are for example mentioned in US2010/0219400, US2015/0073142 and US2015/0102331, e.g. the following compound

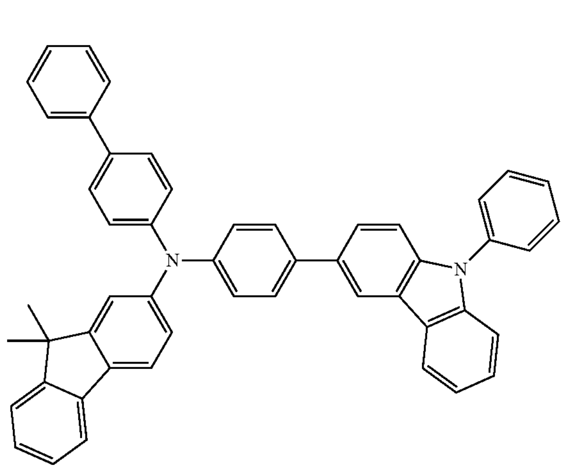 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

doped with a p-dopant. Suitable p-dopants are mentioned below concerning the hole transport layer. Examples for suitable p-dopants are $MoO_3$, F4-TCNQ or NDP-9.

Further compounds suitable as hole injection material are for example mentioned in US2008/0014464, e.g. the following compound

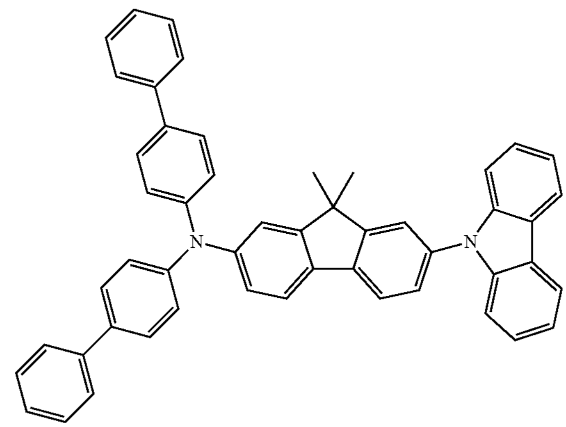 [SMILES: CC1(C)c2cc(N(c3ccc(-c4ccccc4)cc3)c3ccc(-c4ccccc4)cc3)ccc2-c2ccc(-n3c4ccccc4c4ccccc43)cc21]

doped with a p-dopant. Suitable p-dopants are mentioned below concerning the hole transport layer. Examples for suitable p-dopants are $MoO_3$, F4-TCNQ or NDP-9 (N,N'-Di(1-naphthyl)-N,N'-diphenyl-(1,1-biphenyl)-4,4'-diamine). F4-TCNQ:

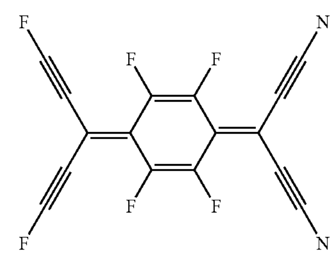 [SMILES: NC#CC(C#CN)=c1c(F)c(F)c(=C(C#CF)C#CF)c(F)c1F]

In addition to the hole injection materials mentioned above, the materials mentioned as hole transport materials in the hole transport layer are also useful as hole injection materials, especially in combination with a p-dopant, for example in combination with $MoO_3$, F4-TCNQ or NDP-9. Further suitable p-dopants are mentioned below (see hole transport layer (c)).

Hole Transport Layer (c)

Either hole-transporting molecules or polymers may be used as the hole transport material. Suitable hole transport materials for layer (c) of the inventive OLED are disclosed, for example, in Kirk-Othmer Encyclopedia of Chemical Technology, 4th Edition, Vol. 18, pages 837 to 860, 1996, US20070278938, US2008/0106190, US2011/0163302 (triarylamines with (di)benzothiophen/(di)benzofuran; Nan-Xing Hu et al. Synth. Met. 111 (2000) 421 (indolocarbazoles), WO2010/002850 (substituted phenylamine compounds), WO2012/16601 (in particular the hole transport materials mentioned on pages 16 and 17 of WO2012/16601), US2013/0181190, especially in table 3, and US2013/0119354, especially in table 4. Further suitable hole transport materials are mentioned in US20120223296. Combination of different hole transport material may be used. Reference is made, for example, to WO2013/022419, wherein (HTL1-1)
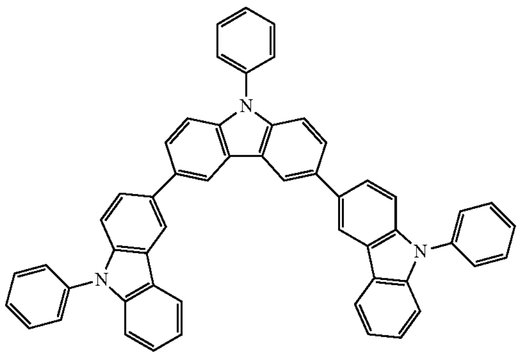
and
-continued
(HTL2-1)
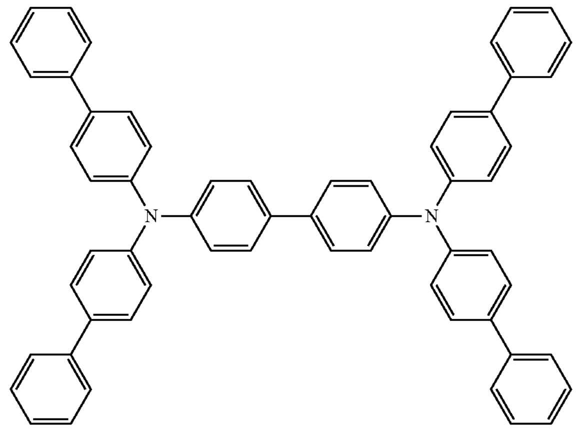
constitute the hole transport layer.
Customarily used hole-transporting molecules are selected from the group consisting of
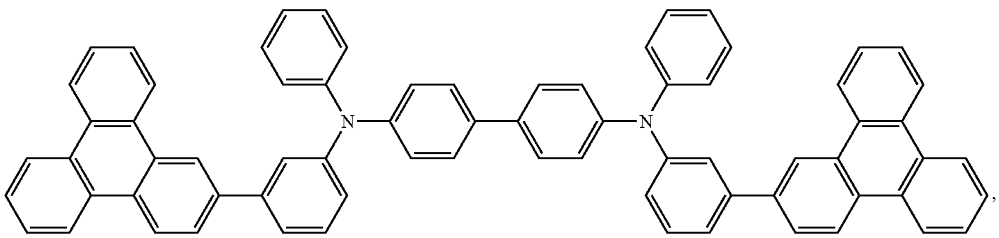
,
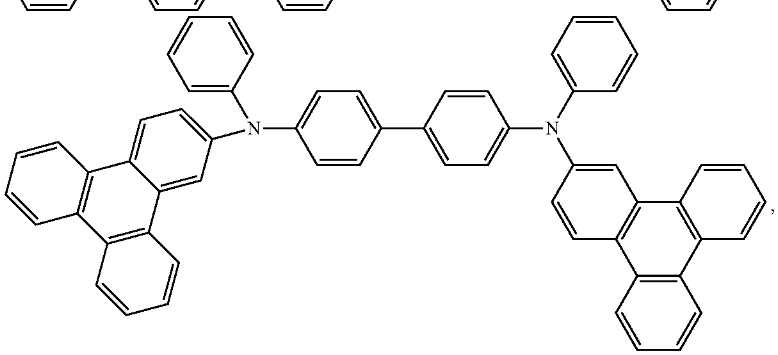
,
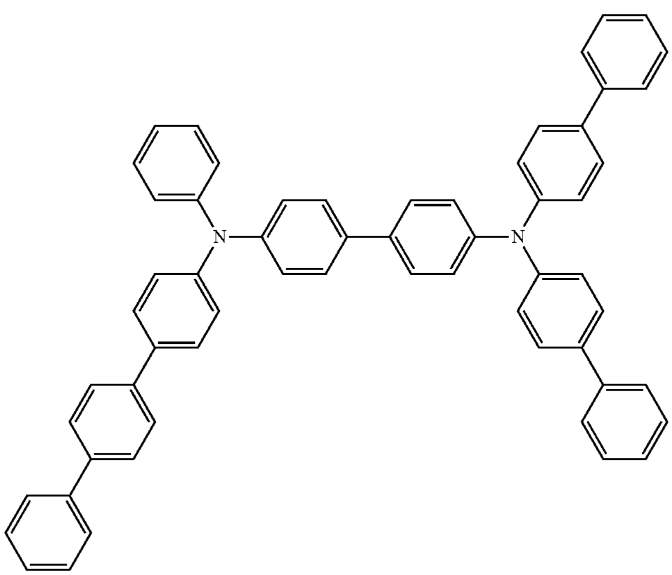

(4-phenyl-N-(4-phenylphenyl)-N-[4-[4-(N-[4-(4-phenylphenyl)phenyl]anilino)phenyl]phenyl]aniline),

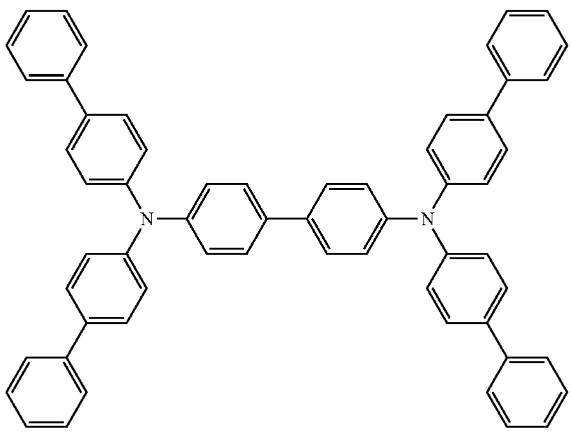 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

(4-phenyl-N-(4-phenylphenyl)-N-[4-[4-(4-phenyl-N-(4-phenylphenyl)anilino)phenyl]phenyl]aniline),

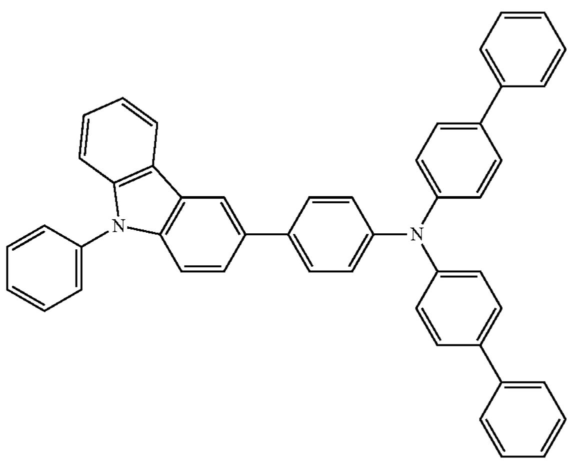 [SMILES: c1ccc(-c2ccc(N(c3ccc(-c4ccccc4)cc3)c3ccc(-c4ccc5c(c4)c4ccccc4n5-c4ccccc4)cc3)cc2)cc1]

(4-phenyl-N-[4-(9-phenylcarbazol-3-yl)phenyl]-N-(4-phenylphenyl)aniline),

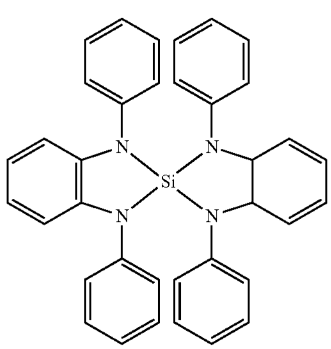 [SMILES: C1=CC2C(C=C1)N(c1ccccc1)[Si]1(N(c3ccccc3)c3ccccc3N1c1ccccc1)N2c1ccccc1]

(1,1',3,3'-tetraphenylspiro[1,3,2-benzodiazasilole-2,2'-3a,7a-dihydro-1,3,2-benzodiazasilole]),

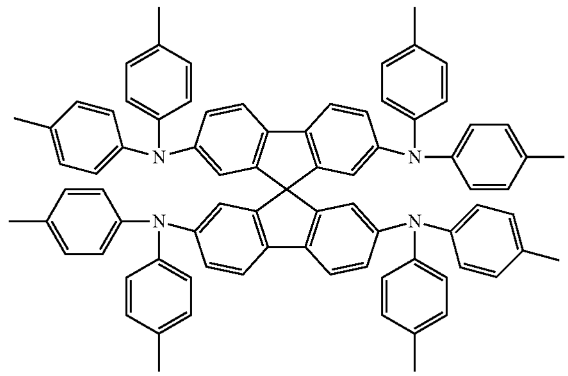

(N2,N2,N2',N2',N7,N7,N7',N7'-octakis(p-tolyl)-9,9'-spirobi[fluorene]-2,2',7,7'-tetramine), 4,4'-bis[N-(1-naphthyl)-N-phenylamino]biphenyl (α-NPD), N,N'-diphenyl-N,N'-bis(3-methylphenyl)-[1,1-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), α-phenyl-4-N,N-diphenylaminostyrene (TPS), p-(diethylamino)benzaldehyde diphenylhydrazone (DEH), triphenylamine (TPA), bis[4-(N,N-diethylamino)2-methylphenyl](4-methylphenyl)methane (MPMP), 1-phenyl-3-[p-(diethylamino)styryl]5-[p-(diethylamino)phenyl]pyrazoline (PPR or DEASP), 1,2-trans-bis(9H-carbazol9-yl)-cyclobutane (DCZB), N,N,N',N'-tetrakis(4-methylphenyl)-(1,1'-biphenyl)-4,4'-diamine (TTB), fluorine compounds such as 2,2',7,7'-tetra(N,N-di-tolyl)amino9,9-spirobifluorene (spiro-TTB), N,N'-bis(naphthalen-1-yl)-N,N'-bis(phenyl)9,9-spirobifluorene (spiro-NPB) and 9,9-bis(4-(N,N-bis-biphenyl-4-yl-amino)phenyl-9Hfluorene, benzidine compounds such as N,N'-bis(naphthalen-1-yl)-N,N'-bis(phenyl)benzidine and porphyrin compounds such as copper phthalocyanines. In addition, polymeric hole-injection materials can be used such as poly(N-vinylcarbazole) (PVK), polythiophenes, polypyrrole, polyaniline, self-doping polymers, such as, for example, sulfonated poly(thiophene-3-[2[(2-methoxyethoxy)ethoxy]-2,5-diyl) (Plexcore® OC Conducting Inks commercially available from Plextronics), and copolymers such as poly(3,4-ethylenedioxythiophene)/poly(4-styrenesulfonate) also called PEDOT/PSS.

In a preferred embodiment it is possible to use metal carbene complexes as hole transport materials. Suitable carbene complexes are, for example, carbene complexes as described in WO2005/019373A2, WO2006/056418 A2, WO2007/115970, WO2007/115981, WO2008/000727, WO2012/121936A2, US2012/0305894A1, and WO2012/172482A1. One example of a suitable carbene complex is $Ir(DPBIC)_3$ (HTM-1). Another example of a suitable carbene complex is $Ir(ABIC)_3$ (HTM-2). The formulae of (HTM-1) and (HTM-2) are mentioned above.

Further compounds suitable as hole transport material are for example mentioned in US2010/0044689 and US2014/0217392, e.g. the following compound

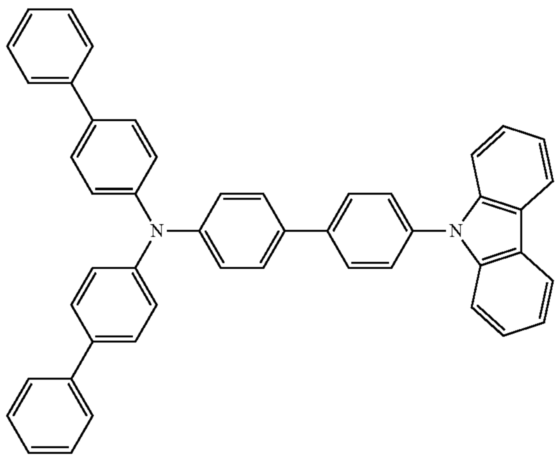 [SMILES: c1ccc(-c2ccc(N(c3ccc(-c4ccccc4)cc3)c3ccc(-c4ccc(-n5c6ccccc6c6ccccc65)cc4)cc3)cc2)cc1]

The compounds are employed in the hole transport layer in doped or undoped form. Suitable dopants are mentioned below.

Further compounds suitable as hole transport material are for example mentioned in US2010/0219400, US2015/0073142 and US2015/0102331, e.g. the following compound

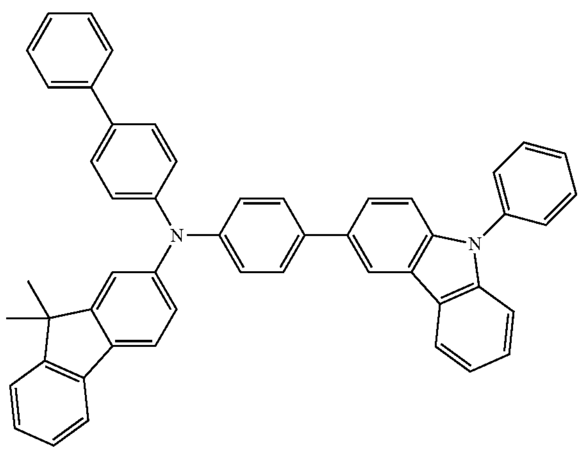 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

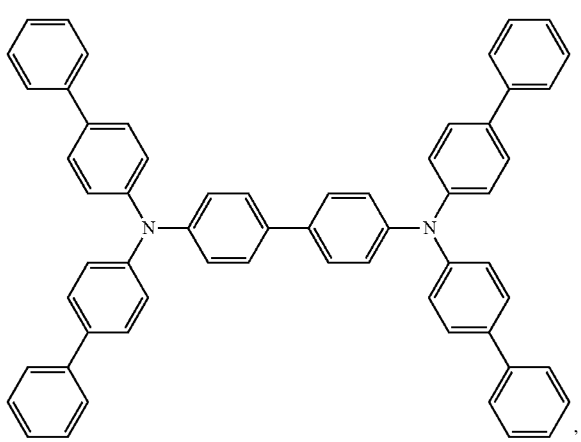

,

The compounds are employed in the hole transport layer in doped or undoped form. Suitable dopants are mentioned below.

Further compounds suitable as hole transport material are for example mentioned in US2008/0014464, e.g. the following compound

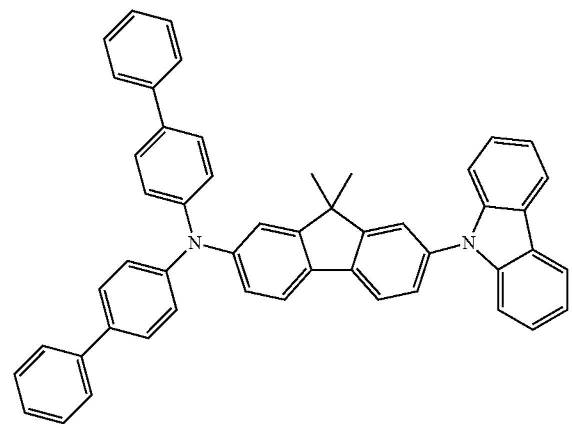 [SMILES: CC1(C)c2cc(N(c3ccc(-c4ccccc4)cc3)c3ccc(-c4ccccc4)cc3)ccc2-c2ccc(-n3c4ccccc4c4ccccc43)cc21]

The compounds are employed in the hole transport layer in doped or undoped form. Suitable dopants are mentioned below.

Further compounds suitable as hole transport material are for example mentioned in WO2013/112557, e.g. the following compounds 1a to 12a mentioned in WO2013/112557:

-continued
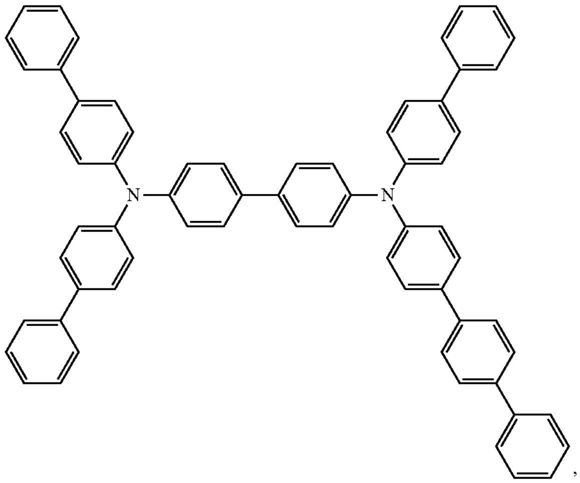
,
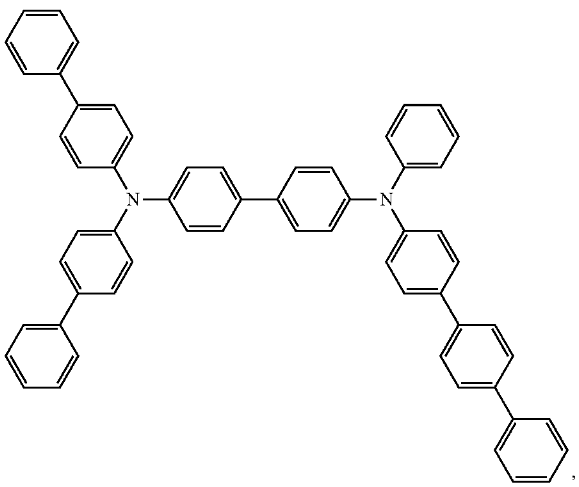
,
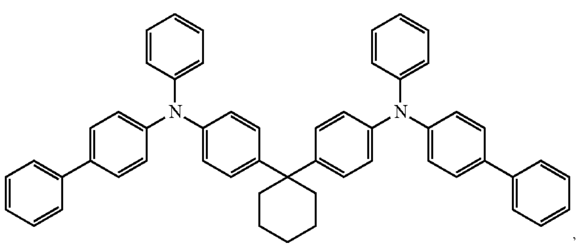
,
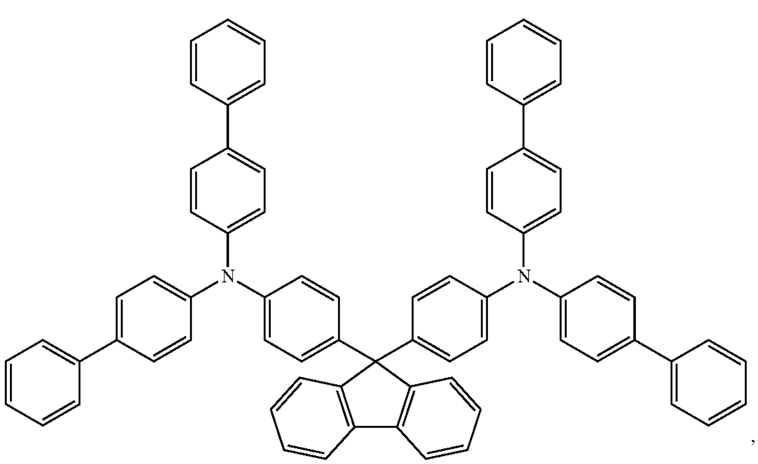
,

-continued
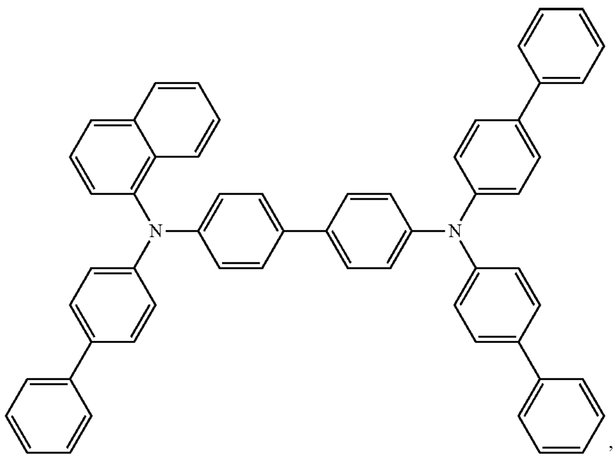
,
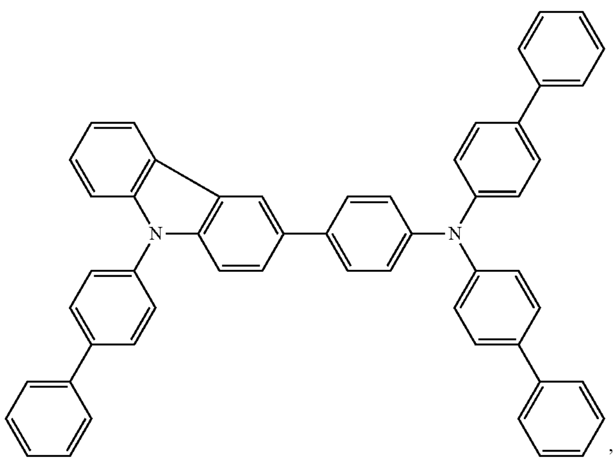
,
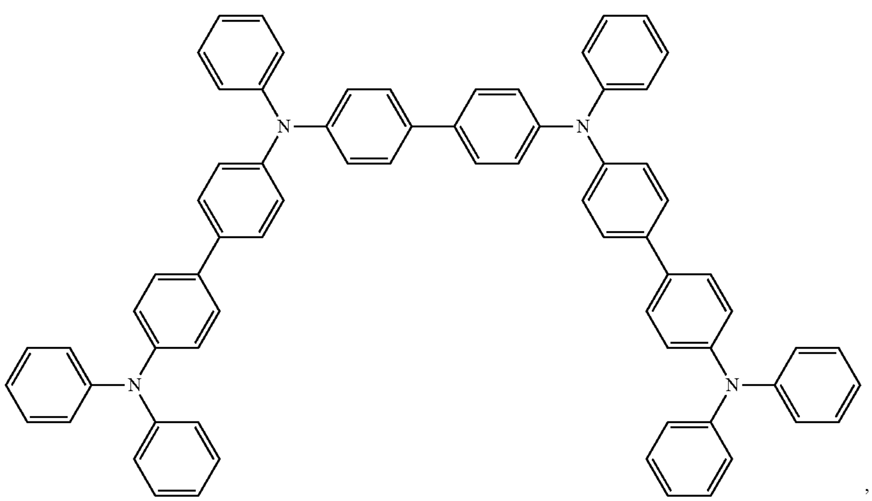
,

-continued

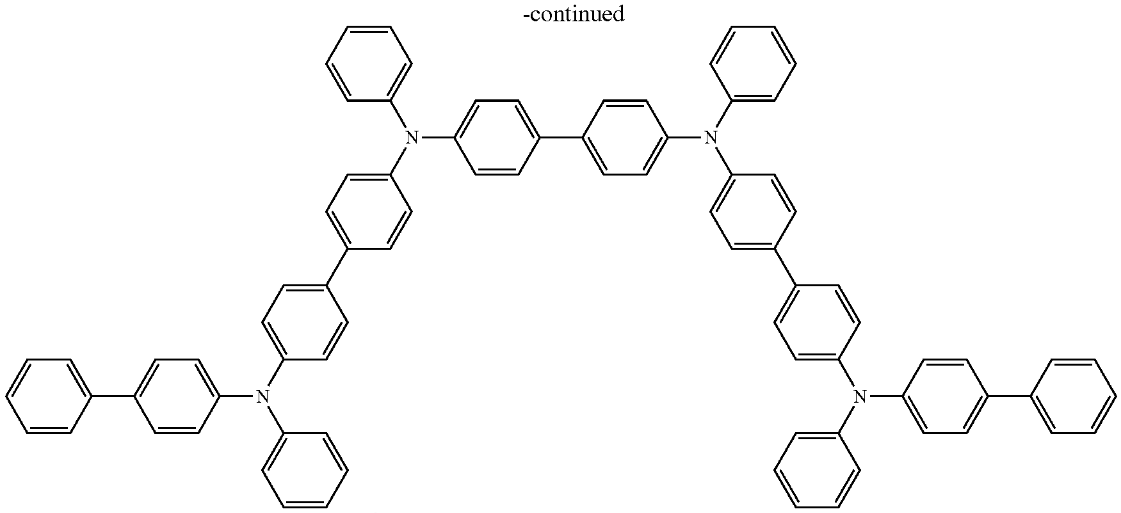

,

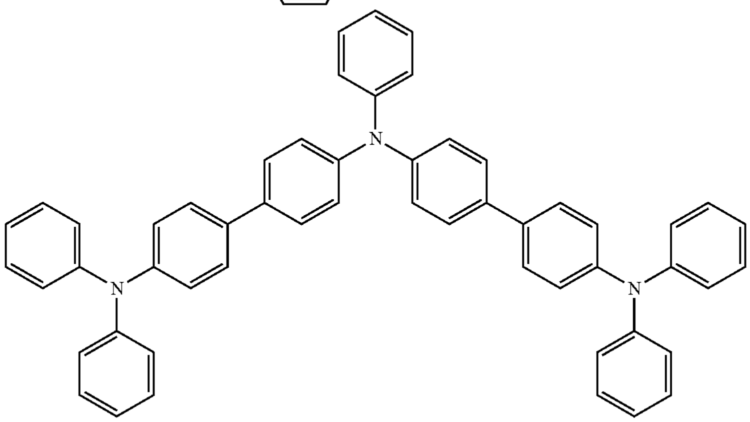

,

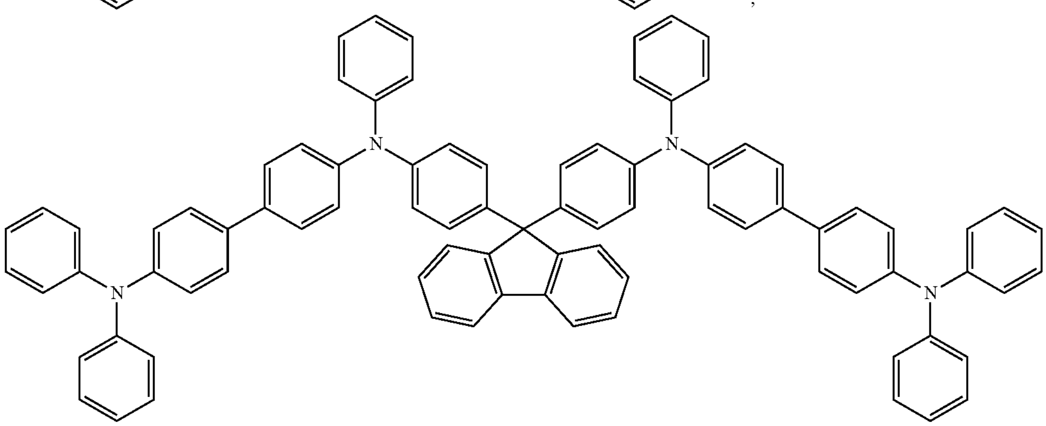

The hole-transporting layer may also be electronically doped in order to improve the transport properties of the materials used, in order firstly to make the layer thicknesses more generous (avoidance of pinholes/short circuits) and in order secondly to minimize the operating voltage of the device. Electronic doping is known to those skilled in the art and is disclosed, for example, in W. Gao, A. Kahn, J. Appl. Phys., Vol. 94, 2003, 359 (p-doped organic layers); A. G. Werner, F. Li, K. Harada, M. Pfeiffer, T. Fritz, K. Leo, Appl. Phys. Lett., Vol. 82, No. 25, 2003, 4495 and Pfeiffer et al., Organic Electronics 2003, 4, 89-103 and K. Walzer, B. Maennig, M. Pfeiffer, K. Leo, Chem. Soc. Rev. 2007, 107, 1233. For example it is possible to use mixtures in the hole-transporting layer, in particular mixtures which lead to electrical p-doping of the hole-transporting layer. p-Doping is achieved by the addition of oxidizing materials. These mixtures may, for example, be the following mixtures: mixtures of the abovementioned hole transport materials with at least one metal oxide, for example $MoO_2$, $MoO_3$, $WO_x$, $ReO_3$ and/or $V_2O_5$, preferably $MoO_3$ and/or $ReO_3$, more preferably $MoO_3$, or mixtures comprising the aforementioned hole transport materials and one or more compounds selected from 7,7,8,8-tetracyanoquinodimethane (TCNQ), 2,3,5,6-tetrafluoro-7,7,8,8-tetracyanoquinodimethane ($F_4$-TCNQ), 2,5-bis(2-hydroxyethoxy)-7,7,8,8-tetracyanoquinodimethane, bis(tetra-n-butylammonium)tetracyanodiphenoquinodimethane, 2,5-dimethyl-7,7,8,8-tetracyanoquinodimethane, tetracyanoethylene, 11,11,12,12- tetracyanonaphtho2,6-quinodimethane, 2-fluoro-7,7,8,8-tetracyanoquino-dimethane, 2,5-difluoro-7,7,8,8etracyanoquinodimethane, dicyanomethylene-1,3,4,5,7,8-hexafluoro-6Hnaphthalen-2-ylidene)malononitrile ($F_6$-TNAP), $Mo(tfd)_3$ (from Kahn et al., J. Am. Chem. Soc. 2009, 131 (35), 12530-12531), compounds as described in EP1988587, US2008/265216, EP2180029, US2010/0102709, WO2010/132236, EP2180029 and quinone compounds as mentioned in EP2401254; as well as compounds as described in EP1713136 and WO2007/071450 and US2008/0265216.

Further materials useful in the hole transport layer are the following materials:

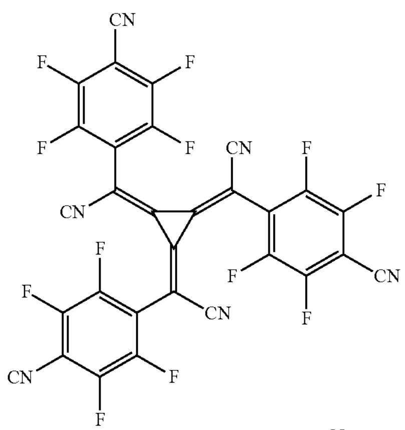

and

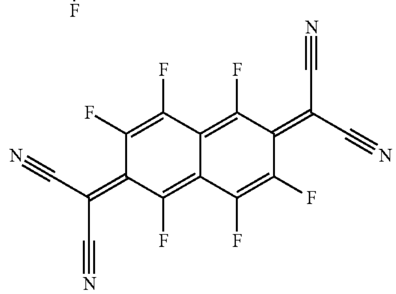

as well as NHT-49, NHT-51 (NHT-49, NHT-51 are commercially available from Novaled).

In addition to the hole transport materials mentioned above, the materials mentioned as hole injection materials in the hole injection layer are also useful as hole transport materials. Said materials may be used in undoped form or in combination with a p-dopant, for example in combination with $MoO_3$, F4-TCNQ or NDP-9, in the hole transport layer.

Electron/Exciton Blocking Layer (d)

Blocking layers may be used to reduce the number of charge carriers (electrons or holes) and/or excitons that leave the emissive layer. An electron/exciton blocking layer (d) may be disposed between the emitting layer (e) and the hole transport layer (c), to block electrons from emitting layer (e) in the direction of hole transport layer (c). Blocking layers may also be used to block excitons from diffusing out of the emissive layer. Suitable metal complexes for use as electron/exciton blocker material are, for example, carbene complexes as described in WO2005/019373A2, WO2006/056418A2, WO2007/115970, WO2007/115981, WO2008/000727, WO2012/121936A2, US2012/0305894A1, and WO2012/172482A1. Explicit reference is made here to the disclosure of the WO applications cited, and these disclosures shall be considered to be incorporated into the content of the present application. One example of a suitable carbene complex is compound HTM-1. Another example of a suitable carbene complex is compound HTM-2. The formulae of (HTM-1) and (HTM-2) are mentioned above.

Also suitable as electron/exciton blocker materials are the compounds mentioned in WO2012/130709; WO2013/050401; WO2014/009317; WO2014/044722; and the non-published European Patent Application EP13191100.0.

Further suitable electron/exciton blocker materials are the compounds of formula (H1) mentioned in WO2013/112557, as described above.

Further suitable electron/exciton blocker materials are the compounds mentioned in US2012/0223296.

Especially suitable are the compounds (H1-1), (H1-2), (H1-7) as mentioned above and the compounds (H1-3), (H1-4), (H1-5), (H1-6), (H1-8), (H1-9), (H1-10), (H1-11), (H1-12), (H1-13), (H1-14), (H1-14), (H-16) and (H1-17) as described in WO 2013/112557.

(Further suitable electron/exciton blocker materials are: NHT-49, NHT-51 (which are commercially available from Novaled) and HTM-211, Further compounds suitable as electron/exciton blocker materials are for example mentioned in US2010/0044689 and US2014/0217392, e.g. the following compound

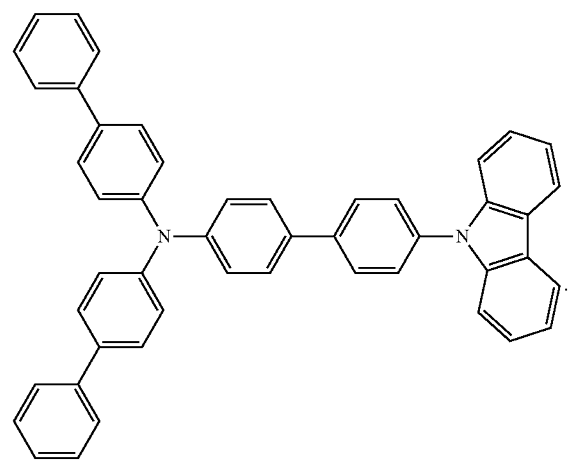 [SMILES: c1ccc(-c2ccc(N(c3ccc(-c4ccccc4)cc3)c3ccc(-c4ccc(-n5c6ccccc6c6ccccc65)cc4)cc3)cc2)cc1]

Further compounds suitable as electron/exciton blocker materials are for example mentioned in US2010/0219400, US2015/0073142 and US2015/0102331, e.g. the following compound

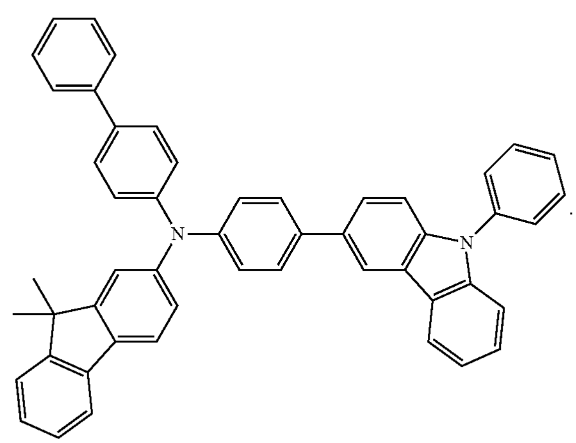 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

Further compounds suitable as electron/exciton blocker materials are for example mentioned in US2008/0014464, e.g. the following compound

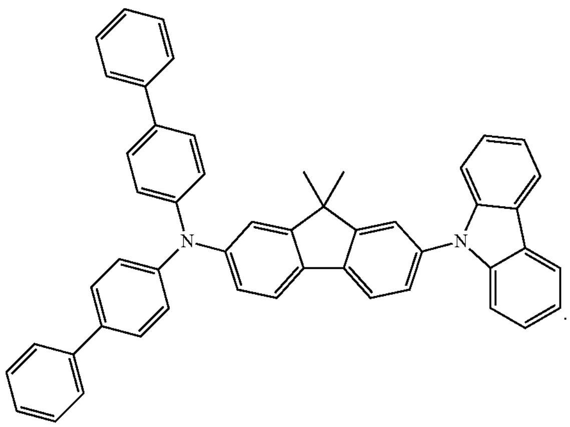 [SMILES: CC1(C)c2cc(N(c3ccc(-c4ccccc4)cc3)c3ccc(-c4ccccc4)cc3)ccc2-c2ccc(-n3c4ccccc4c4ccccc43)cc21]

Hole/Exciton Blocking Layer (f)

Blocking layers may be used to reduce the number of charge carriers (electrons or holes) and/or excitons that leave the emissive layer. The hole blocking layer may be disposed between the emitting layer (e) and electron transport layer (g), to block holes from leaving layer (e) in the direction of electron transport layer (g). Blocking layers may also be used to block excitons from diffusing out of the emissive layer. Suitable hole/exciton blocking materials are, in principle, the host compounds mentioned above. The same preferences apply as for the host material.

Suitable hole/exciton blocker materials are therefore for example the materials containing both triphenylene and benzo-fused furans or benzo-fused thiophenes as mentioned above concerning suitable host materials.

Further hole/exciton blocking materials are one or more compounds of the general formula (X)

(X)

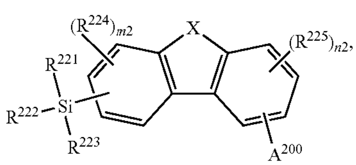

wherein

X is NR, S, O or PR;

R is aryl, heteroaryl, alkyl, cycloalkyl, or heterocycloalkyl;

$A^{200}$ is —$NR^{206}R^{207}$, —$P(O)R^{208}R^{209}$, —$PR^{210}R^{211}$, —$S(O)_2R^{212}$, —$S(O)R^{213}$, —$SR^{214}$, or —$OR^{215}$;

$R^{221}$, $R^{222}$ and $R^{223}$ are independently of each other aryl, heteroaryl, alkyl, cycloalkyl, or heterocycloalkyl, wherein at least on of the groups $R^{221}$, $R^{222}$, or $R^{223}$ is aryl, or heteroaryl;

$R^{224}$ and $R^{225}$ are independently of each other alkyl, cycloalkyl, heterocycloalkyl, aryl, heteroaryl, a group $A^{200}$, or a group having donor, or acceptor characteristics;

n2 and m2 are independently of each other 0, 1, 2, or 3;

$R^{206}$ and $R^{207}$ form together with the nitrogen atom a cyclic residue having 3 to 10 ring atoms, which can be unsubstituted, or which can be substituted with one, or more substituents selected from alkyl, cycloalkyl, heterocycloalkyl, aryl, heteroaryl and a group having donor, or acceptor characteristics; and/or which can be annulated with one, or more further cyclic residues having 3 to 10 ring atoms, wherein the annulated residues can be unsubstituted, or can be substituted with one, or more substituents selected from alkyl, cycloalkyl, heterocycloalkyl, aryl, heteroaryl and a group having donor, or acceptor characteristics; and $R^{208}$, $R^{209}$, $R^{210}$, $R^{211}$, $R^{212}$, $R^{213}$, $R^{214}$ and $R^{215}$ are independently of each other aryl, heteroaryl, alkyl, cycloalkyl, or heterocycloalkyl.

Compounds of formula (X) are described in WO2010/079051 (in particular pages on 19 to 26 and in tables on pages 27 to 34, pages 35 to 37 and pages 42 to 43).

Further suitable hole/exciton blocker materials are mentioned in US2013/0181190, especially in table 3, and US 2013/0119354, especially in table 4. Further suitable hole/exciton blocker materials are mentioned in US2014/0001446 and WO2015/014791.

Examples are bathocuprine compounds such as:

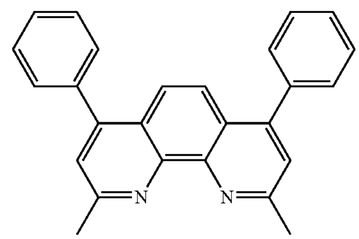

and

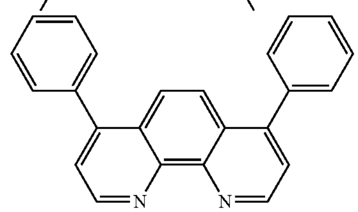

metal-8-hydroxy-quinolates such as:

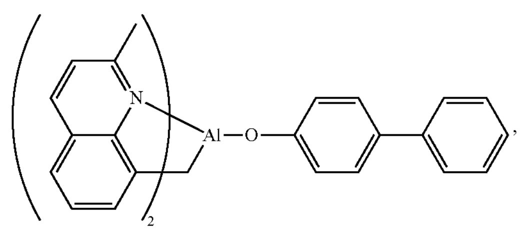

triazoles, oxadiazoles, imidazoles, benzoimidazoles, triphenylene compounds, fluorinated aromatic compounds, phenothiazine-S-oxides, silylated five-membered nitrogen, oxygen, sulfur or phosphorous dibenzoheterocycles, or Azacarbazoles.

Electron Transport Layer (g)

Electron transport layer may include a material capable of transporting electrons. Electron transport layer may be intrinsic (undoped), or doped. Doping may be used to enhance conductivity. Suitable electron-transporting materials for layer (g) of the inventive OLEDs comprise metals chelated with oxinoid compounds, such as tris(8-hydroxyquinolato)aluminum ($Alq_3$), compounds based on phenanthroline such as 2,9-dimethyl-4,7-diphenyl-1,10-phenanthroline (DDPA=BCP), 4,7-diphenyl-1,10-phenanthroline (Bphen), 2,4,7,9-tetraphenyl-1,10-phenanthroline, 4,7-diphenyl-1,10-phenanthroline (DPA) or phenanthroline derivatives disclosed in EP1786050, in EP1970371, or in EP1097981, and azole compounds such as 2-(4-biphenylyl)-5-(4-t-butylphenyl)-1,3,4-oxadiazole (PBD) and 3-(4-biphenylyl)-4phenyl-5-(4-t-butylphenyl)-1,2,4-triazole (TAZ).

It is likewise possible to use mixtures of at least two materials in the electron-transporting layer, in which case at least one material is electron-conducting. Preferably, in such mixed electron-transporting layers, at least one phenanthroline compound is used, preferably BCP, or at least one pyridine compound according to the formula (VIII) below, preferably a compound of the formula (VIIIaa) below. More preferably, in mixed electron-transporting layers, in addition to at least one phenanthroline compound, alkaline earth metal or alkali metal hydroxyquinolate complexes, for example Liq, are used. Suitable alkaline earth metal or alkali metal hydroxyquinolate complexes are specified below (formula VII). Reference is made to WO2011/157779.

The electron-transporting layer may also be electronically doped in order to improve the transport properties of the materials used, in order firstly to make the layer thicknesses more generous (avoidance of pinholes/short circuits) and in order secondly to minimize the operating voltage of the device. Electronic doping is known to those skilled in the art and is disclosed, for example, in W. Gao, A. Kahn, J. Appl. Phys., Vol. 94, No. 1, 1 Jul. 2003 (p-doped organic layers); A. G. Werner, F. Li, K. Harada, M. Pfeiffer, T. Fritz, K. Leo, Appl. Phys. Lett., Vol. 82, No. 25, 23 Jun. 2003 and Pfeiffer et al., Organic Electronics 2003, 4, 89-103 and K. Walzer, B. Maennig, M. Pfeiffer, K. Leo, Chem. Soc. Rev. 2007, 107, 1233. For example, it is possible to use mixtures which lead to electrical n-doping of the electron-transporting layer. n-Doping is achieved by the addition of reducing materials. These mixtures may, for example, be mixtures of the above-mentioned electron transport materials with alkali/alkaline earth metals or alkali/alkaline earth metal salts, for example Li, Cs, Ca, Sr, $Cs_2CO_3$, with alkali metal complexes, for example 8-hydroxyquinolatolithium (Liq), and with Y, Ce, Sm, Gd, Tb, Er, Tm, Yb, $Li_3N$, $Rb_2CO_3$, dipotassium phthalate, $W(hpp)_4$ from EP1786050, or with compounds described in EP1837926B1, EP1837927, EP2246862, WO2010132236 and DE102010004453.

In a preferred embodiment, the electron-transporting layer comprises at least one compound of the general formula (VII)

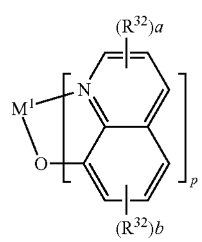

in which $R^{32}$ and $R^{33}$ are each independently F, $C_1$-$C_8$-alkyl, or $C_6$-$C_{14}$-aryl, which is optionally substituted by one or more $C_1$-$C_8$-alkyl groups, or two $R^{32}$ and/or $R^{33}$ substituents together form a fused benzene ring which is optionally substituted by one or more $C_1$-$C_8$-alkyl groups;

a and b are each independently 0, or 1, 2 or 3, $M^1$ is an alkaline metal atom or alkaline earth metal atom, p is 1 when $M^1$ is an alkali metal atom, p is 2 when $M^1$ is an earth alkali metal atom.

A very particularly preferred compound of the formula (VII) is (Liq)

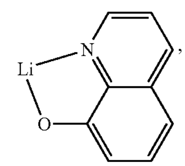

which may be present as a single species, or in other forms such as $Li_gQ_g$ in which g is an integer, for example $Li_6Q_6$. Q is an 8-hydroxyquinolate ligand or an 8-hydroxyquinolate derivative.

In a further preferred embodiment, the electron-transporting layer comprises at least one compound of the formula (VIII), (VIII)

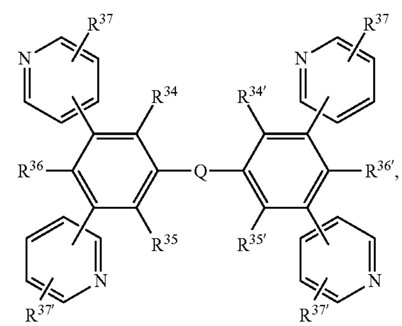

in which $R^{34}$, $R^{35}$, $R^{36}$, $R^{37}$, $R^{34'}$, $R^{35'}$, $R^{36'}$ and $R^{37'}$ are each independently H, $C_1$-$C_{18}$-alkyl, $C_1$-$C_{18}$-alkyl which is substituted by E and/or interrupted by D, $C_6$-$C_{24}$-aryl, $C_6$-$C_{24}$-aryl which is substituted by G, $C_2$-$C_{20}$-heteroaryl or $C_2$-$C_{20}$-heteroaryl which is substituted by G, Q is an arylene or heteroarylene group, each of which is optionally substituted by G;

D is —CO—; —COO—; —S—; —SO—; —$SO_2$—; —O—; —$NR^{40}$—; —$SiR^{45}R^{46}$—; —$POR^{47}$—; —$CR^{38}$=$CR^{39}$—; or —C≡C—;

E is —$OR^{44}$; —$SR^{44}$; —$NR^{40}R^{41}$; —$COR^{43}$; —$COOR^{42}$; —$CONR^{40}R^{41}$; —CN; or F;

G is E, $C_1$-$C_{18}$-alkyl, $C_1$-$C_{18}$-alkyl which is interrupted by D, $C_1$-$C_{18}$-perfluoroalkyl, $C_1$-$C_{18}$-alkoxy, or $C_1$-$C_{18}$-alkoxy which is substituted by E and/or interrupted by D, in which $R^{38}$ and $R^{39}$ are each independently H, $C_6$-$C_{18}$-aryl; $C_6$-$C_{18}$-aryl which is substituted by $C_1$-$C_{18}$-alkyl or $C_1$-$C_{18}$-alkoxy; $C_1$-$C_{18}$-alkyl; or $C_1$-$C_{18}$-alkyl which is interrupted by —O—;

$R^{40}$ and $R^{41}$ are each independently $C_6$-$C_{18}$-aryl; $C_6$-$C_{18}$-aryl which is substituted by $C_1$-$C_{18}$-alkyl or $C_1$-$C_{18}$-alkoxy; $C_1$-$C_{18}$-alkyl; or $C_1$-$C_{18}$-alkyl which is interrupted by —O—; or $R^{40}$ and $R^{41}$ together form a 6-membered ring;

$R^{42}$ and $R^{43}$ are each independently $C_6$-$C_{18}$-aryl; $C_6$-$C_{18}$-aryl which is substituted by $C_1$-$C_{18}$-alkyl or $C_1$-$C_{18}$-alkoxy; $C_1$-$C_{18}$-alkyl; or $C_1$-$C_{18}$-alkyl which is interrupted by —O—, $R^{44}$ is $C_6$-$C_{18}$-aryl; $C_6$-$C_{18}$-aryl which is substituted by $C_1$-$C_{18}$-alkyl or $C_1$-$C_{18}$-alkoxy; $C_1$-$C_{18}$-alkyl; or $C_1$-$C_{18}$-alkyl which is interrupted by —O—, $R^{45}$ and $R^{46}$ are each independently $C_1$-$C_{18}$-alkyl, $C_6$-$C_{18}$-aryl or $C_6$-$C_{18}$-aryl which is substituted by $C_1$-$C_{18}$-alkyl, $R^{47}$ is $C_1$-$C_{18}$-alkyl, $C_6$-$C_{18}$-aryl or $C_6$-$C_{18}$-aryl which is substituted by $C_1$-$C_{18}$-alkyl.

Preferred compounds of the formula (VIII) are compounds of the formula (VIIIa)

(VIIIa)

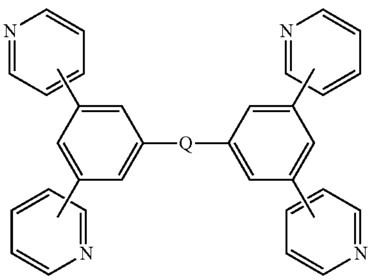

in which Q is:

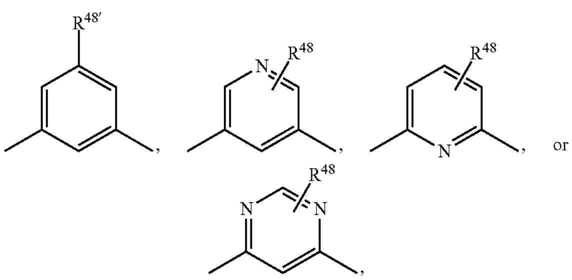

$R^{48}$ is H or $C_1$-$C_{18}$-alkyl and $R^{48'}$ is H, $C_1$-$C_{18}$-alkyl or

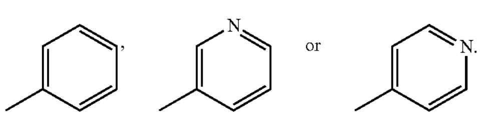

Particular preference is given to a compound of the formula (ETM-2)

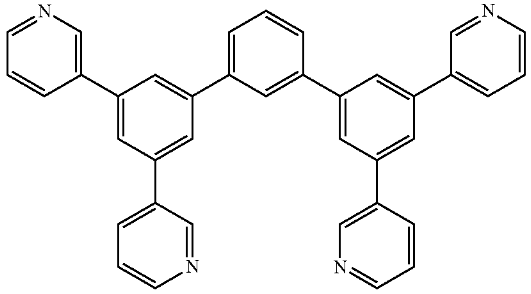

In a further, very particularly preferred embodiment, the electron-transporting layer comprises a compound Liq and a compound ETM-2.

In a preferred embodiment, the electron-transporting layer comprises the compound of the formula (VII) in an amount of 99 to 1% by weight, preferably 75 to 25% by weight, more preferably about 50% by weight, where the amount of the compounds of the formulae (VII) and the amount of the compounds of the formulae (VIII) adds up to a total of 100% by weight.

The preparation of the compounds of the formula (VIII) is described in J. Kido et al., Chem. Commun. (2008) 5821-5823, J. Kido et al., Chem. Mater. 20 (2008) 5951-5953 and JP2008/127326, or the compounds can be prepared analogously to the processes disclosed in the aforementioned documents.

It is likewise possible to use mixtures of alkali metal hydroxyquinolate complexes, preferably Liq, and dibenzofuran compounds in the electron-transporting layer. Reference is made to WO2011/157790. Dibenzofuran compounds A-1 to A-36 and B-1 to B-22 described in WO2011/157790 are preferred, wherein dibenzofuran compound

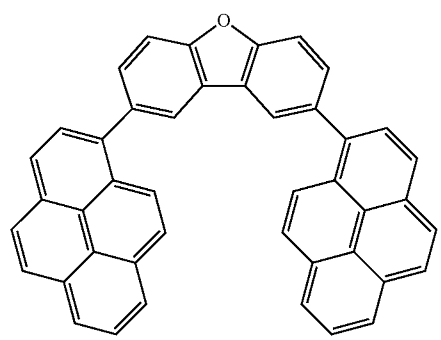 [SMILES: c1cc2ccc3ccc(-c4ccc5oc6ccc(-c7ccc8ccc9cccc%10ccc7c8c9%10)cc6c5c4)c4ccc(c1)c2c34]

(A-10; =ETM-1) is most preferred.

In a preferred embodiment, the electron-transporting layer comprises Liq in an amount of 99 to 1% by weight, preferably 75 to 25% by weight, more preferably about 50% by weight, where the amount of Liq and the amount of the dibenzofuran compound(s), especially ETM-1, adds up to a total of 100% by weight.

In a preferred embodiment, the electron-transporting layer comprises at least one phenanthroline derivative and/or pyridine derivative.

In a further preferred embodiment, the electron-transporting layer comprises at least one phenanthroline derivative and/or pyridine derivative and at least one alkali metal hydroxyquinolate complex.

In a further preferred embodiment, the electron-transporting layer comprises at least one of the dibenzofuran compounds A-1 to A-36 and B-1 to B-22 described in WO2011/157790, especially ETM-1.

In a further preferred embodiment, the electron-transporting layer comprises a compound described in WO2012/111462, WO2012/147397, WO2012/014621, such as, for example, a compound of formula (ETM-3)

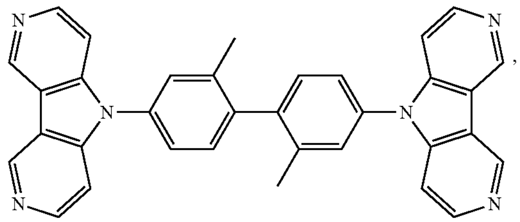

US2012/0261654, such as, for example, a compound of formula (ETM-4)

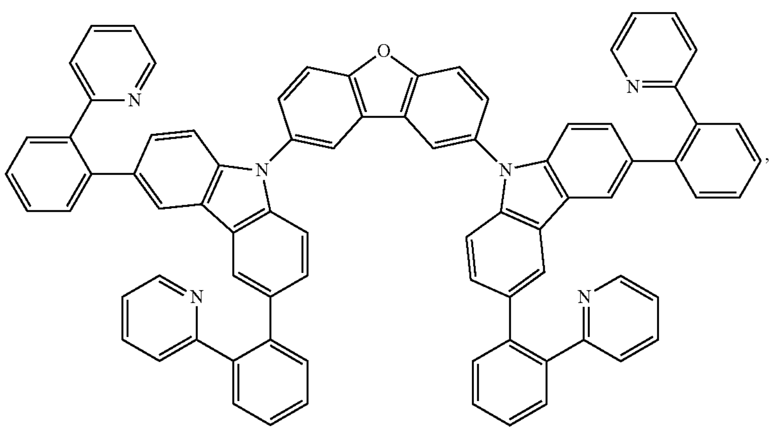

and WO2012/115034, such as for example, such as, for example, a compound of formula (ETM-5)

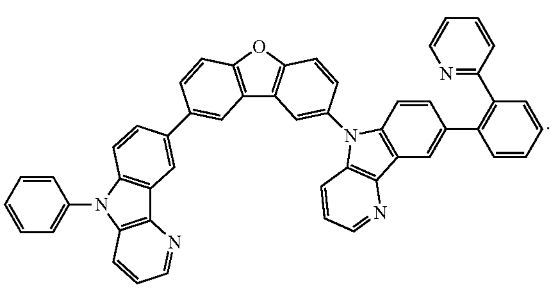

Further suitable electron transport materials are mentioned in US2013/0181190, especially in table 3, and US2013/0119354, especially in table 4.

Further suitable electron transport materials are mentioned in WO2013/079678, especially the compounds mentioned in the examples.

Further suitable electron transport materials are mentioned in EP2452946, especially compound (28) on page 5 and compound (10) on page 6.

A further suitable electron transport material is

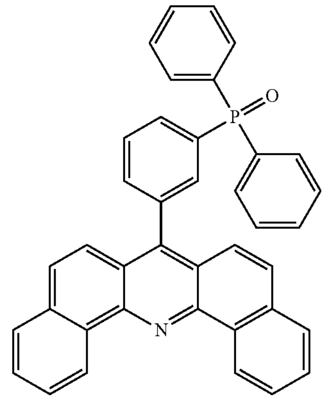

Further suitable electron transport materials are mentioned in EP2434559 and WO2013/187896, for example:

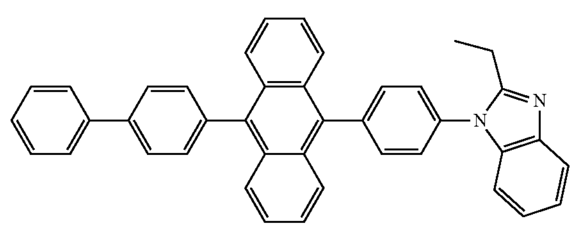

As n-dopant, for example the material mentioned in EP 1 837 926 is employed.

Electron Injection Layer (h)

The electron injection layer may be any layer that improves the injection of electrons into an adjacent organic layer. Lithium-comprising organometallic compounds such as 8-hydroxyquinolatolithium (Liq), CsF, NaF, KF, $Cs_2CO_3$ or LiF may be applied between the electron transport layer (g) and the cathode (i) as an electron injection layer (h) in order to reduce the operating voltage.

Cathode (i)

The cathode (i) is an electrode which serves to introduce electrons or negative charge carriers. The cathode may be any metal or nonmetal which has a lower work function than the anode. Suitable materials for the cathode are selected from the group consisting of alkali metals of group 1, for example Li, Cs, alkaline earth metals of group 2, metals of group 12 of the Periodic Table of the Elements, comprising the rare earth metals and the lanthanides and actinides. In addition, metals such as aluminum, indium, calcium, barium, samarium and magnesium, and combinations thereof, may be used.

In general, the different layers, if present, have the following thicknesses: In general, the different layers in the inventive OLED, if present, have the following thicknesses: anode (a): 12 to 500 nm, preferably 40 to 500, more preferably 50 to 500 nm, most preferably 100 to 200 nm; in a further most preferred embodiment: 40 to 120 nm; hole injection layer (b): 1 to 100 nm, preferably 5 to 100 nm, more preferably 2 to 80 nm, most preferably 20 to 80 nm, hole-transport layer (c): 5 to 200 nm, preferably 5 to 100 nm, more preferably 10 to 80 nm;

electron/exciton blocking layer (d): 1 to 50 nm, preferably 5 to 10 nm, preferably 3 to 10 nm;

light-emitting layer (e): 1 to 100 nm, preferably 5 to 60 nm, preferably 5 to-40 nm;

hole/exciton blocking layer (f): 1 to 50 nm, preferably 5 to 10 nm, preferably 3 to 10 nm;

electron-transport layer (g): 5 to 100 nm, preferably 20 to 80 nm; preferably 20 to 50 nm;

electron injection layer (h): 1 to 50 nm, preferably 2 to 10 nm;

cathode (i): 20 to 1000 nm, preferably 30 to 500 nm.

The inventive OLED can be produced by methods known to those skilled in the art. In general, the OLED is produced by successive vapor deposition of the individual layers onto a suitable substrate. Suitable substrates are, for example, glass, inorganic materials such as ITO or IZO or polymer films. For the vapor deposition, customary techniques may be used, such as thermal evaporation, chemical vapor deposition (CVD), physical vapor deposition (PVD) and others. In case of an active matrix OLED display (AMOLED), the substrate can be an AMOLED backplane.

In an alternative process, the organic layers may be coated from solutions or dispersions in suitable solvents, in which case coating techniques known to those skilled in the art are employed. Suitable coating techniques are, for example, spin-coating, the casting method, the Langmuir-Blodgett ("LB") method, the inkjet printing method, dip-coating, letterpress printing, screen printing, doctor blade printing, slit-coating, roller printing, reverse roller printing, offset lithography printing, flexographic printing, web printing, spray coating, coating by a brush or pad printing, and the like. Among the processes mentioned, in addition to the aforementioned vapor deposition, preference is given to spin-coating, the inkjet printing method and the casting method since they are particularly simple and inexpensive to perform. In the case that layers of the OLED are obtained by the spin-coating method, the casting method or the inkjet printing method, the coating can be obtained using a solution prepared by dissolving the composition in a concentration of 0.0001 to 90% by weight in a suitable organic solvent such as benzene, toluene, xylene, tetrahydrofuran, methyltetrahydrofuran, N,N-dimethylformamide, acetone, acetonitrile, anisole, dichloromethane, dimethyl sulfoxide, water and mixtures thereof.

It is possible that the layers of the OLED are all produced by the same coating method. Furthermore, it is likewise possible to conduct two or more different coating methods to produce the layers of the OLED.

The inventive OLEDs can be used in all devices in which electroluminescence is useful. Suitable devices are preferably selected from stationary and mobile visual display units and illumination means. Further suitable devices are devices such as keyboards; items of clothing; furniture; and wallpaper. The present invention therefore also relates to a device selected from the group consisting of stationary visual display units; mobile visual display units; illumination means; keyboards; items of clothing; furniture; and wallpaper comprising an inventive OLED or an inventive light-emitting layer.

Stationary visual display units are, for example, visual display units of computers, televisions, visual display units in printers, kitchen appliances and advertising panels, illuminations and information panels. Mobile visual display units are, for example, visual display units in cellphones, laptops, tablet PCs, digital cameras, mp-3 players, smartphones, vehicles, and destination displays on buses and trains.

The inventive metal carbene complexes can additionally be used in OLEDs with inverse structure. In these inverse OLEDs, the inventive complexes are in turn preferably used in the light-emitting layer. The structure of inverse OLEDs and the materials typically used therein are known to those skilled in the art.

The present invention further provides a white OLED comprising at least one inventive metal carbene complex. In a preferred embodiment, the inventive metal carbene complex is used as emitter material in the white OLED. Preferred embodiments of the inventive metal carbene complexes have been specified above. Suitable structures of white OLEDs and suitable components are known by a person skilled in the art.

In order to obtain white light, the OLED must generate light which colors the entire visible range of the spectrum. However, organic emitters normally emit only in a limited portion of the visible spectrum—i.e. are colored. White light can be generated by the combination of different emitters. Typically, red, green and blue emitters are combined. However, the prior art also discloses other methods for formation of white OLEDs, for example the triplet harvesting approach. Suitable structures for white OLEDs or methods for formation of white OLEDs are known to those skilled in the art.

In one embodiment of a white OLED, several dyes are layered one on top of another in the light-emitting layer of an OLED and hence combined (layered device). This can be achieved by mixing all dyes or by direct series connection of different-colored layers. The expression "layered OLED" and suitable embodiments are known to those skilled in the art.

In a further embodiment of a white OLED, several different-colored OLEDs are stacked one on top of another (stacked device). For the stacking of two OLEDs, what is called a charge generation layer (CG layer) is used. This CG layer may be formed, for example, from one electrically n-doped and one electrically p-doped transport layer. The expression "stacked OLED" and suitable embodiments are known to those skilled in the art.

In further embodiments of this "stacked device concept", it is also possible to stack only two or three OLEDs or to stack more than three OLEDs.

In a further embodiment of white OLEDs, the two concepts mentioned for white light generation can also be combined. For example, a single-color OLED (for example blue) can be stacked with a multicolor layered OLED (for example red-green). Further combinations of the two concepts are conceivable and known to those skilled in the art.

The inventive metal carbene complex can be used in any of the layers mentioned above in white OLEDs. In a preferred embodiment, it is used in one or more or all light-emitting layer(s) of the OLED(s), in which case the structure of the invention metal carbene complex is varied as a function of the use of the complex. Suitable and preferred components for the further layers of the light OLED(s) or materials suitable as matrix material in the light-emitting layer(s) and preferred matrix materials are likewise specified above.

The examples which follow, more particularly the methods, materials, conditions, process parameters, apparatus and the like detailed in the examples, are intended to support the present invention, but not to restrict the scope of the present invention.

EXAMPLES

All experiments are carried out in protective gas atmosphere. The percentages and ratios mentioned in the examples below—unless stated otherwise—are % by weight and weight ratios.

I. Synthesis Examples

Synthesis Example 1

Synthesis of Complex (I)

a) Synthesis of N2,N3-bis(4-isopropylphenyl)quinoxaline-2,3-diamine

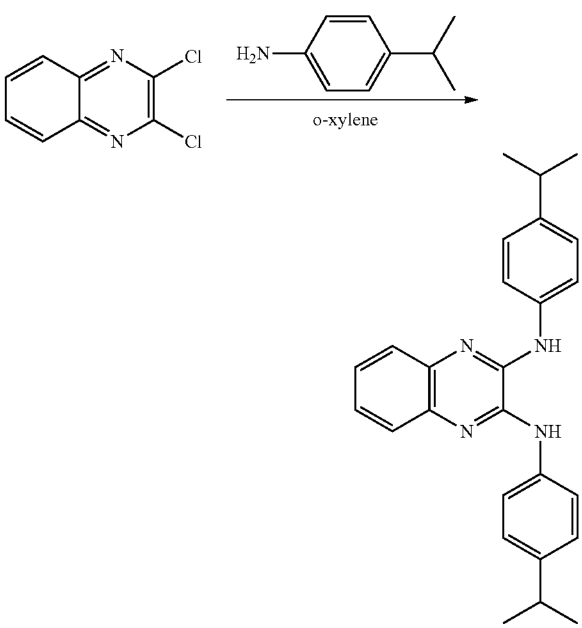

10.0 g (50.2 mmol) of 2,3-dichloroquinoxaline and 14.5 g (0.11 mol) 4-isopropylaniline in 90 ml of o-xylene are heated at 150° C. during 90 minutes followed by stirring the resulting yellow suspension at room temperature during 16 hours. The thick yellow suspension is diluted with 140 ml of o-xylene and heating is continued at 160° C. for another two hours. The suspension is cooled down to room temperature and diluted with heptane up to a total volume of 500 ml. The thick suspension is stirred during 20 minutes, filtered, followed by washing with ethanol, and the resulting yellow solid dried under vacuum. The solid is suspended in a mixture of 100 ml of ethanol, 100 ml of water and 50 ml of 25% aqueous ammonia solution, and the resulting suspension stirred during 15 minutes, providing a light brown emulsion. The emulsion is diluted with water and extracted with dichloromethane. The dichloromethane phase is separated and the aqueous phase extracted with an additional amount of dichloromethane. The combined dichloromethane fractions are washed with water, dried over magnesium sulfate, filtered and concentrated under vacuum. The yellow-brown oil is purified by chromatography (silica gel, heptane/ethyl acetate) giving the title product as a yellow solid (yield: 12.4 g (65%)).

$^1$H-NMR (400 MHz, $CD_3OD$): δ=1.27 (d, 12H), 2.90 (m, 2H), 7.24 (m, 4H), 7.30 (m, 2H), 7.56 (m, 2H), 7.69 (m, 4H).

b) Synthesis of [3-(4-isopropylanilino)quinoxalin-2-yl]-(4-isopropylphenyl)ammonium chloride

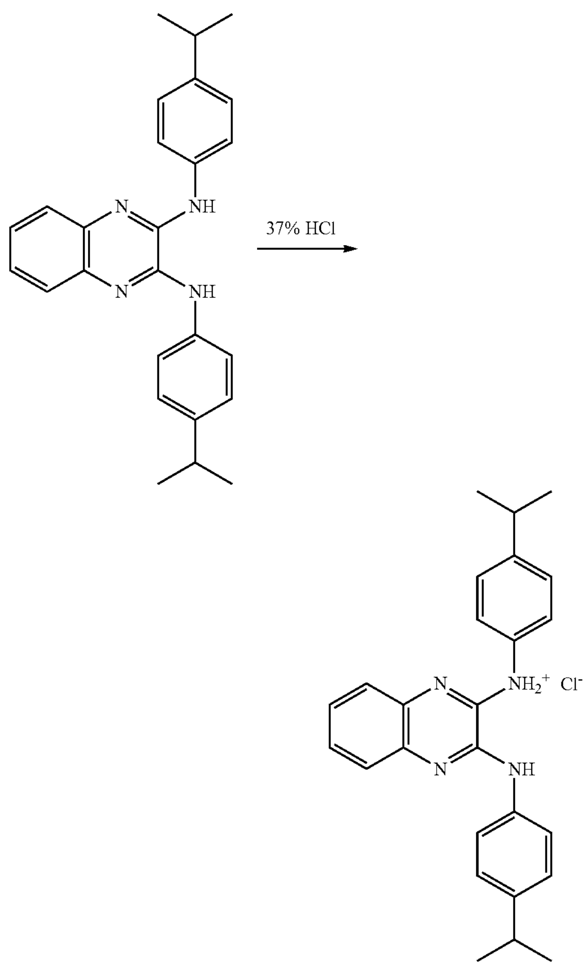

An orange suspension of 12.4 g (31.3 mmol) of N2,N3-bis(4-isopropylphenyl)quinoxaline-2,3-diamine and 250 ml of 37% hydrochloric acid solution is stirred at room temperature during one hour. The yellow suspension is carefully diluted with water and stirring continued for 10 minutes. The suspension is filtered and the solid washed with water and further dried under vacuum giving the title product as a yellow solid (yield: 22.0 g, still wet).

c) Synthesis of 2-ethoxy-1,3-bis(4-isopropylphenyl)-2H-imidazo[4,5-b]quinoxaline

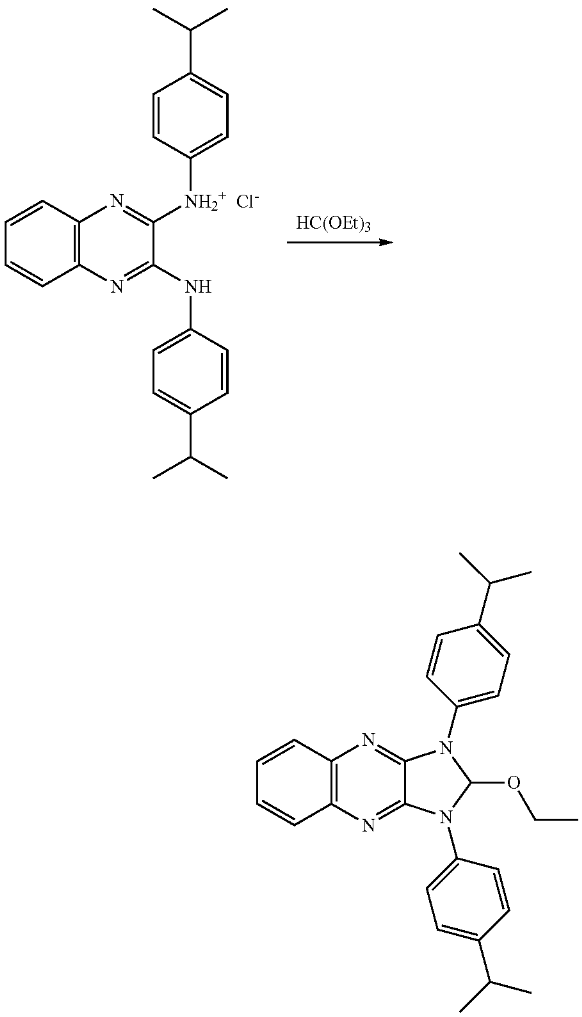

22 g (max. 31 mmol, still including residual water) of [3-(4-isopropylanilino)quinoxalin-2-yl]-(4-isopropylphenyl)ammonium chloride and 200 ml (1.2 mol) of triethyl orthoformate are heated under argon at 95° C. during 90 minutes. The light yellow-greenish turbid solution is cooled down and triethyl orthoformate distilled off under vacuum. 50 ml of ethanol are added and the resulting suspension stirred over an ice-bath. The suspension is filtered and the solid washed with 25 ml of ethanol giving the title product as a white solid (yield: 12.1 g (86%)).

$^1$H-NMR (400 MHz, $d_6$-DMSO): δ=0.91 (t, 3H), 1.26 (d, 12H), 2.96 (m, 2H), 3.28 (m, 2H), 7.37 (m, 2H), 7.42 (m, 4H), 7.61 (m, 2H), 7.78 (s, 1H), 8.02 (m, 4H).

d) Synthesis of Complex (I)

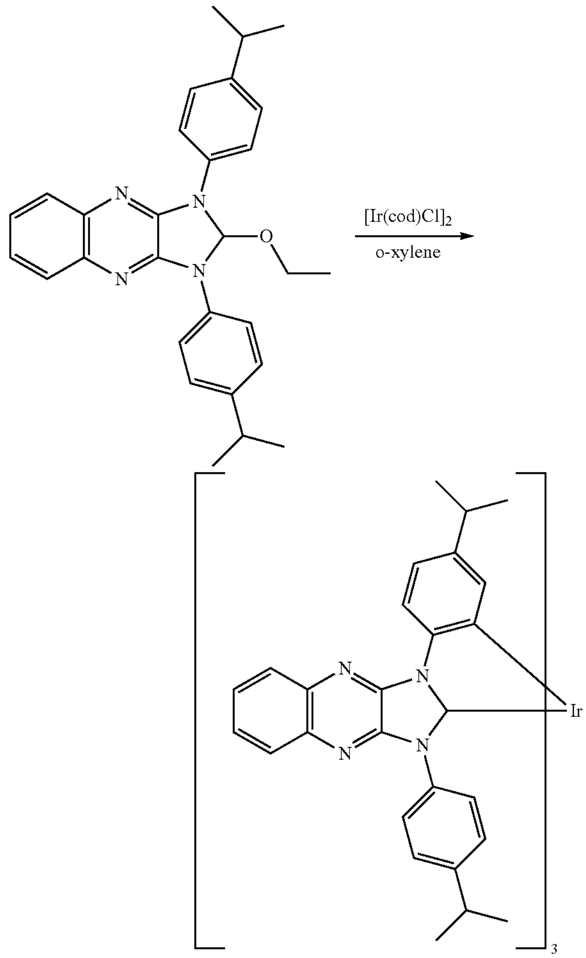

4.00 g (8.84 mmol) of 2-ethoxy-1,3-bis(4-isopropylphenyl)-2H-imidazo[4,5-b]quinoxaline and 0.60 g (0.89 mmol) of chloro(1,5-cyclooctadiene)iridium(I) dimer are suspended under argon in 70 ml of o-xylene. The orange suspension is three times evacuated and backfilled with argon, followed by heating at 142° C. during 9 hours. The solution is cooled down to room temperature and concentrated under vacuum. The solid is treated with ethanol and stirred at room temperature during one hour. The suspension is filtered and the solid further purified by chromatography (silica gel, heptane/dichloromethane). The resulting solid is dissolved in 50 ml of dichloromethane followed by the addition of 250 ml of ethanol. The resulting yellow suspension is stirred at room temperature during 30 minutes, then filtered, the solid washed with ethanol, dried under vacuum, giving the title product as a bright yellow solid (yield: 1.90 g (75%)).

APCI-LC-MS (positive, m/z): exact mass of $C_{81}H_{75}IrN_{12}$=1408.59; found 1409.7 $[M+1]^+$.

$^1$H-NMR (400 MHz, $CD_2Cl_2$): δ=0.70 (d, 9H), 0.80 (d, 9H), 1.01 (d, 9H), 1.11 (d, 9H), 2.11 (m, 3H), 2.66 (m, 3H), 6.05 (br. s, 3H), 6.35-6.79 (2×br. s, and d, 9H), 7.12 (dd, 3H), 7.37 (br. s, 3H), 7.72 (m, 3H), 7.84 (m, 6H), 8.35 (d, 3H), 8.99 (d, 3H).

Synthesis Example 2

Synthesis of Complex (II)

a) Synthesis of Complex Intermediate (II-1)

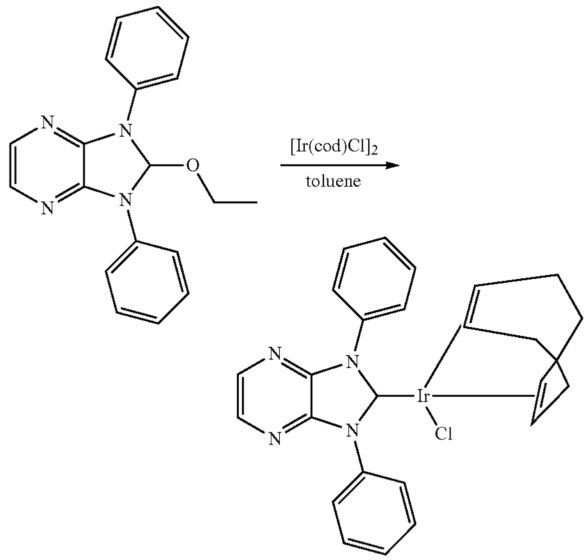

5.27 g (7.85 mmol) of chloro(1,5-cyclooctadiene)iridium (I) dimer are suspended in 250 ml of toluene and three times evacuated and backfilled with argon. 5.00 g (15.7 mmol) of 2-ethoxy-1,3-diphenyl-2H-imidazo[4,5-b]pyrazine are added in small portions at 66° C. during 20 minutes. Heating is continued at 66° C. and the generated ethanol continuously removed by using a distillation bridge. The yellow-brown suspension is cooled down to room temperature and diluted with 200 ml of ethanol, and cooling is continued until 5° C. is reached. Stirring is continued at this temperature for 30 minutes, followed by filtration and washing with 50 ml of cold ethanol and 50 ml of heptane. The resulting solid is dried under vacuum giving the title product as a yellow solid (yield: 4.1 g (43%)).

$^1$H-NMR (400 MHz, $CDCl_3$): δ=1.31-1.42 (m, 2H), 1.43-1.64 (m, 4H), 1.73-1.86 (m, 2H), 2.50-2.59 (m, 2H), 4.68-4.78 (m, 2H), 7.57-7.69 (m, 6H), 8.15-8.22 (m, 4H), 8.33 (s, 2H).

b) Synthesis of Complex (II)

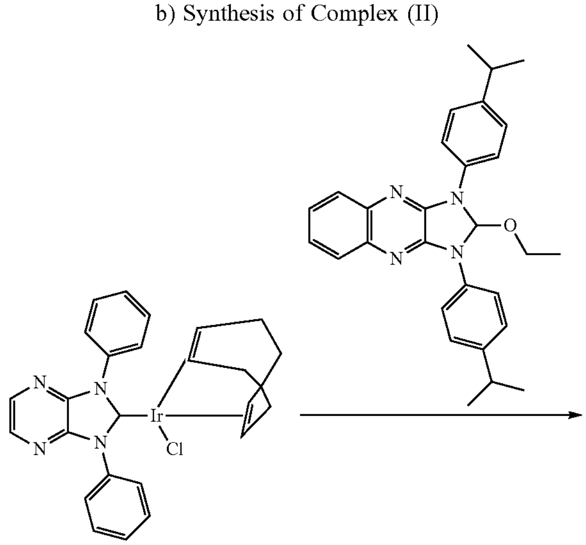

-continued

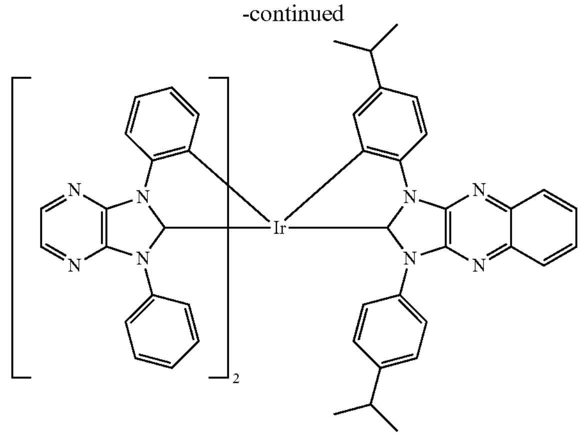

0.3 g (0.5 mmol) of intermediate complex (II-1) and 0.49 g (1.08 mmol) of 2-ethoxy-1,3-bis(4-isopropylphenyl)-2H-imidazo[4,5-b]quinoxaline are dissolved under argon in 50 ml of o-xylene. The yellow turbid solution is three times evacuated and backfilled with argon, followed by heating at 140° C. during 10 hours. The reaction mixture is cooled down to 50° C. and directly purified by elution via chromatography (silica gel, toluene/ethyl acetat) The product fractions are combined and concentrated under vacuum. The yellow resin is dissolved in a minimum amount of dichloromethane and treated with ethanol until precipitation is initiated and further stirred over an ice-batch during one hour. The suspension is filtered and the solid dried under vacuum, giving the title product as a bright yellow solid (yield: 50 mg (18%)).

APCI-LC-MS (positive, m/z): exact mass of $C_{61}H_{47}IrN_{12}$=1140.37; found 1141.5 $[M+1]^+$.

$^1$H-NMR (400 MHz, $CD_2Cl_2$): δ=0.97 (d, 3H), 1.02 (d, 3H), 1.06 (d, 6H), 2.54 (m, 1H), 2.64 (m, 1H), 6.02-7.67 (broad signals, 12H), 6.55 (d, 1H), 6.66 (m, 4H), 6.87 (m, 3H), 7.13 (dd, 1H), 7.20 (m, 2H), 7.84 (ddd, 1H), 7.90 (dd, 1H), 8.09 (dd, 2H), 8.31-8.43 (m, 3H), 8.78 (dd, 1H), 8.85 (dd, 1H), 8.97 (d, 1H).

Synthesis Example 3

Synthesis of Complex (III)

a) Synthesis of 4,7-diethyl-2,1,3-benzothiadiazole

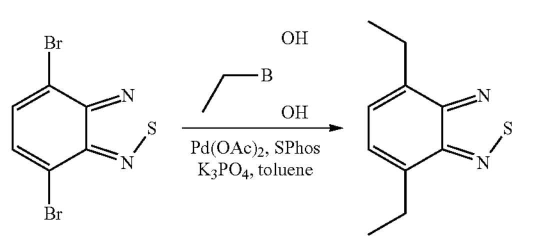

5.0 g (17.0 mmol) of 4,7-dibromo-2,1,3-benzothiadiazole and 3.77 g (51.0 mmol) of ethylboronic acid are suspended under argon in 50 ml of toluene. 150 mg (0.67 mmol) of palladium(II) acetate and 0.85 g (2.07 mmol) of 2-dicyclohexyl-phosphino-2',6'-dimethoxybiphenyl are added, followed by the addition of 36.1 g (0.16 mol) of potassium phosphate monohydrate. The yellow suspension is three times evacuated and backfilled with argon, followed by heating at 110° C. during three hours. The yellow-brown reaction mixture is poured onto 200 ml water and 50 ml of toluene, followed by stirring for short time. The water phase is separated, and the organic phase two times washed with 200 ml of water. The organic phase is dried over magnesium sulfate and filtered. The orange solution is further filtered over a 3 cm layer of silica gel and the silica gel layer rinsed with toluene. The combined filtrates are concentrated under vacuum. The resulting yellow oil is cooled down and stirred together with 30 ml of heptane over an ice-bath providing a yellow suspension which is first further stirred during 30 minutes. The suspension is filtered, the white solid washed with heptane. The combined filtrates are concentrated under vacuum giving the title product as a yellow oil (yield: 3.21 g (98%)).

$^1$H-NMR (400 MHz, $CD_2Cl_2$): δ=1.41 (t, 6H), 3.15 (q, 4H), 7.31 (s, 2H).

b) Synthesis of 3,6-diethylbenzene-1,2-diamine

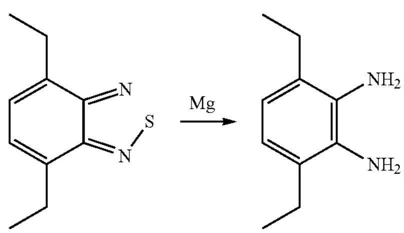

6.90 g (35.9 mmol) of 4,7-diethyl-2,1,3-benzothiadiazole are dissolved in 150 ml of methanol and heated under reflux. A total of 6.15 g (0.25 mol) of magnesium shavings are carefully added in four portions during one hour, and stirring continued for 30 minutes. The green slightly turbid solution is cooled down to room temperature and diluted with methanol up to a volume of 800 ml. The turbid solution is filtered over cellulose filter aid and the filtrate treated with 60 ml of water. The thick suspension is filtered and the solid rinsed with methanol. The filtrates are concentrated under vacuum and the resulting oil diluted with dichloromethane. The solution is filtered over a layer of silica gel followed by rinsing of the silica gel with dichloromethane. The collected fractions are concentrated under vacuum giving the title product as a yellow oil (yield: 3.52 g (60%)).

$^1$H-NMR (400 MHz, $CD_2Cl_2$): δ=1.26 (t, 6H), 2.57 (q, 4H), 3.43 (br. s, 4H), 6.62 (s, 2H).

c) Synthesis of 5,8-diethyl-1,4-dihydroquinoxaline-2,3-dione

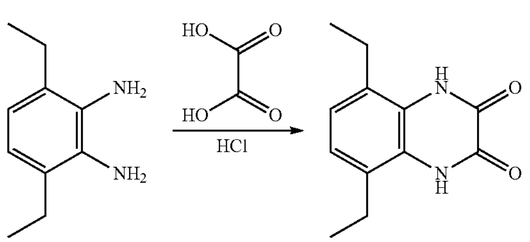

11.6 g (70.6 mmol) of 3,6-diethylbenzene-1,2-diamine are suspended in 130 ml of water and 80 ml of 4N aqueous hydrochloric acid. 9.05 g (71.8 mmol) of oxalic acid dihydrate are added and the white suspension heated under reflux during 15 hours. The pink suspension is cooled down to room temperature, followed by filtration and washing of the solid with water. The solid is stirred in 200 ml of 5% aqueous sodium bicarbonate. The suspension is filtered and the solid washed with water, giving the title product as a white solid (yield: 14.3 g (93%)).

$^1$H-NMR (400 MHz, $d_6$-DMSO): δ=1.12 (t, 6H), 2.75 (q, 4H), 6.89 (s, 2H), 11.18 (br. s, 2H).

d) Synthesis of 2,3-dichloro-5,8-diethyl-quinoxaline

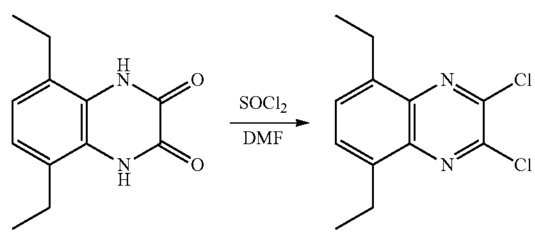

20.2 g (92.6 mmol) of 5,8-diethyl-1,4-dihydroquinoxaline-2,3-dione are slowly treated at room temperature with 50 ml (0.7 mol) of thionyl chloride. The white suspension is heated at 38° C. during two hours, followed by heating at 73° C. during 30 minutes. Thionyl chloride is distilled off and the yellow oil carefully transferred at room temperature into a beaker containing 1000 ml of water. The beige suspension is stirred during 10 minutes. The suspension is made slightly basic by the addition of sodium bicarbonate and sodium hydroxide. The suspension is further stirred during 10 minutes, followed by filtration and washing of the solid with water. The beige solid is treated with 100 ml of metanol and stirred during 10 minutes. The suspension is filtered and the solid washed with a small amount of metanol, giving the title product as a White solid (yield: 20.2 g (86%)).

$^1$H-NMR (400 MHz, $CD_2Cl_2$): δ=1.36 (t, 6H), 3.19 (q, 4H), 7.63 (s, 2H).

e) Synthesis of (3-anilino-5,8-diethyl-quinoxalin-2-yl)-phenyl-ammonium chloride

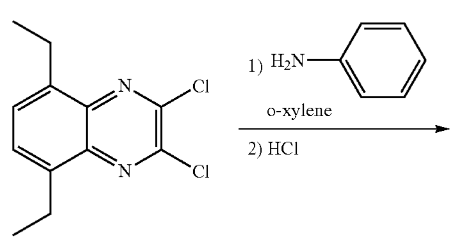

-continued

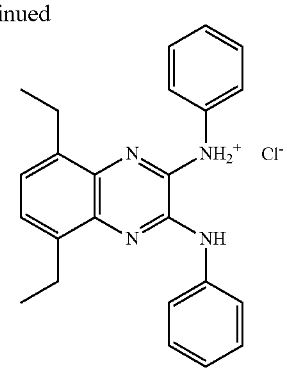

8.35 g (32.7 mmol) of 2,3-dichloro-5,8-diethyl-quinoxaline and 50 ml (0.55 mol) of aniline in 100 ml of o-xylene are heated under reflux during 18 hours. The yellow reaction mixture is cooled down to 50° C., filtered, and the solid rinsed with o-xylene. The yellow filtrate is treated with 200 ml of water and 50 ml of 25% aqueous ammonia solution, followed by stirring during 10 minutes, and dilution with 250 ml of heptane. The aqueous phase is separated and the organic phase three times washed with 300 ml of water. The organic phase is treated with 200 ml of water, and 15 ml of 37% aqueous hydrochlorid acid. The suspension is filtered and the solid stirred in 300 ml of heptane first, followed by stirring in 300 ml of water. The solid is filtered and dried under vacuum, giving the title product as a light yellow solid (yield: 9.3 g (70%)).

$^1$H-NMR (400 MHz, $d_6$-DMSO): δ=1.28 (t, 6H), 3.00 (q, 4H), 7.06 (m, 2H), 7.15 (s, 2H), 7.39 (m, 4H), 8.08 (d, 4H), 9.41 (br. s, 2H).

f) Synthesis of 2-ethoxy-5,8-diethyl-1,3-diphenyl-2H-imidazo[4,5-b]quinoxaline

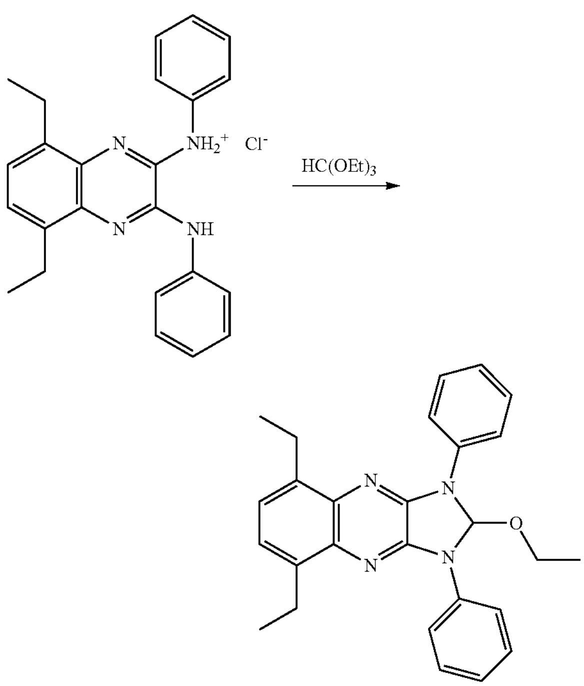

9.53 g (23.5 mmol) of (3-anilino-5,8-diethyl-quinoxalin-2-yl)-phenyl-ammonium chloride and 200 ml (1.2 mol) of triethyl orthoformate are heated under argon at 95° C. during 90 minutes. The slightly turbid orange solution is concentrated under vacuum and the resulting solid three times stirred in 50 ml of heptane. The suspension is filtered and dried under vacuum, giving the title product as a light grey solid (yield: 7.5 g (75%)).

$^1$H-NMR (400 MHz, $d_6$-DMSO): δ=0.89 (t, 3H), 1.31 (t, 6H), 3.05 (q, 4H), 3.23 (q, 2H), 7.22 (s, 2H), 7.24 (t, 2H), 7.54 (t, 4H), 7.92 (s, 1H), 8.28 (d, 4H).

g) Synthesis of Complex (III)

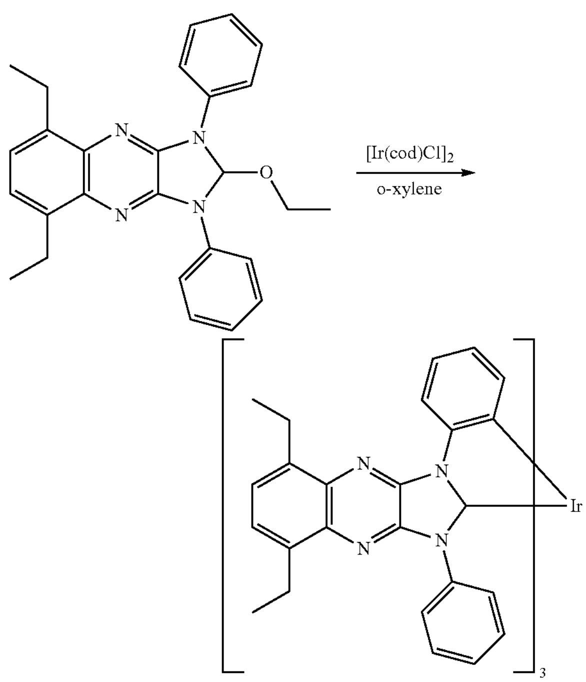

4.00 g (9.42 mmol) of 2-ethoxy-5,8-diethyl-1,3-diphenyl-2H-imidazo[4,5-b]quinoxaline and 0.63 (0.94 mmol) of chloro(1,5-cyclooctadiene)iridium(I) dimer are suspended under argon in 70 ml of o-xylene. The suspension is three times evacuated and backfilled with argon, followed by heating at 136° C. during 15 hours. The reaction mixture is cooled down to 100° C. and filtered through a 4.5 cm layer of silica gel. The silica gel layer is rinsed with o-xylene and dichloromethane. The collected filtrates are stirred over an ice-bath during 30 minutes. The suspension is filtered and the solid washed with a small amount of o-xylene, followed by drying under vacuum, giving the title product as a bright yellow solid (yield: 0.65 g (25%)).

APCI-LC-MS (positive, m/z): exact mass of $C_{75}H_{63}IrN_{12}$=1324.49; found 1325.5 $[M+1]^+$.

$^1$H-NMR (400 MHz, $CD_2Cl_2$): δ=1.19 (t, 9H), 1.59 (t, 9H), 2.88 (m, 3H), 3.00 (m, 3H), 3.49 (m, 6H), 6.49-7.41 (broad signal, 12H), 6.54 (td, 3H), 6.76 (dd, 3H), 6.89 (td, 3H), 7.29 (td, 3H), 7.54 (d, 3H), 7.63 (d, 3H), 9.09 (d, 3H).

Synthesis Example 4

Synthesis of Complex (IV)

a) Synthesis of 2,3-dianilino-quinoxaline

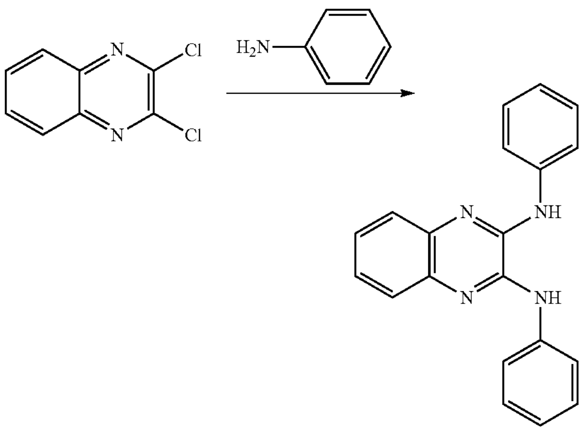

2,3-Dianilino-quinoxaline was synthetized similar to the protocol described in J. Chem. Soc. 1948, 777-782. 5.00 g (24.6 mmol) 2,3-dichloro-quinoxaline were added in portions to 25 ml aniline at 140° C. The solution was heated to 160° C. and held at that temperature for 30 min. 100 ml methyl-tert.-butylether was added to the suspension after the solution had cooled down to room temperature. The precipitate was filtered off, washed five times with 10 ml methyl-tert.-butylether each, and dried at 30° C. in a vacuum oven. The solid was suspended in 150 ml water, then filtered off, washed four times with 20 ml water each, and sucked dry. The residue was dissolved in 70 ml methylenechloride. Magnesium sulfate was added. The solution was concentrated. Then 30 ml methyl-tert.-butylether was added. The suspension was concentrated to dryness and dried at 50° C. in a vacuum oven. 8.35 g yellow solid were obtained. It was used without further purification.

$^1$H-NMR (500 MHz, $d_6$-DMSO): δ [ppm]=7.09 (mc; 2H), 7.34 (mc; 2H), 7.41 (mc; 4H), 7.55 (mc; 2H), 7.90 (mc; 4H), 9.03 (s; 2H).

b) Synthesis of 2-alkoxy-1,3-diphenyl-2H-imidazo [4,5-b]quinoxaline (i) 2-Methoxy-1,3-diphenyl-2H-imidazo[4,5-b]quinoxaline

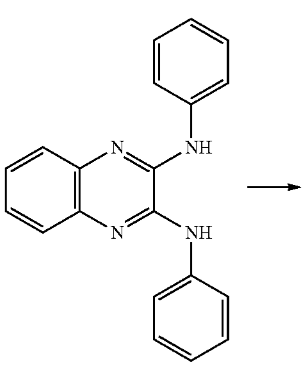

-continued

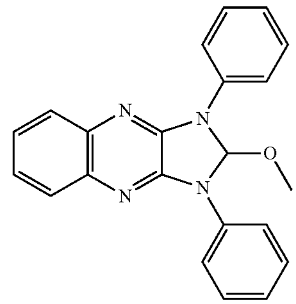

16.00 g (51.2 mmol) 2,3-dianilino-quinoxaline and 5.54 g (51.2 mmol) ammonium tetrafluoroborate were dissolved in 64 ml ortho-formic acid trimethylester. The solution was heated to 82° C. and held at that temperature for 1.5 h. After cooling to room temperature the suspension was filtered. The residue was washed three times with little cold ortho ester and then with petrol ether. The solid was dissolved in methylene chloride. The suspension was filtered to separate the product from the salt. The filtrate was concentrated to dryness. 13.7 g (75% of theory) colorless solid were isolated.

$^1$H-NMR (400 MHz, $CD_2Cl_2$): δ [ppm]=3.08 (s; 3H), 7.25 (mc; 2H), 7.36 (s; 1H), 7.41 (mc; 2H), 7.51 (mc; 4H), 7.73 (mc; 2H), 8.17 (mc; 4H)

(ii) 2-Ethoxy-1,3-diphenyl-2H-imidazo[4,5-b]quinoxaline

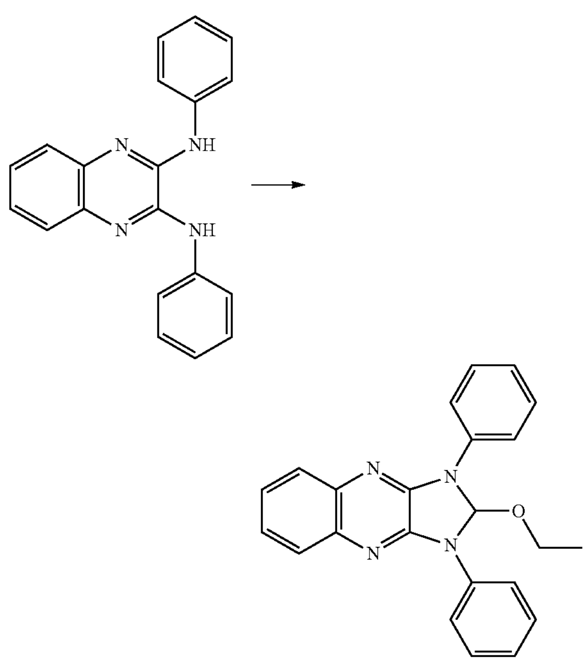

16.35 g (18.7 mmol) 2,3-dianilino-quinoxaline and 0.50 g (4.6 mmol) ammonium tetrafluoroborate were suspended in ortho-formic acid triethylester. The reaction mixture was heated to reflux for 1 h. The solution was cooled to room temperature, filtered, and concentrated to dryness. The residue was suspended in pentane, filtered, washed with pentane, and dried. 6.24 g (87% of theory) colorless solid were obtained.

$^1$H-NMR (500 MHz, $CD_2Cl_2$): δ [ppm]=1.04 (t; 3H), 3.36 (q; 2H), 7.26 (mc; 2H), 7.35 (s; 1H), 7.41 (mc; 2H), 7.51 (mc; 4H), 7.73 (mc; 2H), 8.20 (mc; 4H).

c) Synthesis of Complex (IV)

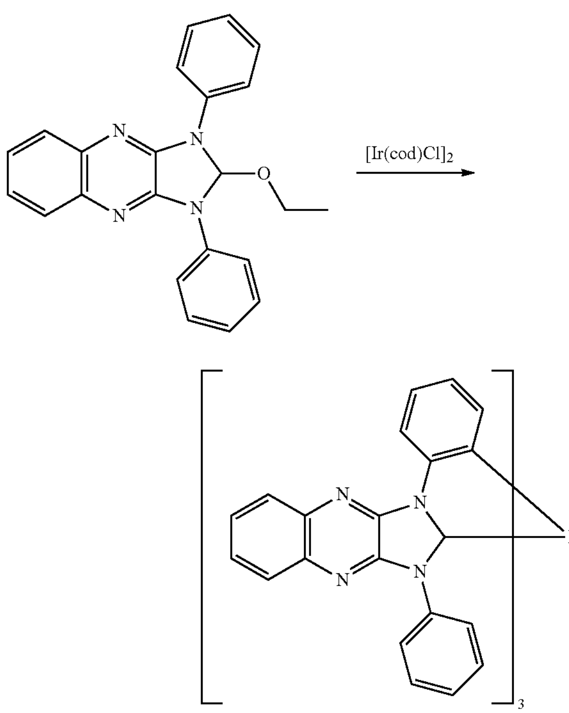

4.00 g (10.9 mmol) 2-ethoxy-1,3-diphenyl-2H-imidazo[4,5-b]quinoxaline and 0.948 g (1.41 mmol) chloro-(1,5-cyclooctadiene)-iridium(I) dimer were dissolved in 60 ml o-dichloro benzene. The suspension was heated to 150° C. and held at that temperature for 20 h. After cooling the solution to room temperature the precipitate was filtered, washed three times with 1.5 ml o-dichloro benzene each, then four times with 2 ml pentane each, and dried in a vacuum oven at 50° C. The solid was suspended in tetrahydrofurane and heated to reflux for 1 h. The hot suspension was filtered. The residue was washed with THF, pentane, and dried in a vacuum oven at 70° C. 0.902 g (28% of theory) bright yellow solid was obtained.

MALDI-MS (positive, m/z): exact mass of $C_{63}H_{39}IrN_{12}$=1156.28; found 1156 $[M+H]^+$.

$^1$H-NMR (500 MHz, $CD_2Cl_2$): δ [ppm]=6.58 (mc) 6.67 (mc), 6.84 (mc), 7.72 (mc), 7.82 (mc), 7.87 (mc), 8.32 (mc), 9.05 (mc).

Synthesis Example 5

Synthesis of Complex (V)

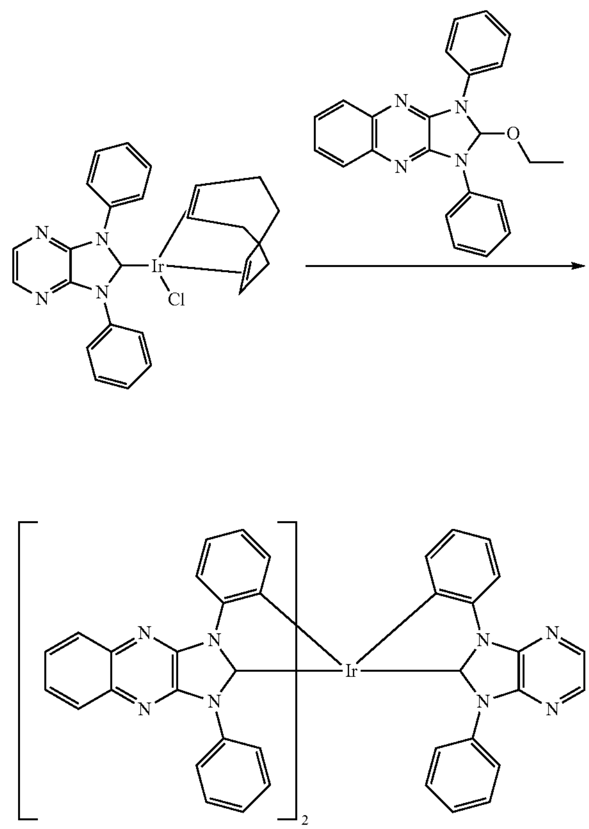

0.250 g 2-Ethoxy-1,3-diphenyl-2H-imidazo[4,5-b]quinoxaline and 0.206 g of intermediate complex (II-1) were dissolved/suspended in 18 ml o-xylene. The suspension was heated to 115° C. and held at that temperature for 43 h. The precipitate was filtered off after cooling the solution to room temperature. The filtrate was concentrated to brown resin and then suspended in methylenchloride. The solid was filtered off. The filtrate was purified at silica gel 60 (70-200 μm) with methylenchloride as the eluent. The last fractions monitored by TLC were combined and concentrated to dryness. The yellow solid (64 mg) was suspended in 5 ml methanol, then filtered off, washed three times with 1 ml methanol each, and dried at 60° C. in a vacuum oven. 53 mg (14% of theory) yellow solid were obtained.

MALDI-MS (positive, m/z): exact mass of $C_{59}H_{37}IrN_{12}$=1106.22; found 1106 $[M+H]^+$.

$^1$H-NMR (500 MHz, $CD_2Cl_2$): δ [ppm]=6.56-6.89 (m; 18H), 7.15-7.45 (m; 5H), 7.45-7.73 (m; 3H), 7.81 (mc; 2H), 7.86 (mc; 2H), 8.08 (mc; 1H), 8.31 (mc; 2H), 8.35 (mc; 1H), 8.77 (mc; 1H), 9.04 (mc; 2H).

Synthesis Example 6

Synthesis of Complex (VIa)

a) Synthesis of N2,N3-bis(4-tert-butylphenyl)quinoxaline-2,3-diamine

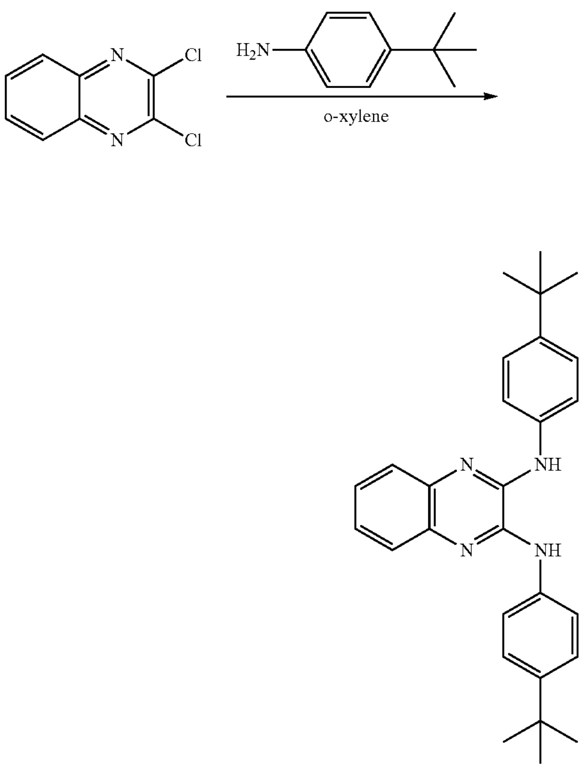

10.0 g (50.2 mmol) of 2,3-dichloroquinoxaline and 16.5 g (0.11 mol) 4-tert-butylaniline in 90 ml of o-xylene are heated at 150° C. during five hours. The reaction mixture is cooled down to room temperature, diluted with a small amount of dichloromethane and concentrated under vacuum. The mixture is treated with 200 ml of water, 200 ml of ethanol, and solid sodium carbonate is added until a basic pH is reached. The organic phase is separated and the aqueous phase extracted with dichloromethane. The combined organic phases are two times washed with water, dried over sodium sulfate, and concentrated under vacuum. The resulting brown oil is mixed with 100 ml of heptane and heated up to reflux, and the solution cooled down to room temperature. The resulting suspension is filtered, the light yellow solid dissolved in 100 ml of heptane under reflux, followed by cooling down the solution to room temperature. The suspension is filtered and the solid dried under vacuum, giving the title product as a light yellow solid (yield: 13.4 g (63%)).

b) Synthesis of [3-(4-tert-butylanilino)quinoxalin-2-yl]-(4-tert-butylphenyl)ammonium chloride

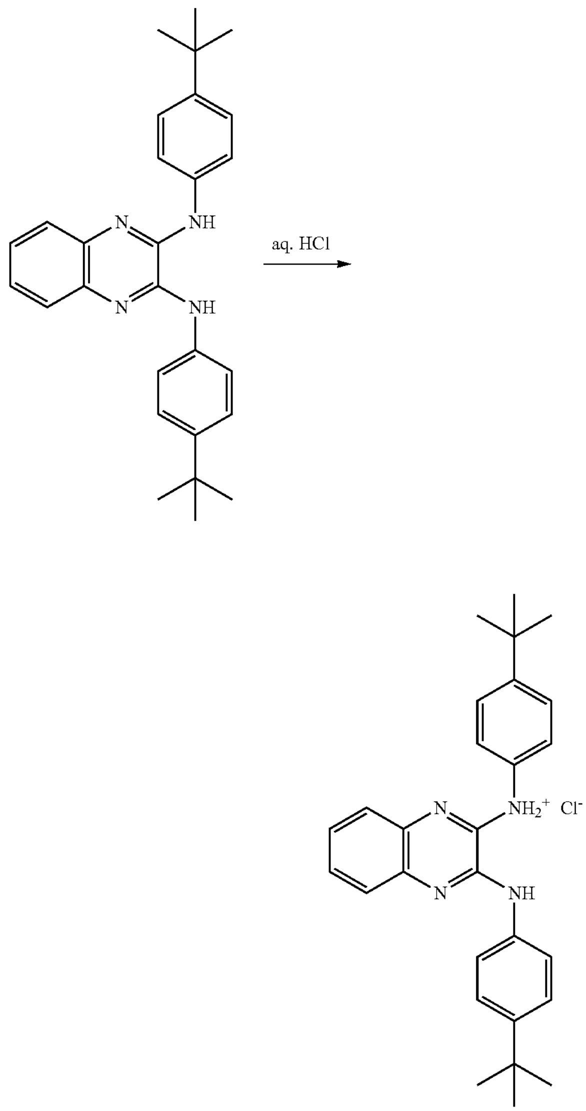 [SMILES: CC(C)(C)c1ccc(Nc2nc3ccccc3nc2Nc2ccc(C(C)(C)C)cc2)cc1 ; CC(C)(C)c1ccc(Nc2nc3ccccc3nc2[NH2+]c2ccc(C(C)(C)C)cc2)cc1 ; [Cl-]]

13.4 g (31.6 mmol) of N2,N3-bis(4-tert-butylphenyl)quinoxaline-2,3-diamine are added in several portions to 250 ml of concentrated aqueous hydrochloric acid and stirred at room temperature during one hour. The yellow suspension is carefully diluted with 300 ml of water and stirring continued for ten minutes. The suspension is filtered and the solid washed with water and further dried under vacuum, giving the title product as a yellow solid (12.1 g isolated, still including residual water).

$^1$H-NMR (400 MHz, $d_6$-DMSO): δ=1.33 (s, 18H), 7.32-7.38 (m, 2H), 7.46 (d, 4H), 7.55-7.61 (m, 2H), 7.85 (d, 4H), 10.14 (br. s, 2H).

c) Synthesis of 1,3-bis(4-tert-butylphenyl)-2-ethoxy-2H-imidazo[4,5-b]quinoxaline

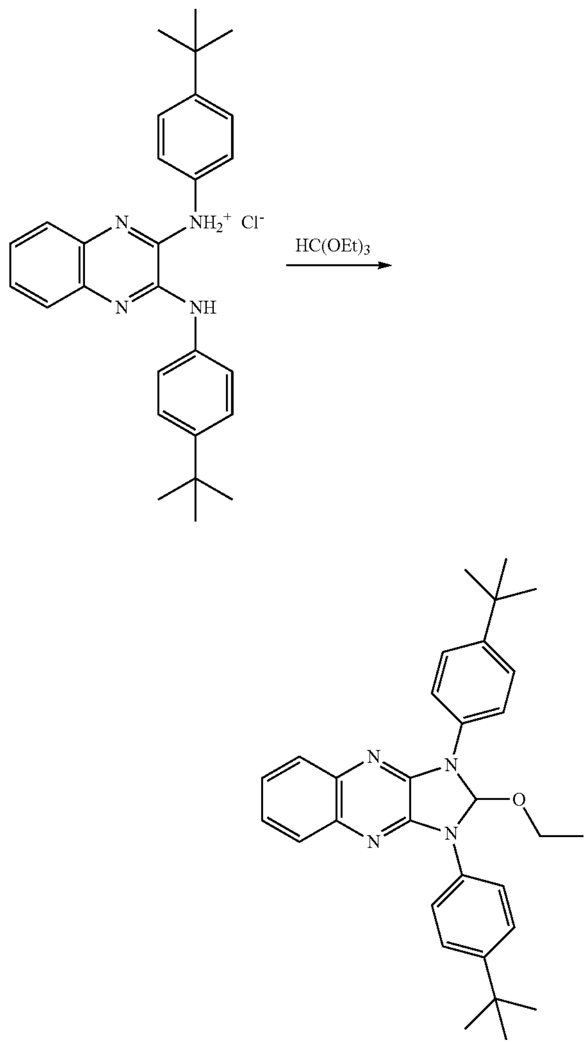

48.3 g (max. 0.1 mol, still including residual water) of [3-(4-tert-butylanilino)quinoxalin-2-yl]-(4-tert-butylphenyl) ammonium chloride and 250 ml (1.7 mol) of triethyl orthoformate are heated under argon at 95° C. during 30 minutes in a reactor fitted with a Dean-Stark separator and condenser. 100 ml (0.7 mol) of triethyl orthoformate are added to the yellow suspension and stirring continued for 30 minutes. Another 100 ml of triethyl orthoformate are added after 30 minutes, and heating continued for one hour. The yellow suspension is cooled down to room temperature, then filtered, and the yellow solid washed with ethanol. The solid is further stirred in 60 ml of ethanol, and the suspension filtered, followed by drying the solid under vacuum. The solid is stirred in 50 ml of heptane, filtered, and dried under vacuum, giving the title product as a light yellow solid (yield: 18.5 g (min. 37%)).

$^1$H-NMR (400 MHz, $d_6$-DMSO): δ=0.93 (t, 3H), 1.35 (s, 18H), 3.29 (q, 2H), 7.35-7.41 (m, 2H), 7.54-7.65 (2 m, 6H), 7.78 (s, 1H), 8.00-8.08 (m, 4H).

d) Synthesis of Complex (VIa)

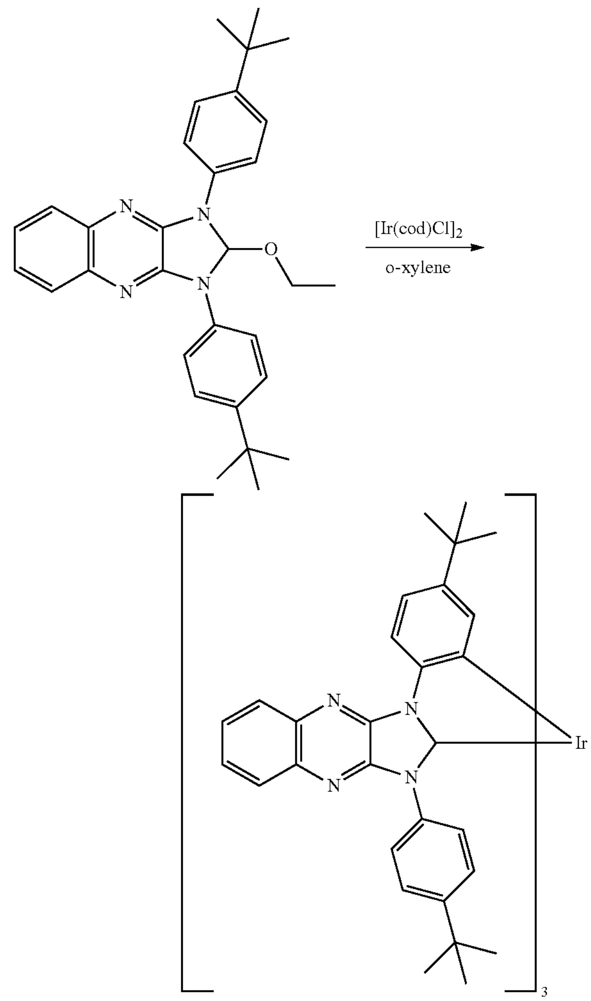

8.00 g (16.6 mmol) of 1,3-bis(4-tert-butylphenyl)-2-ethoxy-2H-imidazo[4,5-b]quinoxaline and 1.40 g (2.08 mmol) of chloro(1,5-cyclooctadiene)iridium(I) dimer are suspended under argon in 150 ml of o-xylene. The orange suspension is three times evacuated and backfilled with argon, followed by heating at 134° C. during five hours. The orange-red solution is cooled down to room temperature and diluted with 200 ml of ethanol. The resulting suspension is filtered and the yellow solid washed with ethanol. The solid is dissolved in 600 ml of dichloromethane and filtered through a 5 cm layer of silica gel followed by rinsing the silica gel layer with 300 ml of dichloromethane. The collected eluents (orange solution) is treated with 50 ml of ethyl acetate and the solution concentrated under vacuum until a suspension is formed. The suspension is filtered and the solid washed subsequently with ethyl acetate and ethanol, respectively, followed by drying under vacuum. The solid is dissolved in 500 ml of dichloromethane and 50 ml of ethyl acetate, and the solution concentrated under vacuum until a suspension is formed. The suspension is filtered, the solid washed with ethyl acetate first, then with ethanol, followed by drying under vacuum, giving the title product as a yellow solid (yield: 4.15 g (67%)).

APCI-LC-MS (positive, m/z): exact mass of $C_{87}H_{87}IrN_{12}$=1492.68; found 1493.8 $[M+1]^+$.

$^1$H-NMR (400 MHz, $CD_2Cl_2$): δ=0.79 (s, 27H), 1.10 (s, 27H), 6.09-6.23 (br. signal, 3H), 6.40-6.56 (br. signal, 6H), 6.68 (d, 3H), 7.29 (dd, 3H), 7.47-7.62 (br. signal, 3H), 7.68-7.75 (m, 3H), 7.78-7.91 (m, 6H), 8.35 (dd, 3H), 9.01 (d, 3H).

Synthesis Example 7

Synthesis of Complex (VII)

a) Synthesis of Complex Intermediate (VII-a)

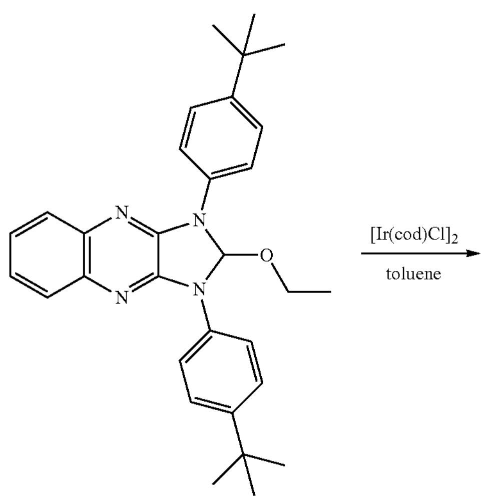

-continued

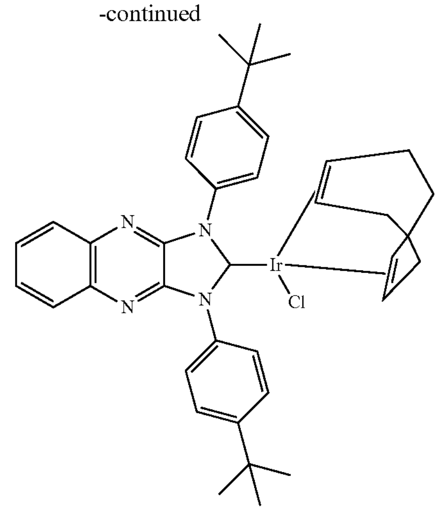

2.34 g (3.48 mmol) of chloro(1,5-cyclooctadiene)iridium (I) dimer are suspended in 100 ml of toluene. The suspension is three times evacuated and backfilled with argon and heated up to 77° C. 3.35 g (6.97 mmol) of 1,3-bis(4-tert-butylphenyl)-2-ethoxy-2H-imidazo[4,5-b]quinoxaline are added in small portions, and heating continued at 78° C. during 19 hours. The brown solution is cooled down to room temperature and concentrated under vacuum. The resulting red solid is dissolved in dichloromethane first, followed by the addition of and 50 ml of ethanol. The solution is concentrated under vacuum until a suspension is formed. The suspension is filtered, the solid washed with ethanol and heptane, followed by drying under vacuum, giving the title product as a yellow solid (yield: 3.10 g (58%)).

$^1$H-NMR (400 MHz, $CDCl_3$): δ=1.30-1.52 (m, 4H), 1.47 (s, 18H), 1.53-1.65 (m, 2H), 1.69-1.82 (m, 2H), 2.46-2.55 (m, 2H), 4.72-4.81 (m, 2H), 7.68 (d, 2H), 7.73-7.79 (d, 4H), 8.11-8.20 (m, 6H).

b) Synthesis of Complex (VII)

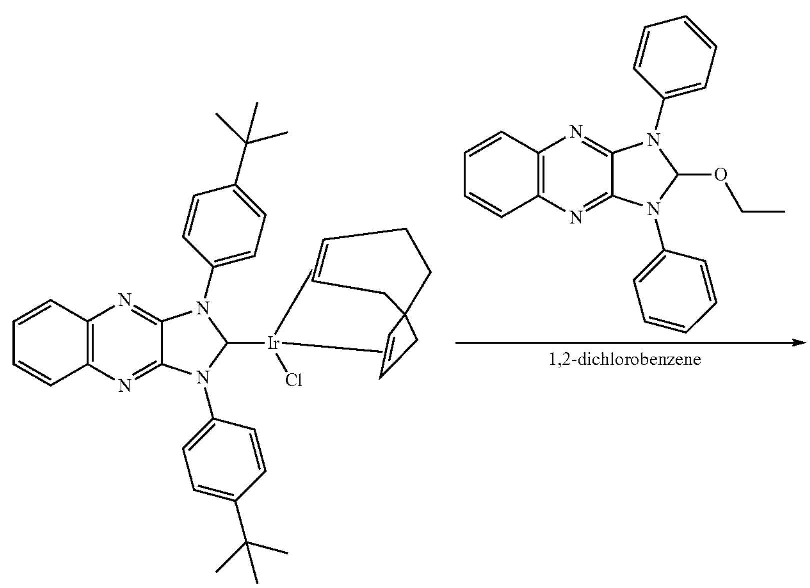

-continued

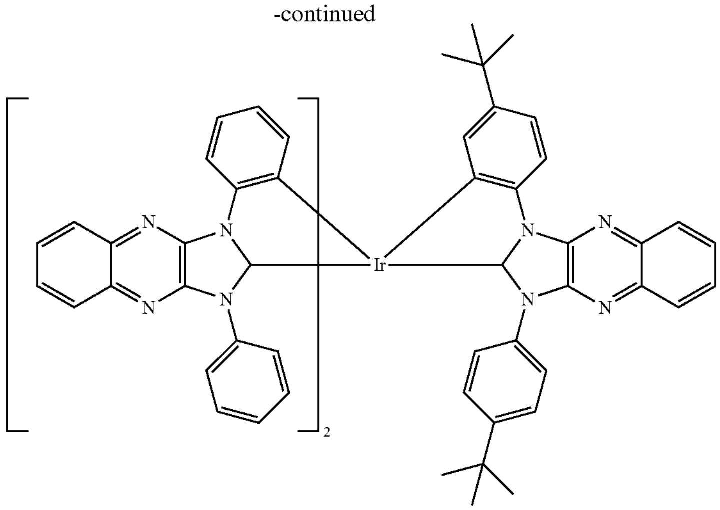

2.50 g (3.24 mmol) of complex intermediate (VII-a) and 2.39 g (6.49 mmol) of 2-ethoxy-1,3-diphenyl-2H-imidazo [4,5-b]quinoxaline are suspended under argon in 50 ml of 1,2-dichlorobenzene. The orange-red suspension is three times evacuated and backfilled with argon, followed by heating at 117° C. during 20 hours. The reaction mixture is diluted with 50 ml of acetone, then filtered, and the solid washed with acetone. The combined filtrates are concentrated under vacuum, then dissolved in dichloromethane, followed by the addition of 50 ml of acetone. The solution is concentrated under vacuum until a suspension is formed. The suspension is filtered, the solid washed with acetone and ethanol, followed by drying under vacuum. The solid is further purified by chromatography (silica gel, dichloromethane), giving the title product as a yellow solid (yield: 1.05 g (25%)).

APCI-LC-MS (positive, m/z): exact mass of $C_{71}H_{55}IrN_{12}$=1268.43; found 1269.6 $[M+1]^+$.

$^1$H-NMR (400 MHz, $CD_2Cl_2$): δ=0.72 (s, 9H), 1.08 (s, 9H), 6.08-8.07 (br. signals, 12H), 6.62-6.76 (m, 5H), 6.86-6.93 (m, 2H), 7.24-7.33 (m, 3H), 7.69-7.79 (m, 3H), 7.81-7.88 (m, 4H), 7.88-7.94 (m, 2H), 8.32-8.39 (m, 3H), 8.95 (d, 1H), 9.09 (d, 1H), 9.15 (d, 1H).

Synthesis Example 8

Synthesis of Complex (VIII)

a) Synthesis of Complex Intermediate (VIII-a)

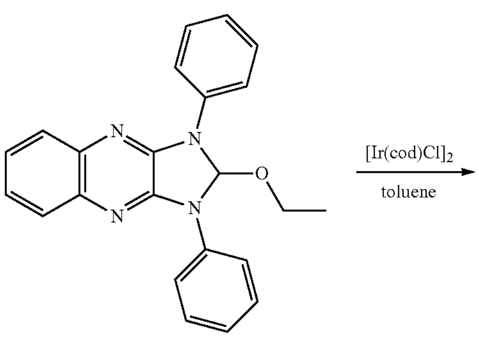

-continued

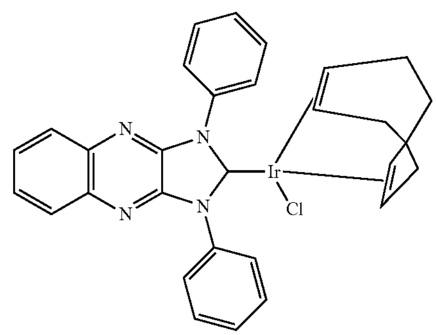

3.00 g (4.47 mmol) of chloro(1,5-cyclooctadiene)iridium (I) dimer are suspended in 50 ml of toluene. The suspension is three times evacuated and backfilled with argon and heated up to 75° C. A solution of 3.29 g (8.92 mmol) of 2-ethoxy-1,3-diphenyl-2H-imidazo[4,5-b]quinoxaline in 100 ml of toluene is added within two hours, and heating continued at 75° C. during 21 hours. The reaction mixture is concentrated under vacuum and the residue dissolved in dichloromethane and a small amount of ethanol. The solution is concentrated under vacuum until a suspension is formed. The suspension is filtered, the solid washed with ethanol, and further dried under vacuum, giving the title product as a yellow solid (yield: 2.70 g (46%)).

$^1$H-NMR (400 MHz, $CDCl_3$): δ=1.31-1.87 (4 m, 8H), 2.53-2.62 (m, 2H), 4.74-4.84 (m, 2H), 7.59-7.72 (m, 6H), 7.73-7.79 (m, 2H), 8.09-8.16 (m, 2H), 8.22-8.29 (m, 4H).

b) Synthesis of Complex (VIII)

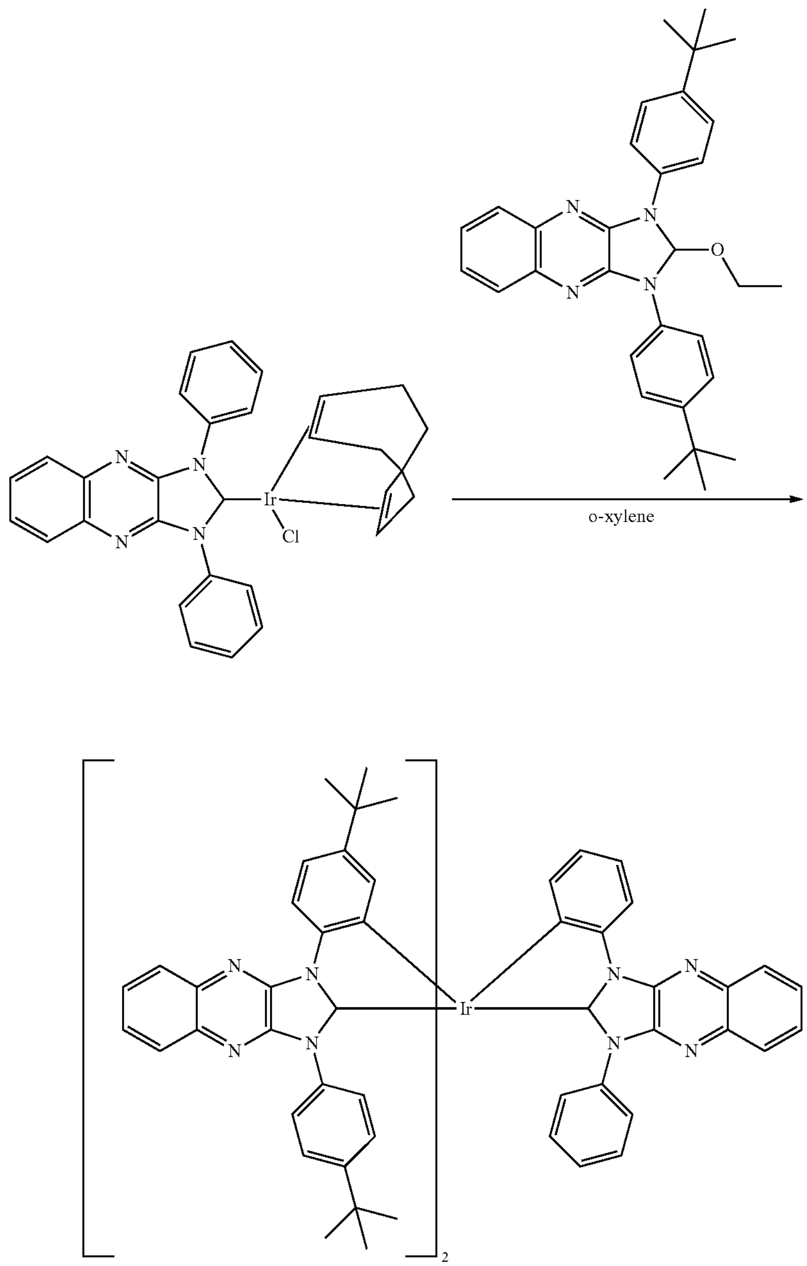

0.80 g (1.21 mmol) of complex intermediate (VIII-a) and 1.17 g (2.43 mmol) of 1,3-bis(4-tert-butylphenyl)-2-ethoxy-2H-imidazo[4,5-b]quinoxaline are suspended under argon in 25 ml of o-xylene. The orange suspension is three times evacuated and backfilled with argon, followed by heating at 138° C. during three hours. The orange suspension is cooled down to room temperature and filtered. The filtrate is concentrated under vacuum and the resulting thick oil dissolved in dichloromethane first, followed by the addition of 30 ml of ethanol. The orange-red solution is concentrated under vacuum until a suspension is formed. The yellow suspension is filtered and the solid dried under vacuum. The solid is further purified by chromatography (silica gel, heptane/ethyl acetate). The isolated product is dissolved in dichloromethane, followed by the addition of ethanol. The solution is concentrated under vacuum until a suspension is formed. The suspension is filtered, the solid washed with ethanol and further dried under vacuum, giving the title product as a yellow solid (yield: 179 mg (11%)).

APCI-LC-MS (positive, m/z): exact mass of $C_{79}H_{71}IrN_{12}$=1380.56; found 1381.7 $[M+1]^+$.

$^1$H-NMR (400 MHz, $CD_2Cl_2$): δ=0.75 (s, 18H), 1.08 (s, 9H), 1.10 (s, 9H), 6.03-7.69 (br. signals, 8H), 6.49 (br. d, 2H), 6.56 (d, 2H), 6.62-6.71 (m, 3H), 6.75 (d, 1H), 6.89 (dt, 1H), 7.24-7.32 (m, 3H), 7.69-7.79 (m, 3H), 7.79-7.95 (m, 6H), 8.32-8.40 (m, 3H), 8.94 (d, 1H), 9.00 (d, 1H), 9.15 (dd, 1H).

Synthesis Example 9

Synthesis of Complex (IX)

a) Synthesis of 1-methyl-2-(4-nitrophenyl)benzene

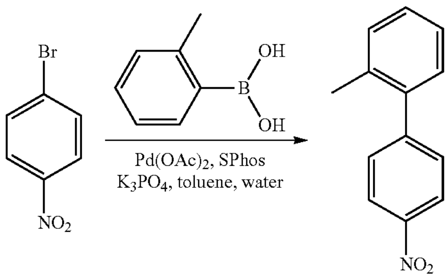

57.6 g (0.29 mol) of 1-bromo-4-nitrobenzene together with 50.0 g (0.37 mol) of o-tolylboronic acid, 161 g (0.70 mol) of potassium phosphate tribasic monohydrate, 1.72 g (4.19 mmol) of 2-dicyclohexylphosphino-2',6'-dimethoxy-biphenyl, and 314 mg (1.40 mmol) of palladium(II) acetate are suspended in 500 ml of toluene and 100 ml of water at room temperature under argon. The suspension is three times evacuated and backfilled with argon, followed by heating under reflux for two hours. The dark reaction mixture is cooled down to room temperature, diluted with toluene, and the resulting mixture two times extracted with water. The organic phase is dried over magnesium sulfate and concentrated under vacuum. The resulting solid is recrystallized from 2-propanol, giving the title product as an orange solid (yield: 39.3 g (66%)).

$^1$H-NMR (400 MHz, $CD_2Cl_2$): δ=2.31 (s, 3H), 7.25-7.39 (m, 4H), 7.52-7.58 (m, 2H), 8.27-8.33 (m, 2H).

b) Synthesis of 4-(o-tolyl)aniline

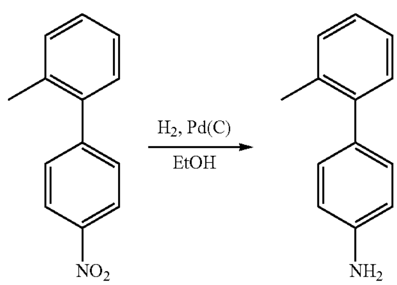 [SMILES: "EtOH" ; Cc1ccccc1-c1ccc([N+](=O)[O-])cc1 ; Cc1ccccc1-c1ccc(N)cc1]

39.3 g (0.18 mol) of 1-methyl-2-(4-nitrophenyl)benzene and 2.25 g of 10 wt %-palladium on carbon in 400 ml of ethanol are reacted in a pressure reactor under 2 bar hydrogen pressure at 35° C. during 5 hours. The reaction mixture is cooled down to room temperature and the reactor flooded with argon. The reaction mixture is filtered through a layer of Hyflo® filter aid and rinsed with additional ethanol, followed by drying under vacuum. The residual oil is further purified by distillation under vacuum (0.3 mbar/140° C.), giving the title product as a beige solid (yield: 22.0 g (65%)).

$^1$H-NMR (300 MHz, $CD_2Cl_2$): δ=2.35 (s, 3H), 3.80 (br. s, 2H), 6.75-6.82 (m, 2H), 7.15-7.21 (m, 2H), 7.24-7.35 (m, 4H).

c) Synthesis of N2,N3-bis[4-(o-tolyl)phenyl]quinoxaline-2,3-diamine

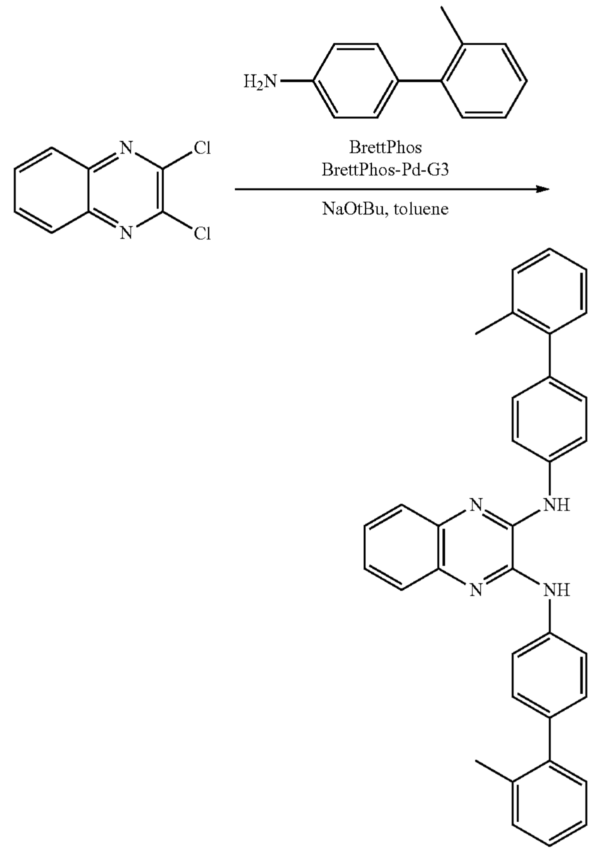

10.2 g (55.7 mmol) of 4-(o-tolyl)aniline and 6.40 g (66.6 mmol) of sodium tert-butoxide in 100 ml of toluene are three times evacuated and backfilled with argon. 135 mg (0.25 mmol) of BrettPhos ligand [=2-(dicyclohexylphosphino)3, 6-dimethoxy-2',4',6'-triisopropyl-1,1'-biphenyl, CAS No. 1070663-78-3] and 201 mg (0.25 mmol) of BrettPhos-Pd-G3 palladacycle {=[(2-dicyclohexylphosphino-3,6-dimethoxy-2',4',6'-triisopropyl-1,1'-biphenyl)-2-(2'-amino-1,1'-biphenyl)]palladium(II) methanesulfonate methanesulfonate, CAS No. 1470372-59-8} are added, followed by the addition of 5.00 g (25.1 mmol) of 2,3-dichloroquinoxaline. The suspension is heated under reflux during 4 hours, then cooled down to room temperature, and diluted with toluene and water. The water phase is separated, and the organic phase two times extracted with water. The organic phase is dried over magnesium sulfate first, then filtered, and the solution further filtered through a 4 cm layer of silica gel, followed by rinsing the silica gel layer with toluene. The combined eluents are concentrated under vacuum, and the residual resin stirred in toluene first, followed by the addition of half concentrated hydrochloric acid solution. Stirring is continued until a suspension is formed. The suspension is filtered, the solid washed with heptane, and then further suspended in a mixture of heptane and water. Concentrated aqueous sodium hydroxide solution is added until a basic pH is reached. The suspension is filtered, the solid washed with heptane, followed by drying under vacuum, giving the title product as a beige solid (yield: 1.68 g (14%)).

d) Synthesis of [3-[4-(o-tolyl)anilino]quinoxalin-2-yl]-[4-(o-tolyl)phenyl]ammonium chloride

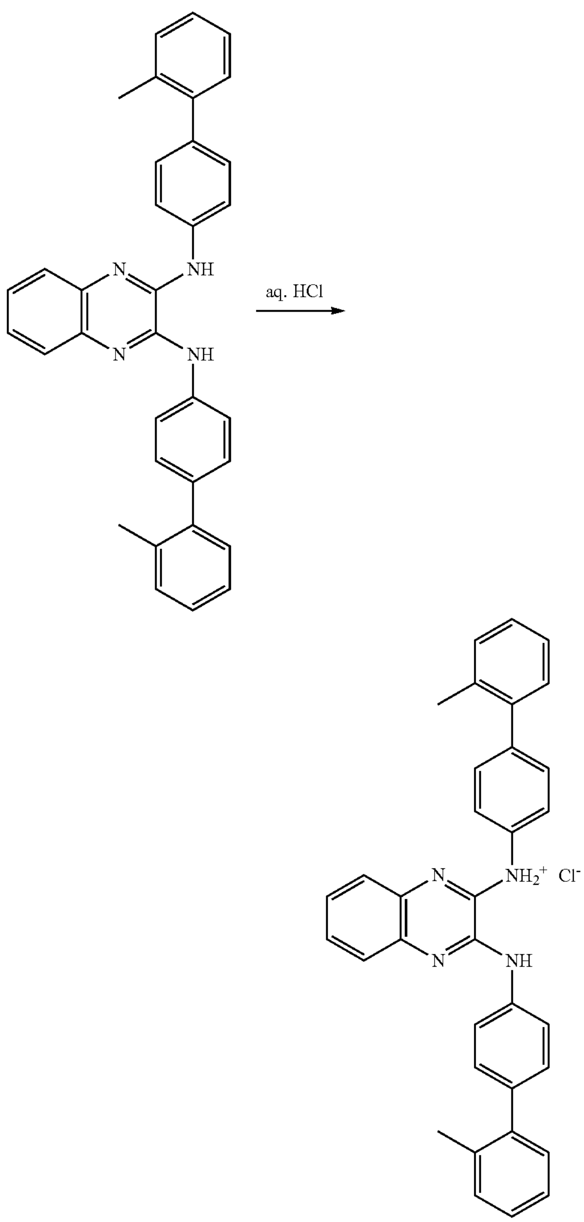

1.68 g (3.41 mmol) of N2,N3-bis[4-(o-tolyl)phenyl]quinoxaline-2,3-diamine are treated with 50 ml of concentrated aqueous hydrochloric acid and stirred at room temperature during 30 minutes. The orange suspension is carefully diluted with 50 ml of water first, then filtered, and the solid dried under vacuum, giving the title product as a yellow solid (2.3 g isolated, still including residual water).

e) Synthesis of 2-ethoxy-1,3-bis[4-(o-tolyl)phenyl]-2H-imidazo[4,5-b]quinoxaline

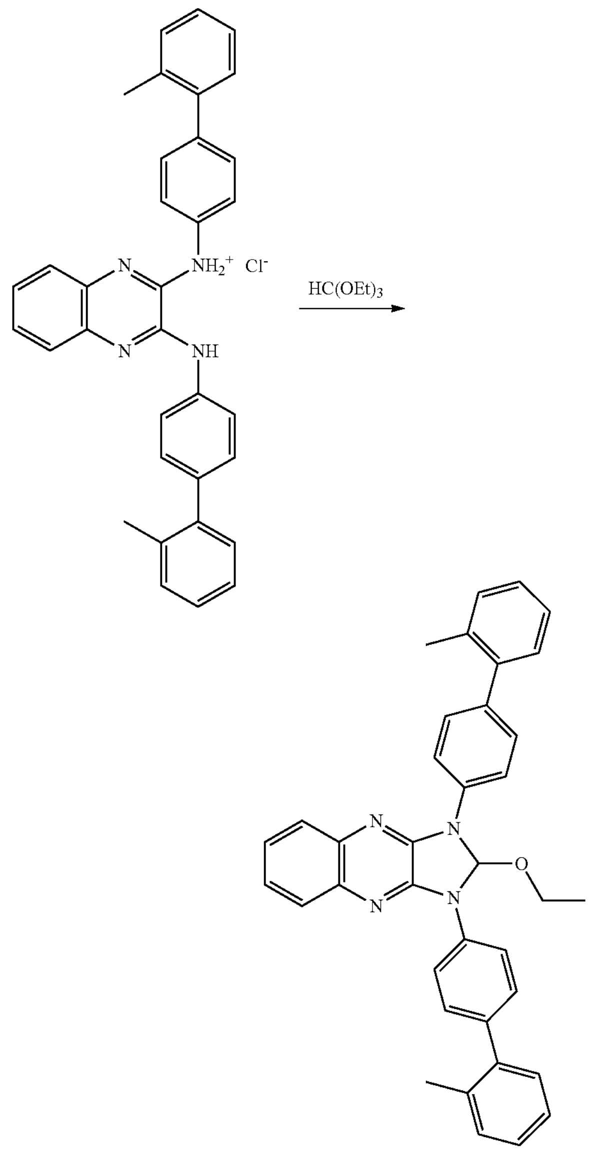

2.3 g (max. 4.3 mmol, still including residual water) of [3-[4-(o-tolyl)anilino]quinoxalin-2-yl]-[4-(o-tolyl)phenyl] ammonium chloride and 30 ml of triethyl orthoformate are heated under argon at 100° C. during one hour in a reactor fitted with a Dean-Stark separator and condenser. The reaction mixture is cooled down to room temperature and concentrated under vacuum until a suspension formed. The suspension is diluted with heptane, then filtered, and the solid dissolved in dichloromethane. The solution is treated with ethanol, and concentrated under vacuum until a suspension is formed. The suspension is filtered, the solid washed with ethanol, followed by drying under vacuum, giving the title product as a yellow solid (yield: 1.70 g (minimum 71%)).

$^1$H-NMR (300 MHz, $CD_2Cl_2$): δ=1.16 (t, 3H), 2.40 (s, 6H), 3.49 (q, 2H), 7.27-7.40 (m, 8H), 7.44-7.58 (m, 7H), 7.77-7.85 (m, 2H), 8.28-8.38 (m, 4H).

f) Synthesis of Complex Intermediate (IX-a)

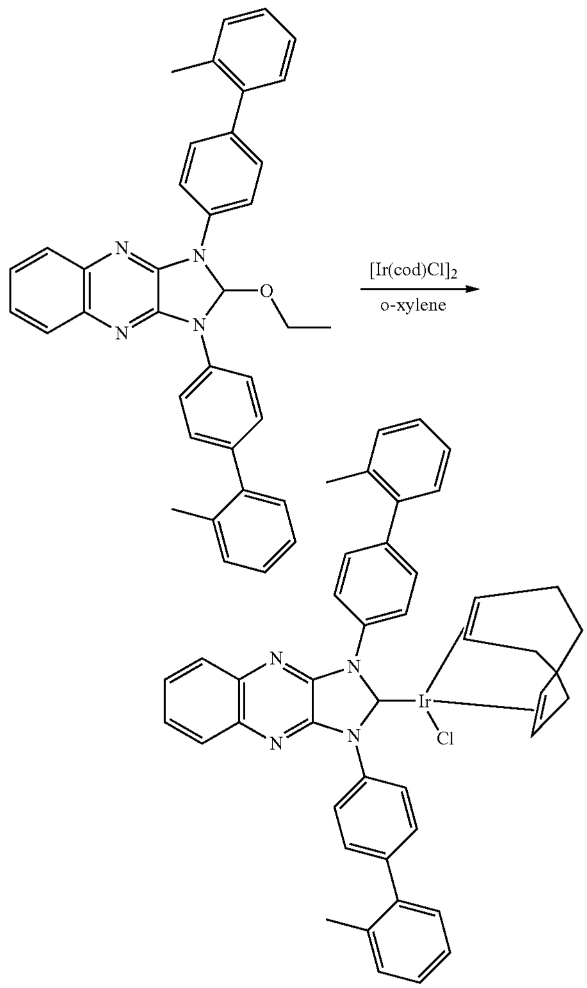

1.63 g (2.97 mmol) of 2-ethoxy-1,3-bis[4-(o-tolyl)phenyl]-2H-imidazo[4,5-b]quinoxaline are dissolved under argon in 50 ml of o-xylene. 1.06 g (1.58 mmol) of chloro (1,5-cyclooctadiene)-iridium(I) dimer are added and the resulting orange solution three times evacuated and back-filled with argon, followed by heating at 110° C. during two hours. The heating bath is removed, the red solution treated with 50 ml of ethanol, followed by further cooling down to room temperature under stirring. The resulting orange suspension is further stirred during 30 minutes, then filtered, and the solid washed with 50 ml of ethanol. The solid is dissolved in dichloromethane and filtered through a 2.5 cm layer of silica gel, followed by rinsing the silica gel layer with dichloromethane. The combined eluents are diluted with 150 ml of ethanol and concentrated under vacuum until a suspension is formed. The suspension is filtered, the solid washed with ethanol, followed by drying under vacuum, giving the title product as a yellow solid (yield: 0.95 g (38%)).

$^1$H-NMR (400 MHz, $CD_2Cl_2$): δ=1.44-1.56 (m, 2H), 1.57-1.76 (m, 4H), 1.81-1.96 (m, 2H), 2.47 (s, 6H), 2.69-2.77 (m, 2H), 4.75-4.85 (m, 2H), 7.33-7.48 (m, 8H), 7.64-7.72 (m, 4H), 7.81-7.88 (m, 2H), 8.15-8.22 (m, 2H), 8.31-8.38 (m, 4H).

g) Synthesis of Complex (IX)

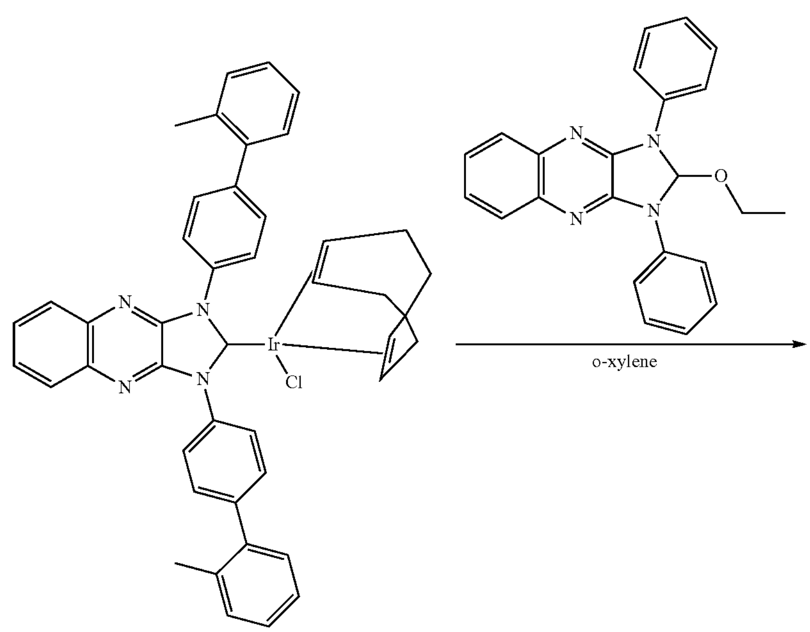

-continued

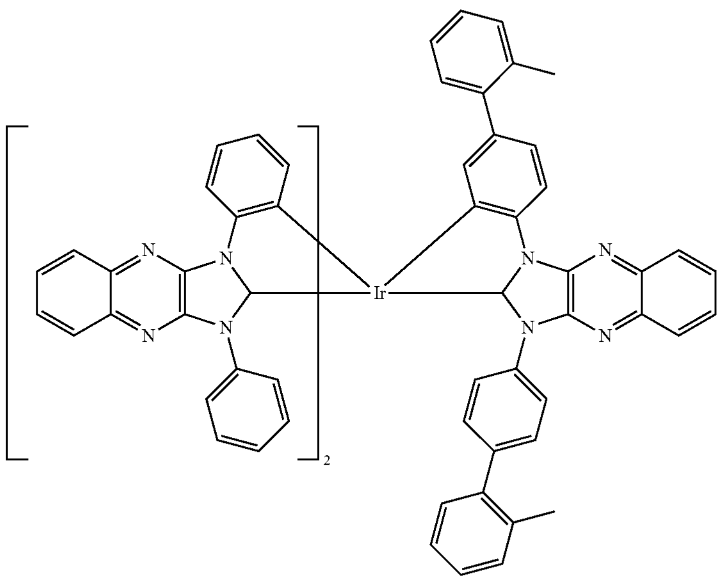

0.95 g (1.13 mmol) of complex intermediate (IX-a) and 1.67 g (4.53 mmol) of 2-ethoxy-1,3-diphenyl-2H-imidazo[4,5-b]quinoxaline are suspended under argon in 50 ml of o-xylene. The yellow suspension is three times evacuated and backfilled with argon, followed by heating at 124° C. during two hours. The orange suspension is cooled down to room temperature, then concentrated under vacuum, and further purified by chromatography (silica gel, toluene/dichloromethane). The pure product fractions are concentrated under vacuum, and the resulting solid dissolved in dichloromethane, followed by the addition of ethanol. The solution is concentrated under vacuum until a suspension is formed. The suspension is filtered, the solid washed with ethanol, followed by drying under vacuum, giving 0.7 g product. The solid is heated in 30 ml of DMF during one hour at 130° C. first, then at room temperature during 30 minutes. The resulting suspension is filtered, the solid two times washed with ethanol, followed by drying under vacuum, giving the title product as a yellow solid (yield: 0.5 g (33%)).

APCI-LC-MS (positive, m/z): exact mass of $C_{77}H_{51}IrN_{12}$=1336.40; found 1337.5 $[M+1]^+$.

$^1$H-NMR (400 MHz, $CD_2Cl_2$): δ=1.97 (s, 3H), 2.04 (s, 3H), 6.05 (d, 1H), 6.16-8.04 (br. signal, 12H), 6.58-6.70 (m, 4H), 6.72 (d, 1H), 6.79-6.89 (m, 2H), 6.90-6.96 (m, 1H), 6.99-7.07 (m, 2H), 7.09-7.15 (m, 3H), 7.15-7.39 (m, 4H), 7.65-7.94 (m, 8H), 7.99 (dd, 1H), 8.27 (dd, 1H), 8.34 (dd, 1H), 8.39 (dd, 1H), 9.03 (dd, 1H), 9.11-9.17 (m, 2H).

Synthesis Example 10

Synthesis of Complex (X)

a) Synthesis of N2,N3-bis(m-tolyl)quinoxaline-2,3-diamine

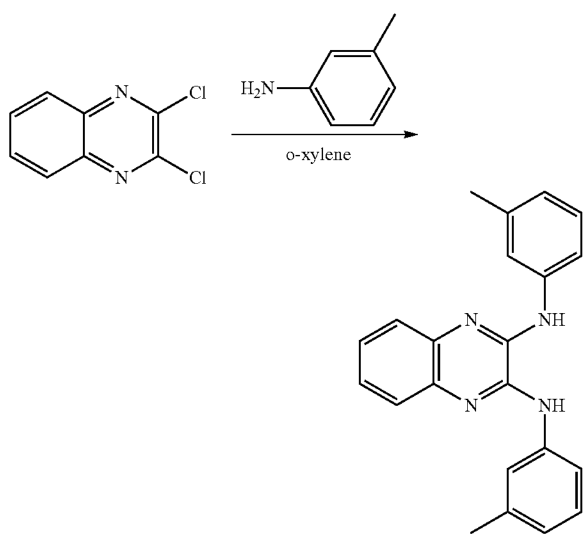

10.0 g (50.2 mmol) of 2,3-dichloroquinoxaline and 12.0 g (0.11 mol) of m-toluidine in 70 ml of o-xylene are heated at 143° C. during one hour. The reaction mixture is cooled down to room temperature and treated with a small amount of 25% aqueous ammonia solution. The mixture is two times extracted with 500 ml of water, and the organic phase dried over magnesium sulfate and concentrated under vacuum.

The dark brown oil is stirred at room temperature in 250 ml of heptane, and heated up to 40° C. The resulting suspension is stirred over an ice-bath during 15 minutes. The beige suspension is filtered and the solid dissolved in 300 ml of toluene, then treated with 10 ml of concentrated aqueous hydrochloric acid, and stirred at room temperature during 15 minutes. The suspension is filtered, the resulting solid washed with toluene first, followed by stirring in 250 ml of heptane and 50 ml of water. 30 g of a 33% aqueous sodium hydroxide solution are added and the mixture stirred during one hour. The resulting suspension is filtered, the solid washed with heptane, followed by drying under vacuum, giving the title product as a light yellow solid (yield: 5.07 g (30%)).

$^1$H-NMR (400 MHz, $d_6$-DMSO): δ=2.36 (s, 6H), 6.90 (d, 2H), 7.28 (t, 2H), 7.34 (dd, 2H), 7.54 (dd, 2H), 7.74 (s, 2H), 7.81 (d, 2H), 9.16 (br. s, 2H).

b) Synthesis of [3-(3-methylanilino)quinoxalin-2-yl]-(m-tolyl)ammonium chloride

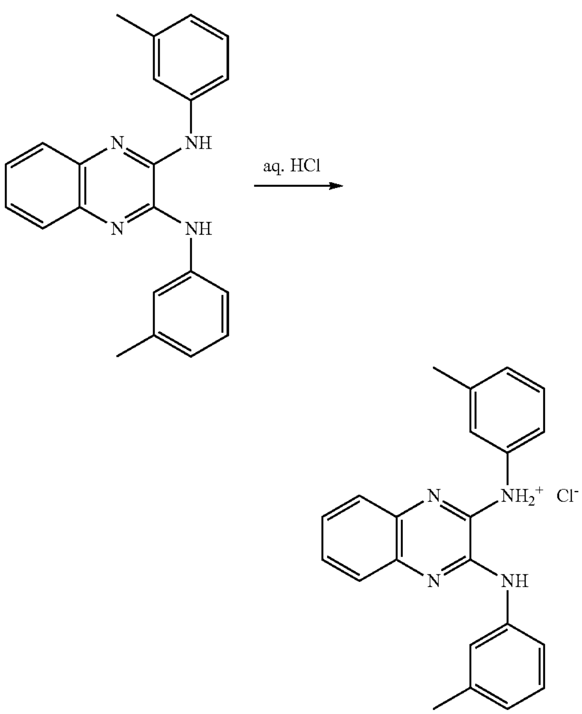

5.07 g (14.9 mmol) of [3-(3-methylanilino)quinoxalin-2-yl]-(m-tolyl)ammonium chloride are treated with 25 ml of concentrated aqueous hydrochloric acid and stirred at room temperature during 20 minutes. 50 ml of water are added and the suspension stirred during 10 minutes. The yellow suspension is filtered, the solid washed with a small amount of water, followed by drying under vacuum, giving the title compound as a yellow solid (4.57 g isolated, still including residual water).

$^1$H-NMR (400 MHz, $d_6$-DMSO): δ=2.37 (s, 6H), 7.01 (d, 2H), 7.33 (t, 2H), 7.37 (dd, 2H), 7.61 (dd, 2H), 7.72-7.85 (m, 4H), 10.41 (br. s, 2H).

c) Synthesis of 2-ethoxy-1,3-bis(m-tolyl)-2H-imidazo[4,5-b]quinoxaline

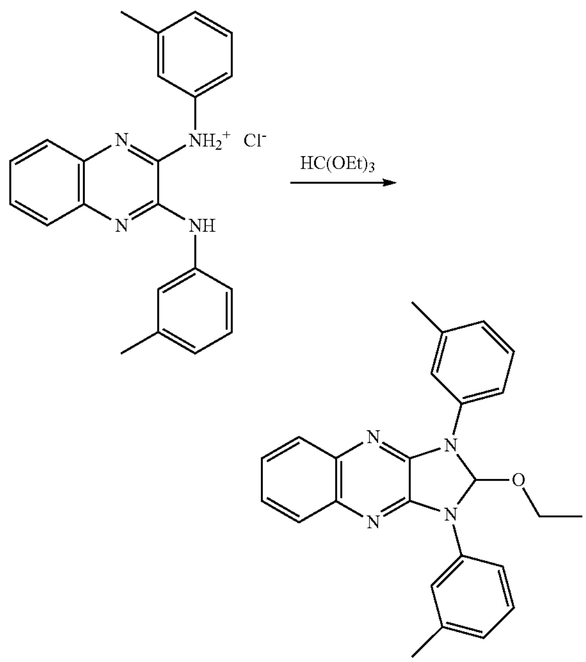

4.57 g (max. 14.9 mmol, still including residual water) of [3-(3-methylanilino)quinoxalin-2-yl]-(m-tolyl)ammonium chloride and 75 ml of triethyl orthoformate are heated under argon at 105° C. during one hour in a reactor fitted with a Dean-Stark separator and condenser. The resulting solution is treated with a small amount of active charcoal first, and then cooled down under stirring until 40° C. are reached, followed by filtration over a 4 cm silica gel layer. The silica gel layer is rinsed with a small amount of ethanol and the combined eluents concentrated under vacuum. The resulting oil is stirred at room temperature in 50 ml of heptane until a solid is precipitating. The resulting suspension is filtered, the solid washed with heptane, followed by drying under vacuum, giving the title product as a white solid (yield: 3.74 g (78%)).

$^1$H-NMR (300 MHz, $d_6$-DMSO): δ=0.89 (t, 3H), 2.42 (s, 6H), 3.25 (q, 2H), 7.09 (d, 2H), 7.34-7.48 (m, 4H), 7.60-7.70 (m, 2H), 7.83 (s, 1H), 7.92-8.06 (m, 4H).

d) Synthesis of Complex (X)

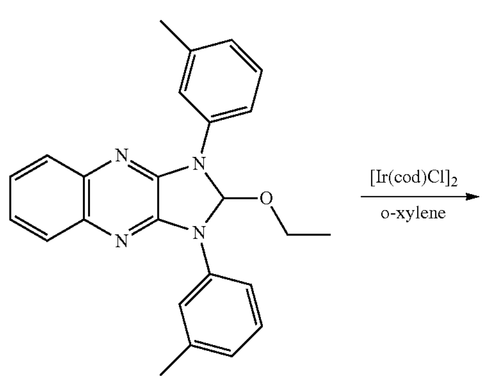

-continued

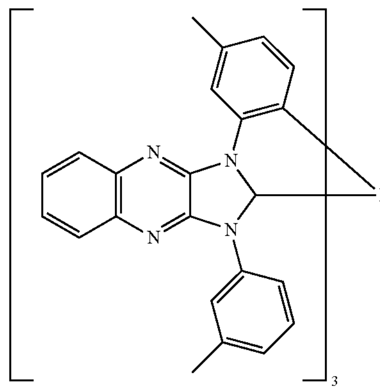

-continued

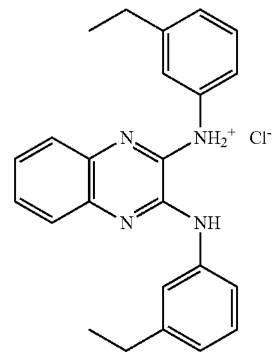

75 ml of o-xylene are three times evacuated and backfilled with argon and heated up to 130° C. 0.52 g (0.77 mmol) of chloro(1,5-cyclooctadiene)iridium(I) dimer are added first and the orange suspension stirred during 5 minutes, followed by the addition of 3.03 g (7.46 mmol) of 2-ethoxy-1,3-bis(m-tolyl)-2H-imidazo[4,5-b]quinoxaline. The suspension is heated under reflux during 17 hours, then cooled down to 80° C., and poured into 300 ml of ethanol. The wine-red suspension is further cooled down to room temperature, and stirring continued for one hour. The suspension is filtered, and the solid washed with ethanol. The solid is dissolved in 600 ml of dichloromethane, followed by the addition of 200 ml of ethyl acetate, and concentration under vacuum until a suspension is formed. The suspension is further stirred at room temperature during 30 minutes, followed by filtration. The solid is washed with ethanol, followed by drying under vacuum, giving the title product as a yellow solid (0.91 g (47%)).

APCI-LC-MS (positive, m/z): exact mass of $C_{69}H_{51}IrN_{12}$=1240.40; found 1241.5 $[M+1]^+$.

Synthesis Example 11

Synthesis of Complex (XI)

a) Synthesis of [3-(3-ethylanilino)quinoxalin-2-yl]-(3-ethylphenyl)ammonium chloride

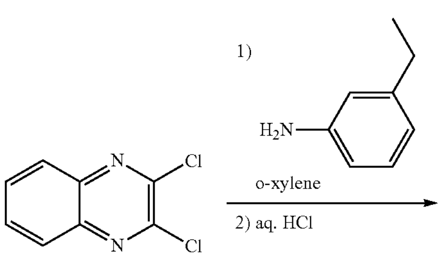

3.05 g (15.3 mmol) of 2,3-dichloroquinoxaline and 4.10 g (33.8 mmol) of 3-ethylaniline in 25 ml of o-xylene are heated at 122° C. during two hours. The resulting yellow thick suspension is cooled down to room temperature and treated with 100 ml of heptane. The mixture is further stirred under heating, then cooled down to room temperature and treated with 50 ml of 25% aqueous ammonia solution first, followed by the addition of 300 ml of water together with 50 ml of heptane and 50 ml of toluene, and further stirred at room temperature for 30 minutes. The organic phase is three times washed with 200 ml of water and treated with 30 ml of concentrated hydrochloric acid. The suspension is filtered, the solid washed with heptane, followed by washing with a 4:1-mixture of water and ethanol. The solid is further dried under vacuum, giving the title product as a slightly yellow solid (5.9 g isolated, still including residual water).

$^1$H-NMR (300 MHz, $d_6$-DMSO): δ=1.25 (t, 6H), 2.67 (q, 4H), 6.97-7.05 (m, 2H), 7.29-7.43 (m, 4H), 7.54-7.63 (m, 2H), 7.74-7.86 (m, 4H), 10.12 (br. s, 2H).

b) Synthesis of 2-ethoxy-1,3-bis(3-ethylphenyl)-2H-imidazo[4,5-b]quinoxaline

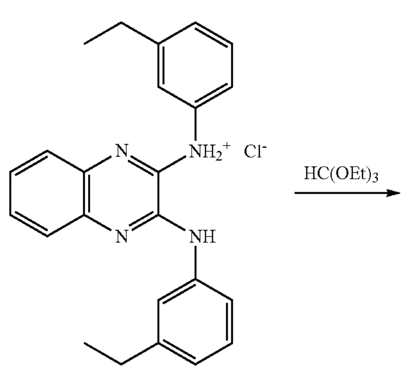

-continued

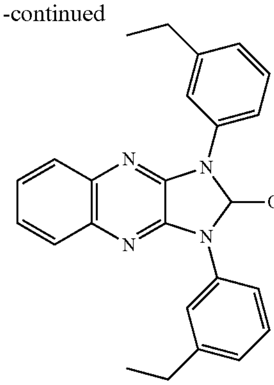

A yellow suspension of 5.9 g (max. 14.6 mmol, still including residual water) of [3-(3-ethyl-anilino)quinoxalin-2-yl]-(3-ethylphenyl)ammonium chloride and 50 g (0.34 mol) of triethyl orthoformate is heated in a reactor fitted with a Dean-Stark separator and condenser under argon at 80° C. during two hours first, and at 100° C. during one hour. The reaction solution is concentrated under vacuum. The residual oil is stirred together with 25 ml of heptane during 10 minutes. The resulting suspension is filtered, the solid washed with a small amount of heptane, followed by drying under vacuum, giving the title product as a blueish-white solid (yield: 3.54 g (min. 57%)).

$^1$H-NMR (400 MHz, $d_6$-DMSO): δ=0.90 (t, 3H), 1.27 (t, 6H), 2.27 (q, 4H), 3.27 (q, 2H), 7.09-7.17 (m, 2H), 7.35-7.48 (2 m, 4H), 7.60-7.67 (m, 2H), 7.85 (s, 1H), 7.97-8.06 (m, 4H).

c) Synthesis of Complex (XI)

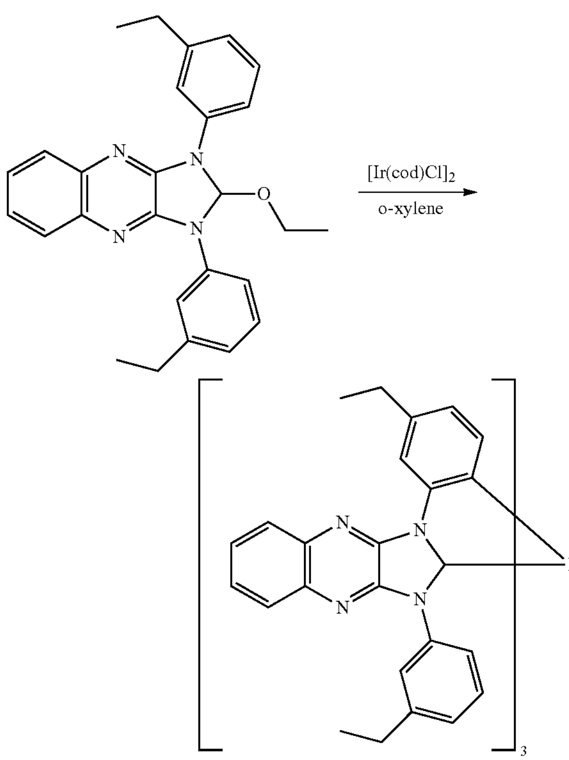

50 ml of o-xylene are three times evacuated and backfilled with argon and heated up to 132° C. A slightly turbid orange solution of 2.95 g (6.95 mmol) of 2-ethoxy-1,3-bis(3-ethylphenyl)-2H-imidazo[4,5-b]quinoxaline and 0.59 g (0.88 mmol) of chloro(1,5-cyclooctadiene)iridium(I) dimer is added, using an additional portion of pre-heated o-xylene (total 20 ml) for rinsing the flask for complete transfer of the reagents. The resulting dark red solution is heated at 143° C. during 17 hours. The dark reaction solution is cooled down to 110° C. and poured onto 300 ml of ethanol. The red suspension is stirred until a temperature of 32° C. is reached. The suspension is filtered, the solid washed with ethanol, followed by drying under vacuum. The solid is dissolved in dichloromethane and filtered through a 4 cm layer of silica gel, followed by rinsing the silica gel layer with dichloromethane and a mixture of dichloromethane/ethanol. The combined fractions are diluted with 100 ml of ethanol and concentrated under vacuum, until a suspension formed. The suspension is further stirred at room temperature, then filtered, the solid washed with ethanol, followed by drying under vacuum, giving the title product as a yellow solid (yield: 1.42 g (61%)).

APCI-LC-MS (positive, m/z): exact mass of $C_{75}H_{63}IrN_{12}$=1324.49; found 1325.5 $[M+1]^+$.

$^1$H-NMR (400 MHz, $CD_2Cl_2$): δ=0.65-1.40 (br. signal, 9H), 1.36 (t, 9H), 1.89-2.91 (br. signal, 6H), 2.67-2.87 (m, 6H), 5.98-7.67 (br. signal, 12H), 6.55 (d, 3H), 6.71 (d, 3H), 7.75 (t, 3H), 7.84 (t, 3H), 7.92 (d, 3H), 8.34 (d, 3H), 8.89 (br. s, 3H).

Synthesis Example 12

Synthesis of Complex (XII)

a) Synthesis of N2,N3-bis(3,4-dimethylphenyl)quinoxaline-2,3-diamine

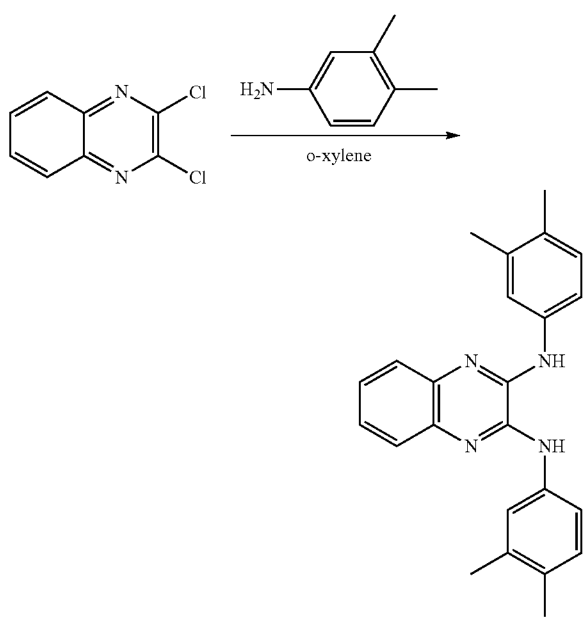

20.0 g (0.10 mol) of 2,3-dichloroquinoxaline and 28.0 g (0.23 mol) 3,4-dimethylaniline in 400 ml of o-xylene are heated at 140° C. during 23 hours. 28.0 g of 3,4-dimethylaniline are added and heating continued at the same temperature during 19 hours. The yellow suspension is cooled down to room temperature and diluted with 200 ml of heptane. The suspension is filtered and the solid stirred in 500 ml of heptane, followed by filtration. The solid is stirred in 500 ml of water together with 100 ml of 25% aqueous ammonia solution and 250 ml heptane. The suspension is filtered, followed by stirring the solid in 500 ml of heptane, and then by stirring the solid in methanol (2× 500 ml). The suspension is filtered, the solid dried under vacuum giving the title product as a light yellow solid (yield: 36.6 g (99%)).

$^1$H-NMR (400 MHz, $d_6$-DMSO): δ=2.26 (s, 6H), 2.28 (s, 6H), 7.21 (d, 2H), 7.31-7.39 (m, 2H), 7.55-7.62 (m, 2H), 7.62-7.72 (m, 4H), 10.22 (br. s, 2H).

b) Synthesis of [3-(3,4-dimethylanilino)quinoxalin-2-yl]-(3,4-dimethylphenyl)ammonium chloride

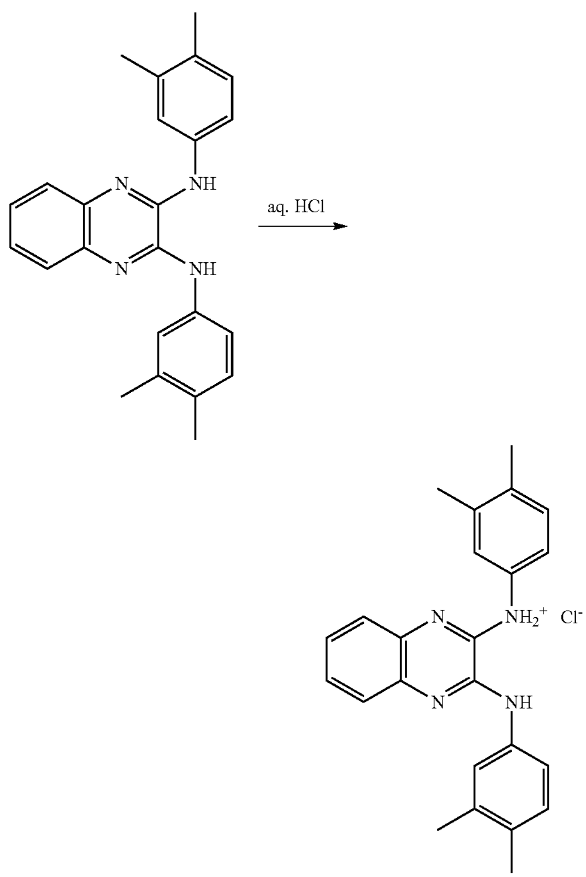

36.6 g (0.10 mol) of N2,N3-bis(3,4-dimethylphenyl)quinoxaline-2,3-diamine are added in several portions to 350 ml of concentrated hydrochloric acid and stirred at room temperature during one hour. The reaction mixture is filtered and the solid dried under vacuum, followed by two times stirring in cyclohexane. The suspension is filtered, followed by drying the solid under vacuum, giving the title product as a light yellow solid (41.9 g isolated, sill including residual water).

$^1$H-NMR (400 MHz, $d_6$-DMSO): δ=2.27 (s, 6H), 2.28 (s, 6H), 7.25 (d, 2H), 7.34-7.43 (m, 2H), 7.58-7.73 (m, 6H), 11.42 (br. s, 2H).

c) Synthesis of 1,3-bis(3,4-dimethylphenyl)-2-ethoxy-2H-imidazo[4,5-b]quinoxaline

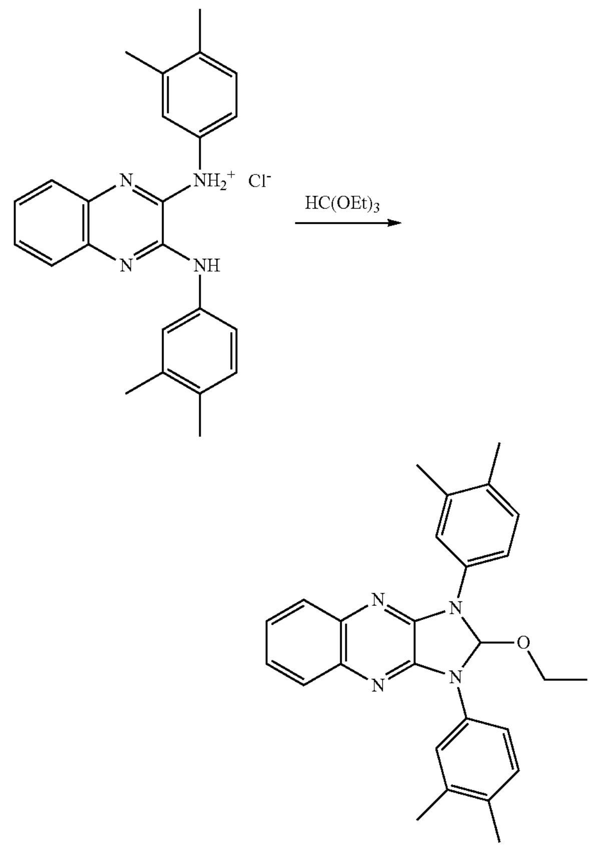

40.2 g (max. 0.1 mol, still including residual water) of [3-(3,4-dimethylanilino)quinoxalin-2-yl]-(3,4-dimethylphenyl)ammonium chloride and 350 ml of triethyl orthoformate are heated under argon at 95° C. during 30 minutes in a reactor fitted with a Dean-Stark separator and condenser. The reaction mixture is cooled down to room temperature and treated with 1.2 g of active charcoal, followed by stirring at 110° C. during 30 minutes. The mixture is cooled down and filtered over a 3 cm layer of Hyflo® filter aid, followed by rinsing the filter aid with 150 ml of ethanol. After short time precipitation of a solid is starting in the combined filtrates, providing a white suspension. The suspension is stirred at room temperature during 30 minutes, followed by filtration, and rinsing the solid with 50 ml of ethanol. The solid is further dried under vacuum, and then mixed with 250 ml of cyclohexane and 150 ml of dichloromethane. The suspension is heated up to 50° C. and the resulting light yellow solution concentrated under vacuum until most of dichloromethane is evaporated off. The residual solution is cooled down to room temperature and the resulting suspension filtered. The solid is washed with a small amount of cyclohexane, followed by drying under vacuum, giving the title compound as a white solid (yield: 36.2 g (min. 86%)).

$^1$H-NMR (400 MHz, $d_6$-DMSO): δ=0.89 (t, 3H), 2.28 (s, 6H), 2.33 (s, 6H), 3.25 (q, 2H), 7.29 (d, 2H), 7.36 (m, 2H), 7.61 (m, 2H), 7.78 (s, 1H), 7.83-7.93 (m, 4H).

d) Synthesis of Complex (XII)

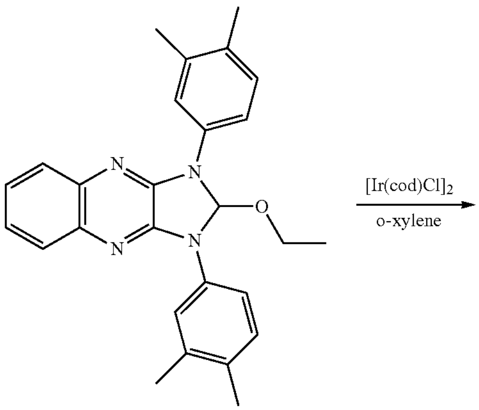

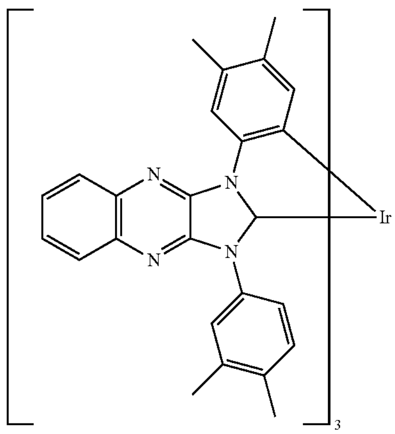

75 ml of o-xylene are three times evacuated and backfilled with argon and heated up to 135° C. A slightly turbid orange solution of 6.00 g (14.1 mmol) of 1,3-bis(3,4-dimethylphenyl)-2-ethoxy-2H-imidazo[4,5-b]quinoxaline and 1.19 g (1.77 mmol) of chloro(1,5-cyclooctadiene)iridium(I) dimer is added, using an additional portion of pre-heated o-xylene (total 20 ml) for rinsing the flask for complete transfer of the reagents. The resulting reaction mixture is heated at 132° C. during 17 hours. The dark reaction solution is cooled down to 120° C. and poured onto 1.2 L of ethanol. The orange-yellow suspension is stirred until 35° C. are reached. The yellow suspension is filtered and the solid washed with ethanol. The solid is suspended in 200 ml of ethanol and heated under reflux during one hour. The suspension is cooled down to room temperature and filtered, the solid washed with ethanol, followed by drying. The solid is suspended in toluene and heated under reflux. The solution is cooled down to 9° C. and the solid filtered off, and washed with a small amount of toluene. The solid is further purified by chromatography (silica gel, dichloromethane/heptane), giving the title product as a yellow solid (yield: 1.78 g (38%)).

APCI-LC-MS (positive, m/z): exact mass of $C_{75}H_{63}IrN_{12}$=1324.49; found 1325.5 $[M+1]^+$.

$^1$H-NMR (400 MHz, $CD_2Cl_2$): δ=1.25 (br. s, 9H), 1.48-2.36 (br. signal, 9H), 2.05 (s, 9H), 2.41 (s, 9H), 5.84-7.67 (br. signal, 12H), 7.67-7.98 (m, 9H), 8.35 (d, 3H), 8.78 (s, 3H).

Synthesis Example 13

Synthesis of Complex (XIII)

a) Synthesis of N2,N3-bis(4-tert-butylphenyl)pyrazine-2,3-diamine

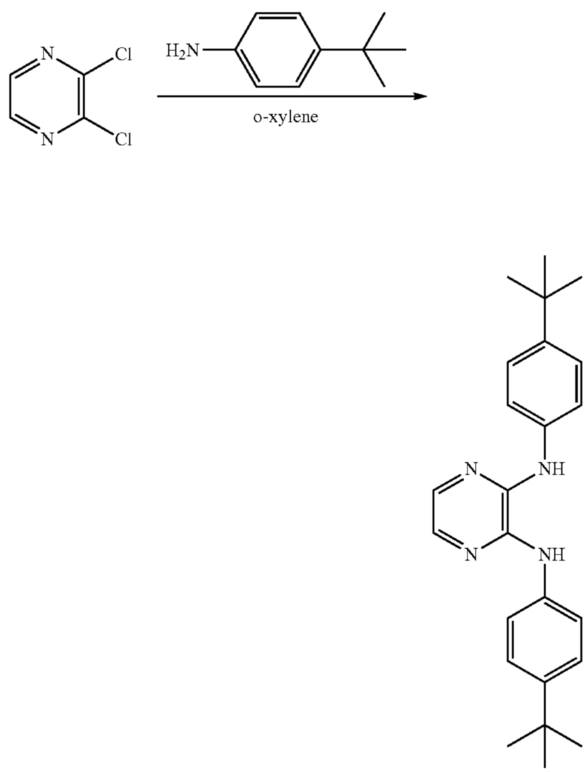

71.3 g 4-tert-butyl aniline (0.47 mol) are added to a solution of 2,3-dichloropyrazine (32.3 g; 0.21 mol) in 200 ml o-xylene. The red solution is heated to 150° C. over 1.25 hours and stirred at that temperature overnight. The mixture turns to a brownish yellow suspension. After cooling to room temperature, the yellow solid is filtered and washed with successive portions of heptane, aqueous saturated sodium bicarbonate, and ethanol. The product is dried under vacuum at 60° C. to give the title product as a bright yellow solid (yield: 52.5 g (66%)).

$^1$H-NMR (300 MHz, $d_6$-DMSO): δ=8.91 (br.s, 2H), 7.59 (m, 4H), 7.48 (s, 2H) 7.36 (m, 4H), 1.29 (s, 18H).

b) Synthesis of 1,3-bis(4-tert-butylphenyl)-2-ethoxy-2H-imidazo[4,5-b]pyrazine

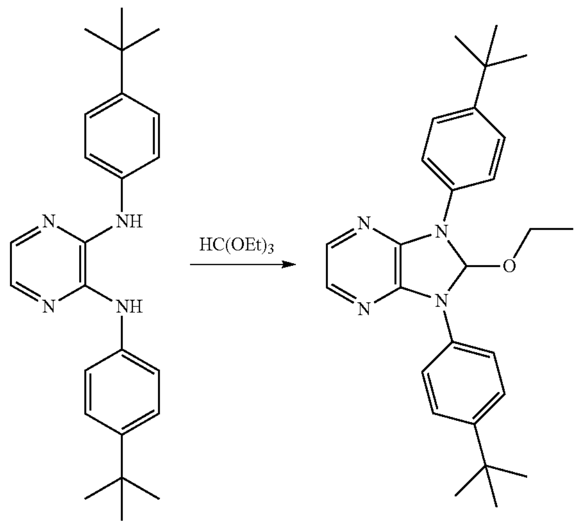 [SMILES: CC(C)(C)c1ccc(Nc2nccnc2Nc2ccc(C(C)(C)C)cc2)cc1 ; CCOC1N(c2ccc(C(C)(C)C)cc2)c2nccnc2N1c1ccc(C(C)(C)C)cc1 ; "HC(OEt)3"]

17.1 g (45.7 mmol) of N2,N3-bis(4-tert-butylphenyl) pyrazine-2,3-diamine and 67.7 g (0.46 mol) of triethylothoformate are heated in a 3-necked flask fitted with a Dean-Stark separator and condenser to 130° C. (bath temperature). Distillation of a ethanol/triethylorthoformate mixture starts at ca. 105° C. internal temperature. After 105 minutes (int. temperature 120° C.), distillation ceases and the suspension is filtered at ca. 80° C. in order to remove some residual solid. The filtrate is concentrated under vacuum to give 17 g of pink crude product, which is recrystallized from 35 g heptane to give the title compound as a light pinkish solid (yield: 13.0 g (66%)).

$^1$H-NMR (400 MHz, $CDCl_3$): δ=7.94-7.89 (m, 4H), 7.52 (s, 2H), 7.51-7.47 (m, 4H), 7.21 (s, 1H), 3.38 (q, J=7.0 Hz, 2H), 1.37 (s, 18H), 1.13 (t, J=7.0 Hz, 3H).

c) Synthesis of Complex Intermediate (XIII-a)

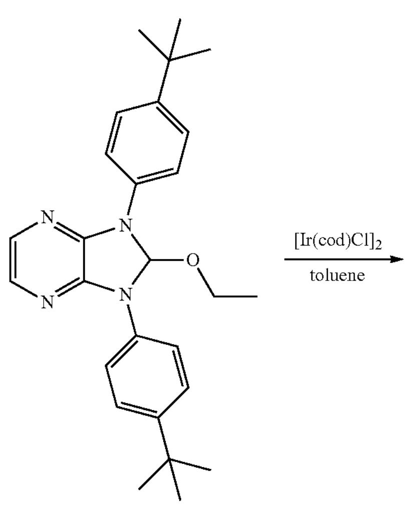

-continued

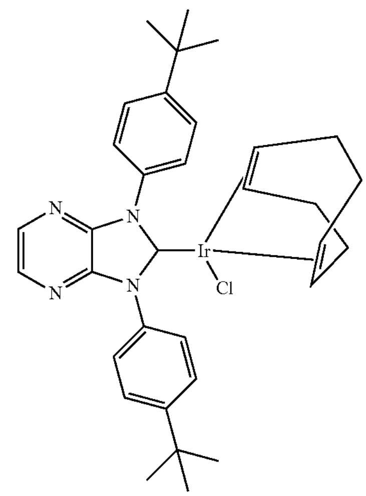

3.90 g (5.81 mmol) of chloro(1,5-cyclooctadiene)iridium (I) dimer are suspended in 70 ml of toluene and three times evacuated and backfilled with argon, and heated up to 73° C. A solution of 5.00 g (11.6 mmol) of 1,3-bis(4-tert-butylphenyl)-2-ethoxy-2H-imidazo[4,5-b]pyrazine in 70 ml of toluene is added within 45 minutes and the resulting greenish-brown solution heated at 74° C. during 17 hours. The warm reaction mixture is filtered, the solid washed with toluene and heptane, followed by drying under vacuum, giving the title product as a brownish-yellow solid (yield: 6.83 g (82%)).

$^1$H-NMR (400 MHz, $CDCl_3$): δ=1.25-1.49 (2 m, 4H), 1.44 (s, 18H), 1.49-1.62 (m, 2H), 1.67-1.81 (m, 2H), 2.45-2.55 (m, 2H), 4.63-4.74 (m, 2H), 7.65 (d, 4H), 8.07 (d, 4H), 8.32 (s, 2H).

d) Synthesis of Complex (XIII)

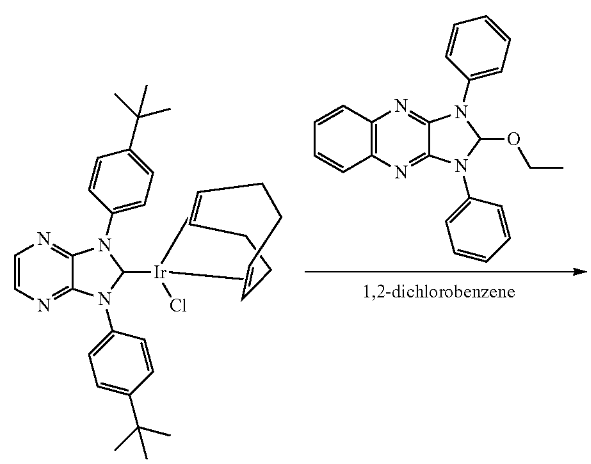

-continued

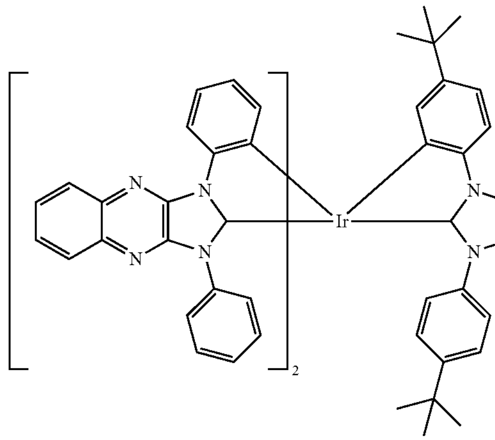

2.00 g (2.78 mmol) of complex intermediate (XIII-a) and 2.05 g (5.56 mmol) of 2-ethoxy-1,3-diphenyl-2H-imidazo[4,5-b]quinoxaline are suspended under argon in 40 ml of 1,2-dichlorobenzene. The yellow suspension is three times evacuated and backfilled with argon, followed by heating at 116° C. during seven hours. The dark solution is cooled down to room temperature, diluted with 100 ml of heptane and filtered. The solid is washed with ethanol. The combined filtrates are concentrated under vacuum and the residue subjected to further purification by chromatography (silica gel, dichloromethane/heptane), giving the title product as a yellow solid (yield: 0.64 g (19%)).

APCI-LC-MS (positive, m/z): exact mass of $C_{67}H_{53}IrN_{12}$=1218.41; found 1219.5 $[M+1]^+$.

$^1$H-NMR (400 MHz, $CD_2Cl_2$): δ=0.69 (s, 9H), 1.06 (s, 9H), 5.99-7.99 (br. signal, 10H), 6.54 (br. d, 2H), 6.61-6.69 (m, 2H), 6.69-6.75 (m, 2H), 6.85-6.97 (m, 3H), 7.18-7.33 (m, 3H), 7.69-7.78 (m, 2H), 7.79-7.87 (m, 2H), 7.87-7.93 (m, 1H), 8.11 (d, 1H), 8.31-8.37 (m, 2H), 8.38 (d, 1H), 8.67 (d, 1H), 9.08 (d, 1H), 9.15 (d, 1H).

Synthesis Example 14

Synthesis of Complex (XIV)

a) Synthesis of [3-(3-ethylanilino)pyrazin-2-yl]-(3-ethylphenyl)ammonium chloride

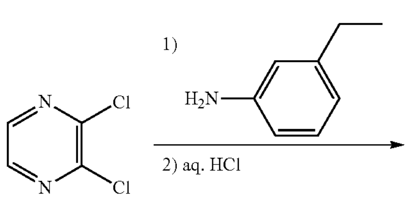

-continued

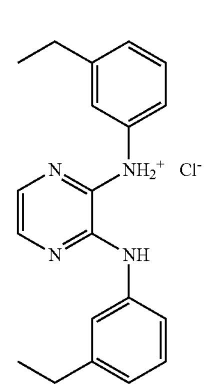

13.3 g (8.93 mmol) of 2,3-dichloropyrazine and 25 ml (0.2 mol) of 3-ethylaniline in 30 ml of o-xylene are heated under reflux during 20 hours. The dark reaction mixture is cooled down to room temperature and poured onto 300 ml of 10% aqueous hydrochloric acid solution, followed by the addition of 200 ml of heptane, and stirring for one hour. The suspension is filtered and the solid washed with water and heptane, followed by drying under vacuum. The solid is suspended in 1 L of 10% aqueous sodium hydroxide and 1 L of heptane, followed by stirring during 30 minutes and filtration. The solid is washed with water and heptane, and then stirred in 500 ml of 10% aqueous hydrochloric acid and 400 ml of heptane during 30 minutes. The suspension is filtered and the solid washed with water and further dried under vacuum giving the title product as a white solid (28.5 g isolated, still including residual water).

$^1$H-NMR (400 MHz, $d_6$-DMSO): δ=1.21 (t, 6H), 2.62 (q, 4H), 6.95 (d, 2H), 7.28 (t, 2H), 7.49 (s, 2H), 7.53 (s, 2H), 7.58 (d, 2H), 9.68 (br. s, 2H).

b) Synthesis of 2-ethoxy-1,3-bis(3-ethylphenyl)-2H-imidazo[4,5-b]pyrazine

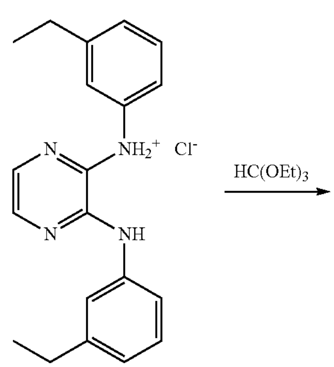

-continued

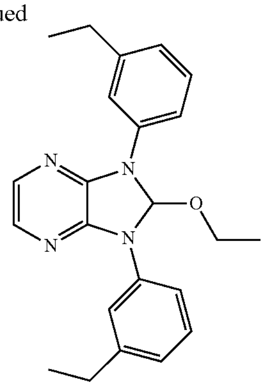

27.0 g (max. 76 mmol, still including residual water) of [3-(3-ethylanilino)pyrazin-2-yl]-(3-ethylphenyl)ammonium chloride and 200 ml (1.2 mol) of triethyl orthoformate are heated under argon at 130° C. during five hours in a reactor fitted with a Dean-Stark separator and condenser. The reaction solution is concentrated under vacuum and dried, giving the title compound as a yellowish solid (yield: 22.2 g (78%)).

$^1$H-NMR (400 MHz, $d_6$-DMSO): δ=0.90 (t, 3H), 1.23 (t, 6H), 2.66 (q, 4H), 3.18 (q, 2H), 7.03 (d, 2H), 7.36 (t, 2H), 7.51 (s, 2H), 7.72 (s, 1H), 7.84-7.94 (m, 4H).

c) Synthesis of Complex Intermediate (XIV-a)

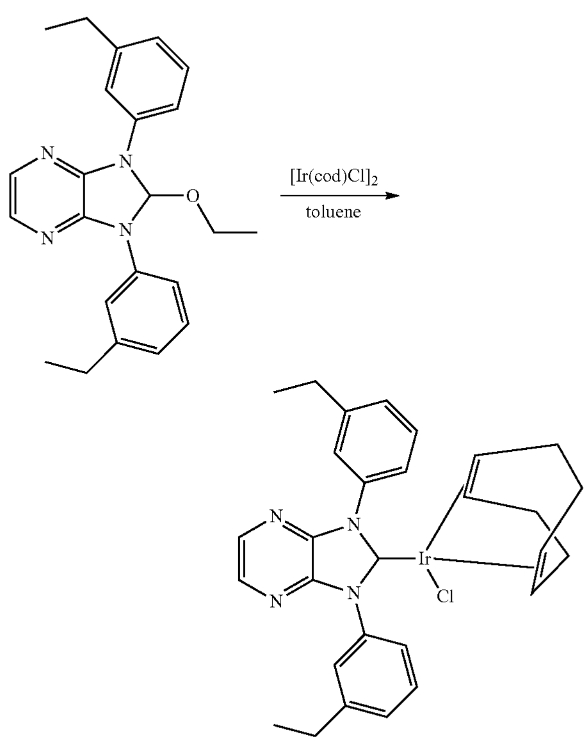

3.68 g (5.48 mmol) of chloro(1,5-cyclooctadiene)iridium (I) dimer are suspended in 50 ml of toluene and three times evacuated and backfilled with argon, and heated up to 73° C. A solution of 4.10 g (10.9 mmol) of 2-ethoxy-1,3-bis(3-ethylphenyl)-2H-imidazo[4,5-b]pyrazine in 50 ml of toluene is slowly added and the resulting greenish-brown solution heated at 74° C. during one hour. The orange-brown slightly turbid solution is filtered and the filtrate diluted with 100 ml of ethanol and cooled down using an ice-bath. The resulting suspension is filtered and the solid washed with ethanol and heptane, followed by drying under vacuum, giving the title product as a yellow solid (yield: 4.10 g (56%)).

$^1$H-NMR (400 MHz, $CD_2Cl_2$): δ=1.28-1.66 (m, 6H), 1.40 (t, 6H), 1.69-1.87 (m, 2H), 2.54-2.64 (m, 2H), 2.78-2.93 (m, 4H), 4.56-4.67 (m, 2H), 7.42-7.49 (m, 2H), 7.55 (t, 2H), 7.79-7.87 (m, 2H), 8.16-8.22 (m, 2H), 8.32 (s, 2H).

d) Synthesis of Complex (XIV)

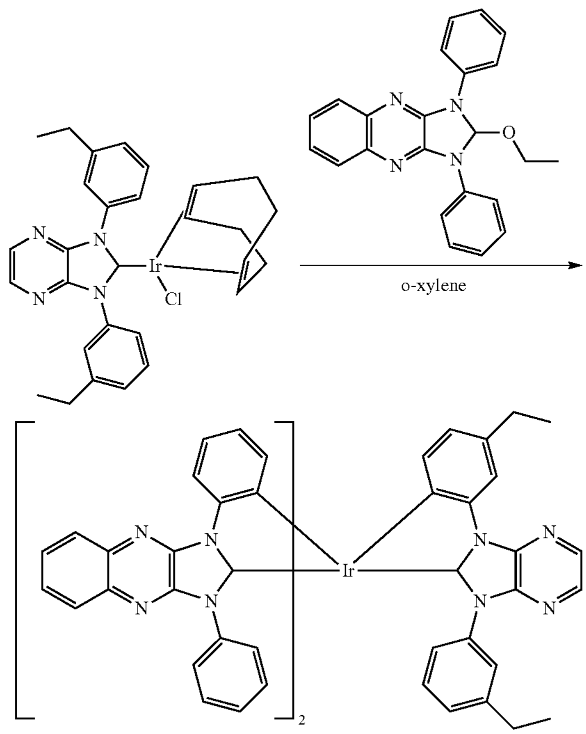

2.00 g (3.0 mmol) of complex intermediate (XIV-a) and 2.18 g (6.0 mmol) of the 2-ethoxy-1,3-diphenyl-2H-imidazo [4,5-b]quinoxaline are suspended in 100 ml of o-xylene, and heated at 144° C. during 18 hours. The dark solution is cooled down to room temperature, diluted with 150 ml of ethanol, and further cooled down with an ice-bath. The suspension is filtered, the solid washed with ethanol, followed by drying under vacuum. The solid is dissolved in 1 L of dichloromethane and the solution filtered through a 4 cm layer of silica gel, followed by rinsing the silica gel layer with 500 ml of dichloromethane. The combined fractions are mixed with 50 ml of ethanol and the solution concentrated under vacuum until a solid formed. The solid is filtered off and dissolved in 1 L of dichloromethane, then filtered and the filtrate treated with 50 ml of ethyl acetate. The solution is concentrated under vacuum to a volume of 250 ml, and the resulting suspension filtered. The solid is washed with ethyl acetate and dried under vacuum, giving the title product as a yellow solid (yield: 0.36 g (10%)).

APCI-LC-MS (positive, m/z): exact mass of $C_{63}H_{45}IrN_{12}$=1162.35; found 1163.5 $[M+1]^+$.

$^1$H-NMR (400 MHz, $CD_2Cl_2$): δ=1.22-1.36 (m, 6H), 2.73 (q, 4H), 6.00-7.98 (br. signal, 12H), 6.55 (d, 1H), 6.58-6.66

(m, 1H), 6.66-6.76 (m, 3H), 6.81-6.96 (m, 3H), 7.21-7.32 (m, 2H), 7.77-7.80 (m, 2H), 7.80-7.95 (m, 4H), 8.11 (d, 1H), 8.26-8.42 (m, 3H), 8.70 (s, 1H), 9.01-9.12 (m, 2H).

Synthesis Example 15

Synthesis of Complex (XV)

a) Synthesis of N2,N3-bis(m-tolyl)pyrazine-2,3-diamine

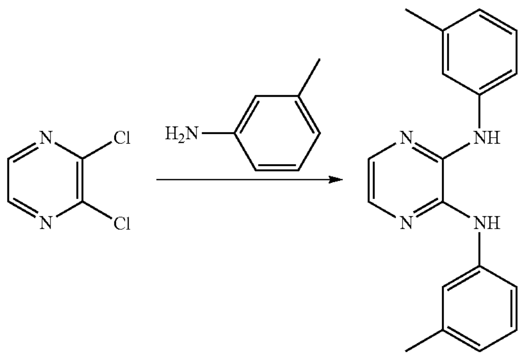

A solution of 13.8 g 2,3-dichloropyrazine (92.6 mmol) in 100 g m-toluidine (0.93 mol) is heated at 140° C. for five hours. The mixture is allowed to cool to 50° C. and diluted with 150 ml methanol. It is further cooled in an ice bath whereby products starts to precipitate. After stirring at room temperature overnight, the mixture is cooled again to 10° C. and the light beige suspension is filtered. The crude product is resuspended in 100 ml cold methanol, filtered, and dried under vacuum to give the title product as a light beige solid (yield: 19.2 g (71.6%)).

$^1$H-NMR (300 MHz, $d_6$-DMSO): δ=8.93 (bs, 2H), 7.71-7.41 (m, 6H), 7.27-7.09 (m, 2H), 6.88-6.72 (m, 2H), 2.30 (s, 6H).

b) Synthesis of [3-(3-methylanilino)pyrazin-2-yl]-(m-tolyl)ammonium chloride

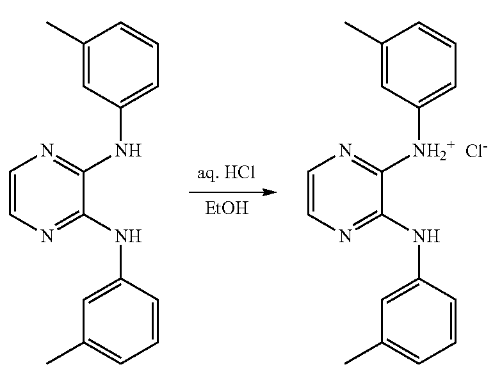 [SMILES: "EtOH" ; Cc1cccc(Nc2nccnc2Nc2cccc(C)c2)c1 ; Cc1cccc(Nc2nccnc2[NH2+]c2cccc(C)c2)c1 ; [Cl-]]

A yellow suspension of 19 g (65 mmol) of N2,N3-bis(m-tolyl)pyrazine-2,3-diamine in 400 ml of ethanol and 128 g of 37% hydrochloric acid is stirred at room temperature overnight. The product is filtered, washed with heptane (3×100 ml), and dried under vacuum. The product is obtained as a yellow solid (17.9 g isolated, still including residual water).

$^1$H-NMR (300 MHz, $d_6$-DMSO): δ=10.07 (bs, 2H), 7.69-7.52 (m, 4H), 7.48 (s, 2H), 7.31-7.14 (m, 2H), 6.91 (dt, J=6.8, 1.2 Hz, 2H), 6.7 (bs, 1H), 2.32 (s, 6H).

c) Synthesis of 2-ethoxy-1,3-bis(m-tolyl)-2H-imidazo[4,5-b]pyrazine

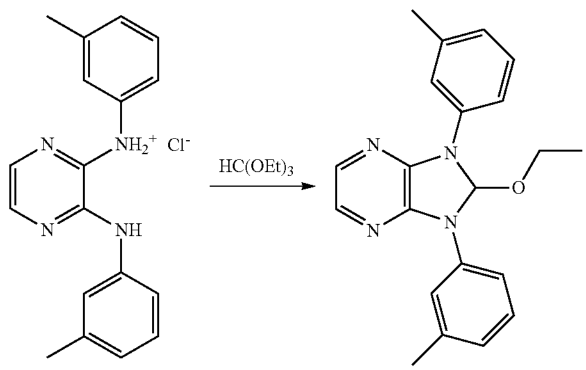 [SMILES: Cc1cccc(Nc2nccnc2[NH2+]c2cccc(C)c2)c1 ; [Cl-] ; CCOC1N(c2cccc(C)c2)c2nccnc2N1c1cccc(C)c1 ; "HC(OEt)3"]

17.8 g of [3-(3-methylanilino)pyrazin-2-yl]-(m-tolyl)ammonium chloride (max. 55 mmol, still including residual water) are suspended in 207 g triethyl orthoformate (1.36 mol) are heated at 110° C. for six hours in a reactor fitted with a Dean-Stark separator and condenser. 14 ml of ethanol and triethylorthoformate are separated during the reaction time. The reaction mixture is cooled, filtered, and the orange filtrate is concentrated under vacuum. The crude product is washed with ethanol and heptane, filtered, purified by resuspension in ethanol (3×), and dried under vacuum. The title compound is obtained as a salmon pink powder (yield: 10.8 g (57%)).

$^1$H-NMR (300 MHz, $d_6$-DMSO): δ=7.89 (m, 2H), 7.85 (m, 2H), 7.75 (s, 1H), 7.52 (s, 2H), 7.36 (t, 2H), 7.02 (m, 2H), 3.18 (q, J=7.0 Hz, 2H), 2.38 (s, 6H), 0.91 (t, J=7.0 Hz, 3H).

d) Synthesis of Complex Intermediate (XV-a)

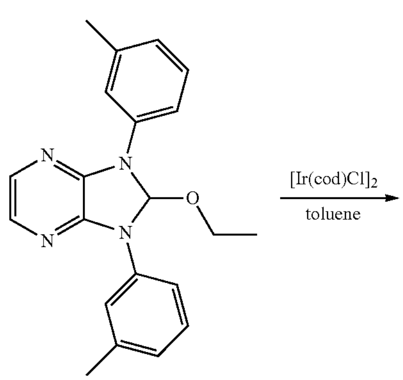

-continued

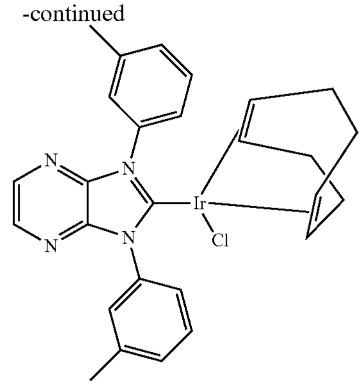

3.00 g (4.47 mmol) of chloro(1,5-cyclooctadiene)iridium (I) dimer and 3.09 g (8.92 mmol) of 2-ethoxy-1,3-bis(m-tolyl)-2H-imidazo[4,5-b]pyrazine are dissolved in 50 ml of toluene. The dark solution is three times evacuated and backfilled with argon, and heated at 75° C. during two hours. The reaction mixture is cooled down to room temperature and diluted with 100 ml of ethanol. The resulting suspension is filtered, the solid washed with ethanol and heptane, followed by drying under vacuum, giving the title product as a yellow solid (yield: 3.88 g (68%)).

$^1$H-NMR (400 MHz, $CD_2Cl_2$): δ=1.33-1.45 (m, 2H), 1.47-1.66 (m, 4H), 1.75-1.88 (m, 2H), 2.55 (s, 6H), 2.58-2.65 (m, 2H), 4.59-4.67 (m, 2H), 7.43 (d, 2H), 7.53 (t, 2H), 7.92 (d, 2H), 8.06 (s, 2H), 8.33 (s, 2H).

e) Synthesis of Complex (XV)

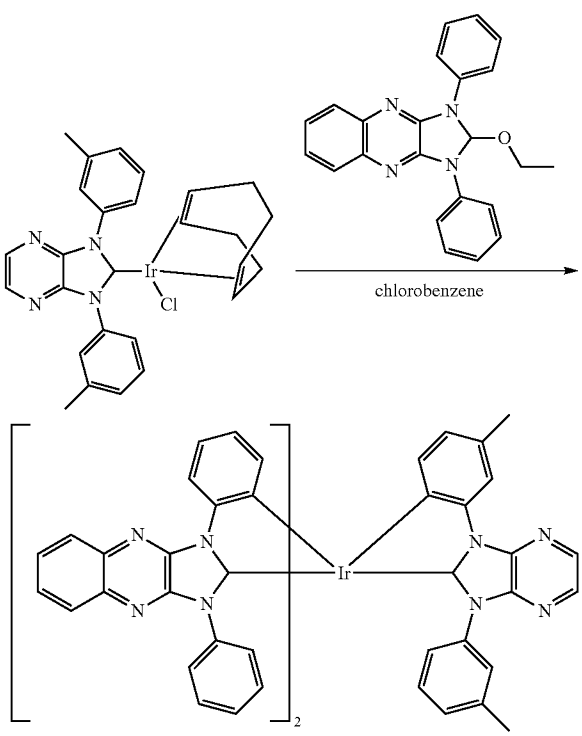

2.00 g (3.14 mmol) of complex intermediate (XV-a) and 4.63 g (12.6 mmol) of 2-ethoxy-1,3-diphenyl-2H-imidazo [4,5-b]quinoxaline are dissolved under argon in 40 ml of chlorobenzene. The yellow solution is three times evacuated and backfilled with argon, followed by heating at 124° C. during 23 hours. The reaction mixture is cooled down to room temperature and treated with 40 ml of ethanol and 80 ml of acetone, followed by stirring during 30 minutes. The suspension is filtered, and the solid washed with 30 ml of ethanol first, followed by washing with 30 ml of acetone and 30 ml of heptane. The solid is dried under vacuum and further purified by chromatography (silica gel, dichloromethane/heptane), giving the title product as a yellow solid (yield: 1.94 g (54%)).

APCI-LC-MS (positive, m/z): exact mass of $C_{61}H_{41}IrN_{12}$=1134.32; found 1135.3 $[M+1]^+$.

$^1$H-NMR (400 MHz, $CD_2Cl_2$): δ=1.61-2.67 (br. signals, 3H), 2.43 (s, 3H), 5.86-7.69 (br. signals, 12H), 6.53 (d, 1H), 6.59-6.76 (m, 5H), 6.82-6.92 (m, 2H), 7.21-7.33 (m, 2H), 7.70-7.96 (m, 6H), 8.10 (d, 1H), 8.26-8.42 (m, 3H), 8.67 (s, 1H), 9.00-9.14 (m, 2H).

Synthesis Example 16

Synthesis of Complex (XVI)

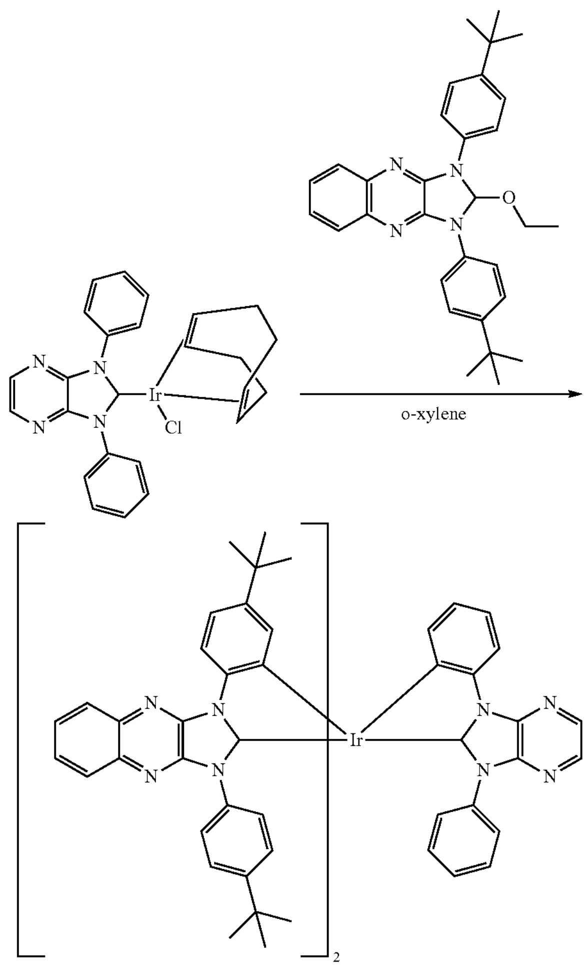

1.50 g (2.47 mmol) of complex intermediate (II-1) and 2.38 g (4.95 mmol) of 1,3-bis(4-tert-butyl-phenyl)-2-ethoxy-2H-imidazo[4,5-b]quinoxaline are suspended under argon in 70 ml of o-xylene. The grey-yellow suspension is three times evacuated and backfilled with argon, followed by heating at 128° C. during 20 hours. The reaction mixture is cooled down to room temperature and concentrated under vacuum. The residue is dissolved in dichloromethane and filtered through a 4 cm layer of silica gel followed by rinsing the silica gel layer with dichloromethane. The combined eluents are concentrated under vacuum and the solid further purified by chromatography (silica gel, heptane/ethyl acetate). The isolated product is dissolved in dichloromethane first, followed by the addition of 20 ml of ethanol. The solution is concentrated until a suspension is formed. The suspension is filtered, the solid washed with ethanol and further dried under vacuum, giving a first crop of the title product as a yellow solid. The filtrate is concentrated giving a second crop of the title product (combined yield: 0.45 g (14%)).

APCI-LC-MS (positive, m/z): exact mass of $C_{75}H_{69}IrN_{12}$=1330.54; found 1331.7 $[M+1]^+$.

$^1$H-NMR (400 MHz, $CD_2Cl_2$): δ=0.76 (s, 9H), 1.08 (2 s, 18H), 1.10 (s, 9H), 6.10-7.68 (br. signal, 12H), 6.60-6.73 (m, 4H), 6.87 (t, 1H), 7.18-7.30 (m, 3H), 7.69-7.78 (m, 2H), 7.79-7.93 (m, 4H), 8.09 (d, 1H), 8.30-8.38 (m, 2H), 8.39 (d, 1H), 8.86-8.93 (m, 2H), 8.90 (d, 1H).

Synthesis Example 17

Synthesis of Complex (XVII)

a) Synthesis of N2,N3-bis(4-phenylphenyl)pyrazine-2,3-diamine

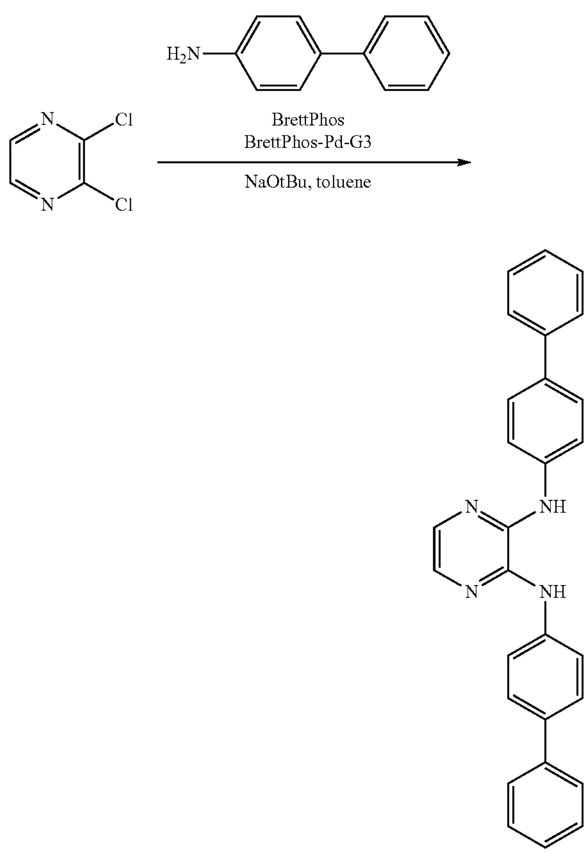

25.0 g (0.15 mol) of 4-biphenylamine and 16.8 g (0.17 mol) of sodium tert-butoxide in 200 ml of toluene are three times evacuated and backfilled with argon. 0.36 g (0.67 mmol) of BrettPhos ligand [=2-(dicyclohexylphosphino)3, 6-dimethoxy-2',4',6'-triisopropyl-1,1'-biphenyl, CAS No. 1070663-78-3] and 0.54 g (0.68 mmol) of BrettPhos-Pd-G3 palladacycle {=[(2-di-cyclohexylphosphino-3,6-dimethoxy-2',4',6'-triisopropyl-1,1'-biphenyl)-2-(2'-amino-1,1'-biphenyl)]palladium(II) methanesulfonate methanesulfonate, CAS No. 1470372-59-8} are added, followed by the addition of 10.2 g (68.5 mmol) of 2,3-dichloropyrazine. The temperature is raised up to 85° C. during which a thick suspension is formed. Heating is continued at 85° C. during 20 hours. The reaction mixture is cooled down to room temperature, filtered, and the solid rinsed with toluene. The yellow solid is suspended first in 300 ml of heptane, then filtered, followed by stirring the resulting solid in 150 ml of ethanol under reflux. The hot suspension is filtered and the solid washed with ethanol. The solid is stirred in solution of 150 ml of water and 1.5 g of sodium cyanide under moderate heating. The suspension is filtered, the solid washed with water and heated up again in 150 ml of ethanol. The hot suspension is filtered, the solid dried under vacuum, giving the title product as a light yellow solid (yield: 18.1 g (65%)).

$^1$H-NMR (400 MHz, $d_6$-DMSO): δ=7.33 (t, 2H), 7.46 (t, 4H), 7.60-7.73 (m, 10H), 7.80 (d, 4H), 8.70 (s, 2H).

b) Synthesis of [3-(4-phenylanilino)pyrazin-2-yl]-(4-phenylphenyl)ammonium chloride

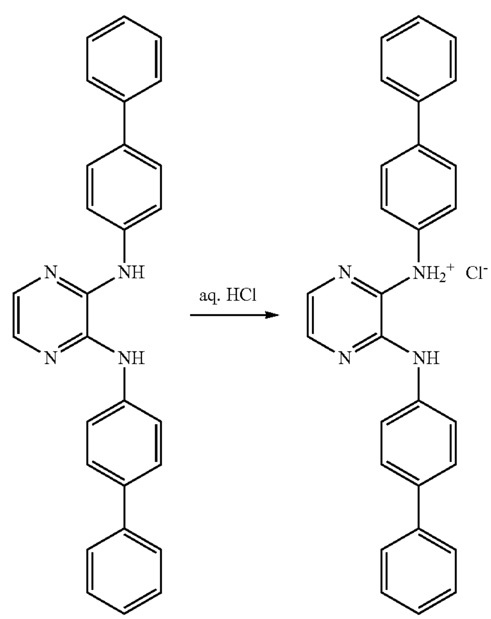 [SMILES: c1ccc(-c2ccc(Nc3nccnc3Nc3ccc(-c4ccccc4)cc3)cc2)cc1 ; c1ccc(-c2ccc(Nc3nccnc3[NH2+]c3ccc(-c4ccccc4)cc3)cc2)cc1 ; [Cl-]]

A yellow suspension of 18.1 g (43.6 mmol) of N2,N3-bis(4-phenylphenyl)pyrazine-2,3-diamine and 120 ml of concentrated hydrochloric acid is stirred at room temperature during 15 minutes. 100 ml of water are carefully added under stirring and the resulting suspension filtered, and the solid dried under vacuum, giving the title product as a light yellow solid (32.6 g isolated, still including residual water).

$^1$H-NMR (400 MHz, $d_6$-DMSO): δ=7.34 (t, 2H), 7.47 (t, 4H), 7.55 (s, 2H), 7.63-7.77 (m, 8H), 7.91 (d, 4H), 10.21 (br. s, 2H).

c) Synthesis of 2-ethoxy-1,3-bis(4-phenylphenyl)-2H-imidazo[4,5-b]pyrazine

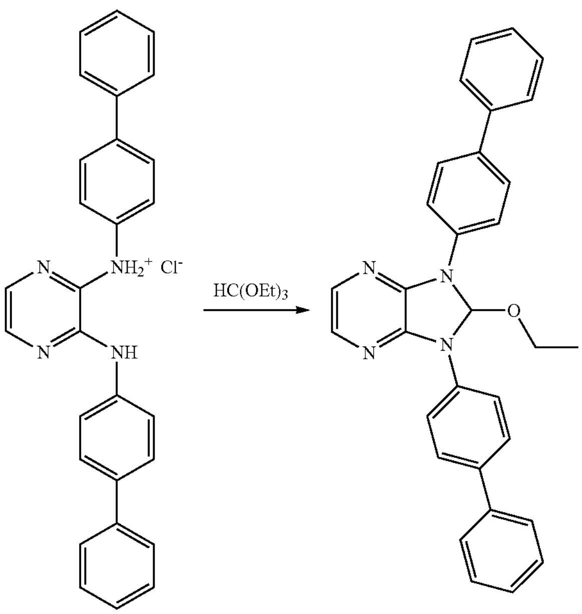 [SMILES: c1ccc(-c2ccc(Nc3nccnc3[NH2+]c3ccc(-c4ccccc4)cc3)cc2)cc1 ; [Cl-] ; CCOC1N(c2ccc(-c3ccccc3)cc2)c2nccnc2N1c1ccc(-c2ccccc2)cc1 ; "HC(OEt)3"]

20.4 g (max. 45 mmol, still including residual water) of [3-(4-phenylanilino)pyrazin-2-yl]-(4-phenylphenyl)ammonium chloride are suspended in 200 ml of triethyl orthoformate and heated at 110° C. during 17 hours in a reactor fitted with a Dean-Stark separator and condenser. The orange-brown slightly turbid solution is cooled down and filtered through a 2 cm layer of silica gel, followed by rinsing the silica gel layer with heptane and ethanol. The combined eluents are filtered over cellulose powder, followed by rinsing the cellulose powder with heptane. The combined eluents are concentrated under vacuum until a suspension is formed. The suspension is further stirred at room temperature, then filtered, and the solid washed with ethanol, followed by drying under vacuum. The solid is dissolved in dichloromethane followed by addition of ethanol. The solution is concentrated under vacuum until a suspension is formed. The suspension is cooled down to room temperature under stirring, then filtered, and the solid washed with ethanol, followed by drying under vacuum, giving the title product as a light pink solid (yield: 11.2 g (minimum 53%)).

$^1$H-NMR (400 MHz, $d_6$-DMSO): δ=0.95 (t, 3H), 3.24 (q, 2H), 7.37 (t, 2H), 7.49 (t, 4H), 7.59 (s, 2H), 7.73 (d, 4H), 7.82 (d, 4H), 7.90 (s, 1H), 8.19 (d, 4H).

d) Synthesis of Complex Intermediate (XVII-a)

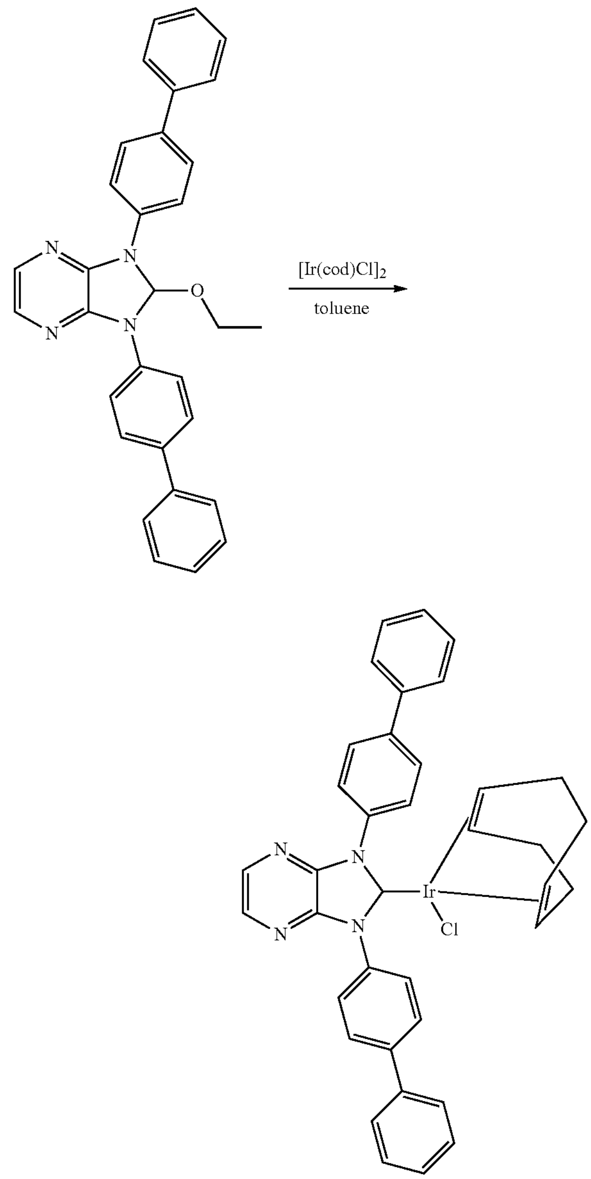

4.32 g (6.43 mmol) of chloro(1,5-cyclooctadiene)iridium (I) dimer and 6.02 g (12.8 mmol) of 2-ethoxy-1,3-bis(4-phenylphenyl)-2H-imidazo[4,5-b]pyrazine are dissolved in 250 ml of toluene. The orange slightly turbid solution is three times evacuated and backfilled with argon, and heated under reflux during one hour. The hot hot orange suspension is filtered through a 3 cm layer of silica gel and the silica gel layer rinsed two times with 25 ml of toluene. The solid is dried under vacuum, giving the title product as a yellow solid (yield: 7.9 g (81%)).

$^1$H-NMR (400 MHz, $CD_2Cl_2$): δ=1.36-1.47 (m, 2H), 1.51-1.68 (m, 4H), 1.77-1.92 (m, 2H), 2.67 (m, 2H), 4.71 (m, 2H), 7.44-7.51 (m, 2H), 7.52-7.61 (m, 4H), 7.77-7.83 (m, 4H), 7.88-7.95 (m, 4H), 8.26-8.33 (m, 4H), 8.37 (s, 2H).

e) Synthesis of Complex (XVII)

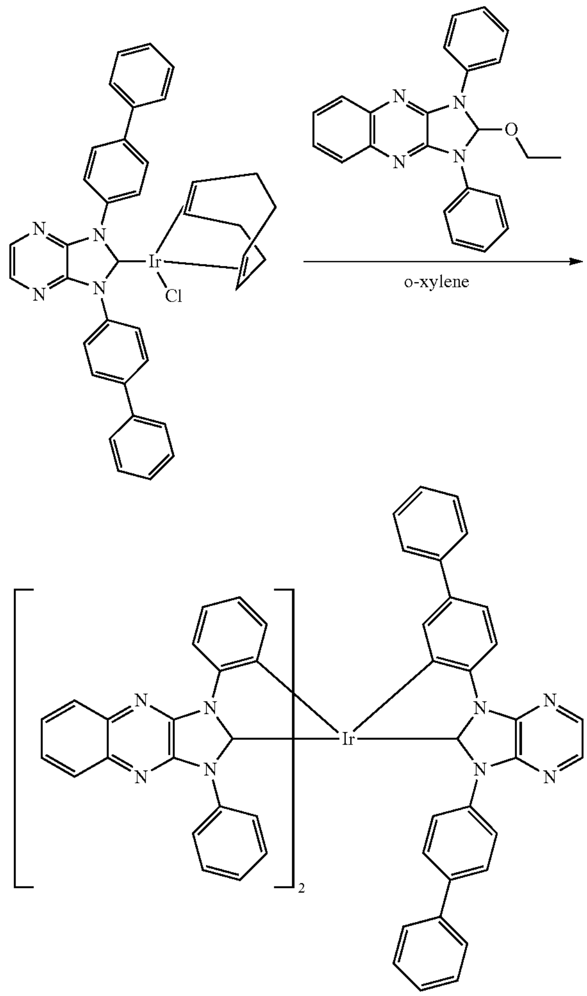

50 ml of o-xylene are three times evacuated and backfilled with argon and heated up to 132° C. 0.80 g (1.05 mmol) of complex intermediate (XVII-a) and 0.81 g (2.20 mmol) of 2-ethoxy-1,3-diphenyl-2H-imidazo[4,5-b]quinoxaline are added and stirring continued at 134° C. during one hour. The dark red suspension is cooled down to room temperature followed by filtration. The solid is washed with o-xylene. The filtrate is treated with 200 ml of ethanol and the resulting suspension stirred during 10 minutes, followed by filtration. The filtrate is filtered over a 0.5 cm layer of Hyflo® filter aid, followed by rinsing the filter aid with dichloromethane. The combined filtrates are concentrated under vacuum. The resulting solid is further purified by chromatography (silica gel, dichloromethane/heptane). The isolated product fractions are concentrated under vacuum and the solid dissolved in a minimal amount of dichloromethane followed by the addition of 50 ml of ethanol. The solution is concentrated under vacuum until a suspension is formed. The suspension is further stirred at room temperature, then filtered, and the solid washed with ethanol, followed by drying under vacuum, giving the title product as a light yellow solid (190 mg (14%)).

APCI-LC-MS (positive, m/z): exact mass of $C_{71}H_{45}IrN_{12}$=1258.35; found 1259.5 $[M+1]^+$.

$^1$H-NMR (300 MHz, $CD_2Cl_2$): δ=6.16-7.96 (br. signal, 12H), 6.59-6.69 (m, 3H), 6.76-6.86 (m, 3H), 6.88-7.03 (m, 5H), 7.07-7.15 (m, 1H), 7.16-7.24 (m, 1H), 7.25-7.40 (m, 6H), 7.46-7.53 (dd, 1H), 7.59-7.87 (m, 5H), 7.87-7.93 (m, 1H), 8.16 (d, 1H), 8.28-8.37 (m, 2H), 8.42 (d, 1H), 8.87 (d, 1H), 9.08-9.19 (m, 2H).

Synthesis Example 18

Synthesis of Complex (XVIII)

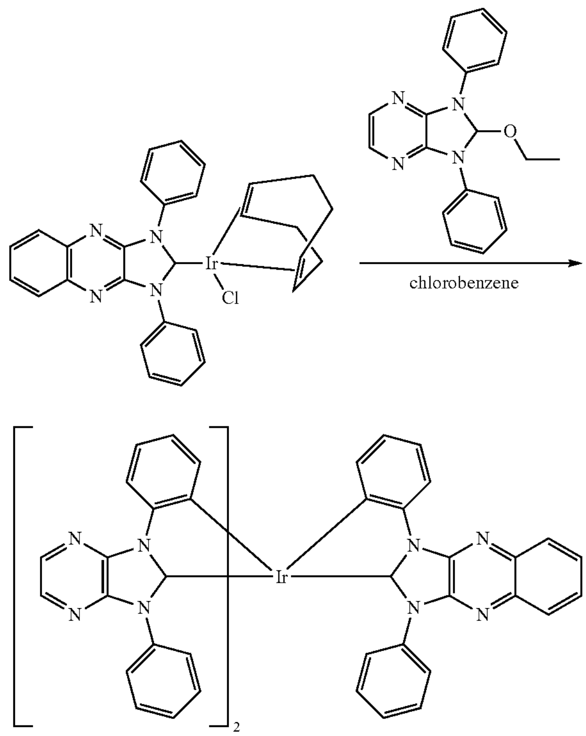

3.50 g (5.31 mmol) of complex intermediate (VIII-a) and 3.38 g (10.6 mmol) of 2-ethoxy-1,3-diphenyl-2H-imidazo[4,5-b]pyrazine (see synthesis example 16, WO2011/073149) are dissolved under argon in 70 ml of chlorobenzene. The reaction mixture is three times evacuated and backfilled with argon, followed by heating at 112° C. during 18 hours. The reaction mixture is cooled down to room temperature, treated with 400 ml of ethanol and vigorously stirred during 30 minutes. The suspension is filtered, and the solid subjected to further purification by chromography (silica gel, dichloromethane/ethyl acetate), giving the title product as a yellow solid (yield: 1.53 g (27%)).

APCI-LC-MS (positive, m/z): exact mass of $C_{55}H_{35}IrN_{12}$=1056.27; found 1057.4 $[M+1]^+$.

$^1$H-NMR (400 MHz, $CD_2Cl_2$): δ=6.12-8.06 (br. signal, 12H), 6.61 (t, 1H), 6.67-6.75 (m, 3H), 6.82-6.95 (m, 5H), 7.17-7.32 (m, 3H), 7.71-7.79 (m, 1H), 7.80-7.93 (m, 2H), 8.07-8.15 (m, 2H), 8.30-8.43 (m, 3H), 8.82 (t, 2H), 9.09 (d, 1H).

Synthesis Example 19

Synthesis of Complex (XIX)

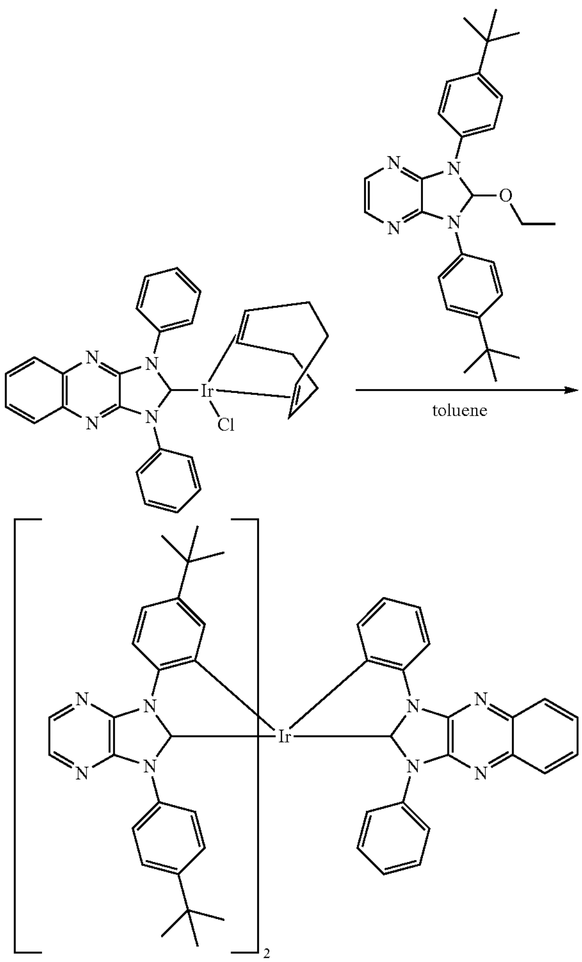

2.50 g (3.80 mmol) of complex intermediate (VIII-a) and 3.27 g (7.59 mmol) of 1,3-bis(4-tert-butylphenyl)-2-ethoxy-2H-imidazo[4,5-b]pyrazine are suspended under argon in 100 ml of toluene. The yellow suspension is three times evacuated and backfilled with argon, followed by heating at 108° C. during 22 hours. The reaction mixture is cooled down to room temperature and diluted with 400 ml of heptane, followed by stirring during one hour. The suspension is filtered and the solid washed with heptane. The combined filtrates are concentrated under vacuum and the solid further purified by chromatography (silica gel, dichloromethane/heptane), giving the title product as a yellow solid (yield: 1.40 g (28%)).

APCI-LC-MS (positive, m/z): exact mass of $C_{71}H_{67}IrN_{12}$=1280.52; found 1281.7 $[M+1]^+$.

$^1$H-NMR (400 MHz, $CD_2Cl_2$): δ=0.73 (s, 9H), 1.08 (s, 27H), 5.92-7.93 (br. signal, 12H), 6.61 (d, 1H), 6.64 (d, 1H), 6.76 (d, 1H), 6.88 (t, 1H), 6.97 (t, 1H), 7.18-7.30 (m, 3H), 7.66-7.74 (m, 1H), 7.77-7.88 (m, 2H), 8.06-8.13 (m, 2H), 8.33 (d, 1H), 8.38 (dd, 2H), 8.67 (d, 1H), 8.72 (d, 1H), 9.11 (d, 1H).

Synthesis Example 20

Synthesis of Complex (XX)

a) Synthesis of Complex Intermediate (XX-a)

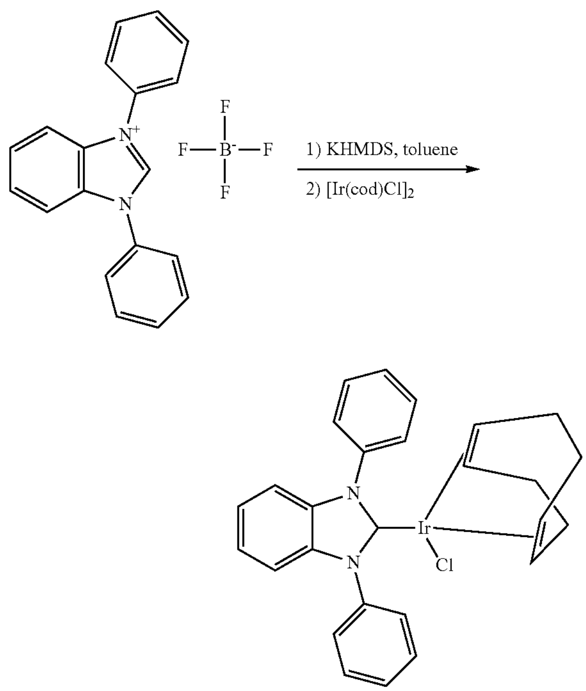

5.00 g (14.0 mmol) of 1,3-diphenylbenzimidazol-3-ium tetrafluoroborate (see synthesis in WO2005/019373) are suspended in 80 ml of toluene and cooled down to −10° C. 27.9 ml (14.0 mmol) of potassium bis(trimethylsilyl)amide solution (KHMDS, 0.5M in toluene) are added within 10 minutes at a maximum temperature of −8° C. The cooling bath is removed and the suspension stirred during 40 minutes reaching room temperature. The greenish suspension is added within 15 minutes to a preheated brownish solution of 4.69 g (7.0 mmol) of chloro(1,5-cyclooctadiene)iridium(I) dimer in 120 ml of toluene at 74° C., and stirring continued at the same temperature during three hours. The warm suspension is filtered through a 3 cm layer of silica gel and the silica gel layer rinsed with toluene. The collected fractions are concentrated under vacuum and the resulting solid dissolved in a minimal amount of dichloromethane, followed by the addition of 50 ml of ethanol. The solution is concentrated until a suspension is generated. The suspension is filtered, the solid washed with cold ethanol and dried under vacuum, giving the title compound as a yellow solid (yield: 6.20 g (74%)).

$^1$H-NMR (400 MHz, $CD_2Cl_2$): δ=1.22-1.36 (m, 2H), 1.39-1.54 (m, 4H), 1.66-1.82 (m, 2H), 2.52-2.62 (m, 2H), 4.39-4.49 (m, 2H), 7.28-7.40 (2 m, 4H), 7.57-7.70 (m, 6H), 8.04-8.13 (m, 4H).

b) Synthesis of Complex (XX)

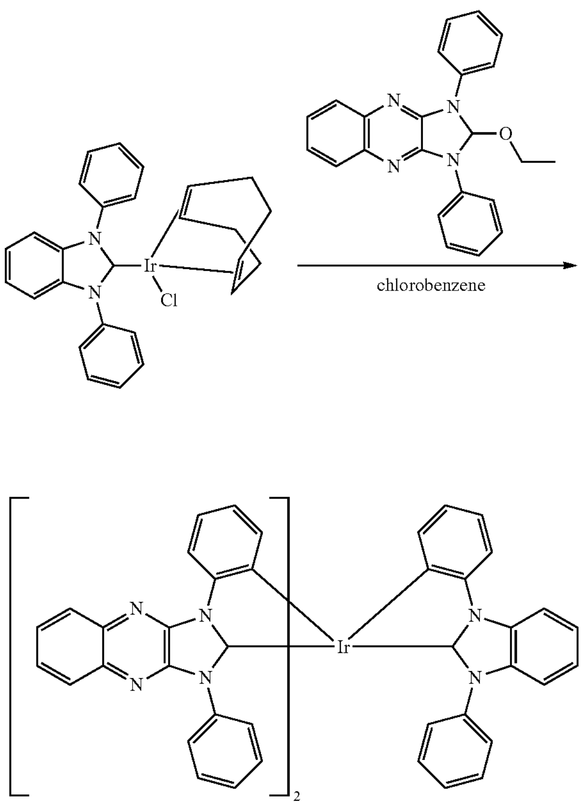

8.00 g (13.2 mmol) of complex intermediate (XX-a) and 19.5 g (52.8 mmol) of 2-ethoxy-1,3-diphenyl-2H-imidazo[4,5-b]quinoxaline are dissolved under argon in 120 ml of chlorobenzene. The yellow solution is three times evacuated and backfilled with argon, followed by heating at 124° C. during 21 hours. The reaction mixture is cooled down to room temperature and treated with 100 ml of ethanol and 300 ml of acetone, followed by stirring during 30 minutes. The suspension is filtered, the solid washed with 100 ml of ethanol first, followed by washing with 100 ml of acetone and 100 ml of heptane. The collected filtrates are concentrated under vacuum and further purified by chromatography (silica gel, dichloromethane/heptane). The pure product fractions are collected and concentrated under vacuum, until a suspension is formed. The suspension is filtered, the solid washed with 100 ml of ethanol and 100 ml of heptane, followed by drying under vacuum, giving the title product as a yellow solid (yield: 5.10 g (35%)).

APCI-LC-MS (positive, m/z): exact mass of $C_{61}H_{39}IrN_{10}$=1104.30; found 1105.2 $[M+1]^+$.

$^1$H-NMR (400 MHz, $CD_2Cl_2$): δ=5.92-7.68 (br. signal, 8H), 6.32-6.41 (m, 2H), 6.47-6.67 (m, 5H), 6.67-6.76 (t, 2H), 6.78-6.92 (m, 4H), 7.13 (t, 1H), 7.17-7.30 (m, 3H), 7.30-7.44 (m, 2H), 7.69-7.94 (2 m, 6H), 8.06 (d, 1H), 8.22 (d, 1H), 8.33 (t, 2H), 9.03 (d, 1H), 9.09 (d, 1H).

Synthesis Example 21

Synthesis of Complex (XXI)

a) Synthesis of N1,N2-bis(4-tert-butylphenyl)benzene-1,2-diamine

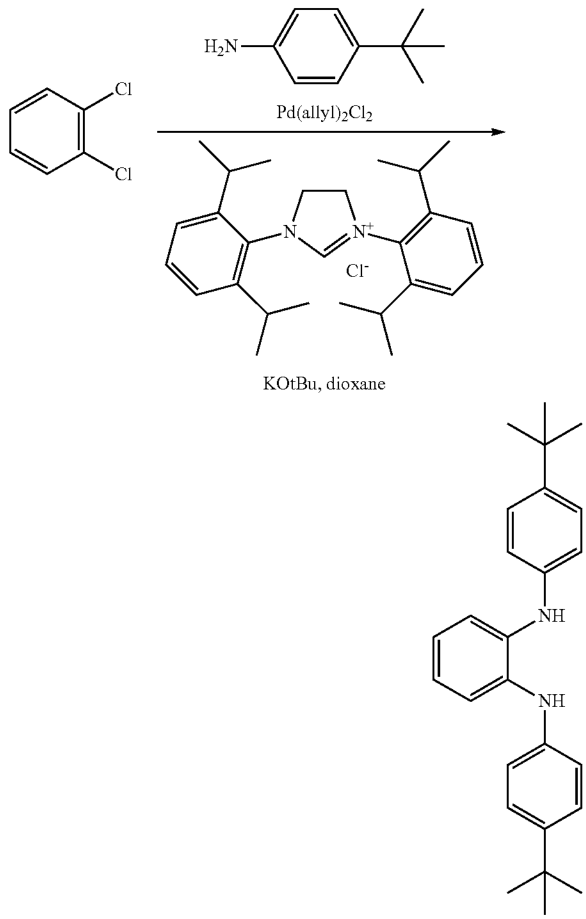

12.0 g (81.6 mmol) of 1,2-dichlorobenzene and 26.8 g (0.18 mol) of 4-tert-butylaniline are dissolved under argon in 100 ml of dioxane. 27.5 g (0.25 mol) of potassium tert-butoxide are added first, followed by the addition of 150 mg (0.41 mmol) allylpalladium(II) chloride dimer and 350 mg (0.82 mmol) of 1,3-bis-(2,6-diisopropylphenyl)imidazolium chloride. The reaction mixture is three times evacuated and backfilled with argon, followed by heating at 94° C. during three hours. The reaction mixture is diluted with 200 ml of toluene and filtered through a 5 cm layer of Hyflo® filter aid. The filtrate is concentrated under vacuum and the residue dissolved in hot ethanol. The solution is cooled down to room temperature, and the resulting suspension filtered. The solid is washed with ethanol and heptane, followed by drying under vacuum, giving the title product as a white solid (yield: 23.6 g (78%)).

$^1$H-NMR (400 MHz, $d_6$-DMSO): δ=1.25 (s, 18H), 6.83-6.88 (m, 2H), 6.90 (d, 4H), 7.09 (s, 2H), 7.16-7.25 (m, 6H).

b) Synthesis of 1,3-bis(4-tert-butylphenyl)benzimidazol-3-ium tetrafluoroborate

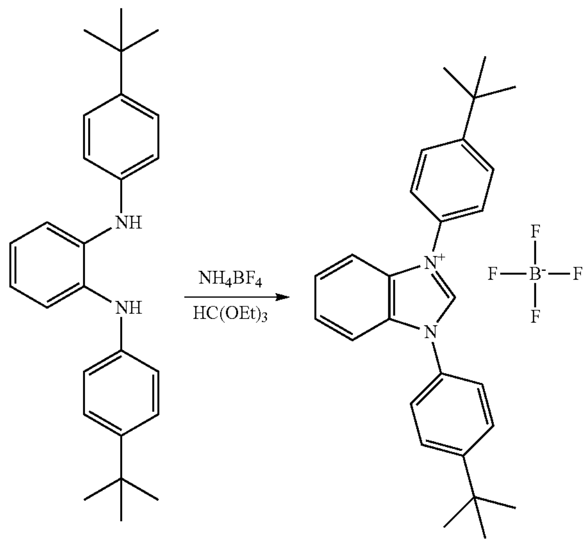

A dark blue suspension of 20.0 g (53.7 mmol) of N1,N2-bis(4-tert-butylphenyl)benzene-1,2-diamine and 5.63 g (53.7 mmol) of ammonium tetrafluoroborate in 90 ml (0.54 mol) of triethyl orthoformate are heated at 128° C. during three hours. The reaction mixture is cooled down to room temperature and diluted with 200 ml of heptane. The dark suspension is filtered, the solid washed with heptane, followed by drying under vacuum, giving the title compound as an off-white solid (yield: 24.9 g (99%).

$^1$H-NMR (400 MHz, $d_6$-DMSO): δ=1.40 (s, 18H), 7.74-7.90 (m, 10H), 7.91-8.01 (m, 2H), 10.45 (s, 1H).

c) Synthesis of Complex Intermediate (XXI-a)

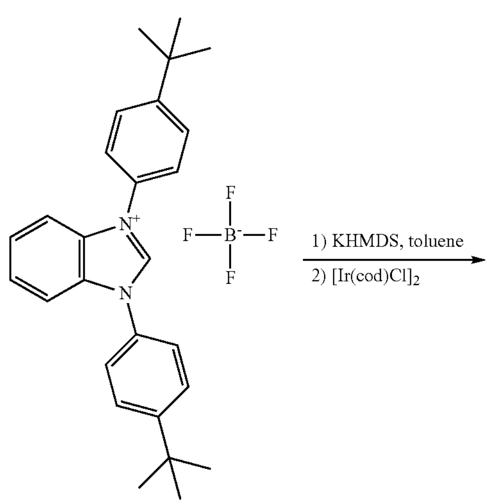

-continued

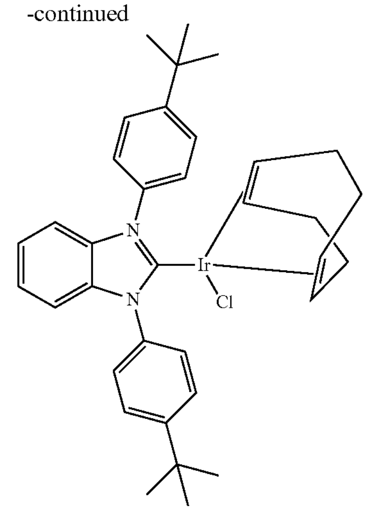

6.00 g (12.8 mmol) of 1,3-bis(4-tert-butylphenyl)benzimidazol-3-ium tetrafluoroborate are suspended in 100 ml of toluene and cooled down to −12° C. 25.5 ml (12.8 mmol) of potassium bis(trimethylsilyl)amide solution (KHMDS, 0.5M in toluene) are added within 20 minutes. The cooling bath is removed and the suspension stirred during 30 minutes until room temperature is reached. The brown suspension is added within 20 minutes to a preheated brownish solution of 4.28 g (6.37 mmol) of chloro(1,5-cyclooctadiene)iridium(I) dimer in 70 ml toluene at 74° C., and stirring continued at the same temperature during 30 minutes. The hot reaction mixture is filtered through a 4 cm layer of silica gel and the silica gel layer rinsed with toluene. The combined eluents are concentrated under vacuum and the residue stirred in hot ethanol. The suspension is filtered, the solid washed with ethanol, followed by drying under vacuum, giving the title product as a yellow solid (yield: 7.78 g (85%)).

$^1$H-NMR (400 MHz, $CDCl_3$): δ=1.17-1.61 (m, 6H), 1.45 (s, 18H), 1.62-1.75 (m, 2H), 2.40-2.50 (m, 2H), 4.44-4.55 (m, 2H), 7.23-7.38 (m, 2H), 7.34-7.41 (m, 2H), 7.61 (d, 4H), 7.97 (d, 4H).

d) Synthesis of Complex (XXI)

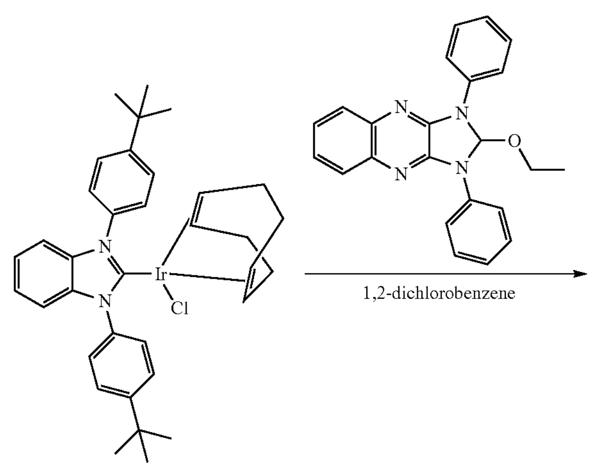

-continued

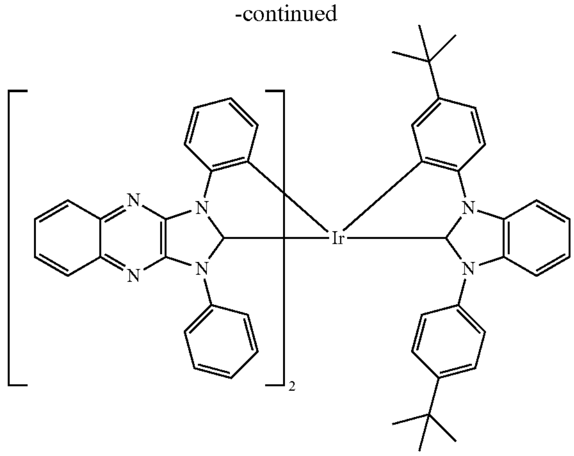

4.62 g (12.5 mmol) of complex intermediate (XXI-a) and 4.50 g (6.26 mmol) of 2-ethoxy-1,3-diphenyl-2H-imidazo [4,5-b]quinoxaline are suspended in 100 ml of 1,2-dichlorobenzene, and heated at 123° C. during during 49 hours. The reaction mixture is cooled down to room temperature and concentrated under vacuum to a volume of ca. 40 ml, followed by the addition of 300 ml of ethanol and 300 ml of heptane. The resulting suspension is filtered, the solid washed with 100 ml of ethanol, followed by drying under vacuum. The solid is further purified by chromatography (silica gel, dichloromethane/heptane). The isolated product fractions are diluted with 100 ml of ethanol and concentrated under vacuum until a suspension is formed. The suspension is filtered, the solid washed with ethanol, followed by drying under vacuum, giving the title product as a yellow solid (yield: 2.71 g (36%)).

APCI-LC-MS (positive, m/z): exact mass of $C_{69}H_{55}IrN_{10}$=1216.42; found 1217.4 $[M+1]^+$.

$^1$H-NMR (400 MHz, $CD_2Cl_2$): δ=0.69 (s, 9H), 1.06 (s, 9H), 5.98-8.08 (br. signals, 8H), 6.28 (dd, 1H), 6.33 (dd, 1H), 6.40 (dd, 1H), 6.52 (d, 1H), 6.59-6.65 (m, 2H), 6.70-6.77 (m, 2H), 6.82-6.94 (m, 3H), 7.12 (t, 1H), 7.17-7.29 (m, 3H), 7.35-7.45 (m, 2H), 7.66-7.87 (m, 5H), 7.88-7.93 (m, 1H), 7.95 (d, 1H), 8.22 (d, 1H), 8.30-8.38 (m, 2H), 9.09 (d, 2H).

Synthesis Example 22

Synthesis of Complex (XXII)

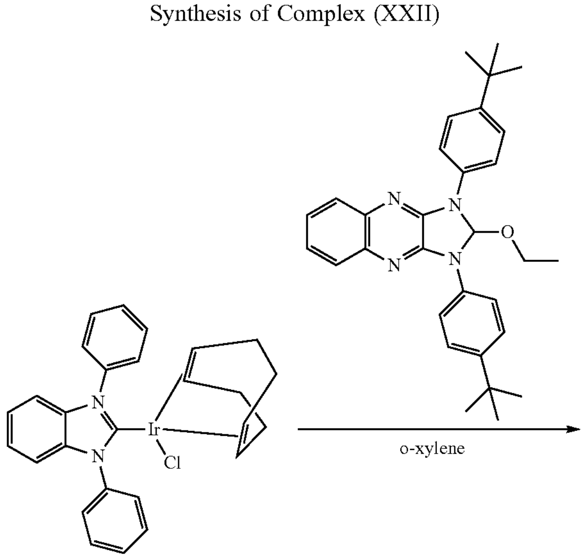

-continued

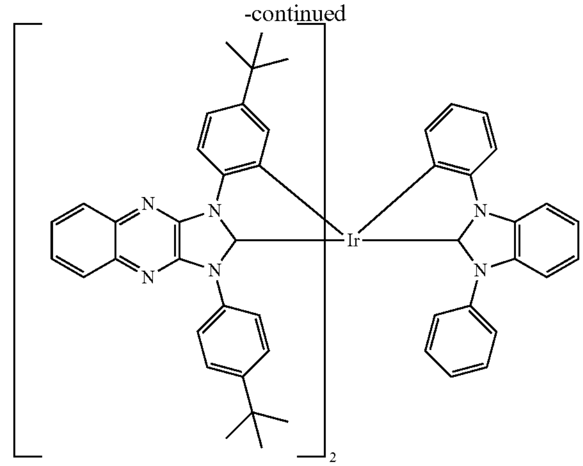

1.50 g (2.47 mmol) of complex intermediate (XX-a) and 2.37 g (4.93 mmol) of the 1,3-bis(4-tert-butylphenyl)-2-ethoxy-2H-imidazo[4,5-b]quinoxaline are dissolved in 70 ml of o-xylene, and heated at 141° C. during 21 hours. The reaction mixture is cooled down to room temperature and concentrated under vacuum. The residue is dissolved in dichloromethane and filtered through a 4 cm layer of silica gel followed by rinsing the silica gel layer with dichloromethane. The combined eluents are concentrated under vacuum and the solid further purified by chromatography (silica gel, heptane/ethyl acetate 4:1). The isolated product is dissolved in dichloromethane first, followed by the addition of 30 ml ethanol. The solution is concentrated until a suspension is formed. The suspension is filtered, the solid washed with ethanol and further dried under vacuum, giving the title product as a yellow solid (yield: 421 mg (13%)).

APCI-LC-MS (positive, m/z): exact mass of $C_{77}H_{71}IrN_{10}$=1328.55; found 1329.7 $[M+1]^+$.

$^1$H-NMR (400 MHz, $CD_2Cl_2$): δ=0.76 (s, 9H), 1.04 (s, 9H), 1.08 (s, 9H), 1.09 (s, 9H), 6.05-7.97 (br. signals, 8H), 6.10 (d, 1H), 6.20 (t, 1H), 6.38 (d, 1H), 6.48 (d, 1H), 6.56-6.66 (m, 2H), 6.68 (d, 1H), 6.73 (d, 1H), 6.82 (t, 1H), 7.10 (t, 1H), 7.16-7.29 (m, 3H), 7.29-7.43 (m, 2H), 7.68-7.76 (m, 2H), 7.77-7.85 (m, 2H), 7.88 (d, 2H), 8.09 (d, 1H), 8.25-8.38 (m, 3H), 8.85 (d, 1H), 9.00 (d, 1H).

Synthesis Example 23

Synthesis of Complex (XXIII)

a) Synthesis of N1,N2-bis(3-ethylphenyl)benzene-1,2-diamine

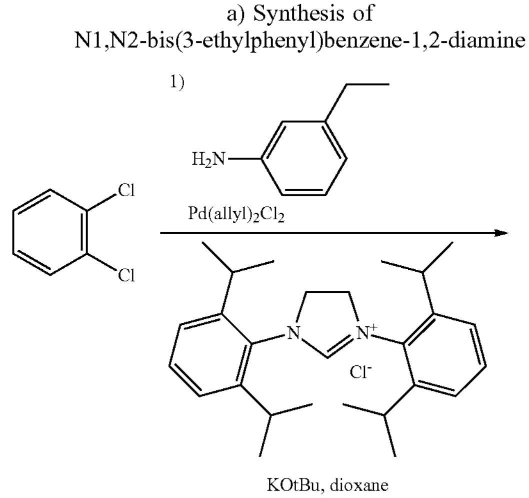

-continued

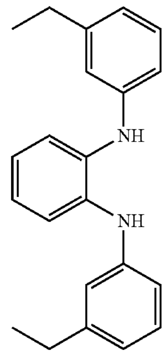

11.1 g (75.8 mmol) of 1,2-dichlorobenzene and 20.2 g (0.17 mol) of 3-ethylaniline are dissolved under argon in 100 ml of dioxane. 25.5 g (0.23 mol) of potassium tert-butoxide are added first, followed by the addition of 139 mg (0.38 mmol) allylpalladium(II) chloride dimer and 0.32 g (0.75 mmol) of 1,3-bis-(2,6-diisopropylphenyl)imidazolium chloride. The reaction mixture is three times evacuated and backfilled with argon, followed by heating at 92° C. during 90 minutes. The dark suspension is diluted with toluene and filtered through a 5 cm layer of silica gel, followed by rinsing the silica gel layer with 100 ml of toluene. The collected eluents are concentrated under vacuum, and then dissolved in 100 ml of heptane and 200 ml of 20% aqueous hydrochloric acid, followed by stirring at 50° C. during 30 minutes. The suspension is cooled down to room temperature, then filtered, and the solid washed with water and heptane. The solid is suspended in 10% aqueous sodium hydroxide and 100 ml of toluene. The toluene phase is separated then washed two times with 50 ml water, followed by drying over sodium sulfate, and concentrated under vacuum, giving the title product as a light yellow oil (yield: 13.1 g (55%)).

$^1$H-NMR (400 MHz, $d_6$-DMSO): δ=1.12 (t, 6H), 2.49 (q, 4H), 6.61 (d, 2H), 6.74-6.81 (2 br. signals, 4H), 6.87-6.94 (m, 2H), 7.08 (t, 2H), 7.17 (s, 2H), 7.20-7.27 (m, 2H).

b) Synthesis of 1,3-bis(3-ethylphenyl)benzimidazol-3-ium tetrafluoroborate

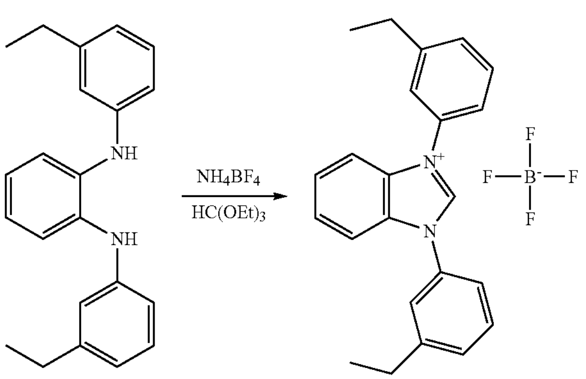

A dark blue suspension of 13.0 g (41.1 mmol) of N1,N2-bis(3-ethylphenyl)benzene-1,2-diamine and 4.31 g (41.1 mmol) of ammonium tetrafluoroborate in 70 ml (0.42 mol) of triethyl orthoformate are heated under reflux during four hours. The reaction mixture is cooled down to room temperature and diluted with 200 ml of heptane, followed by stirring during 17 hours. The dark suspension is filtered, the solid washed with heptane and further dried under vacuum, giving the title compound as a light yellow solid (yield: 16.3 g (96%)).

$^1$H-NMR (400 MHz, $d_6$-DMSO): δ=1.30 (t, 6H), 2.82 (q, 4H), 7.59-7.65 (2 br. signals, 2H), 7.69-7.84 (m, 8H), 7.94-8.00 (m, 2H), 10.53 (s, 1H).

c) Synthesis of Complex Intermediate (XXIII-a)

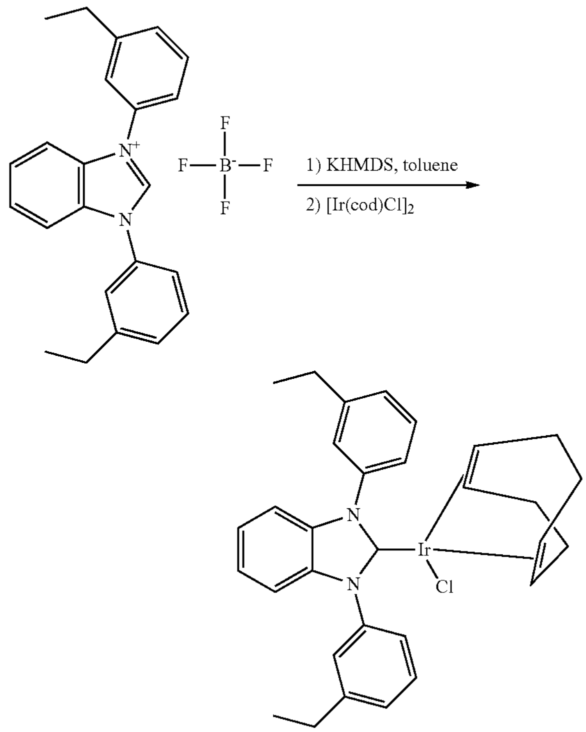

5.00 g (12.1 mmol) of 1,3-bis(3-ethylphenyl)benzimidazol-3-ium tetrafluoroborate are suspended in 100 ml of toluene and cooled down to −13° C. 24.0 ml (12.0 mmol) of potassium bis(trimethylsilyl)amide solution (KHMDS, 0.5M in toluene) are added within 15 minutes. The cooling bath is removed and the suspension stirred during 30 minutes reaching room temperature. The brown suspension is added within 35 minutes to a preheated brownish solution of 4.05 g (6.03 mmol) of chloro(1,5-cyclooctadiene)iridium(I) dimer in 70 ml toluene at 74° C., and stirring continued at the same temperature during three hours. The warm reaction mixture is filtered through a 3 cm layer of silica gel, and the silica gel layer rinsed with toluene. The collected eluents are concentrated under vacuum and stirred in warm ethanol. The suspension is filtered, the solid washed with ethanol and further dried under vacuum, giving the title product as a yellow solid (yield: 5.5 g (69%)).

$^1$H-NMR (400 MHz, $CDCl_3$): δ=1.18-1.29 (m, 2H), 1.33-1.51 (2 m, 4H), 1.38 (t, 6H), 1.65-1.79 (m, 2H), 2.45-2.52 (m, 2H), 2.75-2.90 (m, 4H), 4.46-4.54 (m, 2H), 7.24-7.30 (m, 2H), 7.33-7.41 (m, 4H), 7.50 (t, 2H), 7.76 (d, 2H), 8.06 (s, 2H).

d) Synthesis of Complex (XXIII)

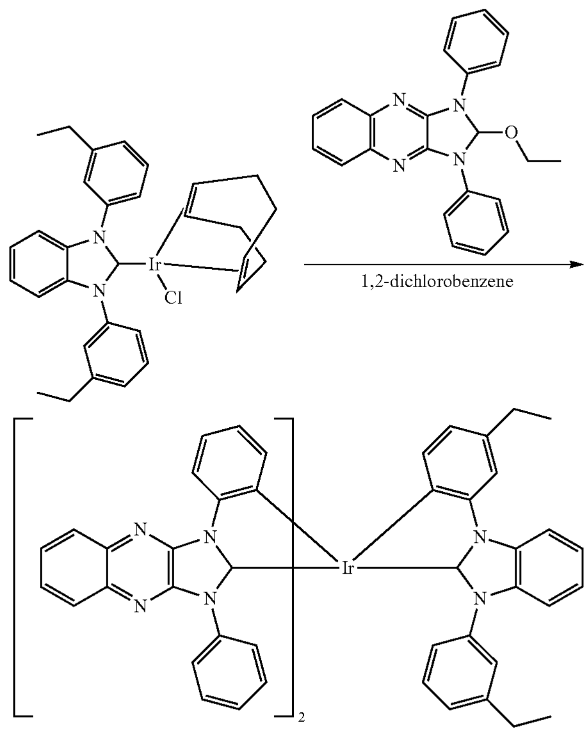

3.00 g (4.53 mmol) of complex intermediate (XXIII-a) and 3.34 g (9.07 mmol) of 2-ethoxy-1,3-diphenyl-2H-imidazo[4,5-b]quinoxaline are dissolved in 90 ml of 1,2-dichlorobenzene, and heated first at 112° C. during 20 hours, followed by heating at 123° C. during 48 hours. The reaction mixture is cooled down to room temperature, diluted with 200 ml of acetone, and stirred during three hours. The suspension is filtered, the solid washed with acetone and ethanol and further dried under vacuum, giving the title product as a yellow solid (yield: 1.69 g (32%)).

APCI-LC-MS (positive, m/z): exact mass of $C_{65}H_{47}IrN_{10}$=1160.36; found 1161.4 $[M+1]^+$.

Synthesis Example 24

Synthesis of Complex (XXIV)

a) Synthesis of N1,N2-bis(4-phenylphenyl)benzene-1,2-diamine

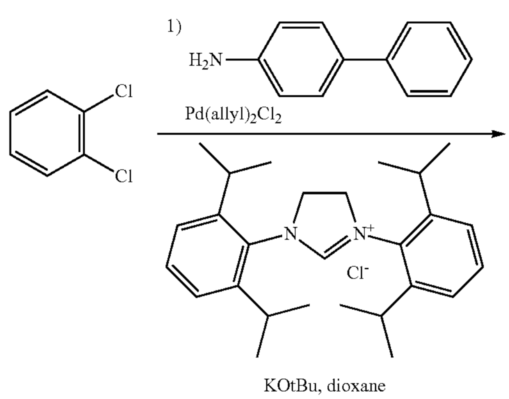

-continued

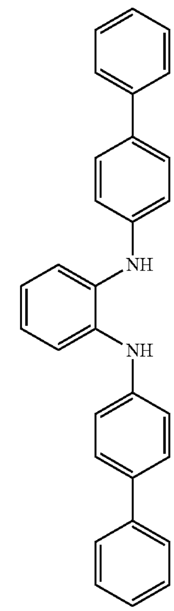

10.9 g (73.9 mmol) of 1,2-dichlorobenzene and 25.0 g (0.15 mol) of 4-biphenylamine are dissolved under argon in 100 ml of dioxane. 24.9 g (0.22 mol) of potassium tert-butoxide are added first, followed by the addition of 135 mg (0.37 mmol) allylpalladium(II) chloride dimer and 315 mg (0.74 mmol) of 1,3-bis-(2,6-diisopropylphenyl)imidazolium chloride. The reaction mixture is three times evacuated and backfilled with argon, followed by heating under reflux during 20 hours. 5.00 g (29.5 mmol) of 4-biphenylamine are added and heating continued during 24 hours. The reaction mixture is cooled down to room temperature, then diluted with 200 ml of toluene, followed by filtration through Hyflo® filter aid. The filter aid is rinsed with toluene and the combined eluents concentrated under vacuum. The residue is stirred in ethanol under reflux and the resulting suspension filtered. The solid is washed with ethanol and dissolved in 600 ml of dichloromethane. 100 ml of a 5% aqueous sodium cyanide solution are added under stirring and stirring continued during 30 minutes. The organic phase is separated and two times washed with 100 ml of water, and further diluted with 200 ml of ethanol. The solution is concentrated under vacuum until a suspension is formed. The suspension is filtered, the solid washed with ethanol, followed by drying under vacuum, giving the title product as a solid (yield: 15.3 g (50%)).

$^1$H-NMR (400 MHz, $d_6$-DMSO): δ=6.91-7.02 (m, 2H), 7.06 (d, 4H), 7.22-7.36 (m, 4H), 7.41 (t, 4H), 7.50 (s, 2H), 7.48-7.55 (m, 4H), 7.56-7.63 (m, 4H).

b) Synthesis of 1,3-bis(4-phenylphenyl)benzimidazol-3-ium tetrafluoroborate

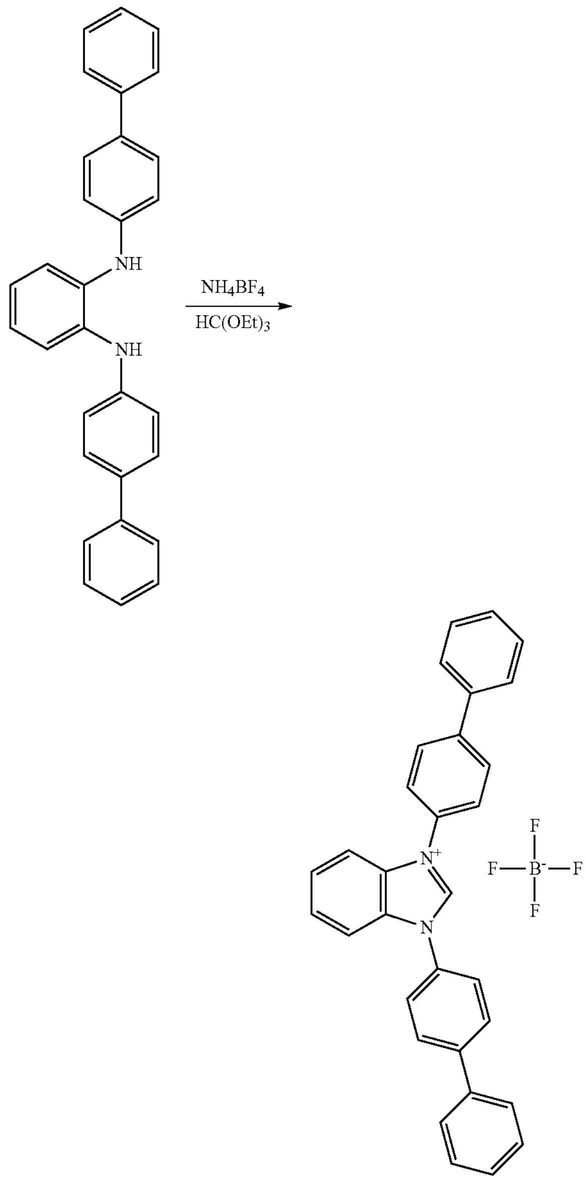

A beige suspension of 10.0 g (24.2 mmol) of N1,N2-bis(4-phenylphenyl)benzene-1,2-diamine, 2.54 g (24.2 mmol) of ammonium tetrafluoroborate and 36.6 g (0.25 mol) of triethyl orthoformate is heated at 112° C. during 15 minutes. An additional 36.6 g (0.25 mol) of triethyl orthoformate are added and heating continued at 119° C. during 4 h 30 min. The beige suspension is cooled down to room temperature first, then diluted with ethanol, and filtered. The resulting solid is washed with ethanol first, followed by drying under vacuum, giving the title product as an off-white solid (yield: 11.6 g (94%)).

$^1$H-NMR (400 MHz, $d_6$-DMSO): δ=7.49 (t, 2H), 7.58 (t, 4H), 7.82-7.89 (m, 6H), 8.03-8.09 (m, 6H), 8.10-8.16 (m, 4H), 10.65 (s, 1H).

c) Synthesis of Complex Intermediate (XXIV-a)

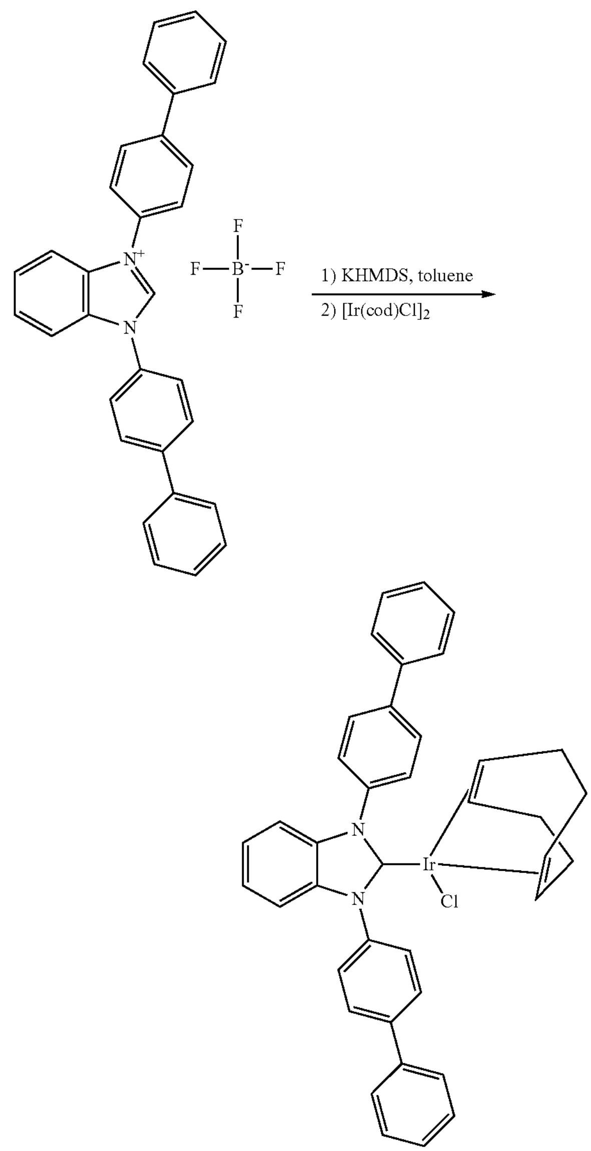

4.56 g (8.94 mmol) of 1,3-bis(4-phenylphenyl)benzimidazol-3-ium tetrafluoroborate are suspended in 50 ml of toluene and cooled down to −14° C. 18.0 ml (9.00 mmol) of potassium bis(trimethylsilyl)amide solution (KHMDS, 0.5M in toluene) are added within 15 minutes. The cooling bath is removed and the suspension stirred during 25 minutes until room temperature is reached. 3.00 g (4.47 mmol) of chloro(1,5-cyclooctadiene)iridium(I) dimer are added and the suspension heated at 63° C. during 1 h 40 min. The hot reaction mixture is filtered through Hyflo® filter aid, followed by rinsing the filter aid with toluene. The combined eluents are partly concentrated under vacuum and diluted with 100 ml of ethanol. The resulting suspension is filtered, the solid dried under vacuum, giving the title product as a yellow solid (yield: 4.10 g (61%)).

$^1$H-NMR (400 MHz, $d_6$-DMSO): δ=1.18-1.30 (m, 2H), 1.32-1.46 (m, 4H), 1.61-1.74 (m, 2H), 2.57-2.66 (m, 2H), 4.30-4.39 (m, 2H), 7.38-7.51 (m, 6H), 7.56 (t, 4H), 7.85 (d, 4H), 7.98 (d, 4H), 8.18 (d, 4H).

d) Synthesis of Complex (XXIV)

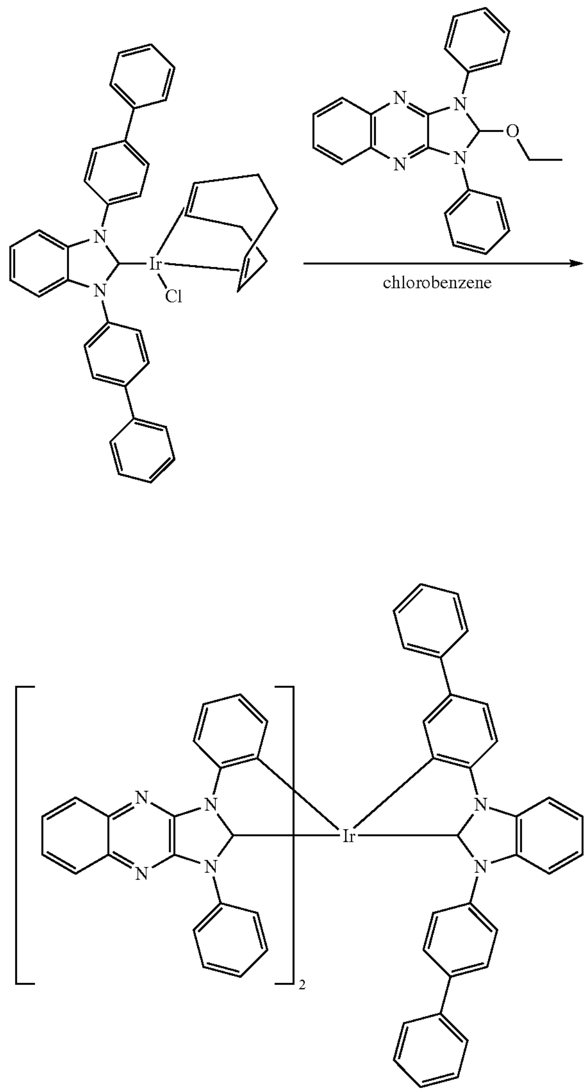

4.00 g (5.27 mmol) of complex intermediate (XXIV-a) and 7.80 g (21.1 mmol) of 2-ethoxy-1,3-diphenyl-2H-imidazo[4,5-b]quinoxaline are dissolved under argon in 100 ml of chlorobenzene. The green-brown solution is three times evacuated and backfilled with argon, followed by heating at 124° C. during 19 hours. The orange-brown solution is cooled down to room temperature first, then treated with 400 ml of acetone, and stirring continued during one hour. The resulting suspension is filtered, the solid washed with 100 ml of acetone and 200 ml of ethanol. The solid is dissolved in 75 ml of dichloromethane and filtered through a 4 cm layer of silica gel, followed by rinsing the silica gel layer with 400 ml of dichloromethane. The combined eluents are treated with 100 ml of acetone, and concentrated under vacuum to a volume of 50 ml until a suspension is formed. The suspension is filtered, the solid washed with 100 ml of acetone and 50 ml of pentane, followed by drying under vacuum. The solid is further purified by chromatography (silica gel, dichloromethane/heptane), giving the title product as a yellow solid (yield: 4.23 g (44%)).

APCI-LC-MS (positive, m/z): exact mass of $C_{73}H_{47}IrN_{10}$=1256.36; found 1257.4 $[M+1]^+$.

$^1$H-NMR (400 MHz, $CD_2Cl_2$): δ=5.98-7.70 (br. signal, 8H), 6.46 (dd, 1H), 6.57-6.64 (m, 2H), 6.64-6.72 (m, 4H), 6.73-6.83 (m, 2H), 6.85-6.95 (m, 3H), 6.95-7.03 (m, 3H), 7.11 (t, 1H), 7.14-7.23 (m, 2H), 7.24-7.33 (m, 4H), 7.33-7.39 (m, 2H), 7.43 (t, 1H), 7.50 (dd, 1H), 7.56-7.65 (m, 3H), 7.71-7.79 (m, 2H), 7.80-7.86 (m, 1H), 7.91 (dd, 1H), 8.12 (d, 1H), 8.27 (t, 2H), 8.33 (dd, 1H), 9.09 (dd, 1H), 9.13 (dd, 1H).

Synthesis Example 25

Synthesis of Complex (XXV)

a) Synthesis of 5,6-dicyano-1,3-diphenyl-benzimidazolium tetrafluoroborate

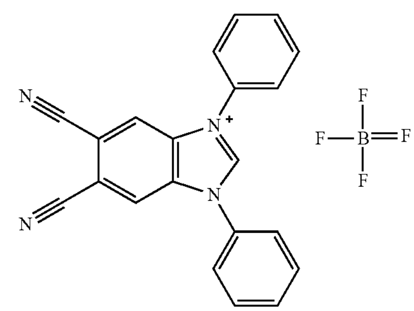

22.6 g (170 mmol) of chloromethylene-dimethyliminium chloride (Vilsmeyer reagent) are dissolved in 270 ml of acetonitrile at −5° C. 9.20 g (26.6 mmol) 4,5-dianilinophthalic acid diamide described in EP0600832 are added in portions within 5 minutes. The dark green solution is stirred for one hour at 0° C. The reaction mixture is warmed up to room temperature and stirred overnight. 19.0 g (173 mmol) of sodium tetrafluoroborate are added to the dark blue solution. After stirring the suspension for 4.5 hours the solid is filtered off and washed with acetonitrile. The filtrate is concentrated. 100 ml of an ice-water mixture are added. After stirring the suspension for 30 min the residue is filtered off, washed three times with 20 ml ice-cold water each, and is sucked dry. The solid is suspended three times in 20 ml of isopropanol each, sucked dry, and is washed twice with 20 ml of n-pentane each. The solid is dried under vacuum in a drying cabinet at 60° C. for 16 hours. 10.6 g (94% of theory) slightly turquoise solid are obtained.

$^1$H-NMR (400 MHz, $CD_3CN$): δ [ppm]=7.80 (mc; 10H), 8.50 (mc; 2H), 9.78 (s; 1H).

b) Synthesis of 2-methoxy-1,3-diphenyl-2H-benzimidazol-5,6-dicarbonitrile

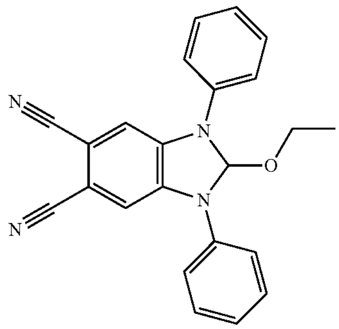 [SMILES: CCOC1N(c2ccccc2)c2cc(C#N)c(C#N)cc2N1c1ccccc1]

10.6 g (26.0 mmol) of 5,6-dicyano-1,3-diphenyl-benzimidazolium tetrafluoroborate are suspended in 250 ml of methanol. After cooling the suspension to 0° C. a solution, 4.68 g (26.0 mmol) of sodium methoxide in methanol (30%) is added within 10 minutes. The reaction mixture is stirred at 0° C. for 40 minutes and then warmed up to room temperature and stirred for three hours. The residue is filtered off, washed three times with 10 ml of ice-cold methanol, and dried under vacuum in drying cabinet overnight at 50° C. 8.51 g (93% of theory) greenish solid are obtained.

$^1$H-NMR (400 MHz, $CD_2Cl_2$): δ [ppm]=3.17 (s; 3H), 7.02 (s; 1H), 7.19 (mc; 2H), 7.32 (mc; 2H), 7.50 (mc; 8H).

c) Synthesis of Complex Intermediate (XXV-a)

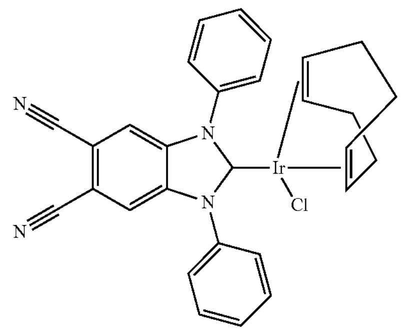

9.50 g (27.0 mmol) 2-methoxy-1,3-diphenyl-2H-benzimidazol-5,6-dicarbonitrile and 9.05 g (13.5 mmol) of μ-chloro-1,5-cyclooctadiene-iridium(I) dimer are added to 500 ml toluene. The flask is rinsed with 150 ml of toluene. After heating the suspension to 60° C. a solution is formed which is heated at that temperature for 24 hours. The suspension is cooled to 15° C. and then filtered. The residue is washed five times with 5 ml of toluene, then three times with 10 ml of n-pentane, and dried under vacuum in drying cabinet at 60° C. during 16 hours. 14.1 g (80% of theory) of an olive-green solid are obtained.

$^1$H-NMR (400 MHz, $CD_2Cl_2$): δ [ppm]=1.30-1.60 (m; 6H), 1.71 (mc; 2H), 2.54 (mc; 2H), 4.57 (mc; 2H), 7.68 (mc; 6H), 7.73 (mc; 2H), 7.99 (mc; 4H).

d) Synthesis of Complex (XXV)

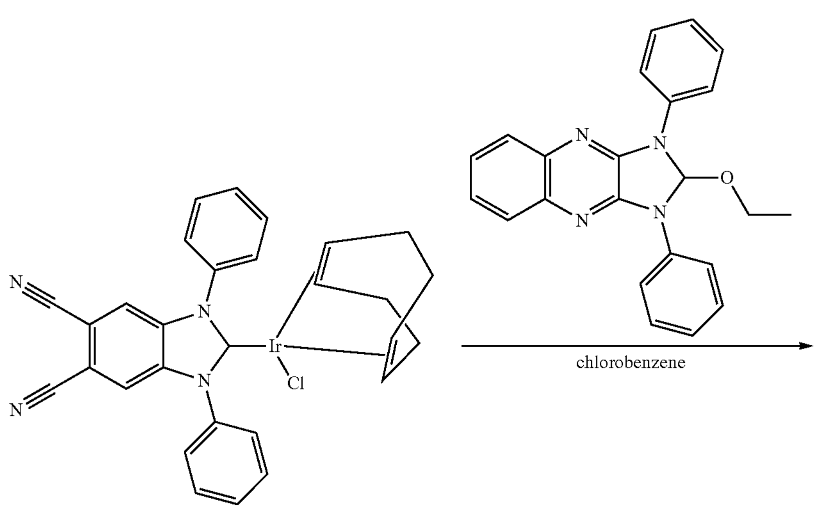

-continued

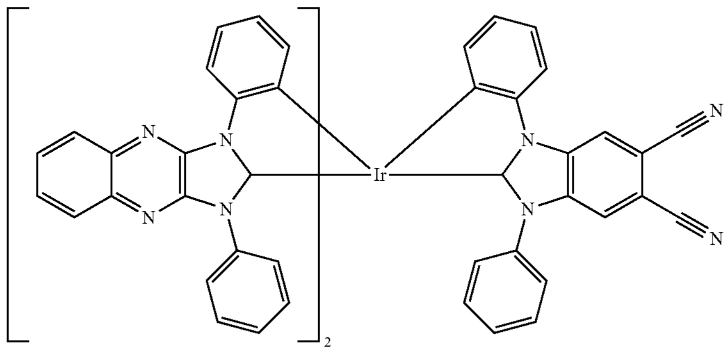

1.00 g (1.52 mmol) of complex intermediate (XXV-a) and 2.25 g (6.10 mmol) 2-ethoxy-1,3-diphenyl-2H-imidazo[4,5-b]quinoxaline are suspended in 30 ml of chlorobenzene. The suspension is heated to 125° C. and stirred at that temperature for 17 hours. After cooling the reaction mixture to room temperature 15 ml of acetone and 45 ml of absolute ethanol are added. The suspension is stirred for 30 minutes and then filtered. The filtrate is evaporated to dryness. The brown solid is dissolved in 5 ml of dichloromethane and then precipitated by adding 7 ml of absolute ethanol. The precipitate is filtered off, three times washed with 3 ml of n-pentane, and dried under vacuum in drying cabinet at 60° C. overnight. A dark yellow solid is obtained that is further purified by MPLC with the CombiFlash Companion (silica gel, dichloromethane/methanol 99.5:0.5). The purified yellow solid (0.52 g) is boiled up in 10 ml of acetonitrile. The hot suspension is filtered. The residue is washed three times with 1 ml of acetonitrile, then washed twice with 3 ml of ethanol, and three times with 3 ml of n-pentane, and dried under vacuum in a drying cabinet at 100° C. overnight. The yellow solid (0.41 g) obtained is again purified by boiling up in acetonitrile as described before. The yellow solid is purified by MPLC a second time as described before. The yellow solid is boiled up in acetonitrile again as described before. 225 mg (13% of theory) yellow solid are obtained.

ESI-LC/MS (positive, m/z): exact mass of $C_{63}H_{37}IrN_{12}$=1154.29; found 1154.2 $[M+H]^+$ $^1$H-NMR (500 MHz, $CD_2Cl_2$): δ [ppm]=6.30 (mc), 6.39 (mc), 6.53-6.61 (m), 6.68 (mc), 6.78-6.84 (m), 6.88 (mc), 6.92 (mc), 7.21 (mc), 7.36 (mc), 7.72 (mc; 2H), 7.78-7.87 (m; 5H), 8.29 (mc; 2H), 8.56 (mc; 1H), 9.01 (mc; 2H).

Synthesis Example 26

Synthesis of Complex (XXVI)

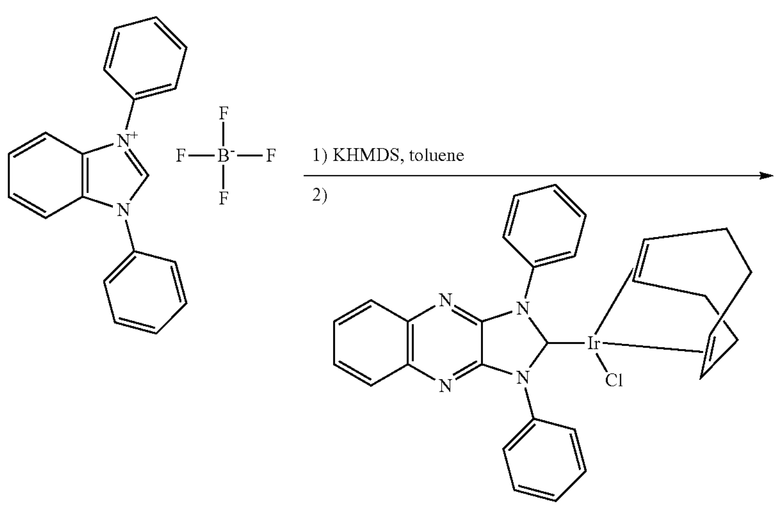

-continued

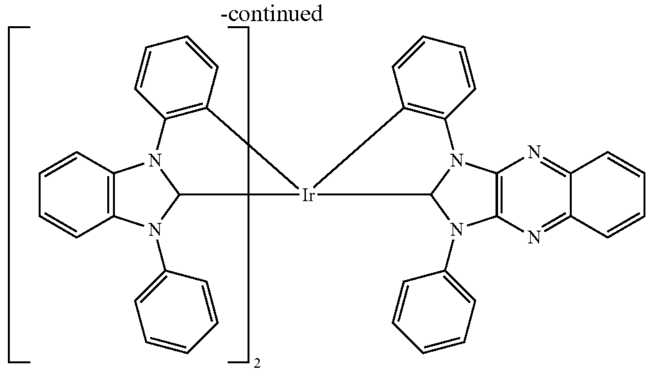

A suspension of 8.69 g (24.3 mmol) of 1,3-diphenylbenzimidazol-3-ium tetrafluoroborate (see synthesis in WO2005/019373) in 50 ml of toluene is cooled down to −11° C. 48.6 ml (24.3 mmol) of potassium bis(trimethylsilyl)amide solution (KHMDS, 0.5M in toluene) are added within 20 minutes. The cooling bath is removed and stirring continued until room temperature is reached. The green suspension is treated with 4.00 g (6.07 mmol) of complex intermediate (VIII-a) and 100 ml of toluene, and heated at 109° C. during three hours. The reaction mixture is cooled down to room temperature, filtered, and the solid washed with 50 ml of toluene. The combined filtrates are diluted with 300 ml of ethanol and 500 ml of heptane, followed by stirring during one hour. The suspension is filtered, the solid washed with ethanol and heptane, followed by drying under vacuum. The solid is further purified by chromatography (silica gel, dichloromethane/heptane), giving the title product as a yellow solid (yield: 1.64 g (26%)).

APCI-LC-MS (positive, m/z): exact mass of $C_{59}H_{39}IrN_8$=1052.29; found 1053.3 $[M+1]^+$.

$^1$H-NMR (400 MHz, $CD_2Cl_2$): δ=6.23-7.49 (br. signal, 4H), 6.25-6.40 (m, 4H), 6.45 (d, 1H), 6.49-6.61 (m, 3H), 6.61-6.69 (m, 3H), 6.70-6.89 (m, 6H), 7.06-7.24 (m, 5H), 7.27-7.41 (m, 4H), 7.68-7.75 (m, 1H), 7.77-7.84 (m, 1H), 7.88 (d, 1H), 7.98-8.08 (m, 2H), 8.20 (t, 2H), 8.31 (d, 1H), 9.02 (d, 1H).

Synthesis Example 27

Synthesis of Complex (XXVII)

a) Synthesis of N2,N3-diphenylnaphthalene-2,3-diamine

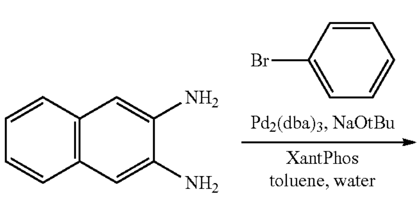

-continued

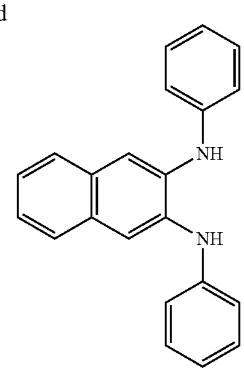

A mixture of 25 g (0.16 mol) of 2,3-diaminonaphthalene, 49.6 g (0.32 mol) of bromobenzene and 250 ml of toluene is degassed under vacuum and backfilling with argon (repeated three times). 1.45 g (1.58 mmol) of dipalladium tris(dibenzylidene acetonate), 2.74 g (4.74 mmol) of XantPhos ligand (=4,5-bis(diphenylphosphino)-9,9-dimethylxanthene), 21.0 g sodium tert-butoxide (0.22 mol) and 2.84 ml of degassed water are added and the mixture degassed again 3 times with vacuum/argon backfilling. The dark suspension is refluxed under argon for 20 hours and cooled to room temperature. The mixture is diluted with 400 ml of dichloromethane, extracted twice with a 1% aqueous solution of sodium cyanide, washed three times with water, dried over sodium sulfate, and concentrated under vacuum. The residue is purified by chromatography (silica gel, dichloromethane 99.5%:triethylamine 0.5%) to give the title product as a brown powder (yield: 23.5 g (48%)).

$^1$H-NMR (300 MHz, $CDCl_3$): δ=7.67 (s, 2H), 7.64-7.60 (m, 2H), 7.37-7.27 (m, 6H), 7.10 (m, 4H), 7.00 (tt, 2H), 5.84 (s, 2H).

b) Synthesis of 1,3-diphenylbenzo[f]benzimidazol-3-ium tetrafluoroborate

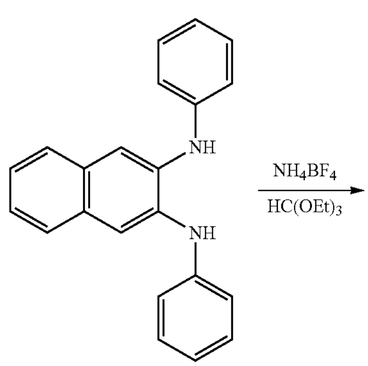

-continued

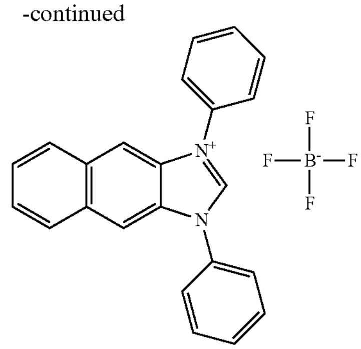

A mixture of 22 g of N2,N3-diphenylnaphthalene-2,3-diamine (71 mmol) and 7.44 g ammonium tetrafluoroborate (71 mmol) in 154.8 g triethyl orthoformate (1.05 mol) is heated for 20 hours at 100° C. in a reactor fitted with a Dean-Stark separator and condenser. The reaction mixture is cooled to 15° C. and the precipitate is rinsed with cold triethyl orthoformate and heptane. The crude product is dissolved in 600 ml of dichloromethane, filtered, and the filtrate concentrated under vacuum. The title product is obtained as a brown powder (yield: 24 g (85%)).

$^1$H-NMR (300 MHz, $d_6$-DMSO): δ=10.74 (s, 1H), 8.61 (s, 2H), 8.30 (m, 2H), 8.05 (m, 4H), 7.85 (m, 6H), 7.71 (m, 2H).

c) Synthesis of N2,N3-bis(4-isopropylphenyl)quinoxaline-2,3-diamine (XXVII-a)

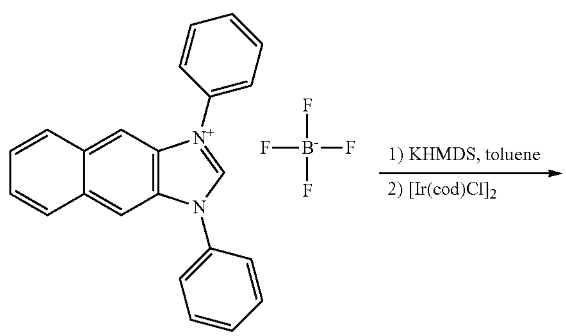

-continued

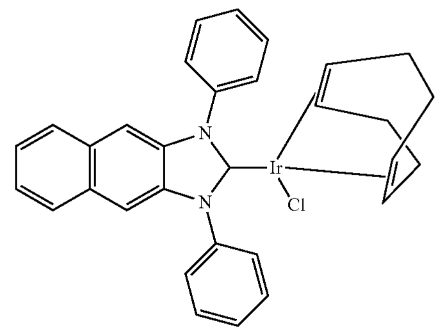

5.00 g (12.2 mmol) of 1,3-diphenylbenzo[f]benzimidazol-3-ium tetrafluoroborate are suspended in 100 ml of toluene and cooled down to −13° C. 24.5 ml (12.3 mmol) of potassium bis(trimethylsilyl)amide solution (KHMDS, 0.5M in toluene) are added within 20 minutes. The cooling bath is removed and the suspension stirred during one hour until room temperature is reached. The orange suspension is treated with 4.11 g (6.12 mmol) of chloro(1,5-cyclooctadiene)iridium(I) dimer and 50 ml of toluene, and then heated at 66° C. during one hour. The hot reaction mixture is filtered through a 3 cm layer of Hyflo® filter aid, and the filter aid layer rinsed with 30 ml of toluene. The combined eluents are concentrated under vacuum, and the black residue stirred in 100 ml of ethanol during 15 minutes. The resulting suspension is filtered, the solid washed with 30 ml of ethanol, followed by drying under vacuum, giving the title product as a greenish yellow solid (yield: 4.54 g (56%)).

$^1$H-NMR (400 MHz, $d_6$-DMSO): δ=1.19-1.49 (m, 6H), 1.57-1.71 (m, 2H), 2.58-2.66 (m, 2H), 4.28-4.37 (m, 2H), 7.47-7.54 (m, 2H), 7.63-7.76 (m, 2H), 7.88 (s, 2H), 8.05-8.11 (m, 2H), 8.11-8.17 (m, 4H).

d) Synthesis of Complex (XXVII)

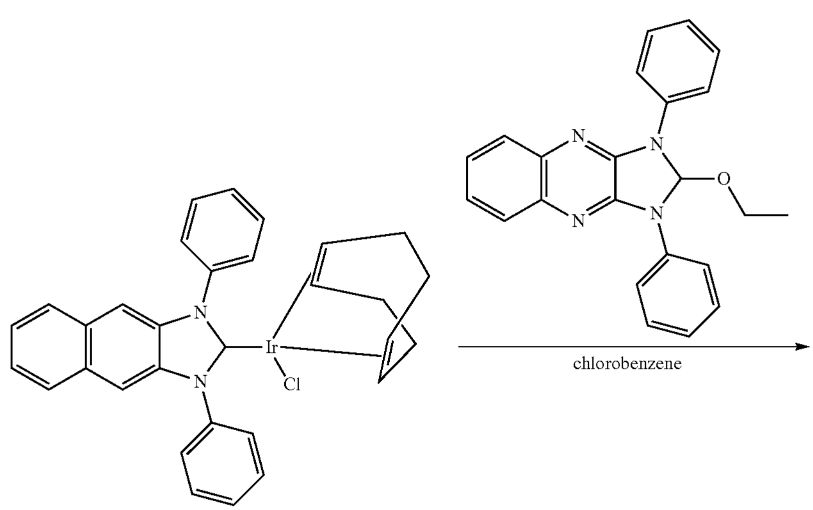

-continued

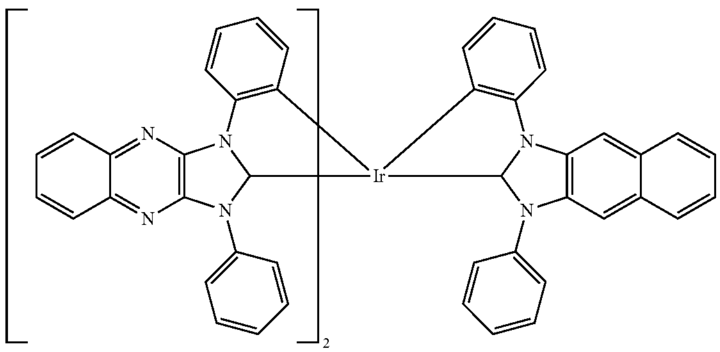

4.00 g (6.10 mmol) of complex intermediate (XXVII-a) and 9.00 g (24.4 mmol) of 2-ethoxy-1,3-diphenyl-2H-imidazo[4,5-b]quinoxaline are dissolved under argon in 100 ml of chlorobenzene. The dark solution is three times evacuated and backfilled with argon, followed by heating at 126° C. during 23 hours. The reaction mixture is treated with 100 ml of DMF and then cooled down to room temperature, followed by stirring at ice-bath temperature during 30 minutes. The suspension is filtered and the resulting solid washed with 20 ml of DMF. The solid is further stirred in 20 ml of DMF, and the resulting suspension filtered, followed by stirring the solid two times in 30 ml of ethanol first, and then two times in 30 ml of heptane. The suspension is filtered and the solid dried under vacuum. The solid is dissolved in 80 ml of hot NMP. The brownish yellow solution is cooled down to room temperature and the resulting suspension stirred during 30 minutes. The suspension is filtered, the solid washed with 20 ml of NMP first, then 50 ml of ethanol and 50 ml of heptane, followed by drying under vacuum. The yellow solid is stirred in 1 L of dichloromethane during one hour, followed by filtration. The filtrate is treated with 10 g of Hyflo® filter aid, and concentrated under vacuum. The solid Hyflo®-product mixture is subjected to further purification by chromatography (silica gel, dichloromethane/toluene), giving the title product as a yellow solid (yield: 1.73 g (25%)).

APCI-LC-MS (positive, m/z): exact mass of $C_{65}H_{41}IrN_{10}$=1154.31; found 1155.4 $[M+1]^+$.

$^1$H-NMR (400 MHz, $CD_2Cl_2$): δ=6.04-7.63 (br. signal, 8H), 6.44 (m, 2H), 6.54-6.78 (m, 7H), 6.79-6.91 (m, 4H), 7.17-7.34 (m, 3H), 7.39 (t, 1H), 7.48 (t, 1H), 7.57 (t, 1H), 7.67-7.80 (m, 3H), 7.80-7.96 (m, 4H), 8.17 (d, 1H), 8.24 (d, 1H), 8.35 (t, 2H), 8.64 (s, 1H), 9.03 (d, 1H), 9.10 (d, 1H).

Synthesis Example 28

Synthesis of Complex (XXVIII)

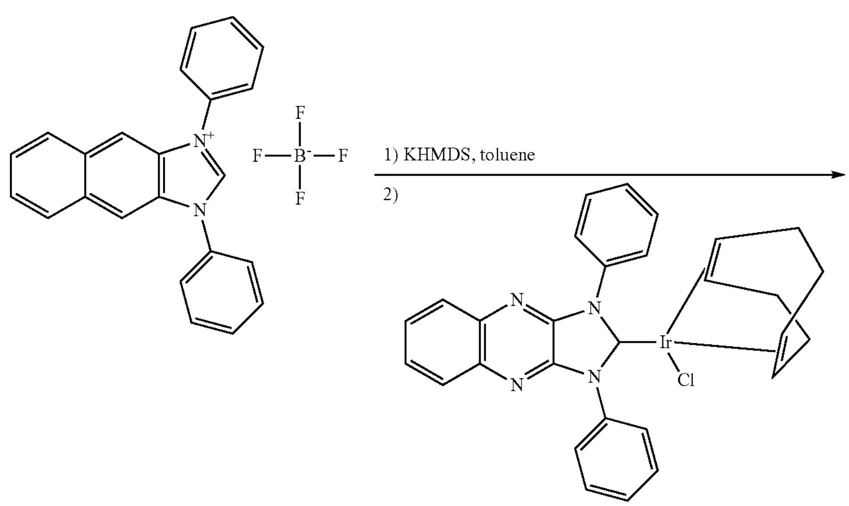

-continued

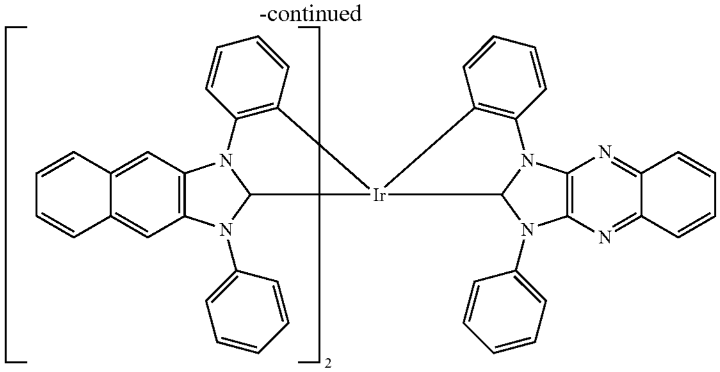

A suspension of 9.40 g (23.0 mmol) of 1,3-diphenylbenzo[f]benzimidazol-3-ium tetrafluoroborate in 150 ml of toluene is cooled down to −12° C. 46.1 ml (23.1 mmol) of potassium bis(trimethyl-silyl)amide solution (KHMDS, 0.5M in toluene) are added within 25 minutes at a maximum temperature of −9° C. The cooling bath is removed and stirring continued until room temperature is reached. The red suspension is treated with 3.80 g (5.76 mmol) of complex intermediate (VIII-a), and heated under reflux during 75 minutes. The hot orange-brown suspension is filtered through a 3 cm layer of Hyflo® filter aid, and the filter aid rinsed with 30 ml of toluene. The combined eluents are diluted with 600 ml of ethanol and stirred during 45 minutes. The suspension is filtered, the solid washed with ethanol, followed by drying under vacuum. The solid is further purified by chromatography (silica gel, dichloromethane/heptane), giving the title product as a yellow solid (yield: 3.49 g (53%)).

APCI-LC-MS (positive, m/z): exact mass of $C_{67}H_{43}IrN_8$=1152.32; found 1153.3 $[M+1]^+$.

$^1$H-NMR (400 MHz, $CD_2Cl_2$): δ=6.26-7.63 (br. signal, 4H), 6.27-6.50 (m, 4H), 6.57 (t, 1H), 6.61-6.88 (m, 12H), 6.90 (s, 1H), 7.15-7.32 (m, 3H), 7.34-7.60 (m, 5H), 7.65-7.94 (m, 5H), 8.10-8.28 (m, 4H), 8.32 (dd, 1H), 8.61 (d, 2H), 9.03 (dd, 1H).

Synthesis Example 29

Synthesis of Complex (XXIX)

a) Synthesis of 1,3-diphenylimidazol-1-ium tetrafluoroborate

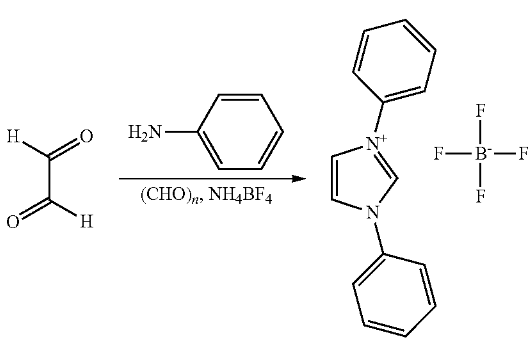

A solution of 50.0 g (0.34 mol) of a 40% aqueous glyoxal solution, 65.3 g (0.70 mol) of aniline and 500 ml of ethyl acetate is stirred over an ice-bath during one hour. The ice-bath is removed and the reaction mixture stirred at room temperature during one hour. The light orange solution is slowly treated at ice-bath temperature with an ice-cold suspension of 5.20 g of paraformaldehyde in 120 ml of 1,4-dioxane and 52 g of concentrated aqueous hydrochloric acid, followed by stirring during 20 minutes. The ice-bath is removed and stirring continued until room temperature is reached, followed by stirring during one hour at room temperature. The resulting suspension is treated with 500 ml of saturated aqueous sodium hydrogencarbonate solution first, then filtered, and the solid washed with ethyl acetate. The water phase is separated of the filtrate solution, and two times washed with 100 ml of ethyl acetate. The water phase is further treated with 45.4 g of 48% aqueous solution of tetrafluoroboric acid and stirred for a short time. The resulting suspension is filtered and the solid dried under vacuum, giving the title product as a white solid (yield: 22.7 g (21%)).

$^1$H-NMR (400 MHz, $d_6$-DMSO): δ=7.65 (t, 2H), 7.73 (t, 4H), 7.93 (d, 4H), 8.58 (d, 2H), 10.34 (s, 1H).

b) Synthesis of Complex Intermediate (XXIX-a)

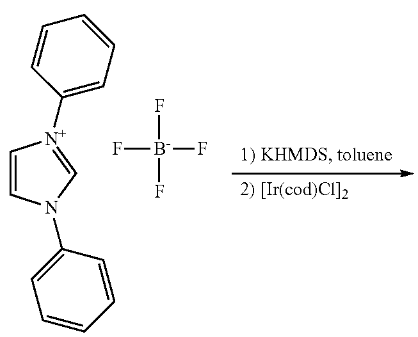

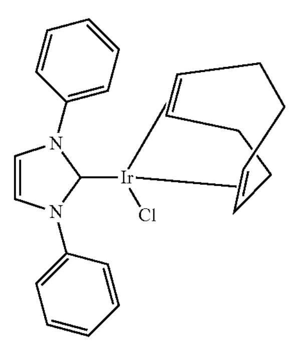

0.92 g (14.0 mmol) of 1,3-diphenylimidazol-1-ium tetrafluoroborate are suspended under argon in 15 ml of toluene and cooled down to −10° C. 6.0 ml (3.0 mmol) of potassium bis(trimethylsilyl)-amide solution (KHMDS, 0.5M in toluene) are dropwise added at a max. temperature of −8° C. The cooling bath is removed and the suspension stirred until room temperature is reached. The orange suspension is dropwise added to a preheated brownish solution of 1.00 g (1.49 mmol) of chloro(1,5-cyclooctadiene)iridium(I) dimer in 15 ml of toluene at 74° C., and stirring continued at the same temperature during two hours. The warm orange suspension is diluted with 50 ml of toluene and filtered through a 3 cm layer of silica gel and the silica gel layer rinsed with toluene. The collected fractions are concentrated under vacuum and the resulting solid dissolved in a minimal amount of dichloromethane, followed by the addition of 30 ml of ethanol. The solution is concentrated until a suspension is generated. The suspension is filtered, the solid washed with cold ethanol and dried under vacuum, giving the title compound as a yellow solid (yield: 0.64 g (39%)).

$^1$H-NMR (400 MHz, $CD_2Cl_2$): δ=1.17-1.31 (m, 2H), 1.40-154 (m, 4H), 1.74-1.89 (m, 2H), 2.37-2.45 (m, 2H), 4.40-4.48 (m, 2H), 7.39 (s, 2H), 7.47-7.61 (m, 6H), 8.11-8.18 (m, 4H).

c) Synthesis of Complex (XXIX)

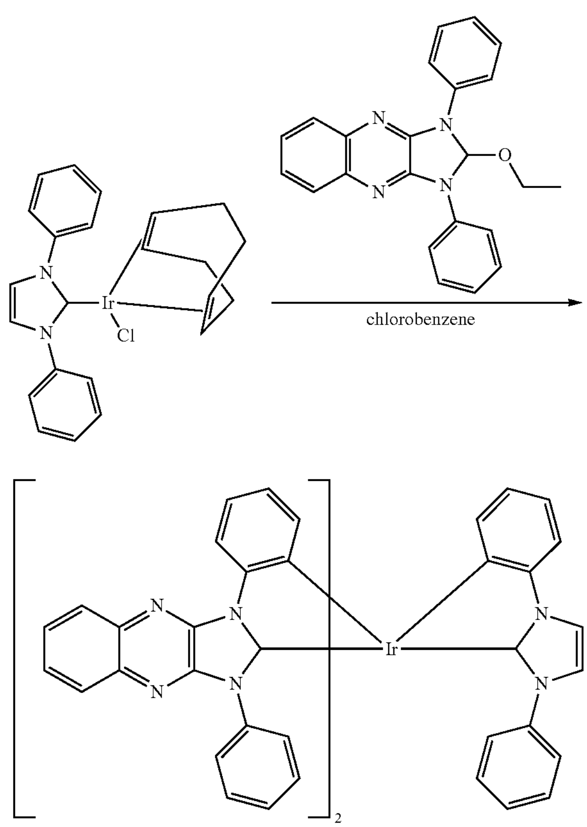

0.50 g (0.90 mmol) of complex intermediate (XXIX-a) and 1.34 g (3.64 mmol) of 2-ethoxy-1,3-diphenyl-2H-imidazo[4,5-b]quinoxaline are dissolved under argon in 25 ml of chlorobenzene. The yellow solution is three times evacuated and backfilled with argon, followed by heating at 116° C. during 16 hours. The reaction mixture is cooled down to room temperature and treated with 20 ml of ethanol, followed by stirring during 30 minutes. The suspension is filtered, the solid washed with ethanol first, followed by washing with heptane. The collected filtrates are concentrated under vacuum, and further purified by chromatography (silica gel, dichloromethane/heptane). The pure product fractions are collected and concentrated under vacuum, until a suspension is formed. The suspension is filtered, the solid washed with ethanol, followed by drying under vacuum, giving the title product as a yellow solid (yield: 0.3 g (32%)).

APCI-LC-MS (positive, m/z): exact mass of $C_{57}H_{37}IrN_{10}$=1054.28; found 1055.2 $[M+1]^+$.

$^1$H-NMR (400 MHz, $CD_2Cl_2$): δ=6.21-7.66 (br. signals, 8H), 6.35 (dd, 2H), 6.48 (tt, 1H), 6.55 (d, 1H), 6.56-6.65 (m, 3H), 6.66-6.90 (m, 7H), 7.10 (td, 1H), 7.24 (td, 2H), 7.40 (m, 1H), 7.49 (d, 1H), 7.68-7.88 (m, 5H), 7.93 (dd, 1H), 8.29 (dd, 1H), 8.34 (dd, 1H), 8.97 (dd, 1H), 9.08 (dd, 1H).

Synthesis Example 30

Synthesis of Complex (XXX)

a) Synthesis of Complex Intermediate (XXX-a)

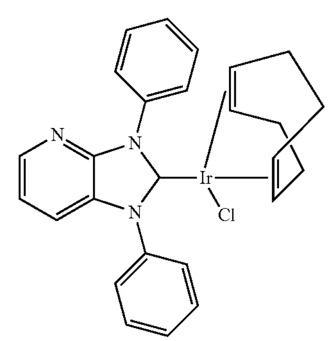

0.50 g (1.64 mmol) of 1,3-Diphenyl-imidazo[4,5-b]pyridiniumchloride (synthesis described in WO2011/073149, example 26) are dissolved in 10 ml toluene and cooled to −10° C. 3.28 ml (1.64 mmol) of a 0.5M KHMDS solution in toluene are added to the solution within five minutes. The solution is stirred another five minutes and then slowly warmed up to room temperature. 0.55 g (0.82 mmol) μ-chloro-1,5-cyclooctadien-iridium(I) dimer are added to the reaction mixture. After heating the suspension to 60° C. it is held at that temperature for 20.5 hours. The suspension is cooled to room temperature and then filtered through Decalite Speed. The filtrate is washed with water and then with brine. The organic solution is dried with magnesium sulfate and filtered. The solution is concentrated under vacuum. The solid (0.83 g) is dissolved in dichloromethane and adsorbed on 2 g of Decalite Speed. The solid is filtered off and further purified by MPLC with the CombiFlash Companion (silica gel, ethyl acetate/n-heptane), giving the title product as a yellow solid (yield: 0.21 g (21%)).

$^{1}$H-NMR (500 MHz, $CD_2Cl_2$): δ [ppm]=1.29-1.34 (m, 2H), 1.29-1.52 (m, 4H), 1.74 (mc, 2H), 2.50-2.59 (m, 2H), 4.48 (mc, 2H), 7.25 (mc, 1H), 7.54-7.66 (m, 7H), 8.05 (mc, 2H), 8.12 (mc, 2H), 8.32 (mc, 1H).

b) Synthesis of Complex (XXX)

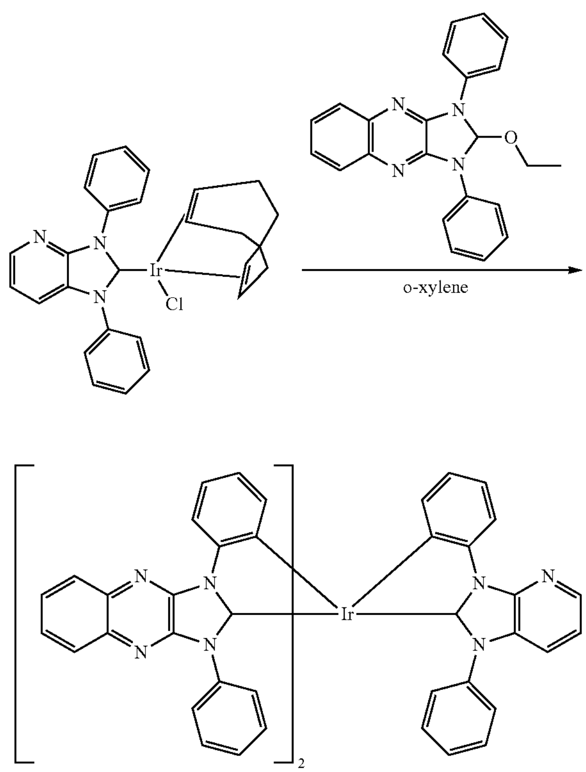

0.40 g (0.66 mmol) of complex intermediate (XXX-a) and 0.49 g (1.32 mmol) 2-ethoxy-1,3-diphenyl-2H-imidazo[4,5-b]quinoxaline are dissolved in 20 ml o-xylene. The solution is heated to 115° C. and held at that temperature for 21.5 hours. After cooling the reaction mixture to room temperature it is evaporated to dryness. The solid is added to ethyl acetate. After the suspension has been filtered the filtrate is evaporated to dryness. The solid is purified by MPLC with the CombiFlash Companion (silica gel, ethyl acetate/n-heptane). After evaporating the solvent the solid is recrystallized in toluene. The solid is filtered, and dried under vacuum, giving the title product as a yellow solid (yield: 20 mg (3%)).

ESI-LC/MS (positive, m/z): exact mass of $C_{60}H_{38}IrN_{11}$=1105.29; found 1106.3 $[M+H]^+$.

$^{1}$H-NMR (500 MHz, $CD_2Cl_2$): δ [ppm]=6.28-7.36 (m; 26H), 7.72 (mc; 2H), 7.76-7.88 (m; 4H), 8.30 (mc; 2H), 8.41 (mc; 1H), 9.02 (mc, 3H).

Synthesis Example 31

Synthesis of Complex (XXXI)

a) Synthesis of 2-ethoxy-1-(o-tolyl)-3-phenyl-6-(trifluoromethyl)-2H-imidazo[4,5-b]pyridine

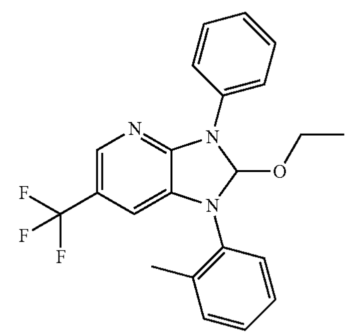 [SMILES: CCOC1N(c2ccccc2C)c2cc(C(F)(F)F)cnc2N1c1ccccc1]

5.32 g (14.0 mmol) HCl-Adduct of 2,3-dianilino-5-trifluoromethyl-pyridine are heated in 45 g triethyl orthoformate at 120° C. for 16 h. The reaction mixture is evaporated to dryness in vacuum. 6.39 g oil are obtained containing small amounts of triethyl orthoformate.

b) Synthesis of Complex Intermediate (XXXI-a)

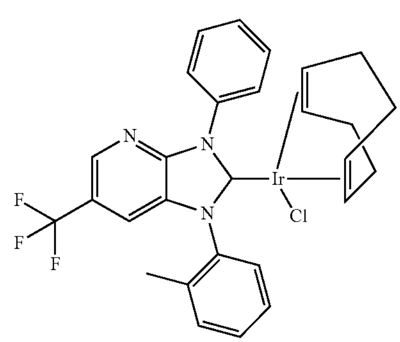

A solution of 6.39 g of 2-ethoxy-1-(o-tolyl)-3-phenyl-6-(trifluoromethyl)-2H-imidazo[4,5-b]pyridine and 4.49 g (6.68 mmol) μ-chloro-cyclooctadien-iridium dimer in 75 ml toluene is heated at 55° C. for 50 min. The reaction mixture is evaporated to dryness in vacuum. 50 ml ethanol are added to the residue. The mixture is stirred during five minutes and then filtered. The solid is dried under vacuum giving the title product as a solid (yield: 5.32 g).

c) Synthesis of Complex (XXXI)

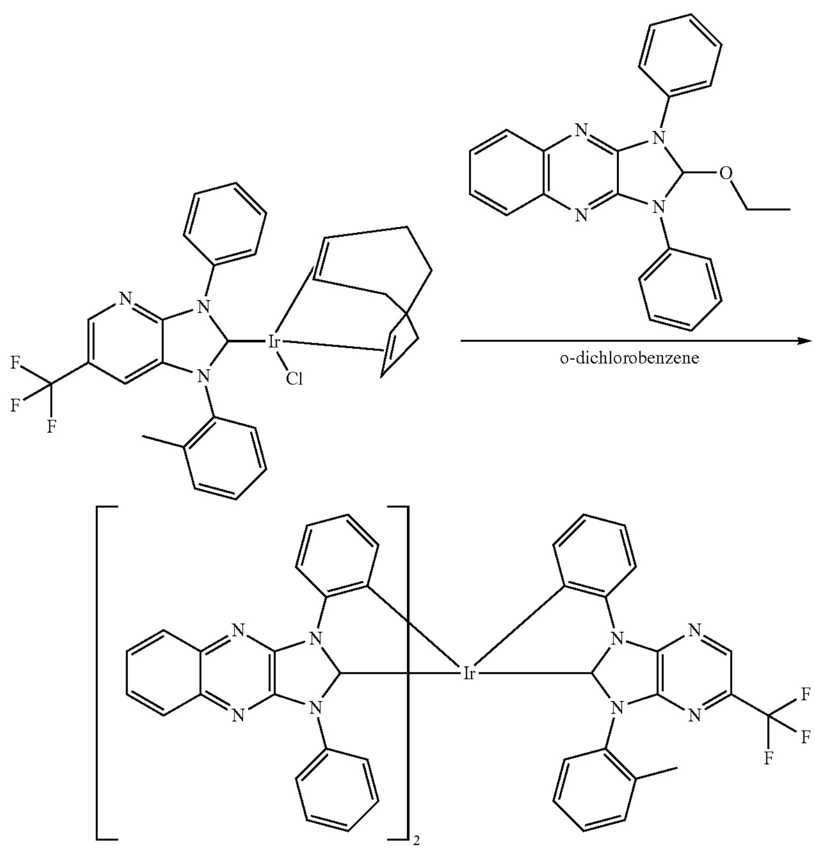

A solution of 12.83 g (34.8 mmol) complex intermediate (XXXI-a) and 8.00 g 2-ethoxy-1,3-diphenyl-2H-imidazo[4,5-b]quinoxaline in 300 ml o-dichlorobenzene is heated at 150° C. for one hour. After cooling the reaction mixture to room temperature the suspension is filtered. The residue is purified by MPLC with CombiFlash Companion (silica gel, dichloromethane/n-heptane), giving the title product as a yellow solid (yield: 2.80 g (20%)).

MALDI-MS (positive, m/z): exact mass of $C_{62}H_{39}F_3IrN_{11}$=1187.30; found 1187 $[M+H]^+$ $^1$H-NMR (500 MHz, $d_6$-DMSO): δ [ppm]=0.77 (s; 3H), 6.20 (mc; 1H), 6.50-6.65 (m; 5H), 6.68-6.78 (m; 4H), 6.82 (mc; 1H), 6.90-7.23 (m; 9H), 7.78 (mc, 2H), 7.81-7.90 (m; 4H), 8.25 (mc; 1H), 8.31 (mc; 1H), 8.72 (mc; 1H), 8.81 (mc; 1H), 8.84 (mc; 1H), 8.95 (mc; 1H).

Synthesis Example 32

Synthesis of Complex (XXXII)

a) Synthesis of phenanthrene-9,10-dione oxime

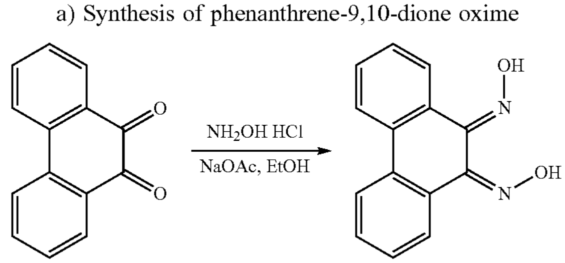

12.6 g (61 mmol) 9,10-Phenthrenedione, 16.9 g (243 mmol) hydroxylamine hydrochloride, 12.5 g (152 mmol) sodium acetate and 250 ml ethanol are heated under reflux over night. After cooling to room temperature the precipitate is filtered off. The solid residue is suspended in water (50 ml) and filtered off. It is washed with water and petroleum spirits. The crude product is recrystallized from methanol. Isomers of phenanthrene-9,10-dione oxime are obtained as light-orange solid (yield: 11.9 g (83%)).

$^1$H-NMR (400 MHz, $d_6$-DMSO): δ=7.43-7.50 (m, 2H), 7.52-7.60 (m, 2H), 7.80+7.85 (2×d, 1H), 8.09-8.15 (m, 2H), 8.46-8.49 (m, 1H), 12.20+12.24+12.31+12.49 (4×s, 2H).

b) Synthesis of phenanthrene-9,10-diamine hydrochloride

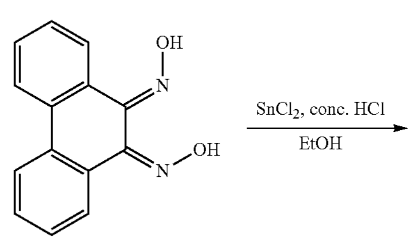

-continued

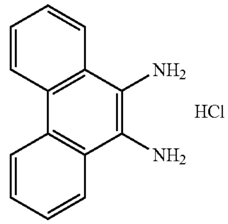

3.4 g (14.3 mmol) of phenanthrene-9,10-dione oxime are dissolved in refluxing ethanol (135 ml). The solution is cooled below 70° C. and 14.9 g (78.5 mmol) $SnCl_2$ dissolved in 135 ml hydrochloric acid (32%) are added dropwise within 10 minutes. The reaction mixture starts to reflux upon the exothermic reaction. The reaction is refluxed for additional 10 minutes. After cooling to room temperature the precipitate is filtered off and is washed with ethanol. The crude product is directly used in the next reaction.

c) Synthesis of 1,4-dihydrophenanthro[9,10-b]pyrazine-2,3-dione

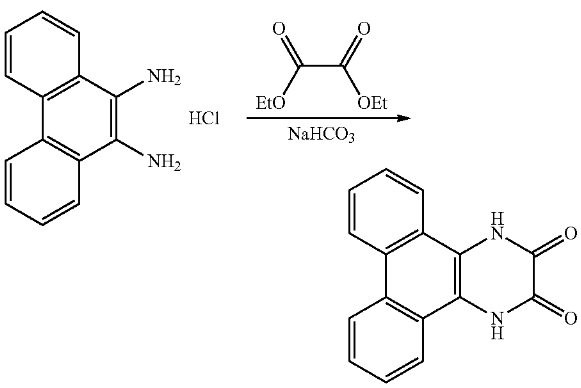

3.5 g (14.3 mmol) of crude phenanthrene-9,10-diamine hydrochloride and 9.34 g (111 mmol) $NaHCO_3$ are suspended in 140 ml diethyl oxalate. The mixture is heated to 130° C. overnight. After cooling to room temperature the precipitate is filtered off. The residue is suspended in 100 ml water and filtered off. The solid is washed with ethanol and dried under vacuum. 1,4-Dihydrophenanthro[9,10-b]pyrazine-2,3-dione is obtained as light-orange powder (yield: 481 mg (13% w.r.t. phenanthrene-9,10-dione oxime)).

$^1$H-NMR (500 MHz, $d_6$-DMSO): δ=7.71-7.77 (m, 4H), 8.69 (d, 2H), 8.91 (d, 2H), 12.17 (s, br, 2H).

d) Synthesis of 2,3-dichlorophenanthro[9,10-b]pyrazine

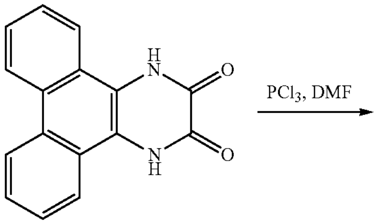

-continued

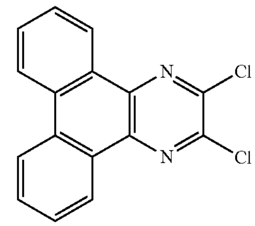

600 mg (2.29 mmol) of 1,4-dihydrophenanthro[9,10-b]pyrazine-2,3-dione are dissolved in 9 ml DMF under argon. 4 ml (6.28 g, 20 mmol) $PCl_3$ are added dropwise and the reaction mixture is heated to 100° C. for 3.5 h. After cooling to room temperature the reaction mixture is quenched with water. The precipitate is filtered off and washed with ethanol. After drying under vacuum 2,3-dichlorophenanthro[9,10-b]pyrazine is obtained as light-brown solid (yield: 539 mg (78%)).

$^1$H-NMR (400 MHz, $d_6$-DMSO): δ=7.90 (t, 2H), 7.99 (t, 2H), 8.95-8.99 (m, 4H).

e) Synthesis of N2,N3-diphenylphenanthro[9,10-b]pyrazine-2,3-diamine

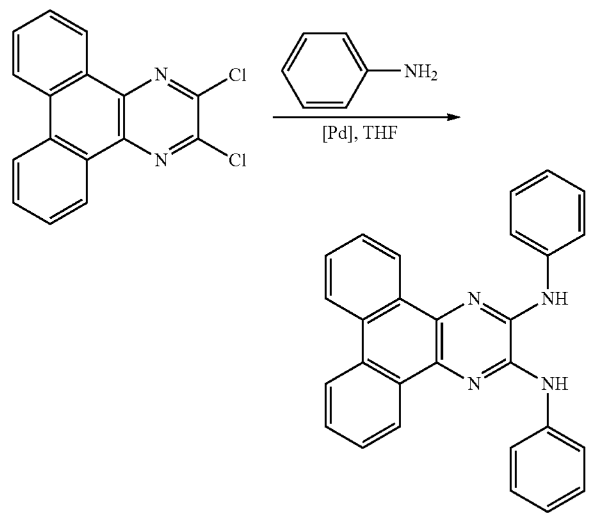

582 mg (1.95 mmol) of 2,3-dichlorophenanthro[9,10-b]pyrazine and 0.43 ml (435 mg, 2.4 mmol) aniline are dissolved in 5 ml THF under argon. The solution is degassed. 106 mg (0.12 mmol) BrettPhos Pd(II) (G3) and 63 mg (0.12 mmol) BrettPhos ligand are added. 4.7 ml LiHMDS (4.7 mmol in THF) are added dropwise within 5 minutes. Then, the reaction mixture is heated under reflux over night. After cooling to room temperature the reaction is quenched with ice and 1 M hydrochloride acid. Solids are filtered off and the filtrate is diluted with 20 ml dichloromethane. The layers are separated and the aqueous layer is extracted with dichloromethane (2×20 ml). The combined organic layers are washed with brine (20 ml) and dried over $Na_2SO_4$. The solvent is removed in vacuo. The crude product is recrystallized from methanol. N2,N3-Diphenylphenanthro[9,10-b]pyrazine-2,3-diamine is obtained as light-brown solid (yield: 435 mg (54%)).

$^1$H-NMR (400 MHz, $d_6$-DMSO): δ=7.18 (t, 2H), 7.54 (t, 4H), 7.72-7.80 (m, 4H), 8.04 (d, 4H), 8.83-8.86 (m, 4H), 9.20 (s, 2H).

f) Synthesis of (1,3-bisphenyl-2-ethoxy-2H-imidazo)phenanthro[9,10-b]pyrazine

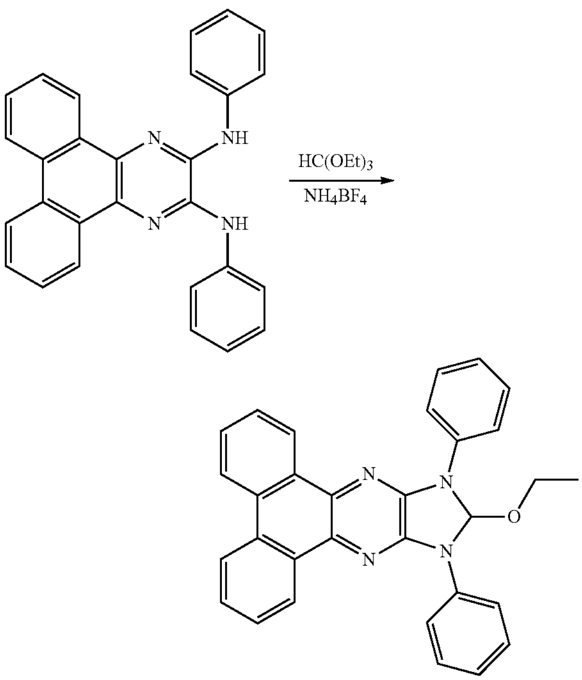

225 mg (0.55 mmol) of N2,N3-diphenylphenanthro[9,10-b]pyrazine-2,3-diamine, 2.5 ml (2.23 g, 15 mmol) triethyl orthoformate and 5 mg (0.05 mmol) $NH_4BF_4$ are heated to 135° C. with stirring for 10 h under argon. After cooling to room temperature the residue is suspended in ethanol and filtered off. After drying in vacuo (1,3-bisphenyl-2-ethoxy-2H-imidazo)phenanthro[9,10-b]pyrazine is obtained as light-brown solid (yield: 131 mg (51%)).

$^1$H-NMR (400 MHz, $d_6$-DMSO): δ=0.96 (t, 3H), 3.35 ($H_2O$ peak+q, 2H), 7.35 (t, 2H), 7.68 (t, 4H), 7.78 (t, 2H), 7.84 (m, 2H), 8.09 (s, 1H), 8.39 (d, 4H), 8.89 (d, 2H), 9.01 (d, 2H).

g) Synthesis of Intermediate Complex (XXXII-a)

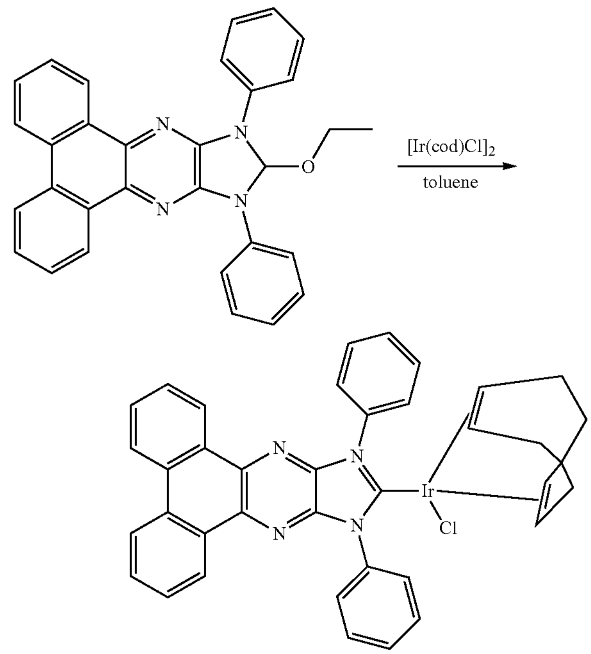

115 mg (0.24 mmol) of (1,3-bisphenyl-2-ethoxy-2H-imidazo)phenanthro[9,10-b]pyrazine and 84 mg (0.12 mmol) of chloro(1,5-cyclooctadiene)iridium(I) dimer are dissolved in 5 ml toluene. The suspension is degassed and subsequently heated to 80° C. Upon heating a dark solution is obtained. Stirring at 80° C. is continued over night. After cooling a precipitate is formed and filtered off and the solid is washed with ethanol. Complex intermediate (XXXII-a) is obtained as a dark solid (yield: 130 mg (70%)).

$^1$H-NMR (400 MHz, $CD_2Cl_2$): δ=1.36-1.44 (m, 2H), 1.54 ($H_2O$ peak+m, 2H), 1.58-1.62 (m, 2H), 1.79-1.87 (m, 2H), 2.63-2.64 (m, 2H), 4.70-4.72 (m, 2H), 7.66-7.76 (m, 8H), 7.79-7.83 (m, 2H), 8.37-8.40 (m, 4H), 8.69 (d, 2H), 9.09 (d, 2H).

h) Synthesis of Complex (XXXII)

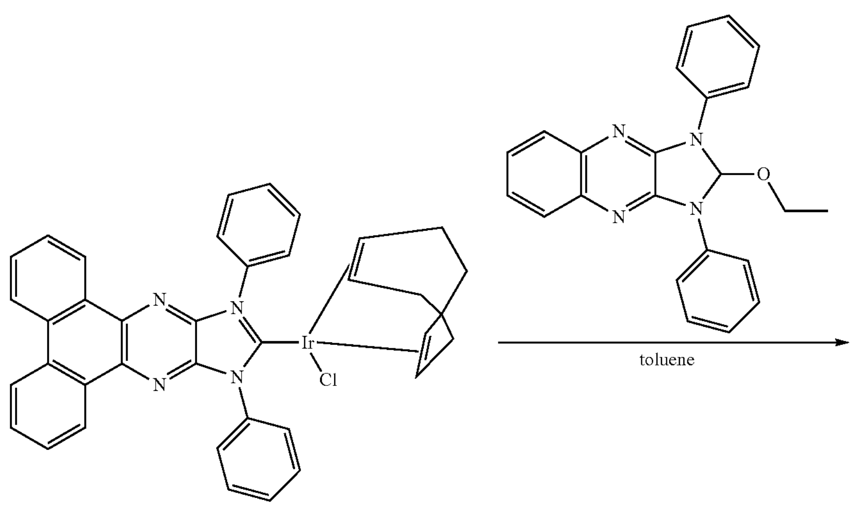

-continued

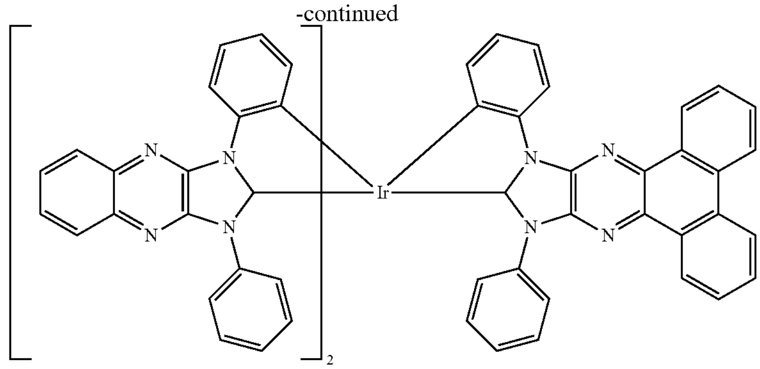

120 mg (0.16 mmol) of complex intermediate (XXXII-a) and 116 mg (0.32 mmol) of 2-ethoxy-1,3-diphenyl-2H-imidazo[4,5-b]quinoxaline are dissolved in 9 ml toluene under argon. The solution is degassed and subsequently heated to 100° C. with stirring over night. After cooling to room temperature the solvent is removed in vacuo and the residue is filtered through a short alumina column with cyclohexane/ethyl acetate (1:1). The solvent is again removed in vacuo and the crude product is purified by silica column chromatography with dichloromethane/hexane 4:1. The title product is obtained as yellow powder (yield: 8 mg (4%)).

HPLC-MS (positive, m/z): exact mass of $C_{71}H_{43}IrN_{12}$=1256.34; found 1257.5 $[M+1]^+$.

$^1$H-NMR (400 MHz, $CD_2Cl_2$): δ=6.35-7.02 (br, 12H), 6.54 (t, 1H), 6.59 (t, 1H), 6.65-6.74 (m, 4H), 6.83-6.91 (m, 4H), 7.25 (t, 2H), 7.35 (t, 1H), 7.58 (t, 1H), 7.69-7.76 (m, 2H), 7.80-7.92 (m, 6H), 8.31-8.35 (m, 2H), 8.69 (d, 1H), 8.72-8.76 (m, 2H), 9.06 (d, 1H), 9.10 (d, 1H), 9.21 (d, 1H), 9.49 (d, 1H).

Synthesis Example 33

Synthesis of Complex (XXXIII)

a) Synthesis of N6,N7-diphenylquinoxaline-6,7-diamine

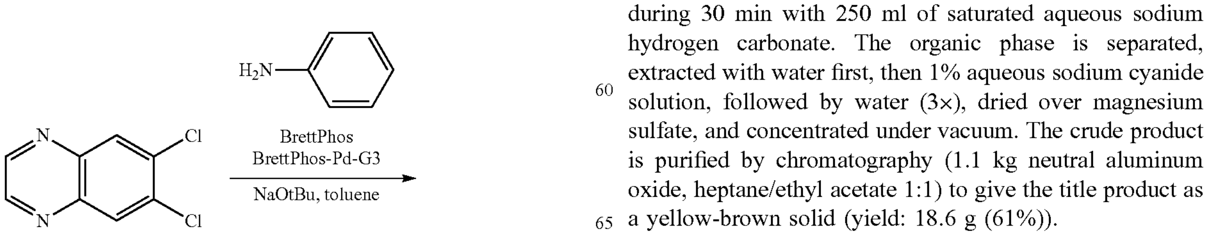

A suspension of 19.5 g of 6,7-dichloroquinoxaline (0.098 mol; prepared according to *J. Chem. Soc., Perkin Trans.* 1, 1999, 803), 20.2 g aniline (0.22 mol) and 25.2 g sodium tert-butoxide (0.26 mol) in 300 ml of anhydrous toluene is degassed by cooling down to −70° C. in a dry ice/acetone bath under vacuum and backfilling with argon (repeated three times). Then 1.07 g (2 mmol) of BrettPhos ligand [=2-(dicyclohexylphosphino)3,6-dimethoxy-2',4',6'-triisopropyl-1,1'-biphenyl, CAS No. 1070663-78-3] and 1.60 g (2 mmol) of BrettPhos-Pd-G3 palladacycle {=[(2-di-cyclohexylphosphino-3,6-dimethoxy-2',4',6'-triisopropyl-1,1'-biphenyl)-2-(2'-amino-1,1'-biphenyl)]palladium(II) methanesulfonate methanesulfonate, CAS No. 1470372-59-8} are added and degassing repeated. The thick suspension is heated for 18 hours at 100° C. (propeller stirrer), cooled to room temperature, filtered (very slow), and rinsed with ca. 200 ml of dichloromethane. The filtrate is acidified with 10% aqueous hydrogen chloride (100 ml) and the precipitated salt is filtered and rinsed with water. The red-brown solid is taken up in 350 ml of dichloromethane and stirred during 30 min with 250 ml of saturated aqueous sodium hydrogen carbonate. The organic phase is separated, extracted with water first, then 1% aqueous sodium cyanide solution, followed by water (3×), dried over magnesium sulfate, and concentrated under vacuum. The crude product is purified by chromatography (1.1 kg neutral aluminum oxide, heptane/ethyl acetate 1:1) to give the title product as a yellow-brown solid (yield: 18.6 g (61%)).

$^1$H-NMR (300 MHz, $CDCl_3$): δ=8.57 (s, 2H), 7.79 (s, 2H), 7.37 (m, 4H), 7.19 (m, 4H), 7.10 (m, 2H), 6.03 (s, 2H).

b) Synthesis of 1,3-diphenylimidazo[4,5-g]quinoxalin-3-ium tetrafluoroborate

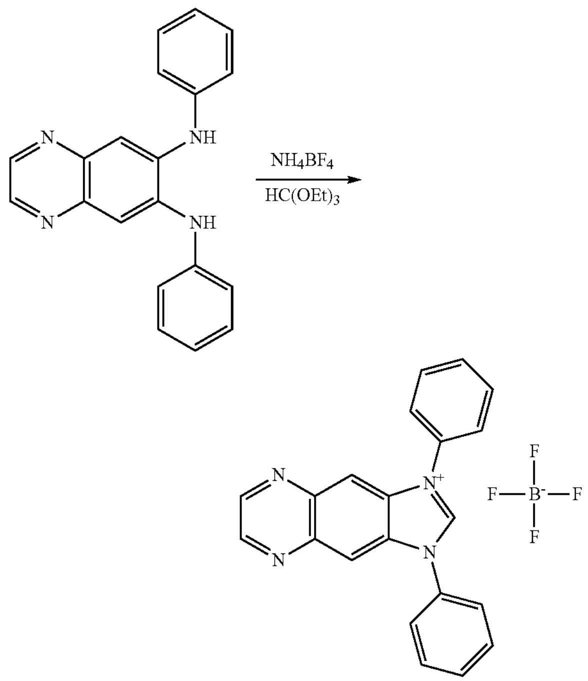

A suspension of 18.64 g of N6,N7-diphenylquinoxaline-6,7-diamine (0.06 mol) and 6.38 g of ammonium tetrafluoroborate (0.06 mol) in 190 ml triethyl orthoformate is heated for six hours at a temperature of 100-122° C. in a reactor fitted with a Dean-Stark separator and condenser. After cooling to room temperature, the precipitated product is filtered and rinsed successively with cold triethyl orthoformate and heptane, then dried under vacuum. The title product is obtained as a red-brown solid (yield: 20.64 g (84%)).

$^1$H-NMR (300 MHz, $d_6$-DMSO): ·=10.94 (s, 1H), 9.18 (s, 2H), 8.63 (s, 2H), 8.08 (m, 4H), 7.85 (m, 4H).

c) Synthesis of Complex Intermediate (XXXIII-a)

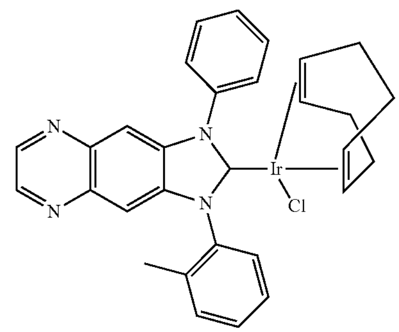

9.46 g (23.1 mmol) of 1,3-Diphenyl-imidazo[4,5-g]quinoxalinium-tetrafluoroborate and 7.75 g (11.5 mmol) of μ-chloro-1,5-cyclopentadiene-iridium(I) dimer are suspended in 310 ml of toluene. The suspension is heated to 60° C. 46.1 ml of a 0.5M (23.1 mmol) solution of potassium bis(trimethylsilyl)amide in toluene are added within 25 minutes to the reaction mixture and stirred at 60° C. for 15 min. 15 g of Diatomaceous earth are added to the reaction mixture at 60° C. The solid is filtered off and washed four times with 25 ml of warm toluene (50-60° C.). The filtrate is concentrated under vacuum. The solid is stirred in 90 ml ethanol for one hour, then filtered off, washed three times with 10 ml of ethanol, and then washed three times with 10 ml n-pentane, and dried under vacuum in a drying cabinet at 60° C. for 17 hours. 10.8 g dark brown solid are obtained.

$^1$H-NMR (500 MHz, $CD_2Cl_2$): δ [ppm]=1.34 (mc; 2H), 1.42-1.56 (m; 4H), 1.73 (mc; 2H), 2.63 (mc; 2H), 4.52 (mc; 2H), 7.67 (mc; 6H), 7.94 (mc; 2H), 8.13 (mc; 4H), 8.80 (mc; 2H).

d) Synthesis of Complex (XXXIII)

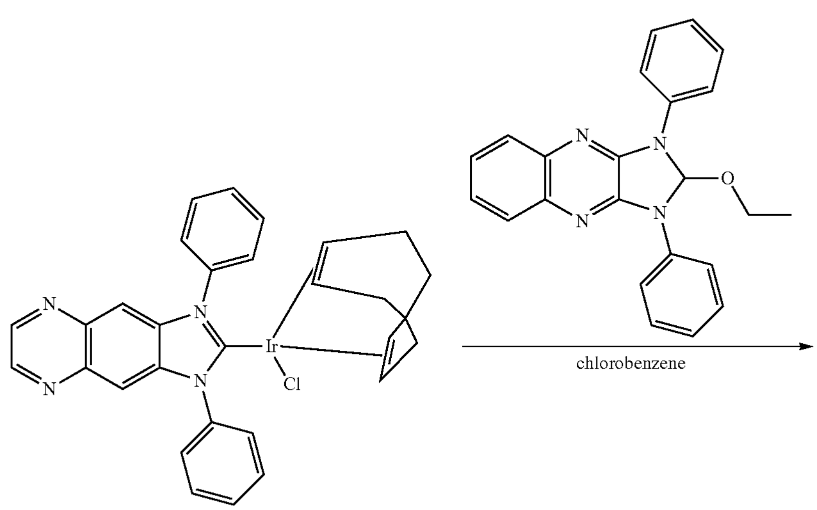

-continued

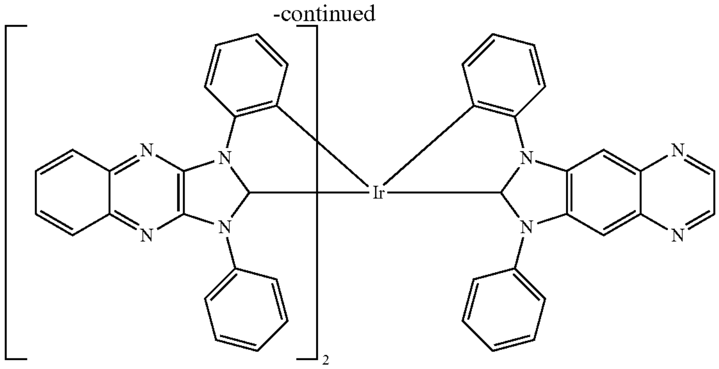

2.16 g (2.95 mmol) of complex intermediate (XXXIII-a) and 4.35 g (11.8 mmol) 2-ethoxy-1,3-diphenyl-2H-imidazo [4,5-b]quinoxaline are added to 70 ml of chlorobenzene. The suspension is heated to 125° C. and is held at that temperature for 22 hours. After cooling the reaction mixture to room temperature the precipitate is filtered off. The filtrate is evaporated to dryness in an attenuated vacuum. The solid is washed three times with 2 ml of chlorobenzene, then three times with 3 ml n-pentane, and dried under vacuum in a drying cabinet at 60° C. for 3 hours. 0.33 g brown solid are obtained. The solid is dissolved in 90 ml of dichloromethane and purified by MPLC with the CombiFlash Companion (silica gel, dichloromethane/methanol 98:2). The obtained solid (0.26 g) is heated in 5 ml of acetonitrile. The suspension is filtered hot. The precipitate is washed twice with 1 ml of hot acetonitrile each, and then washed twice with 1 ml of hot THF, and dried under vacuum in a drying cabinet at 60° C. for 17 hours. 0.21 g yellow solid are obtained which are recrystallized from chlorobenzene. The filtered precipitation is washed with a small amount of chlorobenzene and n-pentane. The solid is dried under vacuum in a drying cabinet at 60° C. for 65 hours, giving the title product as a yellow solid (yield: 80 mg).

$^{1}$H-NMR (400 MHz, $CD_2Cl_2$): δ [ppm]=6.40 (mc; 2H), 6.55-6.85 (m; 15H), 7.11 (mc; 1H), 7.24 (mc; 4H), 7.40 (mc; 2H), 7.74 (mc; 2H), 7.79-7.90 (m; 5H), 8.20 (mc; 1H), 8.33 (mc; 2H), 8.76 (mc; 1H), 8.82 (mc; 1H), 8.89 (mc; 1H), 9.02 (mc; 1H), 9.08 (mc; 1H).

Synthesis of Comparative Examples

Comparative Synthesis Example 1

Synthesis of Comparative Complex (CC-1)

Described in WO2014/147134

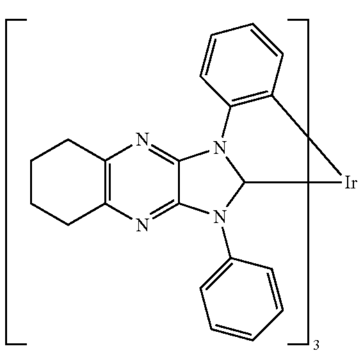

The synthesis of the comparative complex CC-1 is described in WO2014/147134 (example BE-12).

Comparative Synthesis Example 2

Synthesis of Comparative Complex (CC-2)

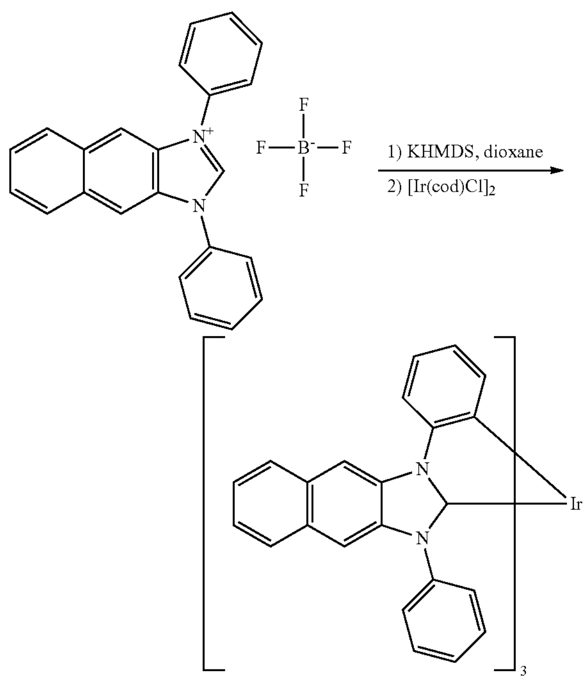

9.12 g (22.3 mmol) of 1,3-diphenylbenzo[f]benzimidazol-3-ium tetrafluoroborate in 200 ml dioxane are three times evacuated and backfilled with argon. 53.6 ml (26.8 mmol) of potassium bis(trimethylsilyl)amide solution (KHMDS, 0.5M in toluene) are added at room temperature within 15 minutes. The orange-red-suspension is heated up to 67° C. and treated with 1.50 g (2.23 mmol) of chloro(1, 5-cyclooctadiene)iridium(I) dimer, followed by heating at 101° C. during 22 hours. The reaction mixture is cooled down to 80° C. and filtered. The solid is washed with dioxane and acetone, followed by drying under vacuum. The solid is suspended in 1.5 L of dichloromethane and filtered through a 5 cm layer of silica gel, followed by rinsing the silica gel layer with 200 ml of dichloromethane. The combined eluents are treated with 200 ml of acetone and concentrated under vacuum until a suspension formed. The suspension is filtered, the solid washed with acetone, followed by drying under vacuum, giving the title product as a light yellow solid (yield: 3.34 g (65%)).

APCI-LC-MS (positive, m/z): exact mass of $C_{69}H_{45}IrN_6$=1150.33; found 1151.4 $[M+1]^+$.

$^1$H-NMR (400 MHz, $CD_2Cl_2$): δ=6.36 (br. d, 6H), 6.61-6.67 (m, 3H), 6.69 (dd, 3H), 6.76 (td, 3H), 6.82 (br. d, 3H), 6.87 (s, 3H), 7.18-7.25 (m, 3H), 7.37-7.48 (m, 6H), 7.50-7.57 (m, 3H), 7.69 (d, 3H), 8.14 (d, 3H), 8.18 (d, 3H), 8.59 (s, 3H).

Comparative Synthesis Example 3

Synthesis of Comparative Complex (CC-3)

a) Synthesis of N2-methyl-N3-phenyl-quinoxaline-2,3-diamine

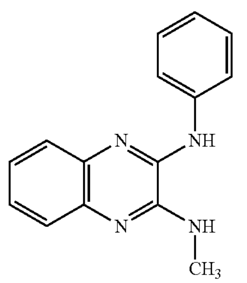 [SMILES: CNc1nc2ccccc2nc1Nc1ccccc1]

A suspension of 22.60 g (0.227 mol) 2-methylamino-3-chloro-quinoxaline which has been synthetized according to DE 1135471, 16.37 g (0.176 mol) aniline, and 1.06 g (0.006 mol) HBr 48% are dissolved in 375 ml diethylenglycol by heating to 170° C. The reaction mixture is held at that temperature for 15 min. After cooling the reaction mixture to room temperature the solid is filtered off, and then shortly stirred in 300 ml water. The solid is filtered off and dried in a vacuum drying cabinet at 60° C. 15.69 g solid are obtained.

MALDI-MS (positive, m/z): exact mass of $C_{48}H_{33}IrN_{12}$=970.26; found 970 $[M+H]^+$ $^1$H-NMR (400 MHz, $D_6$-DMSO): δ [ppm]=3.22 (s; 3H), 7.13 (mc; 1H), 7.43 (mc; 4H), 7.60 (mc; 1H), 7.85 (mc; 1H), 8.07 (mc; 2H), 10.11 (s; 1H, broad), 10.64 (s; 1H, very broad).

b) Synthesis of 2-ethoxy-1-methyl-3-phenyl-2H-imidazo[4,5-b]quinoxaline

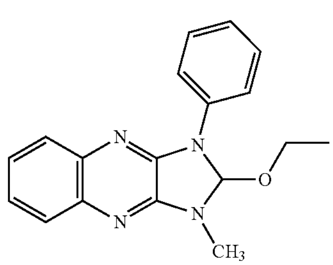 [SMILES: CCOC1N(C)c2nc3ccccc3nc2N1c1ccccc1]

A solution of 11.80 g (47.1 mmol) N2-methyl-N3-phenyl-quinoxaline-2,3-diamine in 224 ml triethyl ortho-formiate is stirred at 90° C. for 24 h. After cooling the reaction mixture to 60° C. the solution is evaporated to dryness in an attenuated vacuum until 70° C. The residue is stirred in diethylether for 1 h. The precipitate is filtered off, washed with diethylether, and is dried in a vacuum drying cabinet at 60° C. 10.5 g solid are obtained $^1$H-NMR (400 MHz, $CD_3CN$): δ [ppm]=1.06 (t; 3H), 3.18 (s; 3H), 3.27 (q; 2H), 6.90 (s; 1H), 7.24 (mc; 1H), 7.32 (mc; 2H), 7.50 (mc; 2H), 7.56 (mc; 1H), 7.60 (mc; 1H), 8.10 (mc; 2H).

$^1$H-NMR (400 MHz, $CD_3CN$): · [ppm]=1.06 (t; 3H), 3.18 (s; 3H), 3.27 (q; 2H), 6.90 (s; 1H), 7.24 (mc; 1H), 7.32 (mc; 2H), 7.50 (mc; 2H), 7.56 (mc; 1H), 7.60 (mc; 1H), 8.10 (mc; 2H).

c) Synthesis of Comparative Complex (CC-3)

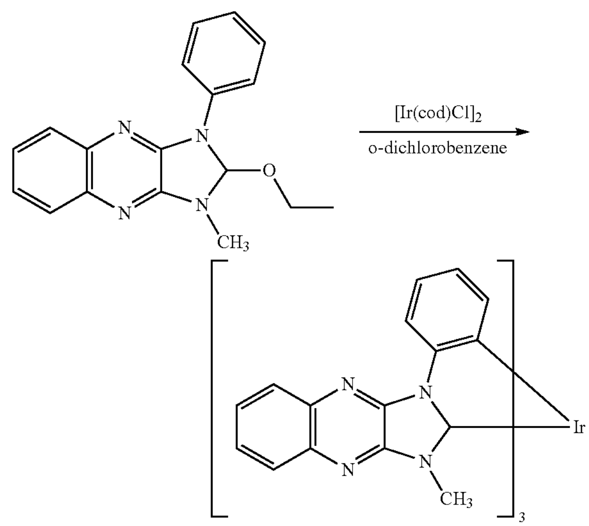

A solution of 10.40 g (33.95 mmol) of 2-ethoxy-1-methyl-3-phenyl-2H-imidazo[4,5-b]quinoxaline and 2.97 g (4.42 mmol) μ-chloro-cyclooctadien-iridium dimer in 130 ml o-dichlorobenzene is heated to 150° C. and stirred at that temperature for 21 h. After cooling the reaction mixture to room temperature the precipitate is filtered off, washed with o-dichlorobenzene, and dried in a vacuum drying cabinet at 60° C. The solid is stirred in hot ethanol for 30 min. After cooling the suspension to room temperature the precipitate is filtered off, washed with n-pentane, and is dried in a vacuum drying cabinet at 80° C. 8.60 g beige solid are obtained. 1.88 g of the beige solid are treated with 20 ml 1M aqueous HCl in 190 ml ethylmethylketone. The reaction mixture is heated at 70° C. for 29.5 h. After cooling the reaction mixture to 60° C. it is filtered. The residue is washed with n-pentane and dried at 60° C. in a vacuum drying cabinet. 1.80 g dark yellow solid is obtained. The solid is heated in 35 ml chlorobenzene under reflux for 1 h. The suspension is cooled to 110° C. and filtered. The residue is washed with warm chlorobenzene and then with n-pentane. The solid is dried at 150° C. at $6.5\times10^{-2}$ mbar for 7 h. 1.25 g (66% of theory in two steps) yellow solid are obtained.

$^1$H-NMR (400 MHz, $CD_2Cl_2$): δ [ppm]=3.59 (s; 9H), 6.55 (mc; 3H), 6.79 (mc; 3H), 7.16 (mc; 3H), 7.80 (mc; 6H), 8.10 (mc; 3H), 8.30 (mc; 3H), 8.93 (mc; 3H).

II. Photoluminescence Examples

Photoluminescence Examples A

Determination of the Photoluminescence Spectra (2% Film in PMMA Matrix)

The photoluminescence (PL) spectra of the complexes are measured on thin polymer films doped with the respective complexes. The thin films are prepared by the following procedure: a 10%-w/w polymer solution is made by dissolving 1 g of the polymer "PMMA 6N" (Evonik) in 9 g of dichloromethane, followed by stirring for one hour. 2 mg of the respective complexes are added to 0.098 g of the PMMA solution, and stirring continued for one minute. The solutions are casted by doctor-blading with a film applicator (Model 360 2082, Erichsen) with a 60 μm gap onto quartz substrates providing thin doped polymer films (thickness ca. 6 μm). The PL spectra and quantum-yields (Q.Y.) of these films are measured with the integrating-sphere method using the Absolute PL Quantum Yield Measurement System (Hamamatsu, Model C9920-02) (excitation wavelength: 370 nm).

Determination of the Lifetime of Luminescence $\tau_v$

The lifetime ($\tau_v$) of the luminescence of the complexes in the prepared films are measured by the following procedure: For excitation of the emission a sequence of short laser pulses (THG Nd-YAG, 355 nm, 1 nsec pulse length, 1 kHz repetition rate) is used. The emissions are detected by the time-resolved photon-counting technique in the multi-channel scaling modus using a combination of photomultiplier, discriminator and a multiscaler card (FAST ComTec GmbH, Model P7888).

The PL Q.Y., $\lambda_{max}$, CIE x, y, and $\tau_v$ values of the photoluminescence measurements are included in the following tables.

| Cpd. | Formula | PL Q.Y. | $\lambda_{max}$ (nm) | CIE x, y | $\tau_V$ (μs) |
|---|---|---|---|---|---|
| I | 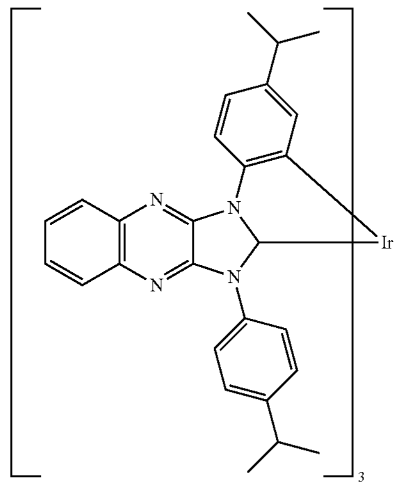 | 84% | 543 | 0.39, 0.58 | 1.7 |
| II | 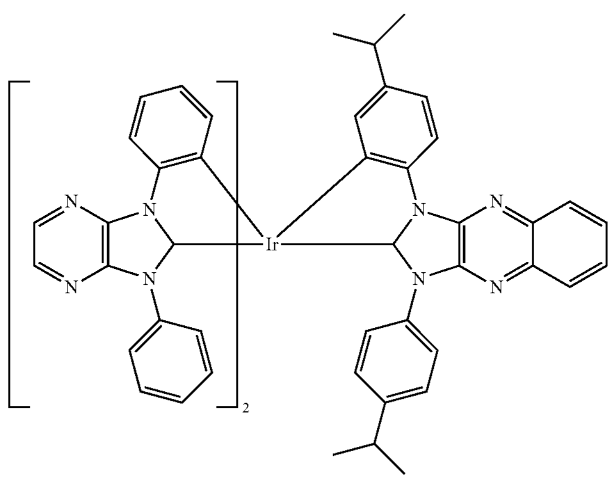 | 88% | 539 | 0.37, 0.59 | |

Photoluminescence Examples B

Determination of the Photoluminescence Spectra

The photoluminescence (PL) spectra of the complexes are measured on thin polymer films doped with the respective complexes. The thin films are prepared by the following procedure: a 10%-w/w polymer solution is made by dissolving 1 g of the polymer "PMMA 6N" (Evonik) in 9 g of dichloromethane, followed by stirring for one hour. 2 mg of the respective complexes are added to 0.098 g of the PMMA solution, and stirring continued for one minute. The solutions are casted by doctor-blading with a film applicator (Model 360 2082, Erichsen) with a 60 μm gap onto quartz substrates providing thin doped polymer films (thickness ca. 6 μm). The PL spectra and quantum-yields (Q.Y.) of these films are measured with the integrating-sphere method using the Absolute PL Quantum Yield Measurement System (Hamamatsu, Model C9920-02) (excitation wavelength: 400 nm).

Determination of the Lifetime of Luminescence $\tau_v$

The lifetime ($\tau_v$) of the luminescence of the complexes in the prepared films are measured by the following procedure: For excitation of the emission a sequence of short laser pulses (THG Nd-YAG, 355 nm, 1 nsec pulse length, 1 kHz repetition rate) is used. The emissions are detected by the time-resolved photon-counting technique in the multi-channel scaling modus using a combination of photomultiplier, discriminator and a multiscaler card (FAST ComTec GmbH, Model P7888).

The PL Q.Y., $\lambda_{max}$, CIE x, y color coordinates, full width at half maximum (FWHM) of the emission spectra, and $\tau_v$ values of the photoluminescence measurements in the iridium complex doped PMMA films are included in the following tables. Data of all emitters are given from PL measurements of 2% films in PMMA matrix, except for compound IV, of which the data are given from a PL measurement of a 1% film in PMMA matrix.

| Cpd. | Formula | PL Q.Y. | $\lambda_{max}$ (nm) | CIE x, y | FWHM (nm) | $\tau_V$ (μs) |
|---|---|---|---|---|---|---|
| I | 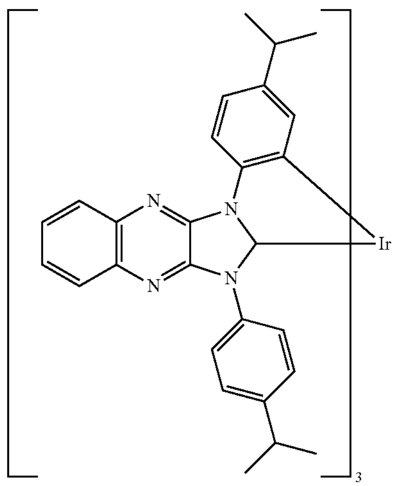 | 84% | 543 | 0.39, 0.58 | 80 | 1.7 |
| II | 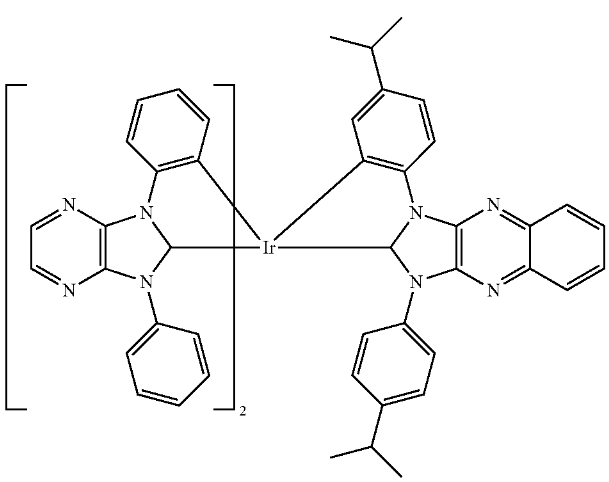 | 88% | 539 | 0.37, 0.59 | 83 | 2.8 |

-continued
| Cpd. | Formula | PL Q.Y. | $\lambda_{max}$ (nm) | CIE x, y | FWHM (nm) | $\tau_V$ (µs) |
|---|---|---|---|---|---|---|
| IV O795 | 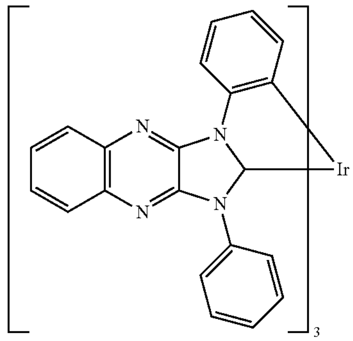 | 92% | 521 | 0.32, 0.62 | 73 | 2.4 |
| V O35191 | 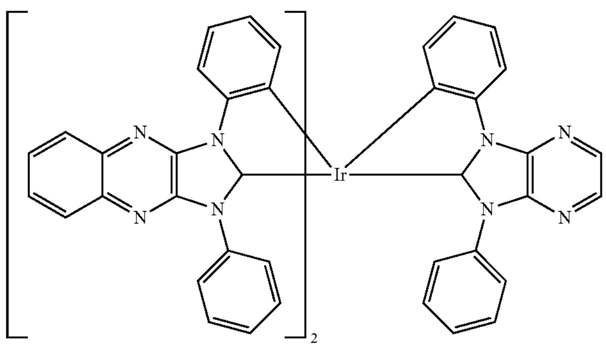 | 95% | 531 | 0.34, 0.61 | 78 | 2.1 |
| VIa | 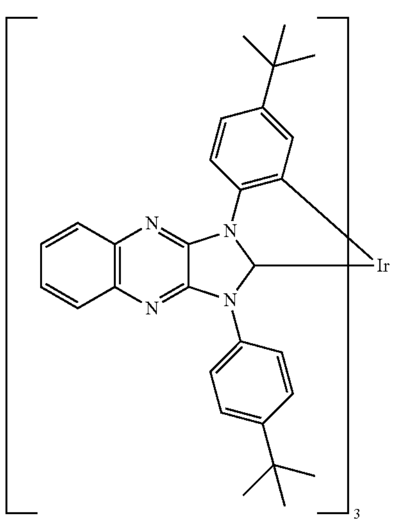 | 86% | 542 | 0.39, 0.59 | 86 | 1.8 |

-continued
| Cpd. | Formula | PL Q.Y. | $\lambda_{max}$ (nm) | CIE x, y | FWHM (nm) | $\tau_V$ (μs) |
|---|---|---|---|---|---|---|
| VII | 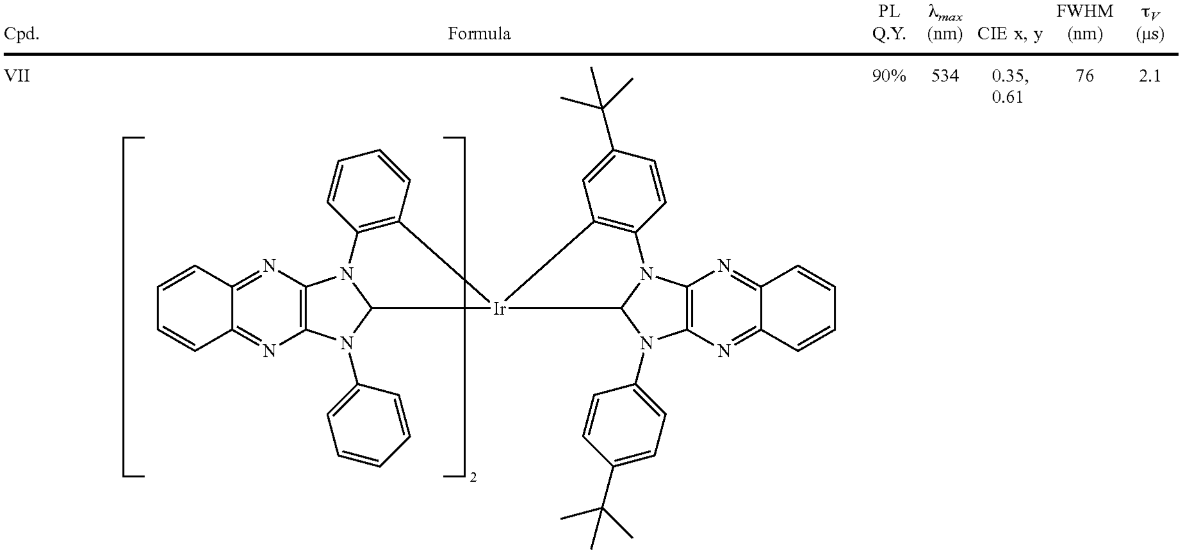 | 90% | 534 | 0.35, 0.61 | 76 | 2.1 |
| VIII | 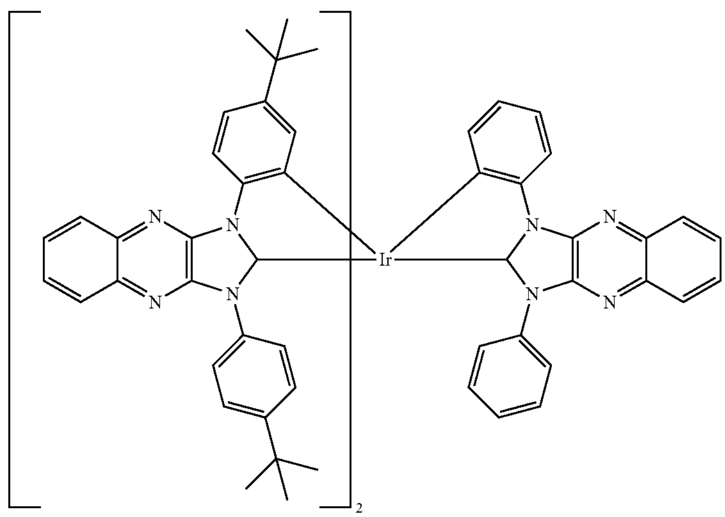 | 89% | 539 | 0.38, 0.59 | 79 | 1.8 |
| X | 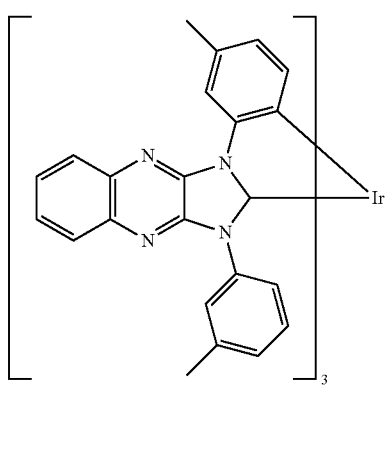 | 84% | 546 | 0.40, 0.57 | 85 | 1.1 |

-continued
| Cpd. | Formula | PL Q.Y. | $\lambda_{max}$ (nm) | CIE x, y | FWHM (nm) | $\tau_V$ (μs) |
|---|---|---|---|---|---|---|
| XI | 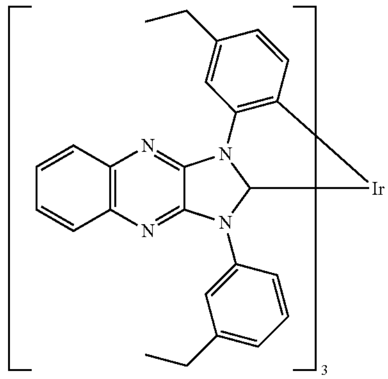 | 82% | 549 | 0.41, 0.57 | 85 | 1.4 |
| XIII | 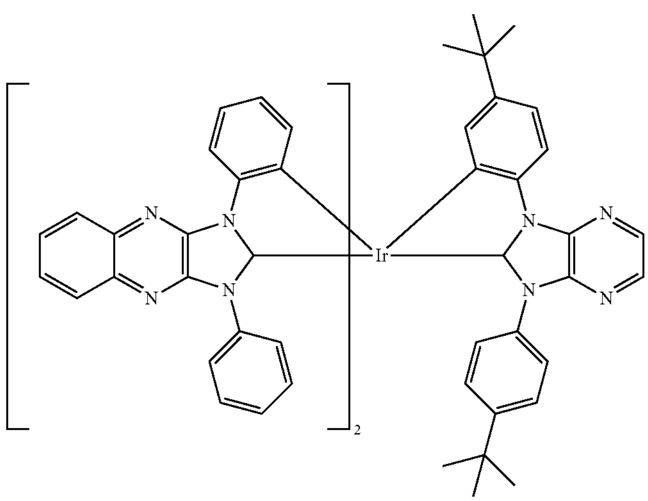 | 89% | 531 | 0.35, 0.61 | 79 | 2.2 |
| XIV | 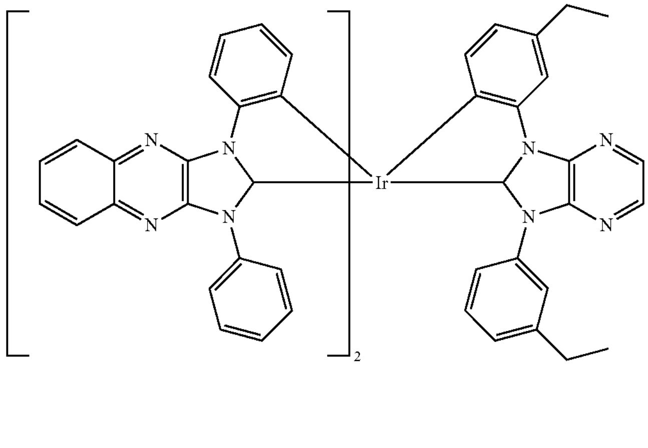 | 92% | 530 | 0.34, 0.61 | 78 | 1.9 |

-continued
| Cpd. | Formula | PL Q.Y. | $\lambda_{max}$ (nm) | CIE x, y | FWHM (nm) | $\tau_V$ (µs) |
|---|---|---|---|---|---|---|
| XV | 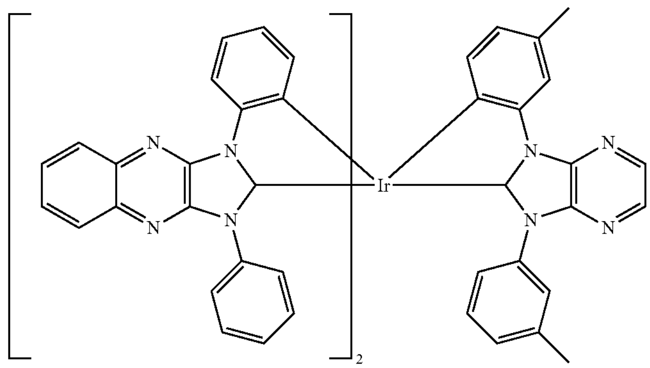 | 88% | 533 | 0.35, 0.61 | 78 | 1.9 |
| XVI | 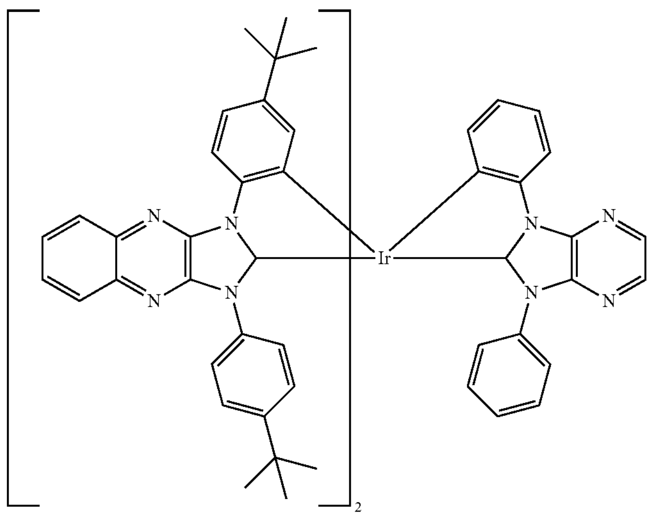 | 87% | 542 | 0.39, 0.59 | 80 | 2.3 |
| XVII | 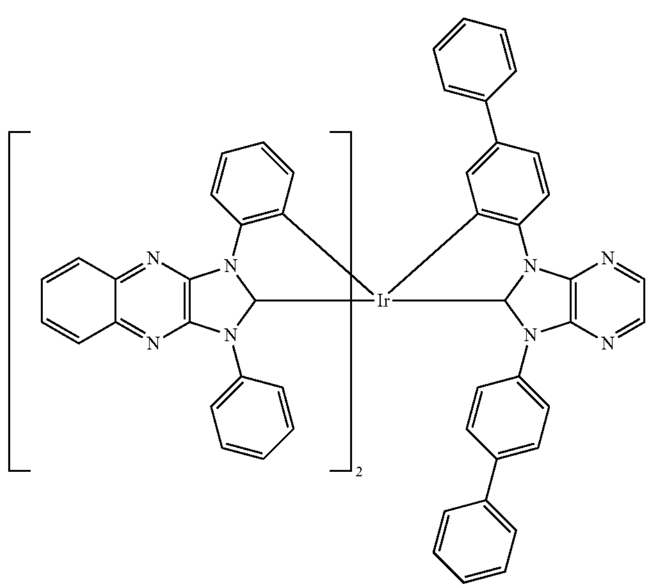 | 95% | 527 | 0.33, 0.61 | 76 | 2.4 |

-continued
| Cpd. | Formula | PL Q.Y. | $\lambda_{max}$ (nm) | CIE x, y | FWHM (nm) | $\tau_V$ (μs) |
|---|---|---|---|---|---|---|
| XVIII | 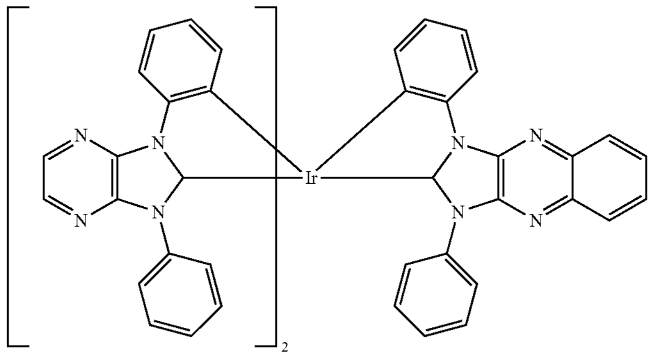 | 89% | 530 | 0.33, 0.61 | 79 | 2.3 |
| XIX | 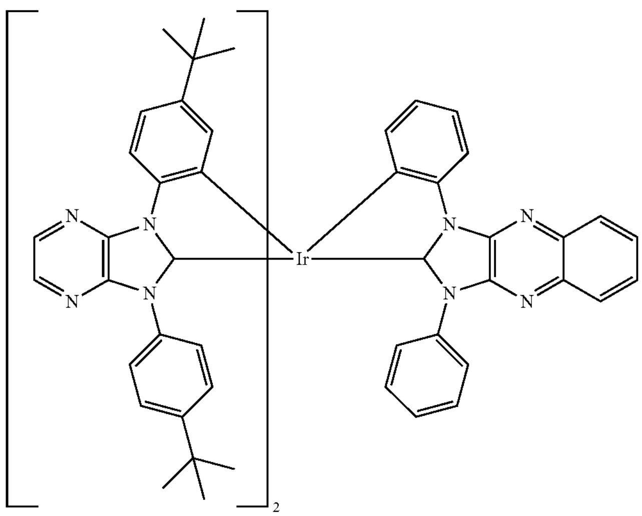 | 95% | 536 | 0.35, 0.61 | 79 | 1.9 |
| XX | 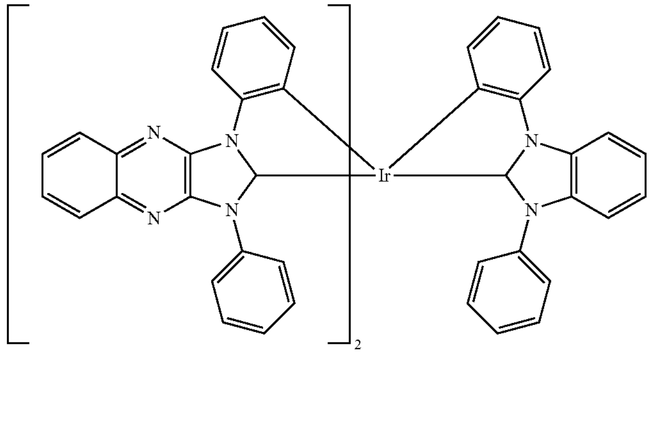 | 91% | 538 | 0.37, 0.60 | 80 | 1.4 |

-continued
| Cpd. | Formula | PL Q.Y. | $\lambda_{max}$ (nm) | CIE x, y | FWHM (nm) | $\tau_V$ (μs) |
|---|---|---|---|---|---|---|
| XXI | 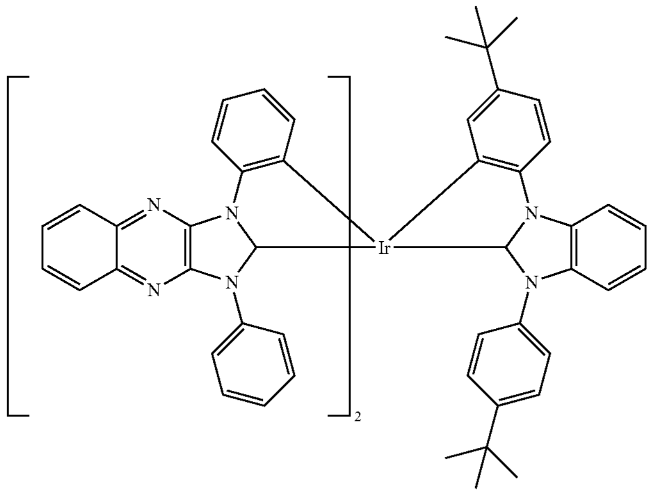 | 89% | 544 | 0.39, 0.59 | 81 | 1.2 |
| XXII | 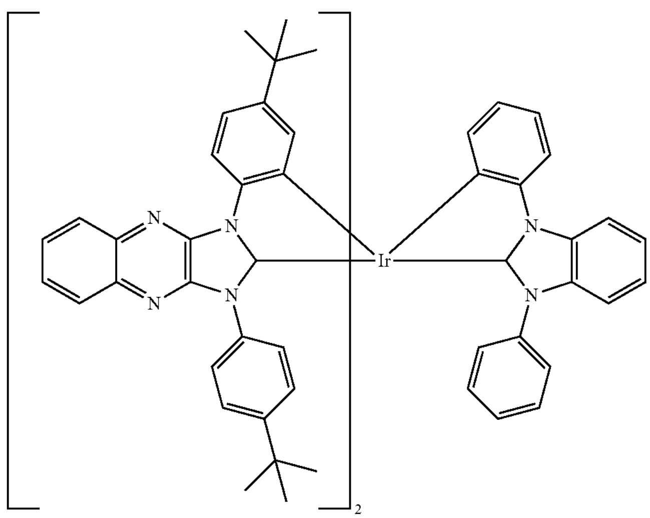 | 79% | 551 | 0.42, 0.56 | 82 | 1.3 |
| XXIII | 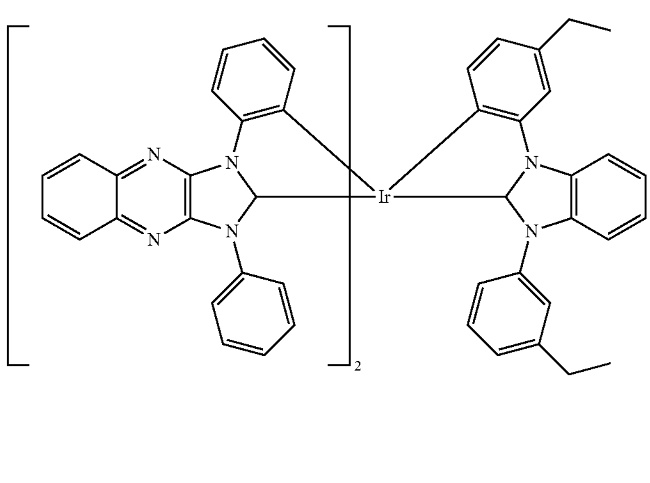 | 89% | 544 | 0.40, 0.58 | 82 | 1.5 |

-continued
| Cpd. | Formula | PL Q.Y. | $\lambda_{max}$ (nm) | CIE x, y | FWHM (nm) | $\tau_V$ (μs) |
|---|---|---|---|---|---|---|
| XXIV | 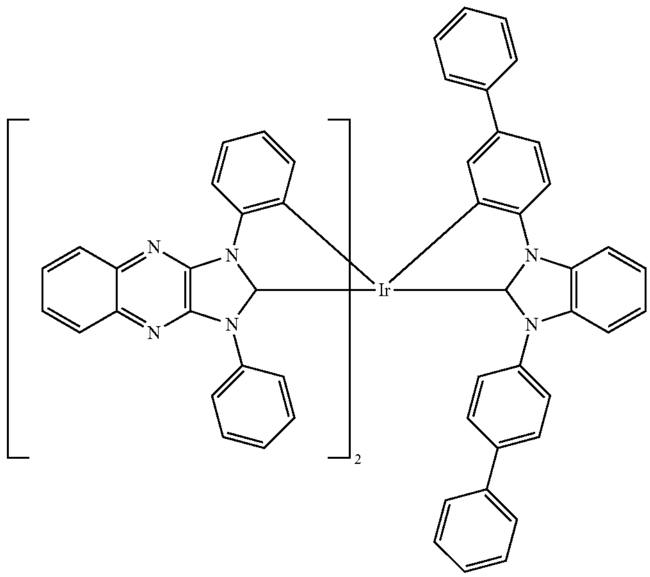 | 94% | 540 | 0.38, 0.59 | 81 | 1.5 |
| XXV | 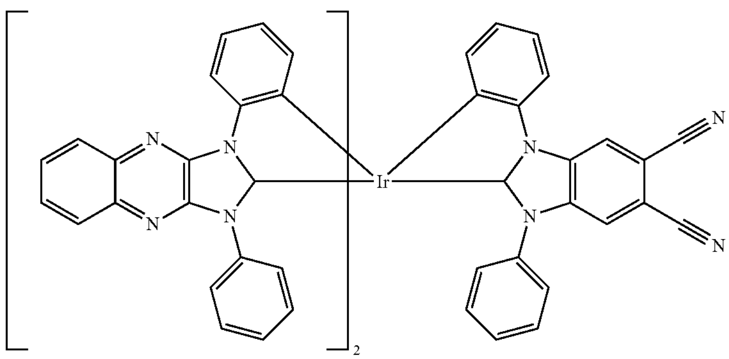 | 87% | 523 | 0.32, 0.62 | 74 | 2.6 |
| XXVI | 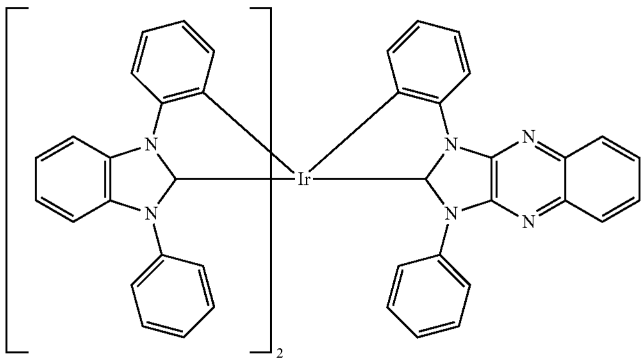 | 86% | 553 | 0.43, 0.56 | 90 | 1.2 |

-continued
| Cpd. | Formula | PL Q.Y. | $\lambda_{max}$ (nm) | CIE x, y | FWHM (nm) | $\tau_V$ (μs) |
|---|---|---|---|---|---|---|
| XXVII | 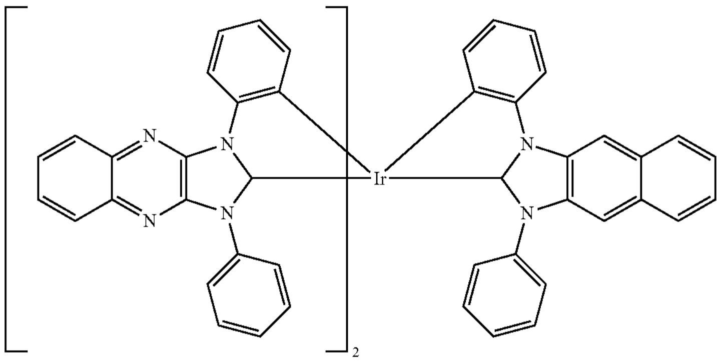 | 90% | 535 | 0.36, 0.60 | 79 | 2.3 |
| XXVIII | 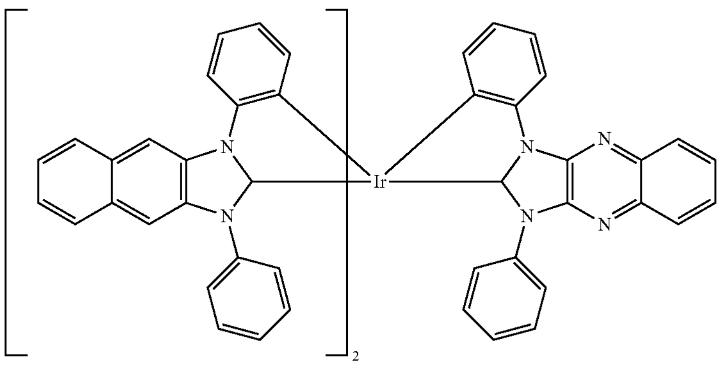 | 87% | 542 | 0.38, 0.59 | 84 | 2.9 |
| XXIX | 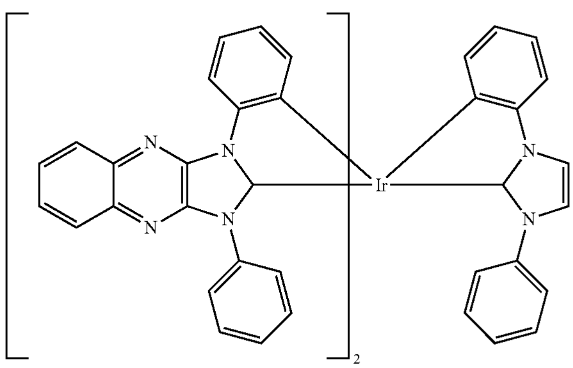 | 84% | 548 | 0.40, 0.57 | 85 | 1.1 |
| XXX | 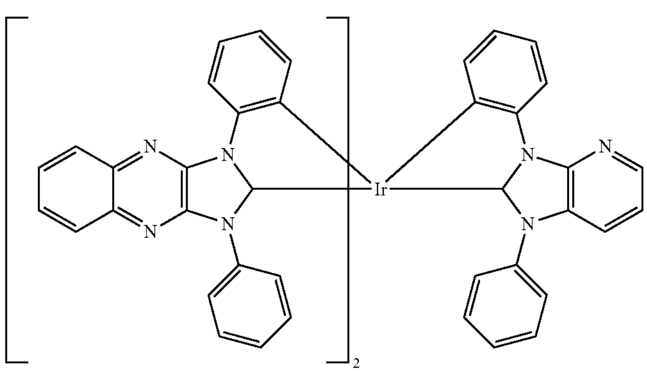 | 91% | 536 | 0.36, 0.60 | 79 | 1.7 |

-continued

| Cpd. | Formula | PL Q.Y. | $\lambda_{max}$ (nm) | CIE x, y | FWHM (nm) | $\tau_V$ (µs) |
|---|---|---|---|---|---|---|
| XXXI | 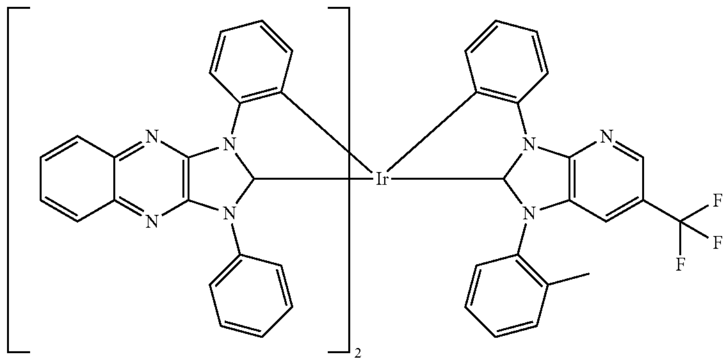 | 95% | 525 | 0.33, 0.62 | 74 | 3.0 |
| XXXII | 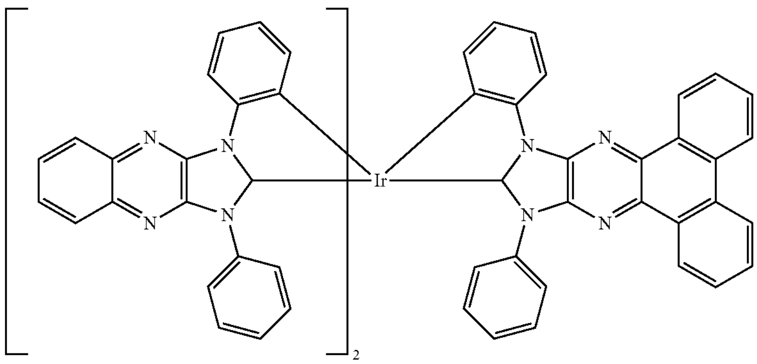 | 91% | 525 | 0.33, 0.62 | 75 | 3.0 |

As evident from the above table, the complexes of the present invention show an emission in the green to yellow-green area, with very high absolute PL quantum efficiency values Q.Y., with short lifetimes of luminescence $\tau_v$, which are as low as down to 1.1 µs.

Comparative Examples

Comparative Example 1

The PL Q.Y., $\lambda_{max}$, CIE x, y color coordinates and $\tau_v$ values of the photoluminescence measurements of complexes IV and CC-1 are included in the following table. Data of both complexes are given from PL measurements of 1% films of the respective complexes in PMMA matrix. Synthesis of the comparative complex CC-1 is described in WO2014/147134 (example BE-12). überall weg

| Cpd. | Formula | PL Q.Y. | $\lambda_{max}$ (nm) | CIE x, y | $\tau_V$ (µs) |
|---|---|---|---|---|---|
| IV | 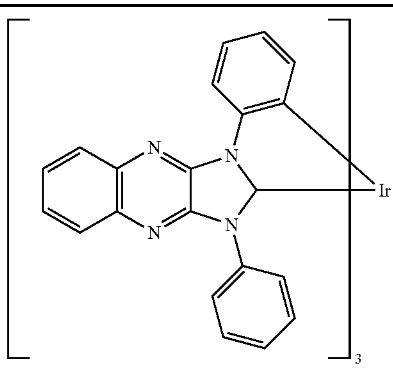 | 92% | 521 | 0.32, 0.62 | 2.4 |

-continued

| Cpd. | Formula | PL Q.Y. | $\lambda_{max}$ (nm) | CIE x, y | $\tau_V$ (µs) |
|---|---|---|---|---|---|
| CC-1 | 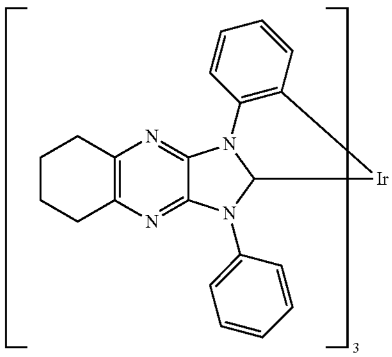 | 86% | 473 | 0.14, 0.20 | 6.0 |

As is evident from the above table, the green emitting inventive metal carbene complex IV shows a factor of 2.5 shorter (improved) lifetime of the luminescence $\tau_v$ in comparison to comparative compound CC-1.

The inventive metal carbene complex IV with an imidazo-quinoxaline carbene ligand shows a green emission with CIE x,y color coordinates of (0.32, 0.62), with very high absolute PL quantum efficiency Q.Y. of 92% close to the theoretical limit, and a very good (=short) lifetime of the luminescence $\tau_v$ of 2.4 µs. The comparative complex CC-1 with a cyclohexane unit attached to the imidazo-pyrazine unit, instead of the benzene unit, as in the inventive complex IV, shows a blue emission with CIE x,y color coordinates of (0.14, 0.20), with a high absolute PL quantum efficiency Q.Y. of 86%, but a lifetime of luminescence $\tau_v$ which is elongated to 6.0 µs.

The short lifetime of luminescence $\tau_v$ of the inventive complex IV is surprising in respect to the elongated lifetime of luminescence $\tau_v$ of the comparative complex CC-1. As is evident from the above table, surprisingly, despite the attached benzene ring at the imidazo-pyrazine unit of the carbene ligand in complex IV the lifetime of the luminescence $\tau_v$ is very good (=short), although the attached cyclic alkane unit to the imidazo-pyrazine unit of the carbene ligand in comparative complex CC-1 is leading to a long lifetime of the luminescence $\tau_v$.

Comparative Example 2

The PL Q.Y., $\lambda_{max}$, CIE x, y color coordinates and $\tau_v$ values of the photoluminescence measurements of complexes IV and CC-2 are included in the following table. Data of both complexes are given from PL measurements of 1% films of the respective complexes in PMMA matrix. Synthesis of the comparative complex CC-2 is described in Comparative synthesis Example 2.

| Cpd. | Formula | PL Q.Y. | $\lambda_{max}$ (nm) | CIE x, y | $\tau_V$ (µs) |
|---|---|---|---|---|---|
| IV | 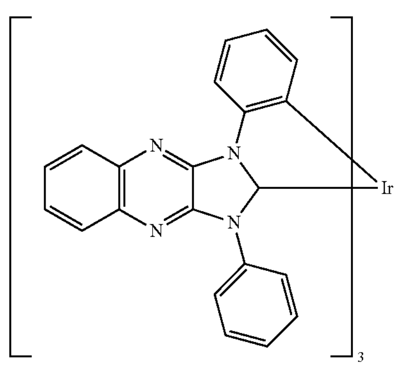 | 92% | 521 | 0.32, 0.62 | 2.4 |

-continued

| Cpd. | Formula | PL Q.Y. | $\lambda_{max}$ (nm) | CIE x, y | $\tau_V$ (µs) |
|---|---|---|---|---|---|
| CC-2 | 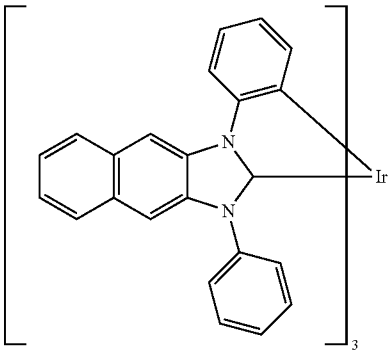 | 85% | 512 | 0.32, 0.62 | 105 |

As is evident from the above table, the green emitting inventive metal carbene complex IV shows a factor of 44 shorter (improved) lifetime of the luminescence $\tau_v$ in comparison to green emitting comparative compound CC-2, at the same CIE x,y color coordinates.

The inventive metal carbene complex IV with an imidazo-quinoxaline carbene ligand shows a green emission with CIE x,y color coordinates of (0.32, 0.62), with very high absolute PL quantum efficiency Q.Y. of 92% close to the theoretical limit, and a very good (=short) lifetime of the luminescence $\tau_v$ of 2.4 µs. The comparative complex CC-2 with an imidazo-naphthalene carbene ligand instead shows a green emission with the same CIE x,y color coordinates, with a high absolute PL quantum efficiency Q.Y. of 85%, but a lifetime of luminescence $\tau_v$ which is extremely elongated to 105 µs, compared to 2.4 µs in the case of the inventive complex IV.

The short lifetime of luminescence $\tau_v$ of the inventive complex IV is surprising in respect to the highly elongated lifetime of luminescence $\tau_v$ of CC-2.

As is evident from the above tables, a carbene metal complex is emitting in the green to yellow-green area, with a very high Q.Y. close to the theoretical limit, and together with a short luminescence $\tau_v$ if an inventive imidazo-quinoxaline carbene ligand is used.

III Device Examples

Production of an OLED (General Procedure)

The ITO substrate used as the anode is cleaned first by rinsing with isopropanol. To eliminate possible organic residues, the substrate is exposed to a continuous ozone flow in an UV ozone oven for a further 20 minutes. This treatment also improves the hole injection properties of the ITO.

Thereafter, the organic materials specified below are applied by vapor deposition to the cleaned substrate at a pressure of about $10^{-7}$-$10^{-9}$ mbar and at a rate of approx. 0.5-5 nm/min. The hole conductor and exciton blocker applied to the substrate is $Ir(DPBIC)_3$ (devices 1 to 3). Depending on the emissive layer thickness and thus for adjusting the optical cavity, the hole conductor has a thickness of 50 or 55 nm, the blocker has a thickness of 10 nm. The hole conducting layer is doped with $MoO_x$ (50 wt.-%:50 wt.-%) to improve the conductivity.

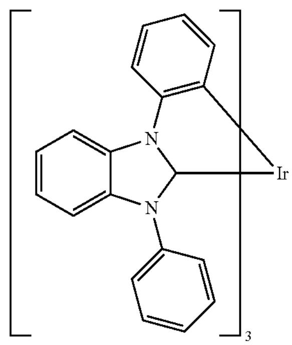

$Ir(DPBIC)_3$ (for preparation of $Ir(DPBIC)_3$ see Ir complex (7) in the application WO2005/019373).

Subsequently, a mixture of emitter, $Ir(DPBIC)_3$ and a host material (the emitter, the host material (SH-1 or SH-2) and the relative amounts in % by weight are given in the specific device examples) is applied by vapor deposition with a thickness of 30 or 40 nm (devices 1 to 3). Subsequently, the host material is applied by vapor deposition with a thickness of 5 nm as an exciton and hole blocker.

Host Material:

SH-1:

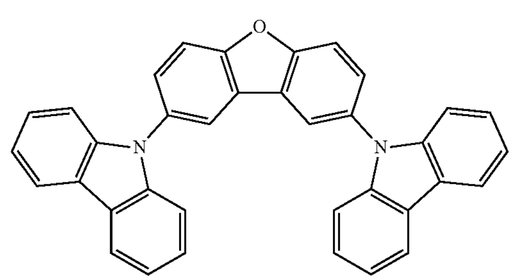 [SMILES: c1ccc2c(c1)c1ccccc1n2-c1ccc2oc3ccc(-n4c5ccccc5c5ccccc54)cc3c2c1]

(compound "3-1" in "Synthetic example 2" in US2009/066226)

SH-2:

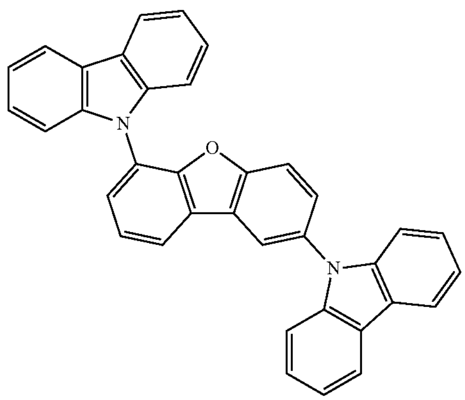 [SMILES: c1cc(-n2c3ccccc3c3ccccc32)c2oc3ccc(-n4c5ccccc5c5ccccc54)cc3c2c1]

(compound I-1, on page 7 and 78, in US2011/0006670)

Next, as an electron transporter, a mixture of Liq and ETM (ETM-1 as specified in the specific device examples) (50 wt.-%:50 wt.-%) is applied by vapor deposition in a thickness of 30 nm; then a 4 nm KF layer is applied; and finally a 100 nm-thick Al electrode is applied. The whole device is encapsulated by attaching a glass lid under inert nitrogen atmosphere with an UV curable adhesive with very low water vapor permeation rate.

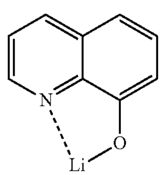

Liq

Electron Transport Material:
ETM-1:

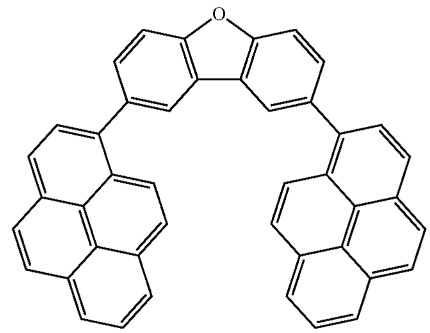 [SMILES: c1cc2ccc3ccc(-c4ccc5oc6ccc(-c7ccc8ccc9cccc%10ccc7c8c9%10)cc6c5c4)c4ccc(c1)c2c34]

(compound A1 in WO2011/157779; compound A-10 in WO2006/128800)

To characterize the OLED, electroluminescence spectra are recorded at different currents and voltages. In addition, the current-voltage characteristic is measured in combination with the light output emitted. The light output can be converted to photometric parameters by calibration with a photometer. The lifetime $LT_{95}$ of the diode is defined by the time taken for the luminance to fall to 95% of its initial value. The lifetime measurement is carried out at a constant current. The $CIE_{x,y}$ coordinates are extracted from the spectra according to CIE 1931 as known in the state-of-the-art.

For the different emitters, host materials and electron transport materials in the above-described OLED structure, the following electrooptical data are obtained:

All data are obtained at 1000 cd/m$^2$, lifetime data is taken at 4000 cd/m$^2$ initial luminance.

Device 1:

50 nm Ir(DPBIC)$_3$:MoO$_3$ (50:50)—10 nm Ir(DPBIC)$_3$—40 nm emitter/SH-1/Ir(DPBIC)$_3$ (15:80:5)—5 nm SH-1—30 nm ETM-1:Liq (50:50)—4 nm KF—100 nm Al Device 2:

55 nm Ir(DPBIC)$_3$:MoO$_3$ (50:50)—10 nm Ir(DPBIC)$_3$—30 nm emitter/SH-1/Ir(DPBIC)$_3$ (15:80:5)—5 nm SH-1—35 nm ETM-1:Liq (50:50)—4 nm KF—100 nm Al Device 3:

55 nm Ir(DPBIC)$_3$:MoO$_3$ (50:50)—10 nm Ir(DPBIC)$_3$—30 nm emitter/SH-2/Ir(DPBIC)$_3$ (15:80:5)—5 nm SH-2—35 nm ETM-1:Liq (50:50)—4 nm KF—100 nm Al Synthesis of the comparative complex CC-3 is described in Comparative Synthesis Example 3.

TABLE 5

| | Emitter | Voltage [V] | CurrEff [cd/A] | LumEff [lm/W] | EQE [%] | CIE x, y | $\lambda_{max}$/ FWHM (nm) | $LT_{95}$ (h) |
|---|---|---|---|---|---|---|---|---|
| Dev. 1 | IV | 5.13 | 66.9 | 41.0 | 18.2 | 0.34, 0.62 | 528/70 | 360 |
| Dev. 3 | IV | 4.56 | 61.1 | 42.1 | 16.7 | 0.33, 0.62 | 526/71 | 500 |
| Dev. 1 | V | 5.81 | 72.0 | 38.9 | 19.5 | 0.34, 0.62 | 528/71 | 370 |
| Dev. 2 | V | 4.82 | 72.6 | 47.3 | 19.7 | 0.34, 0.62 | 529/70 | 310 |
| Dev. 2 | XX | 4.26 | 72.9 | 53.8 | 19.9 | 0.38, 0.59 | 543/74 | 380 |
| Dev. 3 | XXVII | 4.60 | 65.5 | 44.8 | 17.7 | 0.37, 0.61 | 537/74 | 340 |
| Dev. 3 | XXIX | 4.42 | 64.1 | 45.6 | 18.0 | 0.41, 0.58 | 549/77 | 250 |
| Dev. 3 | XVIII | 5.32 | 71.2 | 42.0 | 19.3 | 0.35, 0.61 | 531/76 | 230 |
| Dev. 3 | XXVI | 4.20 | 58.6 | 43.8 | 16.8 | 0.42, 0.56 | 554/78 | 160 |
| Dev. 1 | VII | 5.53 | 57.8 | 32.8 | 15.8 | 0.36, 0.61 | 534/75 | 350 |
| Dev. 1 | XXI | 5.75 | 68.9 | 37.7 | 18.8 | 0.38, 0.60 | 541/73 | 130 |
| Dev. 1 | VIa | 5.79 | 56.3 | 30.5 | 15.2 | 0.38, 0.60 | 537/71 | 100 |
| Dev. 3 | CC-3 | 4.71 | 60.8 | 40.5 | 16.8 | 0.36, 0.60 | 532/78 | 2 |

As is evident from the above table, the inventive green emitting metal complex IV shows much improved device lifetime $LT_{95}$ against comparative green emitting complex CC-3 in the same device setup 3. $LT_{95}$ is improved by a factor of 250, at otherwise comparable device characteristics, and at highly comparable emission ($\lambda_{max}$ and CIE x,y).

As is also evident from the above table, the inventive metal carbene complexes show a green to yellow-green emission color at remarkable high external quantum efficiencies (EQEs) and high current efficiencies. In those tables, all EQEs are calculated from the measured luminance in forward direction under the assumption of Lambertian emission. As shown above, typical examples of inventive emitters demonstrate remarkable high device stability, as shown for devices 1, 2, or 3, respectively.

The device setups 4 and 5 are similar to device setups 1 to 3, but demonstrate optimized setups, including different emitter concentrations, different $Ir(DPBIC)_3$ concentration, or use of a different host SH-1 or SH-2.

Optimized Setups

Device 4:

50 nm $Ir(DPBIC)_3$:$MoO_3$ (50:50)—10 nm $Ir(DPBIC)_3$—40 nm emitter/SH-2/$Ir(DPBIC)_3$ (15:80:5)—5 nm SH-2—30 nm ETM-1:Liq (50:50)—4 nm KF—100 nm Al Device 5:

55 nm $Ir(DPBIC)_3$:$MoO_3$ (50:50)—10 nm $Ir(DPBIC)_3$—30 nm emitter/SH-1/$Ir(DPBIC)_3$ (25:65:10)—5 nm SH-1—35 nm ETM-1:Liq (50:50)—4 nm KF—100 nm Al

TABLE 6

| | Emitter | Voltage [V] | CurrEff [cd/A] | LumEff [lm/W] | EQE [%] | CIE x, y | $\lambda_{max}$/ FWHM (nm) | $LT_{95}$ (h) |
|---|---|---|---|---|---|---|---|---|
| Dev. 4 | IV | 5.96 | 56.8 | 29.9 | 15.5 | 0.34, 0.62 | 527/74 | 670 |
| Dev. 5 | XX | 4.08 | 66.1 | 50.9 | 18.3 | 0.40, 0.58 | 545/77 | 610 |

As is evident from the above table, for example, $LT_{95}$ of both inventive metal complexes IV and XX is further increased to over 600 h by using adapted device setups 4 or 5, respectively.

For a comparison of the influence of the emission layer thickness on the driving voltage, the following results in device 6 of the inventive emitter example V are shown.

Device 6:

50 nm $Ir(DPBIC)_3$:$MoO_3$ (50:50)—10 nm $Ir(DPBIC)_3$—20-40 nm V/SH-1/$Ir(DPBIC)_3$ (20:75:5)—3 nm SH-1—30 nm ETM-1:Liq (50:50)—4 nm KF—100 nm Al

TABLE 7

| Emissive layer thickness | Voltage [V] | CurrEff [cd/A] | LumEff [lm/W] | EQE [%] | CIE x, y | $\lambda_{max}$/ FWHM (nm) | $LT_{95}$ (h) |
|---|---|---|---|---|---|---|---|
| 20 nm | 3.55 | 67.9 | 60.0 | 18.6 | 0.33, 0.63 | 526/67 | 230 |
| 30 nm | 4.34 | 69.3 | 50.2 | 18.8 | 0.33, 0.62 | 527/68 | 405 |
| 40 nm | 5.19 | 69.6 | 42.1 | 18.9 | 0.34, 0.62 | 530/72 | 430 |

As is evident from the above table, a voltage drop from 5.19 eV to 3.55 eV can be observed when decreasing the layer thickness from 40 nm to 20 nm, at the same time leaving all other initial performance parameters almost unchanged.

Additional results in device setup 7 are demonstrating the same findings using the inventive emitter example IV.

Device 7:

60-45 nm $Ir(DPBIC)_3$:$MoO_3$ (50:50)—10 nm $Ir(DPBIC)_3$—20-50 nm IV/SH-1/$Ir(DPBIC)_3$ (20:75:5)—5 nm SH-1—40-25 nm ETM-1:Liq (50:50)—4 nm KF—100 nm Al

TABLE 8

| Emissive layer thickness | Voltage [V] | CurrEff [cd/A] | LumEff [lm/W] | EQE [%] | CIE x, y | $\lambda_{max}$/ FWHM (nm) | $LT_{95}$ (h) |
|---|---|---|---|---|---|---|---|
| 20 nm | 3.79 | 64.6 | 53.6 | 17.6 | 0.33, 0.62 | 527/71 | 250 |
| 30 nm | 4.51 | 64.7 | 45.1 | 17.6 | 0.33, 0.62 | 528/72 | 320 |
| 40 nm | 5.35 | 66.1 | 38.8 | 17.9 | 0.33, 0.62 | 527/70 | 250 |
| 50 nm | 6.06 | 66.5 | 34.5 | 18.1 | 0.34, 0.62 | 527/71 | 220 |

By changing molecular properties of the inventive compounds it is possible to directly influence the driving voltage of the OLED devices. This can be done either by modification of the electron affinity which will affect the electron transport property of the emissive layer since the emitter acts as a deep trap (see data in the following table 9). Or the number of electron transporting ligands of the inventive compound is modified which leads to altered electron transporting properties between the emitter molecules (see data in the following table 10).

Results in the following tables are achieved using the inventive compounds XVIII, XXVI, XX, respectively, in device setup 7 with 20% of emitter concentration and 30 nm emissive layer thickness. Electron Affinities (EA) are calculated based on geometries of neutral and anionic molecules from density functional theory with the b-p86 functional and a SVp basis set in the gas phase. EA is then obtained as the energy difference between the single point energy of the anionic and neutral state, both evaluated within the Conductor Like Screening Model (COSMO) employing a dielectric constant of 4.5 using the b-p86 functional and a TZVp basis set. All calculations are performed using the TURBOMOLE package. The number of electron transporting ligands is obtained by analyzing the LUMO distribution from the gas phase calculation of the neutral molecule.

TABLE 9

| Emitter | EA [eV] | # of e-transporting ligands | Voltage [V] |
|---|---|---|---|
| XVIII | 2.53 | 1 | 5.13 |
| XXVI | 2.30 | 1 | 3.98 |

TABLE 10

| Emitter | EA [eV] | # of e-transporting ligands | Voltage [V] |
|---|---|---|---|
| XVIII | 2.53 | 1 | 5.13 |
| XX | 2.62 | 2 | 4.42 |

As is evident from the above table, starting from a higher voltage of 5.13 V for XVIII, it is possible to reduce the voltage down to <4 V by reduction of the EA, and thus reduction of the electron trap depth, for inventive compound XXVI. By just looking at the EA of the inventive compound XX one would now expect an even higher voltage compared to XVIII, since the trap depth is even larger for electrons. However, the driving voltage can be reduced to 4.42 eV by increasing the number of e-transporting ligands from one to two and thus increasing the propability for an electron to hop between the emitter molecules.

FIGURE

FIG. 1 shows a comparison of the emission spectrum of OLED device 3 comprising inventive complex (IV) compared with the emission spectrum of OLED device 3 comprising comparative complex (CC-3).

In FIG. 1:

The Y-axis shows the EL intensity in arbitrary units (a.u.) and the X-axis shows the wavelength in nm. The dotted line shows the emission spectrum of the OLED comprising inventive complex (IV) and the continuous line shows the emission spectrum of the OLED comprising comparative complex (CC-3).

The invention claimed is:

1. A metal carbene complex, comprising at least one ligand of formula (A)

(A)

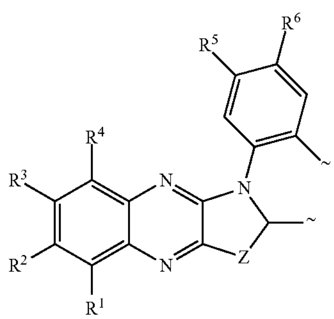

wherein

Z is $NR^x$;

$R^x$ is

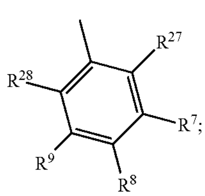

$R^1$, $R^2$, $R^3$ and $R^4$ are independently of each other hydrogen; a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one of O, S and $NR^{65}$ and/or substituted by at least one substituent E; a $C_6$-$C_{14}$ aryl group, which can optionally be substituted by at least one substituent G; a $NR^{65}$—$C_6$-$C_{14}$aryl group, which can optionally be substituted by at least one substituent G; a heteroaryl group comprising 3 to 11 ring atoms, which can optionally be substituted by at least one substituent G, interrupted by at least one of O, S, N and $NR^{65}$; or a $NR^{65}$-heteroaryl group, comprising 3 to 11 ring atoms, which can optionally be substituted by at least one substituent G, interrupted by at least one of O, S, N and $NR^{65}$; a halogen atom; a $C_1$-$C_{18}$haloalkyl group; CN; or $SiR^{80}R^{81}R^{82}$; or $R^1$ and $R^2$, $R^2$ and $R^3$ or $R^3$ and $R^4$ form together a ring

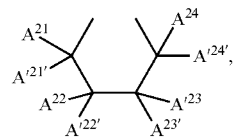 or 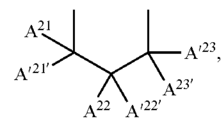

wherein $A^{21}$, $A^{21'}$, $A^{22}$, $A^{22'}$, $A^{23}$, $A^{23'}$, $A^{24'}$ and $A^{24}$ are independently of each other hydrogen, a $C_1$-$C_4$alkyl group, a $C_3$-$C_6$cycloalkyl group, or a fluoro$C_1$-$C_4$alkyl group;

$R^5$ and $R^6$ are independently of each other hydrogen; a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one of O, S and $NR^{65}$ and/or substituted by at least one substituent E; a $C_6$-$C_{14}$aryl group, which can optionally be substituted by at least one substituent G; a —$NR^{65}$—$C_6$-$C_{14}$aryl group, which can optionally be substituted by at least one substituent G; a heteroaryl group comprising 3 to 11 ring atoms, which can optionally be substituted by at least one substituent G, interrupted by at least one of O, S, N and $NR^{65}$; a halogen atom; a $C_1$-$C_{18}$haloalkyl group; CN; or $SiR^{80}R^{81}R^{82}$;

$R^7$, $R^8$, $R^9$, $R^{27}$ and $R^{28}$ are independently of each other hydrogen; a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one of O, S and $NR^{65}$ and/or substituted by at least one substituent E; a $C_6$-$C_{14}$aryl group, which can optionally be substituted by at least one substituent G; a heteroaryl group comprising 3 to 11 ring atoms, which can optionally be substituted by at least one substituent G, interrupted by at least one of O, S, N and $NR^{65}$ a halogen atom; a $C_1$-$C_{18}$haloalkyl group; CN; or $SiR^{80}R^{81}R^{82}$; in addition to the groups mentioned above, $R^8$ may be a —$NR^{65}$—$C_6$-$C_{14}$aryl group, which can optionally be substituted by at least one substituent G; or a —$NR^{65}$-heteroaryl group comprising 3 to 11 ring atoms, which can optionally be substituted by at least one substituent G, interrupted by at least one of O, S, N and $NR^{65}$; or $R^5$ and $R^6$ and/or $R^8$ and $R^9$ together form a group of formula

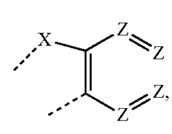

wherein Z' is N or CR''', wherein 0 or 1 Z' is N, X is O, S, $NR^{75}$ or $CR^{73}R^{74}$; R''' is $C_1$-$C_8$alkyl; a is 0, 1 or 2;

D is —CO—, —COO—, —S—, —SO—, —$SO_2$—, —O—, —$NR^{65}$—, —$SiR^{70}R^{71}$—, —$POR^{72}$—, —$CR^{63}$═$CR^{64}$—, or —C≡C;

E is —$OR^{69}$, —$SR^{69}$, —$NR^{65}R^{66}$, —$COR^{68}$, —$COOR^{67}$, —$CONR^{65}R^{66}$, —CN, halogen, a $C_1$-$C_{18}$alkyl group, which can optionally be substituted by at least one substituent E and/or interrupted by D; a $C_1$-$C_8$haloalkyl group, or a $C_1$-$C_8$alkyl group;

G is E; or an unsubstituted $C_6$-$C_{14}$aryl group; a $C_6$-$C_{14}$aryl group, which is substituted by F, $C_1$-$C_{18}$alkyl, or $C_1$-$C_{18}$alkyl, which is substituted by F and/or interrupted by O; an unsubstituted heteroaryl group comprising 3 to 11 ring atoms, interrupted by at least one of O, S, N and $NR^{65}$; or a heteroaryl group comprising 3 to 11 ring atoms, interrupted by at least one of O, S, N and $NR^{65}$, which is substituted by F, unsubstituted $C_1$-$C_{18}$alkyl, $SiR^{80}R^{81}R^{82}$, or $C_1$-$C_{18}$alkyl, which is substituted by F and/or interrupted by O; or a group of formula

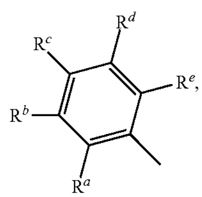

wherein $R^a$ is hydrogen, a $C_1$-$C_5$alkyl group, a fluoro$C_1$-$C_4$alkyl group, or a $C_3$-$C_6$cycloalkyl group;

$R^e$ is hydrogen, a $C_1$-$C_5$alkyl group, a fluoro$C_1$-$C_4$alkyl group, or a $C_3$-$C_6$cycloalkyl group;

$R^c$, $R^b$ and $R^d$ are independently of each other hydrogen; a $C_1$-$C_{18}$alkyl group, which can optionally be substituted by E and/or interrupted by D; a $C_3$-$C_{12}$cycloalkyl group, which can optionally be substituted by G; a $C_3$-$C_{10}$heterocycloalkyl radical which is interrupted by at least one of O, S and $NR^{65}$ and/or substituted by E; a $C_6$-$C_{24}$aryl group, which can optionally be substituted by G; or a $C_2$-$C_{30}$heteroaryl group, which can optionally be substituted by G; a halogen atom; $C_1$-$C_8$haloalkyl; CN; or $SiR^{80}R^{81}R^{82}$; or $R^c$ and $R^b$, or $R^a$ and $R^b$ together form a group of formula

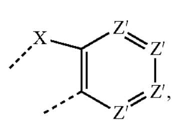

wherein Z' is N or CR''', wherein 0 or 1 Z' is N, X is O, S, $NR^{75}$ or $CR^{73}R^{74}$R''' is $C_1$-$C_8$alkyl, a is 0, 1 or 2;

$R^{63}$ and $R^{64}$ are independently of each other hydrogen; unsubstituted $C_6$-$C_{18}$aryl; $C_6$-$C_{18}$aryl which is substituted by $C_1$-$C_{18}$alkyl, or $C_1$-$C_{18}$alkoxy; unsubstituted $C_1$-$C_{18}$alkyl; or $C_1$-$C_{18}$alkyl which is interrupted by —O—;

$R^{65}$ and $R^{66}$ are independently of each other hydrogen, an unsubstituted $C_6$-$C_{18}$aryl group; a $C_6$-$C_{18}$aryl group which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; or $R^{65}$ and $R^{66}$ together form a five or six membered ring, $R^{67}$ is hydrogen, an unsubstituted $C_6$-$C_{18}$aryl group; a $C_6$-$C_{18}$aryl group, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; $R^{68}$ is hydrogen; an unsubstituted $C_6$-$C_{18}$aryl group; a $C_6$-$C_{18}$aryl group, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—;

$R^{69}$ is hydrogen, an unsubstituted $C_6$-$C_{18}$aryl; a $C_6$-$C_{18}$aryl, which is substituted by $C_1$-$C_{18}$alkyl, or $C_1$-$C_{18}$alkoxy; an unsubstituted $C_1$-$C_{18}$alkyl group; or a $C_1$-$C_{18}$alkyl group, which is interrupted by —O—; $R^{70}$ and $R^{71}$ are independently of each other an unsubstituted $C_1$-$C_{18}$alkyl group; an unsubstituted $C_6$-$C_{18}$aryl group; or a $C_6$-$C_{18}$aryl group, which is substituted by $C_1$-$C_{18}$alkyl;

$R^{72}$ is an unsubstituted $C_1$-$C_{18}$alkyl group; an unsubstituted $C_6$-$C_{18}$aryl group, or a $C_6$-$C_{18}$aryl group, which is substituted by $C_1$-$C_{18}$alkyl;

$R^{73}$ and $R^{74}$ are independently of each other hydrogen, $C_1$-$C_{25}$alkyl, $C_1$-$C_{25}$alkyl which is interrupted by O, $C_7$-$C_{25}$arylalkyl, $C_6$-$C_{24}$aryl, $C_6$-$C_{24}$aryl which is substituted by $C_1$-$C_{18}$alkyl, $C_2$-$C_{20}$heteroaryl, or $C_2$-$C_{20}$heteroaryl, which is substituted by $C_1$-$C_{18}$alkyl;

$R^{75}$ is a $C_6$-$C_{18}$aryl group; a $C_6$-$C_{18}$aryl which is substituted by $C_1$-$C_{18}$alkyl, or $C_1$-$C_{18}$alkoxy; a $C_1$-$C_{18}$alkyl group; or a $C_1$-$C_{18}$alkyl group, which is interrupted by —O—;

$R^{80}$, $R^{81}$ and $R^{82}$ are independently of each other a $C_1$-$C_{25}$alkyl group, which can optionally be interrupted by 0; a $C_6$-$C_{14}$aryl group, which can optionally be substituted by $C_1$-$C_{18}$alkyl; or a heteroaryl group comprising 3 to 11 ring atoms, which can optionally be substituted by $C_1$-$C_{18}$alkyl; and ~ is a bonding site to the metal, wherein the metal is selected from the group consisting of Ir and Pt.

2. The metal carbene complex according to claim 1, wherein:

$R^1$, $R^2$, $R^3$ and $R^4$ are independently of each other hydrogen; a $C_1$-$C_{12}$alkyl group, which can optionally be substituted by at least one substituent E and/or interrupted by D; a $C_3$-$C_{12}$cycloalkyl group, which can optionally be substituted by at least one substituent E; a $C_6$-$C_{14}$aryl group, which can optionally be substituted by one or two groups G; a heteroaryl group comprising 3 to 11 ring atoms, which can optionally be substituted by one or two groups G; or a —N(phenyl)2 group, which can optionally be substituted by one or two groups G-;

$R^5$ and $R^6$ are independently of each other hydrogen; a $C_1$-$C_{12}$alkyl group, which can optionally be substituted by E and/or interrupted by D; a $C_3$-$C_{12}$cycloalkyl group, which can optionally be substituted by E; or one of $R^5$ and $R^6$ is a group of formula

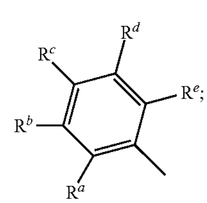

wherein:

$R^a$ is hydrogen, a $C_1$-$C_5$alkyl group, a fluoro$C_1$-$C_4$alkyl group, or a $C_3$-$C_6$cycloalkyl group;

$R^e$ is hydrogen, a $C_1$-$C_5$alkyl group, a fluoro$C_1$-$C_4$alkyl group, or a $C_3$-$C_6$cycloalkyl group;

$R^c$, $R^b$ and $R^d$ are independently of each other hydrogen; a $C_1$-$C_{18}$alkyl group, which can optionally be substituted by E and/or interrupted by D; a $C_3$-$C_{12}$cycloalkyl group, which can optionally be substituted by G; a $C_6$-$C_{14}$aryl group, which can optionally be substituted by G; a $C_2$-$C_{30}$heteroaryl group, which can optionally be substituted by G; $C_1$-$C_8$haloalkyl; or $SiR^{80}R^{81}R^{82}$; or $R^c$ and $R^b$, or $R^a$ and $R^b$ together form a group of formula

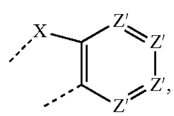

wherein Z' is N or CR''', wherein 0 or 1 Z' is N, —X is O, S, $NR^{75}$ or $CR^{73}R^{74}$R''' is $C_1$-$C_8$alkyl and a is 0, 1 or 2;

$R^7$, $R^8$ and $R^9$ are independently of each other hydrogen; a $C_1$-$C_{12}$alkyl group, which can optionally be substituted by E and/or interrupted by D; a $C_3$-$C_{12}$cycloalkyl group, which can optionally be substituted by E, a $C_6$-$C_{14}$aryl group, which can optionally be substituted by one or two groups G; a heteroaryl group comprising 3 to 11 ring atoms, which can optionally be substituted by one or two groups G;

$R^{27}$, $R^{28}$ are independently of each other hydrogen; or a $C_1$-$C_{12}$alkyl group, which can optionally be substituted by E and/or interrupted by D;

D is —S—, or —O—;

E is $—OR^{69}$, $CF_3$, $C_1$-$C_8$alkyl or F;

G is $—OR^{69}$, $CF_3$ or $C_1$-$C_8$alkyl;

$R^{65}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—; and $R^{69}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—.

3. The metal carbene complex according to claim 1, wherein at least one of the radicals $R^1$, $R^2$, $R^3$, $R^4$, $R^5$, $R^6$, $R^7$, $R^8$, and $R^9$ is not hydrogen.

4. The metal carbene complex according to claim 1, wherein $R^1$, $R^2$, $R^3$ and $R^4$ are independently of each other hydrogen; a $C_1$-$C_8$alkyl group, which can optionally be substituted by at least one substituent E; a $C_3$-$C_6$cycloalkyl group, which can optionally be substituted by at least one substituent E; or a phenyl group, which can optionally be substituted by one or two groups G;

$R^5$ and $R^6$ are independently of each other hydrogen; a $C_1$-$C_8$alkyl group, which can optionally be substituted by at least one substituent E; or a $C_3$-$C_6$cycloalkyl group, which can optionally be substituted by at least one substituent E; or a phenyl group, which can optionally be substituted by one or two groups G;

$R^7$, $R^8$ and $R^9$ are independently of each other hydrogen; a $C_1$-$C_8$alkyl group, which can optionally be substituted by at least one substituent E; or a $C_3$-$C_6$cycloalkyl group, which can optionally be substituted by at least one substituent E; or a phenyl group, which can optionally be substituted by one or two groups G;

$R^{27}$ and $R^{28}$ are hydrogen;

E is $CF_3$, $C_1$-$C_8$alkyl, or F;

G is $CF_3$ or $C_1$-$C_8$alkyl;

$R^{65}$ is a phenyl group, which can optionally be substituted by one or two $C_1$-$C_8$alkyl groups; an unsubstituted $C_1$-$C_8$alkyl group; or a $C_1$-$C_8$alkyl group, which is interrupted by —O—; and $R^{69}$ is a phenyl group, which can optionally be substituted by one or two $C_1$-$C_8$alkyl groups; an unsubstituted $C_1$-$C_8$alkyl group; or a $C_1$-$C_8$alkyl group, which is interrupted by —O—.

5. The metal carbene complex according to claim 1, wherein $R^1$, $R^2$, $R^3$ and $R^4$ are independently of each other hydrogen; a $C_1$-$C_8$alkyl group; or a $C_3$-$C_6$cycloalkyl group;

$R^5$, $R^6$, $R^7$, $R^8$ and $R^9$ are independently of each other hydrogen; a $C_1$-$C_8$alkyl group; or a $C_3$-$C_6$cycloalkyl group; or one of $R^5$ and $R^6$ is a phenyl group, which can optionally be substituted by one or two groups G; and $R^{27}$ and $R^{28}$ are hydrogen.

6. The metal carbene complex according to claim 1, wherein either $R^2$ and $R^3$, or $R^1$ and $R^4$, are hydrogen.

7. The metal carbene complex according to claim 1, wherein $R^5$ and $R^6$ are independently of each other hydrogen; a $C_1$-$C_8$alkyl group; or one of $R^5$ and $R^6$ is a phenyl group, which can optionally be substituted by one or two groups selected from $CF_3$ or $C_1$-$C_8$alkyl;

$R^7$ and $R^9$ are $C_1$-$C_8$alkyl;

$R^8$ is hydrogen; a $C_1$-$C_8$alkyl group; or a phenyl group, which can optionally be para-substituted by one group selected from $CF_3$ or $C_1$-$C_8$alkyl; and $R^{27}$ and $R^{28}$ are hydrogen.

8. The metal carbene complex according to claim 1, wherein $R^5$ is hydrogen; a $C_1$-$C_8$alkyl group, which can optionally be substituted by at least one substituent selected from $CF_3$, $C_1$-$C_8$alkyl and F; a $C_3$-$C_6$cycloalkyl group, which can optionally be substituted by at least one substituent selected from $CF_3$, $C_1$-$C_8$alkyl and F; or a phenyl group, which can optionally be substituted by one or two groups selected from $CF_3$ and $C_1$-$C_8$alkyl;

$R^6$ and $R^8$ are identical and selected from the group consisting of a $C_1$-$C_8$alkyl group, which can optionally be substituted by at least one substituent selected from $CF_3$, $C_1$-$C_8$alkyl and F; a $C_3$-$C_6$cycloalkyl group, which can optionally be substituted by at least one substituent selected from $CF_3$, $C_1$-$C_8$alkyl and F; and a phenyl group, which can optionally be substituted by one or two groups selected from $CF_3$ and $C_1$-$C_8$alkyl;

$R^7$ and $R^9$ are hydrogen;

wherein $R^5$ and $R^6$ are not at the same time a phenyl group, which can optionally be substituted by one or two groups selected from $CF_3$ and $C_1$-$C_8$alkyl; and $R^{27}$ and $R^{28}$ are hydrogen.

9. The metal carbene complex according to claim 1, wherein $R^7$, $R^8$ and $R^9$ are hydrogen;

$R^6$ is hydrogen; and $R^{27}$ and $R^{28}$ are hydrogen.

10. The metal carbene complex according to claim 1, having the following formula (II)

(II)

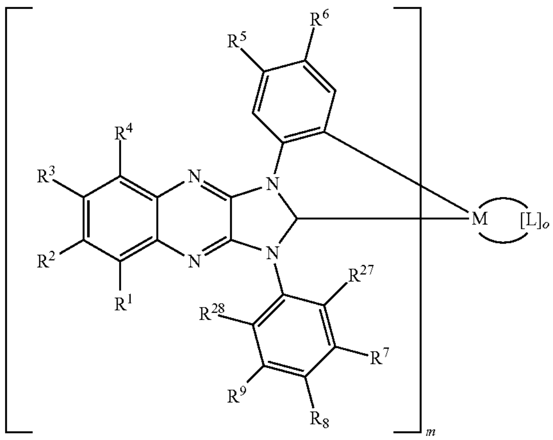

wherein

M is Pt or Ir;

wherein if M is Ir, m is 1, 2, or 3; o is 0, 1, or 2; and the sum of m+o is 3;

wherein when o=2, the ligands L may be the same or different; and when m is 2 or 3, the m carbene ligands may be the same or different;

wherein if M is Pt, m is 1, or 2; o is 0, or 1; and the sum of m+o is 2;

wherein when m is 2, the m carbene ligands may be the same or different; and

L is a monoanionic bidentate ligand.

11. The metal carbene complex according to claim 10, wherein L is a group of formula (X-1)

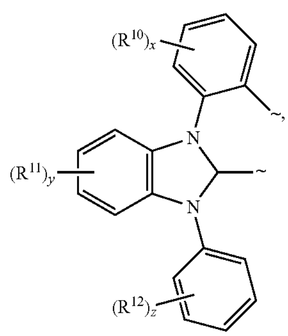

(X-2)

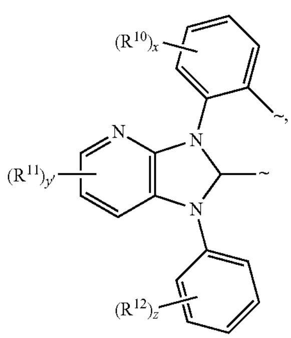

-continued (X-3)

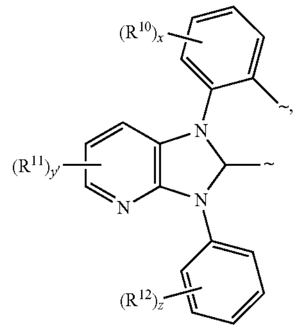

(X-4)

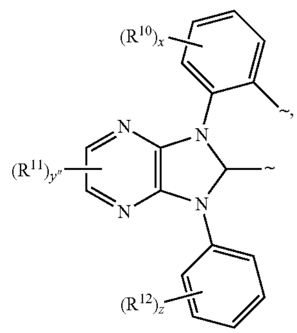

(X-5)

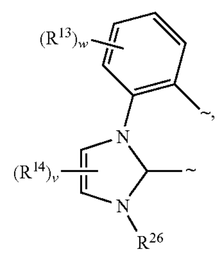

(X-6)

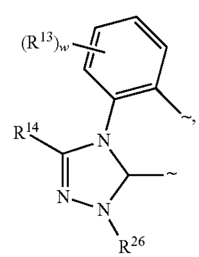

(X-7)

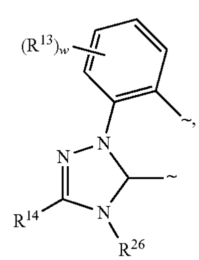

-continued
(X-8)
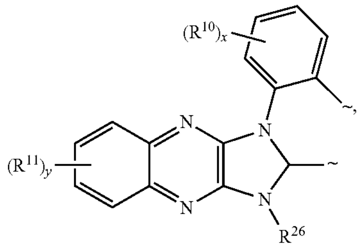
(X-9)
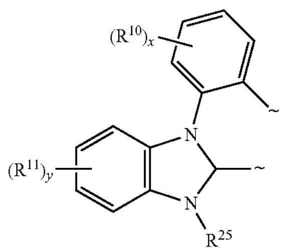
(X-10)
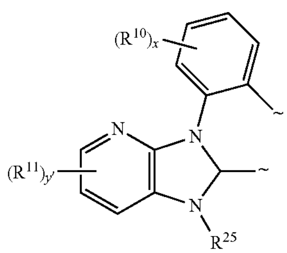
(X-11)
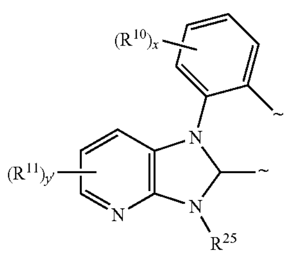
(X-12)
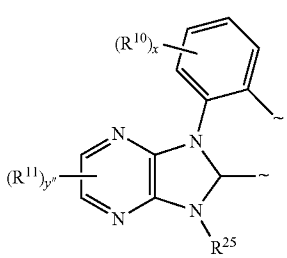
(X-13)
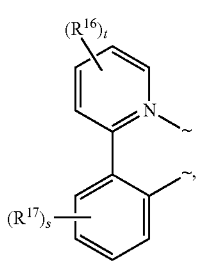
-continued
(X-14)
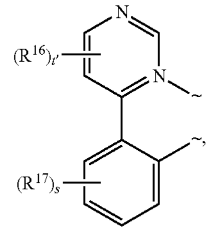
(X-15)
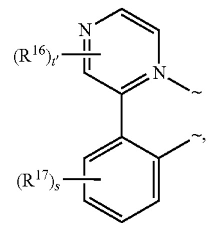
(X-16)
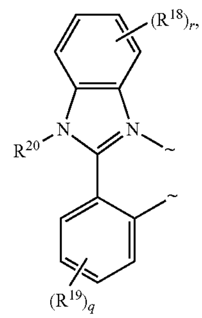
(X-17)
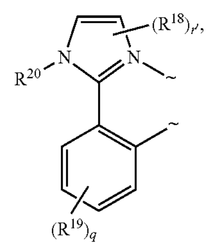
(X-18)
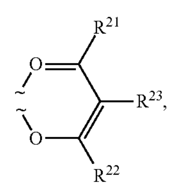
[[or]]
(X-19)
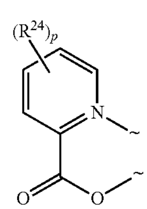
(X-20)
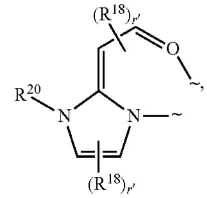

-continued
(X-21)
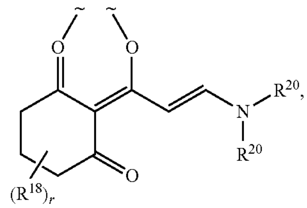
(X-22)
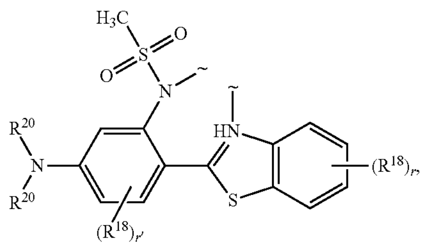
(X-23)
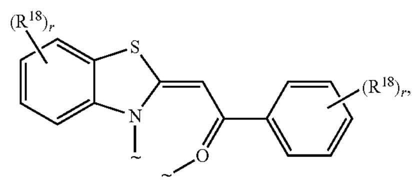
(X-24)
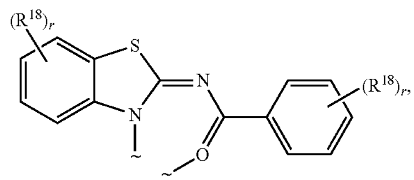
(X-25)
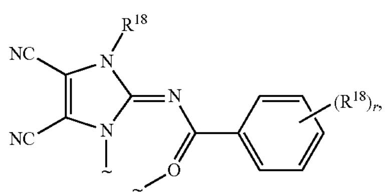
(X-26)
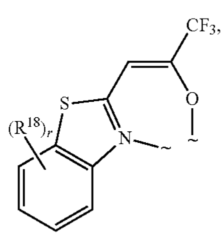
(X-27)
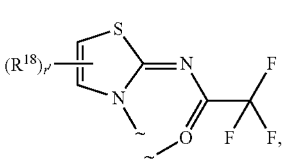
-continued
(X-28)
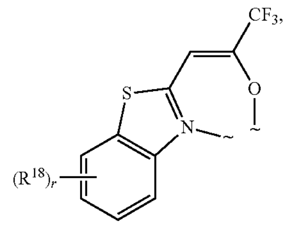
(X-29)
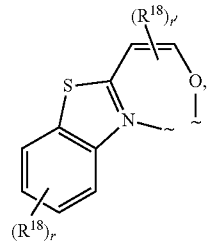
(X-30)
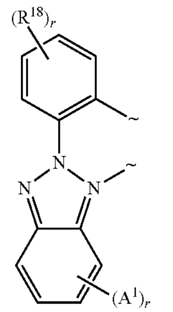
(X-31)
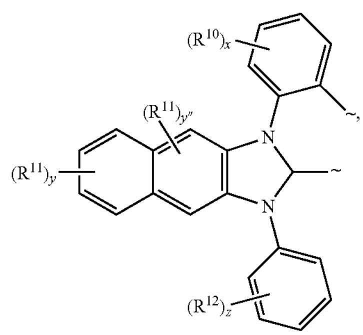
(X-32)
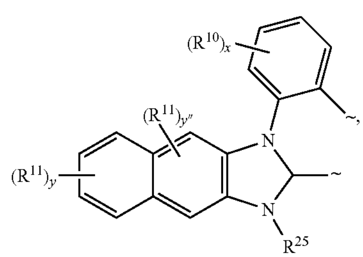
(X-33)
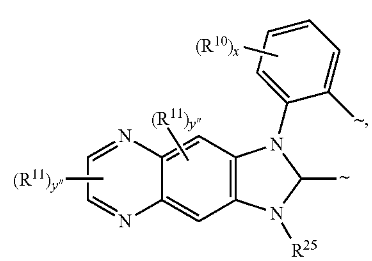

-continued
(X-34)
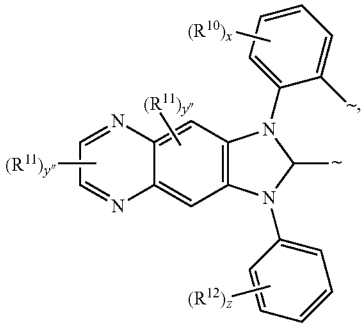
(X-35)
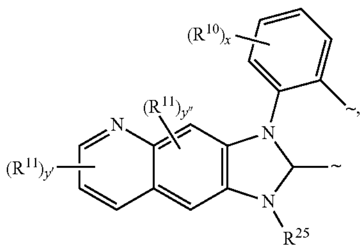
(X-36)
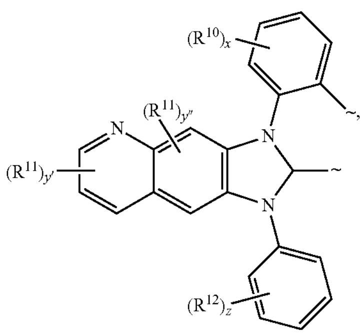
(X-37)
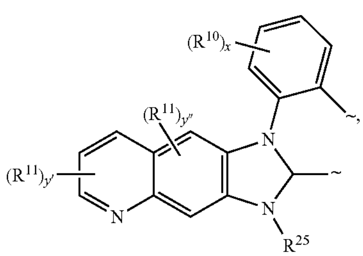
(X-38)
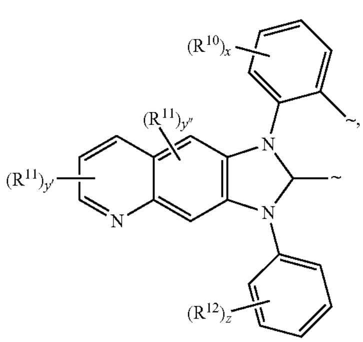
-continued
(X-39)
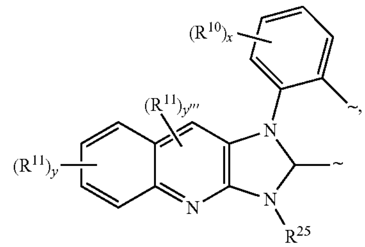
(X-40)
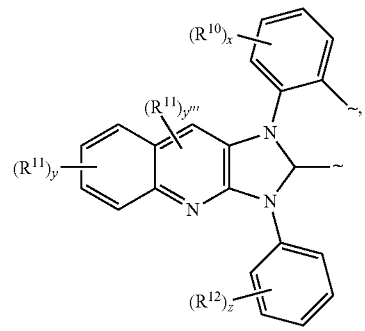
(X-41)
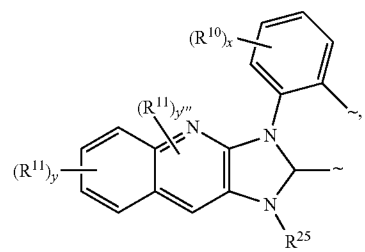
(X-42)
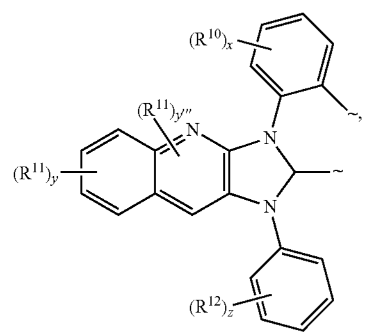
(X-43)
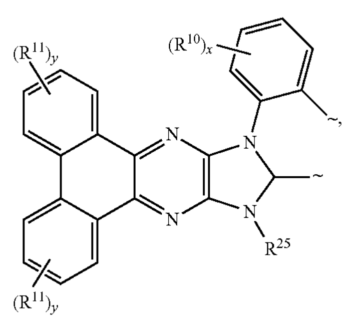
or -continued (X-44)

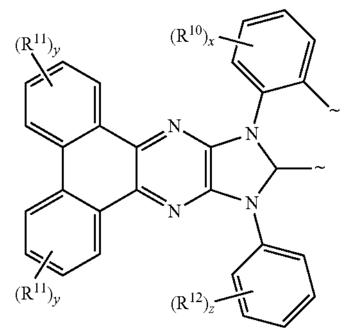

wherein the radicals $R^{10}$, $R^{12}$, $R^{13}$, $R^{16}$, $R^{17}$, $R^{18}$ and $R^{19}$ are—in each case—independently of each other a $C_1$-$C_{18}$alkyl group, which can optionally be substituted by E and/or interrupted by D; a $C_3$-$C_{12}$cycloalkyl group, which can optionally be substituted by E; a heterocycloalkyl group comprising 3 to 6 ring atoms, interrupted by at least one heteroatom selected from —O—, —S— and —$NR^{65}$—, optionally bearing at least one substituent E; a halogen atom; $C_1$-$C_8$haloalkyl; CN; or $SiR^{80}R^{81}R^{82}$; or one radical $R^{10}$ and/or one radical $R^{12}$; one radical $R^{13}$ and/or one radical $R^{12}$; one radical $R^{16}$ and/or one radical $R^{17}$; one radical $R^{18}$ and/or one radical $R^{19}$ is a group of formula

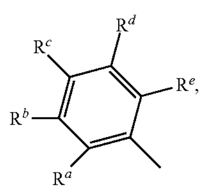

wherein $R^a$ is hydrogen, a $C_1$-$C_8$alkyl group, a fluoro$C_1$-$C_4$alkyl group, or a $C_3$-$C_6$cycloalkyl group;

$R^e$ is hydrogen, a $C_1$-$C_8$alkyl group, a fluoro$C_1$-$C_4$alkyl group, or a $C_3$-$C_6$cycloalkyl group;

$R^c$, $R^b$ and $R^d$ are independently of each other hydrogen; a $C_1$-$C_{18}$alkyl group, which can optionally be substituted by E and/or interrupted by D; a $C_3$-$C_{12}$cycloalkyl group, which can optionally be substituted by G; a $C_3$-$C_{10}$heterocycloalkyl radical which is interrupted by at least one of O, S and $NR^{65}$ and/or substituted by E; a $C_6$-$C_{24}$aryl group, which can optionally be substituted by G; a $C_2$-$C_{30}$heteroaryl group, which can optionally be substituted by G; a halogen atom; CN; or $SiR^{80}R^{81}R^{82}$; or two adjacent radicals $R^{10}$ and/or two adjacent radicals $R^{12}$; two adjacent radicals $R^{13}$ and/or two adjacent radicals $R^{12}$; two adjacent radicals $R^{16}$ and/or two adjacent radicals $R^{17}$; or two adjacent radicals $R^{19}$; or $R^c$ and $R^b$, or $R^a$ and $R^b$ together form a group of formula

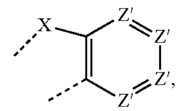

wherein Z' is N or CR''' ', wherein 0 or 1 Z' is N, X is O, S, $NR^{75}$ or $CR^{73}R^{74}$; R''' is $C_1$-$C_8$alkyl and a' is 0 or 1; or the radicals $R^{11}$, $R^{14}$, $R^{20}$, $R^{21}$, $R^{22}$, $R^{23}$ and $R^{24}$ are—in each case—independently of each other a $C_1$-$C_{18}$alkyl group, which can optionally be substituted by at least one substituent E and/or interrupted by D; a $C_3$-$C_{12}$cycloalkyl group, which can optionally be substituted by at least one substituent E; a heterocycloalkyl group comprising 3 to 6 ring atoms, interrupted by at least one heteroatom selected from —O—, —S— and —$NR^{65}$—, optionally bearing at least one substituent E; a $C_6$-$C_{14}$aryl group, which can optionally be substituted by one or two groups G; a heteroaryl group comprising 3 to 11 ring atoms, which can optionally be substituted by one or two groups G; or a —$NR^{65}$-phenyl group, which can optionally be substituted by one or two groups G;

or in the case of X-1, X-2, X-3, X-31, X-34, X-35, X-36, X-37 and X-38 CN; or two adjacent radicals $R^{11}$ or two adjacent radicals $R^{14}$ form together a group

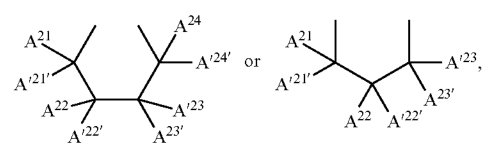

wherein $A^{21}$, $A^{21'}$, $A^{22}$, $A^{22'}$, $A^{23}$, $A^{23'}$, $A^{24'}$ and $A^{24}$ are independently of each other hydrogen, a $C_1$-$C_4$alkyl group, a $C_3$-$C_6$cycloalkyl group, or a fluoro$C_1$-$C_4$alkyl group; or $R^{25}$ is $CH_3$ or ethyl or iso-propyl;

$R^{26}$ is a phenyl group, which can optionally be substituted by one or two groups selected from $CF_3$ and $C_1$-$C_8$alkyl; or $R^{26}$ is $CH_3$; or iso-propyl;

D is —S—, —O—, or —$NR^{65}$—;

E is —$OR^{69}$, —CN, $CF_3$, $C_1$-$C_8$alkyl or F;

G is —$OR^{69}$, —CN, $CF_3$ or $C_1$-$C_8$alkyl; $R^{65}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—;

$R^{69}$ is a phenyl group, which can optionally be substituted by one or two $C_1$-$C_8$alkyl groups; an unsubstituted $C_1$-$C_{18}$alkyl group; or a $C_1$-$C_{18}$alkyl group, which is interrupted by —O—; and $A^1$ is $C_6$-$C_{10}$aryl; or two adjacent groups $A^l$ together form a group

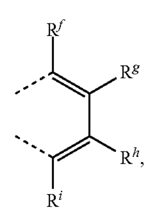

wherein $R^f$, $R^g$, $R^h$ and $R^i$ are independently of each other hydrogen or $C_1$-$C_8$alkyl;

$Q^1$ and $Q^2$ are independently of each other hydrogen, $C_1$-$C_{18}$alkyl, or $C_6$-$C_{18}$aryl;

w and x are independently of each other 0, 1 or 2;

z is 0, 1, 2 or 3;

y, y', y", u, and v are independently of each other 0, 1 or 2;

y''' is 0 or 1;

p, q, r, s, t, t', and t" are independently of each other 0, 1, 2, 3 or 4; and r' is 0, 1, or 2.

12. The metal carbene complex according to claim 1, wherein the metal is Ir.

13. The metal carbene complex according to claim 12, selected from the group consisting of formulae IIa, IIb, IIc, IId, IIe, IIf, IIg, and IIh;

(IIa)

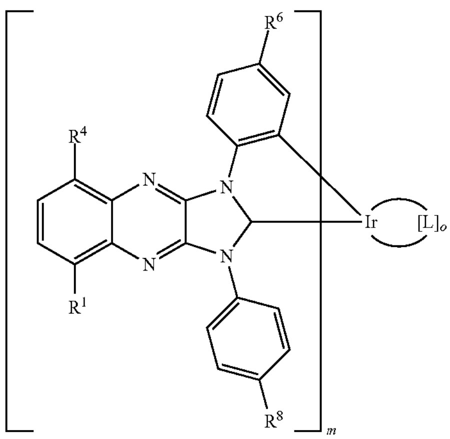

(IIb)

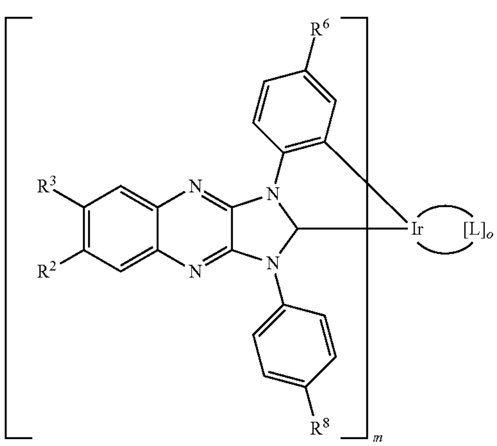

-continued (IIc)

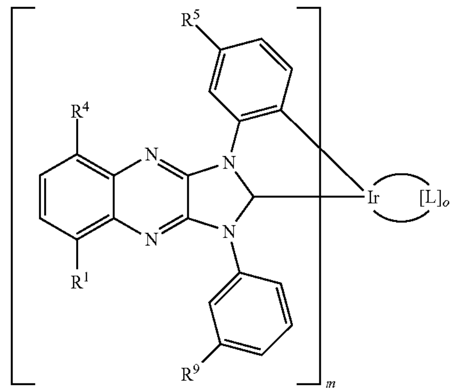

(IId)

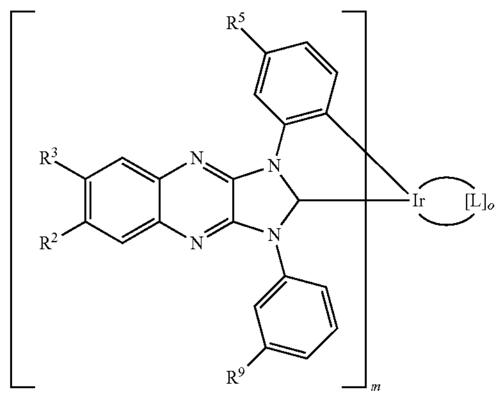

(IIe)

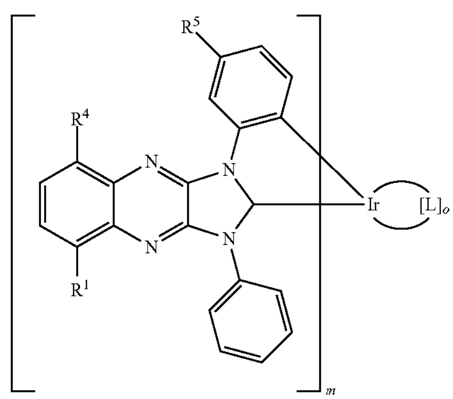

(IIf)

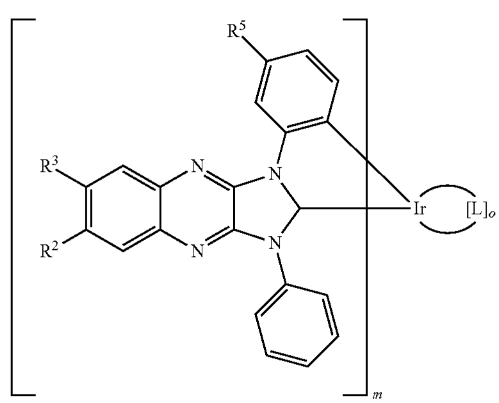

-continued (IIg)

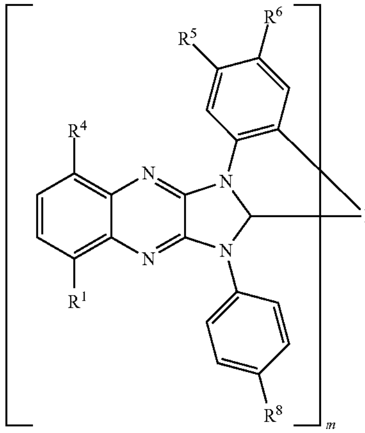

(IIh)

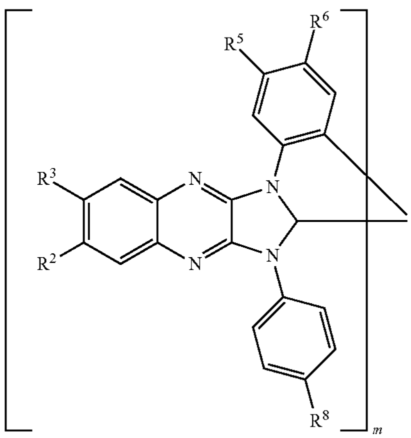

wherein $R^1$, $R^2$, $R^3$ and $R^4$ are independently of each other—in each case—hydrogen; a $C_1$-$C_8$alkyl group, which can optionally be substituted by at least one substituent E and/or interrupted by D; a $C_3$-$C_6$cycloalkyl group, which can optionally be substituted by at least one substituent E; or a phenyl group, which can optionally be substituted by one or two groups G;

$R^5$ and $R^6$ are independently of each other—in each case—hydrogen; a $C_1$-$C_8$alkyl group, which can optionally be substituted by at least one substituent E and/or interrupted by D; or a $C_3$-$C_6$cycloalkyl group, which can optionally be substituted by at least one substituent E; or a phenyl group, which can optionally be substituted by one or two groups G;

$R^8$ and $R^9$ are independently of each other hydrogen; a $C_1$-$C_8$alkyl group, which can optionally be substituted by at least one substituent E and/or interrupted by D; or a $C_3$-$C_6$cycloalkyl group, which can optionally be substituted by at least one substituent E; or a phenyl group, which can optionally be substituted by one or two groups G;

D is —S— or —O—;

E is —$OR^{69}$, —CN, $CF_3$, $C_1$-$C_8$alkyl or F;

G is —$OR^{69}$, —CN, $CF_3$ or $C_1$-$C_8$alkyl;

$R^{69}$ is a phenyl group, which can optionally be substituted by one or two $C_1$-$C_8$alkyl groups; an unsubstituted $C_1$-$C_8$alkyl group; or a $C_1$-$C_8$alkyl group, which is interrupted by —O—;

L is a monoanionic bidentate ligand;

m is 1, 2, or 3;

o is 0, 1, or 2; and the sum of m+o is 3;

wherein when o=2, the ligands L may be the same or different; and when m is 2 or 3, the m carbene ligands may be the same or different.

14. The metal carbene complex according to claim 13, selected from the group consisting of formulae II-1, II-2, II-3, II-4, II-5, II-6, II-7, II-8, II-9, II-10, II-11, II-12, II-13, II-14, II-15, II-16, II-17, II-18, II-19, II-20, II-21, II-22, II-23, II-24, II-25, II-26, II-27, II-28, II-29, II-30, II-31, II-32, II-33, II-34, II-35, II-36, II-37, II-38, II-39, II-40, II-41, II-42, II-43, II-44, II-45, II-46, II-47, II-48, II-49, II-50, II-51, II-52, II-53, II-54, II-55, II-56, II-57, II-58, II-59, II-60, II-61, II-62, II-63, II-64, II-65, II-66, II-67, II-68, II-69, II-70, II-71, II-72, II-73, and II-74;

(II-1)

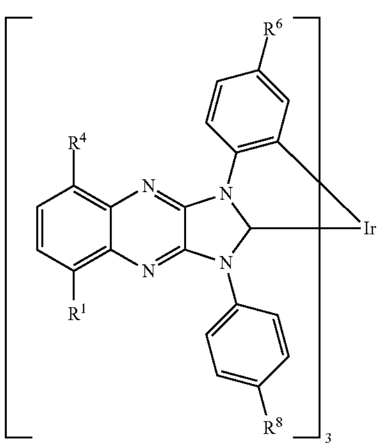

(II-2)

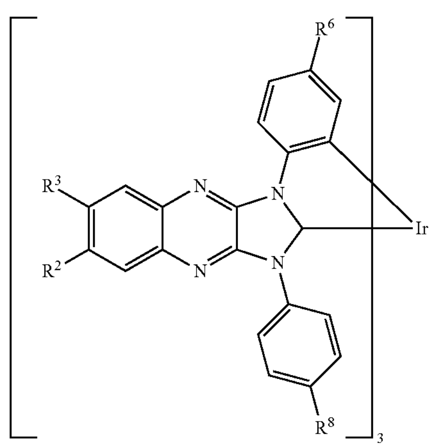

-continued
(II-3)
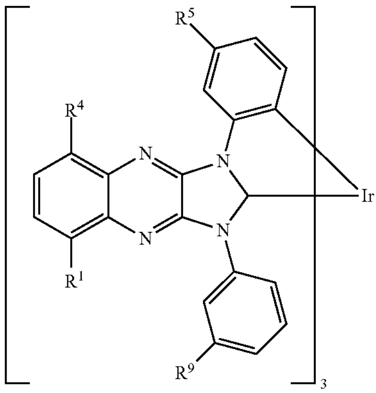
(II-4)
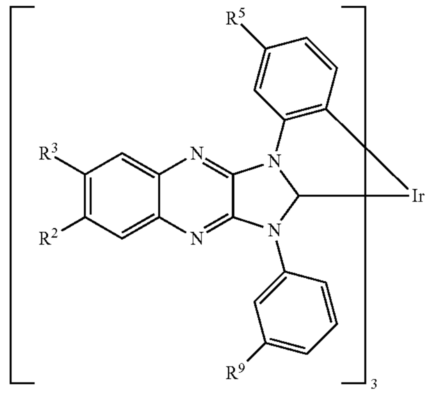
(II-5)
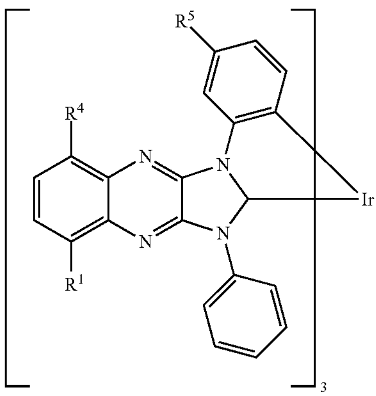
(II-6)
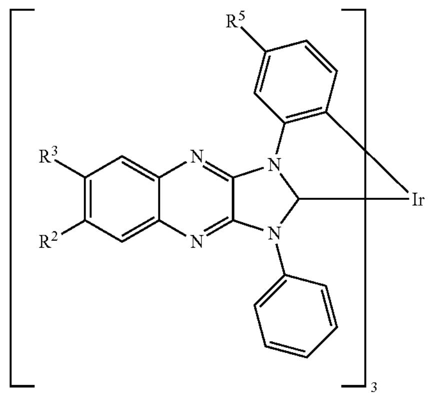
(II-7)
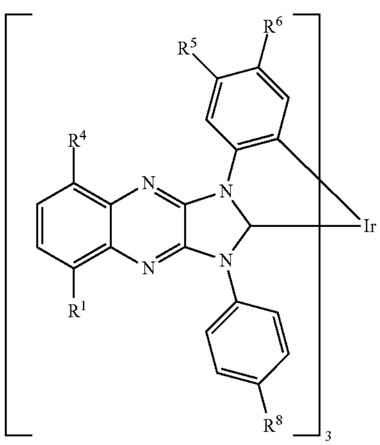
(II-8)
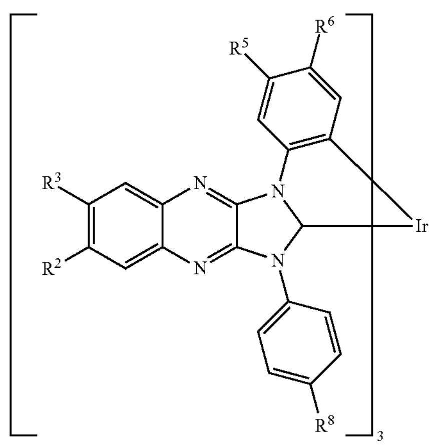
(II-9)
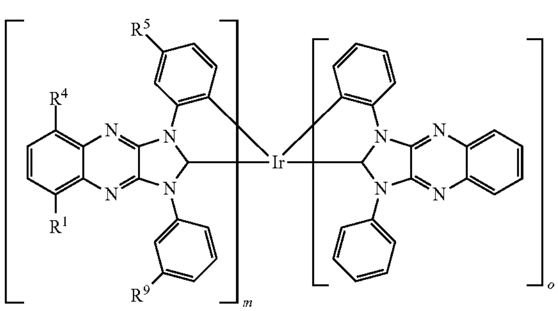
(II-10)
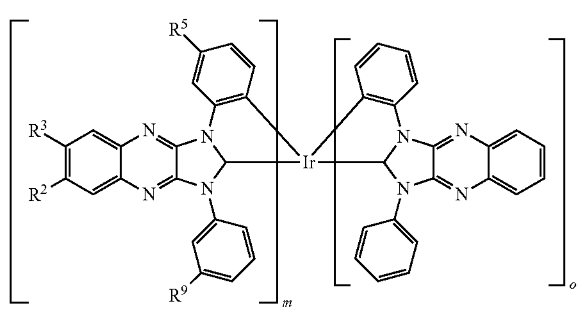

-continued
(II-11)
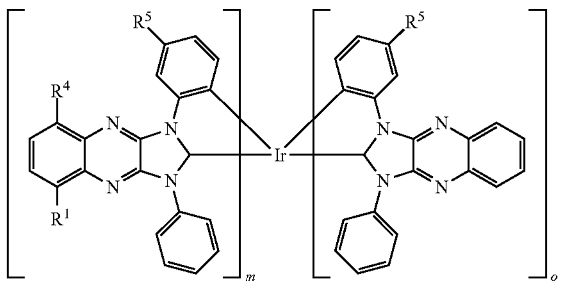
(II-12)
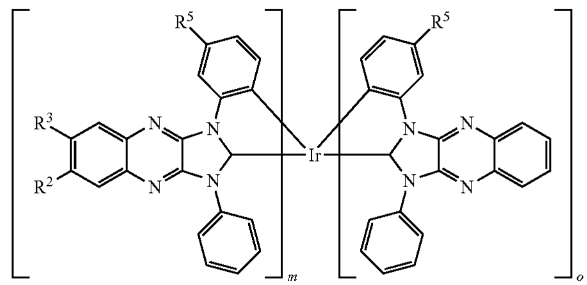
(II-13)
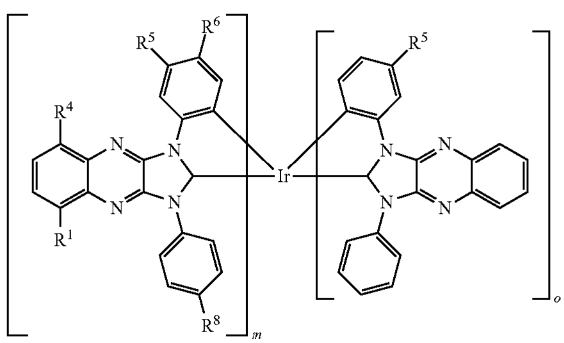
(II-14)
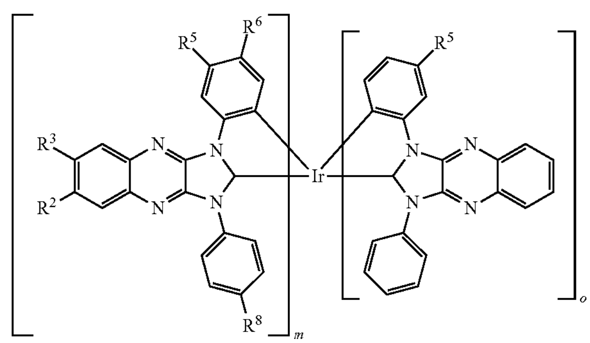
(II-15)
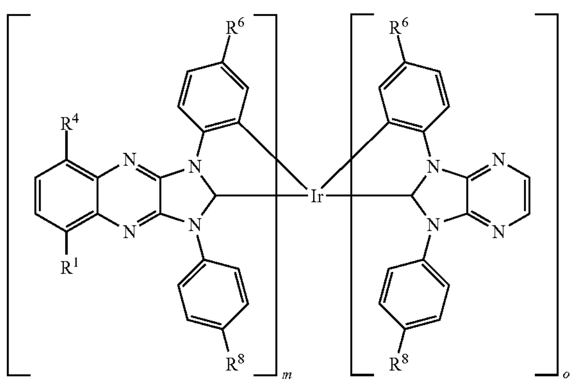
(II-16)
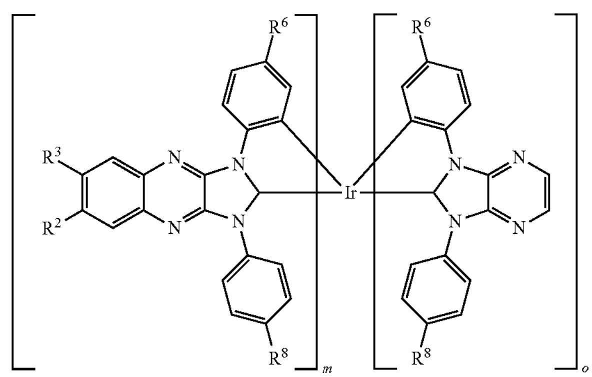
(II-17)
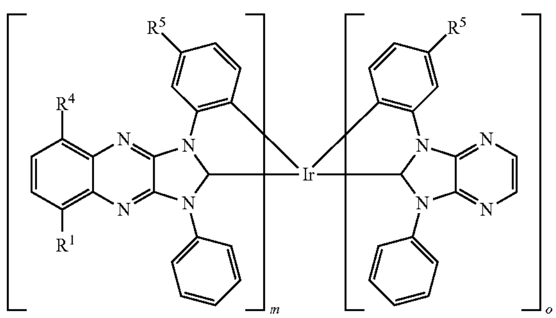
(II-18)
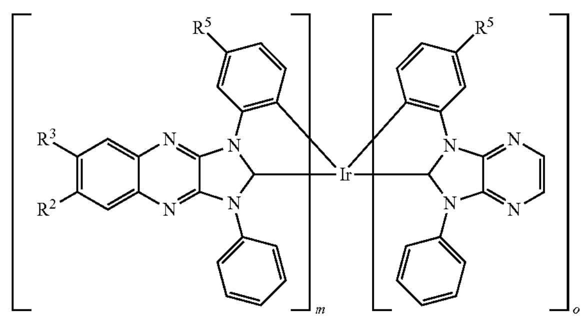

-continued
(II-19)
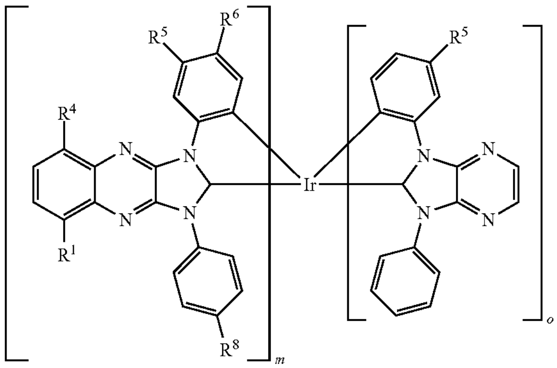
(II-20)
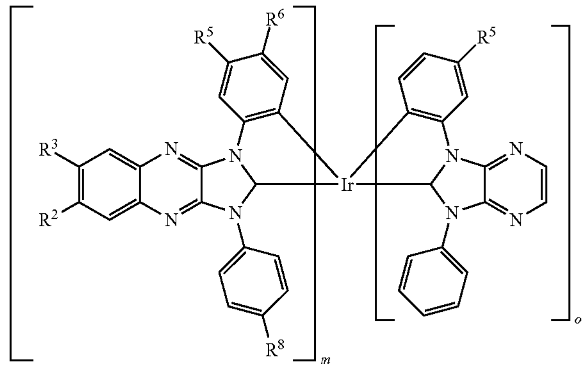
(II-21)
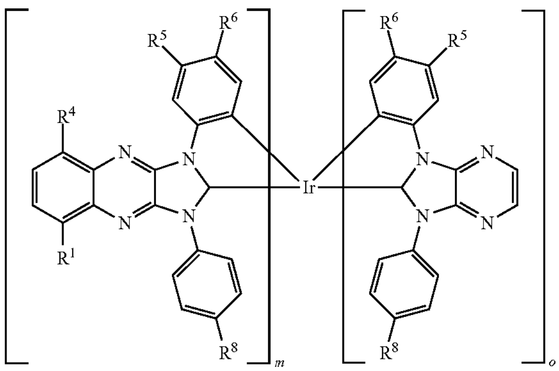
(II-22)
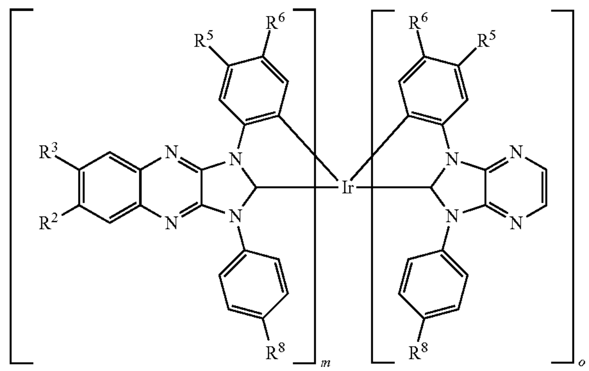
(II-23)
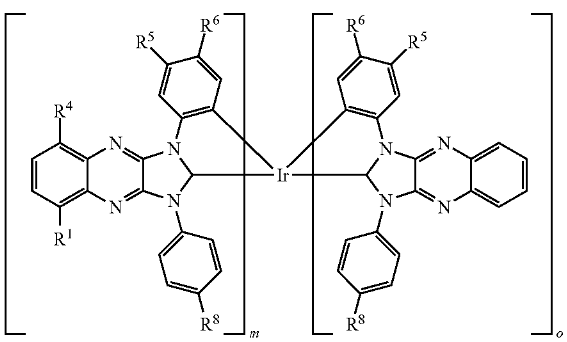
(II-24)
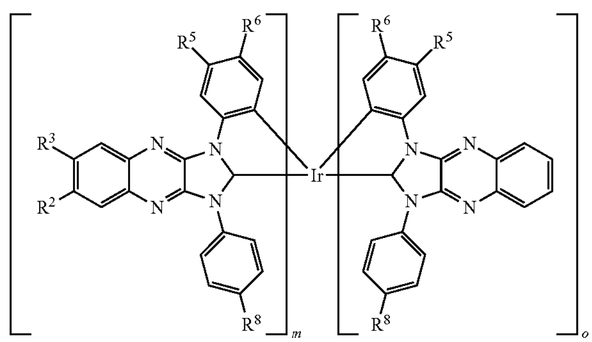
(II-25)
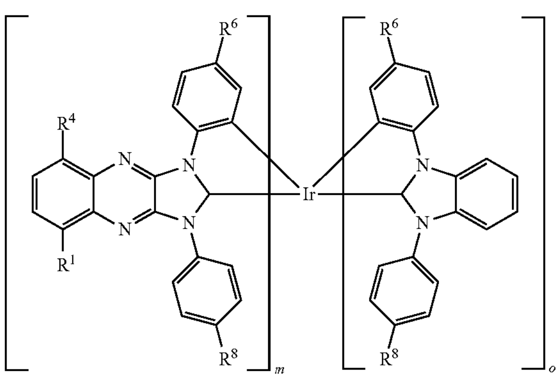
(II-26)
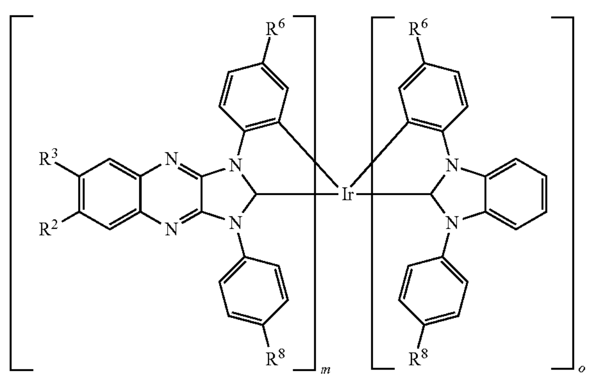

-continued
(II-27)
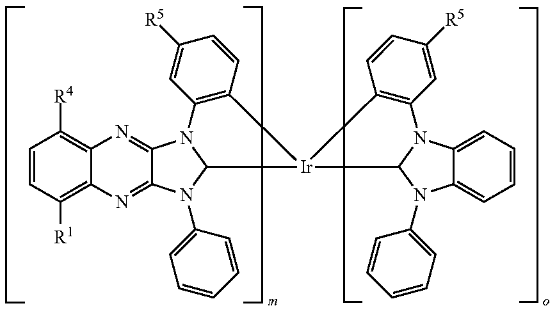
(II-28)
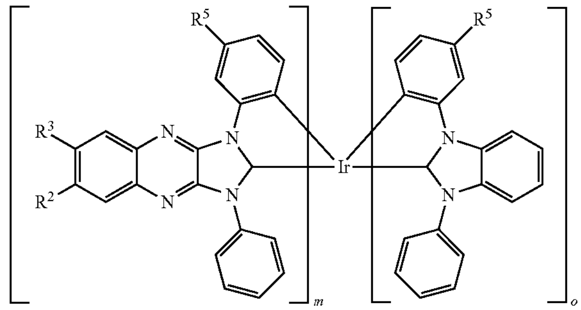
(II-29)
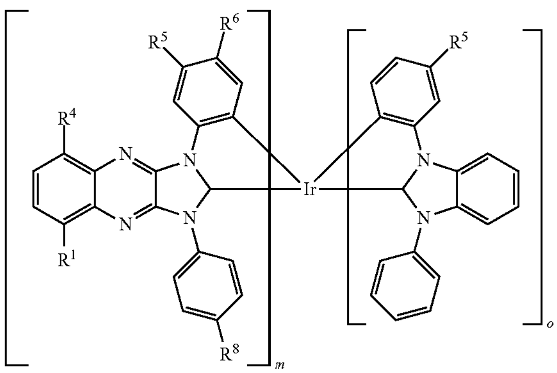
(II-30)
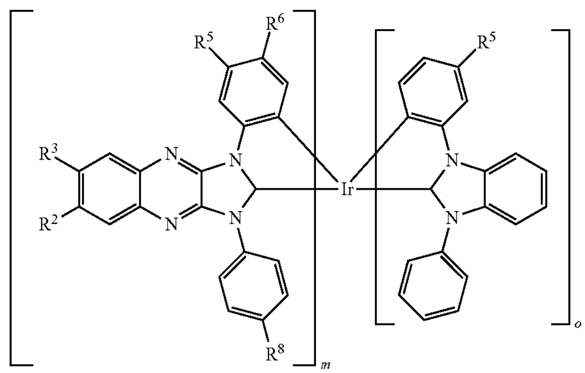
(II-31)
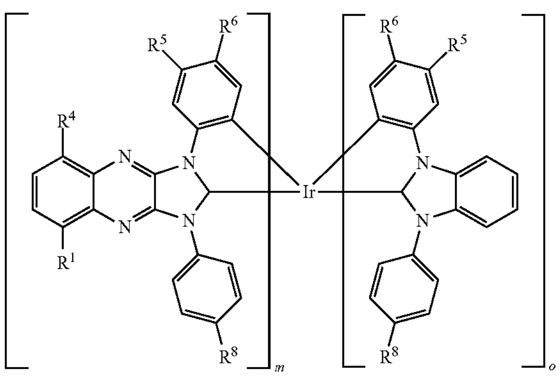
(II-32)
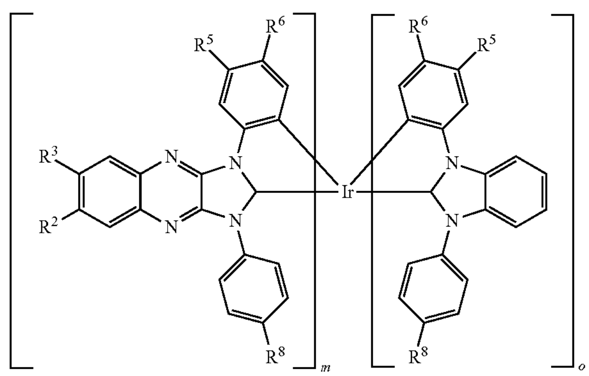
(II-33)
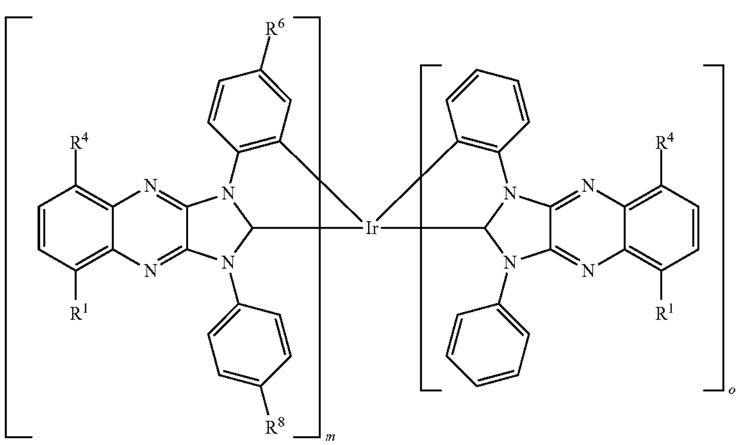

-continued
(II-34)
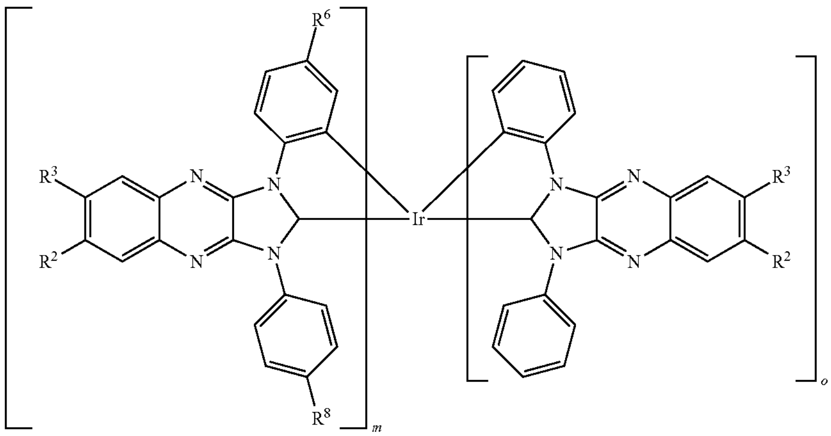
(II-35)
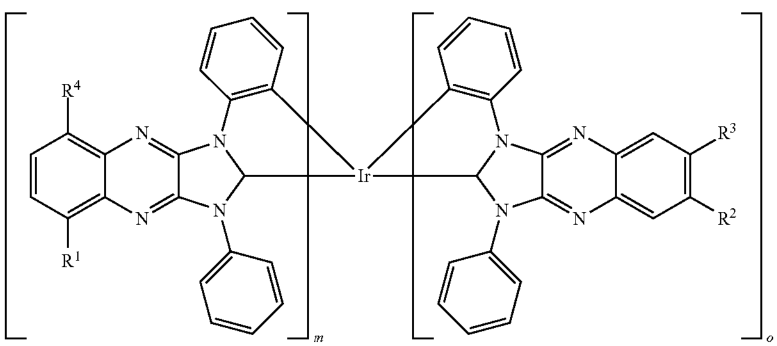
(II-36)
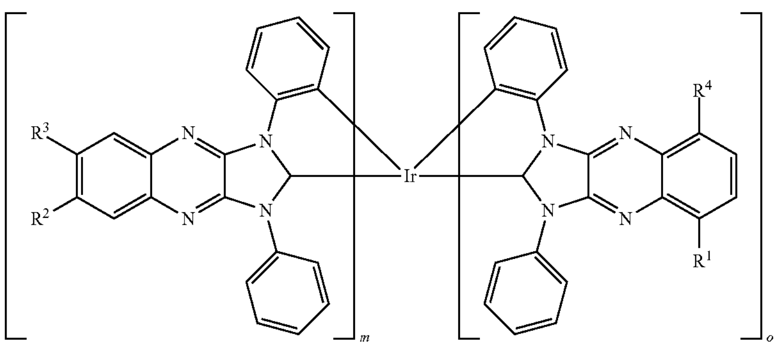
(II-37)
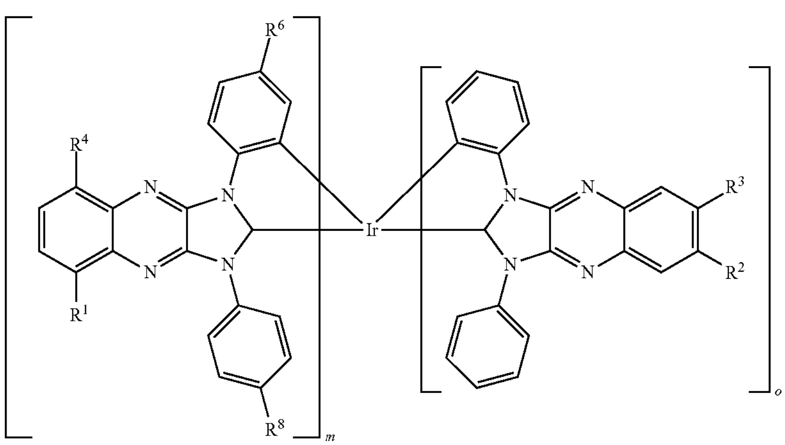

-continued
(II-38)
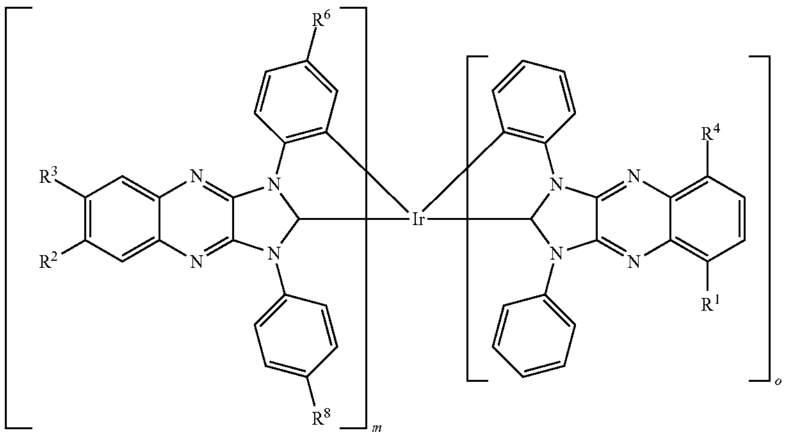
(II-39)
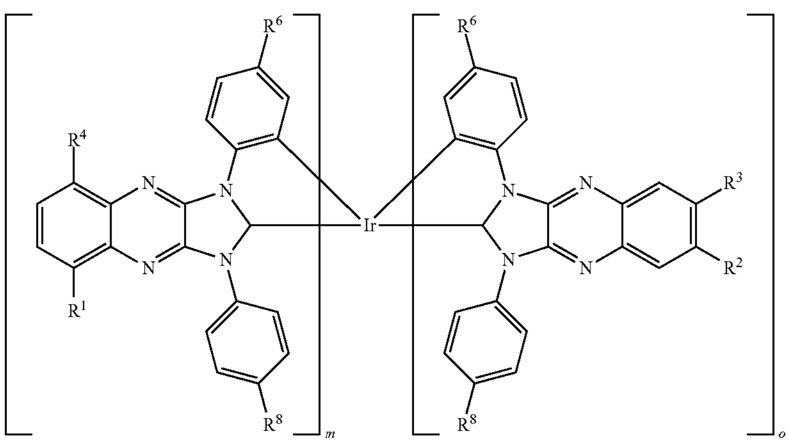
(II-40)
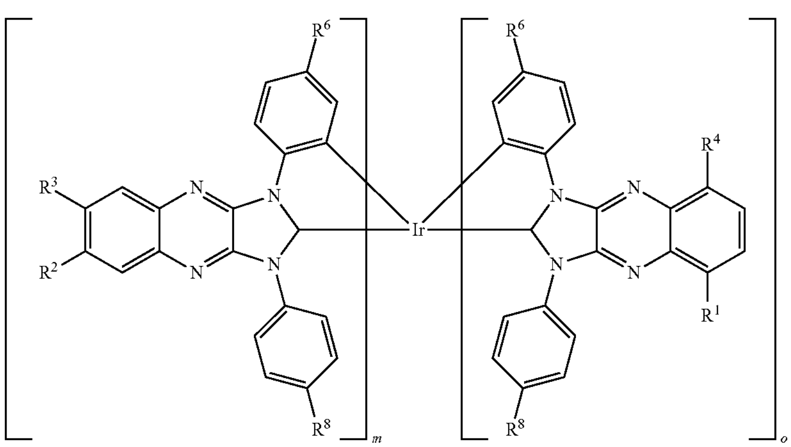

-continued
(II-41)
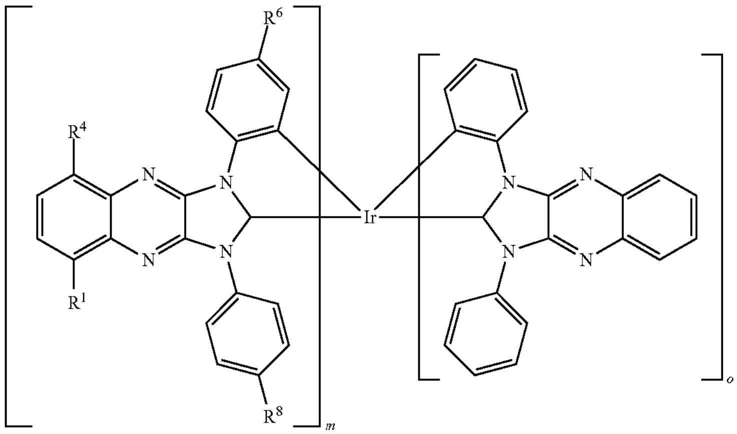
(II-42)
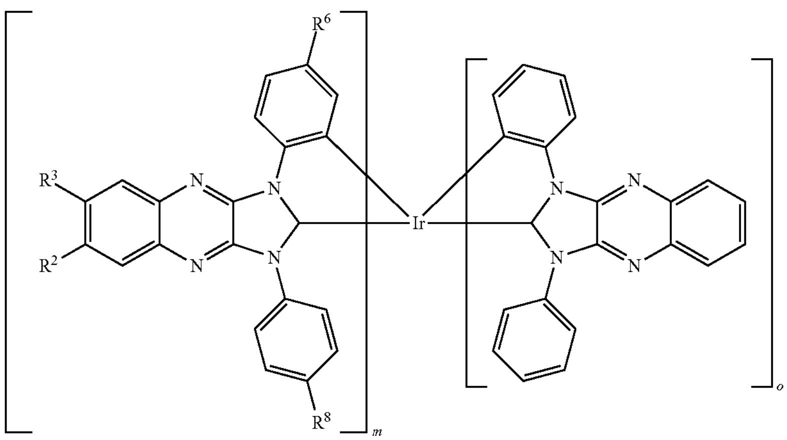
(II-43)
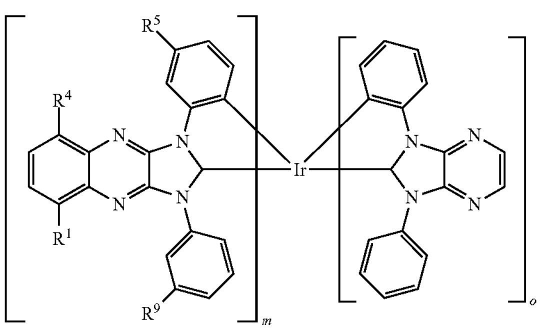
(II-44)
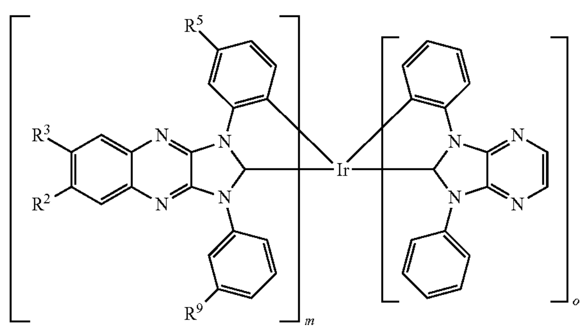
(II-45)
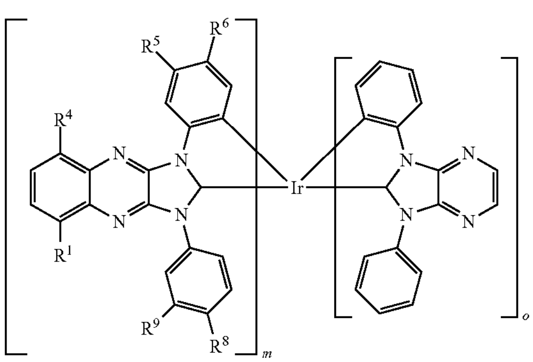
(II-46)
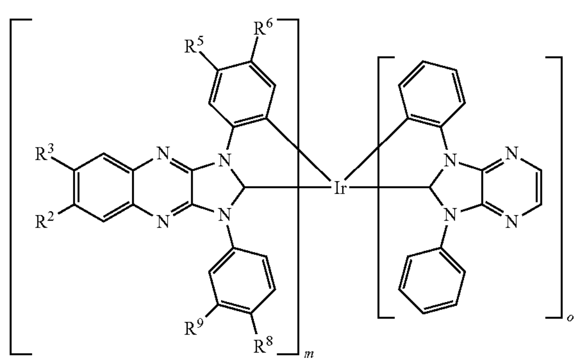

-continued
(II-47)
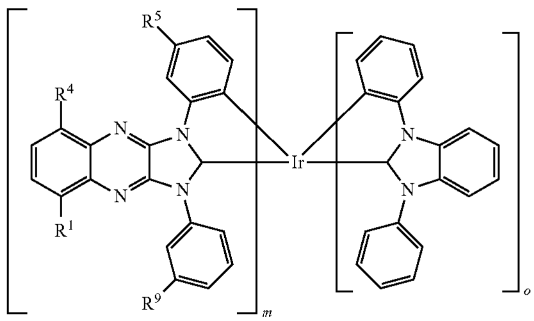
(II-48)
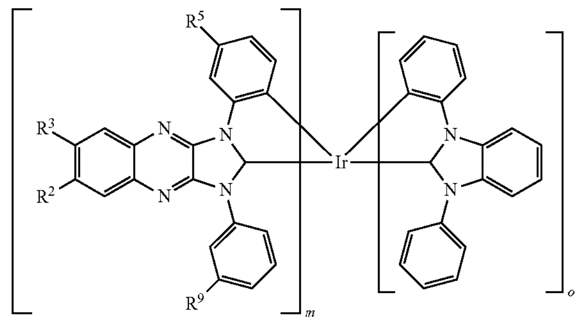
(II-49)
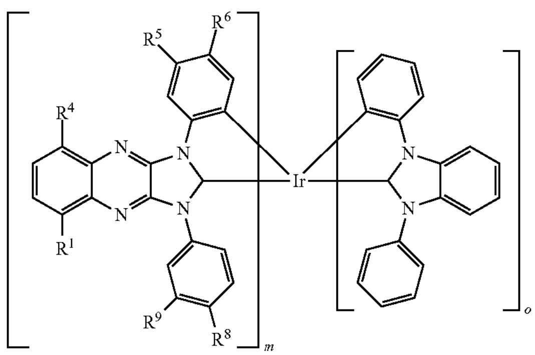
(II-50)
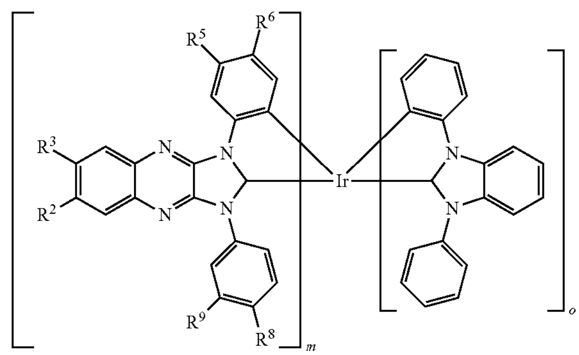
(II-51)
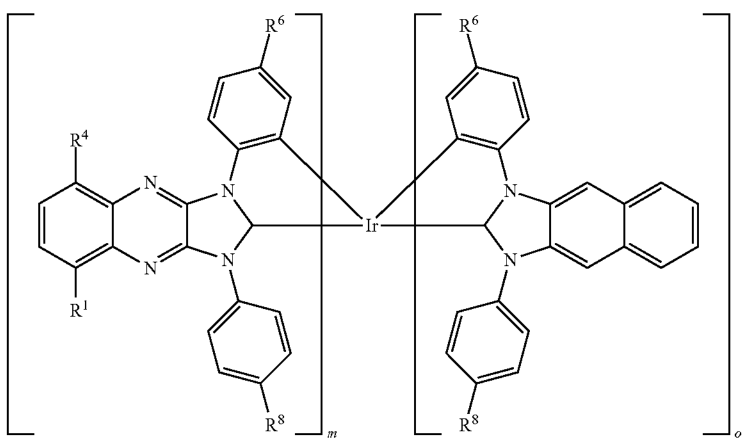
(II-52)
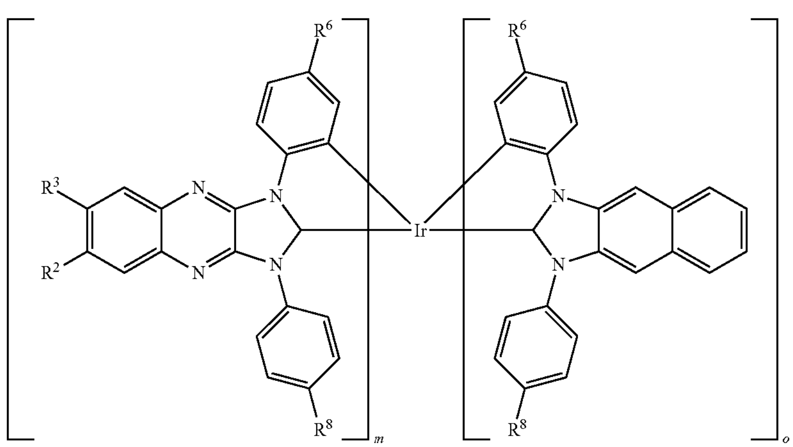

-continued
(II-53)
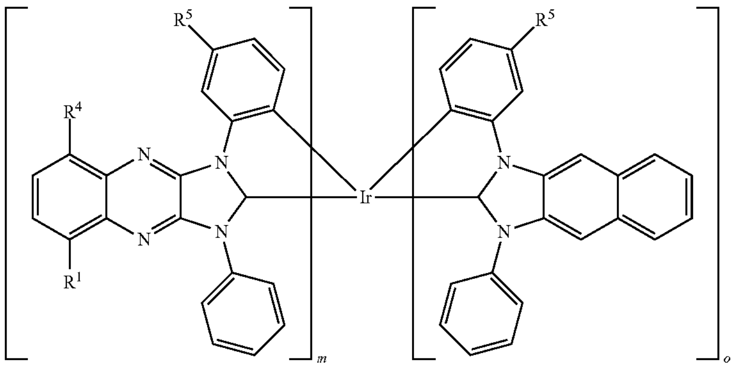
(II-54)
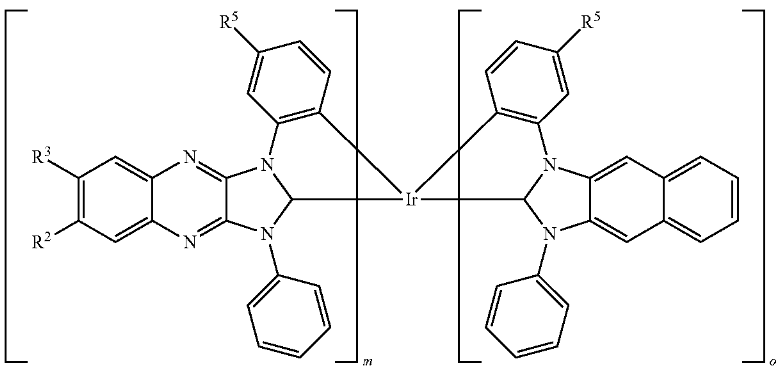
(II-55)
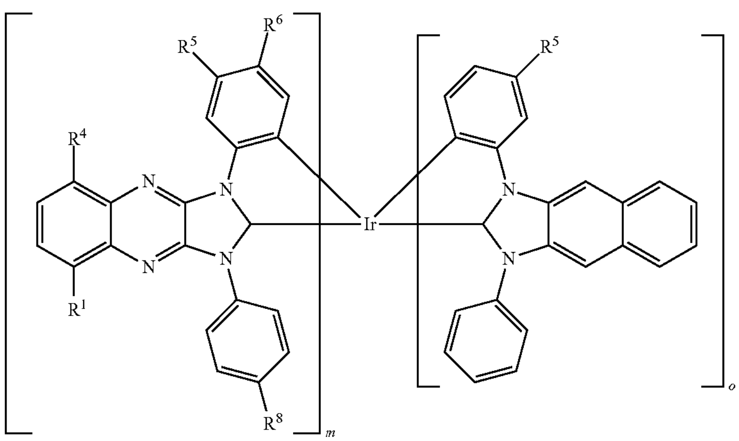
(II-56)
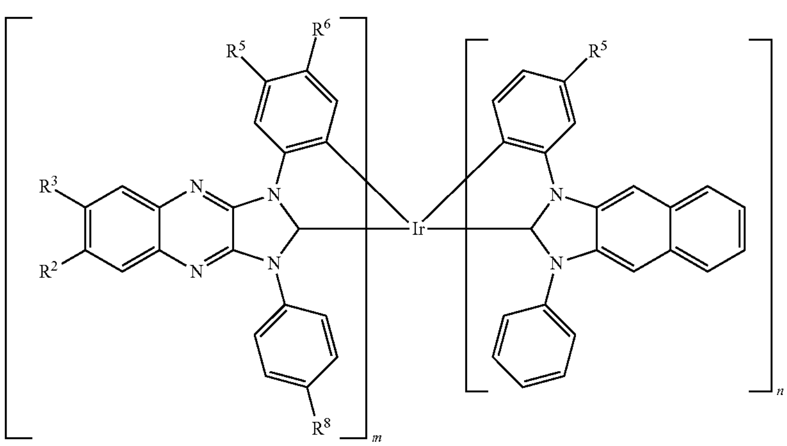

-continued
(II-51)
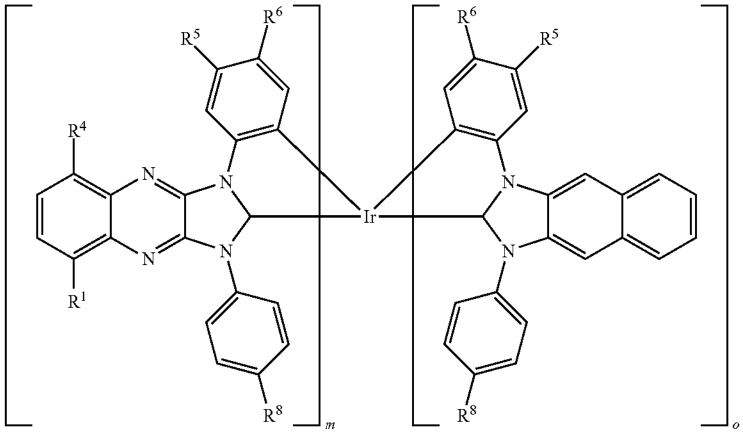
(II-52)
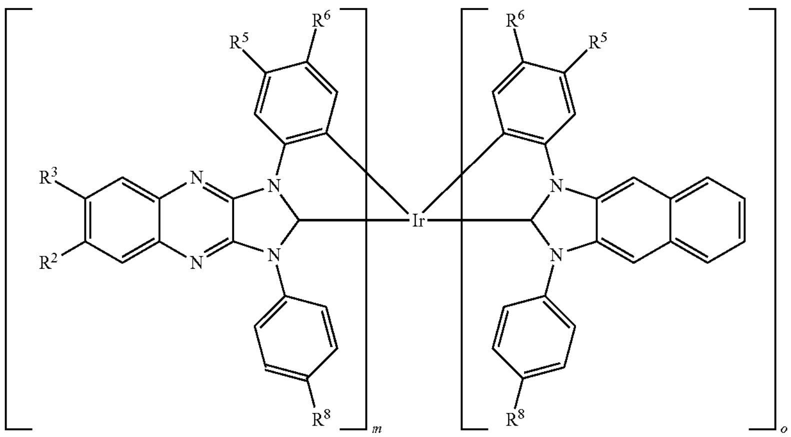
(II-53)
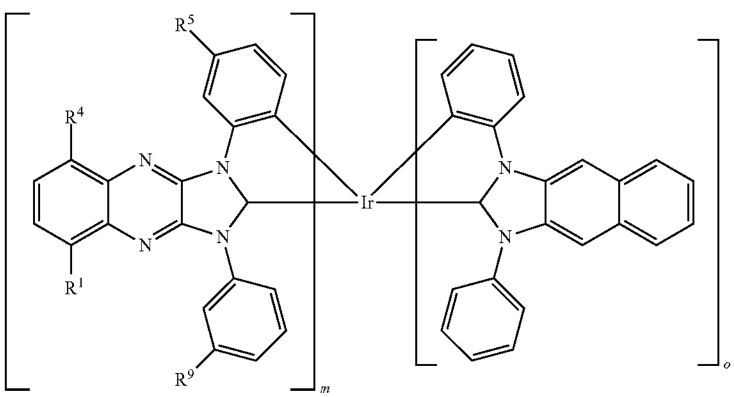
(II-54)
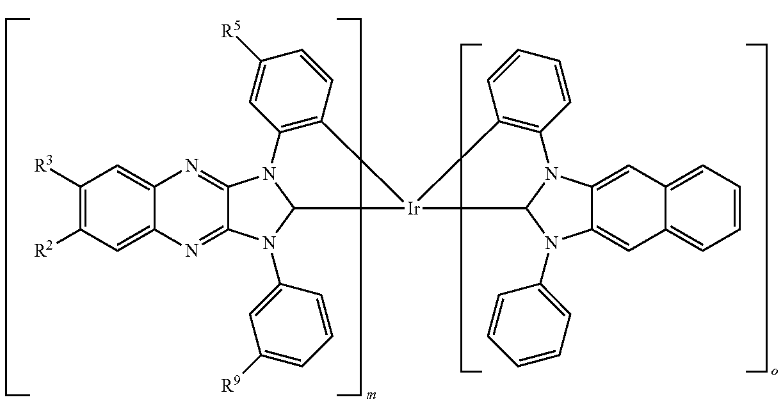

-continued
(II-61)
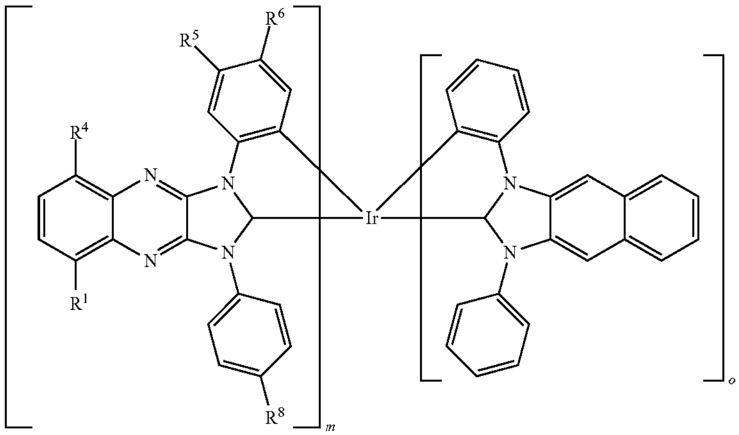
(II-62)
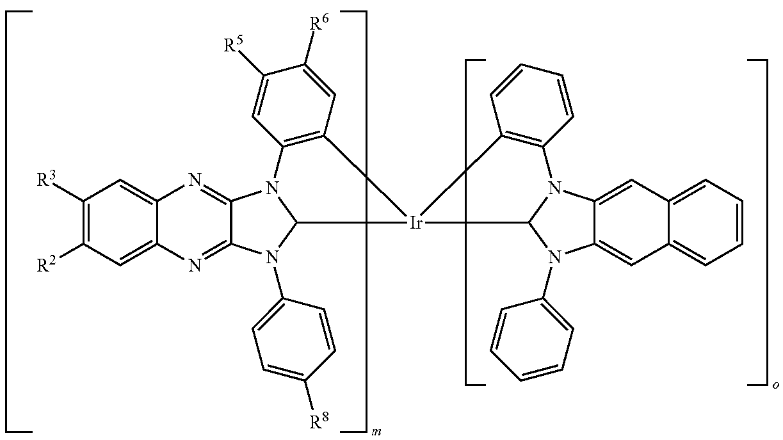
(II-63)
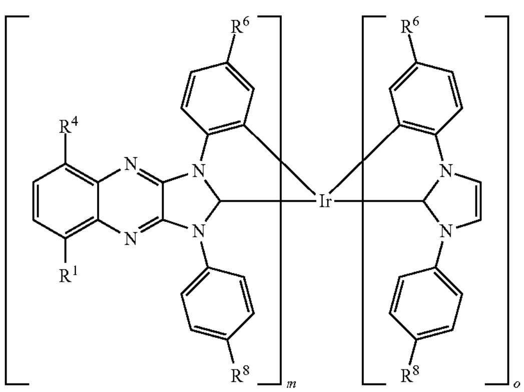
(II-64)
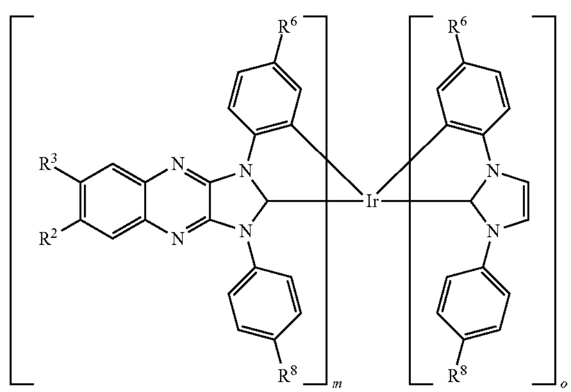
(II-65)
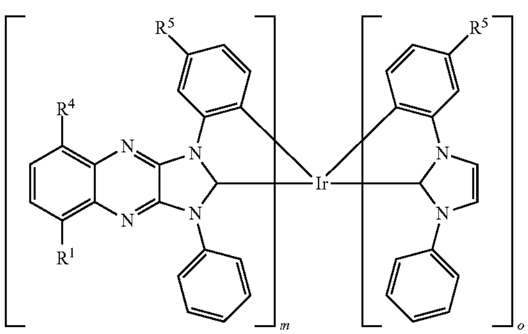
(II-67)
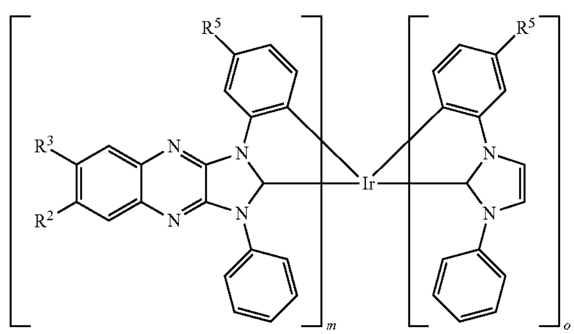

-continued
(II-67)
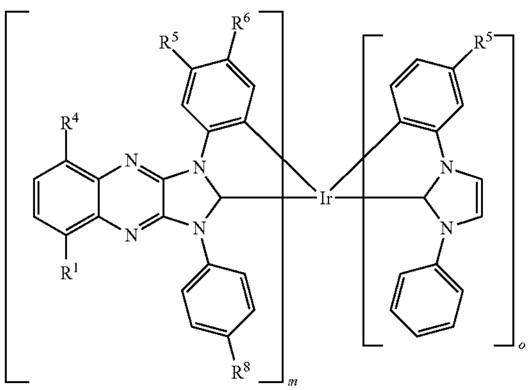
(II-68)
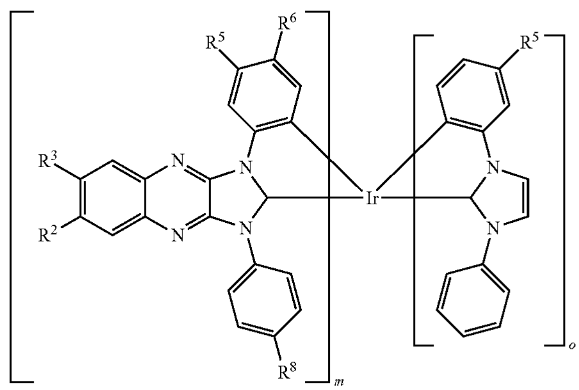
(II-69)
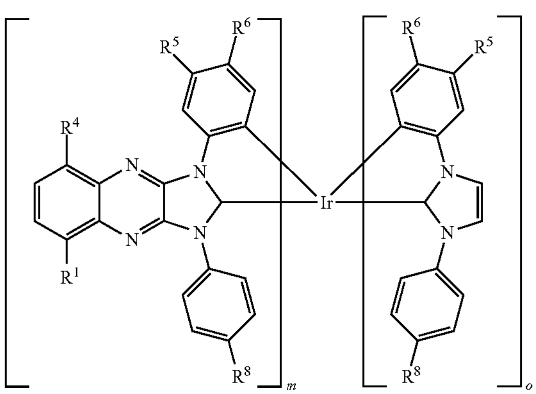
(II-70)
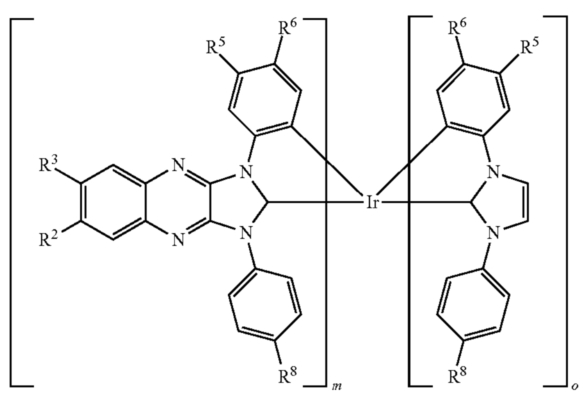
(II-71)
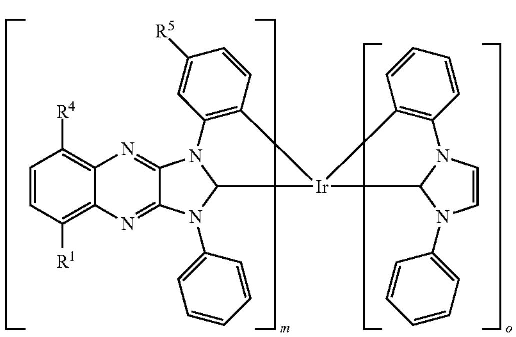
(II-72)
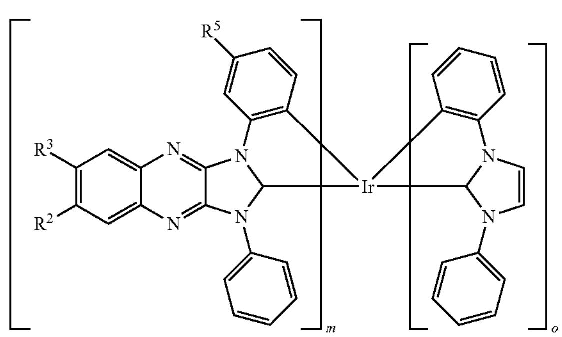
(II-73)
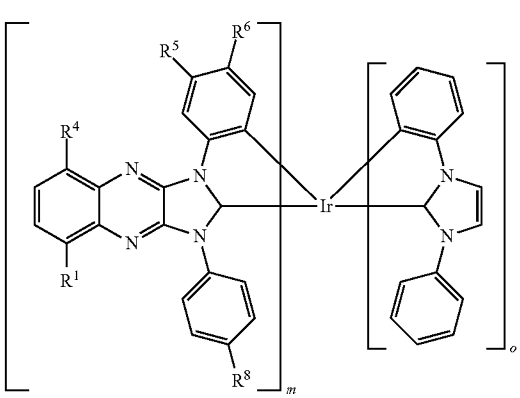
(II-74)
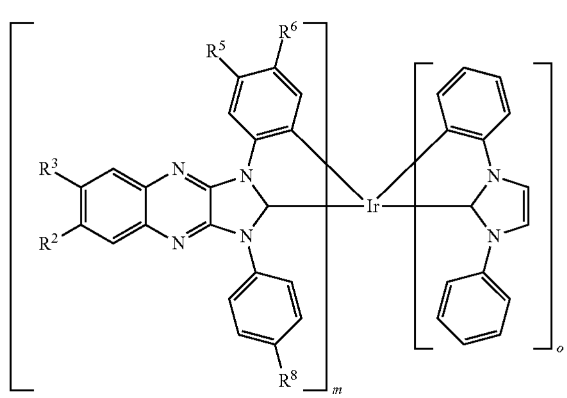

wherein $R^1$, $R^2$, $R^3$ and $R^4$ are independently of each other—in each case—hydrogen, a $C_1$-$C_8$alkyl group, which can optionally be substituted by at least one substituent E and/or interrupted by D; a $C_3$-$C_6$cycloalkyl group, which can optionally be substituted by at least one substituent E; or a phenyl group, which can optionally be substituted by one or two groups G;

$R^5$ and $R^6$ are independently of each other—in each case—hydrogen, a $C_1$-$C_8$alkyl group, which can optionally be substituted by at least one substituent E and/or interrupted by D; or a $C_3$-$C_6$cycloalkyl group, which can optionally be substituted by at least one substituent E; or a phenyl group, which can optionally be substituted by one or two groups G;

$R^8$ and $R^9$ are independently of each other—in each case—hydrogen, a $C_1$-$C_8$alkyl group, which can optionally be substituted by at least one substituent E and/or interrupted by D; or a $C_3$-$C_6$cycloalkyl group, which can optionally be substituted by at least one substituent E; or a phenyl group, which can optionally be substituted by one or two groups G;

D is —S— or —O—;

E is $—OR^{69}$, —CN, $CF_3$, $C_1$-$C_8$alkyl or F; G is $—OR^{69}$, —CN, $CF_3$ or $C_1$-$C_8$alkyl;

$R^{69}$ is a phenyl group, which can optionally be substituted by one or two $C_1$-$C_8$alkyl groups; an unsubstituted $C_1$-$C_8$alkyl group; or a $C_1$-$C_8$alkyl group, which is interrupted by —O—;

m is 2 or 1; wherein when m is 2, the two ligands are identical or different;

o is 1 or 2; wherein when o is 2, the two ligands are identical or different;

and the sum of m+o is 3.

15. An organic electronic device, comprising at least one metal carbene complex of claim 1.

16. The organic electronic device according to claim 15, wherein the organic electronic device is selected from an organic light-emitting diode (OLED), an organic photovoltaic cell (OPV), an organic field-effect transistor (OFET) and a light-emitting electrochemical cell (LEEC).

17. A light-emitting layer comprising at least one metal carbene complex according to claim 1.

18. The light-emitting layer according to claim 17, comprising at least one metal carbene complex of claim 1 and at least one host material.

19. An apparatus selected from the group consisting of a stationary visual display unit; an illumination unit; a keyboard; an item of clothing; furniture; and wallpaper, wherein the apparatus comprises the organic electronic device according to claim 15.

20. A device selected from the group consisting of an electrophotographic photoreceptor, a photoelectric converter, an organic solar cell (organic photovoltaic), a switching element, an organic light emitting field effect transistor (OLEFET), an image sensor, a dye laser, and an electroluminescent device, wherein the device comprises the metal carbene complex of claim 1.

21. A process for preparing a metal carbene complex according to claim 1, wherein the process comprises the step of contacting suitable compounds comprising Ir with appropriate ligands or ligand precursors.

22. A process for preparing a metal carbene complex according to claim 1, comprising at least one ligand of formula (I')

(I')

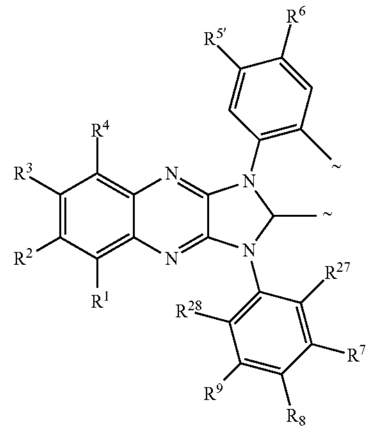

wherein:

$R^{5'}$ is a $C_1$-$C_{18}$alkyl group, which can optionally be substituted by at least one substituent E and/or interrupted by D; a $C_3$-$C_{12}$cycloalkyl group, which can optionally be substituted by at least one substituent E; a $C_6$-$C_{14}$aryl group, which can optionally be substituted by at least one substituent G; a $—N(C_6$-$C_{14}aryl)_2$ group, which can optionally be substituted by at least one substituent G; or a heteroaryl group comprising 3 to 11 ring atoms, which can optionally be substituted by at least one substituent G, interrupted by at least one of O, S and N;

comprising the step of reacting a metal carbene complex comprising at least one ligand of formula (III)

(III)

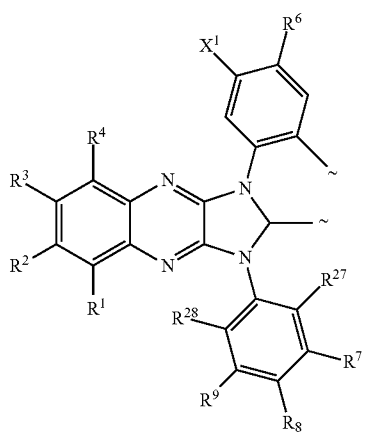

with a compound of formula (IV) corresponding to the respective Y-substituted residue $R^{5'}$:

$R^{5'}$—Y (IV)

wherein $X^1$ is Cl, Br, or I;

Y is $—B(OH)_2$, $—B(OY^1)_2$,

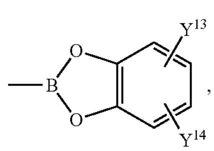

, or

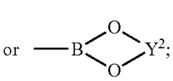

;

wherein $Y^1$ is a $C_1$-$C_{10}$alkyl group and $Y^2$ is independently in each occurrence a $C_2$-$C_{10}$alkylene group, such as $—CY^3Y^4—CY^5Y^6—$, or $—CY^7Y^8—CY^9Y^{10}—$ $CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, and $Y^{13}$ and $Y^{14}$ are independently of each other hydrogen, or a $C_1$-$C_{10}$alkyl group; or Y is —$SnR^{307}R^{308}R^{309}$, wherein $R^{307}$, $R^{308}$ and $R^{309}$ are identical or different and are hydrogen or $C_1$-$C_6$alkyl, wherein two radicals optionally form a common ring and these radicals are optionally branched or unbranched; $ZnR^{310}R^{311}$, wherein $R^{310}$ is halogen and $R^{311}$ is a $C_1$-$C_{10}$alkyl group, a $C_6$-$C_{12}$aryl group, or $C_1$-$C_{10}$alkenyl group; or $SiR^{312}R^{313}R^{314}$, wherein $R^{312}$, $R^{313}$ and $R^{314}$ are identical or different and are halogen or $C_1$-$C_6$alkyl, and wherein the metal is selected from Ir and Pt.

23. The metal carbene complex according to claim 1, wherein $R^1$, $R^2$, $R^3$, $R^4$, $R^5$, $R^6$, $R^7$, $R^8$, $R^9$, $R^{27}$ and $R^{29}$ are hydrogen.

24. The metal carbene complex according to claim 1, wherein the metal carbene complex has one of the following formulae:

(I)

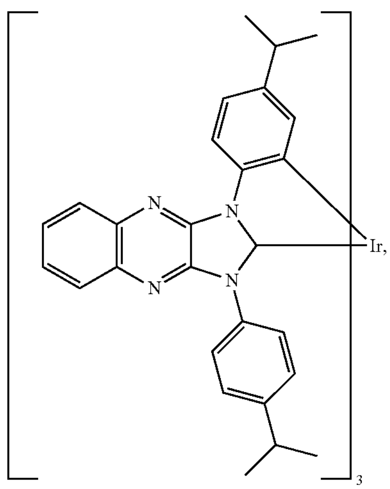

(II)

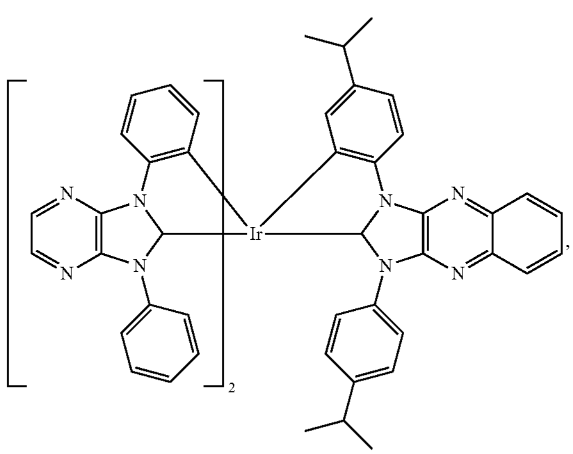

-continued (III)

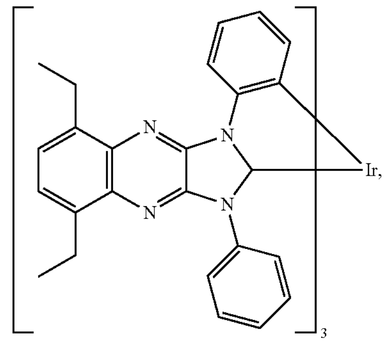

(IV)

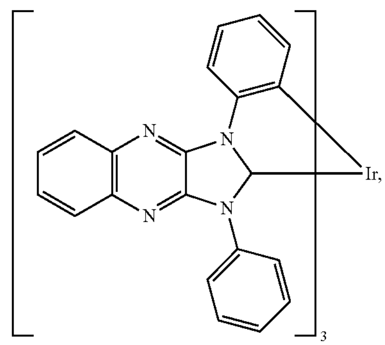

(V)

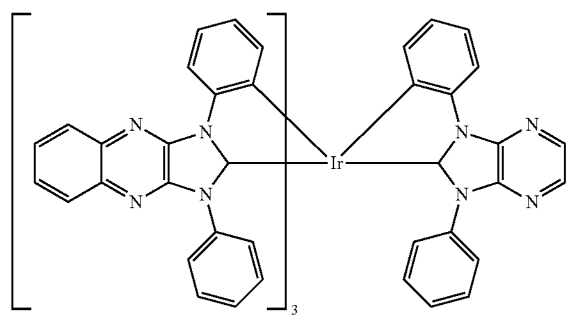

(VI)

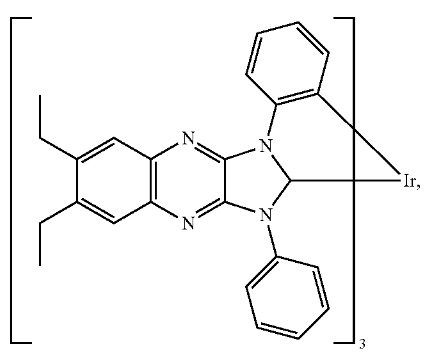

-continued
(VIa)
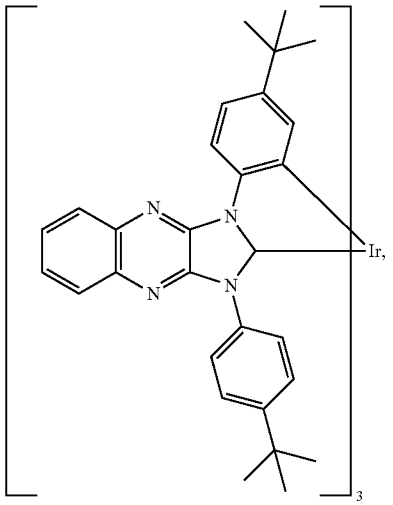
(VII)
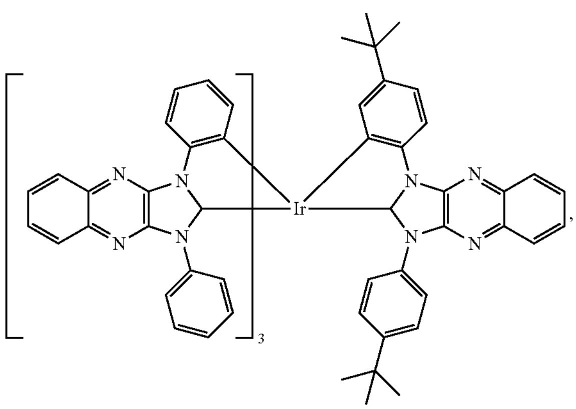
(IX)
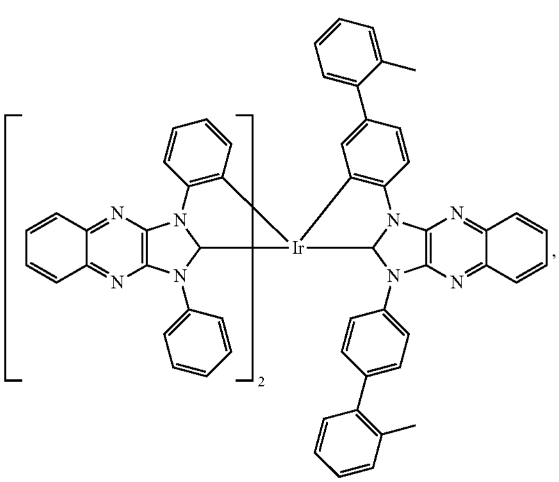
-continued
(XVII)
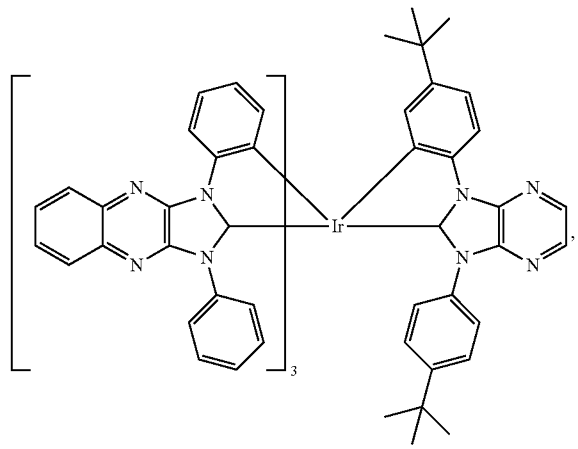
(XVII)
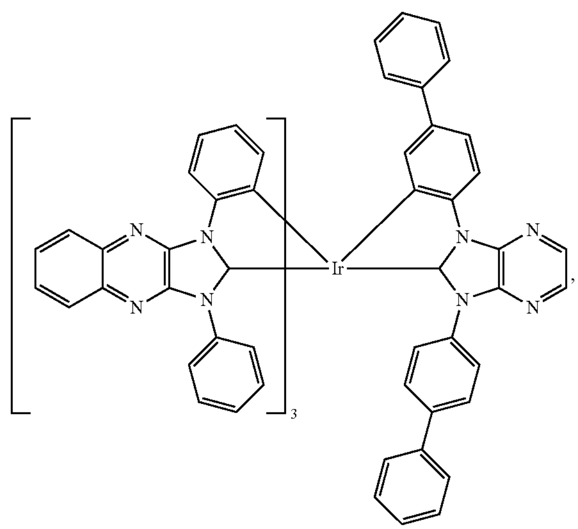
(XVIII)
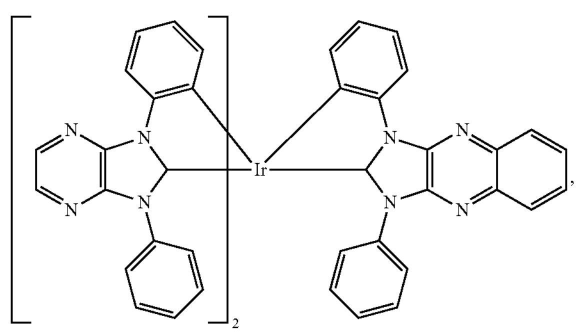

(XX)
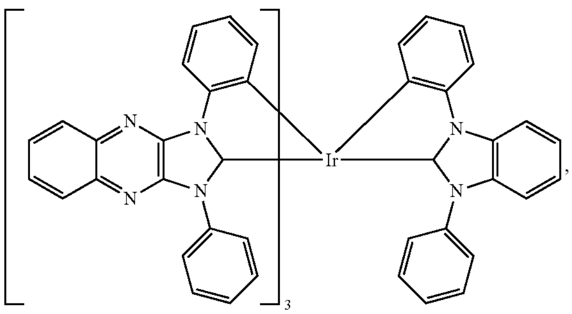
(XXI)
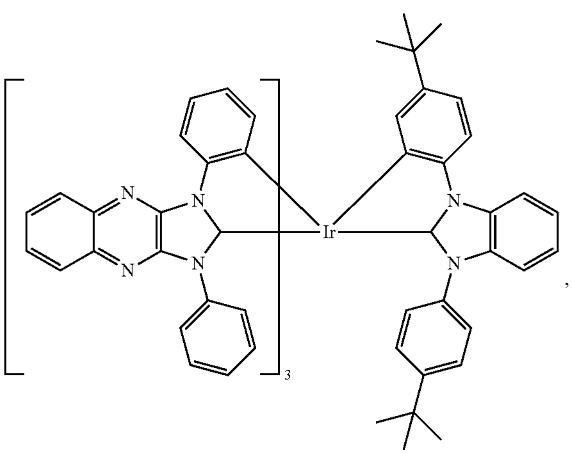
(XXIV)
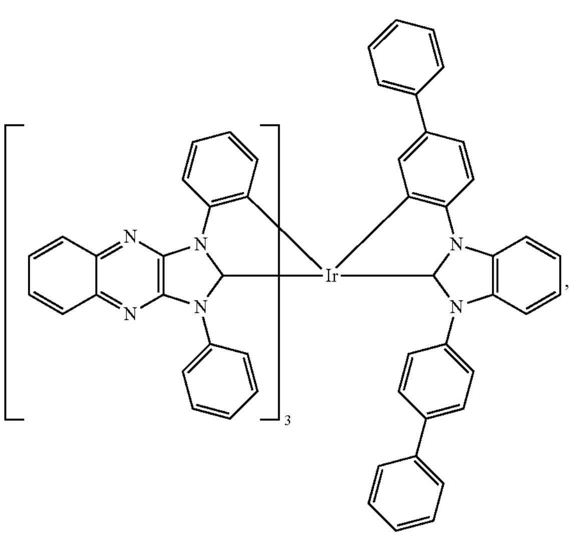
(XXVI)
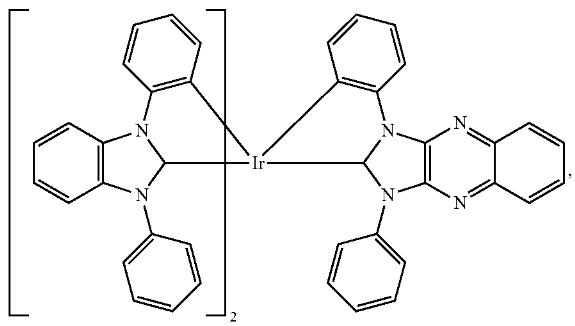
(XXVII)
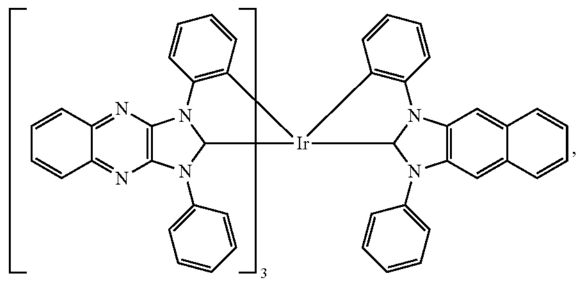
(XXVIII)
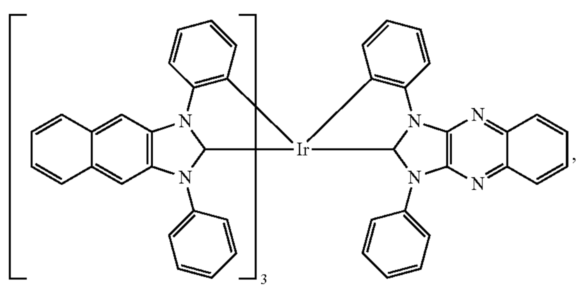
(XXIX)
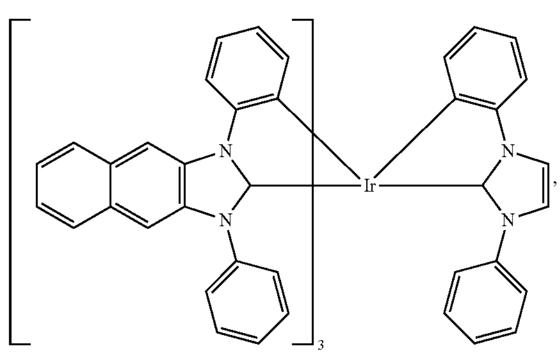

-continued
(XXXIII)
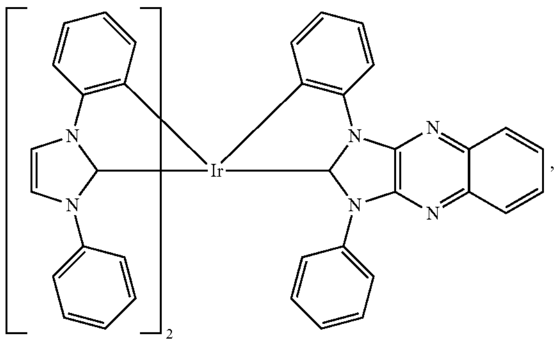
(XXXIV)
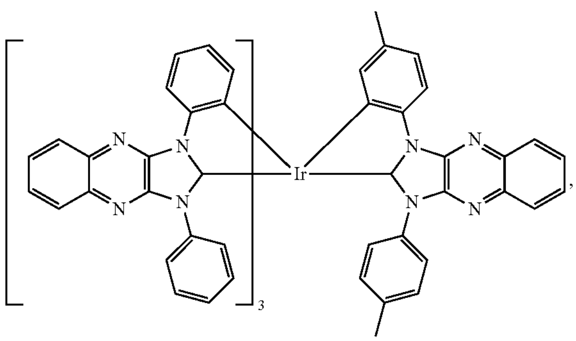
(XXXV)
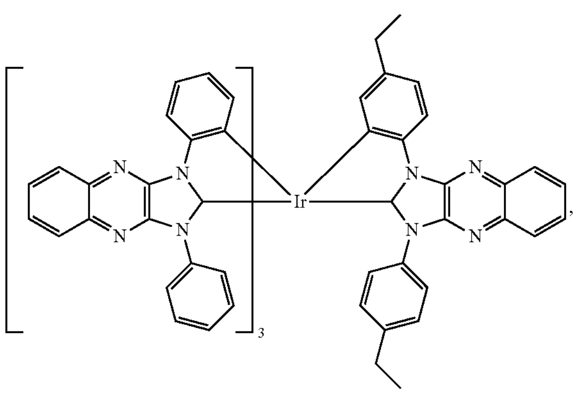
(XXXVI)
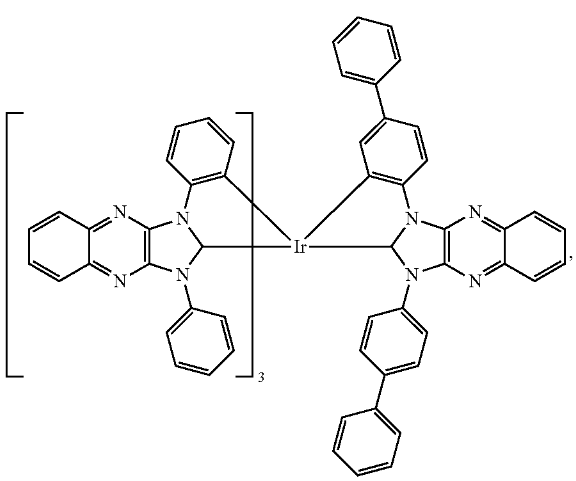
-continued
(XXXVII)
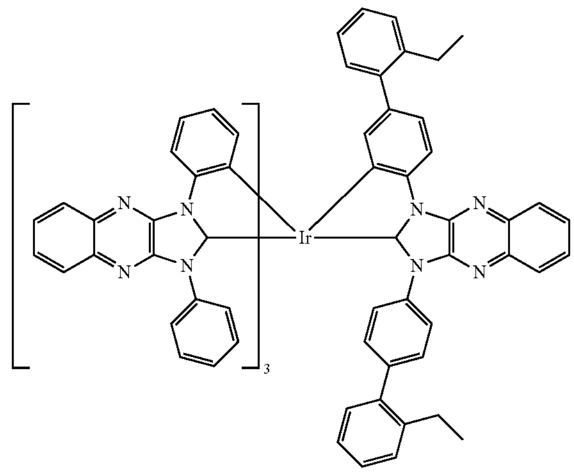
(XXXVIII)
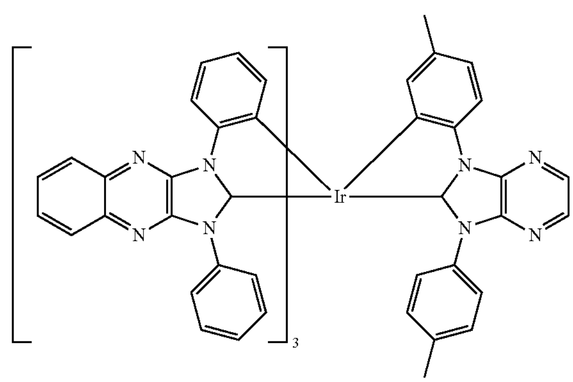
(XXXIX)
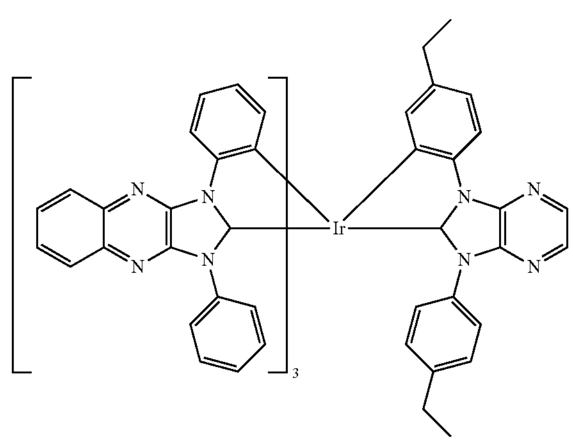

-continued
(XXXX)
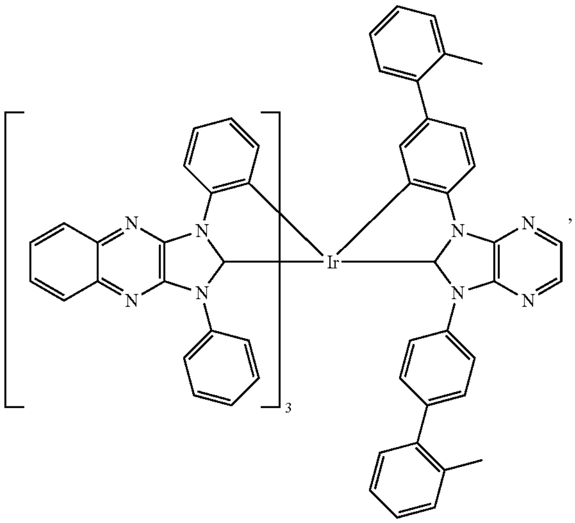
(XXXXI)
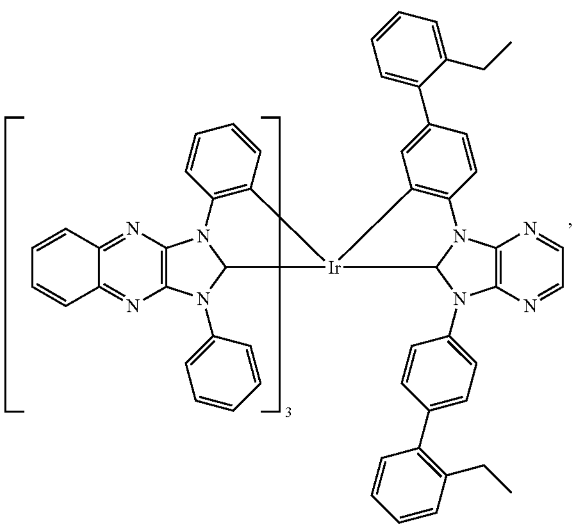
(XXXXII)
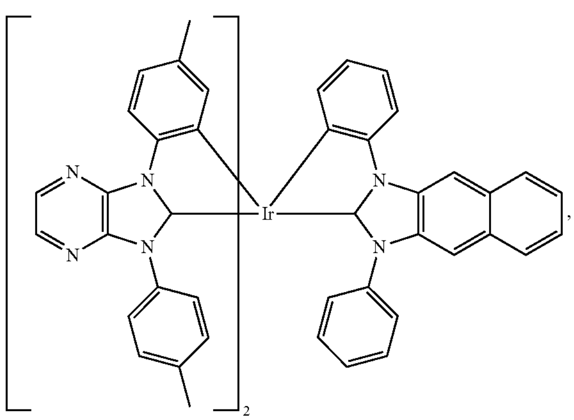
-continued
(XXXXIII)
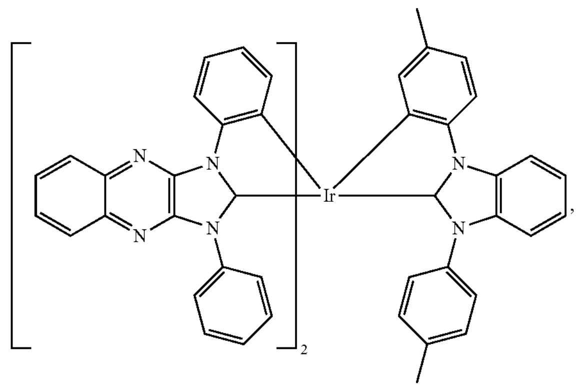
(XXXXIV)
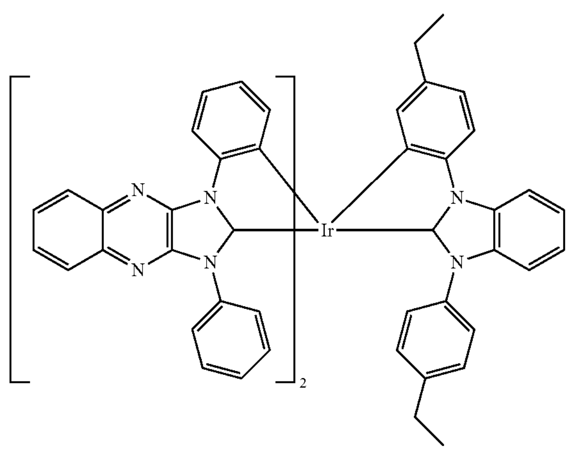
(XXXXV)
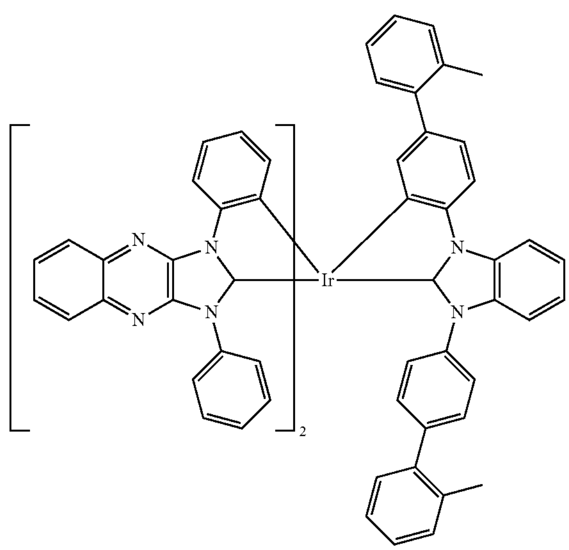

(XXXXVI)
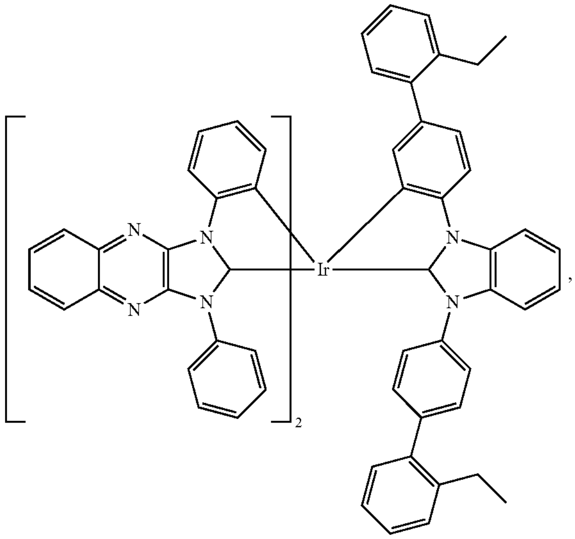
(XXXXVII)
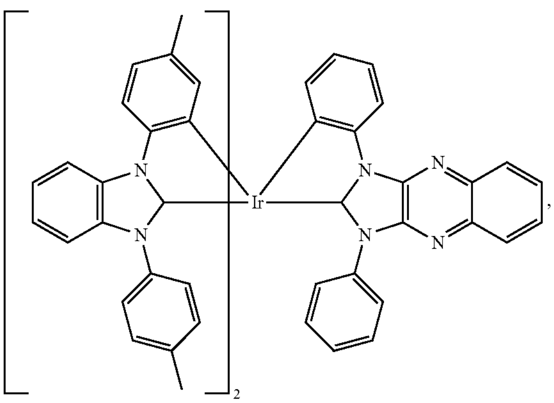
(XXXXVIII)
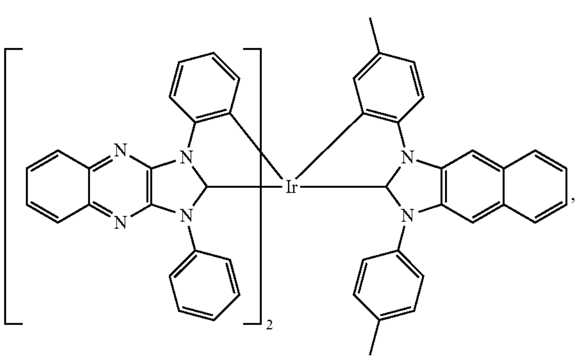
(XXXXIX)
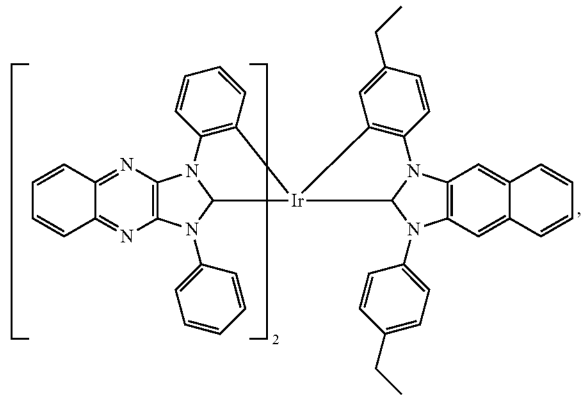
(XXXXX)
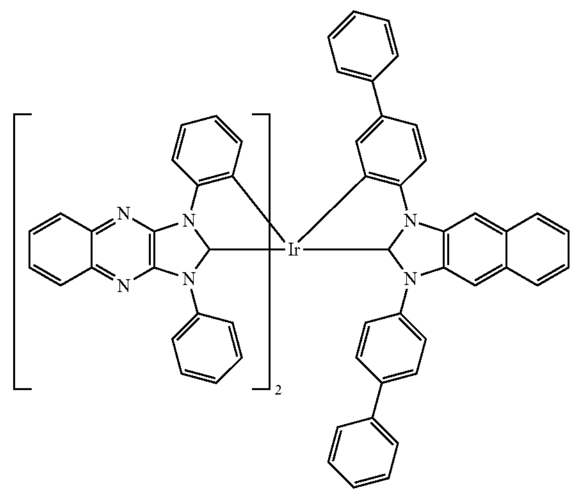
(XXXXXI)
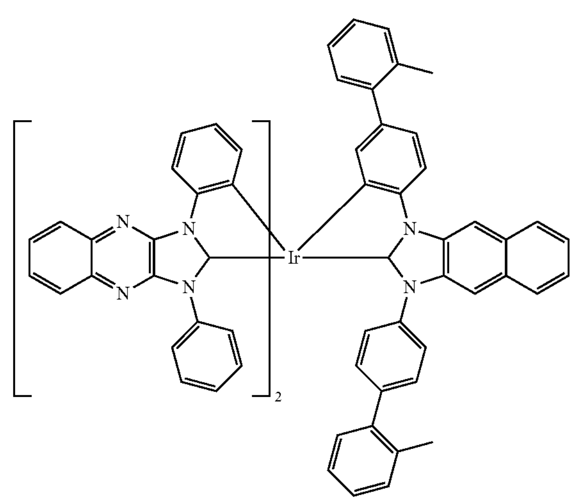

(XXXXXII)
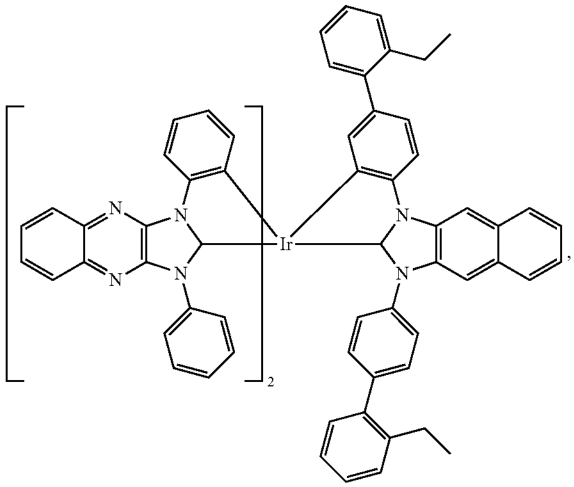
(XXXXXXIII)
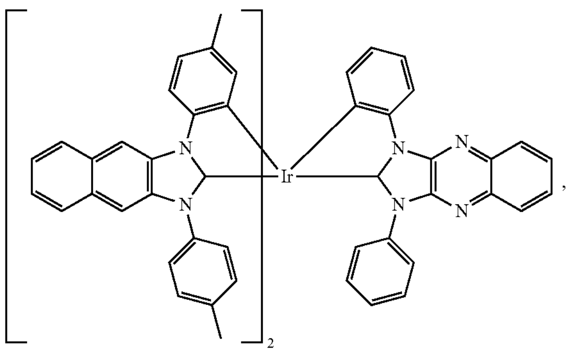
(XXXXXXXIV)
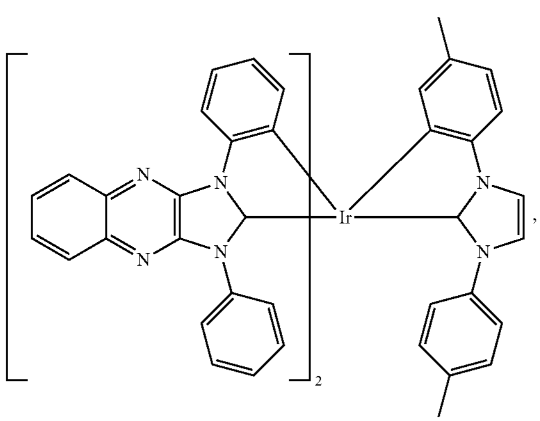
(XXXXXV)
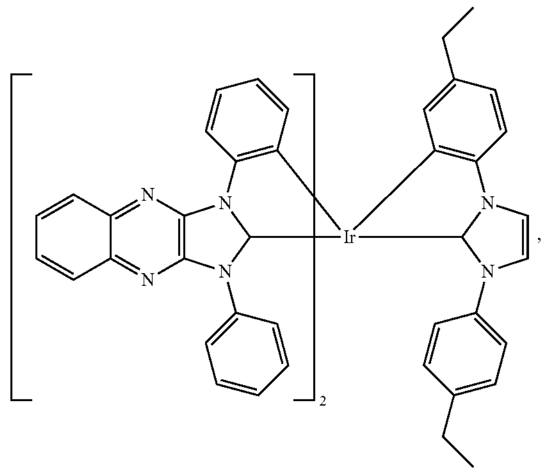
(XXXXXVI)
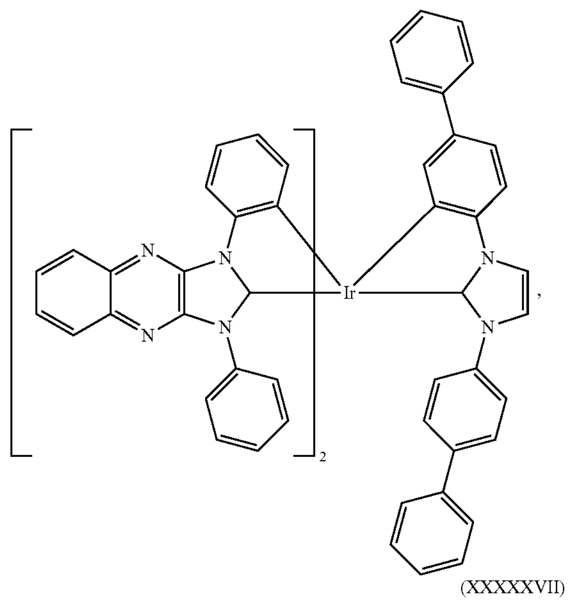
(XXXXXVII)
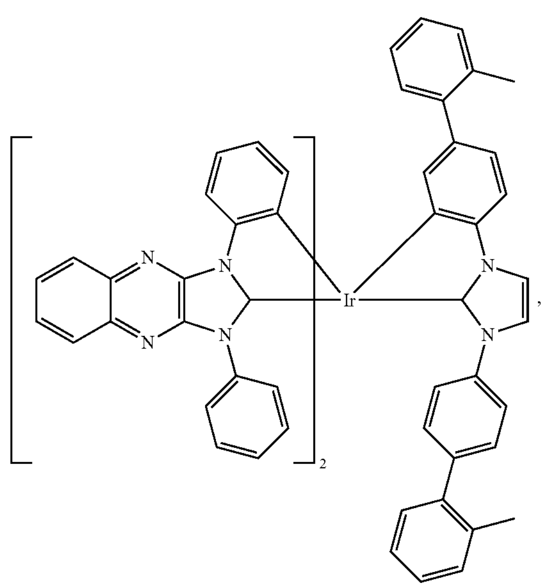

-continued
(XXXXXVIII)
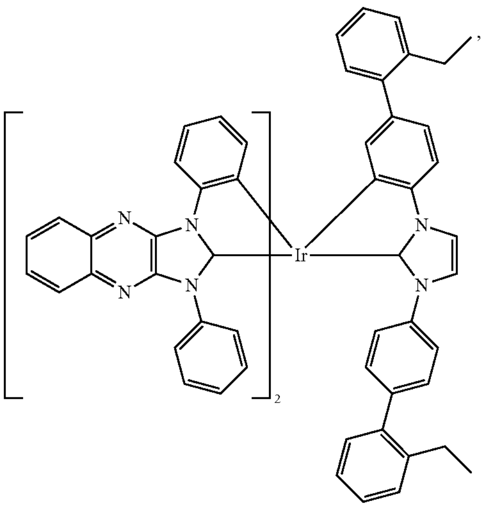
, and
-continued
(XXXXXIX)
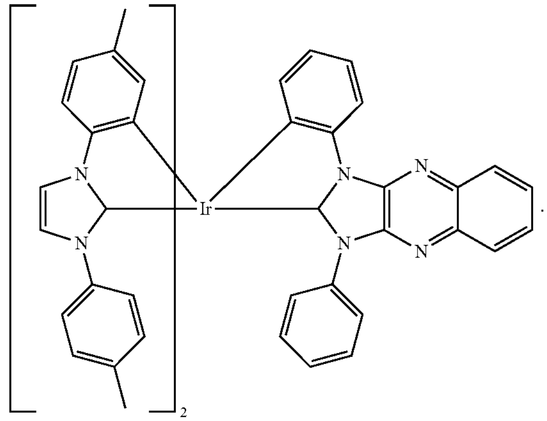
.
* * * * *